US012557543B2

(12) United States Patent
Zhang et al.

(10) Patent No.: US 12,557,543 B2
(45) Date of Patent: Feb. 17, 2026

(54) LIGHT-EMITTING MATERIAL WITH A POLYCYCLIC LIGAND

(71) Applicant: BEIJING SUMMER SPROUT TECHNOLOGY CO., LTD., Beijing (CN)

(72) Inventors: Cuifang Zhang, Beijing (CN); Qi Zhang, Beijing (CN); Nannan Lu, Beijing (CN); Zhihong Dai, Beijing (CN); Chi Yuen Raymond Kwong, Beijing (CN); Chuanjun Xia, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 739 days.

(21) Appl. No.: 17/241,836

(22) Filed: Apr. 27, 2021

(65) Prior Publication Data

US 2022/0109118 A1 Apr. 7, 2022

(30) Foreign Application Priority Data

Apr. 30, 2020 (CN) ........................ 202010362117.X
Nov. 9, 2020 (CN) ........................ 202011219604.7
Apr. 1, 2021 (CN) ........................ 202110348602.6

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 109956977 A 7/2019
CN 110698518 1/2020
(Continued)

OTHER PUBLICATIONS

Machine English translation of Wang et al. (CN 110790797 A). Oct. 31, 2023.*
(Continued)

*Primary Examiner* — Jay Yang
(74) *Attorney, Agent, or Firm* — Workman Nydegger

(57) ABSTRACT

Provided is a light-emitting material with polycyclic ligand. The light-emitting material is a metal complex with polycyclic ligand and may be used as a light-emitting material in an electroluminescent device. While maintaining a very narrow FWHM, these novel metal complexes can better adjust the light-emitting color of the device, reduce the driving voltage of the device or maintain the driving voltage at a low level, improve device efficiency, greatly increase the lifetime of the device, and provide better device performance. Further provided are an electroluminescent device and a compound composition.

35 Claims, 2 Drawing Sheets

(51) Int. Cl.

| | |
|---|---|
| ***C09K 11/06*** | (2006.01) |
| ***H10K 85/30*** | (2023.01) |
| *H10K 50/11* | (2023.01) |
| *H10K 101/10* | (2023.01) |
| *H10K 101/30* | (2023.01) |
| *H10K 101/40* | (2023.01) |

(52) U.S. Cl.

CPC ................ *C09K 2211/1033* (2013.01); *C09K 2211/1037* (2013.01); *C09K 2211/1048* (2013.01); *C09K 2211/185* (2013.01); *H10K 50/11* (2023.02); *H10K 2101/10* (2023.02); *H10K 2101/30* (2023.02); *H10K 2101/40* (2023.02)

(56) References Cited

U.S. PATENT DOCUMENTS

| | | | |
|---|---|---|---|
| 5,844,363 | A | 12/1998 | Gu et al. |
| 6,097,147 | A | 8/2000 | Baldo et al. |
| 6,303,238 | B1 | 10/2001 | Thompson et al. |
| 7,279,704 | B2 | 10/2007 | Walters et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2015/0349273 | A1 | 12/2015 | Hung et al. |
| 2016/0359122 | A1 | 12/2016 | Boudreault et al. |
| 2017/0012223 | A1 | 1/2017 | Boudreault et al. |
| 2019/0077818 | A1 | 3/2019 | Xia et al. |
| 2021/0280802 | A1 | 9/2021 | Wang et al. |
| 2022/0399506 | A1 | 12/2022 | Kwong et al. |
| 2023/0144101 | A1 | 5/2023 | Zhang et al. |

FOREIGN PATENT DOCUMENTS

| | | | |
|---|---|---|---|
| CN | 110790797 | | 2/2020 |
| CN | 110922429 | A | 3/2020 |
| CN | 115275029 | | 11/2022 |
| CN | 115275030 | | 11/2022 |
| CN | 116082406 | A | 5/2023 |
| EP | 4174078 | A1 | 5/2023 |
| JP | 2004131463 | | 4/2004 |
| JP | 2007254540 | A | 10/2007 |
| JP | 7278631 | B2 | 5/2023 |
| JP | 2023067818 | A | 5/2023 |
| JP | 2023067848 | A | 5/2023 |
| KR | 20170120233 | | 10/2017 |
| KR | 20230064557 | A | 5/2023 |

OTHER PUBLICATIONS

Japanese Notice of Reasons for Refusal for Japanese Application No. 2021-076326, dated Jun. 3, 2022, 7 pages with English translation.
Japanese Search Report for Japanese Application No. 2021-076326, dated Jun. 9, 2022, 32 pages with English Translation.
Joyama et. al., "Highly efficient organic light-emitting diodes from delayed fluorescence," Nature, vol. 492, (2012), pp. 234-238.
Tang et. al., "Organic electroluminescent diodes," Applied Physics Letters, (1987), pp. 913-915.
German First Office Action for German Application No. 10 2021 110 753.9, dated Aug. 23, 2022, 6 pages with English Translation.
Japanese Decision to Grant a Patent for Japanese Application No. 2021-076326, dated Mar. 24, 2023, 5 pages with English Translation.
Japanese Notice of Reasons for Refusal for Japanese Application No. 2022-173492, dated Oct. 11, 2023, 5 pages with English translation.
Japanese Notice of Reasons for Refusal for Japanese Application No. 2021-076326, dated Dec. 21, 2022, 4 pages with English translation.
Japanese Search Report for Japanese Application No. 2022-173492, dated Sep. 22, 2023, 24 pages with English translation.
Korean Written Decision on Registration for Korean Application No. 10-2021-0055624, dated Sep. 5, 2023, 6 pages with English translation.
Chinese First Office Action for Chinese Application No. 202110348602.6, dated Aug. 11, 2023, 8 pages with English translation.
Chinese Search Report for Chinese Application No. 2021103486026, dated Aug. 9, 2023, 4 pages with English translation.
Korean Request for the Submission of an Opinion for Korean Application No. 10-2021-0055624, dated Apr. 29, 2021, 15 pages with English translation.
Germany Decision to Grant for German Application No. 10 2021 110 753, dated Jan. 23, 2021, 4 pages with English translation.
Germany Office Action for German Application No. 10 2021 110 753.9, dated Jan. 23, 2023, 8 pages with English translation.
European Search Report for European Application No. 22203974.5, dated Feb. 28, 2023, 7 pages.
Chinese First Office Action for Chinese Application No. 202211093543.3, dated Jan. 23, 2025, 9 pages with translation.
Chinese Search Report for Chinese Application No. 202211093543.3, dated Jan. 21, 2025 , 3 pages with translation.
Chinese Notification to Grant for Chinese Application No. 202110348602.6, dated Nov. 28, 2024, 3 pages with translation.
Chinese Second Office Action for Chinese Application No. 202110348602.6, dated Apr. 30, 2024, 11 pages with translation.
Japanese Decision to Grant for Japanese Application No. 2022-173492, dated Jan. 30, 2024, 5 pages with translation.
Japanese Notice of Reasons for Refusal for Japanese Application No. 2023-072357, dated Apr. 30, 2024, 11 pages with English translation.
Japanese Notice of Reasons for Refusal for Japanese Application No. 2023-072357, dated Feb. 12, 2025, 4 pages with English translation.
Korean Notice of Reasons for Rejection for Korean Application No. 10-2022-0141058, dated May 9, 2025, 31 pages with English translation.
Korean Notice of Reasons for Rejection for Korean Application No. 10-2024-0039587, dated May 9, 2025, 11 pages with English translation.
European Intention to grant for European Application No. 22 203 974.5, mailed Jun. 7, 2024, 9 pages with translation.

* cited by examiner

LIGHT-EMITTING MATERIAL WITH A POLYCYCLIC LIGAND

CROSS-REFERENCE TO RELATED APPLICATIONS

This application claims priority to Chinese Patent Application No. CN 202010362117.X filed on Apr. 30, 2020, Chinese Patent Application No. CN 202011219604.7 filed on Nov. 9, 2020, and Chinese Patent Application No. CN 202110348602.6 filed on Apr. 1, 2021, the disclosures of which are incorporated herein by reference in their entirety.

TECHNICAL FIELD

The present disclosure relates to compounds used in organic electronic devices such as organic light-emitting devices. More particularly, the present disclosure relates to a metal complex with a polycyclic ligand and an electroluminescent device and a compound composition including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which comprises an arylamine hole transporting layer and a tris-8-hydroxyquinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may comprise multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may comprise one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

Phosphorescent metal complexes can be used as phosphorescent doping materials of light-emitting layers and applied to the field of organic electroluminescence lighting or display.

CN110698518A discloses a metal complex with a structure of

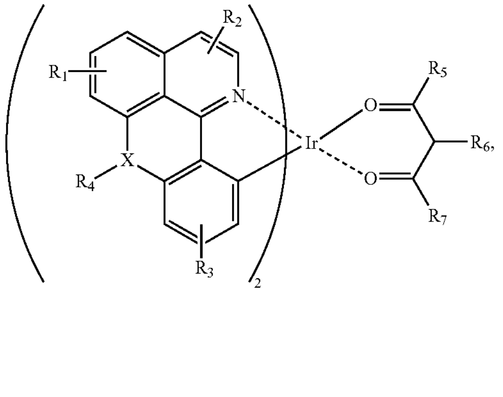

wherein X is N or P. One of many structures disclosed is

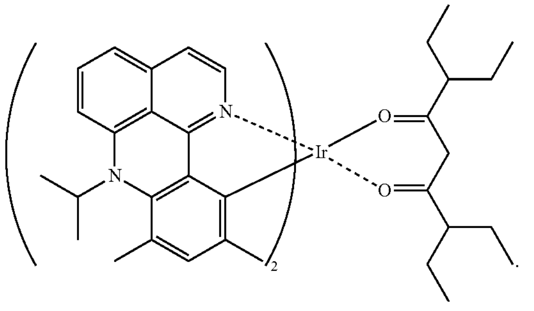

This disclosure has discussed the improvement in performance of materials due to bridge connection via an N or P atom. However, it does not notice the performance improvement brought by the further introduction of a fused ring system at a specific position of a specific ring.

CN110790797A discloses a metal complex with a structure of

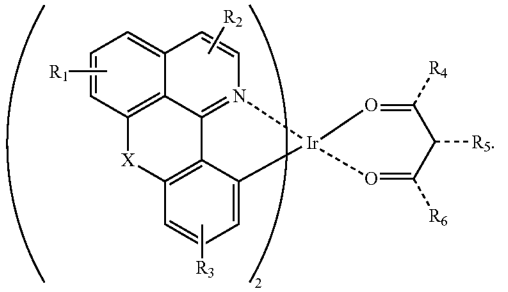

One of many structures disclosed is

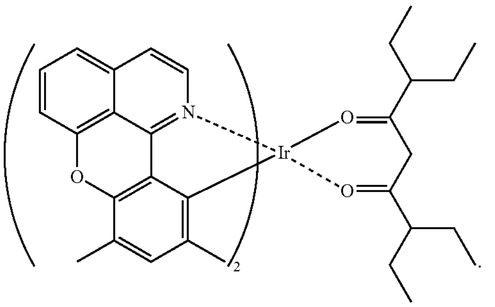

This disclosure has discussed the improvement in performance of materials due to bridge connection via an O or S atom. However, it does not notice the performance improvement brought by the further introduction of a fused ring system at a specific position of a specific ring.

The currently developed metal complexes still have various deficiencies in performance when used in electroluminescent devices. To meet the increasing requirements of the industry such as lower voltage, higher device efficiency, light-emitting color within a particular wavelength range, more saturated light-emitting color, and longer device lifetime, the research and development related to metal complexes still needs to be deepened.

SUMMARY

The present disclosure aims to provide a series of metal complexes having a polycyclic ligand(s) to solve at least part of the above-mentioned problems. The metal complexes can be used as light-emitting materials in organic electroluminescent devices. While maintaining a very narrow full width at half maximum (FWHM), these novel metal complexes can better adjust the light-emitting colors of the devices, reduce the driving voltages of the devices or maintain the driving voltages of the devices at low voltage levels, improve the efficiency of the devices, and greatly increase the lifetimes of the devices. These novel metal complexes can provide better device performance.

According to an embodiment of the present disclosure, disclosed is a metal complex including a ligand $L_a$ having a structure represented by Formula 1:

Formula 1

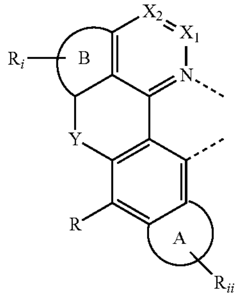

wherein the ring A and the ring B are each independently selected from a five-membered unsaturated carbocyclic ring, an aromatic ring having 6 to 30 carbon atoms, or a heteroaromatic ring having 3 to 30 carbon atoms;

$R_i$ represents, at each occurrence identically or differently, mono-substitution, multiple substitutions or non-substitution; and $R_{ii}$ represents, at each occurrence identically or differently, mono-substitution, multiple substitutions or non-substitution;

Y is selected from $SiR_yR_y$, $GeR_yR_y$, $NR_y$, $PR_y$, O, S or Se; when two $R_y$ are present at the same time, the two $R_y$ may be the same or different;

$X_1$ and $X_2$ are, at each occurrence identically or differently, selected from $CR_x$ or N;

R, $R_i$, $R_{ii}$, $R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

adjacent substituents $R_i$, $R_x$, $R_y$, R and $R_{ii}$ can be optionally joined to form a ring;

the metal is selected from a metal with a relative atomic mass greater than 40.

According to another embodiment of the present disclosure, further disclosed is an electroluminescent device including an anode, a cathode and an organic layer disposed between the anode and the cathode, wherein the organic layer includes a metal complex including a ligand $L_a$ having a structure represented by Formula 1:

Formula 1

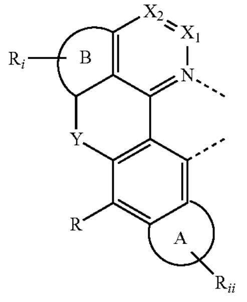

wherein the ring A and the ring B are each independently selected from a five-membered unsaturated carbocyclic ring, an aromatic ring having 6 to 30 carbon atoms, or a heteroaromatic ring having 3 to 30 carbon atoms;

$R_i$ represents, at each occurrence identically or differently, mono-substitution, multiple substitutions or non-substitution; and $R_{ii}$ represents, at each occurrence identically or differently, mono-substitution, multiple substitutions or non-substitution;

Y is selected from $SiR_yR_y$, $GeR_yR_y$, $NR_y$, $PR_y$, O, S or Se; when two $R_y$ are present at the same time, the two $R_y$ may be the same or different;

$X_1$ and $X_2$ are, at each occurrence identically or differently, selected from $CR_x$ or N;

R, $R_i$, $R_{ii}$, $R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

adjacent substituents $R_i$, $R_x$, $R_y$, R and $R_{ii}$ can be optionally joined to form a ring;

the metal is selected from a metal with a relative atomic mass greater than 40.

According to another embodiment of the present disclosure, further disclosed is a compound composition including the metal complex described in the preceding embodiments.

The novel metal complexes having a polycyclic ligand(s), as disclosed by the present disclosure, may be used as light-emitting materials in electroluminescent devices. While maintaining a very narrow FWHM, these novel metal complexes can better adjust the light-emitting colors of the devices, reduce the driving voltages of the devices or maintain the driving voltages of the devices at low voltage levels, improve the efficiency of the devices, and greatly increase the lifetimes of the devices. These novel metal complexes can provide better device performance.

DETAILED DESCRIPTION

Figure 1:
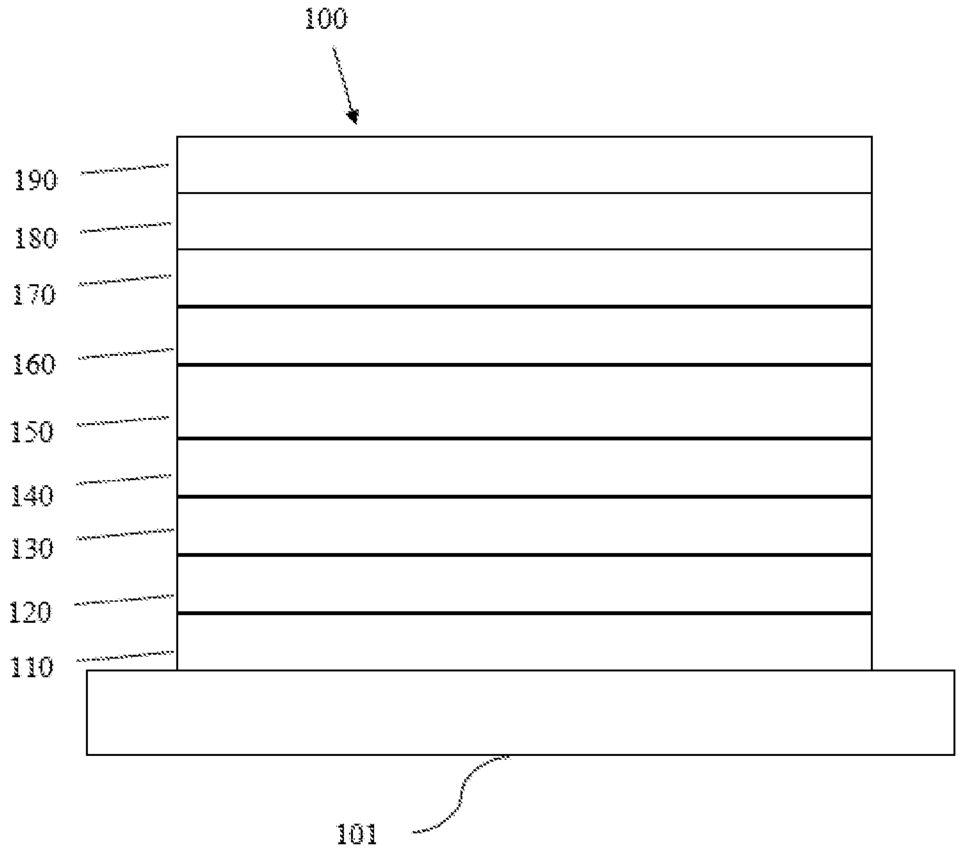
FIG. 1 is a schematic diagram of an organic light-emitting apparatus that may include a metal complex and a compound composition disclosed herein.

OLEDs can be fabricated on various types of substrates such as glass, plastic, and metal foil. FIG. 1 schematically shows an organic light emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer ISO, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by wav of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may comprise a single layer or multiple layers.

Figure 2:
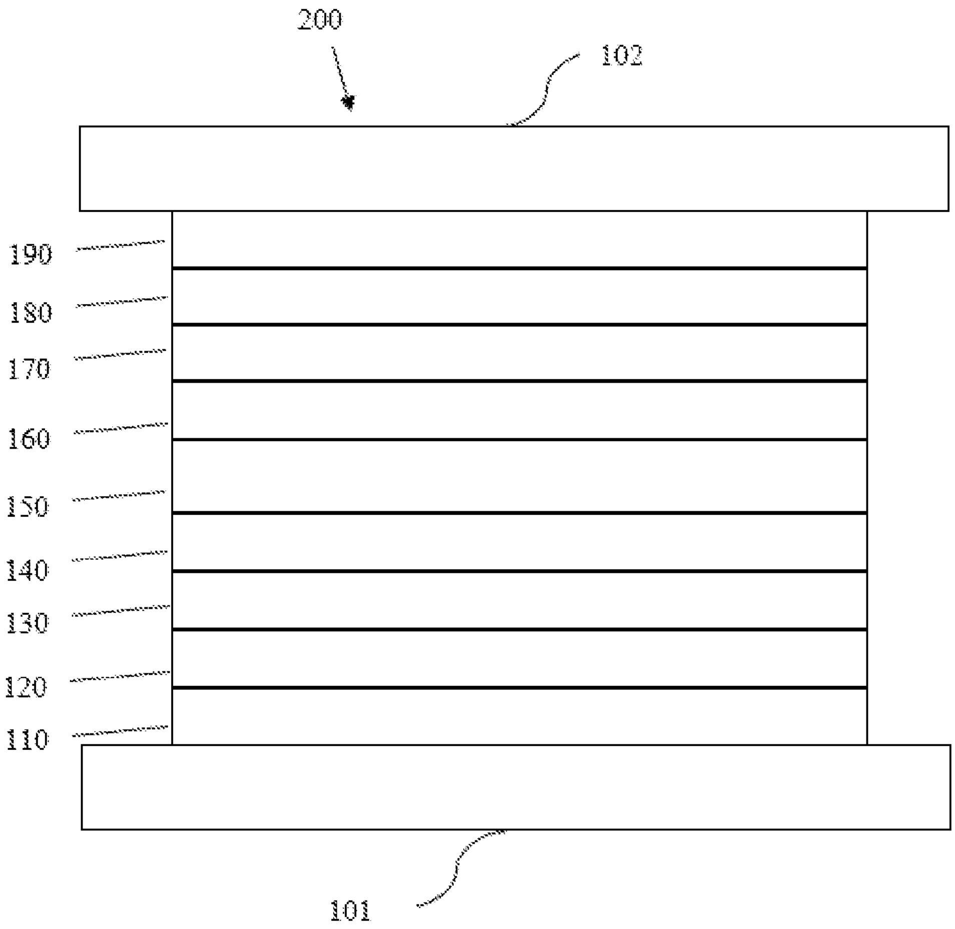
FIG. 2 is a schematic diagram of another organic light-emitting apparatus that may include a metal complex and a compound composition disclosed herein.
Figure 3:
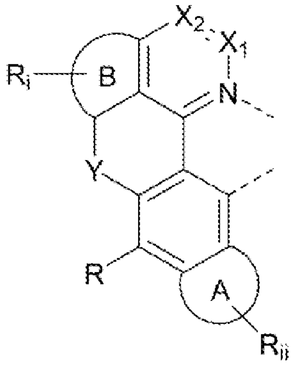
FIG. 3 is a diagram illustrating Formula 1 of the ligand $L_a$ of a metal complex disclosed herein.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—contemplates both straight and branched chain alkyl groups. The alkyl group may be an alkyl group having 1 to 20 carbon atoms, preferably an alkyl group having 1 to 12 carbon atoms, and more preferably an alkyl group having 1 to 6 carbon atoms. Examples of the alkyl group include methyl group, ethyl group, propyl group, isopropyl group, n-butyl group, s-butyl group, isobutyl group, t-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-heptadecyl group, n-octadecyl group, neopentyl group, 1-methyl pentyl group, 2-methylpentyl group, 1-pentylhexyl group, 1-butylpentyl group, 1-heptyloctyl group, and 3-methylpentyl group. Additionally, the alkyl group may be optionally substituted. The carbons in the alkyl chain can be replaced by other hetero atoms. Of the above, preferred are methyl group, ethyl group, propyl group, isopropyl group, n-butyl group, s-butyl group, isobutyl group, t-butyl group, n-pentyl group, and neopentyl group.

Cycloalkyl—as used herein contemplates cyclic alkyl groups. Preferred cycloalkyl groups are those containing 4 to 10 ring carbon atoms and include cyclobutyl, cyclopentyl, cyclohexyl, 4-methylcyclohexyl, 4,4-dimethylcyclohexyl, 1-adamantyl, 2-adamantyl, 1-norbornyl, 2-norbornyl and the like. Additionally, the cycloalkyl group may be optionally substituted. The carbons in the ring can be replaced by other hetero atoms.

Alkenyl—as used herein contemplates both straight and branched chain alkene groups. Preferred alkenyl groups are those containing 2 to 15 carbon atoms. Examples of the alkenyl group include vinyl group, allyl group, 1-butenyl group, 2-butenyl group, 3-butenyl group, 1,3-butanedienyl group, 1-methyl vinyl group, styryl group, 2,2-diphenylvinyl group, 1,2-diphenylvinyl group, 1-methylallyl group, 1,1-dimethylallyl group, 2-methylallyl group, 1-phenylallyl group, 2-phenylallyl group, 3-phenylallyl group, 3,3-diphenylallyl group, 1,2-dimethylallyl group, 1-phenyl 1-butenyl group, and 3-phenyl-1-butenyl group. Additionally, the alkenyl group may be optionally substituted.

Alkynyl—as used herein contemplates both straight and branched chain alkyne groups. Preferred alkynyl groups are those containing 2 to 15 carbon atoms. Additionally, the alkynyl group may be optionally substituted.

Aryl or aromatic group—as used herein includes noncondensed and condensed systems. Preferred aryl groups are those containing six to sixty carbon atoms, preferably six to twenty carbon atoms, more preferably six to twelve carbon atoms. Examples of the aryl group include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Additionally, the aryl group may be optionally substituted. Examples of the non-condensed aryl group include phenyl group, biphenyl-2-yl group, biphenyl-3-yl group, biphenyl-4-yl group, p-terphenyl-4-yl group, p-terphenyl-3-yl group, p-terphenyl-2-yl group, m-terphenyl-4-yl group, m-terphenyl-3-yl group, m-terphenyl-2-yl group, o-tolyl group, m-tolyl group, p-tolyl group, p-t-butylphenyl group, p-(2-phenylpropyl)phenyl group, 4'-methylbiphenylyl group, 4"-t-butyl p-terphenyl-4-yl group, o-cumenyl group, m-cumenyl group, p-cumenyl group, 2,3-xylyl group, 3,4-xylyl group, 2,5-xylyl group, mesityl group, and m-quarterphenyl group.

Heterocyclic group or heterocycle—as used herein includes aromatic and non-aromatic cyclic groups. Heteroaromatic also means heteroaryl. Preferred non-aromatic heterocyclic groups are those containing 3 to 7 ring atoms which include at least one hetero atom such as nitrogen, oxygen, and sulfur. The heterocyclic group can also be an aromatic heterocyclic group having at least one heteroatom selected from nitrogen atom, oxygen atom, sulfur atom, and selenium atom.

Heteroaryl—as used herein includes non condensed and condensed hetero-aromatic groups that may include from one to five heteroatoms. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—it is represented by —O-Alkyl. Examples and preferred examples thereof are the same as those described above. Examples of the alkoxy group having 1 to 20 carbon atoms, preferably 1 to 6 carbon atoms include methoxy group, ethoxy group, propoxy group, butoxy group, pentyloxy group, and hexyloxy group. The alkoxy group having 3 or more carbon atoms may be linear, cyclic or branched.

Aryloxy—it is represented by —O-Aryl or —O-heteroaryl. Examples and preferred examples thereof are the same as those described above. Examples of the aryloxy group having 6 to 40 carbon atoms include phenoxy group and biphenyloxy group.

Arylalkyl—as used herein contemplates an alkyl group that has an aryl substituent. Additionally, the arylalkyl group may be optionally substituted. Examples of the arylalkyl group include benzyl group, 1-phenylethyl group, 2-phenylethyl group, 1-phenylisopropyl group, 2-phenylisopropyl group, phenyl-t-butyl group, alpha-naphthylmethyl group, 1-alpha-naphthylethyl group, 2-alpha-naphthylethyl group, 1-alpha-naphthylisopropyl group, 2-alpha-naphthylisopropyl group, beta-naphthylmethyl group, 1-beta-naphthylethyl group, 2-beta-naphthylethyl group, 1-beta-naphthylisopropyl group, 2-beta-naphthylisopropyl group, p-methylbenzyl group, m-methylbenzyl group, o-methylbenzyl group, p-chlorobenzyl group, m-chlorobenzyl group, o-chlorobenzyl group, p-bromobenzyl group, m-bromobenzyl group, o-bromobenzyl group, p-iodobenzyl group, m-iodobenzyl group, o-iodobenzyl group, p-hydroxybenzyl group, m-hydroxybenzyl group, o-hydroxybenzyl group, p-aminobenzyl group, m-aminobenzyl group, o-aminobenzyl group, p-nitrobenzyl group, m-nitrobenzyl group, o-nitrobenzyl group, p-cyanobenzyl group, m-cyanobenzyl group, o-cyanobenzyl group, 1-hydroxy-2-phenylisopropyl group, and 1-chloro-2-phenylisopropyl group. Of the above, preferred are benzyl group, p-cyanobenzyl group, m-cyanobenzyl group, o-cyanobenzyl group, 1-phenylethyl group, 2-phenylethyl group, 1-phenylisopropyl group, and 2-phenylisopropyl group.

The term "aza" in azadibenzofuran, aza-dibenzothiophene, etc. means that one or more of the C—H groups in the respective aromatic fragment are replaced by a nitrogen atom. For example, azatriphenylene encompasses dibenzo[f,h]quinoxaline, dibenzo[f,h]quinoline and other analogues with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted arylalkyl, substituted alkoxy, substituted aryloxy, substituted alkenyl, substituted aryl, substituted heteroaryl, substituted alkylsilyl, substituted arylsilyl, substituted amine, substituted acyl, substituted carbonyl, substituted carboxylic acid group, substituted ester group, substituted sulfinyl, substituted sulfonyl and substituted phosphino is used, it means that any group of alkyl, cycloalkyl, heteroalkyl, arylalkyl, alkoxy, aryloxy, alkenyl, aryl, heteroaryl, alkylsilyl, arylsilyl, amine, acyl, carbonyl, carboxylic acid group, ester group, sulfinyl, sulfonyl and phosphino may be substituted with one or more groups selected from the group consisting of deuterium, a halogen, an unsubstituted alkyl group having 1 to 20 carbon atoms, an unsubstituted cycloalkyl group having 3 to 20 ring carbon atoms, an unsubstituted heteroalkyl group having 1 to 20 carbon atoms, an unsubstituted arylalkyl group having 7 to 30 carbon atoms, an unsubstituted alkoxy group having 1 to 20 carbon atoms, an unsubstituted aryloxy group having 6 to 30 carbon atoms, an unsubstituted alkenyl group having 2 to 20 carbon atoms, an unsubstituted aryl group having 6 to 30 carbon atoms, an unsubstituted heteroaryl group having 3 to 30 carbon atoms, an unsubstituted alkylsilyl group having 3 to 20 carbon atoms, an unsubstituted arylsilyl group having 6 to 20 carbon atoms, an unsubstituted amino group having 0 to 20 carbon atoms, an acyl group, a carbonyl group, a carboxylic acid group, an ester group, a nitrile group, an isonitrile group, a sulfanyl group, a sulfinyl group, a sulfonyl group and a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different wav s of designating a substituent or attached fragment are considered to be equivalent.

In the compounds mentioned in the present disclosure, the hydrogen atoms can be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitutions refer to a range that includes a double substitution, up to the maximum available substitutions. When a substitution in the compounds mentioned in the present disclosure represents multiple substitutions (including di, tri, tetra substitutions etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot connect to form a ring unless otherwise explicitly defined, for example, adjacent substituents can be optionally joined to form a ring. In the compounds mentioned in the present disclosure, adjacent substituents can be optionally joined to form a ring, including both the case where adjacent substituents can be joined to form a ring, and the case where adjacent substituents are not joined to form a ring. When adjacent substituents can be optionally joined to form a ring, the ring formed may be monocyclic or polycyclic, as well as alicyclic, heteroalicyclic, aromatic or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

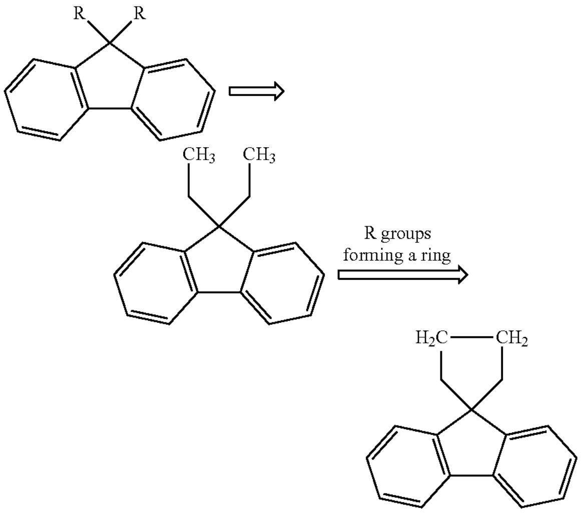

The expression that adjacent substituents can be optionally joined to form a ring is also intended to mean that two substituents bonded to carbon atoms which are directly bonded to each other are joined to each other via a chemical bond to form a ring, which can be exemplified by the following formula:

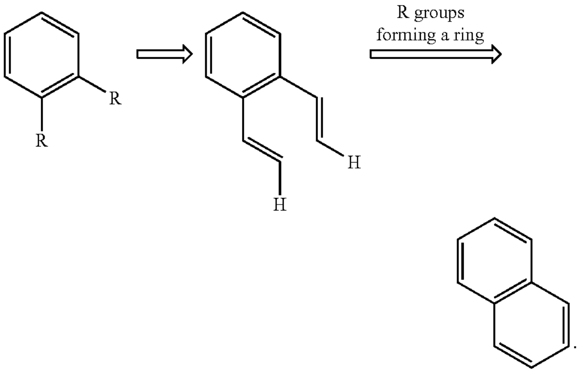

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

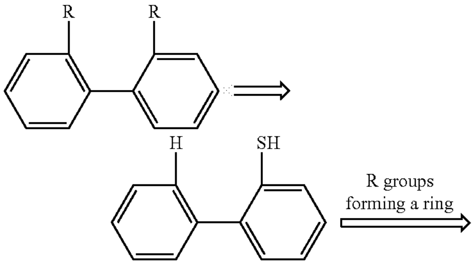

-continued

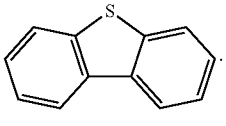

.

According to an embodiment of the present disclosure, disclosed is a metal complex including a ligand $L_a$ having a structure represented by Formula 1:

Formula 1

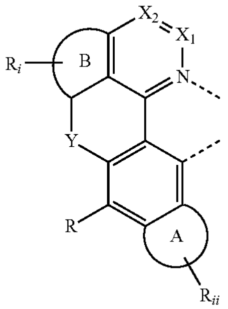

wherein the ring A and the ring B are each independently selected from a five-membered unsaturated carbocyclic ring, an aromatic ring having 6 to 30 carbon atoms, or a heteroaromatic ring having 3 to 30 carbon atoms;

$R_i$ represents, at each occurrence identically or differently, mono-substitution, multiple substitutions or non-substitution; and $R_{ii}$ represents, at each occurrence identically or differently, mono-substitution, multiple substitutions or non-substitution;

Y is selected from $SiR_yR_y$, $GeR_yR_y$, $NR_y$, $PR_y$, O, S or Se; when two $R_y$ are present at the same time, the two $R_y$ may be the same or different; for example, when Y is selected from $SiR_yR_y$, the two $R_y$ may be the same or different; in another example, when Y is selected from $GeR_yR_y$, the two $R_y$ may be the same or different;

$X_1$ and $X_2$ are, at each occurrence identically or differently, selected from $CR_x$ or N;

R, $R_i$, $R_{ii}$, $R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

adjacent substituents $R_i$, $R_x$, $R_y$, R and $R_{ii}$ can be optionally joined to form a ring; the metal is selected from a metal with a relative atomic mass greater than 40.

In the present disclosure, the expression that adjacent substituents $R_i$, $R_x$, $R_y$, R and Ru can be optionally joined to form a ring is intended to mean that any one or more of groups of adjacent substituents, such as two substituents $R_i$, two substituents $R_{ii}$, two substituents $R_y$, two substituents $R_x$, substituents $R_i$ and $R_x$, substituents R and $R_y$, and substituents $R_{ii}$ and R, can be joined to form a ring. Obviously, these substituents may not be joined to form a ring.

According to an embodiment of the present disclosure, wherein the metal complex optionally contains other ligand(s) which is(are) optionally joined to the $L_a$ to form a tridentate ligand, a tetradentate ligand, a pentadentate ligand or a hexadentate ligand.

According to an embodiment of the present disclosure, wherein the ring A and the ring B are each independently selected from a five-membered unsaturated carbocyclic ring, an aromatic ring having 6 to 18 carbon atoms, or a heteroaromatic ring having 3 to 18 carbon atoms.

According to an embodiment of the present disclosure, wherein the ring A or the ring B is each independently selected from a five-membered unsaturated carbocyclic ring, an aromatic ring having 6 to 18 carbon atoms, or a heteroaromatic ring having 3 to 18 carbon atoms.

According to an embodiment of the present disclosure, wherein the ring A and the ring B are each independently selected from a five-membered unsaturated carbocyclic ring, an aromatic ring having 6 to 10 carbon atoms, or a heteroaromatic ring having 3 to 10 carbon atoms.

According to an embodiment of the present disclosure, wherein the ring A or the ring B is each independently selected from a five-membered unsaturated carbocyclic ring, an aromatic ring having 6 to 10 carbon atoms, or a heteroaromatic ring having 3 to 10 carbon atoms.

According to an embodiment of the present disclosure, wherein the $L_a$ is selected from a structure represented by any one of Formula 2 to Formula 19 and Formula 22 to Formula 23;

Formula 2

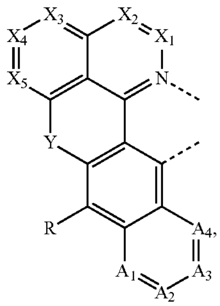

,

Formula 3

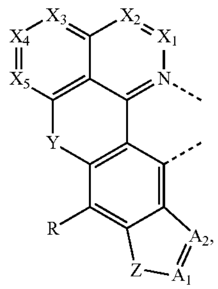

,

-continued
Formula 4
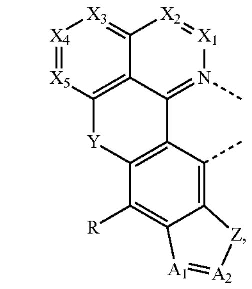
Formula 5
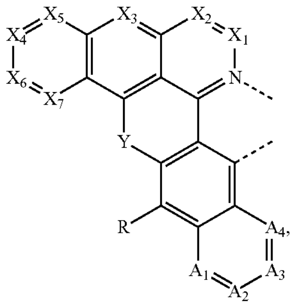
Formula 6
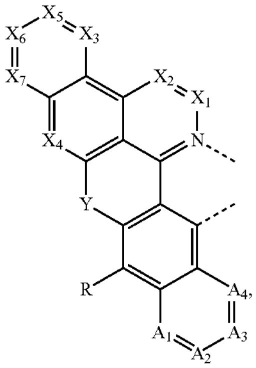
Formula 7
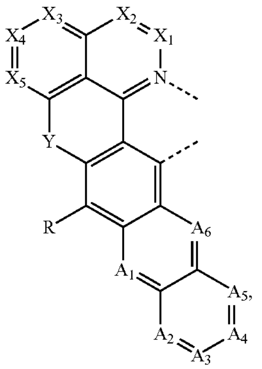
Formula 8
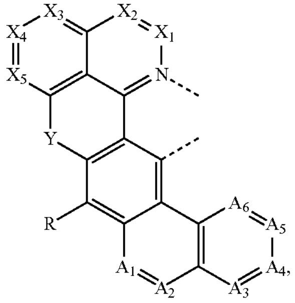
-continued
Formula 9
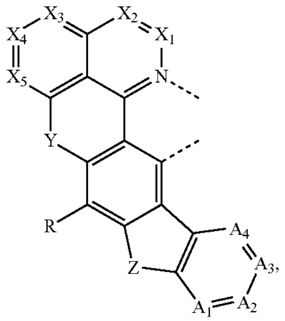
Formula 10
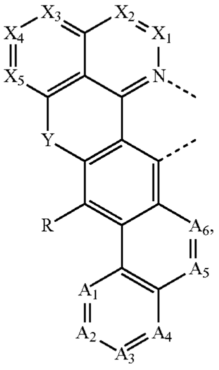
Formula 11
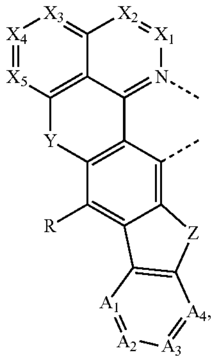
Formula 12
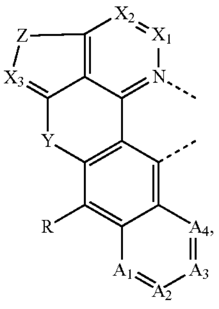

-continued

Formula 13

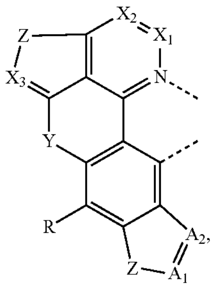

Formula 14

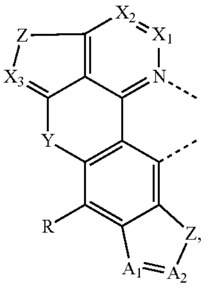

Formula 15

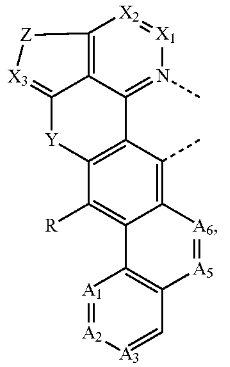

Formula 16

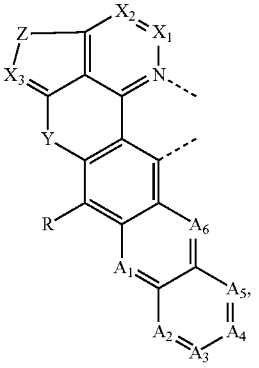

Formula 17

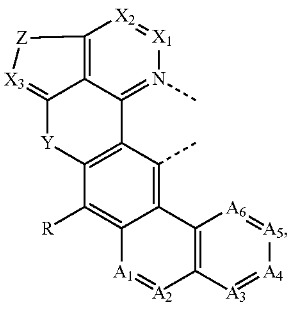

-continued

Formula 18

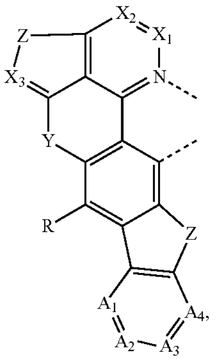

Formula 19

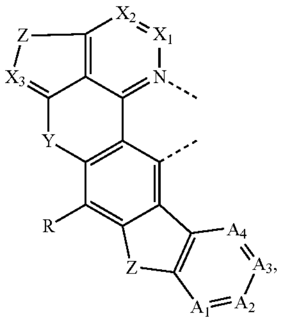

Formula 22

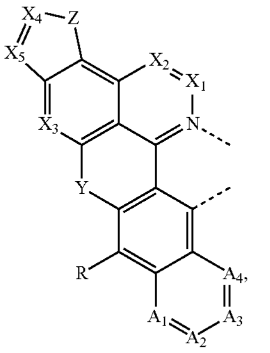

and

Formula 23

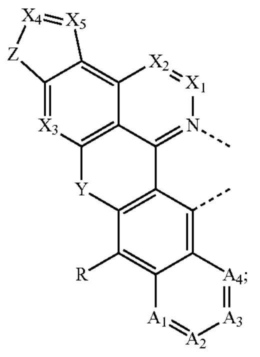

wherein in Formula 2 to Formula 19 and Formula 22 to Formula 23, $X_1$ and $X_2$ are each independently selected from $CR_x$ or N; $X_3$ to $X_7$ are each independently selected from $CR_i$ or N; and $A_1$ to $A_6$ are each independently selected from $CR_{ii}$ or N;

Z is, at each occurrence identically or differently, selected from $CR_{iii}R_{iii}$, $SiR_{iii}R_{iii}$, $PR_{iii}$, O, S or $NR_{iii}$; when two $R_{iii}$ are present at the same time, the two $R_{iii}$ are the same or different; for example, when Z is selected from $CR_{iii}R_{iii}$, the two $R_{iii}$ are the same or different; in another example, when Z is selected from $SiR_{iii}R_{iii}$, the two $R_{iii}$ are the same or different;

Y is selected from $SiR_yR_y$, $NR_y$, $PR_y$, O, S or Se; when two $R_y$ are present at the same time, the two $R_y$ may be the same or different; for example, when Y is selected from $SiR_yR_y$, the two $R_y$ may be the same or different;

R, $R_i$, $R_{ii}$, $R_x$, $R_y$ and $R_{iii}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

adjacent substituents R, $R_x$, $R_y$, $R_i$, $R_{ii}$ and $R_{iii}$ can be optionally joined to form a ring.

In the present disclosure, the expression that adjacent substituents R, $R_x$, $R_y$, $R_i$, $R_{ii}$ and $R_{iii}$ can be optionally joined to form a ring is intended to mean that any one or more of groups of adjacent substituents, such as two substituents $R_i$, two substituents $R_{ii}$, two substituents $R_x$, two substituents $R_y$, two substituents $R_{iii}$, substituents $R_i$ and $R_x$, substituents $R_{ii}$ and $R_{iii}$, substituents R and $R_y$, substituents $R_y$ and $R_{iii}$, and substituents R and $R_{iii}$, can be joined to form a ring. Obviously, these substituents may not be joined to form a ring.

According to an embodiment of the present disclosure, wherein, $L_a$ is selected from a structure represented by Formula 2, Formula 9, Formula 11 or Formula 12.

According to an embodiment of the present disclosure, wherein, $L_a$ is selected from a structure represented by Formula 2.

According to an embodiment of the present disclosure, wherein, in Formula 2 to Formula 19 and Formula 22 to Formula 23, at least one of $X_1$ to $X_n$ and/or $A_1$ to $A_m$ is selected from N, wherein the $X_n$ corresponds to one with the largest number of $X_1$ to $X_7$ in any one of Formula 2 to Formula 19 and Formula 22 to Formula 23, and the $A_m$ corresponds to one with the largest number of $A_1$ to $A_6$ in any one of Formula 2 to Formula 19 and Formula 22 to Formula 23. For example, in the case of Formula 2, the $X_n$ corresponds to one with the largest number of $X_1$ to $X_7$ in Formula 2, that is $X_5$; and the $A_m$ corresponds to one with the largest number of $A_1$ to $A_6$ in Formula 2, that is $A_4$. That is, in Formula 2, at least one of $X_1$ to $X_5$ and/or $A_1$ to $A_4$ is selected from N. In another example, in the case of Formula 12, the $X_n$ corresponds to one with the largest number of $X_1$ to $X_7$ in Formula 12, that is $X_3$; and the $A_m$ corresponds to one with the largest number of $A_1$ to $A_6$ in Formula 12, that is $A_4$. That is, in Formula 12, at least one of $X_1$ to $X_3$ and/or $A_1$ to $A_4$ is selected from N.

According to an embodiment of the present disclosure, wherein, in Formula 2 to Formula 19 and Formula 22 to Formula 23, at least one of $X_1$ to $X_n$ is selected from N, wherein the $X_n$ corresponds to one with the largest number of $X_1$ to $X_7$ in any one of Formula 2 to Formula 19 and Formula 22 to Formula 23.

According to an embodiment of the present disclosure, wherein, in Formula 2 to Formula 19 and Formula 22 to Formula 23, $X_2$ is N.

According to an embodiment of the present disclosure, wherein, in Formula 2 to Formula 19 and Formula 22 to Formula 23, $X_1$ and $X_2$ are each independently selected from $CR_x$; $X_3$ to $X_7$ are each independently selected from $CR_i$; $A_1$ to $A_6$ are each independently selected from $CR_{ii}$; and adjacent substituents $R_x$, $R_i$, $R_{ii}$ can be optionally joined to form a ring.

In this embodiment, the expression that adjacent substituents $R_x$, $R_i$, $R_a$ can be optionally joined to form a ring is intended to mean that any one or more of groups of adjacent substituents, such as two substituents $R_i$, two substituents $R_{ii}$, two substituents $R_x$, and substituents $R_i$ and $R_x$, can be joined to form a ring. Obviously, these substituents may not be joined to form a ring.

According to an embodiment of the present disclosure, in Formula 2 to Formula 19 and Formula 22 to Formula 23, $X_1$ and $X_2$ are each independently selected from $CR_x$; $X_3$ to $X_7$ are each independently selected from $CR_{ii}$ and $A_1$ to $A_6$ are each independently selected from $CR_{ii}$; and the $R_x$, $R_i$ and $R_{ii}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group and combinations thereof; and adjacent substituents $R_x$, $R_i$, $R_{ii}$ can be optionally joined to form a ring.

According to an embodiment of the present disclosure, in Formula 2 to Formula 19 and Formula 22 to Formula 23, $X_1$ and $X_2$ are each independently selected from $CR_x$; $X_3$ to $X_7$ are each independently selected from $CR_i$; and $A_1$ to $A_6$ are each independently selected from $CR_{ii}$; and at least two of the $R_x$, $R_i$ and $R_{ii}$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group and combinations thereof; and adjacent substituents $R_x$, $R_i$, $R_{ii}$ can be optionally joined to form a ring.

In this embodiment, the expression that at least two of the $R_x$, $R_i$ and $R_{ii}$ are, at each occurrence identically or differently, selected from the group of substituents is intended to mean that at least two substituents in the group consisting of two substituents $R_x$, all substituents $R_i$ and all substituents $R_{ii}$ are, at each occurrence identically or differently, selected from the group of substituents.

According to an embodiment of the present disclosure, wherein, in Formula 2 to Formula 19 and Formula 22 to Formula 23, $X_1$ and $X_2$ are each independently selected from $CR_x$; $X_3$ to $X_7$ are each independently selected from $CR_i$;

and $A_1$ to $A_6$ are each independently selected from $CR_{ii}$; and at least three of the $R_x$, $R_i$ and $R_{ii}$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group and combinations thereof; and adjacent substituents $R_x$, $R_i$, $R_{ii}$ can be optionally joined to form a ring.

In this embodiment, the expression that at least three of the $R_x$, $R_i$ and $R_{ii}$ are, at each occurrence identically or differently, selected from the group of substituents is intended to mean that at least three substituents in the group consisting of two substituents $R_x$, all substituents $R_i$ and all substituents $R_{ii}$ are, at each occurrence identically or differently, selected from the group of substituents.

According to an embodiment of the present disclosure, wherein, in Formula 2 to Formula 11 and Formula 22 to Formula 23, $X_4$ and $X_5$ are each independently selected from $CR_i$; and in Formula 12 to Formula 19, $X_3$ is selected from $CR_i$.

According to an embodiment of the present disclosure, wherein, in Formula 2 to Formula 11 and Formula 22 to Formula 23, $X_4$ or $X_5$ is selected from $CR_i$; and in Formula 12 to Formula 19, $X_3$ is selected from $CR_i$.

According to an embodiment of the present disclosure, wherein, in Formula 2 to Formula 11 and Formula 22 to Formula 23, $X_4$ and $X_5$ are each independently selected from $CR_i$; and in Formula 12 to Formula 19, $X_3$ is selected from $CR_i$; and the $R_i$ is, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group or a combination thereof.

According to an embodiment of the present disclosure, wherein, in Formula 2 to Formula 11 and Formula 22 to Formula 23, $X_4$ or $X_5$ is selected from $CR_i$, and in Formula 12 to Formula 19, $X_3$ is selected from $CR_i$; and the $R_i$ is, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group or a combination thereof.

According to an embodiment of the present disclosure, wherein, in Formula 2 to Formula 11 and Formula 22 to Formula 23, $X_4$ and $X_5$ are each independently selected from $CR_i$; and in Formula 12 to Formula 19, $X_3$ is selected from $CR_{ii}$ and the $R_i$ is, at each occurrence identically or differently, selected from the group consisting of: hydrogen, deuterium, fluorine, methyl, ethyl, isopropyl, isobutyl, t-butyl, neopentyl, cyclopentyl, cyclopentylmethyl, cyclohexyl, norbornyl, adamantyl, trimethylsilyl, isopropyldimethylsilyl, phenyldimethylsilyl, trifluoromethyl, cyano, phenyl and combinations thereof.

According to an embodiment of the present disclosure, wherein, in Formula 2 to Formula 11 and Formula 22 to Formula 23, $X_4$ or $X_5$ is selected from $CR_{ii}$ and in Formula 12 to Formula 19, $X_3$ is selected from $CR_{ii}$ and the $R_i$ is, at each occurrence identically or differently, selected from the group consisting of: hydrogen, deuterium, fluorine, methyl, ethyl, isopropyl, isobutyl, t-butyl, neopentyl, cyclopentyl, cyclopentylmethyl, cyclohexyl, norbornyl, adamantyl, trimethylsilyl, isopropyldimethylsilyl, phenyldimethylsilyl, trifluoromethyl, cyano, phenyl and combinations thereof.

According to an embodiment of the present disclosure, wherein, in Formula 2 to Formula 19 and Formula 22 to Formula 23, R is selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein, in Formula 2 to Formula 19 and Formula 22 to Formula 23, R is selected from hydrogen, deuterium, fluorine, methyl, ethyl, isopropyl, isobutyl, t-butyl, neopentyl, cyclopentyl, cyclopentylmethyl, deuterated methyl, deuterated ethyl, deuterated isopropyl, deuterated t-butyl, deuterated neopentyl, deuterated cyclopentyl, deuterated cyclopentylmethyl, deuterated cyclohexyl, trimethylsilyl or a combination thereof.

According to an embodiment of the present disclosure, wherein, in Formula 2 to Formula 19 and Formula 22 to Formula 23, Y is selected from O or S.

According to an embodiment of the present disclosure, wherein, in Formula 2 to Formula 19 and Formula 22 to Formula 23, Y is selected from O.

According to an embodiment of the present disclosure, wherein, in Formula 2 to Formula 19 and Formula 22 to Formula 23, $X_1$ and $X_2$ are each independently selected from $CR_x$.

According to an embodiment of the present disclosure, wherein, in Formula 2 to Formula 19 and Formula 22 to Formula 23, $X_1$ and $X_2$ are each independently selected from $CR_x$; and the $R_x$ is, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein, in Formula 2 to Formula 19 and Formula 22 to Formula 23, $X_1$ is selected from $CR_x$ and $X_2$ is N.

According to an embodiment of the present disclosure, wherein, in Formula 2 to Formula 19 and Formula 22 to Formula 23, $X_1$ is selected from $CR_x$ and $X_2$ is N; and the $R_x$ is, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein, the ligand $L_a$ has a structure represented by Formula 20 or Formula 21:

Formula 20

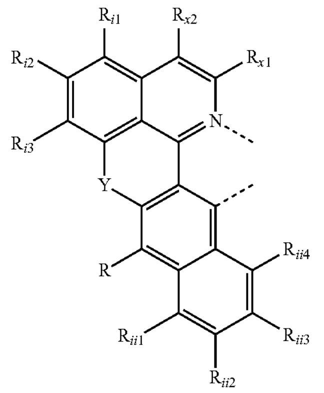

Formula 21

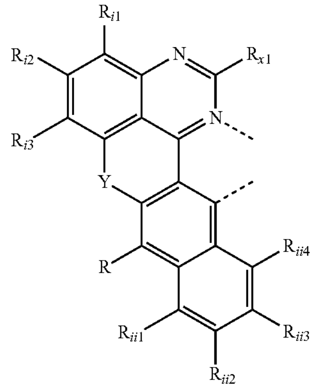

wherein in Formula 20 and Formula 21,

Y is selected from O or S;

$R_{x1}$, $R_{x2}$, $R_{i1}$, $R_{i2}$, $R_{i3}$, $R_{ii1}$, $R_{ii2}$, $R_{ii3}$ and $R_{ii4}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms and combinations thereof.

According to an embodiment of the present disclosure, the ligand $L_a$ has a structure represented by Formula 20 or Formula 21:

Formula 20

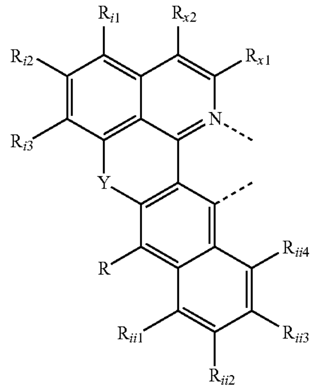

Formula 21

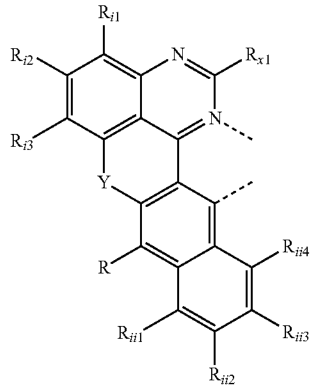

wherein in Formula 20 and Formula 21,

Y is selected from O or S;

at least one or two of $R_{x1}$, $R_{x2}$, $R_{i1}$, $R_{i2}$ and $R_{i3}$ and/or of $R_{ii1}$, $R_{ii2}$, $R_{ii3}$ and $R_{ii4}$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof; R is selected from halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein, the ligand $L_a$ has a structure represented by Formula 20 or Formula 21:

Formula 20

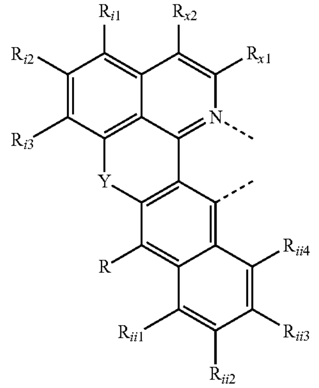

Formula 21

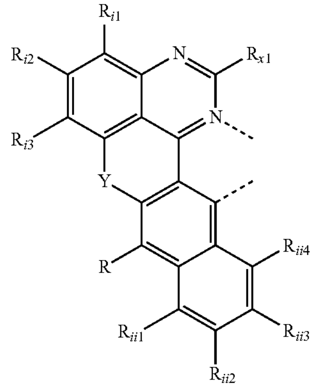

wherein in Formula 20 and Formula 21,

Y is selected from O or S;

at least one or two of $R_{x1}$, $R_{x2}$, $R_{i1}$, $R_{i2}$ and $R_{i3}$ and/or of $R_{ii1}$, $R_{ii2}$, $R_{ii3}$ and $R_{ii4}$ are, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof; R is selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

According to an embodiment of the present disclosure, wherein, the ligand $L_a$ has a structure represented by Formula 20 or Formula 21:

Formula 20

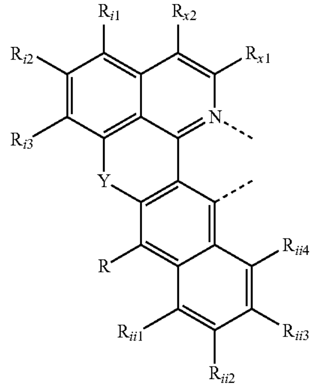

Formula 21

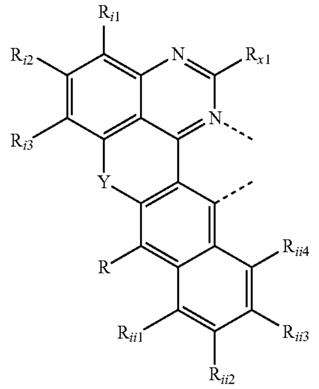

wherein in Formula 20 and Formula 21,

Y is selected from O or S;

$R_{i2}$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof; and R is selected from the group consisting of: halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof; and at least one or two of $R_{ii1}$, $R_{ii2}$, $R_{ii3}$ and $R_{ii4}$ are, at each occurrence identically or differently, selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof.

According to an embodiment of the present disclosure, wherein, the ligand $L_a$ has a structure represented by Formula 20 or Formula 21:

Formula 20

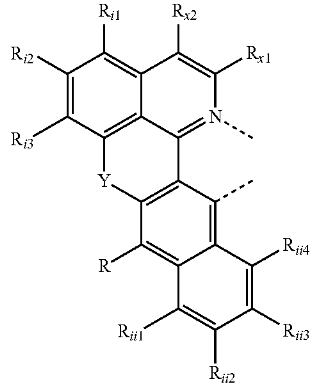

Formula 21

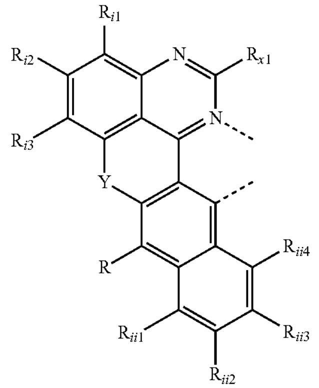

wherein in Formula 20 and Formula 21,

Y is selected from O or S;

$R_{i2}$ is selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof; and R is selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof; and at least one or two of $R_{ii1}$, $R_{ii2}$, $R_{ii3}$ and $R_{ii4}$ are, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof.

According to an embodiment of the present disclosure, wherein, in Formula 20 and Formula 21, one (for example, $R_{ii1}$ or $R_{ii2}$ or $R_{ii3}$) or two (for example, $R_{ii1}$ and $R_{ii2}$, or $R_{ii2}$ and $R_{ii3}$, or $R_{ii1}$ and $R_{ii3}$) of $R_{ii1}$, $R_{ii2}$ and $R_{ii3}$ are, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof.

According to an embodiment of the present disclosure, wherein, in Formula 20 and Formula 21, at least one of $R_{x1}$, $R_{x2}$, $R_{i1}$, $R_{i2}$, $R_{i3}$, $R_{ii1}$, $R_{ii2}$, $R_{ii3}$, $R_{ii4}$ and R is, at each occurrence identically or differently, selected from the group consisting of: substituted or unsubstituted alkyl having 3 to 20 carbon atoms, substituted or unsubstituted cycloalkyl having 3 to 20 ring carbon atoms, substituted or unsubstituted alkylsilyl having 3 to 20 carbon atoms and combinations thereof.

In this embodiment, the expression that at least one of $R_{x1}$, $R_{x2}$, $R_{i1}$, $R_{i2}$, $R_{i3}$, $R_{ii1}$, $R_{ii2}$, $R_{ii3}$, $R_{ii4}$ and R is, at each occurrence identically or differently, selected from the group of substituents is intended to mean that: at least one of $R_{x1}$ and $R_{x2}$ is, at each occurrence identically or differently, selected from the group of substituents, and/or at least one of $R_{ii}$, Ru and $R_{13}$ is, at each occurrence identically or differently, selected from the group of substituents, and/or at least one of $R_{ii1}$, $R_{ii2}$, $R_{ii3}$ and $R_{ii4}$ is, at each occurrence identically or differently, selected from the group of substituents, and/or R is selected from the group of substituents.

According to an embodiment of the present disclosure, wherein, in Formula 20 and Formula 21, at least one of $R_{i2}$, $R_{i3}$, $R_{ii1}$, $R_{ii2}$, $R_{ii3}$ and R is, at each occurrence identically or differently, selected from the group consisting of: substituted or unsubstituted alkyl having 3 to carbon atoms, substituted or unsubstituted cycloalkyl having 3 to 20 ring carbon atoms, substituted or unsubstituted alkylsilyl having 3 to 20 carbon atoms and combinations thereof.

In this embodiment, the expression that at least one of $R_{i2}$, $R_{i3}$, $R_{ii1}$, $R_{ii2}$, $R_{ii3}$ and R is, at each occurrence identically or differently, selected from the group of substituents is intended to mean that: at least one of $R_{i2}$ and $R_{i3}$ is, at each occurrence identically or differently, selected from the group of substituents, and/or at least one of $R_{ii1}$, $R_{ii2}$ and $R_{ii3}$ is, at each occurrence identically or differently, selected from the group of substituents, and/or R is selected from the group of substituents.

According to an embodiment of the present disclosure, wherein, in Formula 20 and Formula 21, at least one of $R_{x1}$, $R_{x2}$, $R_{i1}$, $R_{i2}$, $R_{i3}$, $R_{ii1}$, $R_{ii2}$, $R_{ii3}$, $R_{ii4}$ and R is, at each occurrence identically or differently, selected from the group consisting of: substituted or unsubstituted alkyl having 3 to 10 carbon atoms, substituted or unsubstituted cycloalkyl having 3 to 10 ring carbon atoms and combinations thereof.

In this embodiment, the expression that at least one of $R_{x1}$, $R_{x2}$, $R_{i1}$, $R_{i2}$, $R_{i3}$, $R_{ii1}$, $R_{ii2}$, $R_{ii3}$, $R_{ii4}$ and R is, at each occurrence identically or differently, selected from the group of substituents is intended to mean that: at least one of $R_{x1}$ and $R_{x2}$ is, at each occurrence identically or differently, selected from the group of substituents, and/or at least one of $R_{ii}$, Ru and $R_{13}$ is, at each occurrence identically or differently, selected from the group of substituents, and/or at least one of $R_{ii1}$, $R_{ii2}$, $R_{ii3}$ and $R_{ii4}$ is, at each occurrence identically or differently, selected from the group of substituents, and/or R is selected from the group of substituents.

According to an embodiment of the present disclosure, wherein, $L_a$ is, at each occurrence identically or differently, selected from the group consisting of $L_{a1}$ to $L_{a1706}$, wherein the specific structures of the $L_{a1}$ to $L_{a1706}$ are referred to claim 14.

According to an embodiment of the present disclosure, wherein, $L_a$ is, at each occurrence identically or differently, selected from the group consisting of $L_{a1}$ to $L_{a1803}$, wherein the specific structures of the $L_{a1}$ to $L_{a1803}$ are referred to claim 14.

According to an embodiment of the present disclosure, wherein, $L_a$ is, at each occurrence identically or differently, selected from the group consisting of $L_{a1}$ to $L_{a1931}$, wherein the specific structures of the $L_{a1}$ to $L_{a1931}$ are referred to claim 14.

According to an embodiment of the present disclosure, wherein, hydrogens in structures of the $L_{a1}$ to $L_{a1931}$ may be partially or fully substituted by deuterium.

According to an embodiment of the present disclosure, wherein, the metal complex has a structure of $M(L_a)_m(L_b)_n(L_c)_q$;

wherein, the metal M is selected from a metal with a relative atomic mass greater than 40; $L_a$, $L_b$ and $L_c$ are a first ligand, a second ligand and a third ligand of the metal complex, respectively; m is 1, 2 or 3, n is 0, 1 or 2, q is 0, 1 or 2, and m+n+q is equal to the oxidation state of the metal M; when m is greater than 1, the multiple $L_a$ are the same or different; when n is 2, the two $L_b$ are the same or different; when q is 2, the two $L_c$ are the same or different;

$L_a$, $L_b$ and $L_c$ can be optionally joined to form a multi-dentate ligand; for example, $L_a$, $L_b$ and $L_c$ can be optionally joined to form a tetradentate ligand or a hexadentate ligand; it is possible that $L_a$, $L_b$ and $L_c$ are not joined, so that no multi-dentate ligand is formed;

$L_b$ and $L_c$ are, at each occurrence identically or differently, selected from the group consisting of the following structures:

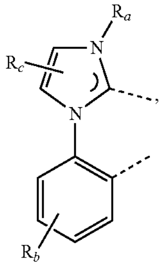
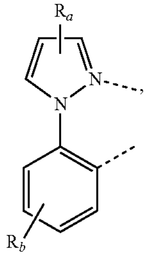
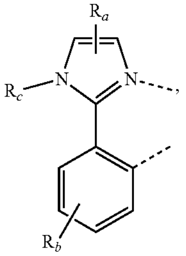
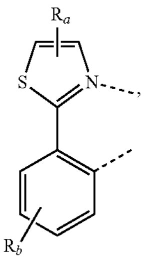
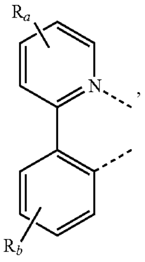
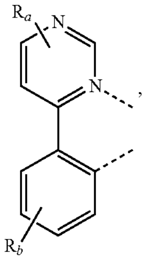

-continued

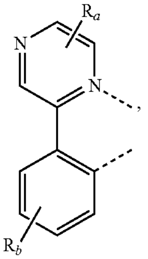
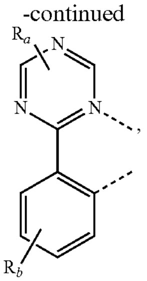
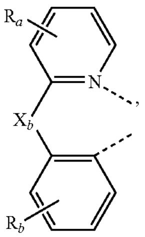
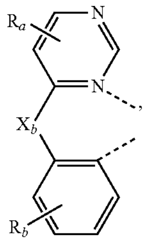
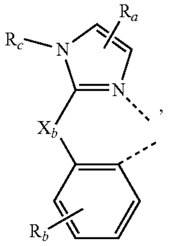
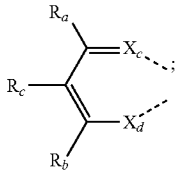

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{C1}R_{C2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

wherein adjacent substituents $R_a$, $R_b$, $R_c$, $R_{N1}$, $R_{N2}$, $R_{C1}$ and $R_{C2}$ can be optionally joined to form a ring.

In this embodiment, the expression that adjacent substituents $R_a$, $R_b$, $R_c$, $R_{N1}$, $R_{N2}$, $R_{C1}$ and $R_{C2}$ can be optionally joined to form a ring is intended to mean that any one or more of groups of adjacent substituents, such as two substituents $R_a$, two substituents $R_b$, two substituents $R_c$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_{C1}$, substituents $R_b$ and $R_{C2}$, substituents $R_b$ and $R_{C1}$, substituents $R_b$ and $R_{C2}$, substituents $R_a$ and $R_{N2}$, substituents $R_b$ and $R_{N2}$, and substituents $R_{C1}$ and $R_{C2}$, may be joined to form a ring. Obviously, these substituents may not be joined to form a ring.

In this embodiment, the expression that $L_a$, $L_b$ and $L_c$ can be optionally joined to form a multi-dentate ligand is intended to mean that any two or three of $L_a$, $L_b$ and $L_c$ can be joined to form a tetradentate ligand or a hexadentate ligand. Obviously, it is possible that $L_a$, $L_b$ and $L_c$ are not joined, so that no multi-dentate ligand is formed.

According to an embodiment of the present disclosure, wherein, the metal M is selected from Ir, Rh, Re, Os, Pt, Au or Cu.

According to an embodiment of the present disclosure, wherein, the metal M is selected from Ir, Pt or Os.

According to an embodiment of the present disclosure, wherein, the metal M is Ir.

According to an embodiment of the present disclosure, wherein, $L_b$ is, at each occurrence identically or differently, selected from the following structure:

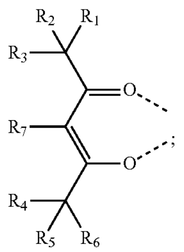

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof.

According to an embodiment of the present disclosure, wherein, $L_b$ is, at each occurrence identically or differently, selected from the following structure:

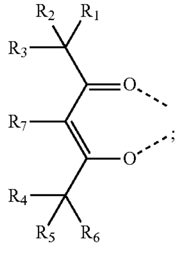

wherein at least one of $R_1$ to $R_3$ is selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein, $L_b$ is, at each occurrence identically or differently, selected from the following structure:

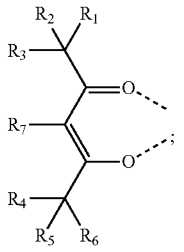

wherein at least two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_1$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

According to an embodiment of the present disclosure, wherein, $L_b$ is, at each occurrence identically or differently, selected from the following structure:

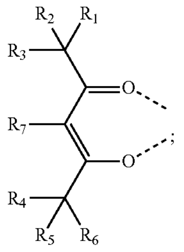

wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof; and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

According to an embodiment of the present disclosure, wherein, $L_b$ is, at each occurrence identically or differently, selected from the group consisting of $L_{b1}$ to $L_{b322}$, and $L_c$ is, at each occurrence identically or differently, selected from the group consisting of $L_{c1}$ to $L_{c231}$. The specific structures of the $L_{b1}$ to $L_{b322}$ and the $L_c$ to $L_{c231}$ are referred to claim 18.

According to an embodiment of the present disclosure, wherein, the metal complex has a structure of $Ir(L_a)_2(L_b)$ or $Ir(L_a)_2(L_c)$ or $Ir(L_a)(L_c)_2$;

wherein, when the metal complex has a structure of $Ir(L_a)_2(L_b)$, $L_a$ is, at each occurrence identically or differently, selected from any one or any two of the group consisting of $L_{a1}$ to $L_{a1706}$ and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1706}$ and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a1706}$ and $L_c$ is, at each occurrence identically or differently, selected from any one or any two of the group consisting of $L_{c1}$ to $L_{c231}$.

According to an embodiment of the present disclosure, wherein, the metal complex has a structure of $Ir(L_a)_2(L_b)$ or $Ir(L_a)_2(L_c)$ or $Ir(L_a)(L_c)_2$;

wherein, when the metal complex has a structure of $Ir(L_a)_2(L_b)$, $L_a$ is, at each occurrence identically or differently, selected from any one or any two of the group consisting of $L_{a1}$ to $L_{a1803}$ and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1803}$ and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a1803}$ and $L_c$ is, at each occurrence identically or differently, selected from any one or any two of the group consisting of $L_{c1}$ to $L_{c231}$.

According to an embodiment of the present disclosure, wherein, the metal complex has a structure of $Ir(L_a)_2(L_b)$ or $Ir(L_a)_2(L_c)$ or $Ir(L_a)(L_c)_2$;

wherein, when the metal complex has a structure of $Ir(L_a)_2(L_b)$, $L_a$ is, at each occurrence identically or differently, selected from any one or any two of the group consisting of $L_{a1}$ to $L_{a1931}$ and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a1931}$ and $L_c$ is selected from any one of the group consisting of $L_{c1}$ to $L_{c231}$; and when the metal complex has a structure of $Ir(L_a)(L_c)_2$, $L_a$ is selected from any one of the group consisting of $L_{a1}$ to $L_{a1931}$ and $L_c$ is, at each occurrence identically or differently, selected from any one or any two of the group consisting of $L_{c1}$ to $L_{c231}$.

According to an embodiment of the present disclosure, wherein, the metal complex is selected from the group consisting of Compound 1 to Compound 260, wherein the specific structures of the Compound 1 to Compound 260 are referred to claim 19.

According to an embodiment of the present disclosure, wherein, the metal complex is selected from the group consisting of Compound 1 to Compound 290, wherein the specific structures of the Compound 1 to Compound 290 are referred to claim 19.

According to an embodiment of the present disclosure, wherein, the metal complex is selected from the group consisting of Compound 1 to compound 312, wherein the specific structures of the Compound 1 to Compound 312 are referred to claim 19.

According to an embodiment of the present disclosure, an electroluminescent device is further disclosed, comprising:

an anode, a cathode, and an organic layer disposed between the anode and the cathode, wherein the organic layer includes a metal complex including a ligand $L_a$ having a structure represented by Formula 1:

Formula 1

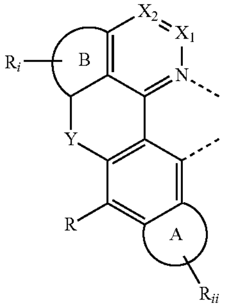

wherein the ring A and the ring B are each independently selected from a five-membered unsaturated carbocyclic ring, an aromatic ring having 6 to 30 carbon atoms, or a heteroaromatic ring having 3 to 30 carbon atoms;

$R_i$ represents, at each occurrence identically or differently, mono-substitution, multiple substitutions or non-substitution; and $R_{ii}$ represents, at each occurrence identically or differently, mono-substitution, multiple substitutions or non-substitution;

Y is selected from $SiR_yR_y$, $GeR_yR_y$, $NR_y$, $PR_y$, O, S or Se; when two $R_y$ are present at the same time, the two $R_y$ may be the same or different;

$X_1$ and $X_2$ are, at each occurrence identically or differently, selected from $CR_x$ or N;

R, $R_i$, $R_{ii}$, $R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof;

adjacent substituents $R_i$, $R_x$, $R_y$, R and $R_{ii}$ can be optionally joined to form a ring;

the metal is selected from a metal with a relative atomic mass greater than 40.

According to an embodiment of the present disclosure, in the electroluminescent device, the organic layer is a light-emitting layer and the metal complex is a light-emitting material.

According to an embodiment of the present disclosure, the electroluminescent device emits red light.

According to an embodiment of the present disclosure, the electroluminescent device emits white light.

According to an embodiment of the present disclosure, in the electroluminescent device, the organic layer is a light-emitting layer, wherein the light-emitting layer further includes at least one host material.

According to an embodiment of the present disclosure, in the electroluminescent device, the at least one host material includes at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to another embodiment of the present disclosure, further disclosed is a compound composition which includes a metal complex whose specific structure is as shown in any one of the embodiments described above.

Combination with Other Materials

The materials described in the present disclosure for a particular layer in an organic light emitting device can be used in combination with various other materials present in the device. The combinations of these materials are described in more detail in U.S. Pat. App. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light emitting device may be used in combination with a variety of other materials present in the device. For example, emissive dopants disclosed herein may be used in combination with a wide variety of hosts, transport layers, blocking layers, injection layers, electrodes and other layers that may be present. The combination of these materials is described in detail in paragraphs 0080-0101 of U.S. Pat. App. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this present disclosure.

Material Synthesis Example

The method for preparing a compound in the present disclosure is not limited herein. Typically, the following compounds are used as examples without limitations, and synthesis routes and preparation methods thereof are described below.

Synthesis Example 1: Synthesis of Compound 81

Step 1: Synthesis of Intermediate 2

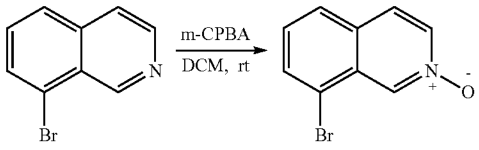

1 2

5 g (24.03 mmol) of Raw material 1 was dissolved in 50 mL of DCM, and 5.39 g (1.3 eq, 31.24 mmol) of meta-chloroperoxybenzoic acid (m-CPBA) was added at room temperature and stirred for 24 h. After TLC showed that the raw material disappeared, the solvents were removed in vacuo to obtain crude Intermediate 2 which was directly used in the next step.

Step 2: Synthesis of Intermediate 3

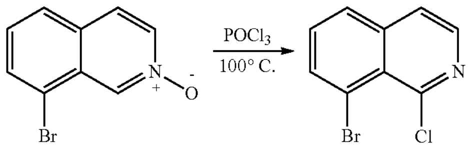

2 3

Intermediate 2 obtained in step 1 was dissolved in 24 mL of phosphorus oxychloride, warmed to 100° C., stirred for 3 h, and cooled to 0° C. An aqueous solution of NaOH was slowly added dropwise until the pH was 9 and the system was extracted three times with DCM (50 mL*3). The organic phases were combined, washed with a saturated aqueous solution of sodium chloride, and dried over anhydrous magnesium sulfate, and the solvents were removed in vacuo. The residue was purified through column chromatography (PE:EA=30:1) to obtain 1.98 g of Intermediate 3 with a yield of 34% over two steps.

Step 3: Synthesis of Intermediate 5

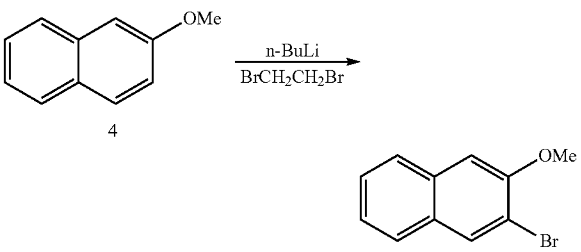

4

5

3 g (18.96 mmol) of Intermediate 4 was dissolved in 30 mL of anhydrous tetrahydrofuran and cooled to −78° C. n-BuLi (1 M, 22.75 mL) (1.2 eq, 22.75 mmol) was slowly added dropwise under a nitrogen atmosphere. After addition, the system was warmed to room temperature and stirred for 1 h. The system was cooled to −78° C. and 4.63 g (1.3 eq, 24.65 mmol) of 1,2-dibromoethane was slowly added dropwise. After addition, the system was warmed to room temperature and stirred overnight. The reaction was quenched with saturated ammonium chloride and extracted three times with EA (40 mL*3). The organic phases were combined, washed with a saturated aqueous solution of sodium chloride, and dried over anhydrous magnesium sulfate, and the solvents were removed in vacuo. The residue was purified through column chromatography (PE:EA=100:1) to obtain 3.82 g of Intermediate 5 with a yield of 85%.

Step 4: Synthesis of Intermediate 6

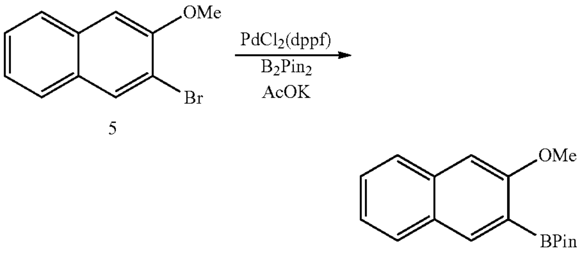

5

6

2.5 g (10.57 mmol) of Intermediate 5, 0.387 g (0.05 eq, 0.53 mmol) of PdCh(dppf), 1.56 g (1.5 eq, 15.85 mmol) of AcOK, 3.22 g (1.2 eq, 12.68 mmol) of bis(pinacolato) diboron ($B_2Pin_2$) were dissolved in 30 mL of 1,4-dioxane, heated to 80° C., and stirred overnight. The system was cooled to room temperature, the solvents were removed in vacuo, and the residue was purified through column chromatography (PE:EA=20:1) to obtain 2.21 g of Intermediate as a white solid with a yield of 74%.

Step 5: Synthesis of Intermediate 7

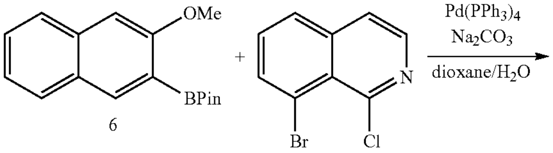

6

3

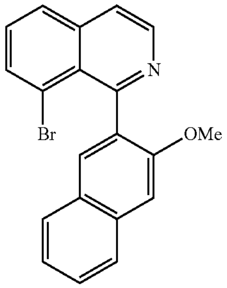

7

3.93 g (1.2 eq, 13.85 mmol) of Intermediate 6, 2.78 g (1 eq, 11.54 mmol) of Intermediate 3, 0.387 g (0.05 eq, 0.58 mmol) of $Pd(PPh_3)_4$, 1.83 g (1.5 eq, 17.31 mmol) of $Na_2CO_3$ were dissolved in 30 mL of 1,4-dioxane and 10 mL of water, heated to 90° C., and stirred overnight. The system was cooled to room temperature, the solvents were removed in vacuo, and the residue was purified through column chromatography (PE:EA=50:1) to obtain 3 g of Intermediate 7 as a white solid with a yield of 72%.

Step 6: Synthesis of Intermediate 8

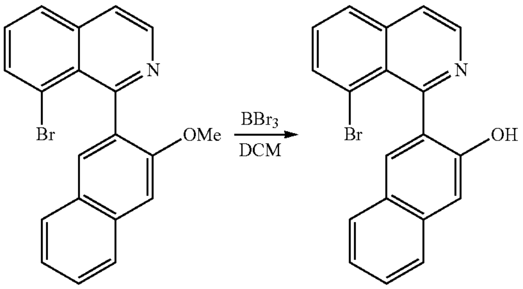

7

8

3.03 g (8.32 mmol) of Intermediate 7 was dissolved in 30 mL of DCM and cooled to 0° C. $BBr_3$ was slowly added dropwise under a nitrogen atmosphere and stirred for 2 h. The reaction was quenched with an aqueous solution of $NaHCO_3$ and extracted with DCM (60 mL*3). The organic phases were combined, washed with a saturated aqueous solution of sodium chloride, and dried over anhydrous magnesium sulfate, and the solvents were removed in vacuo. The residue was purified through column chromatography (PE:EA=4:1) to obtain 1.17 g of Intermediate 8 with a yield of 40%.

Step 7: Synthesis of Intermediate 9

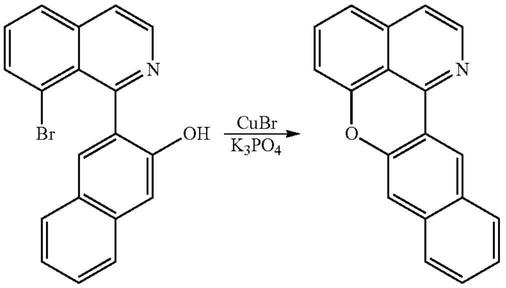

8 9

1.2 g (1 eq, 3.33 mmol) of Intermediate 8, 24 mg (0.05 eq, 0.17 mmol) of CuBr, and 2.82 g (4 eq, 13.3 mmol) of were dissolved in 15 mL of DMF, heat to 90° C., and stirred overnight. The system was cooled to room temperature and diluted with water to precipitate out a product. The product was filtered through Celite and washed with 1 L of DCM to obtain 0.81 g of Intermediate 9 with a yield of 90%. The obtained yellow solid Intermediate 9 was recrystallized from toluene. The obtained solid Intermediate 9 had a purity of 99.7%.

Step 8: Synthesis of an Iridium Dimer

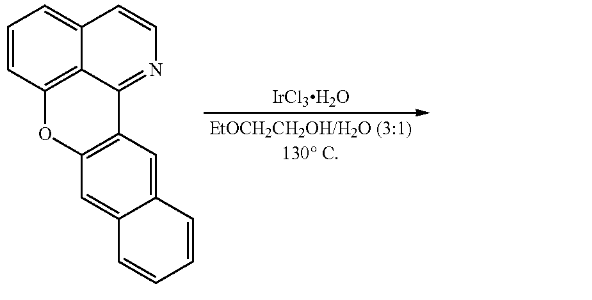

9

1.2 g (3 eq, 4.45 mmol) of Intermediate 9 was dissolved in 24 mL of 2-ethoxyethanol and 8 mL of water at room temperature, 523 mg (1 eq, 1.48 mmol) of $IrCl_3.3H_2O$ were added, and the system was purged with nitrogen three times at room temperature, heated to 130° C., refluxed for 24 h at 130° C., and cooled to room temperature. The system was filtered to obtain solids, and the solids were washed with ethanol until the washing liquid was colorless and suction-filtered for about 15 min until ethanol on the solids completely disappeared, to obtain 1.13 g of an iridium dimer as a red solid with a yield of 99%. The iridium dimer was directly used in the next step without further purification.

Step 9: Synthesis of Compound 81

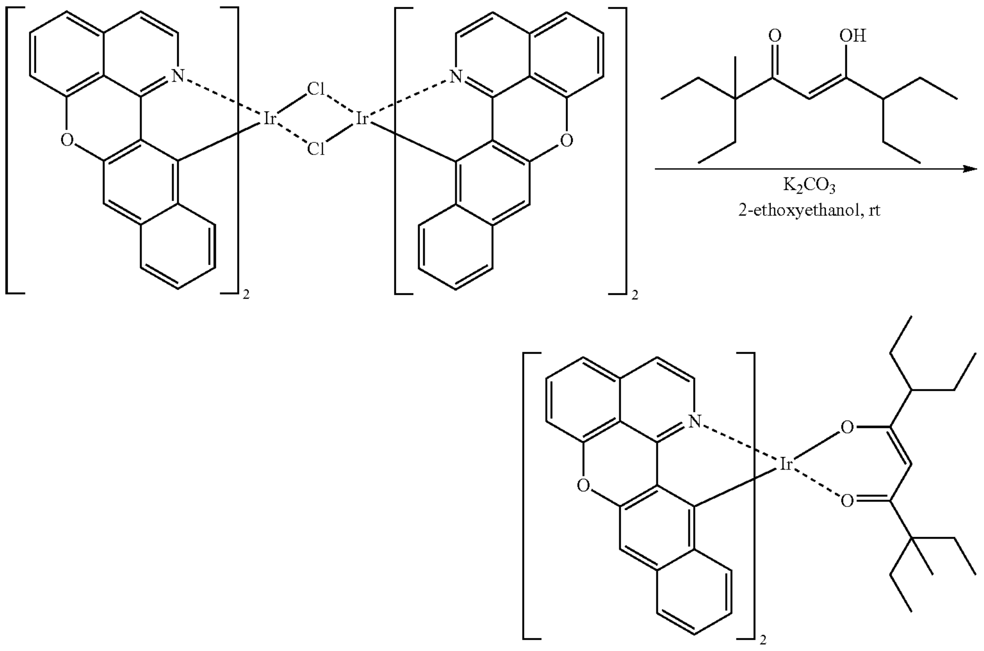

1.13 g (1 eq, 0.74 mmol) of the iridium dimer obtained in step 8 was added to a 100 mL round-bottom flask, 510 mg (5 eq, 3.7 mmol) of $K_2CO_3$ and 0.74 g (4 eq, 2.96 mmol) of 3,7-diethyl-3-methyl-4,6-nonanedione were added, and the system was purged with nitrogen three times at room temperature, stirred under nitrogen protection for 24 h, and filtered through Celite. The solids were washed with ethanol until the washing liquid was colorless and suction-filtered for about 15 min to remove ethanol adsorbed to the solids. Under vacuum filtration, the red solids on the Celite were dissolved in 200 mL of dichloromethane. 20 mL of ethanol was added to the flask, and dichloromethane was removed in vacuo. A product was precipitated from the remaining ethanol and filtered, and ethanol adsorbed to the solids was removed completely through suction filtration. The solids were purified through silica gel column chromatography (PE:DCM=10:1). The obtained crude solids were dissolved in 200 mL of dichloromethane. 20 mL of ethanol was added, and dichloromethane was removed in vacuo. A product was precipitated from the remaining ethanol and filtered, and ethanol adsorbed to the solids was removed completely through suction filtration to obtain Compound 81 as a red solid (with a mass of 1.13 g and a yield of 80%). The purity of Compound 81 was 99.6%. The product was confirmed as the target product with a molecular weight of 954.3.

Synthesis Example 2: Synthesis of Compound 83

Step 1: Synthesis of Intermediate 11

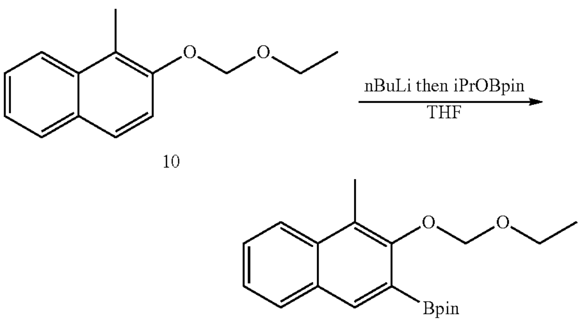

10

11

Intermediate 10 (7.6 g, 35.1 mmol) was dissolved in 70 mL of ultra-dry tetrahydrofuran, the reaction solution was cooled to 0° C., and a solution of n-butyl lithium (15.5 mL, 38.7 mmol) was added dropwise thereto under nitrogen protection. After the dropwise addition, the reaction was maintained at this temperature for 1 h, isopropyl pinacol borate (iPrOBpin) (8.49 g, 45.6 mmol) was added thereto, and after addition, the reaction was warmed to room temperature for 2 h. Then, the reaction was quenched with a saturated solution of ammonium chloride. Ethyl acetate was added to the reaction, liquids were separated, and the aqueous phase was extracted with ethyl acetate. The organic phases were combined, dried, and subjected to rotary evaporation to dryness to obtain a crude product. The crude product was isolated through silica gel column chromatography (using an eluent of ethyl acetate:petroleum ether=1:50, v/v) to obtain the target product Intermediate 11 as a colorless oily liquid (4.7 g, with a yield of 39.1%).

Step 2: Synthesis of Intermediate 13

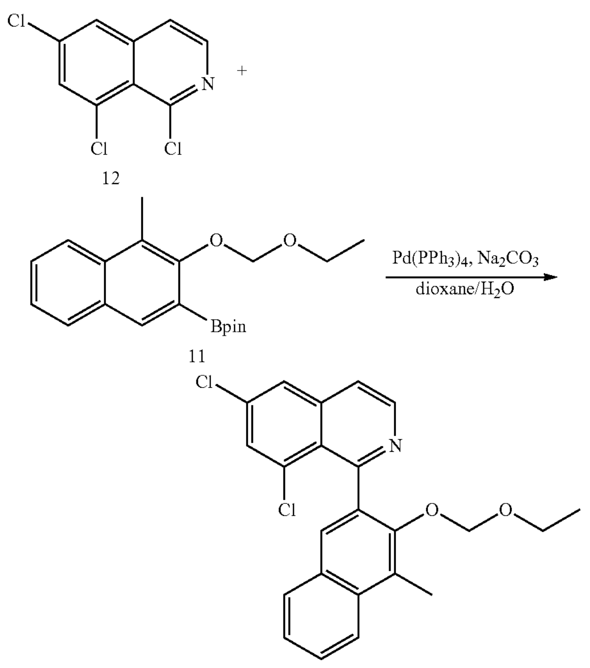

12

11

13

Intermediate 12 (3.19 g, 13.7 mmol), Intermediate 11 (4.7 g, 13.7 mmol), tetrakis(triphenylphosphine)palladium (0.8 g, 0.69 mmol), sodium carbonate (2.18 g, 20.55 mmol), 1,4-dioxane (60 mL), and water (15 mL) were added to a 250 mL round-bottom flask. Then, the reaction was heated to 80° C. under nitrogen protection and stirred overnight. After TLC showed that the reaction was completed, the system was cooled to room temperature. Ethyl acetate was added to the reaction, liquids were separated, and the aqueous phase was extracted with ethyl acetate. The organic phases were combined, dried, and subjected to rotary evaporation to dryness to obtain a crude product. The crude product was isolated through silica gel column chromatography (using an eluent of ethyl acetate:petroleum ether=1:10, v/v) to obtain the target product Intermediate 13 as a white solid (3.5 g, with a yield of 73.0%).

Step 3: Synthesis of Intermediate 14

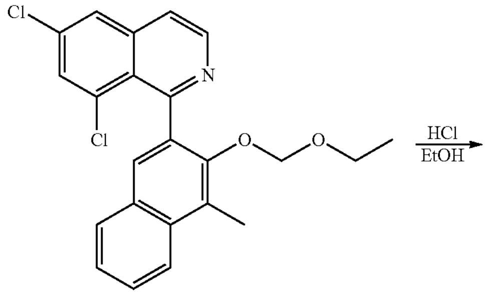

13

-continued

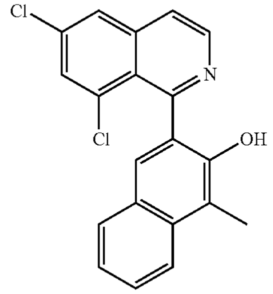

14

Intermediate 13 (4.1 g, 10 mmol) was dissolved in 20 mL of ethanol, and then 20 mL of 2 M HCl were added thereto, and then the reaction was heated to reflux and stirred overnight. After TLC showed that the reaction was completed, the system was cooled to room temperature. Then, a saturated solution of sodium carbonate was added to adjust the pH to neutrality. A large amount of yellow solids were precipitated from the solution. The solids were filtered, washed with water several times, and suction-filtered to obtain the target product Intermediate 14 as a yellow solid (3.3 g, with a yield of 93.2%).

Step 4: Synthesis of Intermediate 15

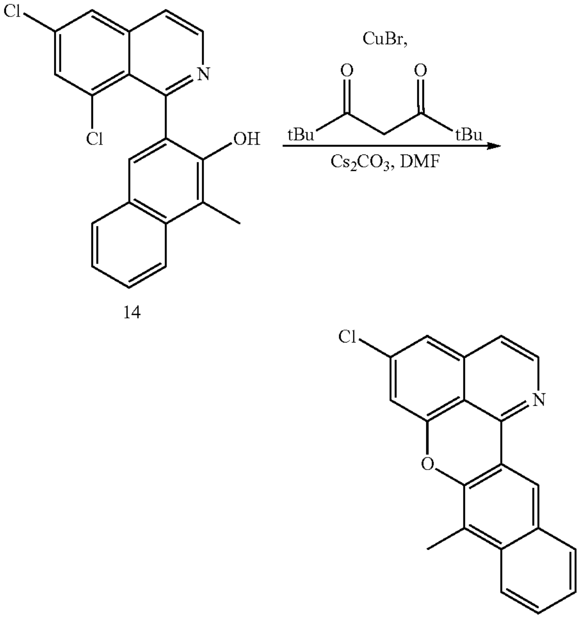

14

15

Intermediate 14 (3.3 g, 9.3 mmol), cuprous bromide (133 mg, 0.9 mmol), 2,2,6,6-tetramethylheptanedione (1.37 g, 7.44 mmol), cesium carbonate (7.6 g, 23.25 mmol), and DMF (90 mL) were heated to 135° C. and reacted overnight under nitrogen protection. After TLC showed that the reaction was completed, the system was cooled to room temperature. 200 mL of water were added to the solution until a large amount of yellow solids were precipitated from the solution. The solids were filtered, washed with water several times, and suction-filtered to obtain the target product Intermediate 15 as a yellow solid (3.10 g, with a yield of 96%).

Step 5: Synthesis of Intermediate 16

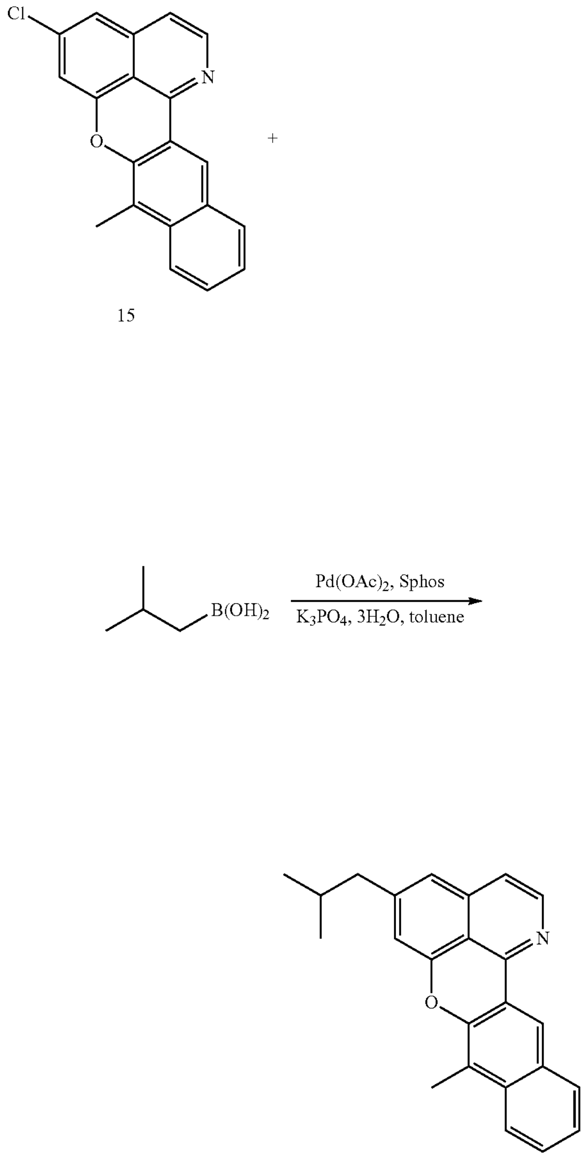

15

16

Intermediate 15 (3.42 g, 10.8 mmol), isobutylboronic acid (2.2 g, 21.6 mmol), palladium acetate (121 mg, 0.54 mmol), Sphos (443 mg, 1.08 mmol), potassium phosphate trihydrate (8.63 g, 32.4 mmol), and toluene (80 mL) were heated to reflux and reacted overnight under nitrogen protection. After TLC showed that the reaction was completed, the system was cooled to room temperature. The solution was poured into a funnel filled with Celite and filtered. The filtrate was collected and subjected to rotary evaporation to dryness to obtain a crude product. The crude product was isolated through silica gel column chromatography (using an eluent of ethyl acetate:petroleum ether=1:30, v/v) to obtain the target product Intermediate 16 as a yellow solid (1.8 g, with a yield of 49.4%).

Step 6: Synthesis of an Iridium Dimer

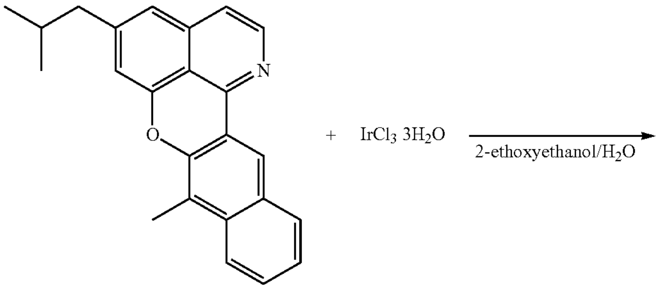

16

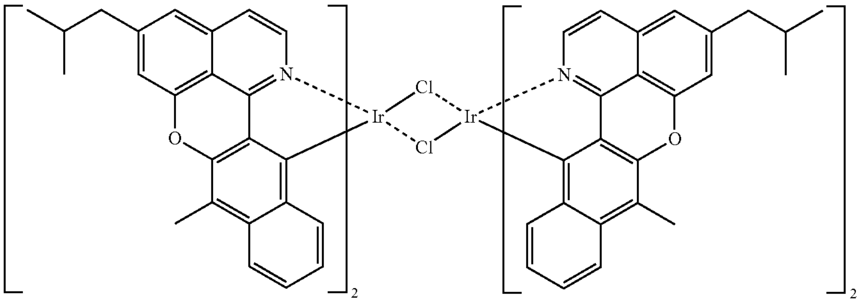

A mixture of Intermediate 16 (1.8 g, 5.3 mmol), iridium trichloride trihydrate (628 mg, 1.78 mmol), 2-ethoxy ethanol (21 mL), and water (7 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was used in the next step without further purification.

Step 7: Synthesis of Compound 83

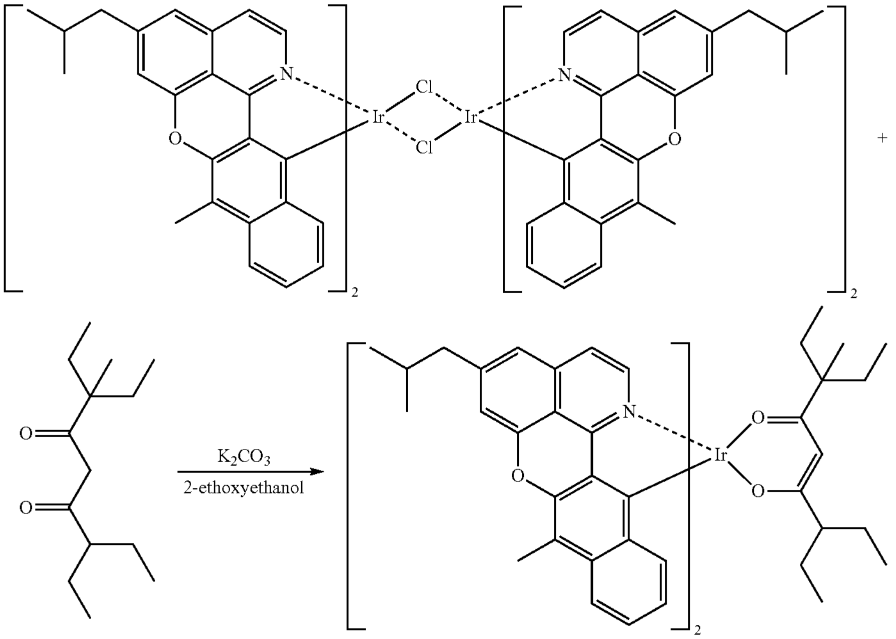

The solution of iridium dimer, 3,7-diethyl-3-methylnonane-4,6-dione (663 mg, 2.67 mmol), and potassium carbonate (1.23 g, 8.9 mmol) were added to a 100 mL round-bottom flask and reacted at 60° C. for 24 h under nitrogen protection. Then, the solution was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 1.1 g of Compound 83 with a yield of 57%. The product was further purified through column chromatography. The structure of the compound was confirmed through NMR and LC-MS as the target product with a molecular weight of 1094.5.

Synthesis Example 3: Synthesis of Compound 64

Step 1: Synthesis of Intermediate 18

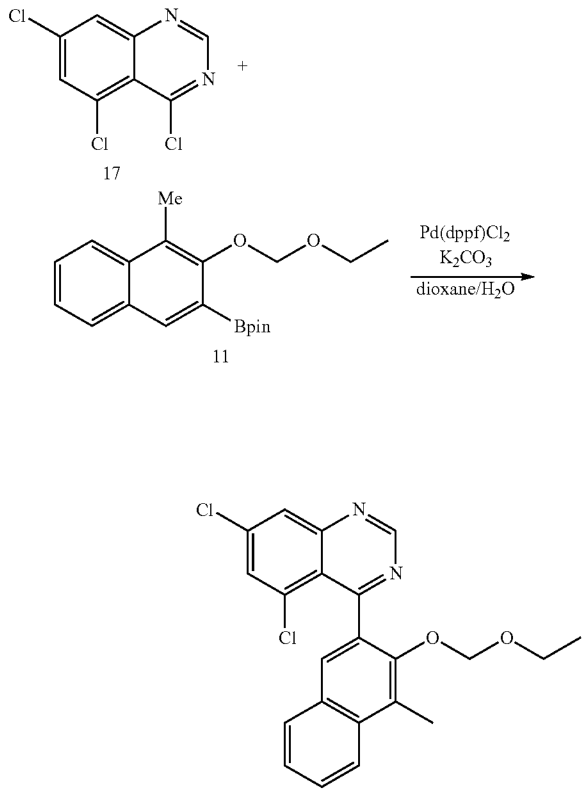

17

11

18

Intermediate 17 (2.93 g, 12.54 mmol), Intermediate 11 (3.9 g, 11.4 mmol), Pd(dppf)$Cl_2$ (439 mg, 0.6 mmol), and $K_2CO_3$ (4.73 g, 34.2 mmol) were mixed in dioxane/water (42 mL/14 mL), purged with nitrogen, and reacted overnight at room temperature. The solution was filtered through Celite and extracted with EA three times. The organic phases were combined, concentrated, and subjected to column chromatography to obtain Intermediate 18 (3 g with a yield of 63.7%).

Step 2: Synthesis of Intermediate 20

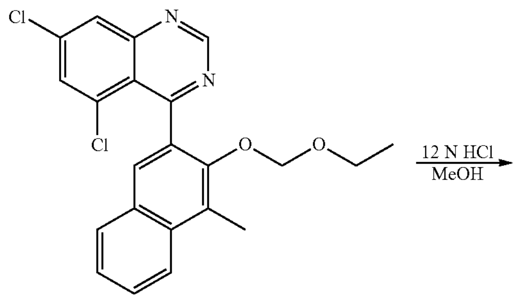

18

-continued

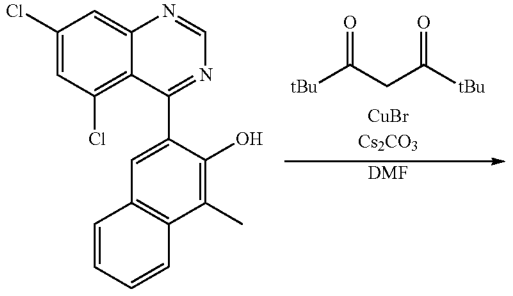

19

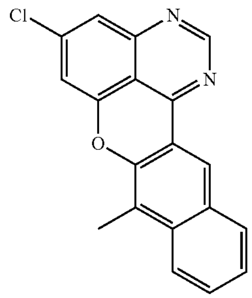

20

Intermediate 18 (3.8 g, 9.2 mmol) was added to a mixed solution of 12 N HCl (7.6 mL) and MeOH (20 mL) and reacted at 54° C. for 2 h. After TLC detected that the reaction was completed, the system was cooled to room temperature, added with a saturated solution of $NaHCO_3$ to adjust the pH to about 7-8, and extracted with EA three times. The organic phases were combined, washed with a saturated aqueous solution of sodium chloride, and concentrated to obtain a crude product of Intermediate 19, which was directly used in the next step without further purification. The crude product of Intermediate 19 (2.6 g, 7.2 mmol), CuBr (103 mg, 0.72 mmol), 2,2,6,6-tetramethyl-3,5-heptanedione (1.06 g, 5.76 mmol), and $Cs_2CO_3$ (5.87 g, 18 mmol) were mixed in DMF (72 mL), purged with nitrogen, reacted overnight, and cooled to room temperature. The product was filtered out. The filter cake was washed with an appropriate amount of DMF, washed with EtOH and PE, and dried to obtain Intermediate 20 (1.85 g with a yield of 63% over two steps).

Step 3: Synthesis of Intermediate 21

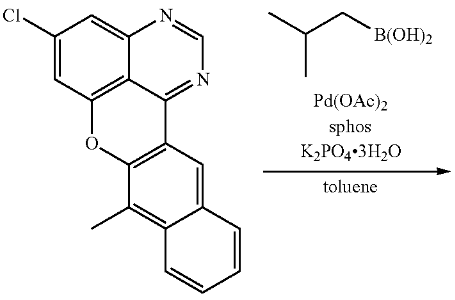

20

-continued

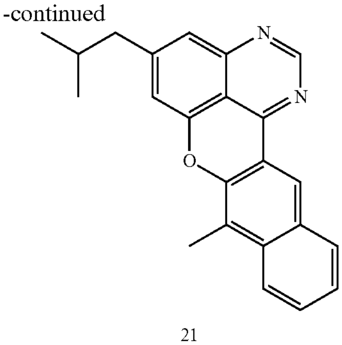

21

Intermediate 20 (1.85 g, 5.82 mmol), isobutylboronic acid (1.19 g, 11.64 mmol), $Pd(OAc)_2$ (65 mg, 0.29 mmol), Sphos (238 mg, 0.58 mmol), and $K_3PO_4.3H_2O$ (4.66 g, 17.5 mmol) were mixed in toluene (58 mL) and refluxed at 120° C. under nitrogen protection. After HPLC detected that Intermediate 21 was converted completely, the reaction solution was cooled to room temperature, filtered through Celite, concentrated, and subjected to column chromatography to obtain Intermediate 21 (1.3 g of yellow solids with a yield of 66%).

Step 4: Synthesis of Compound 64

Intermediate 21 (825 mg, 2.42 mmol), $IrCl_3.3H_2O$ (286 mg, 0.81 mmol), ethoxyethanol (11.5 mL), and water (3.5 mL) were added to a 100 mL single-necked flask, purged with nitrogen, and refluxed at 130° C. for 24 h. After the reaction was cooled to room temperature, the resulting precipitate was filtered out and the filter cake was washed with ethanol and dried. The resulting iridium dimer, 3,7-diethyl-1,1,1-trifluorononane-4,6-dione (319 mg, 1.2 mmol), $K_2CO_3$ (560 mg, 4.05 mmol), and ethoxyethanol (13 mL) were mixed in a 100 mL single-necked flask, purged with nitrogen, and reacted overnight at room temperature. After TLC detected that the reaction was completed, stirring was stopped. The reaction solution was filtered through Celite. The filter cake was washed with an appropriate amount of EtOH. The crude product was washed with DCM into a 250 mL eggplant-shaped flask. EtOH (about 5 mL) was added to the crude product, and DCM was removed through rotary evaporation at room temperature until solids were precipitated. The solids were filtered and washed with an appropriate amount of EtOH to obtain Compound 64 (80 mg with a yield of 8.7%). The product was confirmed as the target product with a molecular weight of 1136.4.

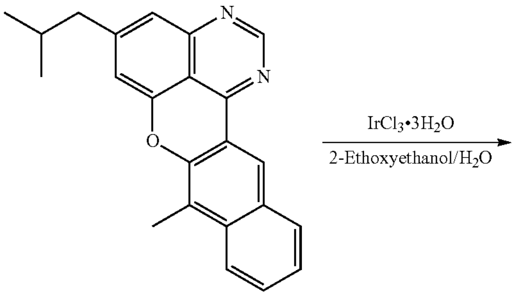

21

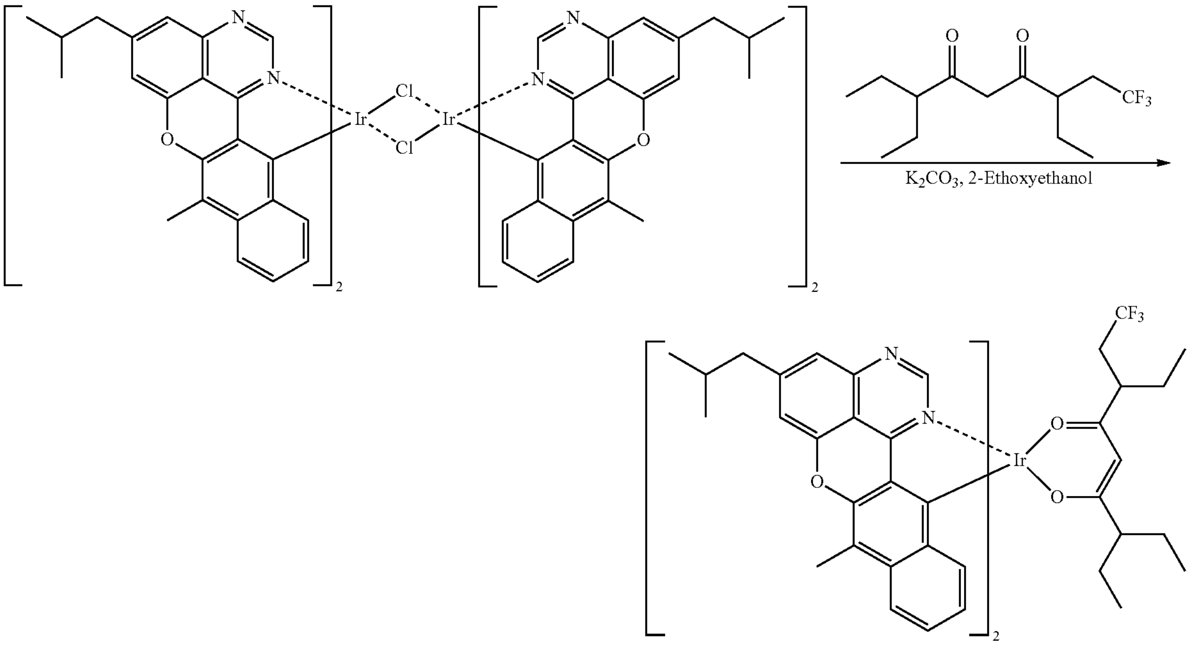

Synthesis Example 4: Synthesis of Compound 93

Step 1: Synthesis of an Iridium Dimer

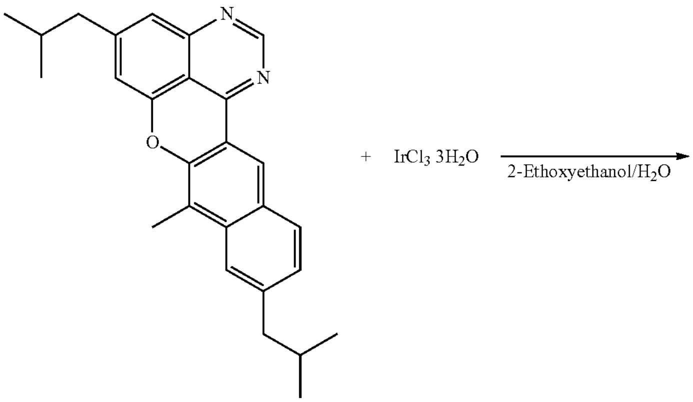

22

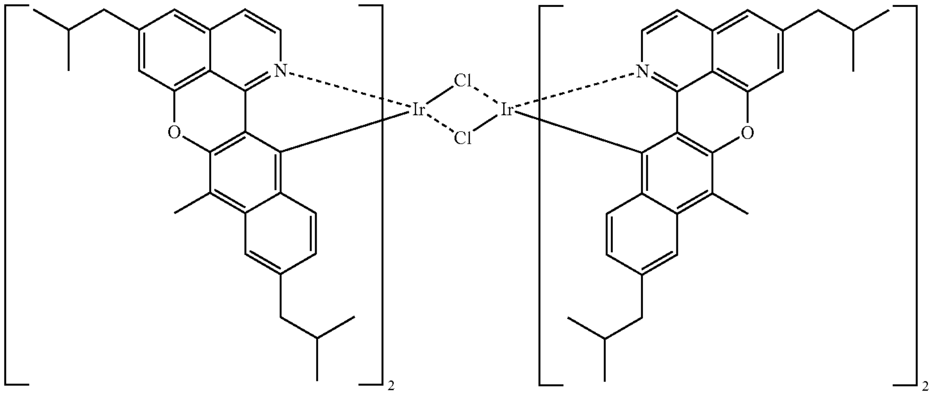

A mixture of Intermediate 22 (0.76 g, 1.92 mmol), iridium trichloride trihydrate (226 mg, 0.64 mmol), 2-ethoxyethanol (7.5 mL), and water (2.5 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was directly used in the next step without further purification.

Step 2: Synthesis of Compound 93

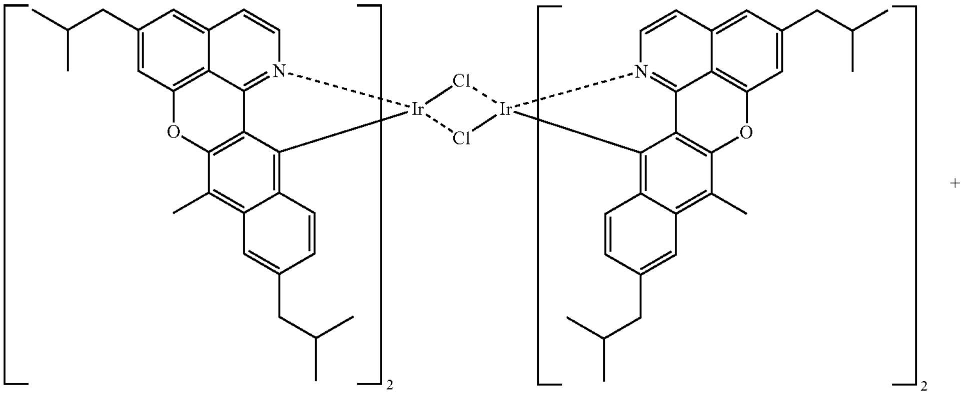

-continued

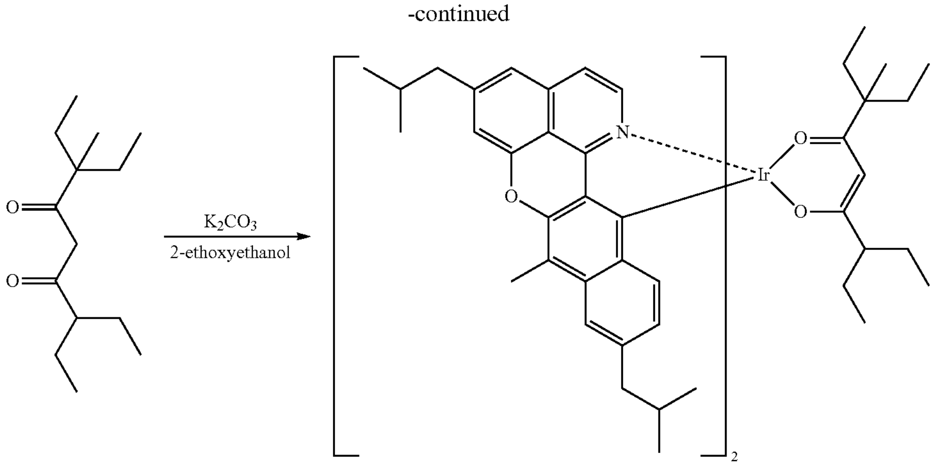

The solution of iridium dimer in ethoxyethanol obtained in the previous step, 3,7-diethyl-3-methylnonane-4,6-dione (450 mg, 1.84 mmol), and potassium carbonate (0.64 g, 4.45 mmol) were added to a 25 mL round-bottom flask and reacted at 50° C. for 24 h under nitrogen protection. Then, the solution was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 550 mg of Compound 93 with a yield of 71%. The structure of the compound was confirmed through LC-MS as the target product with a molecular weight of 1206.6.

Synthesis Example 5: Synthesis of Compound 117

Step 1: Synthesis of an Iridium Dimer

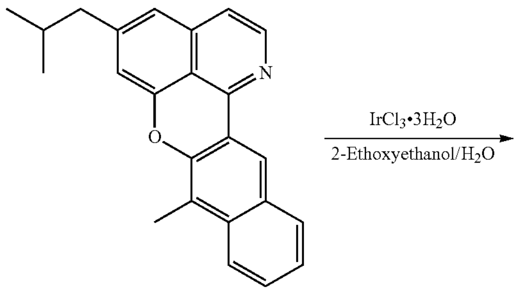

22

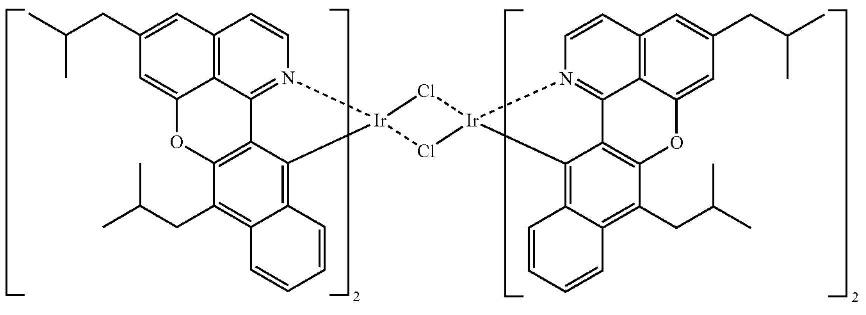

Intermediate 23 (2.1 g, 5.56 mmol), iridium trichloride trihydrate (494 mg, 1.4 mmol), ethoxyethanol (18 mL), and water (6 mL) were added to a 250 mL single-necked flask, purged with nitrogen, and refluxed at 130° C. for 24 h. After the reaction was cooled to room temperature, the resulting precipitate was filtered out and the filter cake was washed with ethanol and dried to obtain an iridium dimer which was directly used in the next step without further purification.

Step 2: Synthesis of Compound 117

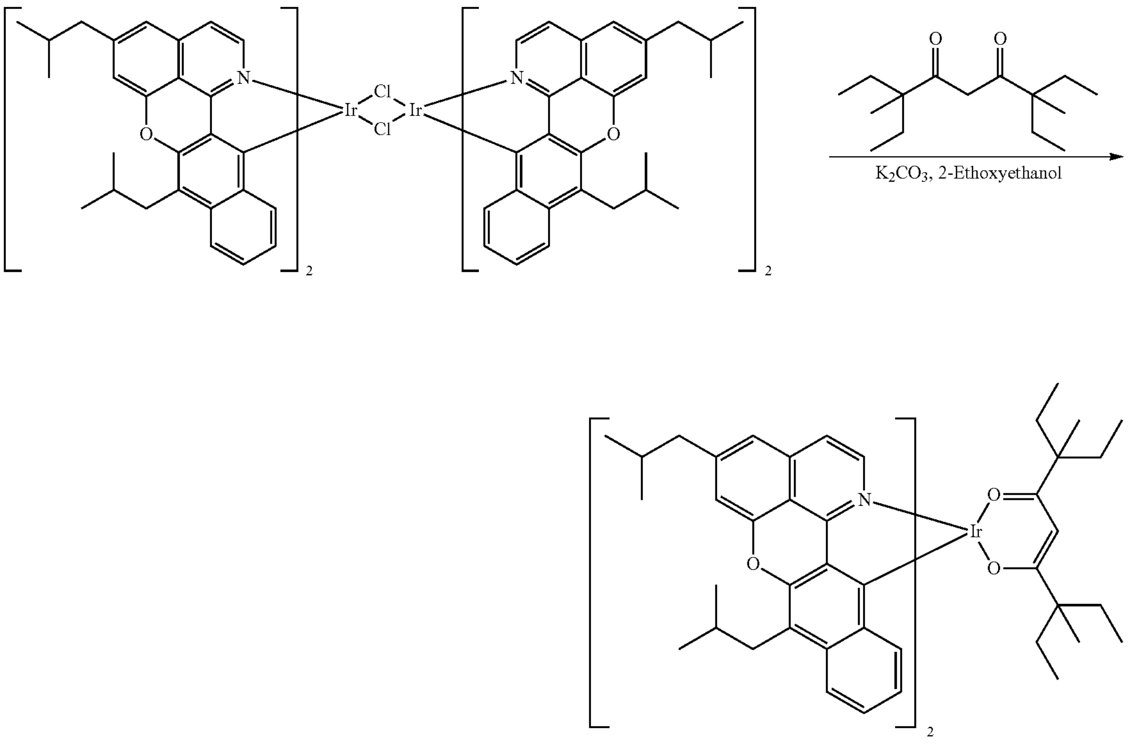

The obtained iridium dimer, 3,7-diethyl-3,7-dimethyl-4,6-nonanedione (421 mg, 1.75 mmol), potassium carbonate (1.94 mg, 14 mmol), and ethoxyethanol (24 mL) were mixed in a 100 mL single-necked flask, purged with nitrogen, and reacted overnight at 55° C. After TLC detected that the reaction was completed, stirring was stopped. The reaction solution was filtered through Celite, the filter cake was washed with an appropriate amount of ethanol, and the crude product was washed with dichloromethane into a 250 mL eggplant-shaped flask. Ethanol (about 5 mL) was added, and dichloromethane was removed through rotary evaporation at room temperature until solids were precipitated. The solids were filtered out, washed with an appropriate amount of ethanol, dried, dissolved in dichloromethane, concentrated, and subjected to column chromatography to obtain Compound 117 as a red solid (1 g with a yield of 60%). The purity of the compound was 99.4%. The structure of the compound was confirmed through LC-MS as the target product with a molecular weight of 1192.6.

Synthesis Example 6: Synthesis of Compound 116

Step 1: Synthesis of an Iridium Dimer

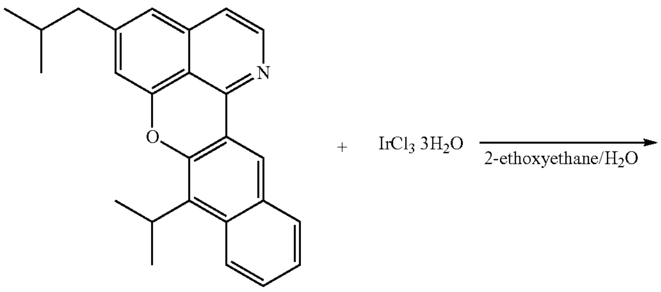

24

-continued

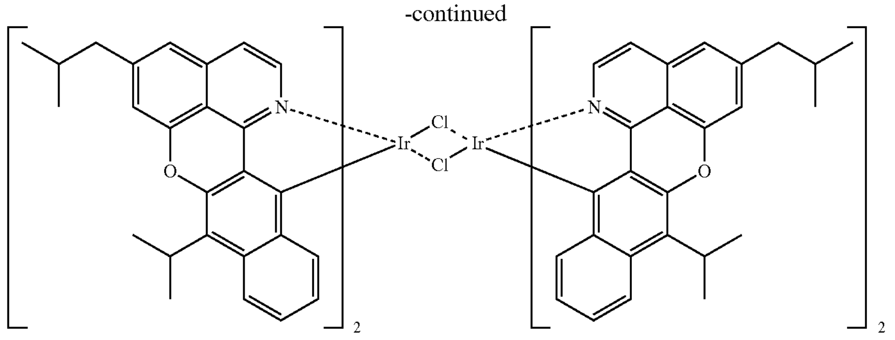

A mixture of Intermediate 24 (1.37 g, 3.73 mmol), iridium trichloride trihydrate (329 mg, 0.93 mmol), 2-ethoxyethanol (12 mL), and water (4 mL) was refluxed under a nitrogen atmosphere for 24 h. The solution was cooled to room temperature and filtered to obtain an iridium dimer as a red solid which was directly used in the next step without further purification.

Step 2: Synthesis of Compound 116

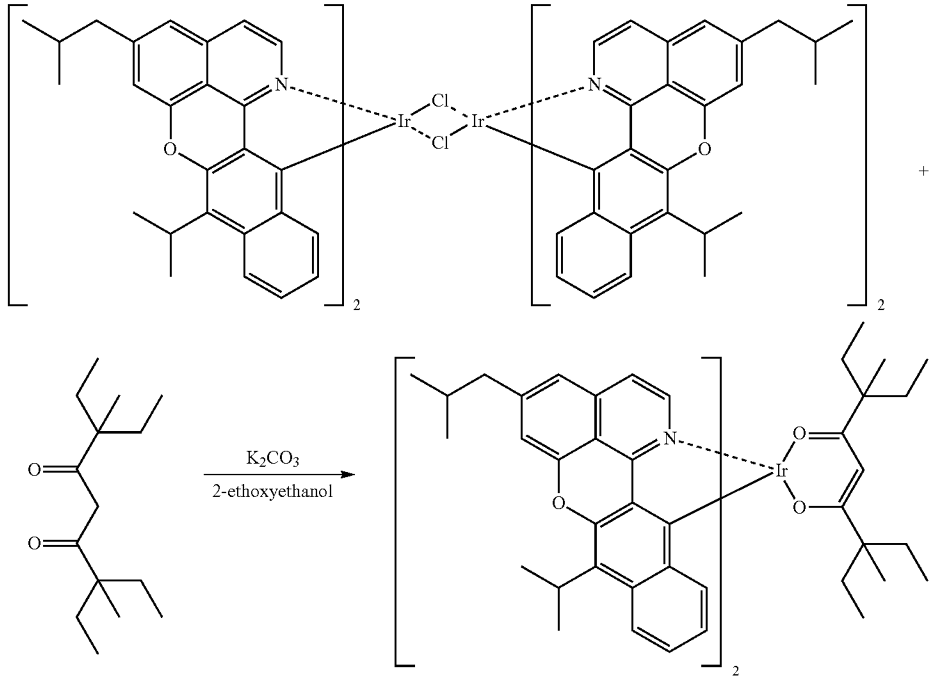

The iridium dimer obtained in the previous step, 3,7-diethyl-3,7-dimethylnonane-4,6-dione (430 mg, 1.79 mmol), and potassium carbonate (0.62 g, 4.48 mmol) were added to a 50 mL round-bottom flask and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 810 mg of Compound 116 with a yield of 82.2%. The structure of the compound was confirmed through LC-MS as the target product with a molecular weight of 1164.5.

Synthesis Example 7: Synthesis of Compound 261

Step 1: Synthesis of an Iridium Dimer

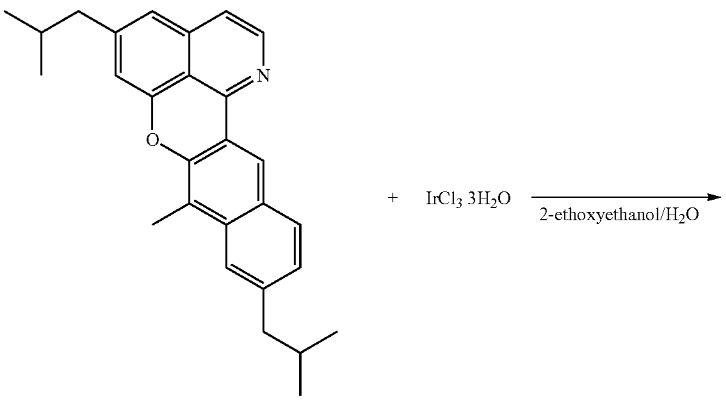

25

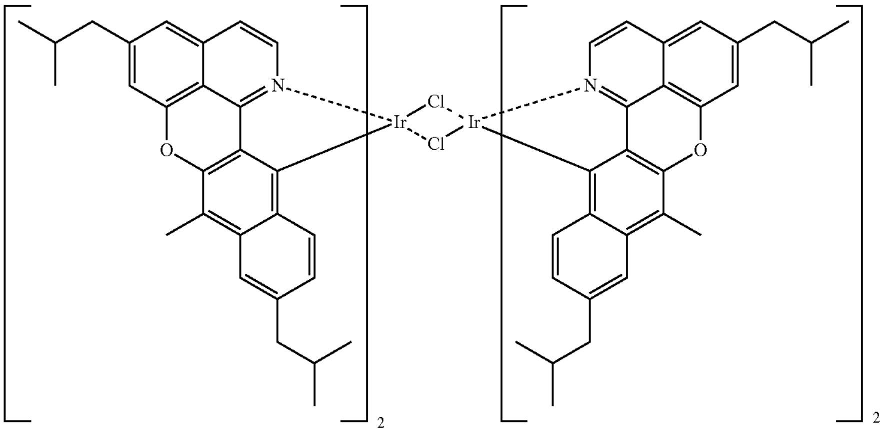

A mixture of Intermediate 25 (0.76 g, 1.92 mmol), iridium trichloride trihydrate (226 mg, 0.64 mmol), 2-ethoxyethanol (7.5 mL), and water (2.5 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was directly used in the next step without further purification.

Step 2: Synthesis of Compound 261

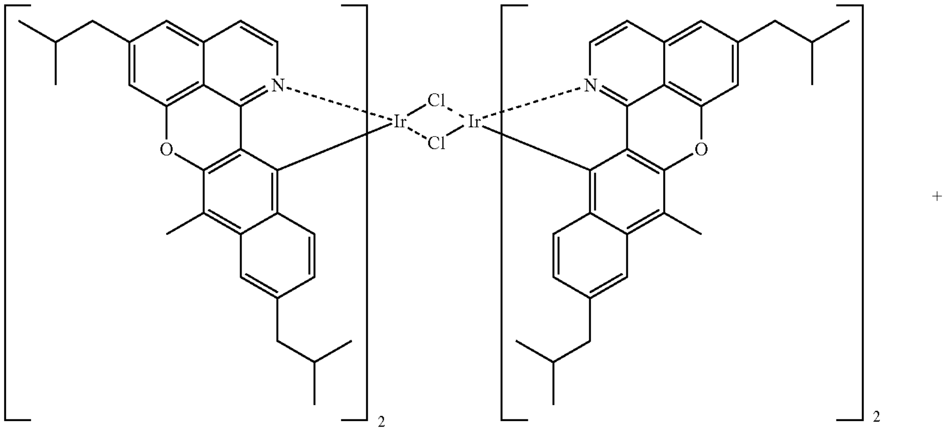

-continued

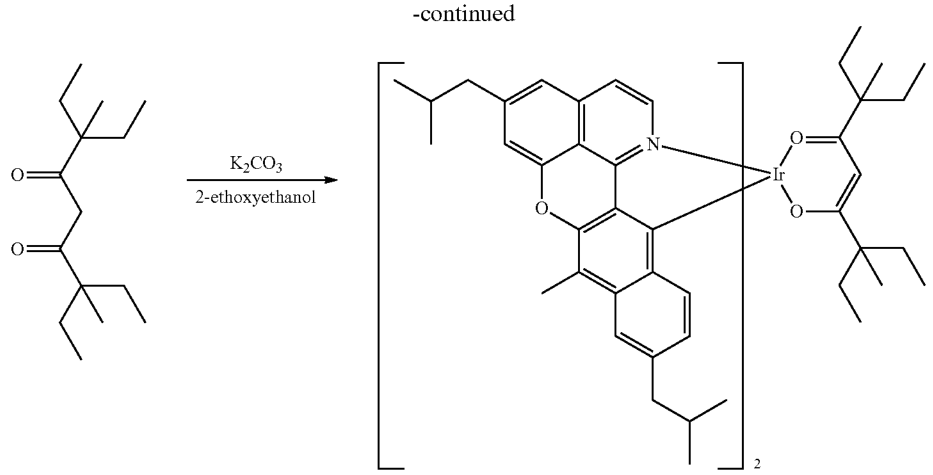

The solution of iridium dimer in ethoxyethanol obtained in the previous step, 3,7-diethyl-3,7-dimethylnonane-4,6-dione (450 mg, 1.84 mmol), and potassium carbonate (0.64 g, 4.45 mmol) were added to a 25 mL round-bottom flask and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated, but not to dryness. The solution was filtered to obtain 1.75 g of Compound 261 with a yield of 96%. The structure of the compound was confirmed through LC-MS as the target product with a molecular weight of 1220.6.

Synthesis Example 8: Synthesis of Compound 262

Step 1: Synthesis of an Iridium Dimer

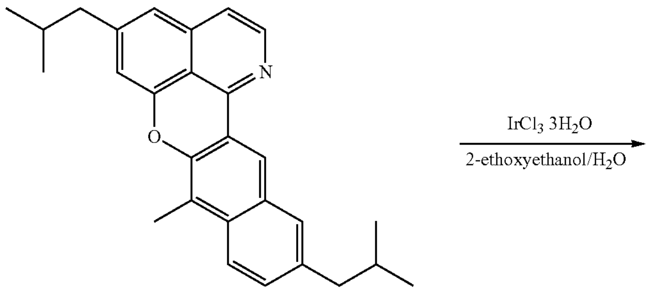

26

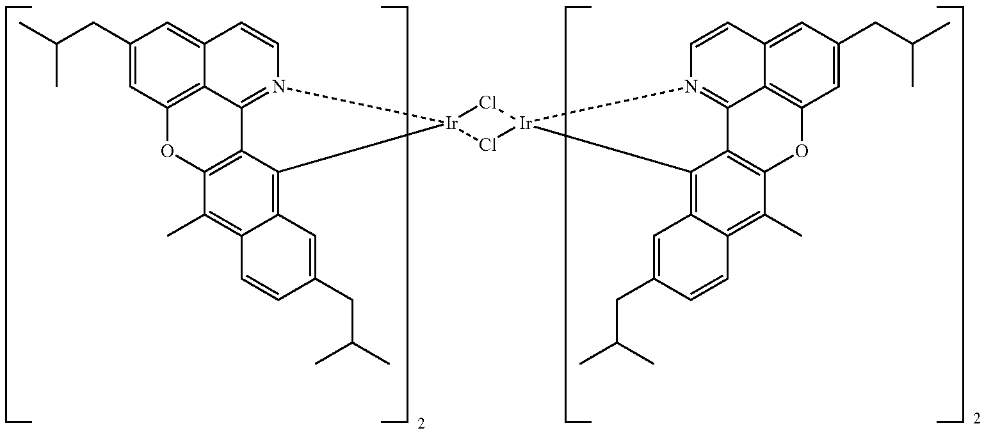

A mixture of Intermediate 26 (0.76 g, 1.92 mmol), iridium trichloride trihydrate (226 mg, 0.64 mmol), 2-ethoxyethanol (7.5 mL), and water (2.5 mL) was refluxed under a nitrogen atmosphere for 24 h. The system was cooled to room temperature and subjected to rotary evaporation to carefully remove water in the solution, so that a solution of an iridium dimer in ethoxyethanol was obtained, which was directly used in the next step without further purification.

Step 2: Synthesis of Compound 262

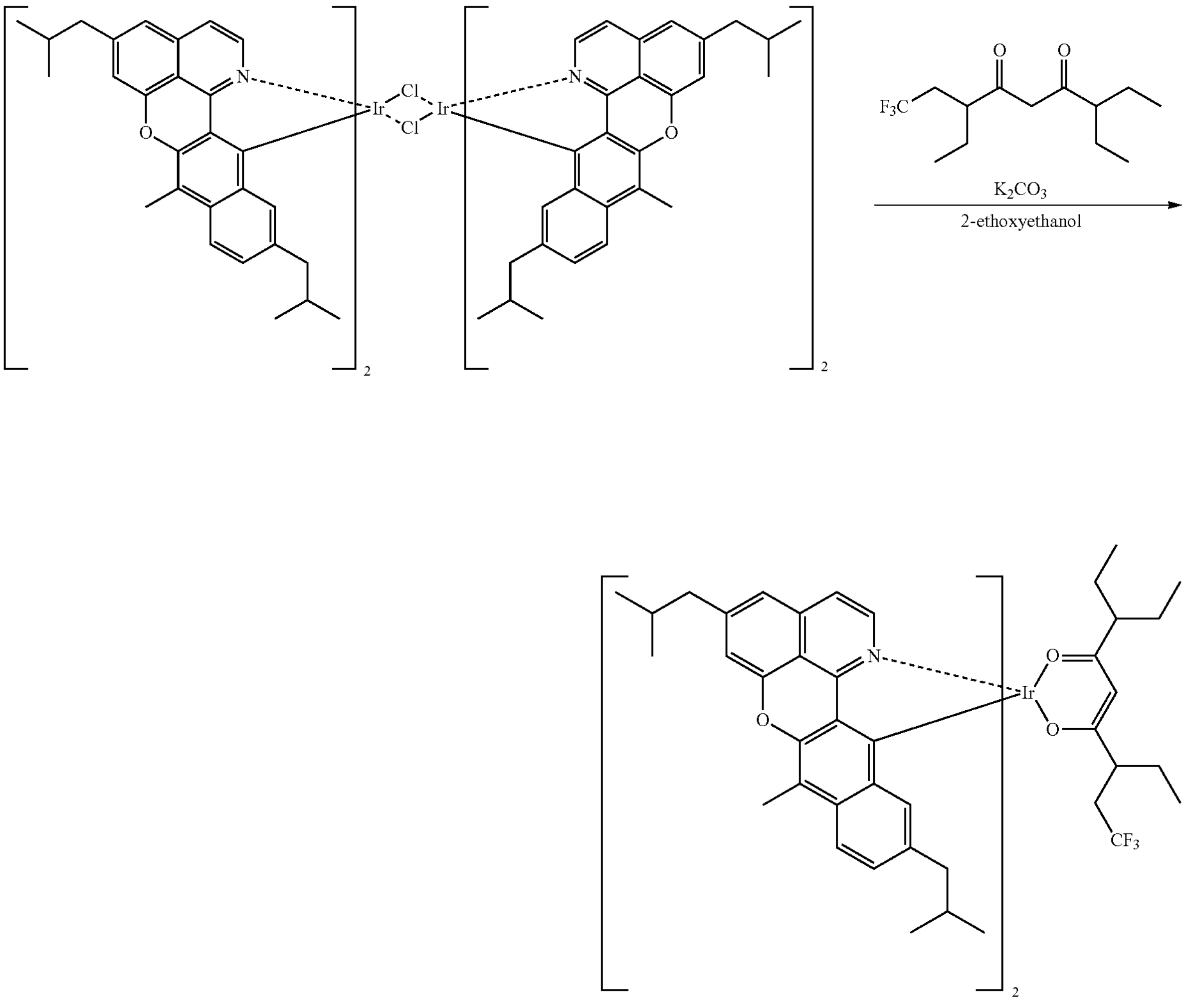

The solution of the iridium dimer in ethoxyethanol obtained in the previous step, 3,7-diethyl-1,1,1-trifluorononane-4,6-dione (450 mg, 1.84 mmol), and potassium carbonate (0.64 g, 4.45 mmol) were added to a 25 mL round-bottom flask and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 1.35 g of Compound 262 with a purity of 98.86% and a yield of 92%. The structure of the compound was confirmed through LC-MS as the target product with a molecular weight of 1246.5.

Synthesis Example 9: Synthesis of Compound 264

Step 1: Synthesis of an Iridium Dimer

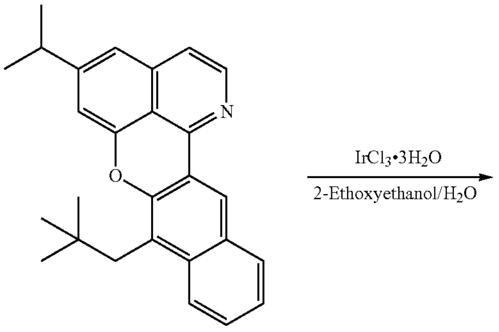

27

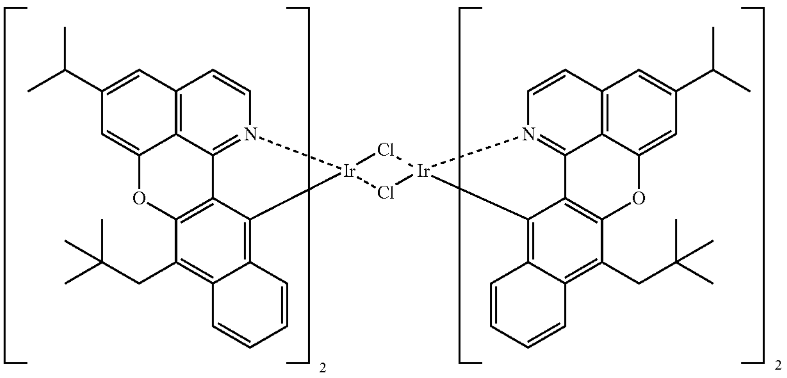

Intermediate 27 (800 mg, 2.1 mmol), iridium trichloride trihydrate (250 mg, 0.7 mmol), ethoxyethanol (7.5 mL), and water (2.5 mL) were added to a 100 mL single-necked flask, purged with nitrogen, and refluxed at 130° C. for 24 h. After the reaction was cooled, the solution was concentrated and the solvents were removed through rotary evaporation to obtain an iridium dimer which was directly used in the next step without further purification.

Step 2: Synthesis of Compound 264

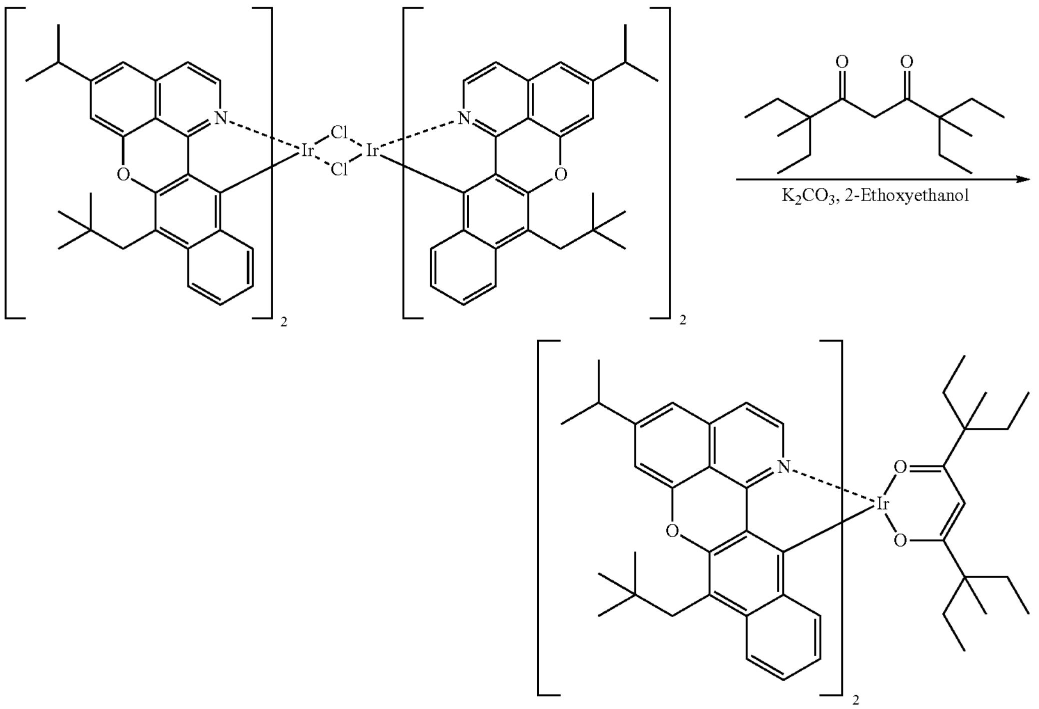

The iridium dimer obtained in the previous step was added with 3,7-diethyl-3,7-dimethylnonane-4,6-dione (337 mg, 1.4 mmol), potassium carbonate (967 mg, 7 mmol), and ethoxyethanol (14 mL), purged with nitrogen, and reacted at room temperature for 48 h. The reaction solution was filtered through Celite. The filter cake was washed with an appropriate amount of ethanol. The crude product was washed with dichloromethane into a 250 mL eggplant-shaped flask. Ethanol (about 5 mL) was added to the crude product, and dichloromethane was removed through rotary evaporation at room temperature until solids were precipitated. The solids were filtered out, washed with an appropriate amount of ethanol, dried, dissolved in dichloromethane, concentrated, and purified through column chromatography to obtain Compound 264 (570 mg). The structure of the compound was confirmed through LC-MS as the target product with a molecular weight of 1192.6.

Synthesis Example 10: Synthesis of Compound 263

Step 1: Synthesis of an Iridium Dimer

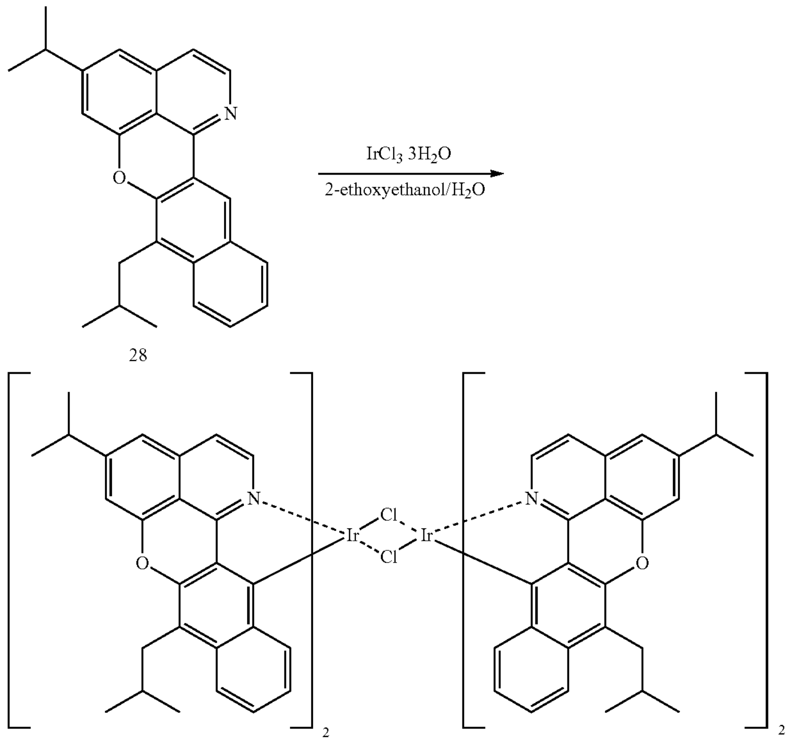

28

A mixture of Intermediate 28 (0.46 g, 1.28 mmol), iridium trichloride trihydrate (130 mg, 0.37 mmol), 2-ethoxyethanol (4.5 mL), and water (1.5 mL) was refluxed under a nitrogen atmosphere for 24 h. The solution was cooled to room temperature and Altered to obtain an iridium dimer as a red solid which was directly used in the next step without further purification.

Step 2: Synthesis of Compound 263

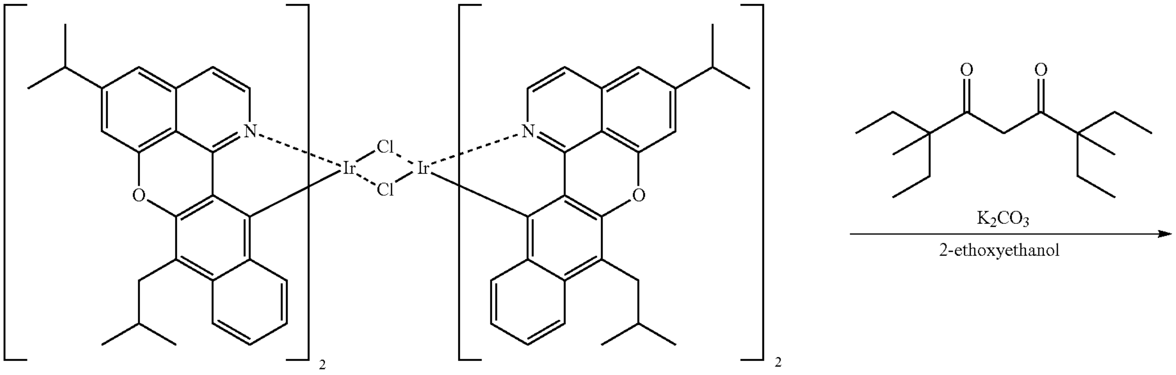

-continued

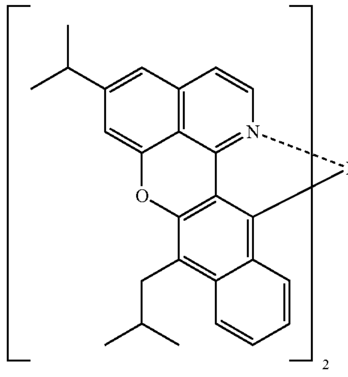

The iridium dimer obtained in the previous step, 3,7-diethyl-3,7-dimethylnonane-4,6-dione (133 mg, 0.55 mmol), and potassium carbonate (0.25 g, 1.84 mmol) were added to a 50 mL round-bottom flask and reacted at 40° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 300 mg of Compound 263 with a yield of 73.7%. The structure of the compound was confirmed through LC-MS as the target product with a molecular weight of 1164.5.

Synthesis Example 11: Synthesis of Compound 266

Step 1: Synthesis of an Iridium Dimer

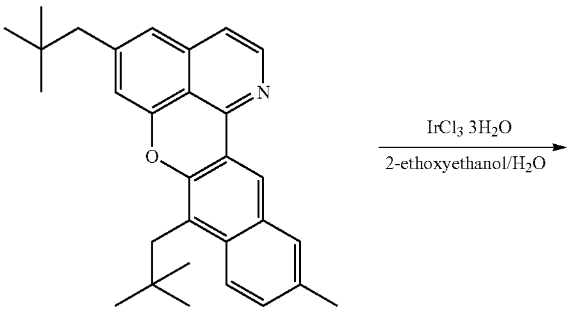

29

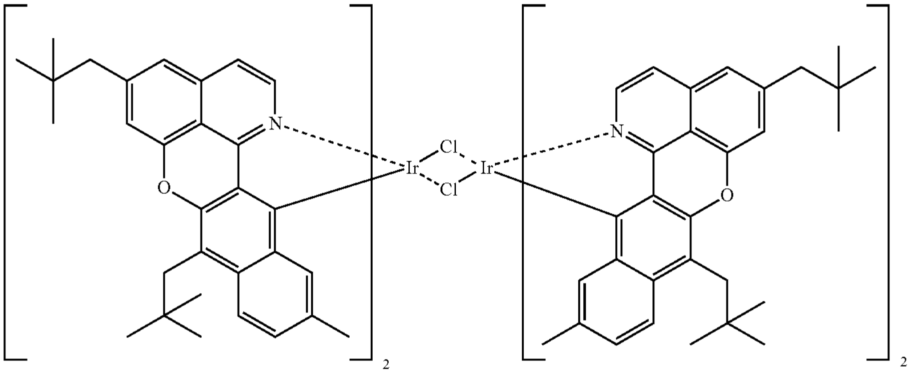

A mixture of Intermediate 29 (1.45 g, 3.42 mmol), iridium trichloride trihydrate (346 mg, 0.98 mmol), 2-ethoxyethanol (12 mL), and water (4 mL) was refluxed under a nitrogen atmosphere for 24 h. The solution was cooled to room temperature and filtered to obtain an iridium dimer as a red solid which was directly used in the next step without further purification.

Step 2: Synthesis of Compound 266

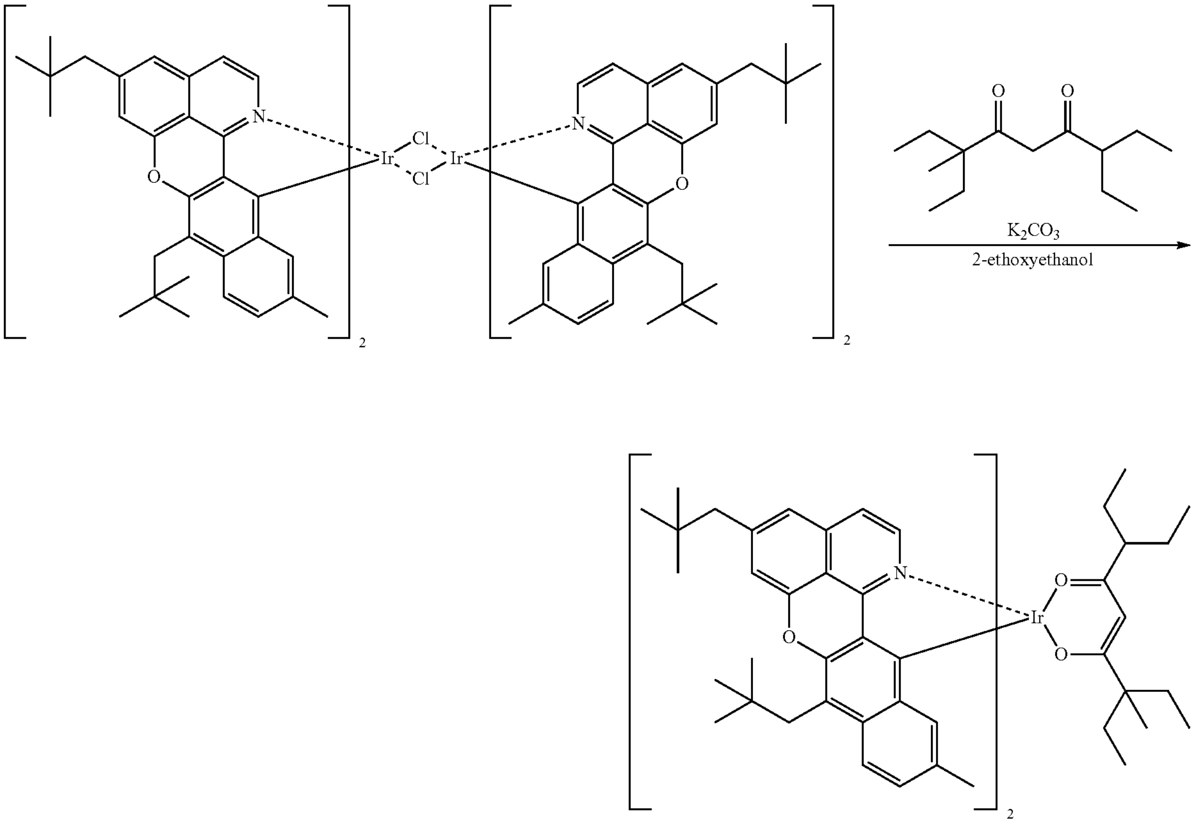

The iridium dimer (0.67 g, 0.31 mmol) obtained in the previous step, 3,7-diethyl-3-methylnonane-4,6-dione (0.21 g, 0.94 mmol), and potassium carbonate (0.43 g, 3.1 mmol) were dissolved in 9 mL of ethoxyethanol and reacted at 40° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 370 mg of Compound 266 with a yield of 47.3%. The structure of the compound was confirmed through LC-MS as the target product with a molecular weight of 1262.6.

Synthesis Example 12: Synthesis of Compound 265

Step 1: Synthesis of Compound 265

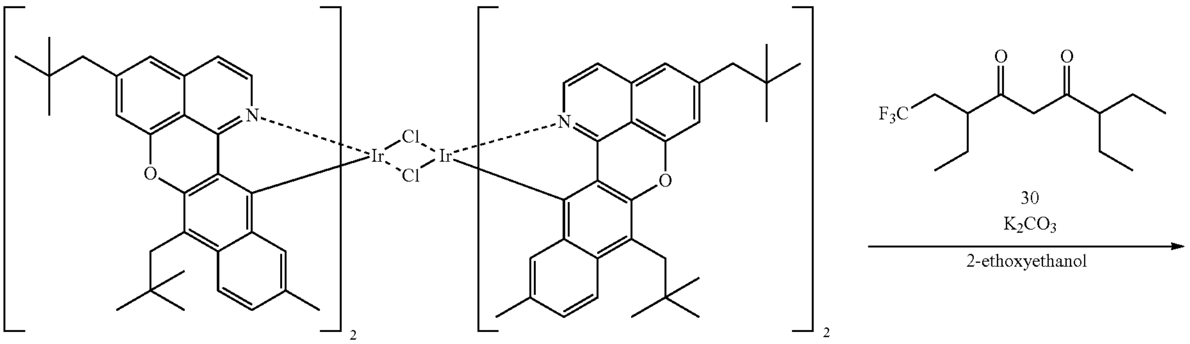

-continued

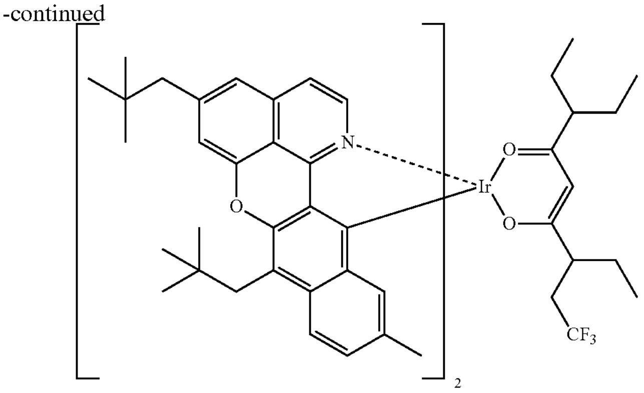

The iridium dimer (0.67 g, 0.31 mmol), Intermediate 30 (0.21 g, 0.94 mmol), and potassium carbonate (0.43 g, 3.1 mmol) were dissolved in 9 mL of ethoxyethanol and reacted at 40° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 370 mg of Compound 265 with a yield of 47.3%. The structure of the compound was confirmed through LC-MS as the target product with a molecular weight of 1302.6.

Synthesis Example 13: Synthesis of Compound 267

Step 1: Synthesis of an Iridium Dimer

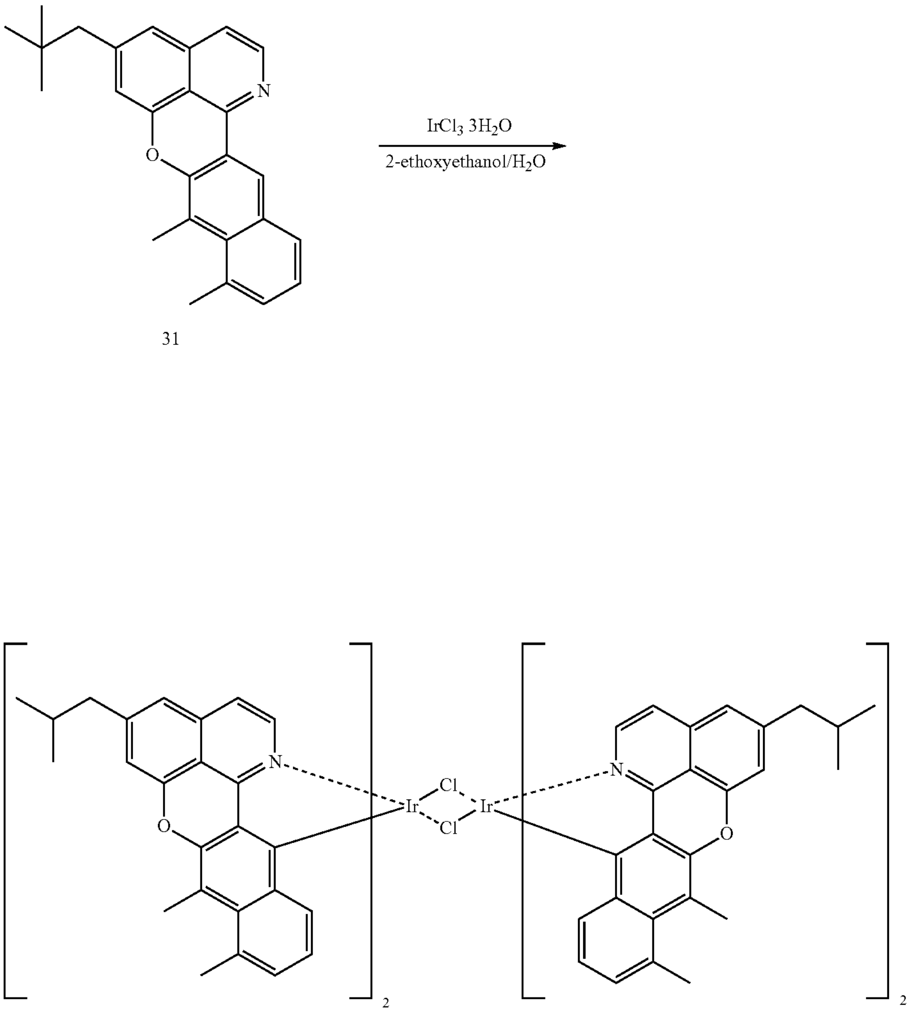

31

A mixture of Intermediate 31 (0.6 g, 1.68 mmol), iridium trichloride trihydrate (198 mg, 0.56 mmol), 2-ethoxyethanol (7.5 mL), and water (2.5 mL) was refluxed under a nitrogen atmosphere for 24 h. The solution was cooled to room temperature and filtered to obtain an iridium dimer as a red solid which was directly used in the next step without further purification.

Step 2: Synthesis of Compound 267

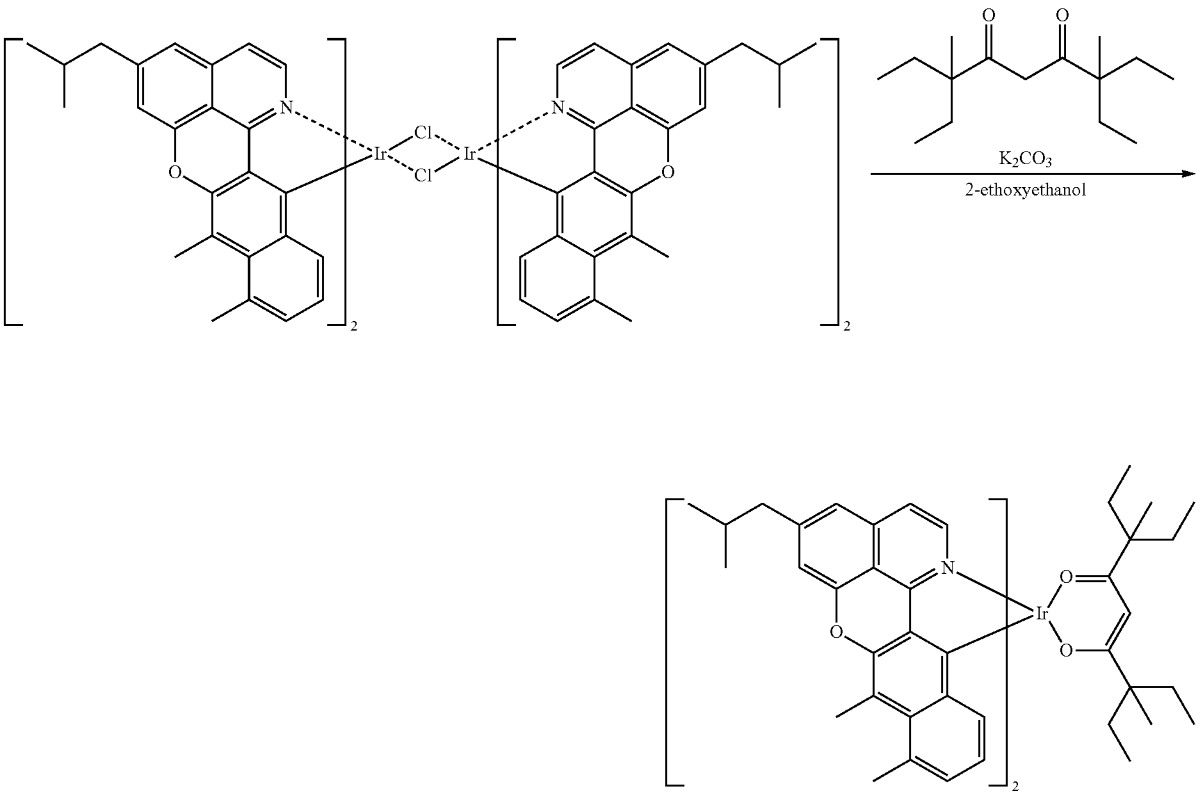

The iridium dimer obtained in the previous step, 3,7-diethyl-3,7-dimethylnonane-4,6-dione (270 mg, 1.12 mmol), and potassium carbonate (0.77 g, 5.6 mmol) were added to a 25 mL round-bottom flask and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain a crude product with a purity of 91.6% (0.4 g). The product was further purified through column chromatography to obtain the final product Compound 267 (0.3 g) with a yield of 47%. The structure of the compound was confirmed through LC-MS as the target product with a molecular weight of 1136.5.

Synthesis Example 14: Synthesis of Compound 269

Step 1: Synthesis of an Iridium Dimer

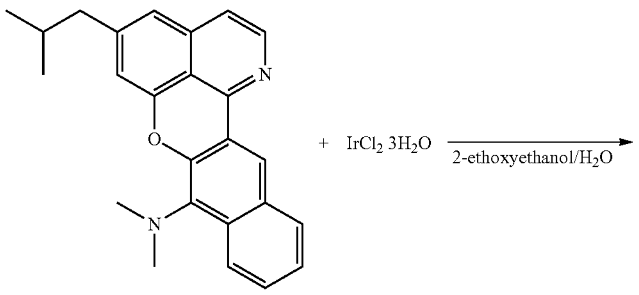

-continued

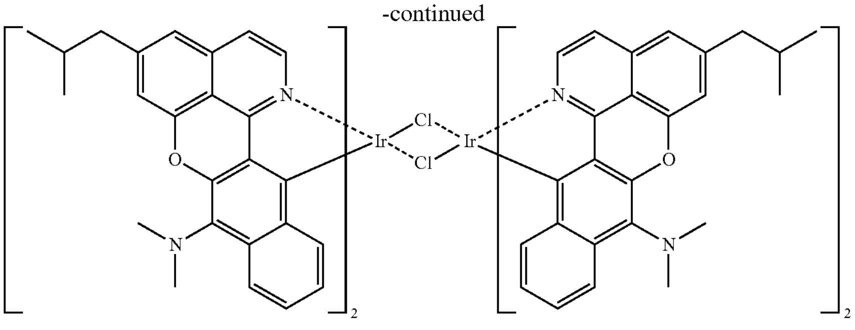

A mixture of Intermediate 32 (1.5 g, 4.2 mmol), iridium trichloride trihydrate (427 mg, 1.2 mmol), 2-ethoxyethanol (12 mL), and water (4 mL) was refluxed under a nitrogen atmosphere for 24 h. The solution was cooled to room temperature and filtered to obtain an iridium dimer as a red solid which was directly used in the next step without further purification.

Step 2: Synthesis of Compound 269

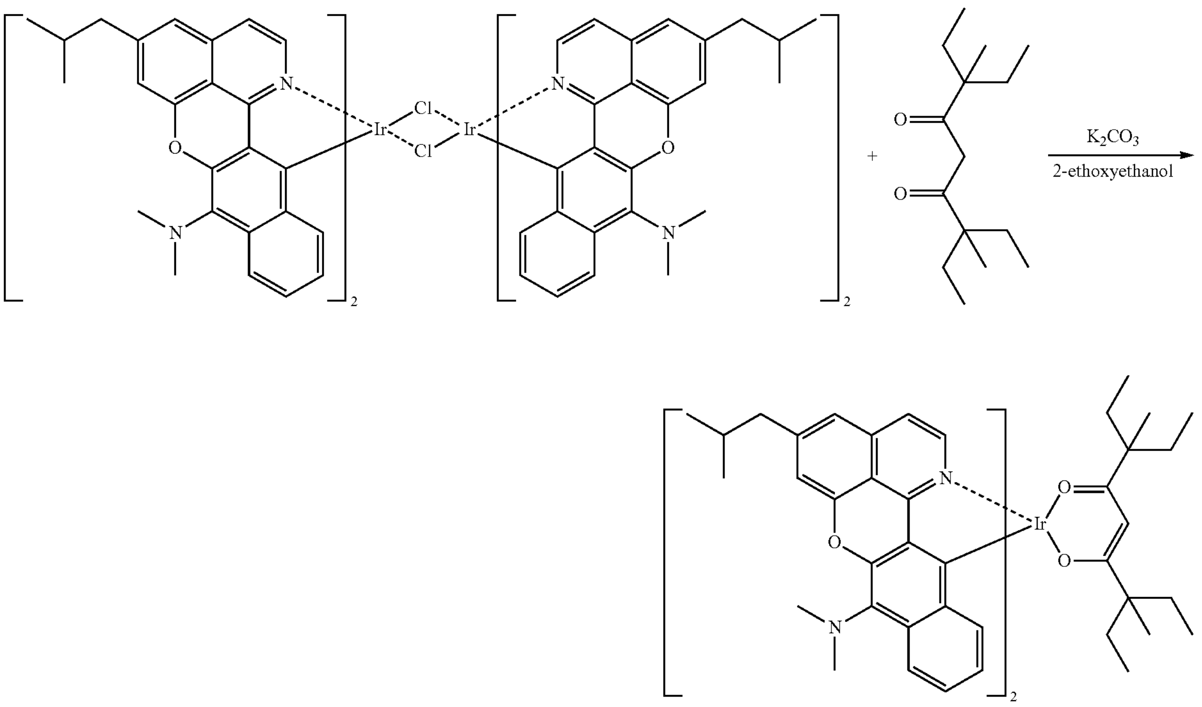

The iridium dimer obtained in the previous step, 3,7-diethyl-3,7-dimethylnonane-4,6-dione (580 mg, 2.4 mmol), and potassium carbonate (0.83 g, 6.04 mmol) were dissolved in 16 mL of ethoxyethanol and reacted at 40° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 940 mg of Compound 269 with a yield of 66%. The structure of the compound was confirmed through LC-MS as the target product with a molecular weight of 1166.5.

Synthesis Example 15: Synthesis of Compound 288

Step 1: Synthesis of an Iridium Dimer

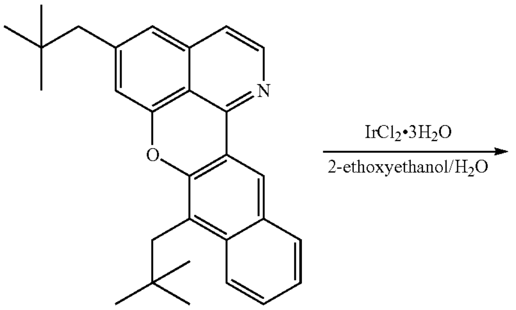

33

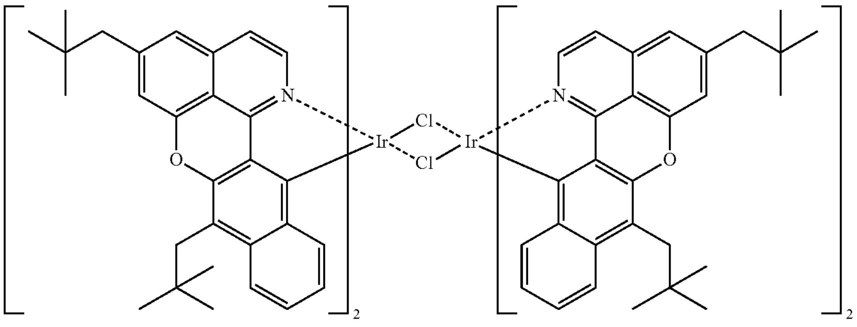

A mixture of Intermediate 33 (1.2 g, 2.93 mmol), iridium trichloride trihydrate (427 mg, 1.2 mmol), 2-ethoxyethanol (12 mL), and water (4 mL) was refluxed under a nitrogen atmosphere for 24 h. The solution was cooled to room temperature and filtered to obtain an iridium dimer as a red solid which was directly used in the next step without further purification.

Step 2: Synthesis of Compound 288

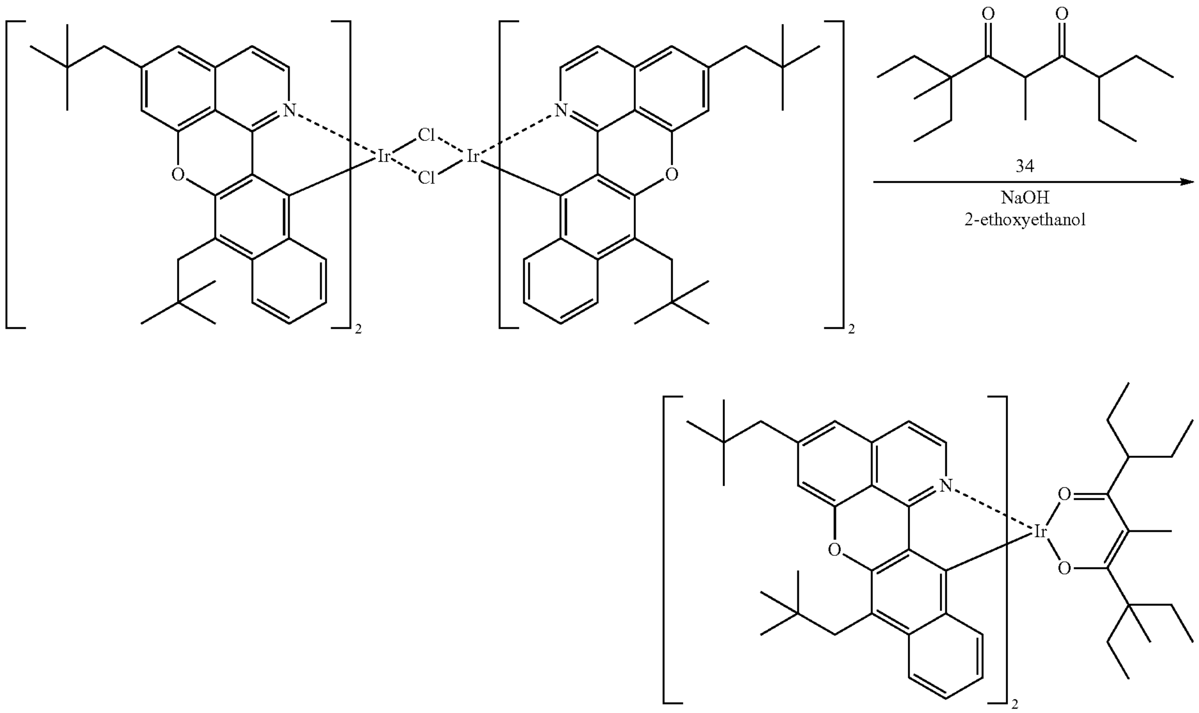

The iridium dimer (0.67 g, 0.31 mmol) obtained in the previous step, Intermediate 34 (414 mg, 1.76 mmol), and sodium hydroxide (176 mg, 4.4 mmol) were dissolved in 16 mL of ethoxyethanol and reacted at 40° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 410 mg of Compound 288 with a yield of 27.4%. The structure of the compound was confirmed through LC-MS as the target product with a molecular weight of 1248.6.

Synthesis Example 16: Synthesis of Compound 273

Step 1: Synthesis of an Iridium Dimer

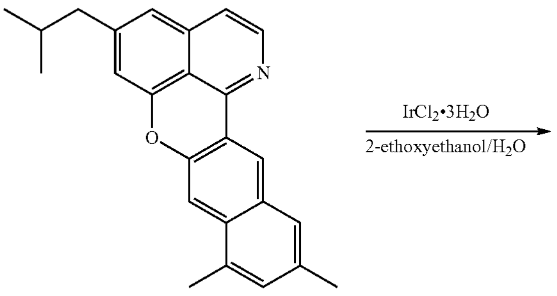

35

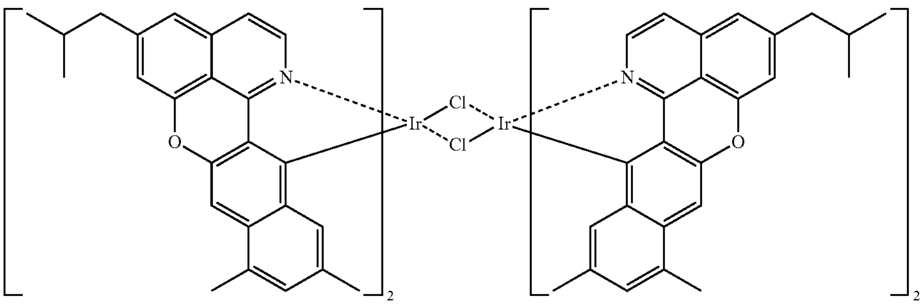

A mixture of Intermediate 35 (1.3 g, 3.54 mmol), iridium trichloride trihydrate (204 mg, 0.58 mmol), 2-ethoxyethanol (18 mL), and water (6 mL) was refluxed under a nitrogen atmosphere for 24 h. The solution was cooled to room temperature and filtered to obtain an iridium dimer as a red solid which was directly used in the next step without further purification.

Step 2: Synthesis of Compound 273

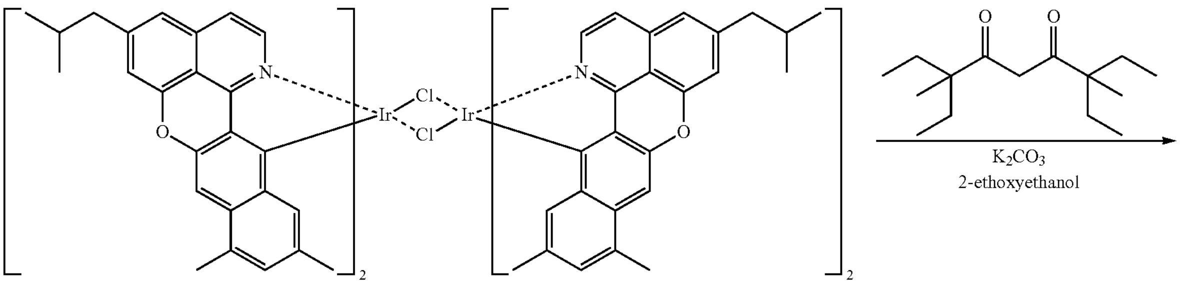

-continued

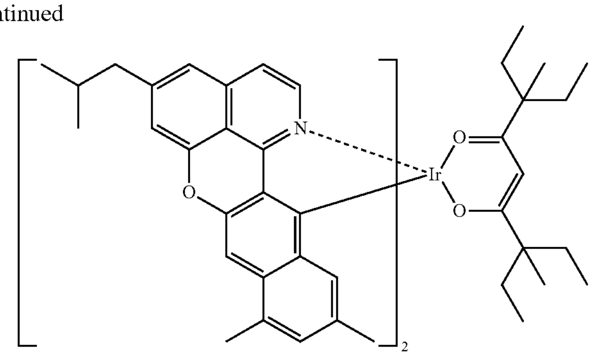

The iridium dimer obtained in the previous step, 3,7-diethyl-3,7-dimethylnonane-4,6-dione (0.21 g, 0.87 mmol), and potassium carbonate (0.40 g, 2.9 mmol) were added to a 100 mL round-bottom flask and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain a crude product (0.7 g). The crude product was further purified through column chromatography to obtain Compound 273 (0.6 g) with a yield of 91%. The structure of the compound was confirmed through LC-MS as the target product with a molecular weight of 1136.5.

Synthesis Example 17: Synthesis of Compound 282

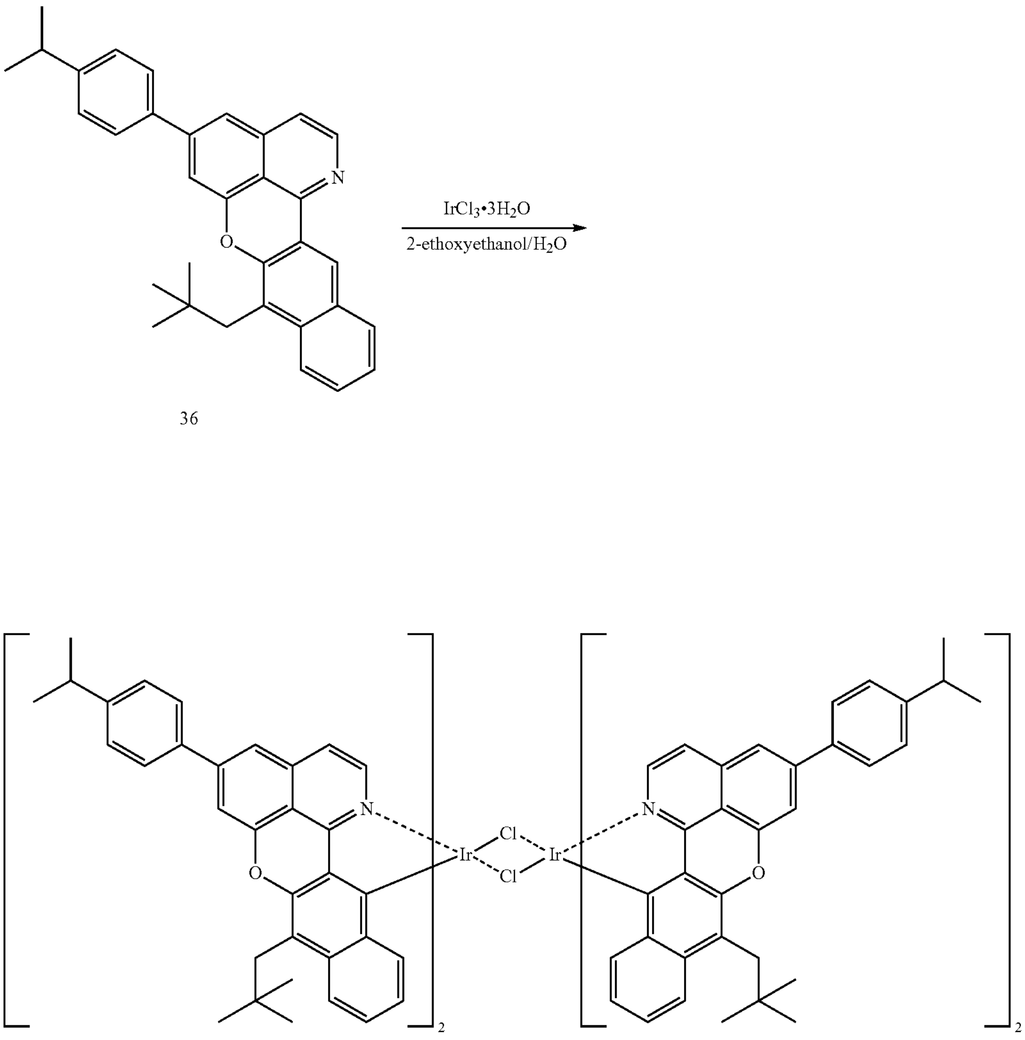

36

Step 1: Synthesis of an Iridium Dimer

A mixture of Intermediate 36 (1.77 g, 3.87 mmol), iridium trichloride trihydrate (390 mg, 1.11 mmol), 2-ethoxyethanol (24 mL), and water (8 mL) was refluxed under a nitrogen atmosphere for 24 h. The solution was cooled to room temperature and filtered to obtain an iridium dimer as a red solid which was directly used in the next step without further purification.

Step 2: Synthesis of Compound 282

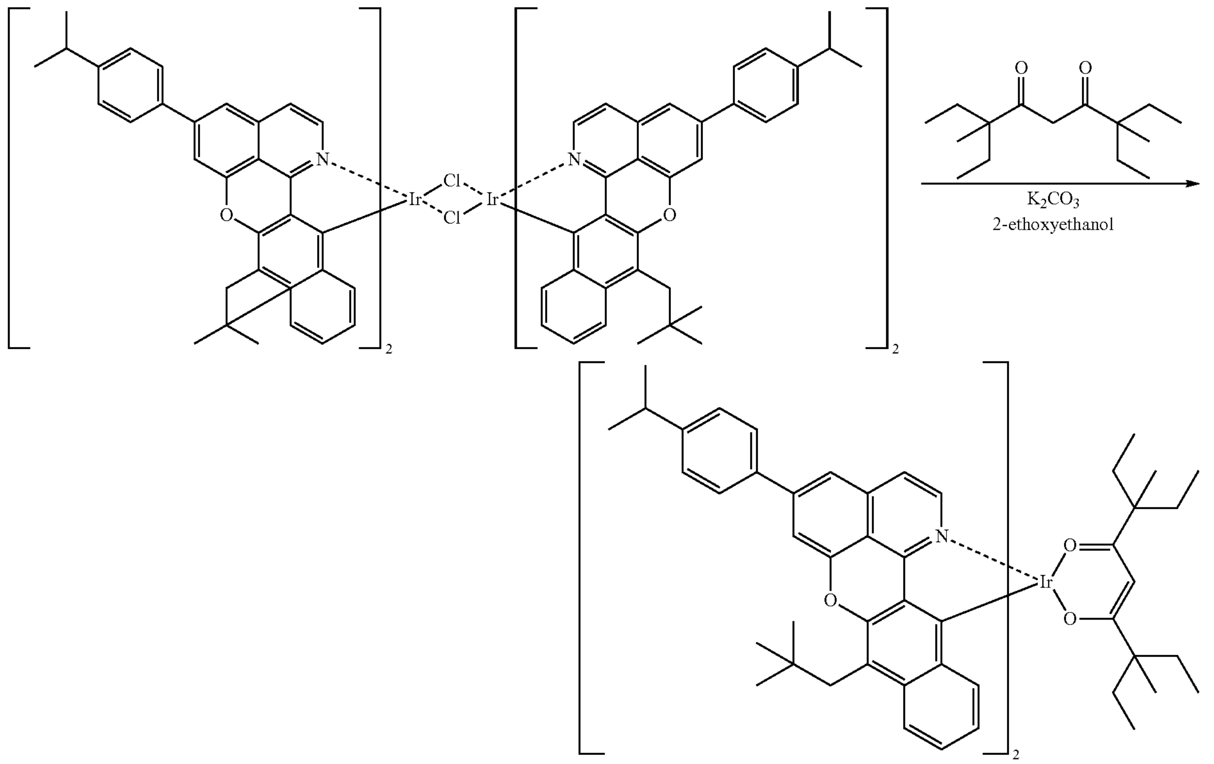

The iridium dimer obtained in the previous step, 3,7-diethyl-3,7-dimethylnonane-4,6-dione (0.4 g, 1.66 mmol), and potassium carbonate (0.77 mg, 5.6 mmol) were added to a 100 mL round-bottom flask and reacted at 50° C. for 48 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain a crude product (0.7 g). The crude product was further purified through column chromatography to obtain Compound 282 (0.25 g) with a yield of 17%. The structure of the compound was confirmed through LC-MS as the target product with a molecular weight of 1344.6.

Synthesis Example 18: Synthesis of Compound 287

Step 1: Synthesis of Compound 287

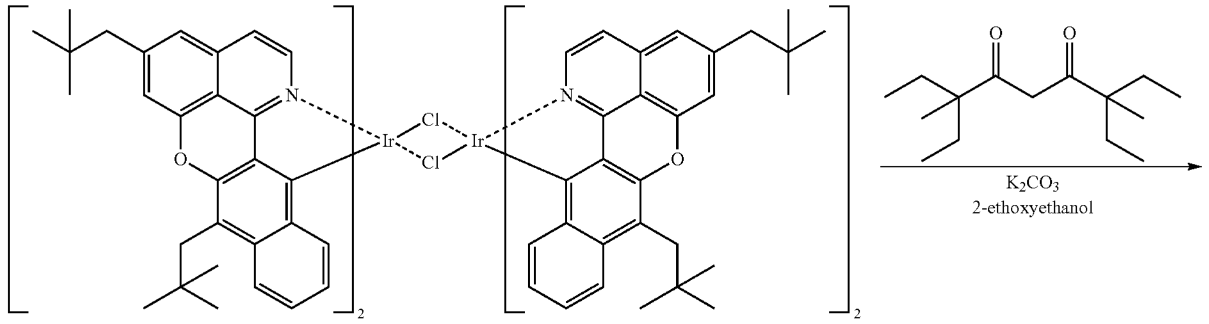

-continued

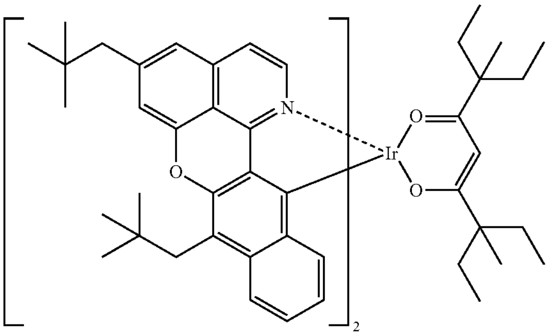

The iridium dimer (0.94 g, 0.45 mmol), 3,7-diethyl-3,7-dimethylnonane-4,6-dione (0.32 g, 1.34 mmol), and potassium carbonate (0.62 mg, 4.45 mmol) were dissolved in 25 mL of ethoxyethanol and reacted at 40° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 0.87 g of Compound 287 with a yield of 78%. The structure of the compound was confirmed through LC-MS as the target product with a molecular weight of 1248.6.

Synthesis Example 19: Synthesis of Compound 291

Step 1: Synthesis of Intermediate 38

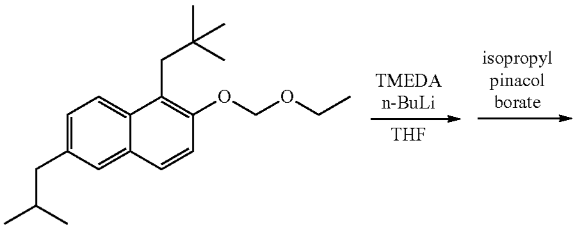

37

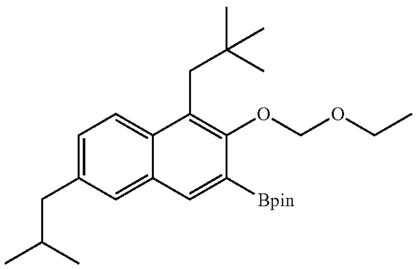

38

Intermediate 37 (2.68 g, 8.69 mmol) and TMEDA (1.31 g, 11.3 mmol) were dissolved in 80 mL of ultra-dry THF. The reaction system was cooled to 0° C. and then n-butyl lithium (4.2 mL, 10.43 mmol, 2.5 M) was slowly added. After reacting for 1 h at this temperature, isopropyl pinacol borate (2.102 g, 11.3 mmol) was added and reacted overnight. After TLC showed that the reaction was completed, saturated ammonium chloride was added to quench the reaction. The solution was extracted with EA, dried, and filtered, and the solvent was removed through rotary evaporation to obtain a crude product. The crude product was purified through silica gel column chromatography to obtain Intermediate 38 (3.86 g, 82%).

Step 2: Synthesis of Intermediate 39

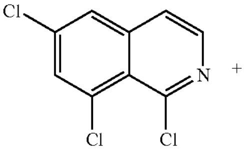

12

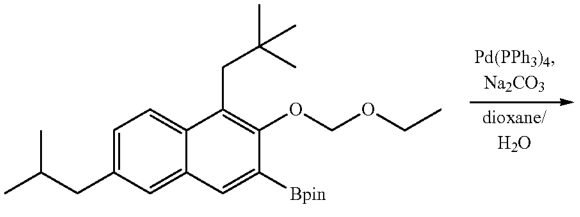

38

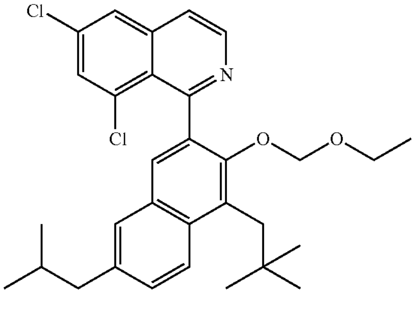

39

A mixture of Intermediate 12 (1.95 g, 8.4 mmol), Intermediate 38 (3.85 g, 8.4 mmol), $Pd(PPh_3)_4$ (0.48 g, 0.42 mmol), sodium carbonate (1.34 g, 12.6 mmol), and 1,4-dioxane/water (32 mL/8 mL) was heated to reflux and reacted overnight under nitrogen protection. After TLC showed that the reaction was completed, the system was cooled to room temperature. Water was added to the reaction system. The organic phase was extracted with EA, dried, and filtered, and the solvent was removed through rotary evaporation to obtain Intermediate 39 (3.1 g with a yield of 70%).

Step 3: Synthesis of Intermediate 40

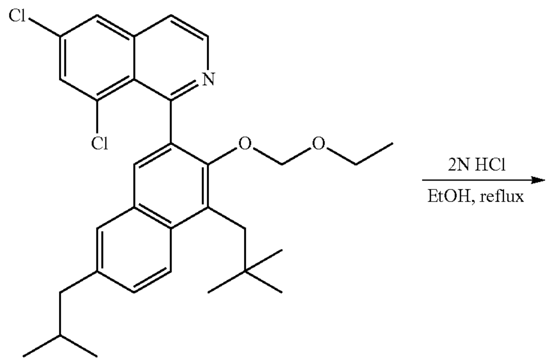

39

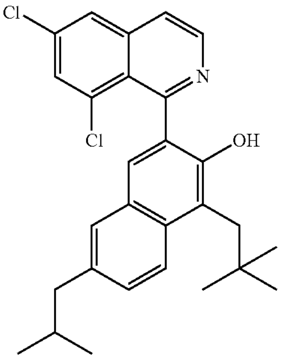

40

Intermediate 39 (3.1 g, 5.91 mmol) was dissolved in 15 mL of ethanol. Then, the reaction system was slowly added with 15 mL of HCl (2N), heated to reflux, and reacted for 2 h. After TLC showed that the reaction was completed, the reaction system was cooled to room temperature, neutralized to be neutral by adding a solution of sodium bicarbonate, and filtered to obtain a crude solid product. The crude solid product was purified through column chromatography to obtain Intermediate 40 (2.75 g with a yield of 99.78%).

Step 4: Synthesis of Intermediate 41

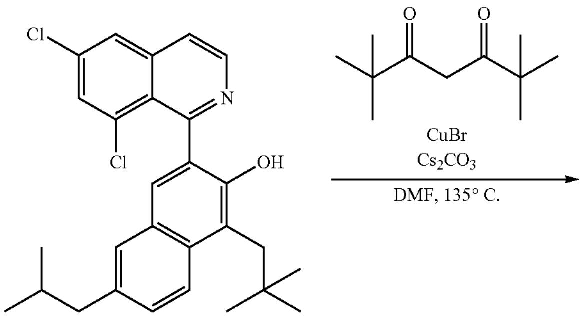

40

-continued

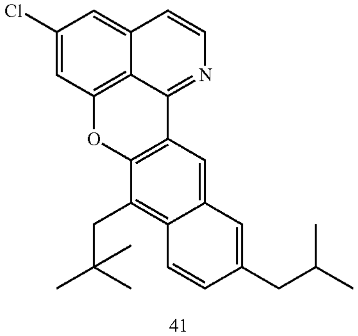

41

Intermediate 40 (2.75 g, 5.9 mmol), cuprous bromide (86 mg, 0.6 mmol), 2,2,6,6-tetramethylheptanedione (0.88 g, 4.8 mmol), cesium carbonate (4.89 g, IS mmol), and DMF (60 mL) were heated to 135° C. and reacted overnight under nitrogen protection. After TLC showed that the reaction was completed, the system was cooled to room temperature. Water was added thereto until a large amount of yellow solids were precipitated from the solution. The solids were filtered, washed with water several times, and suction-filtered to obtain Intermediate 41 as a yellow solid (2.54 g with a yield of 99.8%).

Step 5: Synthesis of Intermediate 42

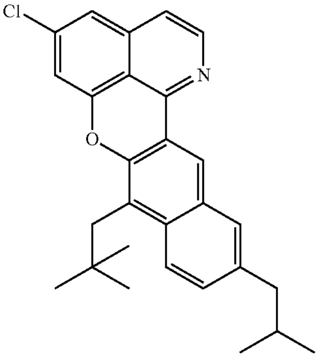

41

+

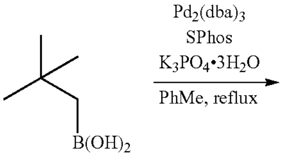

-continued

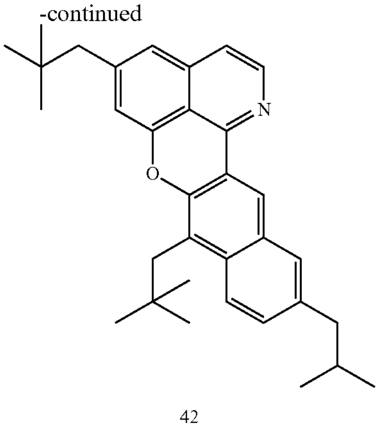

42

Intermediate 41 (2.54 g, 5.91 mmol), neopentylboronic acid (1.37 g, 11.83 mmol), $Pd_2(dba)_3$ (135 mg, 0.15 mmol), Sphos (243 mg, 0.59 mmol), $K_3PO_4.3H_2O$ (4.72 g, 17.7 mmol) and toluene (30 mL) were mixed. The system was purged with nitrogen three times, heated to reflux, and reacted overnight. After TLC detected that the reaction was completed, the system was cooled to room temperature, and the solvent was removed through rotary evaporation to obtain a crude product. The crude product was purified through column chromatography to obtain Intermediate 42 (1.8 g with a yield of 65%).

Step 6: Synthesis of an Iridium Dimer

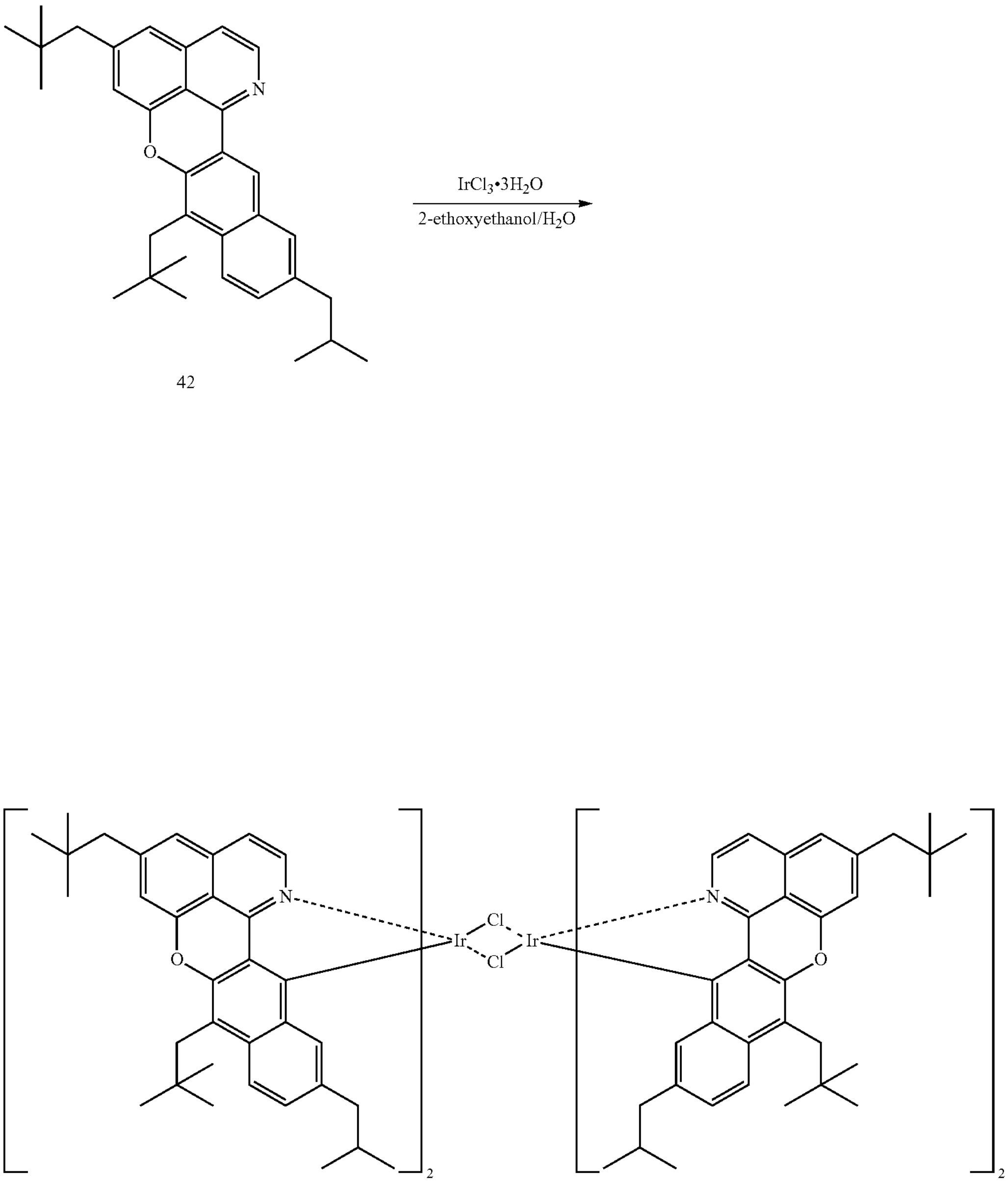

42

A mixture of Intermediate 42 (1.4 g, 3.0 mmol), iridium trichloride trihydrate (0.35 g, 1.0 mmol), 2-ethoxyethanol (12 mL), and water (4 mL) was refluxed under a nitrogen atmosphere for 24 h. The solution was cooled to room temperature and filtered to obtain an iridium dimer as a red solid which was directly used in the next step without further purification.

Step 7: Synthesis of Compound 291

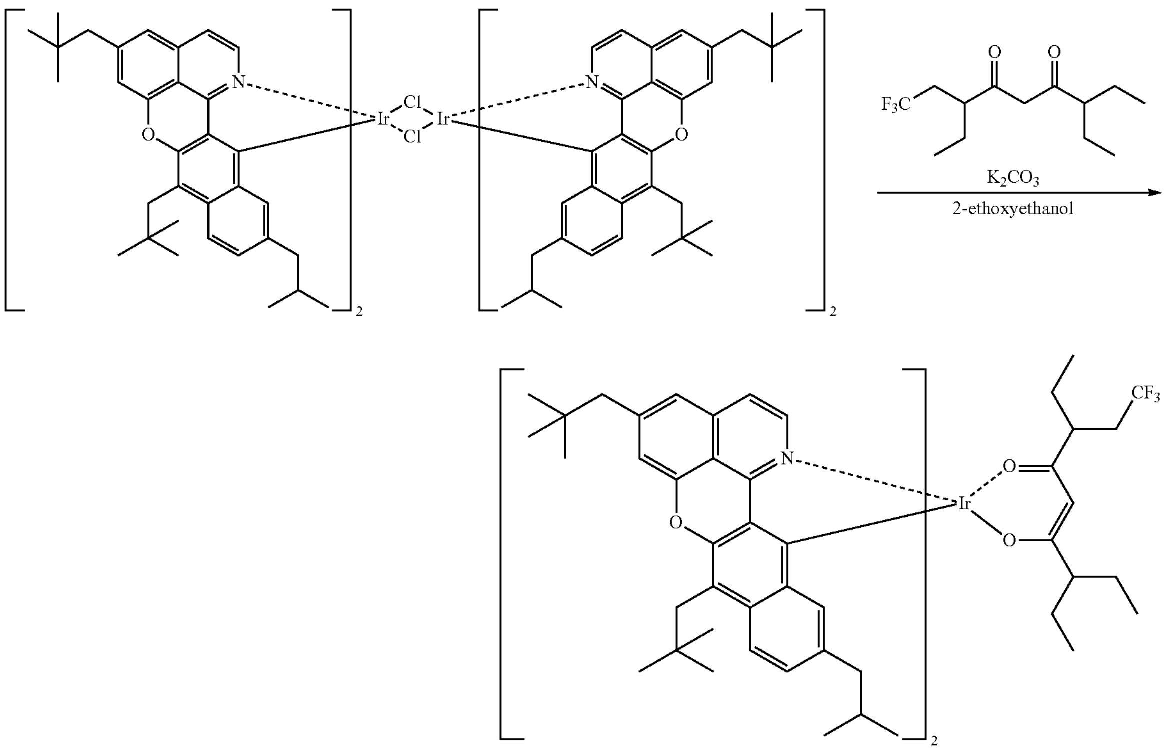

The iridium dimer obtained in the previous step, 3,7-diethyl-1,1,1-trifluorononane-4,6-dione (0.39 g, 1.5 mmol), and potassium carbonate (0.69 g, 5.00 mmol) were dissolved in 16 mL of ethoxyethanol and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 0.71 g of Compound 291 with a yield of 41.2%. The structure of the compound was confirmed through LC-MS as the target product with a molecular weight of 1386.7.

Synthesis Example 20: Synthesis of Compound 292

Step 1: Synthesis of an Iridium Dimer

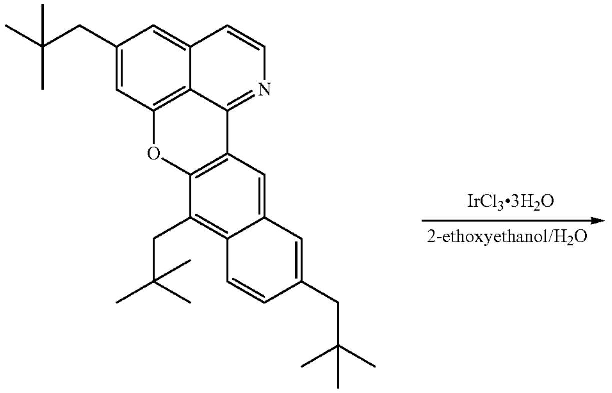

43

-continued

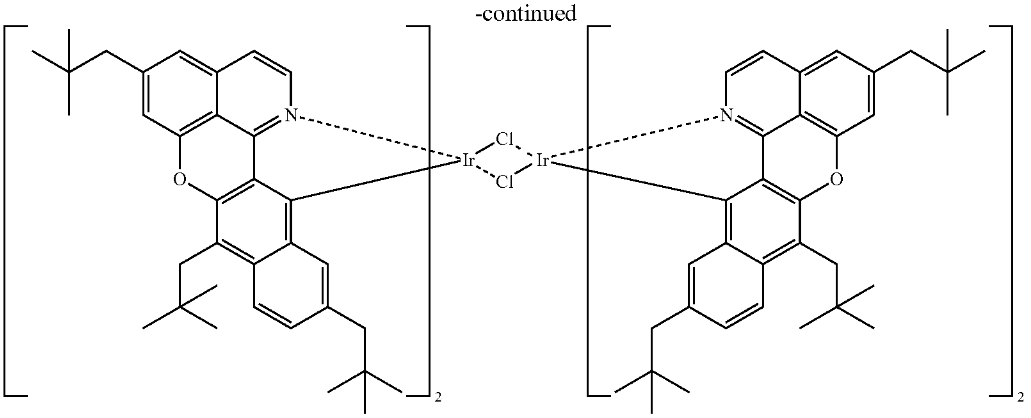

A mixture of Intermediate 43 (1.4 g, 2.92 mmol), iridium trichloride trihydrate (0.34 g, 0.97 mmol), 2-ethoxyethanol (12 mL), and water (4 mL) was refluxed under a nitrogen atmosphere for 24 h. The solution was cooled to room temperature and filtered to obtain an iridium dimer as a red solid which was directly used in the next step without further purification.

Step 2: Synthesis of Compound 292

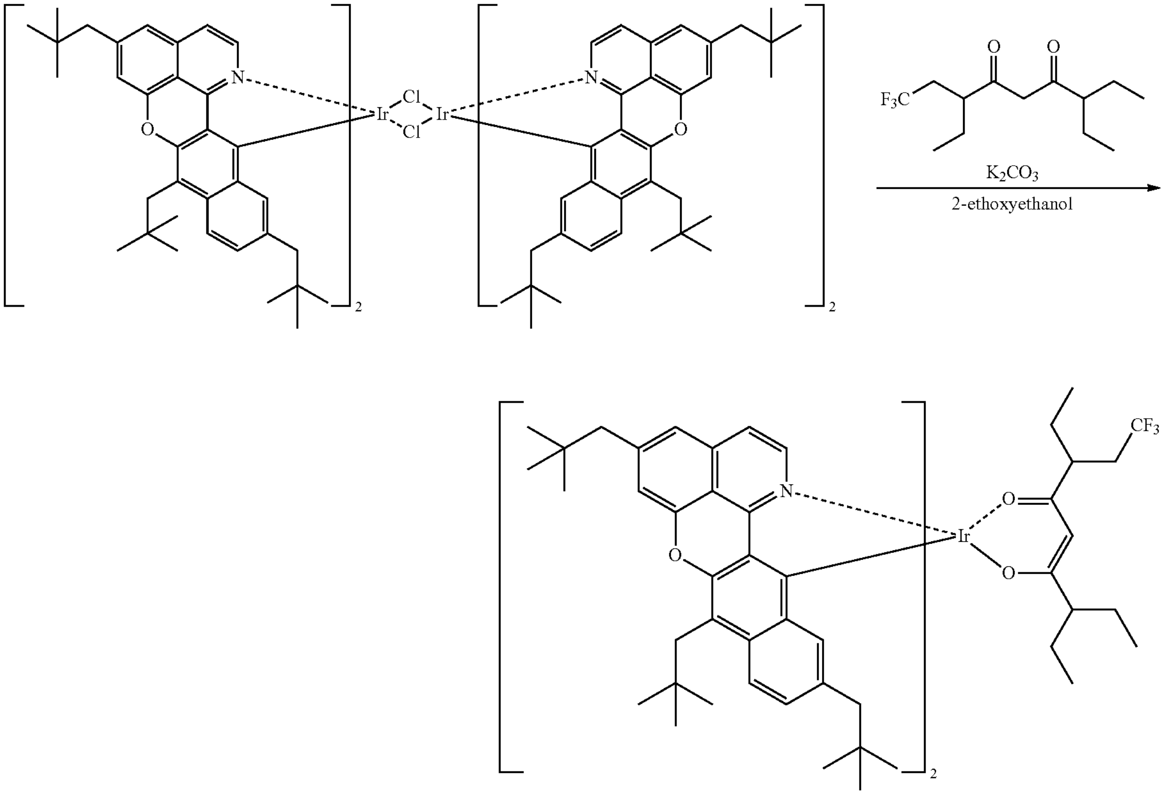

The iridium dimer obtained in the previous step, 3,7-diethyl-1,1,1-trifluorononane-4,6-dione (0.38 g, 1.5 mmol), and potassium carbonate (0.67 g, 4.85 mmol) were dissolved in 16 mL of ethoxyethanol and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 0.67 g of Compound 292 with a yield of 49%. The structure of the compound was confirmed through LC-MS as the target product with a molecular weight of 1414.7.

Synthesis Example 21: Synthesis of Compound 293

Step 1: Synthesis of Compound 293

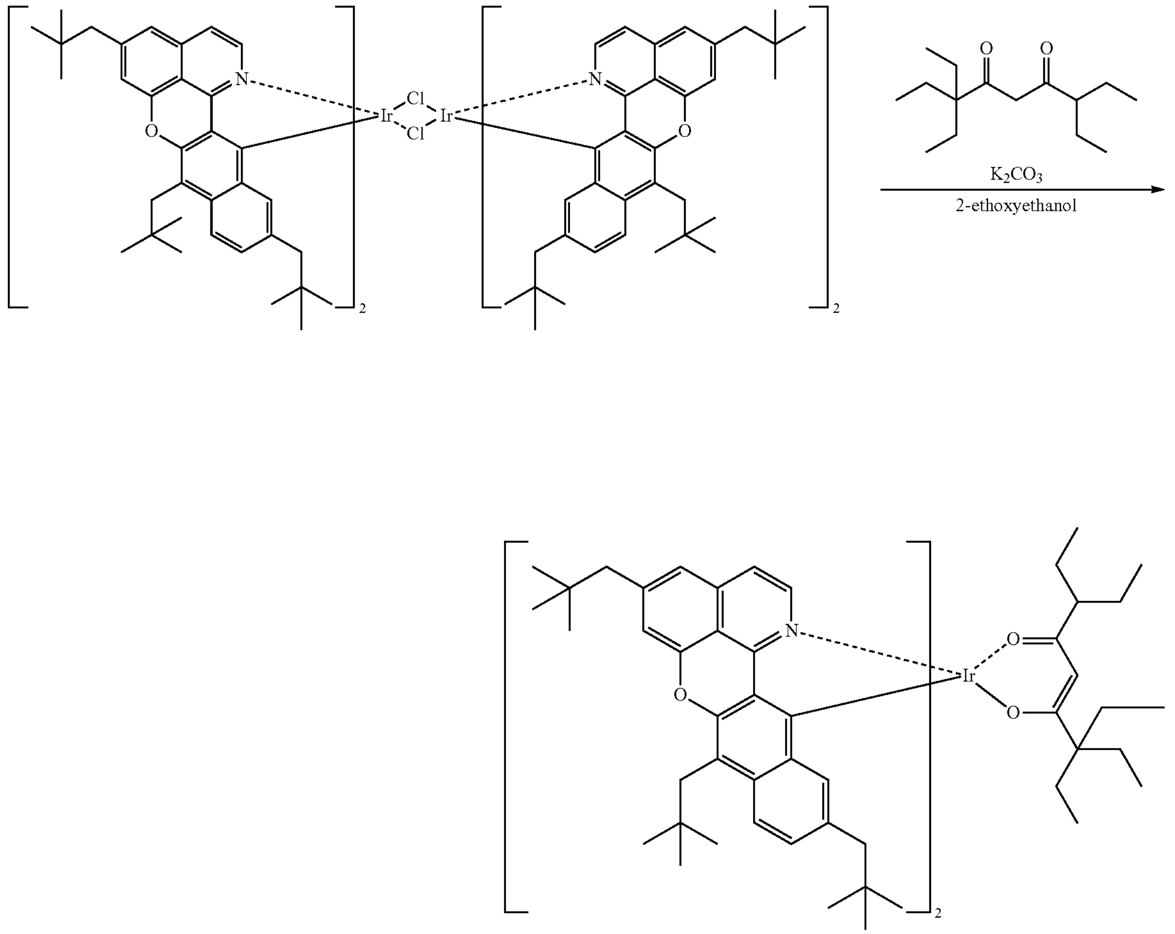

The iridium dimer (1.01 g, 0.97 mmol), 3,3,7-triethylnonane-4,6-dione (0.4 g, 1.5 mmol), and potassium carbonate (0.72 g, 4.85 mmol) were dissolved in 16 mL of ethoxyethanol and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 0.62 g of Compound 293 with a yield of 45%. The structure of the compound was confirmed through LC-MS as the target product with a molecular weight of 1388.8.

Synthesis Example 22: Synthesis of Compound 294

Step 1: Synthesis of an Iridium Dimer

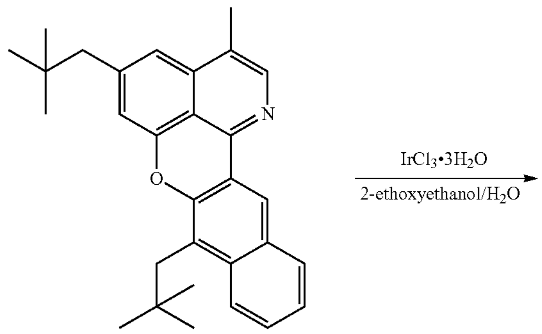

44

-continued

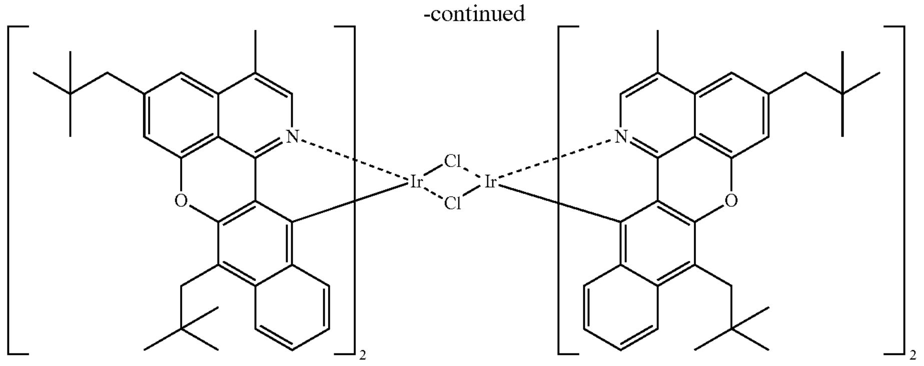

A mixture of Intermediate 44 (0.68 g, 1.60 mmol), iridium trichloride trihydrate (0.16 g, 0.45 mmol), 2-ethoxyethanol (6 mL), and water (2 mL) was refluxed under a nitrogen atmosphere for 24 h. The solution was cooled to room temperature and filtered to obtain an iridium dimer as a red solid which was directly used in the next step without further purification.

Step 2: Synthesis of Compound 294

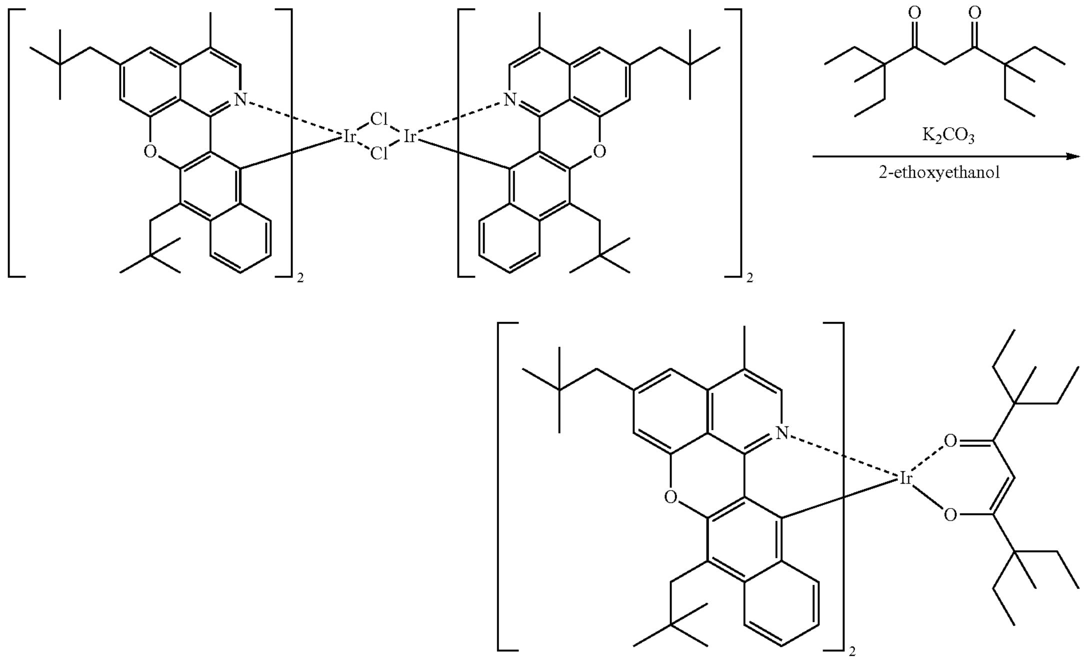

The iridium dimer obtained in the previous step, 3,7-diethyl-3,7-dimethylnonane-4,6-dione (0.22 g, 0.9 mmol), and potassium carbonate (0.62 g, 4.5 mmol) were dissolved in 16 mL of ethoxyethanol and reacted at 50° C. for 24 h under nitrogen protection. Then, the system was poured into a funnel filled with Celite to be filtered and washed with ethanol. The resulting solid was added with dichloromethane and the filtrate was collected. Then ethanol was added and the resulting solution was concentrated but not to dryness. The solution was filtered to obtain 0.42 g of Compound 294 with a yield of 73%. The structure of the compound was confirmed through LC-MS as the target product with a molecular weight of 1276.7.

Synthesis Example 23: Synthesis of Compound 295

Step 1: Synthesis of an Iridium Dimer

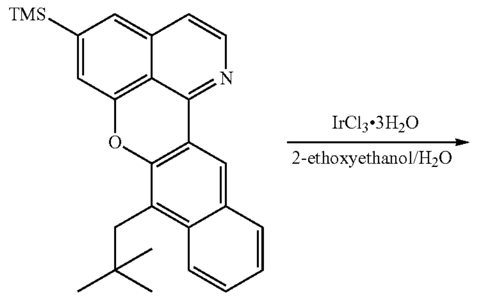

45

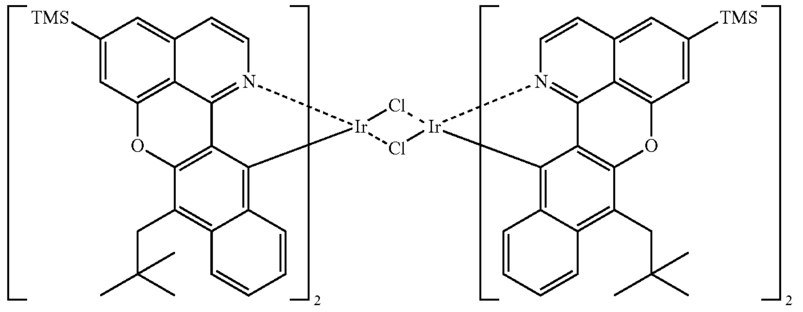

A mixture of Intermediate 45 (2.03 g, 4.93 mmol), iridium trichloride trihydrate (0.48 g, 1.37 mmol), 2-ethoxyethanol (33 mL), and water (11 mL) was refluxed under a nitrogen atmosphere for 24 h. The solution was cooled to room temperature and filtered to obtain an iridium dimer as a red solid which was directly used in the next step without further purification.

Step 2: Synthesis of Compound 295

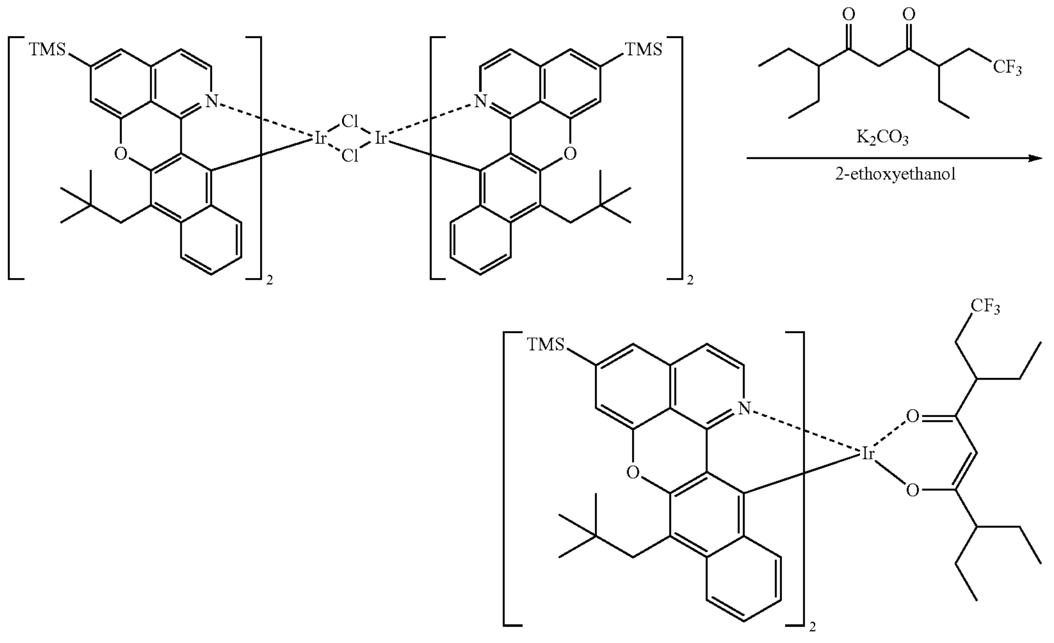

The iridium dimer obtained in the previous step, 3,7-diethyl-1,1,1-trifluorononane-4,6-dione (0.53 g, 2 mmol), and potassium carbonate (0.95 g, 6.85 mmol) were mixed in ethoxy ethanol (23 mL), purged with nitrogen, and reacted at room temperature for 48 h. The reaction solution was filtered through Celite. The filter cake was washed with an appropriate amount of EtOH. The crude product was washed with DCM into a 250 mL eggplant-shaped flask. EtOH (about 10 mL) was added thereto, and DCM was removed through rotary evaporation at room temperature until solids were precipitated. The solids were filtered and washed with an appropriate amount of EtOH to obtain a crude product.

The crude product was purified through column chromatography to obtain 0.1 g of Compound 295 with a yield of 5.7%. The structure of the compound was confirmed through LC-MS as the target product with a molecular weight of 1278.5.

Synthesis Example 24: Synthesis of Compound 280

Step 1: Synthesis of an Iridium Dimer

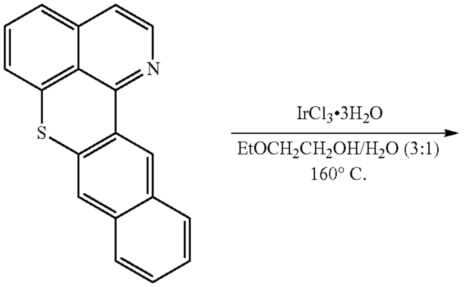

46

-continued

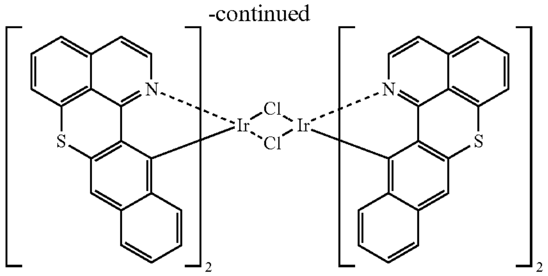

Intermediate 46 (0.15 g, 0.526 mmol) was dissolved in 9 mL of 2-ethoxyethanol and 3 mL of water at room temperature, $IrCl_3.3H_2O$ (62 mg, 0.175 mmol) was added, and the system was heated to 160° C. in an autoclave, refluxed for 24 h at this temperature, and cooled to room temperature. The solution was filtered. The solids were washed with ethanol until the washing liquid was colorless and then suction-filtered to obtain an iridium dimer as a red solid which was directly used in the next step without being purified.

Step 2: Synthesis of Compound 280

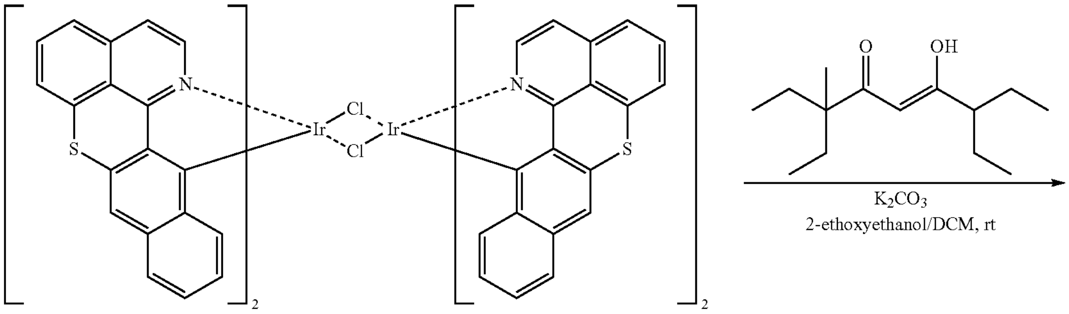

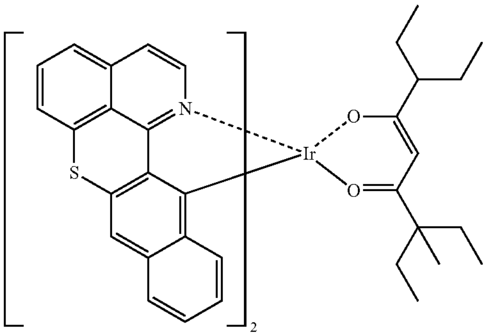

The iridium dimer (0.25 g, 0.157 mmol) obtained in the previous step was added to a 100 mL round-bottom flask, $K_2CO_3$ (217 mg, 1.57 mmol) and 3,7-diethyl-3-methylnonane-4,6-dione (142 mg, 0.629 mmol) were added, and 5 mL of 2-ethoxyethanol and 5 mL of DCM were added. The system was purged three times at room temperature, heated to 40° C., and stirred for 24 h under nitrogen protection. DCM was removed in vacuo. The system was filtered through Celite. The solids were washed with ethanol until the washing liquid was colorless and then suction-filtered to remove ethanol. Under vacuum filtration, the red solids on the Celite were dissolved in 200 mL of dichloromethane. 20 mL of ethanol was added, and dichloromethane was removed in vacuo to precipitate out a solid which was filtered to obtain Compound 280 as a red solid (195 mg, 0.20 mmol, with a yield of 63.7%). The structure of the compound was confirmed through LC-MS as the target product with a molecular weight of 986.3.

Synthesis Example 25: Synthesis of a Compound Comprising Ligand $L_{a1931}$

Step 1: Synthesis of Intermediate 48

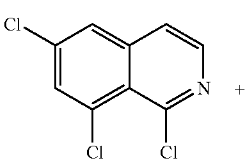

12

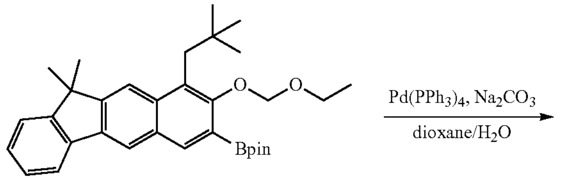

47

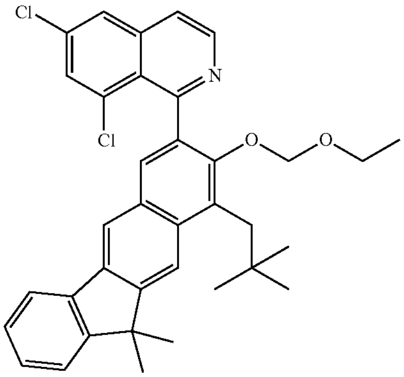

48

A mixture of Intermediate 12 (1.63 g, 7.0 mmol), Intermediate 47 (3.9 g, 7.4 mmol), $Pd(PPh_3)_4$ (0.4 g, 0.35 mmol), sodium carbonate (1.11 g, 10.5 mmol) and 1,4-dioxane/water (28 mL/7 mL) was heated under nitrogen protection to reflux overnight. After TLC showed that the reaction was complete, the system was cooled to room temperature. Water was added to the reaction system. The organic phase was extracted with EA, dried and filtered. The solvent was removed via rotary-evaporation to obtain Intermediate 48 (3.2 g, 76% yield).

Step 2: Synthesis of Intermediate 49

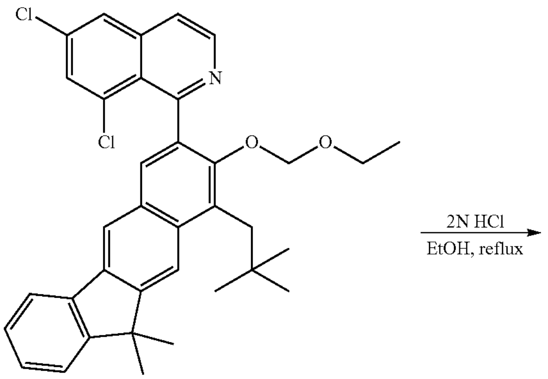

48

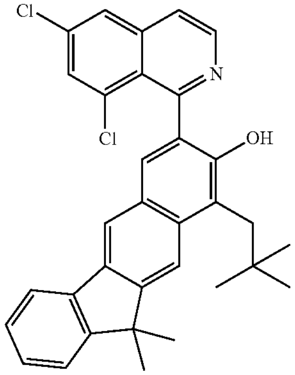

49

Intermediate 48 (3.2 g, 5.33 mmol) was dissolved in 15 mL of ethanol. 15 mL of HCl (2N) was then slowly added to the reaction system, followed by heating to reflux and reacting for 2 h. After TLC showed that the reaction was complete, the system was cooled to room temperature, neutralized by adding sodium bicarbonate solution to neutral, filtered to obtain a solid crude which was purified by column chromatography to obtain Intermediate 49 (2.65 g, 94.5% yield).

Step 3: Synthesis of Intermediate 50

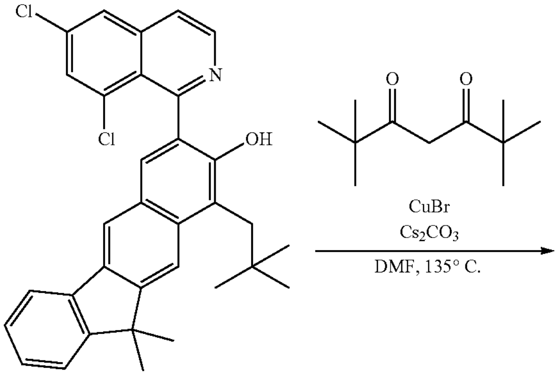

49

-continued

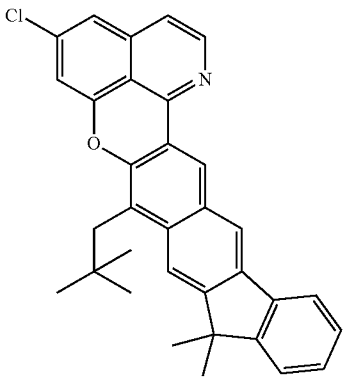

50

-continued

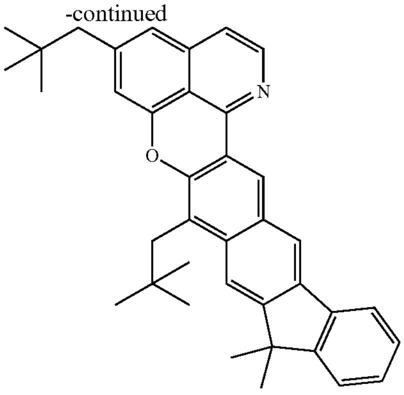

51

Intermediate 49 (2.65 g, 5.0 mmol), cuprous bromide (72 mg, 0.5 mmol), 2,2,6,6-tetramethylheptanedione (0.74 g, 4.0 mmol), cesium carbonate (4.07 g, 12.5 mmol) and DMF (50 mL) were heated to 135° C. under nitrogen protection and reacted overnight. After TLC showed that the reaction was complete, the system was cooled to room temperature. Water was added to the system to precipitate out a large amount of yellow solids which was filtered, washed with water several times and suction-filtered to obtain Intermediate 50 as a yellow solid (2.26 g, 92.4% yield).

Step 4: Synthesis of Intermediate 51

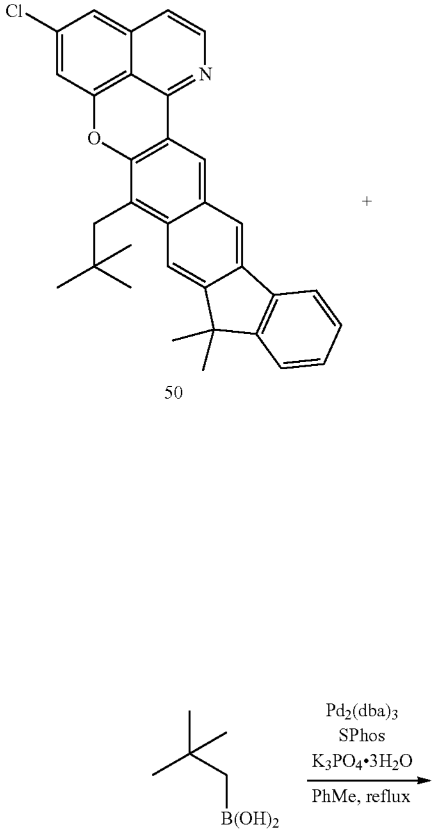

Intermediate 50 (2.26 g, 4.62 mmol), neopentylboronic acid (1.07 g, 9.23 mmol), $Pd_2(dba)_3$ (106 mg, 0.12 mmol), Sphos (190 mg, 0.46 mmol), $K_3PO_4.3H_2O$ (3.69 g, 13.9 mmol) and toluene (30 mL) were mixed. The system was purged with nitrogen three times, heated to reflux, and reacted overnight. After TLC showed that the reaction was complete, the system was cooled to room temperature. The solvent was removed through rotary-evaporation to obtain a crude product, which was purified by column chromatography to obtain Intermediate 51 (1.8 g, 74% yield). The structure of this intermediate was confirmed as the target structure by LC-MS with the molecular weight of 525.3.

Starting from Intermediate 51, a compound of the present disclosure comprising the ligand $L_{a1931}$ can be obtained by the person skilled in the art by referring to the methods in the prior art or by following the methods of Synthesis Examples 1-24.

Those skilled in the art will appreciate that the above preparation methods are merely illustrative. Those skilled in the art can obtain other compound structures of the present disclosure through the modifications of the preparation methods.

Device Example

Device Example 1

First, a glass substrate having an Indium Tin Oxide (ITO) anode with a thickness of nm was cleaned and then treated with oxygen plasma and UV ozone. After the treatment, the substrate was dried in a glovebox to remove moisture. Next, the substrate was mounted on a substrate holder and placed in a vacuum chamber. Organic layers specified below were sequentially deposited through vacuum thermal evaporation on the ITO anode at a rate of 0.2 to Angstroms per second at a vacuum degree of about $10^{-8}$ torr. Compound HI was used as a hole injection layer (HIL) with a thickness of 100 Å. Compound HT was used as a hole transporting layer (HTL) with a thickness of 400 Å. Compound EB1 was used as an electron blocking layer (EBL) with a thickness of 50 Å. Compound 81 of the present disclosure was doped in a host compound RH to be used as an emissive layer (EML, 2:98) with a thickness of 400 Å. Compound HB was used as a hole blocking layer (HBL) with a thickness of 50 Å. On the HBL, Compound ET and 8-hydroxyquinolinolato-lithium (Liq) were co-deposited as an electron transporting layer (ETL) with a thickness of 350 Å. Finally, Liq with a thickness of 1 nm was deposited as an electron injection layer, and A1 with a thickness of 120 nm was deposited as a cathode. The device was transferred back to the glovebox and encapsulated with a glass lid and a moisture getter to complete the device.

Device Example 2

The preparation method in Device Example 2 was the same as that in Device Example 1, except that Compound 81 of the present disclosure was replaced with Compound 83 of the present disclosure in the emissive layer (EML).

Device Example 3

The preparation method in Device Example 3 was the same as that in Device Example 1, except that Compound 81 of the present disclosure was replaced with Compound 64 of the present disclosure in the emissive layer (EML), and Compound 64 of the present disclosure was doped with Compound RH at a ratio of 3:97, and Compound EB1 was replaced with Compound EB2 in the electron blocking layer (EBL).

Device Example 4

The preparation method in Device Example 4 was the same as that in Device Example 3, except that Compound 64 of the present disclosure was replaced with Compound 93 of the present disclosure in the emissive layer (EML).

Device Example 5

The preparation method in Device Example 5 was the same as that in Device Example 3, except that Compound 64 of the present disclosure was replaced with Compound 117 of the present disclosure in the emissive layer (EML).

Device Example 6

The preparation method in Device Example 6 was the same as that in Device Example 3, except that Compound 64 of the present disclosure was replaced with Compound 116 of the present disclosure in the emissive layer (EML).

Device Example 7

The preparation method in Device Example 7 was the same as that in Device Example 3, except that Compound 64 of the present disclosure was replaced with Compound 261 of the present disclosure in the emissive layer (EML).

Device Example 8

The preparation method in Device Example 8 was the same as that in Device Example 3, except that Compound 64 of the present disclosure was replaced with Compound 262 of the present disclosure in the emissive layer (EML).

Device Example 9

The preparation method in Device Example 9 was the same as that in Device Example 3, except that Compound 64 of the present disclosure was replaced with Compound 264 of the present disclosure in the emissive layer (EML).

Device Example 10

The preparation method in Device Example 10 was the same as that in Device Example 3, except that Compound 64 of the present disclosure was replaced with Compound of the present disclosure in the emissive layer (EML).

Device Example 11

The preparation method in Device Example 11 was the same as that in Device Example 3, except that Compound 64 of the present disclosure was replaced with Compound of the present disclosure in the emissive layer (EML).

Device Example 12

The preparation method in Device Example 12 was the same as that in Device Example 3, except that Compound 64 of the present disclosure was replaced with Compound of the present disclosure in the emissive layer (EML).

Device Example 13

The preparation method in Device Example 13 was the same as that in Device Example 3, except that Compound 64 of the present disclosure was replaced with Compound of the present disclosure in the emissive layer (EML).

Device Example 14

The preparation method in Device Example 14 was the same as that in Device Example 3, except that Compound 64 of the present disclosure was replaced with Compound of the present disclosure in the emissive layer (EML).

Device Example 15

The preparation method in Device Example 15 was the same as that in Device Example 3, except that Compound 64 of the present disclosure was replaced with Compound of the present disclosure in the emissive layer (EML).

Device Example 16

The preparation method in Device Example 16 was the same as that in Device Example 3, except that Compound 64 of the present disclosure was replaced with Compound of the present disclosure in the emissive layer (EML).

Device Example 17

The preparation method in Device Example 17 was the same as that in Device Example 3, except that Compound 64 of the present disclosure was replaced with Compound of the present disclosure in the emissive layer (EML).

Device Example 18

The preparation method in Device Example 18 was the same as that in Device Example 3, except that Compound 64 of the present disclosure was replaced with Compound of the present disclosure in the emissive layer (EML).

Device Example 19

The preparation method in Device Example 19 was the same as that in Device Example 3, except that Compound 64 of the present disclosure was replaced with Compound of the present disclosure in the emissive layer (EML).

Device Example 20

The preparation method in Device Example 20 was the same as that in Device Example 3, except that Compound 64 of the present disclosure was replaced with Compound of the present disclosure in the emissive layer (EML).

Device Example 21

The preparation method in Device Example 21 was the same as that in Device Example 3, except that Compound 64 of the present disclosure was replaced with Compound of the present disclosure in the emissive layer (EML).

Device Comparative Example 1

The preparation method in Device Comparative Example 1 was the same as that in Device Example 1, except that Compound 81 of the present disclosure was replaced with Compound RD in the emissive layer (EML).

Device Comparative Example 2

The preparation method in Device Comparative Example 2 was the same as that in Device Example 3, except that Compound 64 of the present disclosure was replaced with Compound RD in the emissive layer (EML).

The structures and thicknesses of partial layers of the devices are shown in the following table. The layers using more than one material were obtained by doping different compounds at weight ratios as recorded.

TABLE 1

Partial device structures in device examples and comparative examples

| Device No. | HIL | HTL | EBL | EML | HBL | ETL |
|---|---|---|---|---|---|---|
| Comparative Example 1 | Compound HI (100 Å) | Compound HT (400 Å) | Compound EB1 (50 Å) | Compound RH:Compound RD (98:2) (400 Å) | Compound HB (50 Å) | Compound ET:Liq (40:60) (350 Å) |
| Example 1 | Compound HI (100 Å) | Compound HT (400 Å) | Compound EB1 (50 Å) | Compound RH:Compound 81 (98:2) (400 Å) | Compound HB (50 Å) | Compound ET:Liq (40:60) (350 Å) |
| Example 2 | Compound HI (100 Å) | Compound HT (400 Å) | Compound EB1 (50 Å) | Compound RH:Compound 83 (98:2) (400 Å) | Compound HB (50 Å) | Compound ET:Liq (40:60) (350 Å) |
| Example 3 | Compound HI (100 Å) | Compound HT (400 Å) | Compound EB2 (50 Å) | Compound RH:Compound 64 (97:3) (400 Å) | Compound HB (50 Å) | Compound ET:Liq (40:60) (350 Å) |
| Comparative Example 2 | Compound HI (100 Å) | Compound HT (400 Å) | Compound EB2 (50 Å) | Compound RH:Compound RD (97:3) (400 Å) | Compound HB (50 Å) | Compound ET:Liq (40:60) (350 Å) |
| Example 4 | Compound HI (100 Å) | Compound HT (400 Å) | Compound EB2 (50 Å) | Compound RH:Compound 93 (97:3) (400 Å) | Compound HB (50 Å) | Compound ET:Liq (40:60) (350 Å) |
| Example 5 | Compound HI (100 Å) | Compound HT (400 Å) | Compound EB2 (50 Å) | Compound RH:Compound 117 (97:3) (400 Å) | Compound HB (50 Å) | Compound ET:Liq (40:60) (350 Å) |
| Example 6 | Compound HI (100 Å) | Compound HT (400 Å) | Compound EB2 (50 Å) | Compound RH:Compound 116 (97:3) (400 Å) | Compound HB (50 Å) | Compound ET:Liq (40:60) (350 Å) |
| Example 7 | Compound HI (100 Å) | Compound HT (400 Å) | Compound EB2 (50 Å) | Compound RH:Compound 261 (97:3) (400 Å) | Compound HB (50 Å) | Compound ET:Liq (40:60) (350 Å) |
| Example 8 | Compound HI (100 Å) | Compound HT (400 Å) | Compound EB2 (50 Å) | Compound RH:Compound 262 (97:3) (400 Å) | Compound HB (50 Å) | Compound ET:Liq (40:60) (350 Å) |
| Example 9 | Compound HI (100 Å) | Compound HT (400 Å) | Compound EB2 (50 Å) | Compound RH:Compound 264 (97:3) (400 Å) | Compound HB (50 Å) | Compound ET:Liq (40:60) (350 Å) |
| Example 10 | Compound HI (100 Å) | Compound HT (400 Å) | Compound EB2 (50 Å) | Compound RH:Compound 263 (97:3) (400 Å) | Compound HB (50 Å) | Compound ET:Liq (40:60) (350 Å) |
| Example 11 | Compound HI (100 Å) | Compound HT (400 Å) | Compound EB2 (50 Å) | Compound RH:Compound 266 (97:3) (400 Å) | Compound HB (50 Å) | Compound ET:Liq (40:60) (350 Å) |
| Example 12 | Compound HI (100 Å) | Compound HT (400 Å) | Compound EB2 (50 Å) | Compound RH:Compound 265 (97:3) (400 Å) | Compound HB (50 Å) | Compound ET:Liq (40:60) (350 Å) |

TABLE 1-continued

| Partial device structures in device examples and comparative examples | | | | | | |
|---|---|---|---|---|---|---|
| Device No. | HIL | HTL | EBL | EML | HBL | ETL |
| Example 13 | Compound HI (100 Å) | Compound HT (400 Å) | Compound EB2 (50 Å) | Compound RH:Compound 267 (97:3) (400 Å) | Compound HB (50 Å) | Compound ET:Liq (40:60) (350 Å) |
| Example 14 | Compound HI (100 Å) | Compound HT (400 Å) | Compound EB2 (50 Å) | Compound RH:Compound 282 (97:3) (400 Å) | Compound HB (50 Å) | Compound ET:Liq (40:60) (350 Å) |
| Example 15 | Compound HI (100 Å) | Compound HT (400 Å) | Compound EB2 (50 Å) | Compound RH:Compound 273 (97:3) (400 Å) | Compound HB (50 Å) | Compound ET:Liq (40:60) (350 Å) |
| Example 16 | Compound HI (100 Å) | Compound HT (400 Å) | Compound EB2 (50 Å) | Compound RH:Compound 294 (97:3) (400 Å) | Compound HB (50 Å) | Compound ET:Liq (40:60) (350 Å) |
| Example 17 | Compound HI (100 Å) | Compound HT (400 Å) | Compound EB2 (50 Å) | Compound RH:Compound 287 (97:3) (400 Å) | Compound HB (50 Å) | Compound ET:Liq (40:60) (350 Å) |
| Example 18 | Compound HI (100 Å) | Compound HT (400 Å) | Compound EB2 (50 Å) | Compound RH:Compound 291 (97:3) (400 Å) | Compound HB (50 Å) | Compound ET:Liq (40:60) (350 Å) |
| Example 19 | Compound HI (100 Å) | Compound HT (400 Å) | Compound EB2 (50 Å) | Compound RH:Compound 292 (97:3) (400 Å) | Compound HB (50 Å) | Compound ET:Liq (40:60) (350 Å) |
| Example 20 | Compound HI (100 Å) | Compound HT (400 Å) | Compound EB2 (50 Å) | Compound RH:Compound 293 (97:3) (400 Å) | Compound HB (50 Å) | Compound ET:Liq (40:60) (350 Å) |
| Example 21 | Compound HI (100 Å) | Compound HT (400 Å) | Compound EB2 (50 Å) | Compound RH:Compound 295 (97:3) (400 Å) | Compound HB (50 Å) | Compound ET:Liq (40:60) (350 Å) |

The structures of the materials used in the devices are shown as follows:

Compound HI

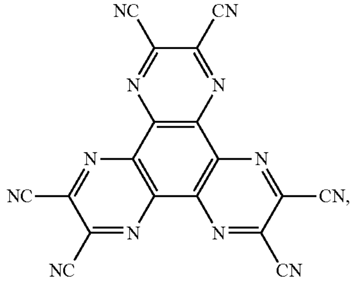

-continued

Compound HT

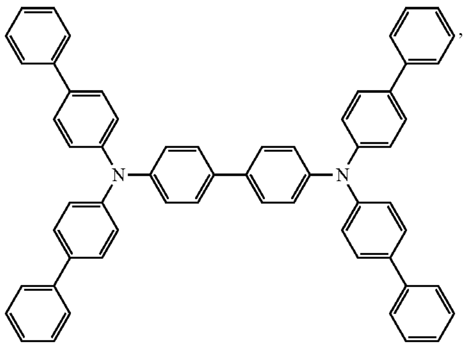

-continued
Compound EB1
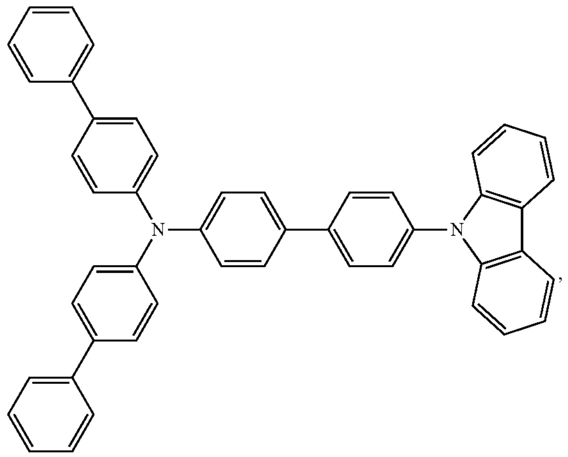
Compound EB2
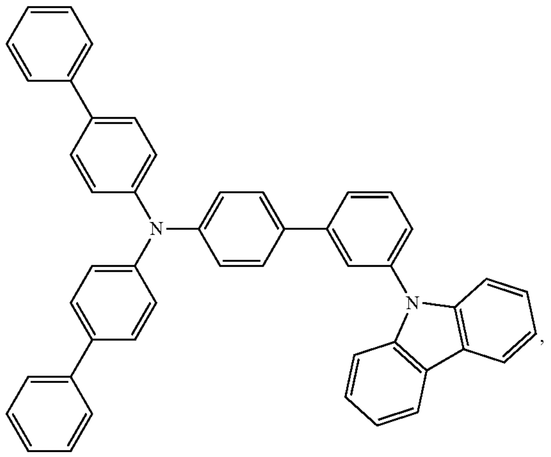
Formula RH
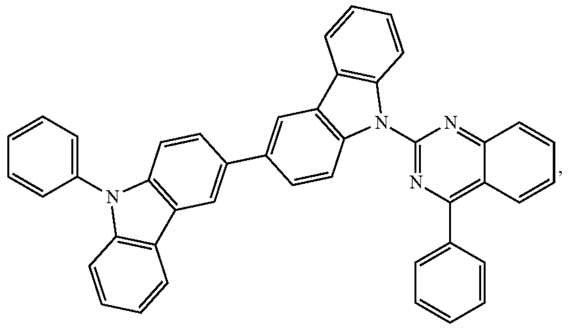
Formula HB
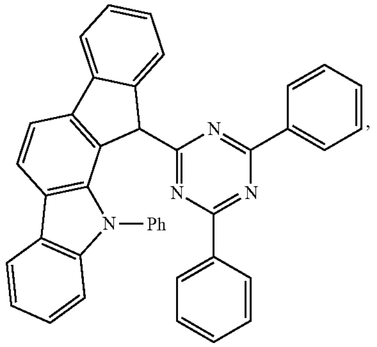
-continued
Formula ET
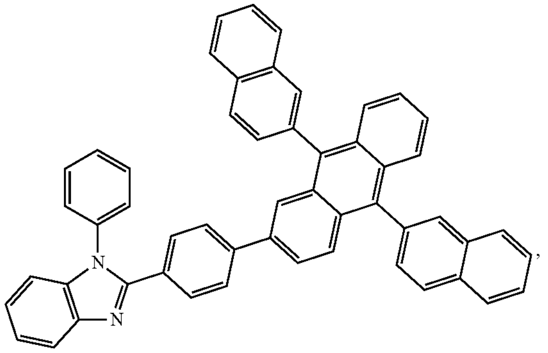
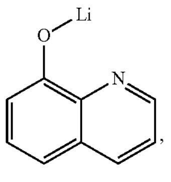
Liq
Formula RD
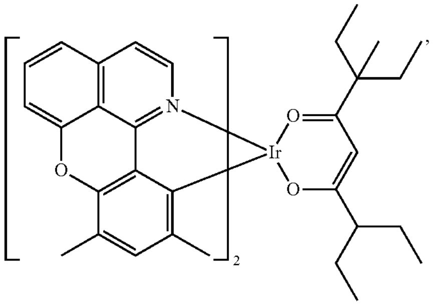
Formula 81
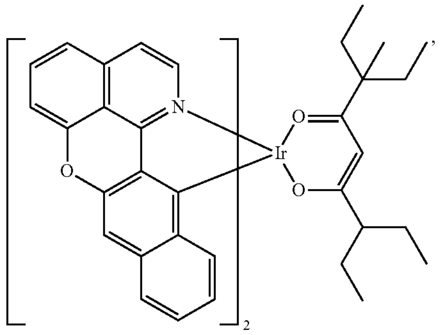
Formula 83
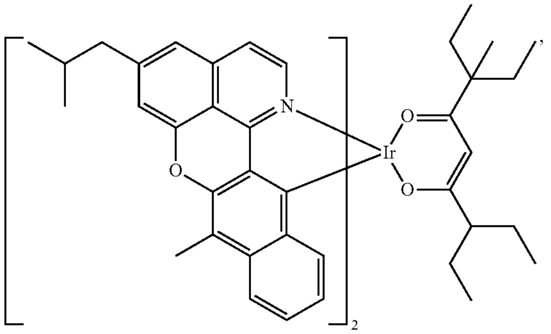

-continued
Formula 64
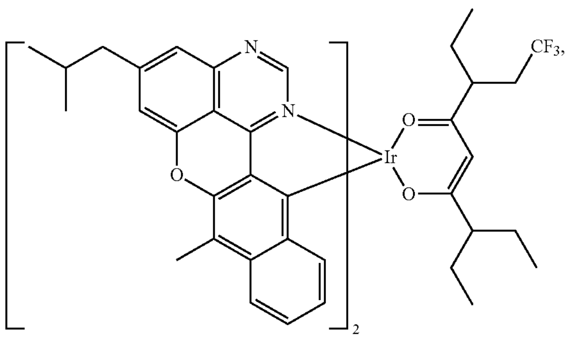
Formula 93
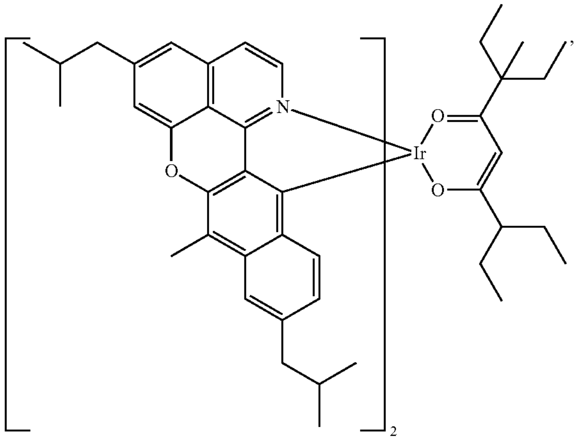
Formula 117
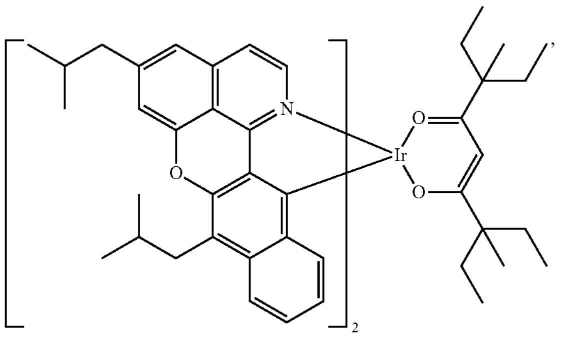
Formula 116
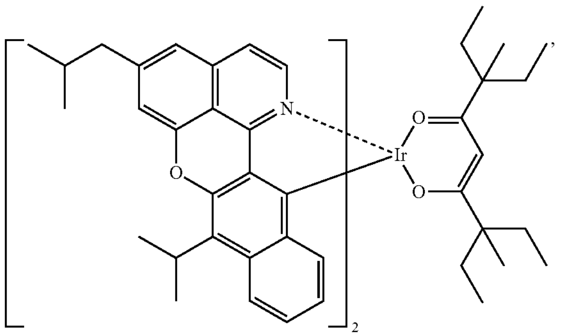
-continued
Formula 261
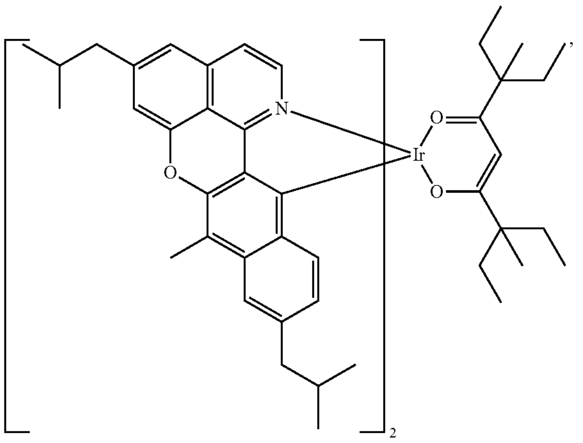
Compound 262
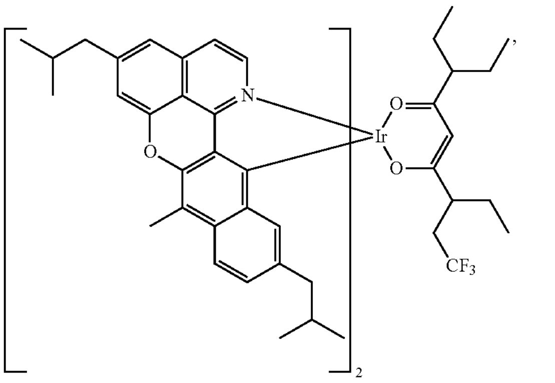
Compound 263
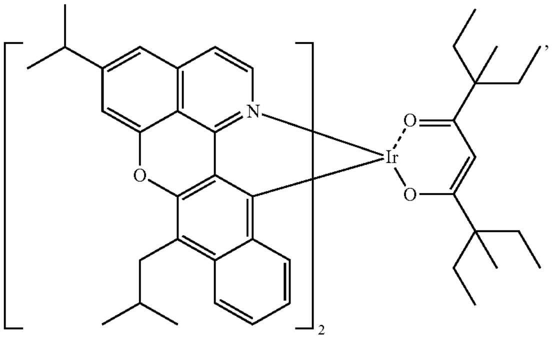
Compound 264
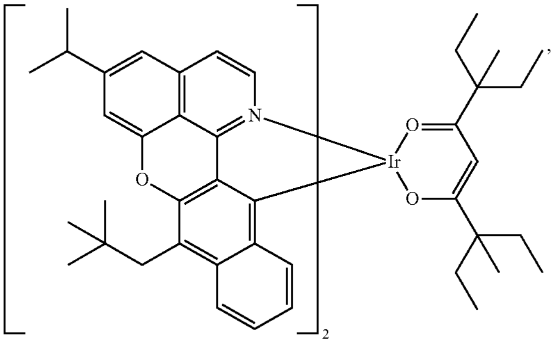

-continued
Compound 265
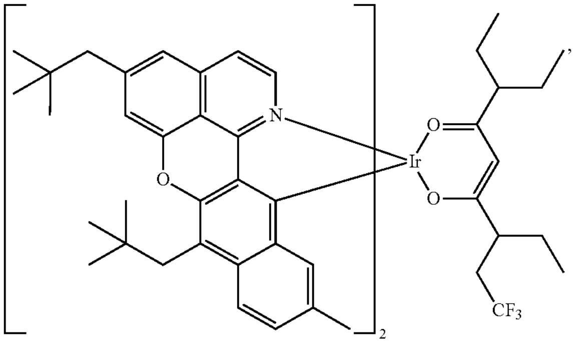
Compound 266
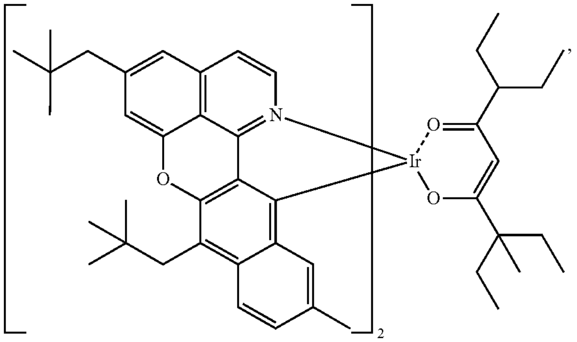
Compound 267
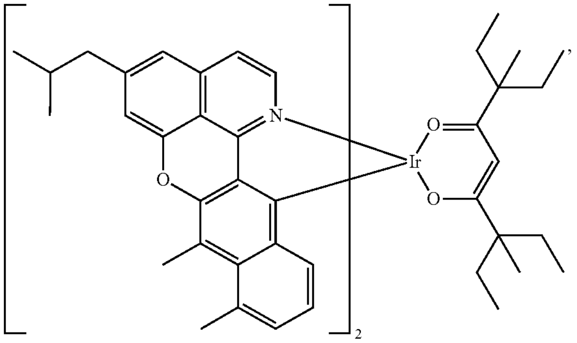
Compound 282
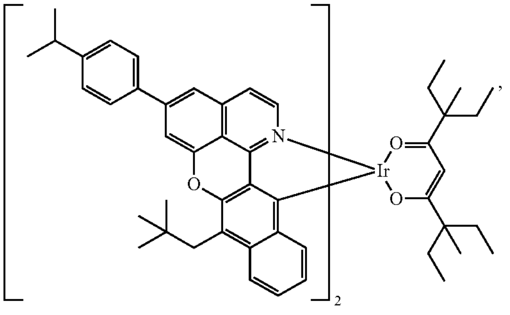
-continued
Compound 273
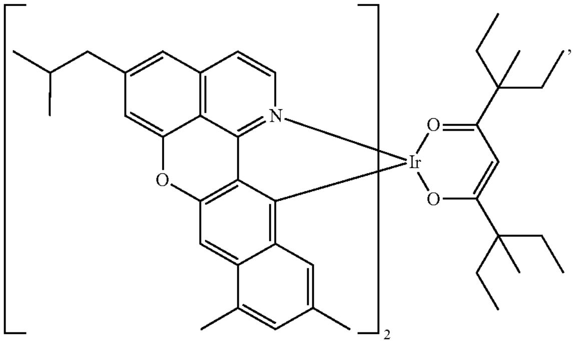
Compound 294
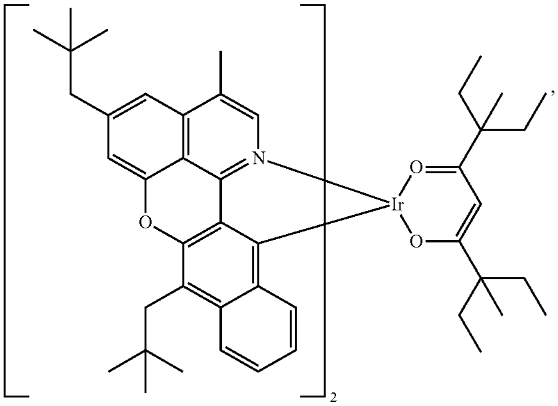
Compound 287
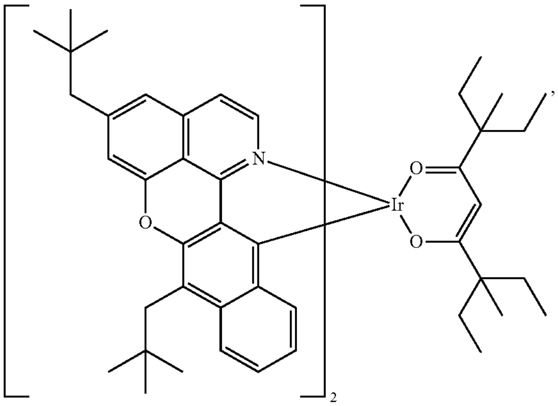
Compound 291
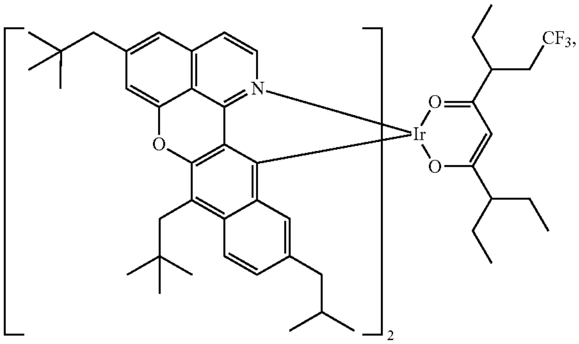

-continued

Compound 292

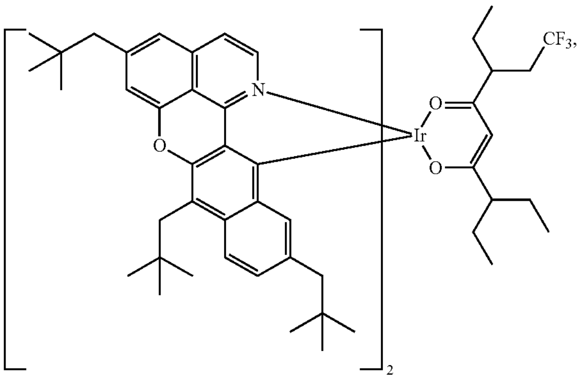

Compound 293

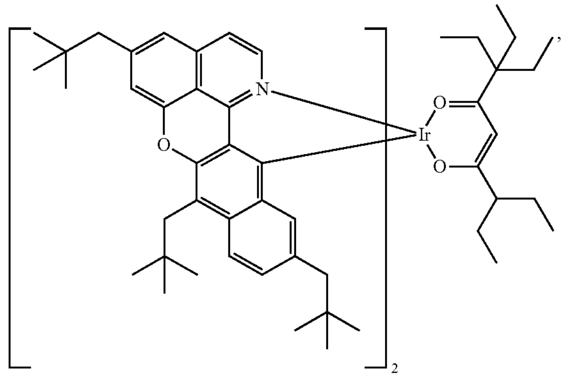

Compound 295

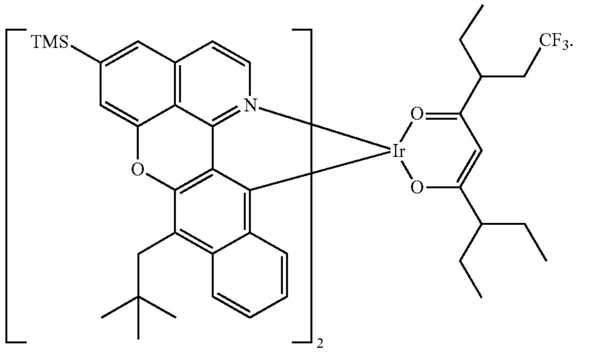

Current-voltage-luminance (IVL) and lifetime characteristics of the devices were measured at different current densities and voltages. Table 2 shows the CIE data, driving voltage (V), maximum emission wavelength ($\lambda_{max}$), full width at half maximum (FWHM), and external quantum efficiency (EQE) of Device Example 1, Device Example 2, and Device Comparative Example 1 measured at a constant current of IS mA/cm$^2$ and the lifetime (LT97) measured at a constant current of 80 mA/cm$^2$.

TABLE 2

| Device data | | | | | | |
|---|---|---|---|---|---|---|
| Device No. | CIE (x, y) | $\lambda_{max}$ (nm) | FWHM (nm) | Voltage (V) | EQE (%) | LT97 (h) |
| Comparative Example 1 | (0.525, 0.472) | 566 | 28.3 | 3.79 | 17.5 | 2 |
| Example 1 | (0.645, 0.351) | 606 | 28.7 | 3.24 | 18.4 | 30 |
| Example 2 | (0.674, 0.324) | 618 | 31 | 3.55 | 23.8 | 105 |

Discussion

From the data shown in Table 2, it can be seen that the FWHMs of Comparative Example 1 and Examples 1 and 2 were all around 30 nm, which are very remarkable. But, Comparative Example 1 had a maximum emission wavelength of 566 nm. Examples 1 and 2, however, achieved a large red shift of the maximum emission wavelength by designing the molecular structure of a light-emitting dopant, so that the emission wavelengths were between nm and 620 nm, which satisfies the requirement on different red emission wavelength bands. At a constant current of IS mA/cm$^2$, Examples 1 and 2 were superior to Comparative Example 1 in terms of the voltage and the external quantum efficiency. Especially, the external quantum efficiency of Example 2 was 36% higher than that of Comparative Example 1. According to the data on the lifetime LT97 of Comparative Example 1 and Examples 1 and 2 at a constant current of 80 mA/cm$^2$, the lifetime of Comparative Example 1 under this condition was 2 hours, the lifetime of Example 1 was 30 hours, and the lifetime of Example 2 was 105 hours. Therefore, it can be seen that the compounds disclosed by the present disclosure can greatly improve the lifetime of an electroluminescent device. From the preceding data analysis, it can be seen that while maintaining a very narrow FWHM, the Examples can effectively adjust the emission wavelength to meet the requirement on red light emission, reduce the voltage, improve the EQE, and most importantly, greatly improve the lifetime, thereby providing excellent performance.

Table 3 shows the CIE data, driving voltage (V), maximum emission wavelength (λmax), full width at half maximum (FWHM), and lifetime (LT97) of Device Example 3 measured at a constant current of 15 mA/cm$^2$.

TABLE 3

| Device data | | | | | |
|---|---|---|---|---|---|
| Device No. | CIE (x, y) | $\lambda_{max}$ (nm) | FWHM (nm) | Voltage (V) | LT97 (h) |
| Example 3 | (0.683, 0.313) | 633 | 39 | 3.78 | 180 |

Discussion

From the data shown in Table 3, it can be seen that Example 3 achieved an emission wavelength of 633 nm by adjusting the molecular structure, which is in a deep red region. At a constant current of 15 mA/cm$^2$, Example 3 had a very narrow FWHM of 39 nm and a relatively low driving voltage of 3.78 V.

Table 4 shows the CIE data, driving voltage (V), maximum emission wavelength ($\lambda_{max}$), full width at half maximum (FWHM), and external quantum efficiency (EQE) of Device Comparative Example 2, and Device Examples 4 to 21 measured at a constant current of 15 mA/cm$^2$ and the lifetime (LT97) at a constant current of 80 mA/cm$^2$.

TABLE 4

| Device No. | CIE (x, y) | $\lambda_{max}$ (nm) | FWHM (nm) | Voltage (V) | EQE (%) | LT97 (h) |
|---|---|---|---|---|---|---|
| Device data | | | | | | |
| Comparative Example 2 | (0.529, 0.469) | 566 | 29.3 | 4.21 | 21.83 | 3 |
| Example 4 | (0.671, 0.328) | 616 | 32.3 | 4.37 | 22.28 | 81 |
| Example 5 | (0.672, 0.326) | 617 | 31.6 | 4.12 | 23.38 | 84 |
| Example 6 | (0.667, 0.331) | 614 | 31.0 | 4.27 | 21.91 | 61 |
| Example 7 | (0.671, 0.328) | 616 | 32.5 | 4.32 | 22.84 | 63 |
| Example 8 | (0.683, 0.315) | 623 | 32.9 | 4.25 | 21.96 | 139 |
| Example 9 | (0.671, 0.328) | 616 | 32.3 | 4.32 | 23.65 | 119 |
| Example 10 | (0.673, 0.326) | 617 | 31.4 | 4.30 | 22.85 | 108 |
| Example 11 | (0.686, 0.316) | 623 | 34.1 | 4.33 | 23.63 | 149 |
| Example 12 | (0.679, 0.320) | 622 | 34.3 | 4.20 | 22.95 | 148 |
| Example 13 | (0.684, 0.315) | 623 | 35.7 | 4.69 | 23.08 | 80 |
| Example 14 | (0.687, 0.312) | 625 | 33.5 | 4.23 | 25.88 | 41 |
| Example 15 | (0.650, 0.349) | 607 | 31.4 | 4.15 | 23.34 | 31 |
| Example 16 | (0.677, 0.322) | 618 | 31.0 | 4.33 | 21.88 | 149 |
| Example 17 | (0.670, 0.328) | 616 | 32.1 | 4.31 | 21.94 | 54 |
| Example 18 | (0.676, 0.321) | 621 | 32.9 | 4.33 | 22.25 | 63 |
| Example 19 | (0.673, 0.325) | 619 | 31.8 | 4.30 | 21.70 | 51 |
| Example 20 | (0.678, 0.320) | 621 | 31.6 | 4.53 | 22.95 | 106 |
| Example 21 | (0.683, 0.314) | 625 | 32.8 | 4.00 | 21.25 | 46 |

Discussion

From the device data in Table 4, it can also be seen that Examples 4 to 13, where the compounds of the present disclosure were used as a dopant in the light-emitting layer, all achieved a large red shift of the maximum emission wavelength of the devices. The emission wavelengths of Examples 4 to 13 were between 614 nm and 623 nm and can meet the requirement on different red emission wavelength bands. While the maximum emission wavelength of Comparative Example 2 where Comparative Compound RD was used was only nm and cannot meet the requirement on the light-emitting colors of red light-emitting devices at all. In addition, though the FWHMs and voltages of Examples 4 to 13 were basically the same as or slightly worse than those of Comparative Example 2 at a constant current of 15 mA/cm$^2$, it should be noted that the FWHMs of Examples 4 to 13, that were less than 36 nm, are still at high levels in the industry and the voltages of Examples 4 to 13 are also still relatively low in the industry. On the other hand, the external quantum efficiency of all Examples 4 to 13 was further improved compared to the very high external quantum efficiency of Comparative Example 2. Most importantly, the lifetimes LT97 of Examples 4 to 13 at a constant current of 80 mA/cm$^2$ were all greatly improved (at least about 20 fold and up to about 50 fold) relative to the lifetime of Comparative Example 2 (which was only 3 hours under this condition and cannot meet the requirement at all). All the above comparisons prove again that the compounds disclosed by the present disclosure have very excellent performance.

From the device data in Table 4, it can also be seen that Examples 14 to 21, where the compounds of the present disclosure were used as a dopant in the light-emitting layer, all achieved a large red shift of the maximum emission wavelength of the devices. The emission wavelengths of Examples 14 to 21 were between 607 nm and 625 nm and can meet the requirement on different red emission wavelength bands. While the maximum emission wavelength of Comparative Example 2 where Comparative Compound RD was used was only nm and cannot meet the requirement on the light-emitting colors of red light-emitting devices at all. In addition, though the FWHMs and voltages of Examples 14 to 21 were basically the same as or slightly worse than those of Comparative Example 2 at a constant current of 15 mA/cm$^2$, it should be noted that the FWHMs of Examples 14 to 21, that were less than 34 nm, are still at high levels in the industry and the voltages of Examples 14 to 21 are also still relatively low in the industry. On the other hand, the external quantum efficiency of all Examples 14 to 21 was further improved compared to the very high external quantum efficiency of Comparative Example 2. Most importantly, the lifetimes LT97 of Examples 14 to 21 at a constant current of 80 mA/cm$^2$ were all greatly improved (at least about 9 fold and up to about fold) relative to the lifetime of Comparative Example 2 (which was only 3 hours under this condition and cannot meet the requirement at all). All the above comparisons prove again that the compounds disclosed by the present disclosure have very excellent performance.

In summary, while maintaining a very narrow FWHM, the compounds disclosed by the present disclosure can effectively adjust the emission wavelength to meet the requirement on red light emission, reduce the voltage or maintain the voltage at a low level, improve the EQE, and most importantly, greatly improve the lifetime, thereby providing excellent performance.

According to our researches on OLED red light-emitting materials, when the substituent R in the structure of Formula I is not a hydrogen atom, the emission spectrum of the materials can be well adjusted and the external quantum efficiency of the materials can be improved:

Formula I

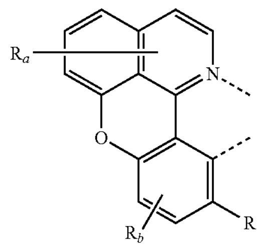

However, according to our repeated researches, a ligand with the structure of Formula II cannot be successfully coordinated with a metal to form a metal complex:

Formula II

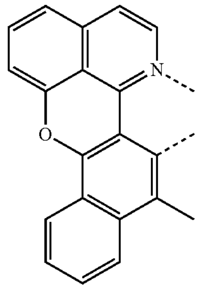

Surprisingly, if the substituent R in Formula I is designed, through structural design, as a part of a fused ring, then (1)

a ligand with a corresponding structure, such as Formula 1 disclosed by the present disclosure, can be successfully coordinated with a metal to form a metal complex; (2) as shown by the results of researches on devices using the related compounds, metal complexes having such structure disclosed by the present disclosure, when used as light-emitting materials in electroluminescent devices, all exhibit excellent device performance, and they can effectively adjust the emission wavelength to meet the requirement on red light emission, obtain a very narrow FWHM, reduce the voltage or maintain a low voltage, improve the EQE, and most importantly, greatly increase the lifetime. These results further highlight the uniqueness and importance of the present disclosure.

It should be understood that various embodiments described herein are merely embodiments and not intended to limit the scope of the present disclosure. Therefore, it is apparent to those skilled in the art that the present disclosure as claimed may include variations of specific embodiments and preferred embodiments described herein. Many of the materials and structures described herein may be replaced with other materials and structures without departing from the spirit of the present disclosure. It should be understood that various theories as to why the present disclosure works are not intended to be limitative.

The invention claimed is:

1. A metal complex, comprising a ligand $L_a$ having a structure represented by Formula 1:

Formula 1

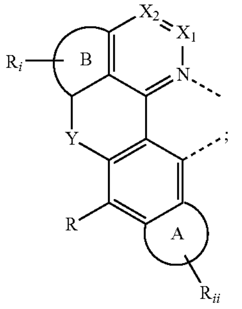

wherein the ring A is selected from an aromatic ring having 6 to 30 carbon atoms, or a heteroaromatic ring having 3 to 30 carbon atoms and the ring B is selected from a five-membered unsaturated carbocyclic ring, an aromatic ring having 6 to 30 carbon atoms, or a heteroaromatic ring having 3 to 30 carbon atoms;

$R_i$ represents, at each occurrence identically or differently, mono-substitution, multiple substitutions or non-substitution; and $R_{ii}$ represents, at each occurrence identically or differently, mono-substitution, multiple substitutions or non-substitution;

Y is selected from $SiR_yR_y$, $GeR_yR_y$, $NR_y$, $PR_y$, O, S or Se; when two $R_y$ are present at the same time, the two $R_y$ may be the same or different;

$X_1$ and $X_2$ are, at each occurrence identically or differently, selected from $CR_x$ or N;

R, $R_i$, $R_{ii}$, $R_x$ and $R_y$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof, the metal is selected from a metal with a relative atomic mass greater than 40, the dotted lines in Formula 1 are bonded to a single metal atom of the metal complex.

2. The metal complex of claim 1, wherein the ring A and/or the ring B are each independently selected from an aromatic ring having 6 to 18 carbon atoms, or a heteroaromatic ring having 3 to 18 carbon atoms.

3. The metal complex of claim 1, wherein the $L_a$ is selected from a structure represented by any one of Formula 2 to Formula 19 and Formula 22 to Formula 23:

Formula 2

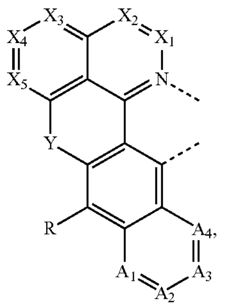

Formula 3

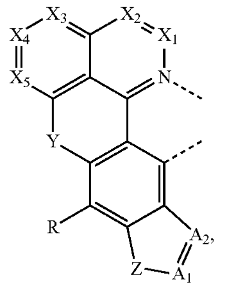

Formula 4

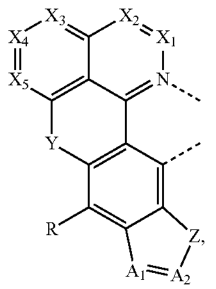

-continued
Formula 5
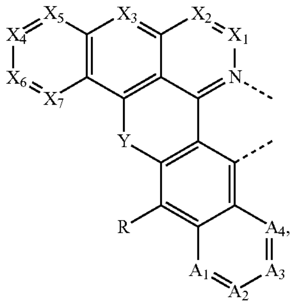
Formula 6
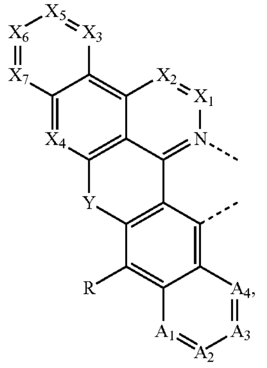
Formula 7
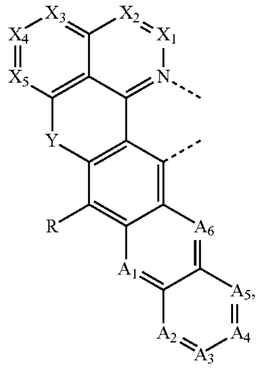
Formula 8
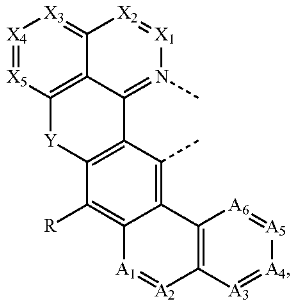
-continued
Formula 9
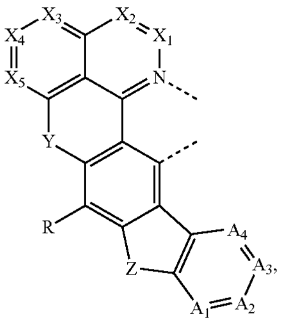
Formula 10
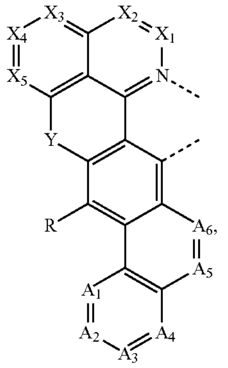
Formula 11
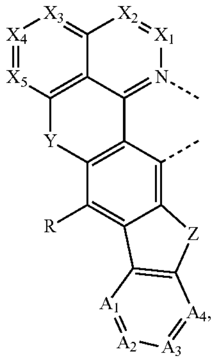
Formula 12
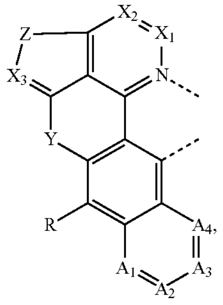

-continued

Formula 13

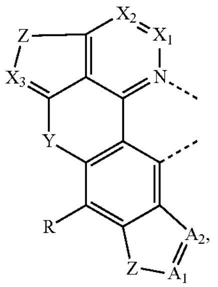

Formula 14

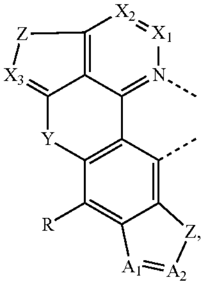

Formula 15

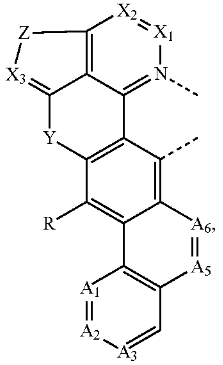

Formula 16

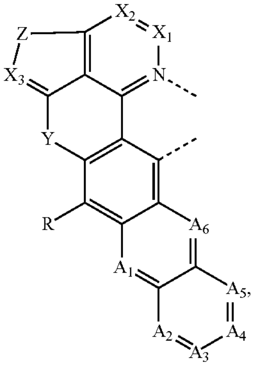

Formula 17

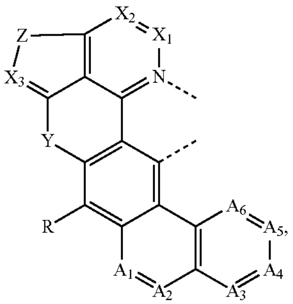

-continued

Formula 18

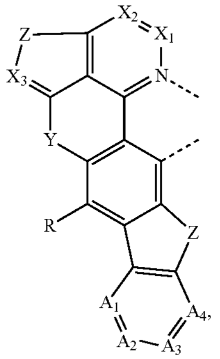

Formula 19

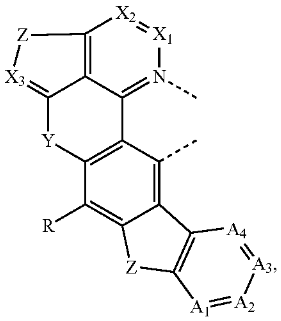

Formula 22

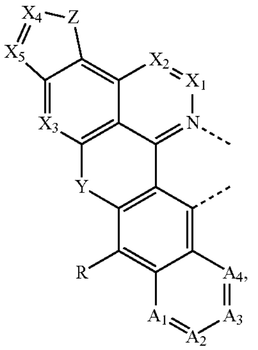

and

Formula 23

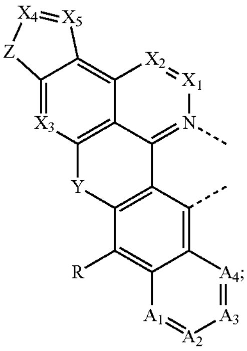

wherein in Formula 2 to Formula 19 and Formula 22 to Formula 23, $X_1$ and $X_2$ are, at each occurrence identically or differently, selected from $CR_x$ or N; $X_3$ to $X_7$ are, at each occurrence identically or differently, selected from $CR_i$ or N; and A1 to A6 are, at each occurrence identically or differently, selected from $CR_{ii}$ or N;

Z is, at each occurrence identically or differently, selected from $SiR_{iii}R_{iii}$, $PR_{iii}$, O, S or $NR_{iii}$; when two $R_{iii}$ are present at the same time, the two $R_{iii}$ are the same or different;

Y is selected from $SiR_yR_y$, $NR_y$, $PR_y$, O, S or Se; when two $R_y$ are present at the same time, the two $R_y$ are the same or different;

R, $R_x$, $R_y$, $R_i$, $R_{ii}$ and $R_{iii}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof.

4. The metal complex of claim 3, wherein in Formula 2 to Formula 19 and Formula 22 to Formula 23, at least one of $X_1$ to $X_n$ and/or $A_1$ to $A_m$ is selected from N, wherein the $X_n$ corresponds to one with the largest number of $X_1$ to $X_7$ in any one of Formula 2 to Formula 19 and Formula 22 to Formula 23, and the $A_m$ corresponds to one with the largest number of $A_1$ to $A_6$ in any one of Formula 2 to Formula 19 and Formula 22 to Formula 23.

5. The metal complex of claim 3, wherein:

in Formula 2 to Formula 19 and Formula 22 to Formula 23, $X_1$ and $X_2$ are each independently selected from $CR_x$; $X_3$ to $X_7$ are each independently selected from $CR_i$; $A_1$ to $A_6$ are each independently selected from $CR_{ii}$; and $R_x$, $R_i$ and $R_{ii}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group and combinations thereof.

6. The metal complex of claim 3, wherein:

in Formula 2 to Formula 11 and Formula 22 to Formula 23, $X_4$ and/or $X_5$ are selected from $CR_i$, and in Formula 12 to Formula 19, $X_3$ is selected from $CR_i$; and $R_i$ is, at each occurrence identically or differently, selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a cyano group or a combination thereof.

7. The metal complex of claim 3, wherein in Formula 2 to Formula 19 and Formula 22 to Formula 23, R is selected from hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

8. The metal complex of claim 3, wherein in Formula 2 to Formula 19 and Formula 22 to Formula 23, Y is selected from O or S.

9. The metal complex of claim 3, wherein in Formula 2 to Formula 19 and Formula 22 to Formula 23, $X_1$ and $X_2$ are each independently selected from $CR_x$.

10. The metal complex of claim 7, wherein in Formula 2 to Formula 19 and Formula 22 to Formula 23, $X_1$ is selected from $CR_x$ and $X_2$ is N.

11. The metal complex of claim 1, wherein the ligand $L_a$ has a structure represented by Formula 20 or Formula 21:

Formula 20

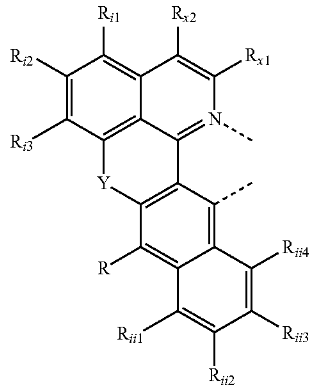

Formula 21

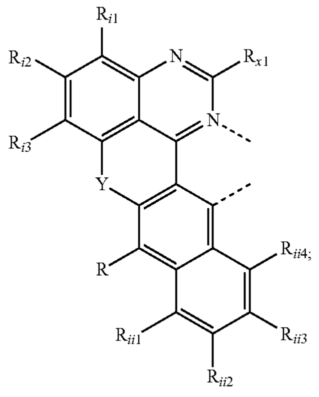

wherein in Formula 20 and Formula 21,

Y is selected from O or S;

$R_{x1}$, $R_{x2}$, $R_{i1}$, $R_{i2}$, $R_{i3}$, $R_{ii1}$, $R_{ii2}$, $R_{ii3}$ and $R_{ii4}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof, R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms and combinations thereof.

12. The metal complex of claim 11, wherein $R_{i2}$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof, R is selected from halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof, and at least one or two of $R_{ii1}$, $R_{ii2}$, $R_{ii3}$ and $R_{ii4}$ are, at each occurrence identically or differently, selected from deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

13. The metal complex of claim 11, wherein in Formula 20 and Formula 21, at least one of $R_{x1}$, $R_{x2}$, $R_{i1}$, $R_{i2}$, $R_{i3}$, $R_{ii1}$, $R_{ii2}$, $R_{ii3}$, $R_{ii4}$ and R is, at each occurrence identically or differently, selected from the group consisting of: substituted or unsubstituted alkyl having 3 to 20 carbon atoms, substituted or unsubstituted cycloalkyl having 3 to 20 ring carbon atoms, substituted or unsubstituted alkylsilyl having 3 to 20 carbon atoms and combinations thereof.

14. The metal complex of claim 1, wherein $L_a$ is, at each occurrence identically or differently, selected from the group consisting of the following structures:

$L_{a1}$

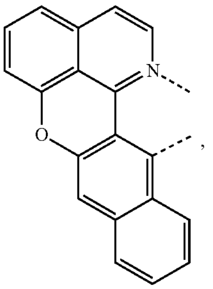

-continued $L_{a2}$

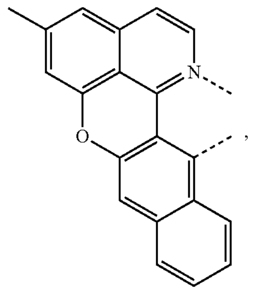

$L_{a3}$

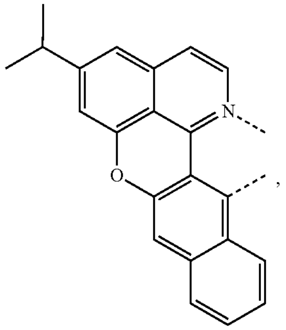

$L_{a4}$

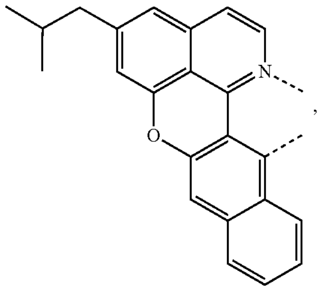

$L_{a5}$

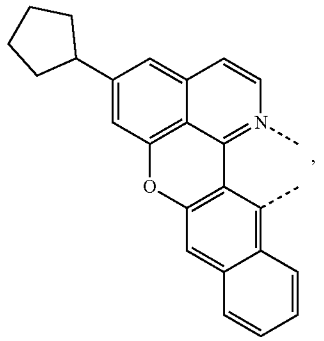

$L_{a6}$

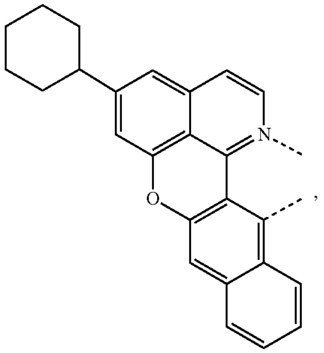

-continued
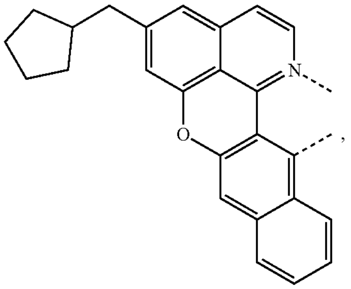
La7
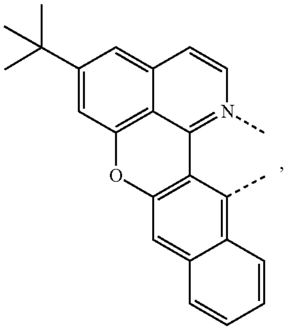
La8
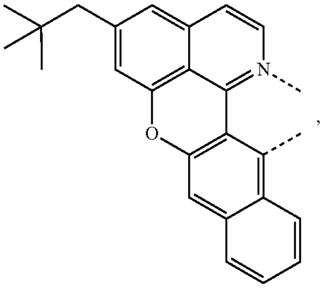
La9
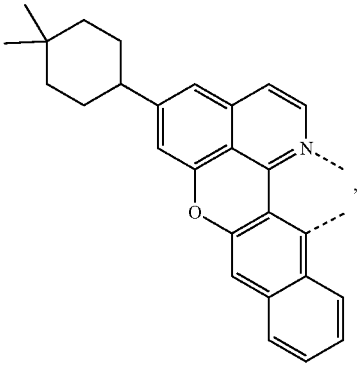
La10
-continued
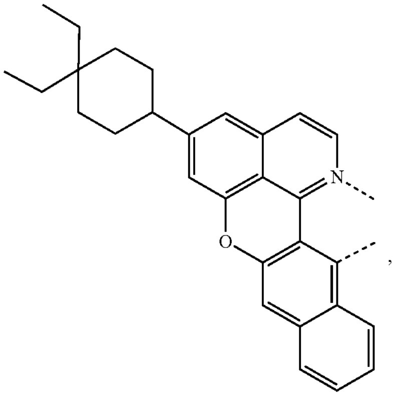
La11
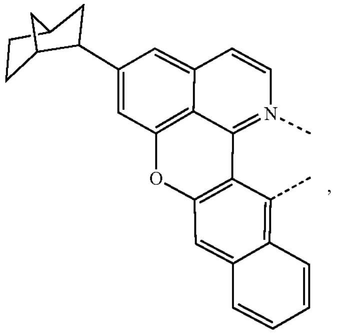
La12
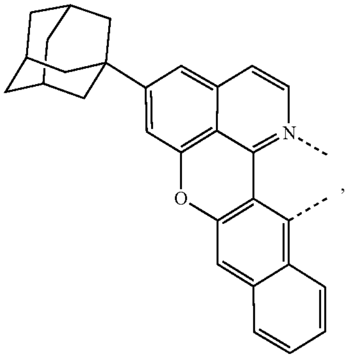
La13
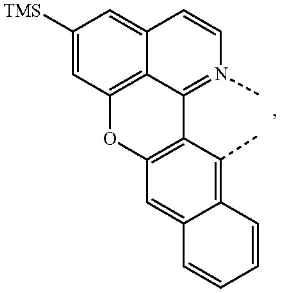
La14

-continued
$L_{a15}$
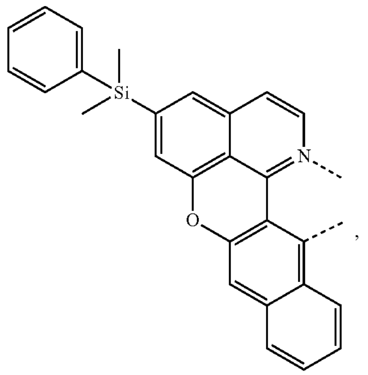
$L_{a16}$
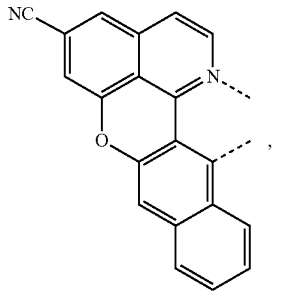
$L_{a17}$
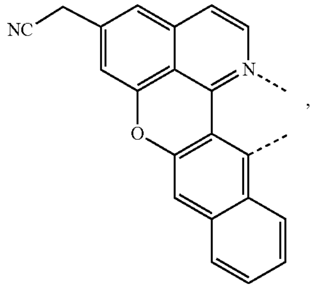
$L_{a18}$
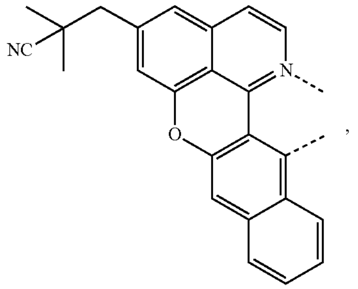
$L_{a19}$
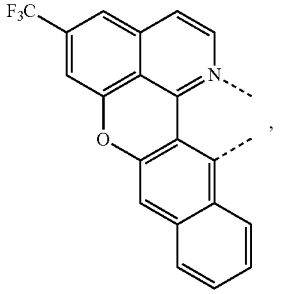
-continued
$L_{a20}$
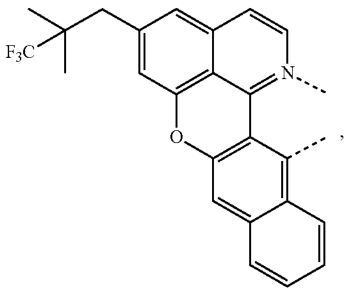
$L_{a21}$
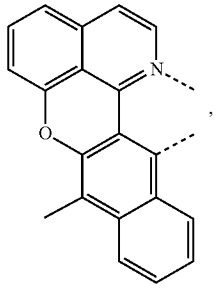
$L_{a22}$
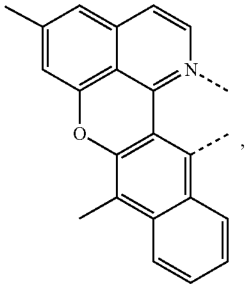
$L_{a23}$
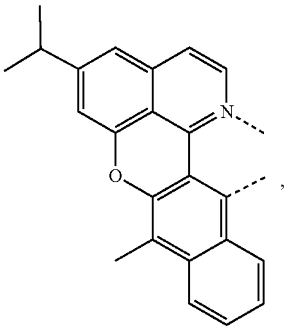
$L_{a24}$
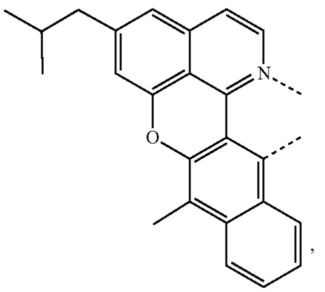

-continued
$L_{a25}$
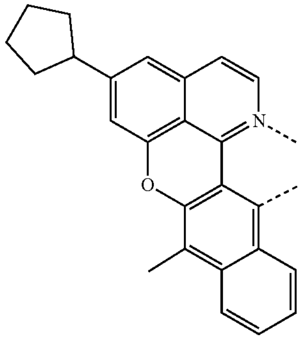
,
$L_{a26}$
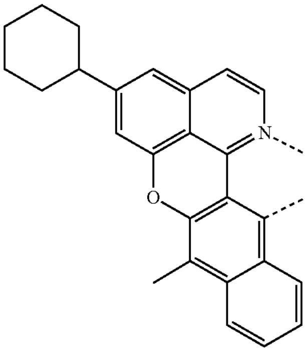
,
$L_{a27}$
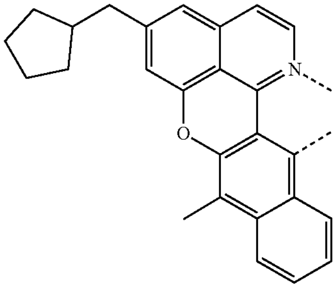
,
$L_{a28}$
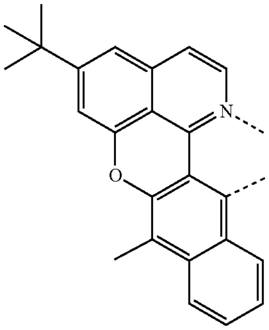
,
$L_{a29}$
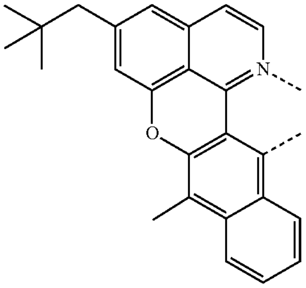
,
-continued
$L_{a30}$
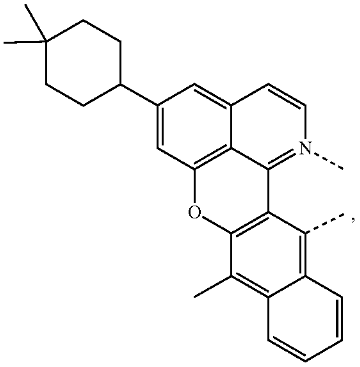
,
$L_{a31}$
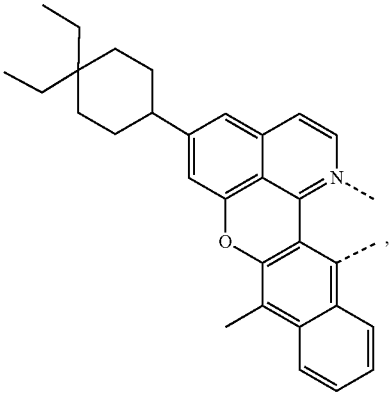
,
$L_{a32}$
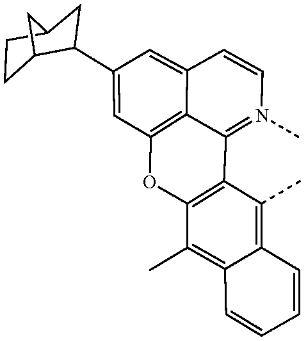
,
$L_{a33}$
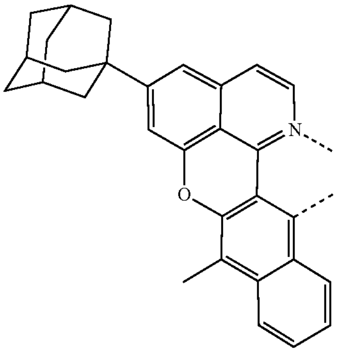
, -continued
$L_{a34}$
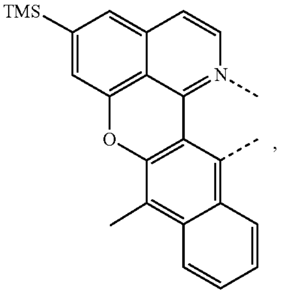
$L_{a35}$
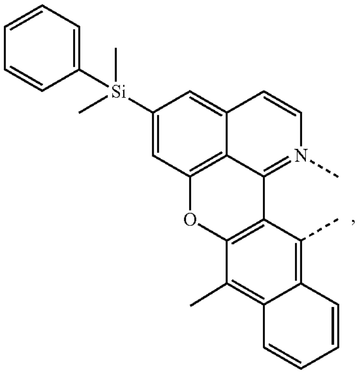
$L_{a36}$
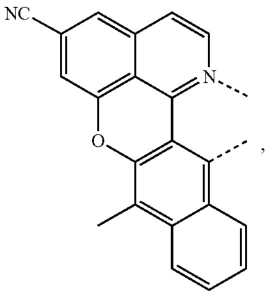
$L_{a37}$
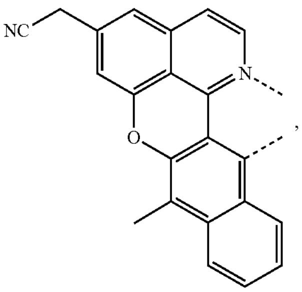
$L_{a38}$
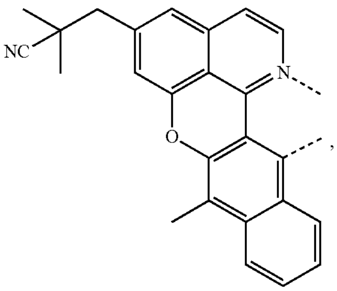
-continued
$L_{a39}$
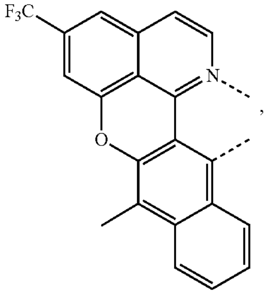
$L_{a40}$
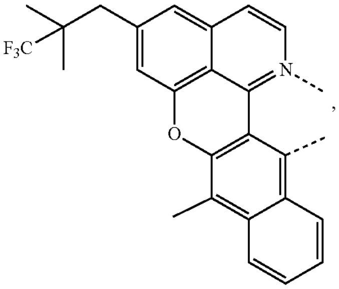
$L_{a41}$
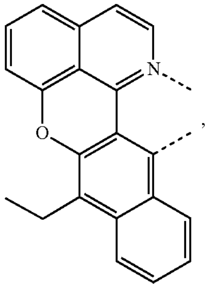
$L_{a42}$
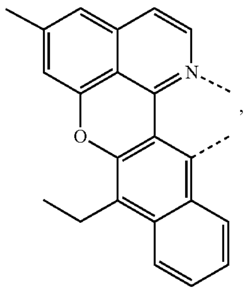
$L_{a43}$
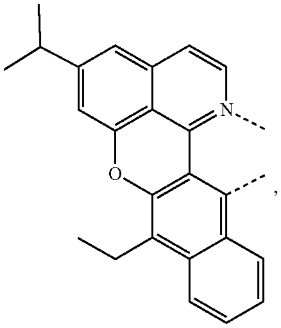

-continued
$L_{a44}$
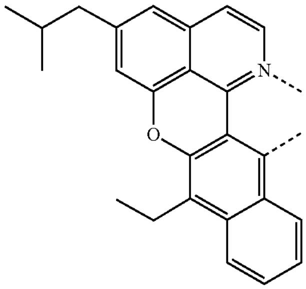
,
$L_{a45}$
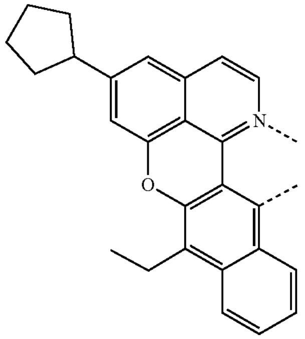
,
$L_{a46}$
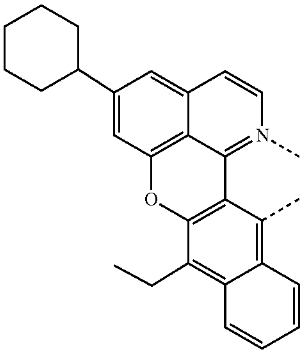
,
$L_{a47}$
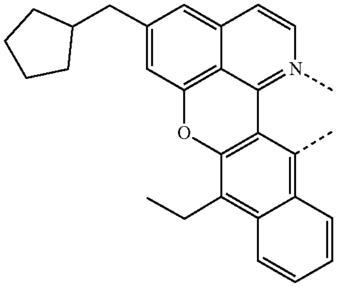
,
$L_{a48}$
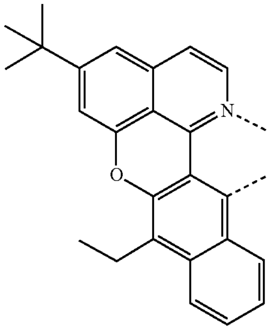
,
-continued
$L_{a49}$
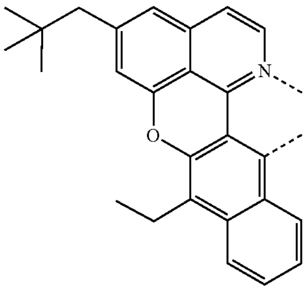
,
$L_{a50}$
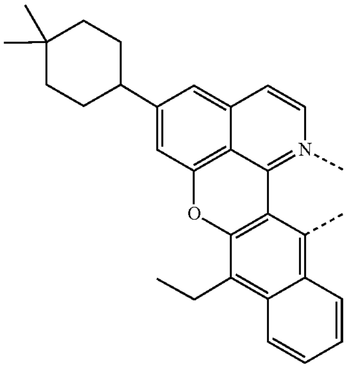
,
$L_{a51}$
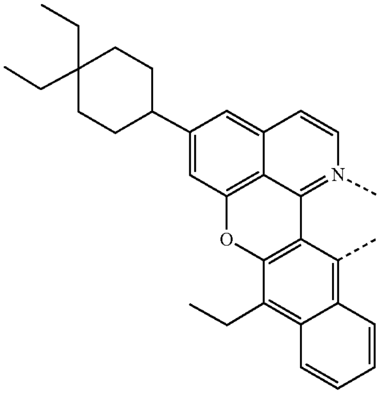
,
$L_{a52}$
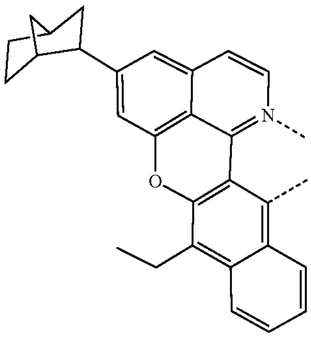
, -continued
$L_{a53}$
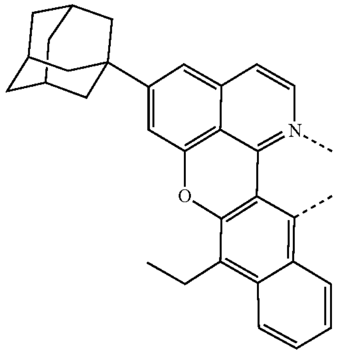
,
$L_{a54}$
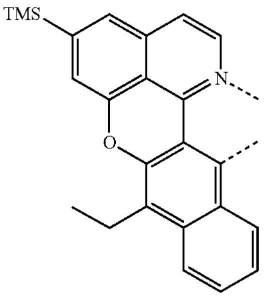
,
$L_{a55}$
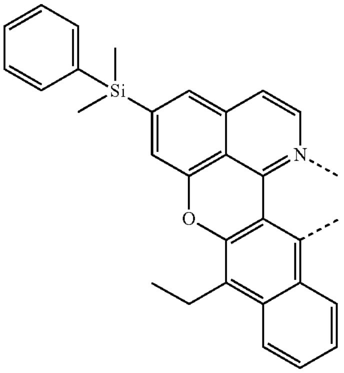
,
$L_{a56}$
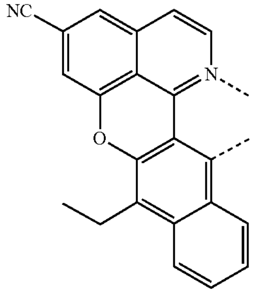
,
$L_{a57}$
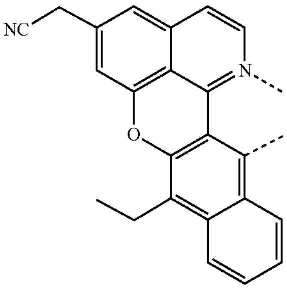
,
-continued
$L_{a58}$
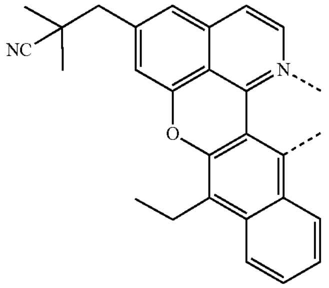
,
$L_{a59}$
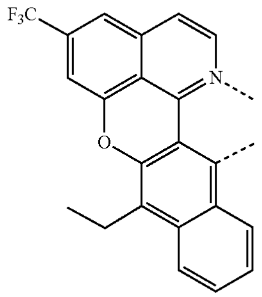
,
$L_{a60}$
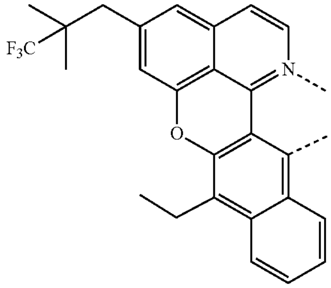
,
$L_{a61}$
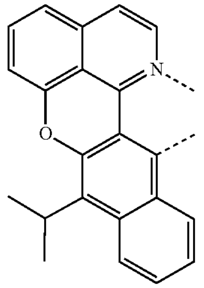
,
$L_{a62}$
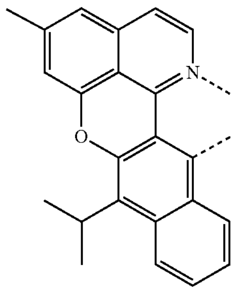
, L$_{a63}$
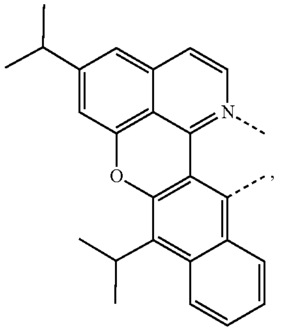
L$_{a64}$
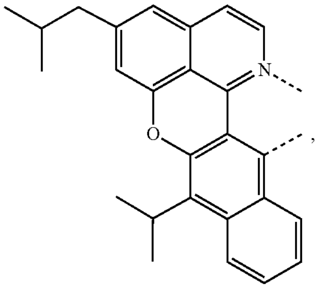
L$_{a65}$
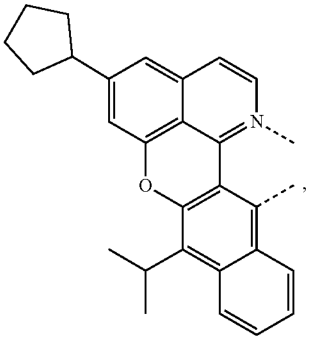
L$_{a66}$
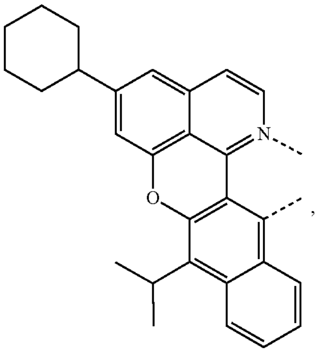
L$_{a67}$
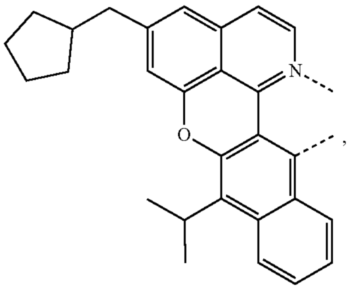
L$_{a68}$
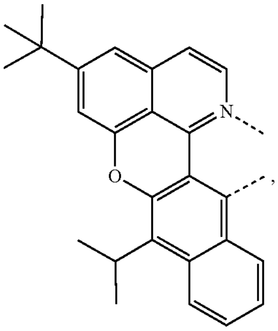
L$_{a69}$
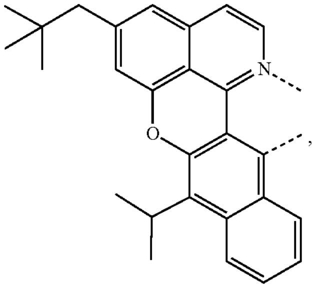
L$_{a70}$
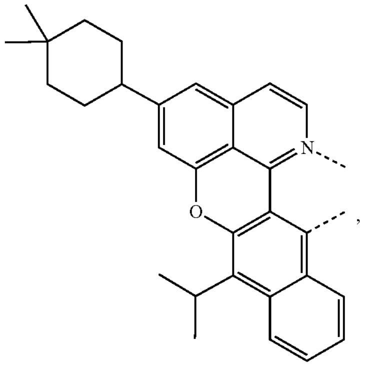
L$_{a71}$
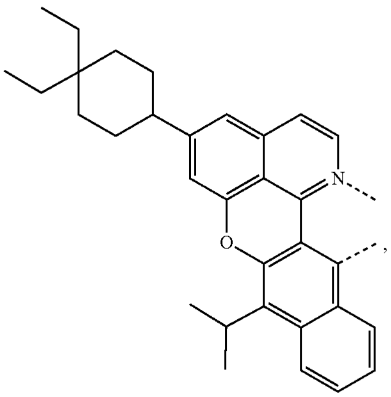

-continued
La72
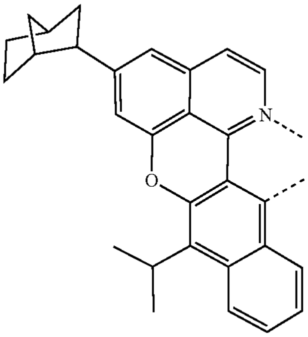
,
La73
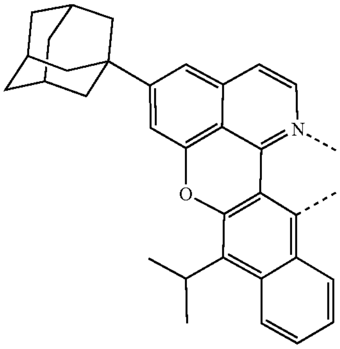
,
La74
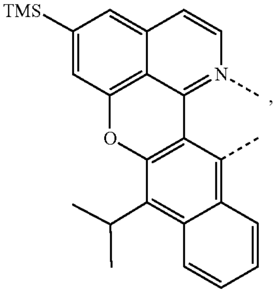
,
La75
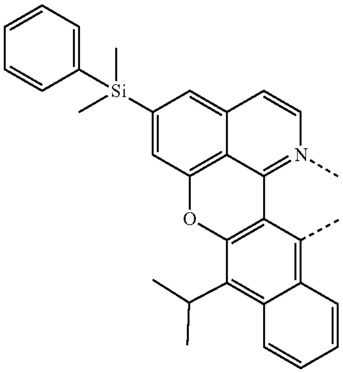
,
-continued
La76
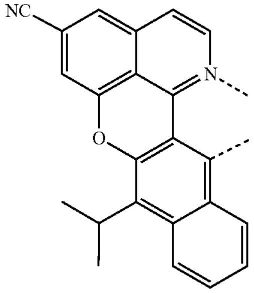
,
La77
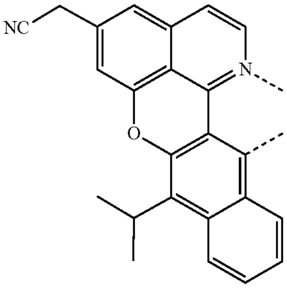
,
La78
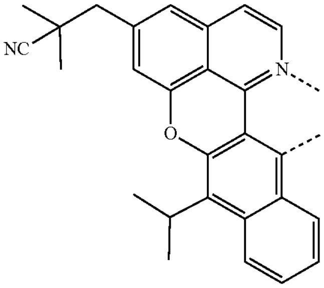
,
La79
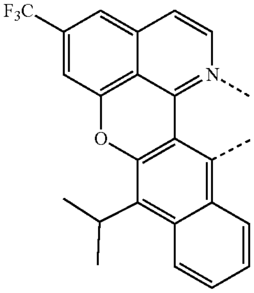
,
La80
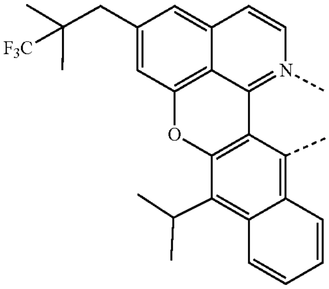
, -continued
$L_{a81}$
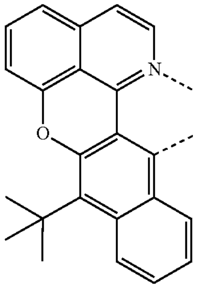
,
$L_{a82}$
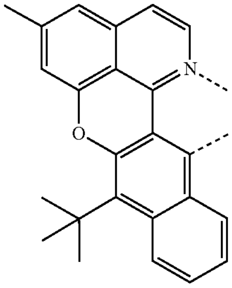
,
$L_{a83}$
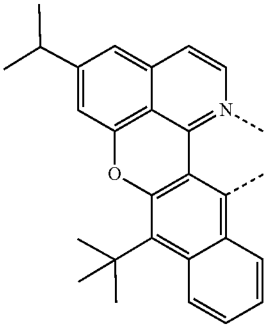
,
$L_{a84}$
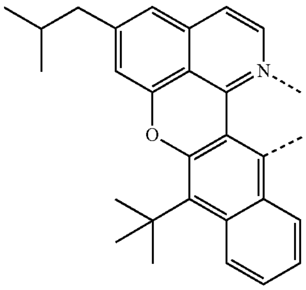
,
$L_{a85}$
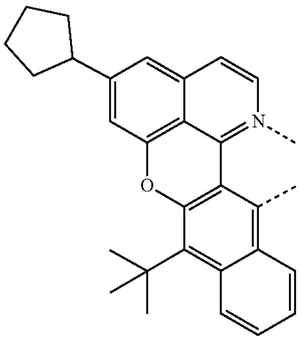
,
-continued
$L_{a86}$
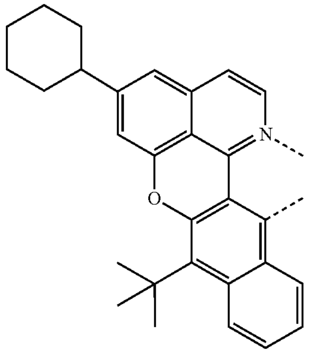
,
$L_{a87}$
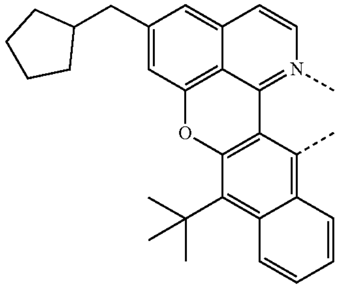
$L_{a88}$
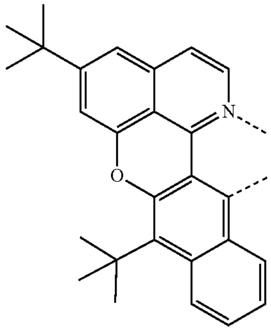
$L_{a89}$
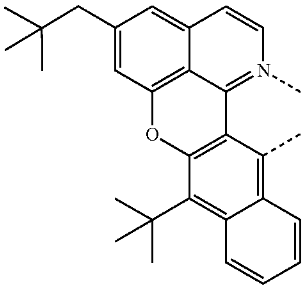

-continued
$L_{a90}$
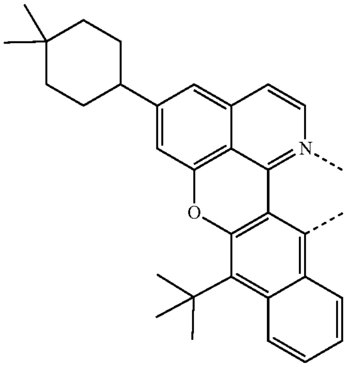
$L_{a91}$
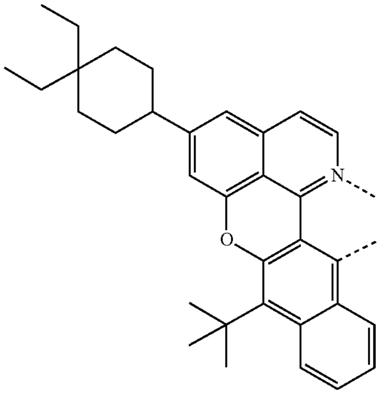
,
$L_{a92}$
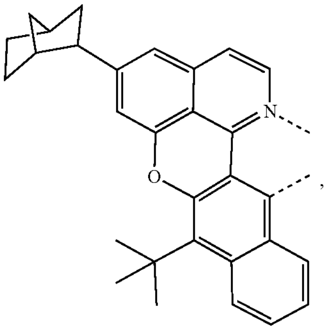
,
$L_{a93}$
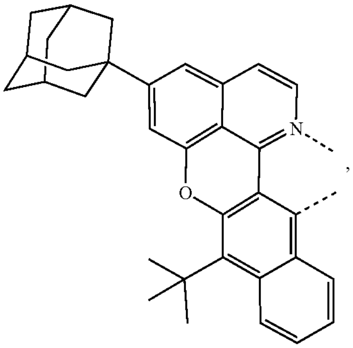
,
-continued
$L_{a94}$
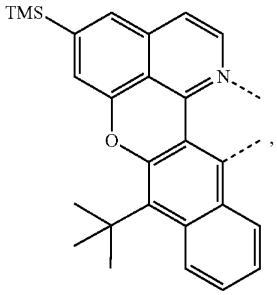
,
$L_{a95}$
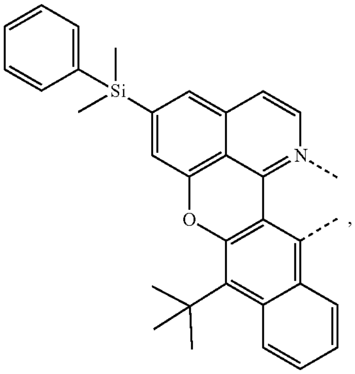
,
$L_{a96}$
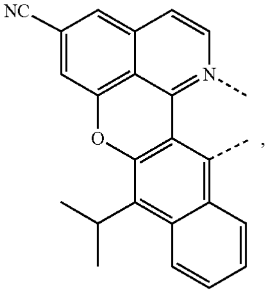
,
$L_{a97}$
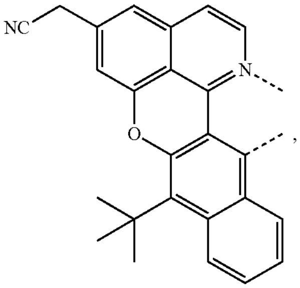
,
$L_{a98}$
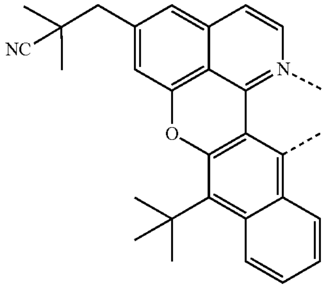

-continued
$L_{a99}$
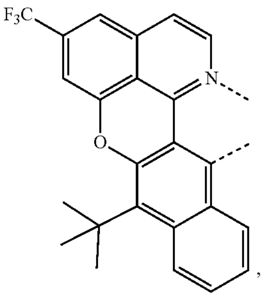
$L_{a100}$
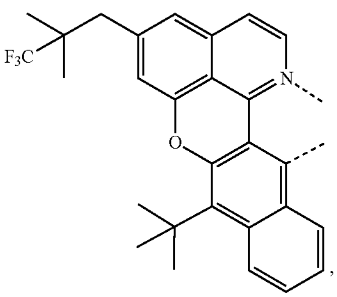
$L_{a101}$
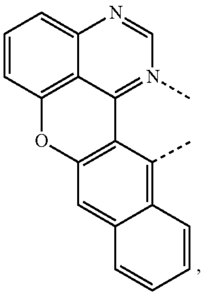
$L_{a102}$
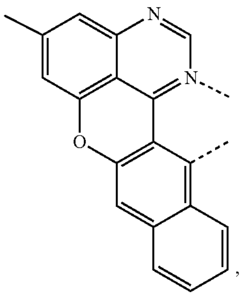
$L_{a103}$
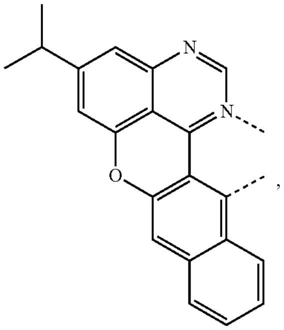
-continued
$L_{a104}$
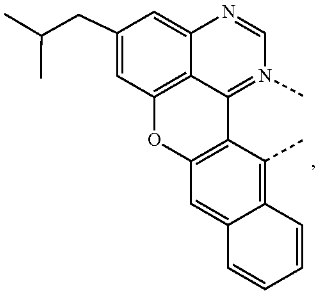
$L_{a105}$
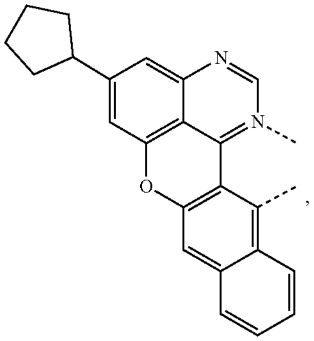
$L_{a106}$
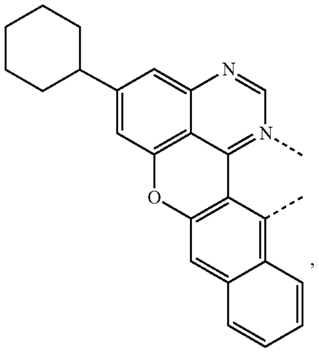
$L_{a107}$
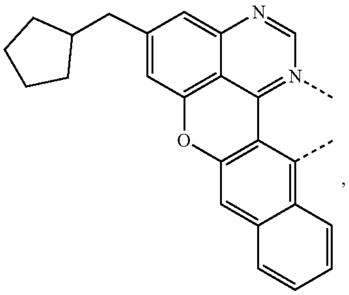
$L_{a108}$
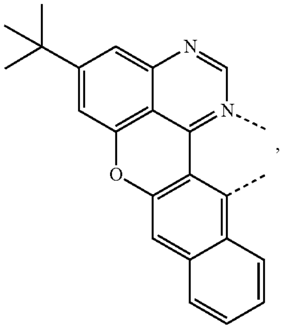

-continued
$L_{a109}$
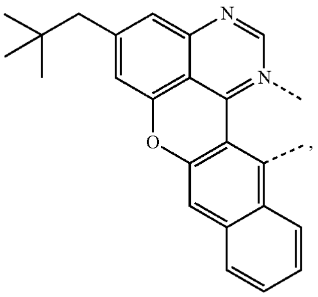
$L_{a110}$
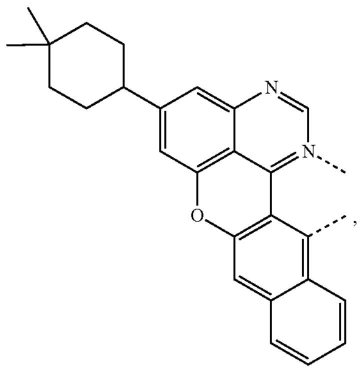
$L_{a111}$
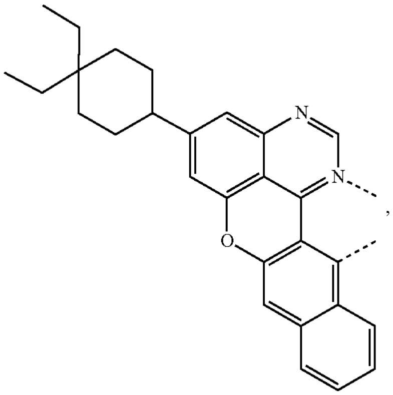
$L_{a112}$
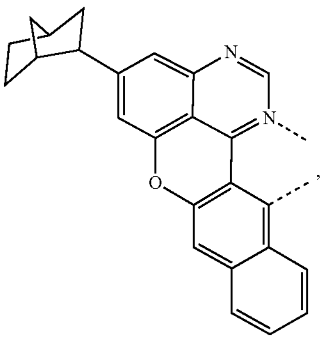
-continued
$L_{a113}$
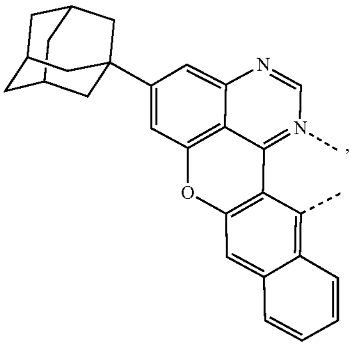
$L_{a114}$
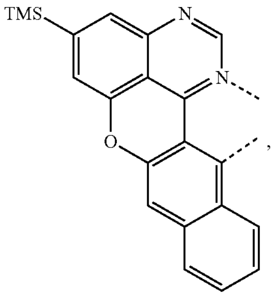
$L_{a115}$
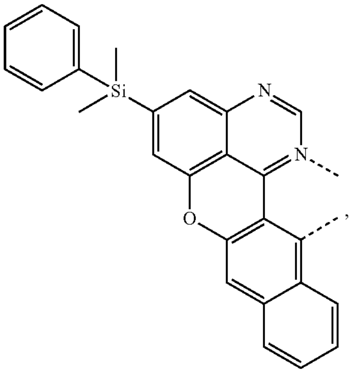
$L_{a116}$
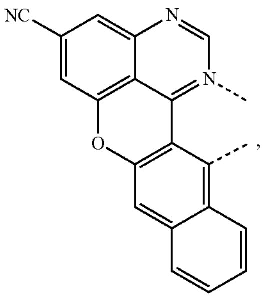
$L_{a117}$
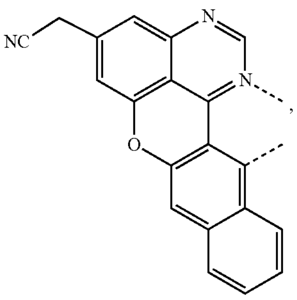

-continued
$L_{a118}$
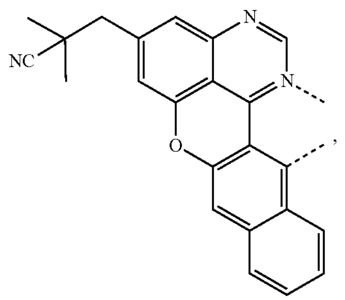
$L_{a119}$
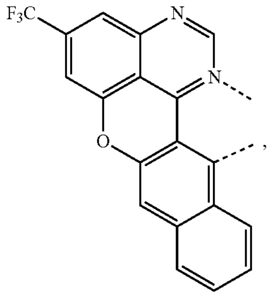
$L_{a120}$
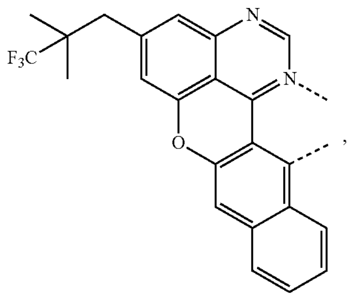
$L_{a121}$
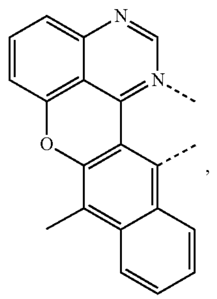
$L_{a122}$
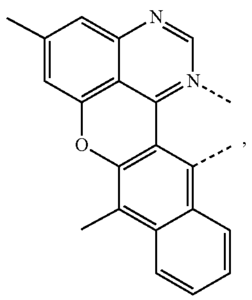
-continued
$L_{a123}$
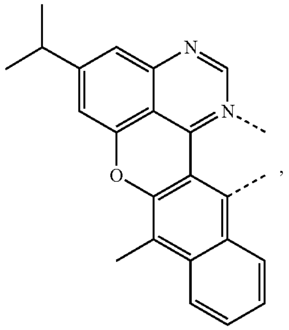
$L_{a124}$
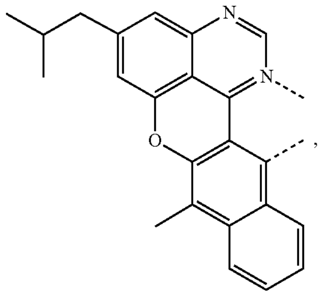
$L_{a125}$
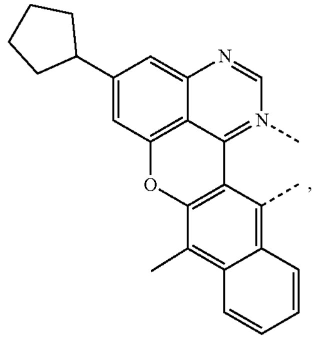
$L_{a126}$
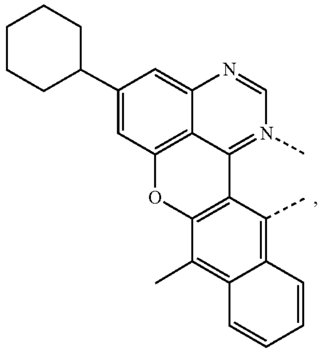
$L_{a127}$
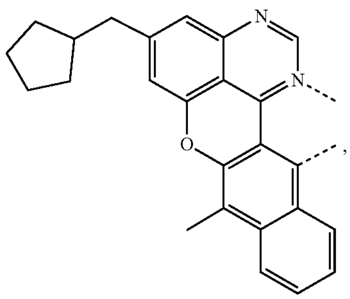

-continued
$L_{a128}$
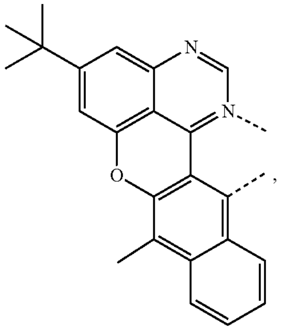
$L_{a129}$
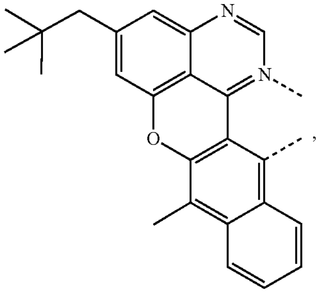
$L_{a130}$
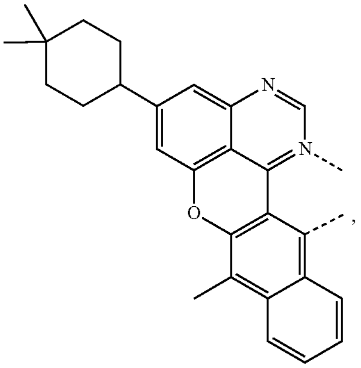
$L_{a131}$
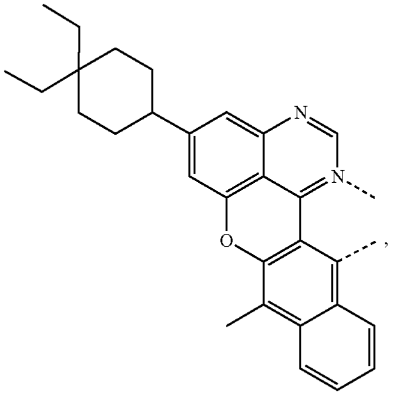
-continued
$L_{a132}$
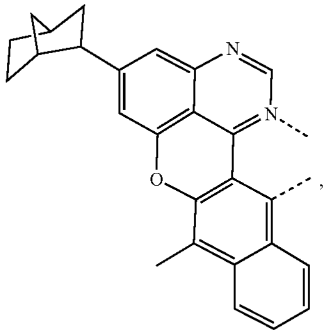
$L_{a133}$
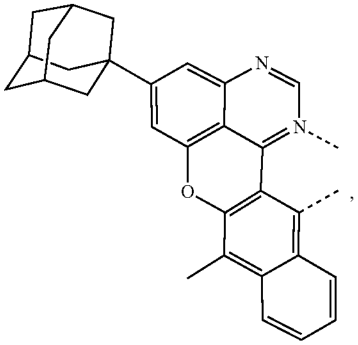
$L_{a134}$
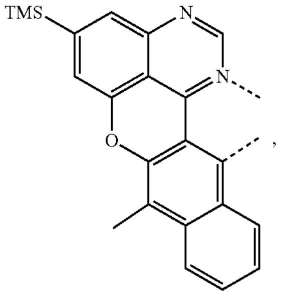
$L_{a135}$
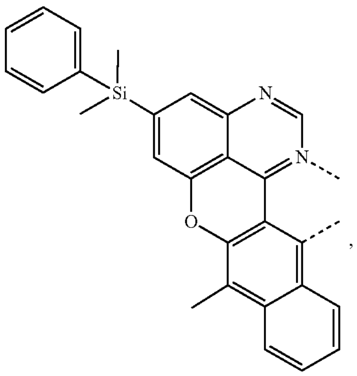

-continued
$L_{a136}$
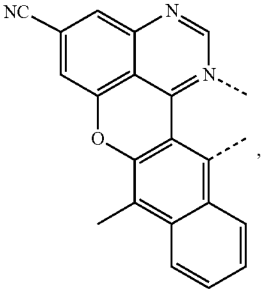
,
$L_{a137}$
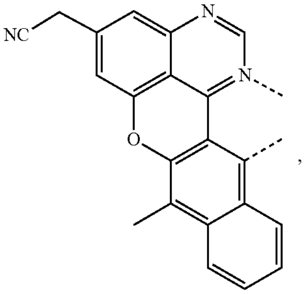
,
$L_{a138}$
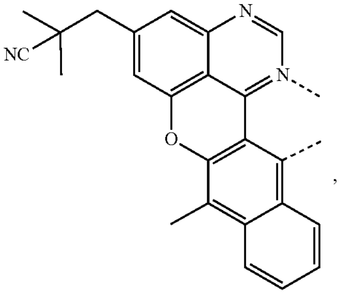
,
$L_{a139}$
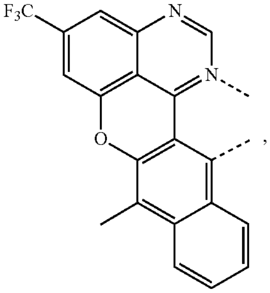
,
$L_{a140}$
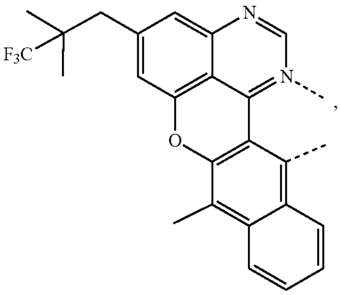
,
-continued
$L_{a141}$
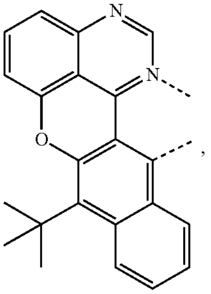
,
$L_{a142}$
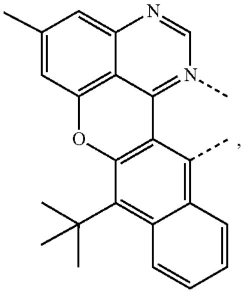
,
$L_{a143}$
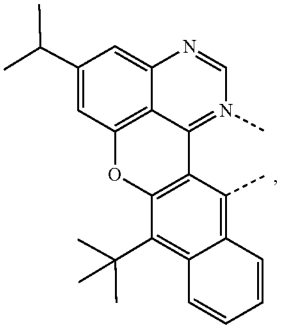
,
$L_{a144}$
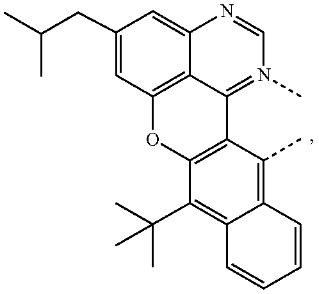
,
$L_{a145}$
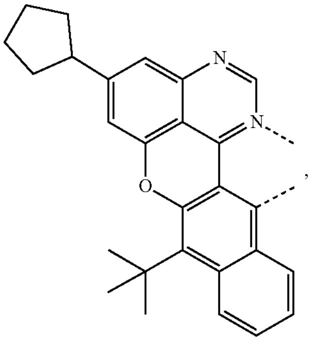
, $L_{a146}$
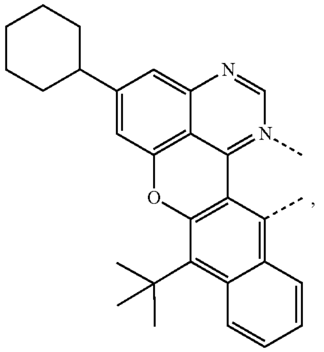
$L_{a147}$
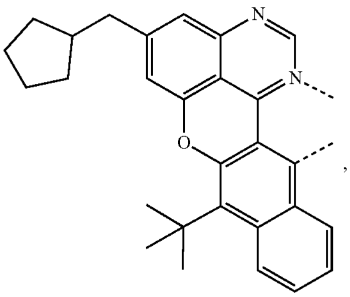
$L_{a148}$
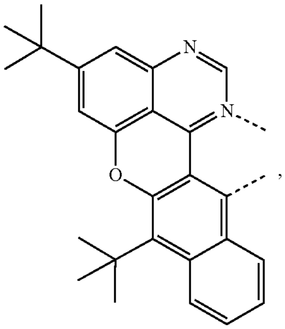
$L_{a149}$
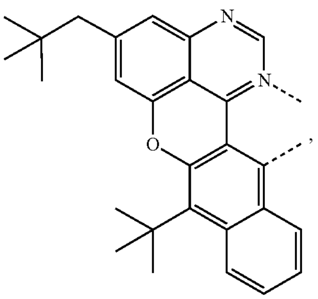
$L_{a150}$
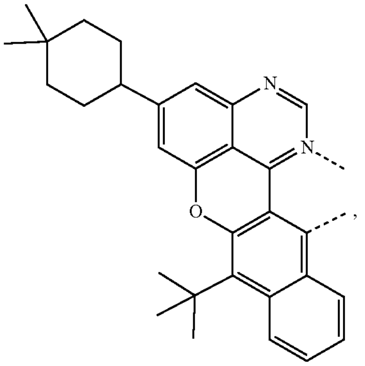
$L_{a151}$
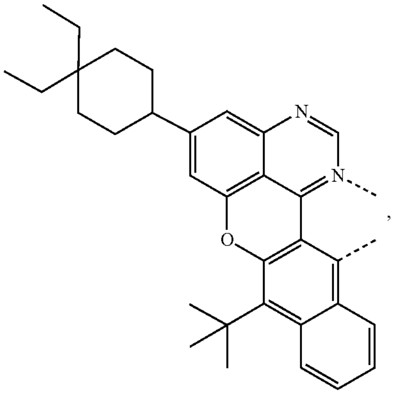
$L_{a152}$
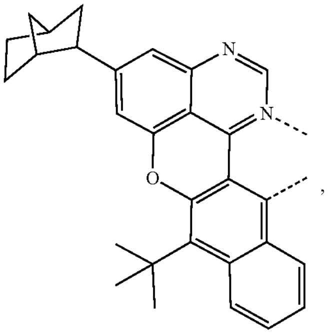
$L_{a153}$
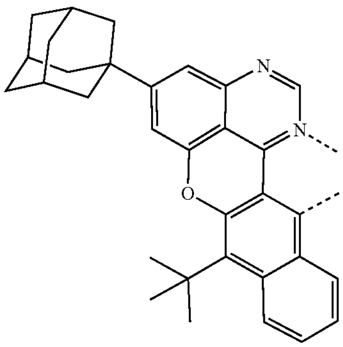

-continued
$L_{a154}$
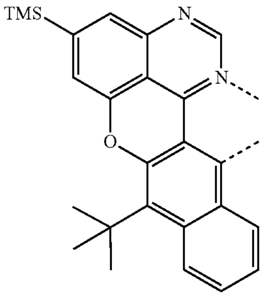
$L_{a155}$
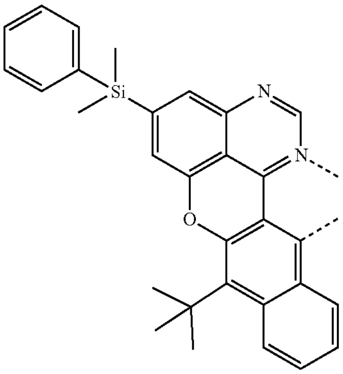
$L_{a156}$
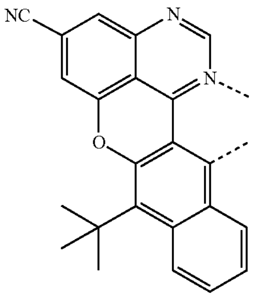
$L_{a157}$
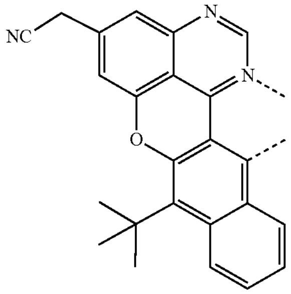
,
$L_{a158}$
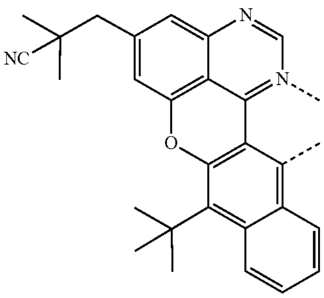
,
-continued
$L_{a159}$
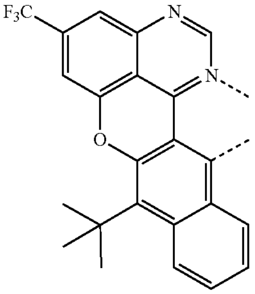
,
$L_{a160}$
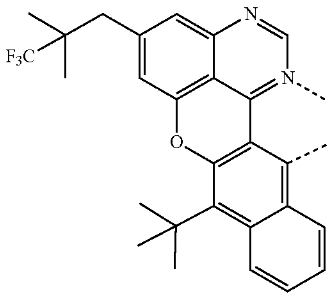
,
$L_{a161}$
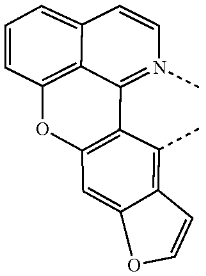
,
$L_{a162}$
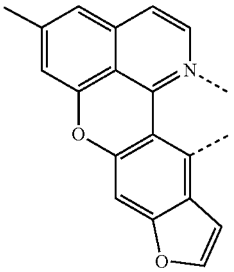
,
$L_{a163}$
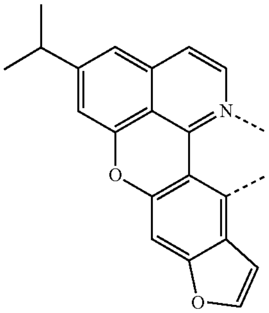
, -continued
$L_{a164}$
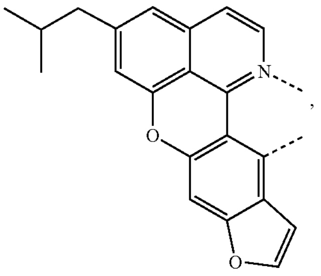
$L_{a165}$
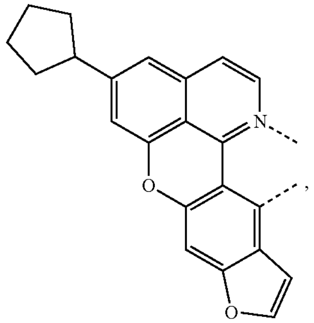
$L_{a166}$
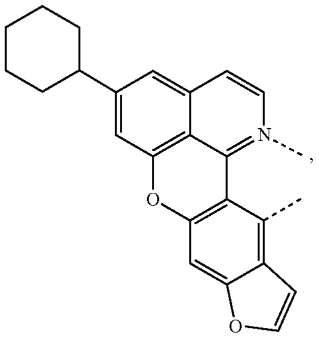
$L_{a167}$
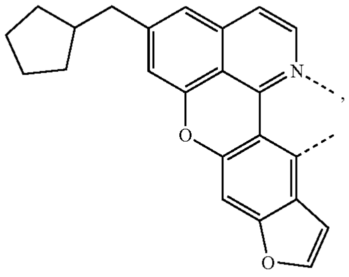
$L_{a168}$
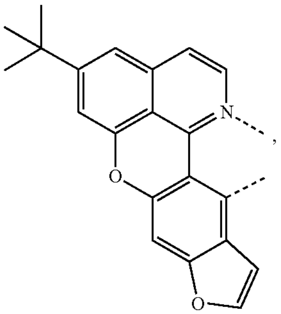
-continued
$L_{a169}$
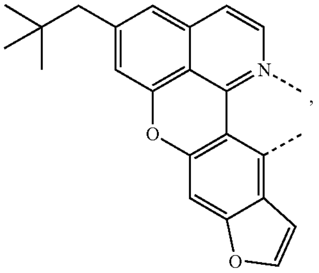
$L_{a170}$
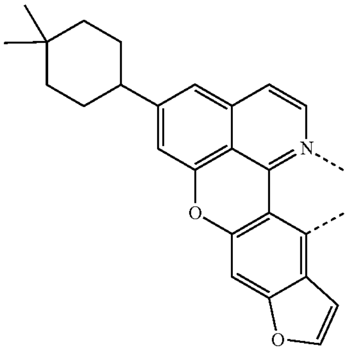
$L_{a171}$
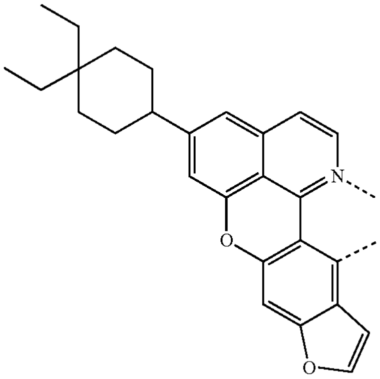
$L_{a172}$
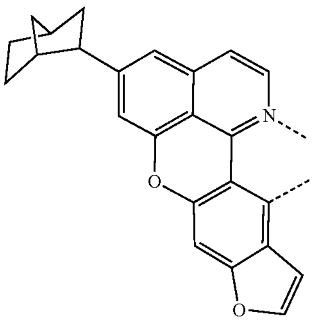

-continued
$L_{a173}$
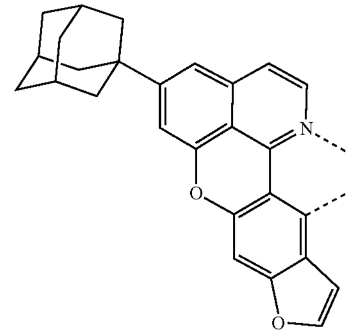
$L_{a174}$
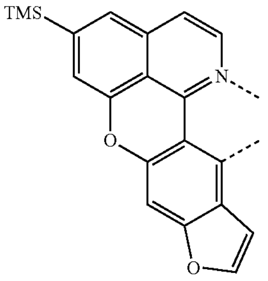
$L_{a175}$
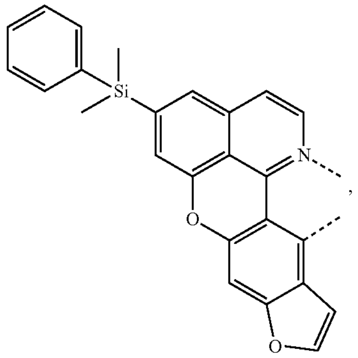
$L_{a176}$
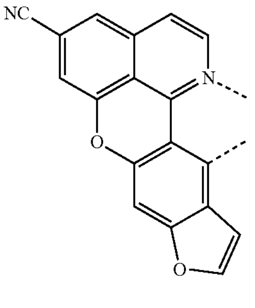
$L_{a177}$
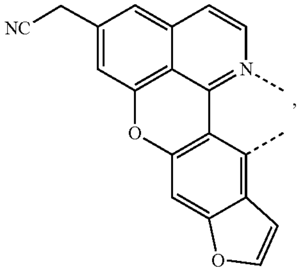
-continued
$L_{a178}$
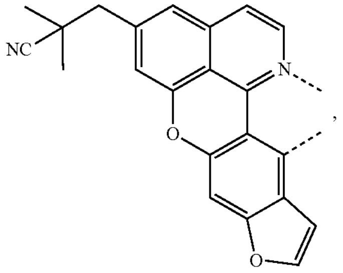
$L_{a179}$
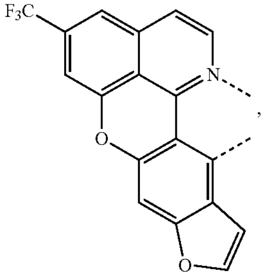
$L_{a180}$
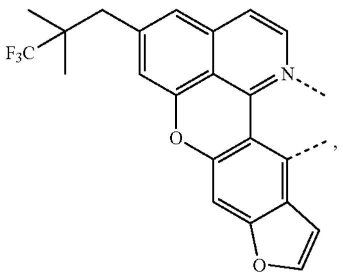
$L_{a181}$
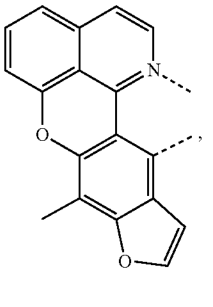
$L_{a182}$
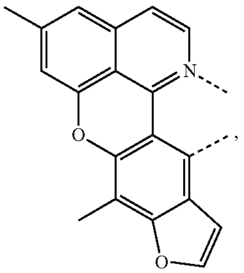

-continued
$L_{a183}$
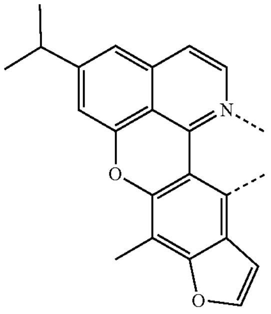
$L_{a184}$
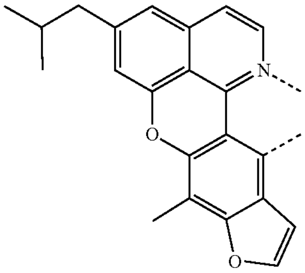,
$L_{a185}$
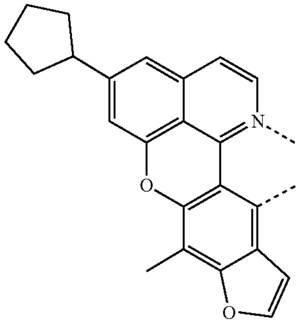,
$L_{a186}$
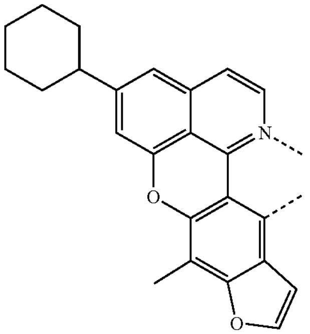,
$L_{a187}$
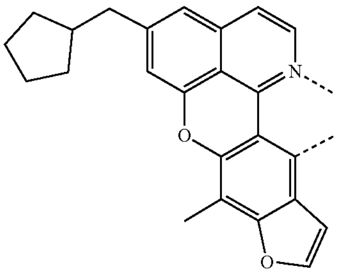,
-continued
$L_{a188}$
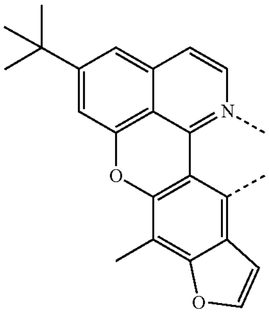,
$L_{a189}$
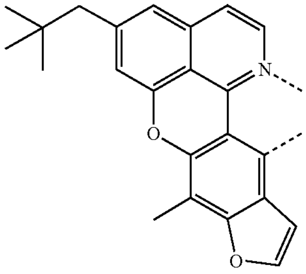,
$L_{a190}$
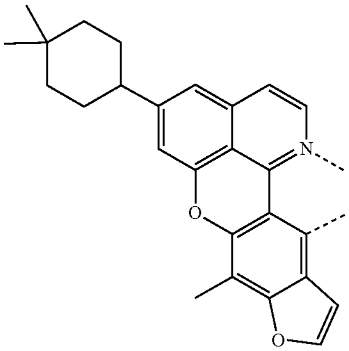,
$L_{a191}$
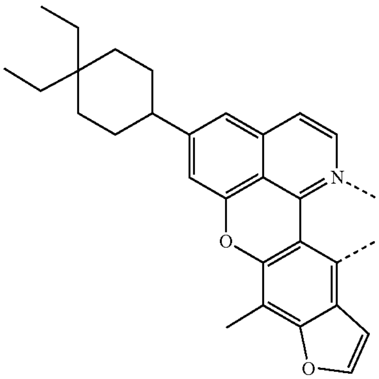, -continued
$L_{a192}$
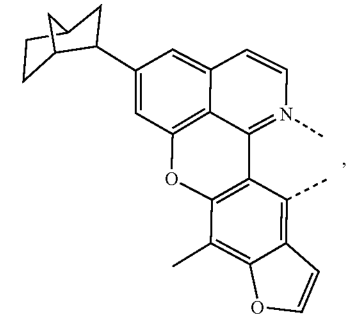
$L_{a193}$
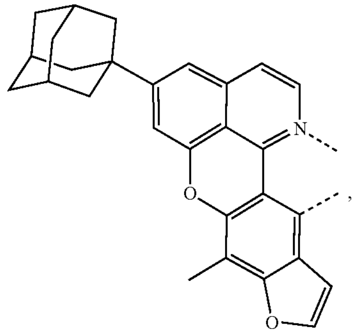
$L_{a194}$
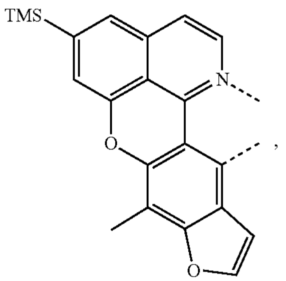
$L_{a195}$
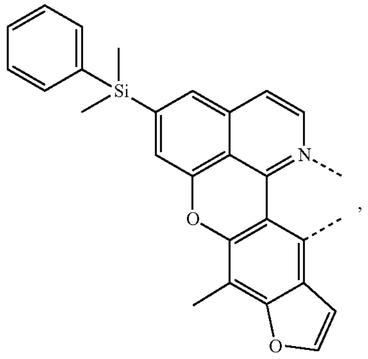
$L_{a196}$
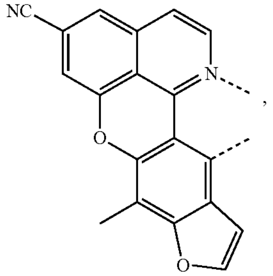
-continued
$L_{a197}$
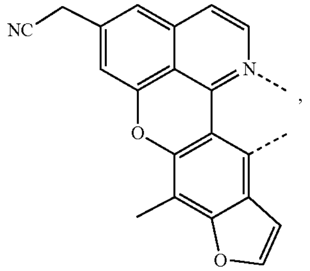
$L_{a198}$
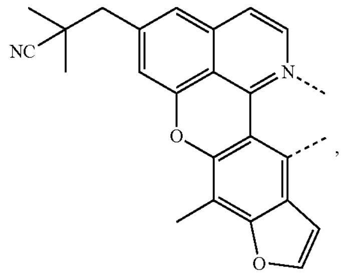
$L_{a199}$
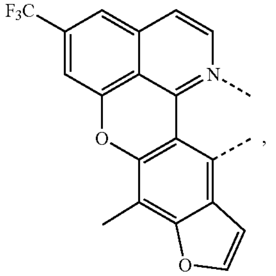
$L_{a200}$
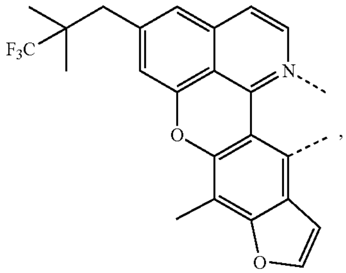
$L_{a201}$
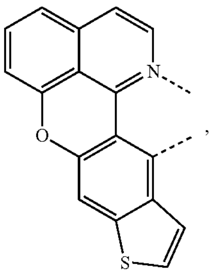

-continued
$L_{a202}$
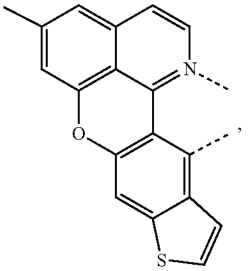
$L_{a203}$
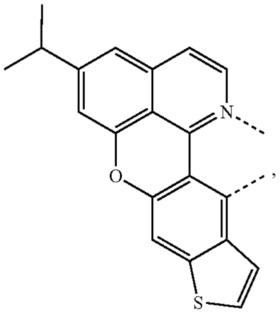
$L_{a204}$
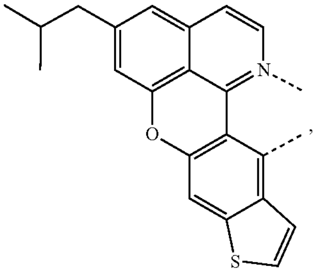
$L_{a205}$
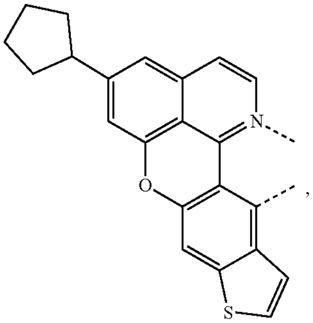
$L_{a206}$
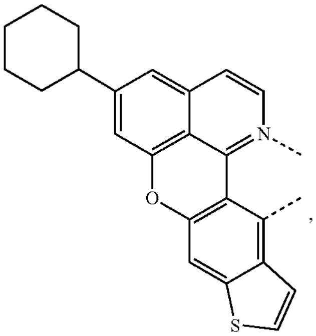
-continued
$L_{a207}$
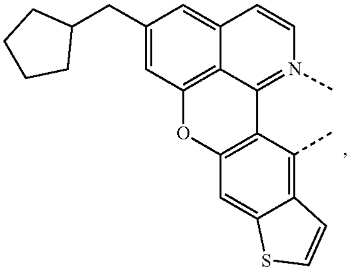
$L_{a208}$
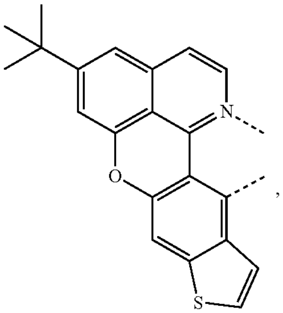
$L_{a209}$
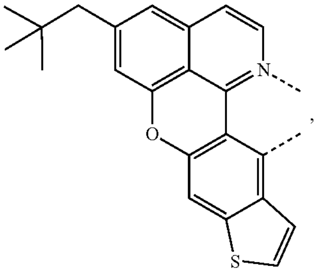
$L_{a210}$
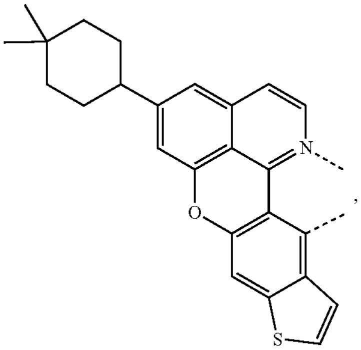
$L_{a211}$
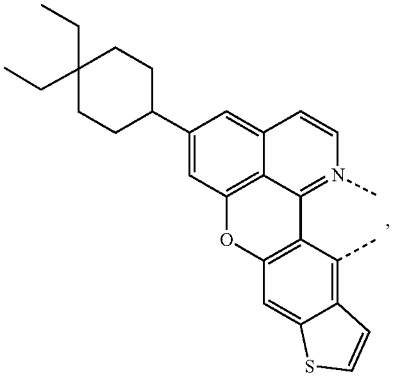

$L_{a212}$
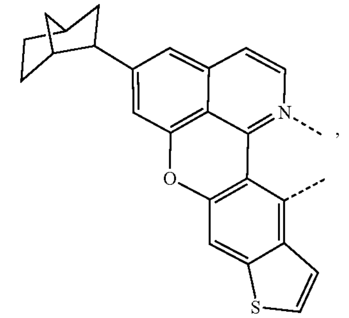
$L_{a213}$
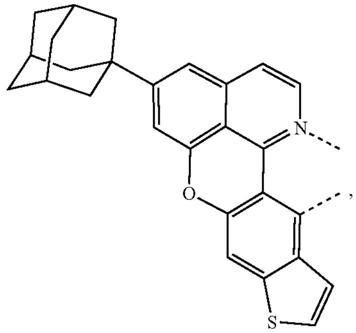
$L_{a214}$
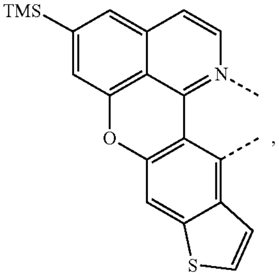
$L_{a215}$
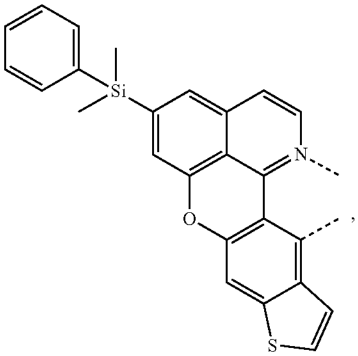
$L_{a216}$
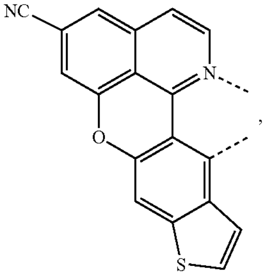
$L_{a217}$
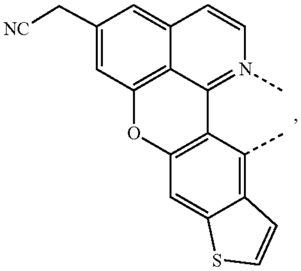
$L_{a218}$
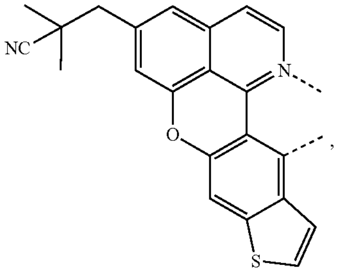
$L_{a219}$
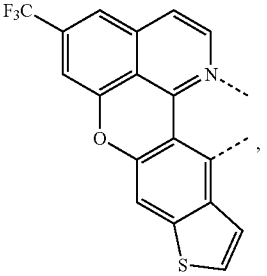
$L_{a220}$
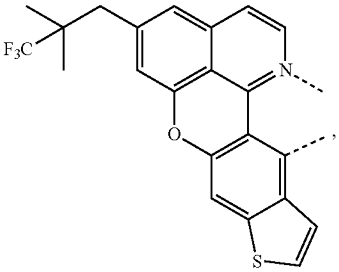
$L_{a221}$
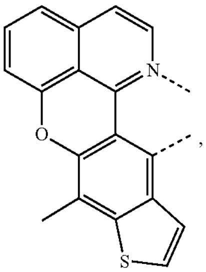

-continued
$L_{a222}$
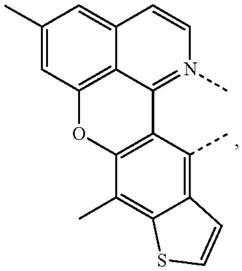
$L_{a223}$
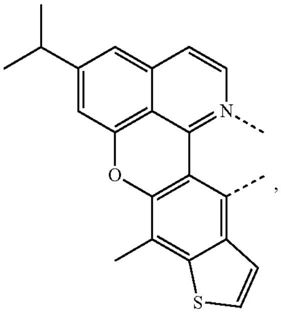
$L_{a224}$
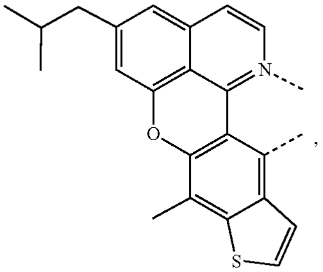
$L_{a225}$
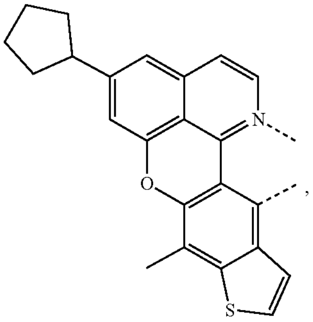
$L_{a226}$
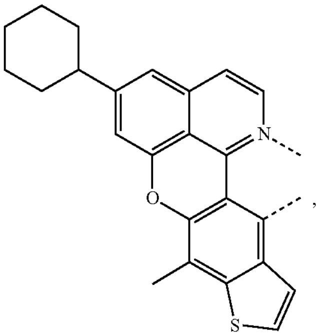
-continued
$L_{a227}$
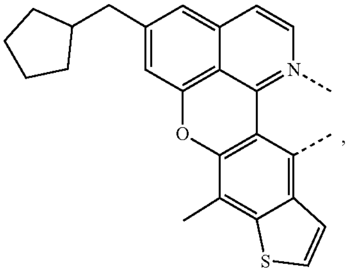
$L_{a228}$
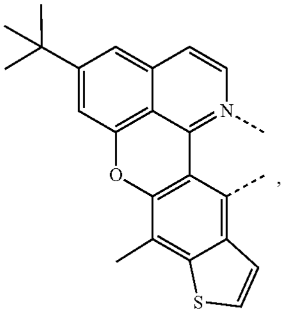
$L_{a229}$
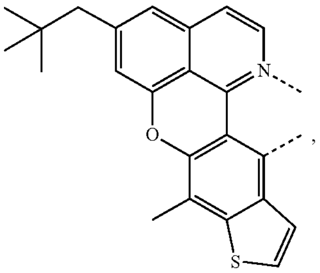
$L_{a230}$
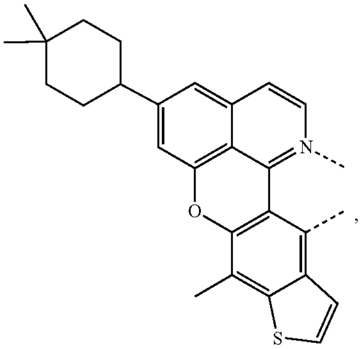
$L_{a231}$
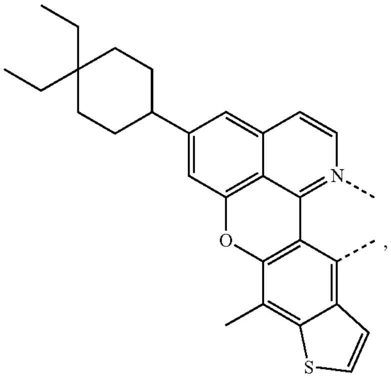

$L_{a232}$
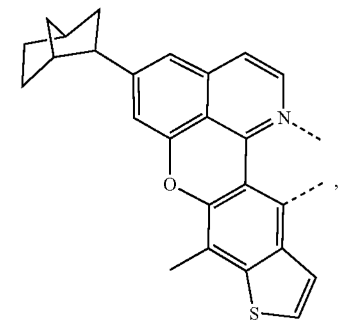
$L_{a233}$
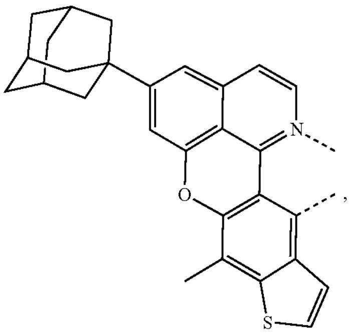
$L_{a234}$
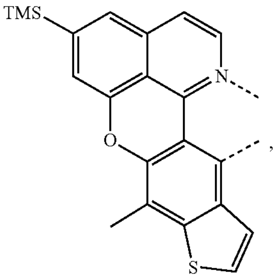
$L_{a235}$
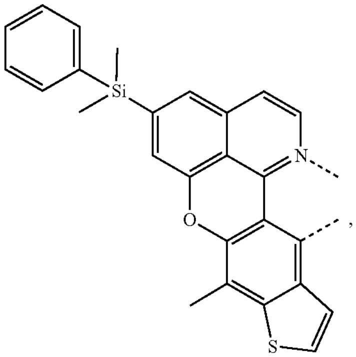
$L_{a236}$
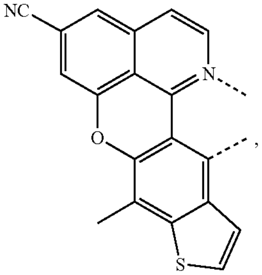
$L_{a237}$
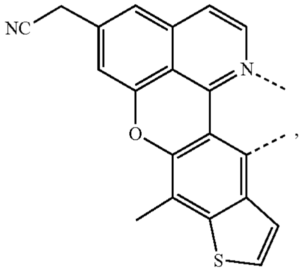
$L_{a238}$
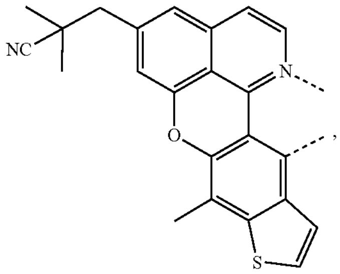
$L_{a239}$
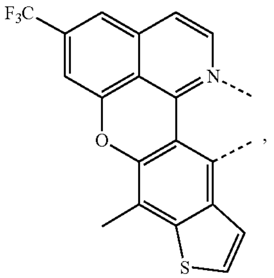
$L_{a240}$
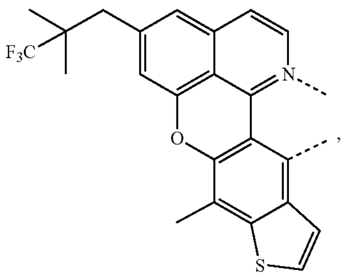
$L_{a241}$
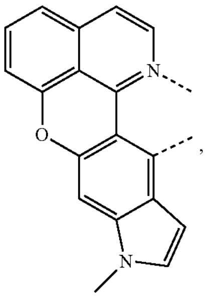

-continued
$L_{a242}$
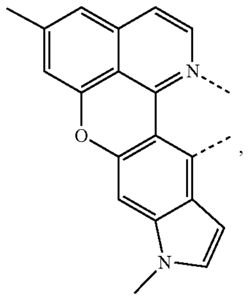
$L_{a243}$
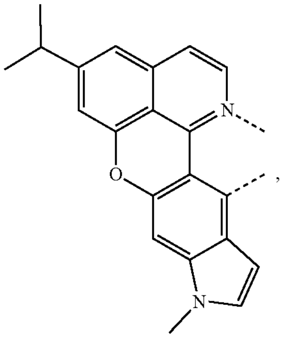
$L_{a244}$
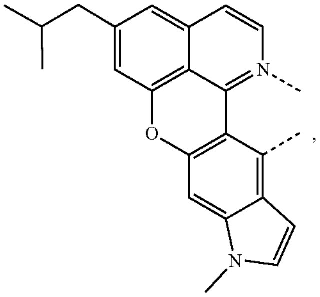
$L_{a245}$
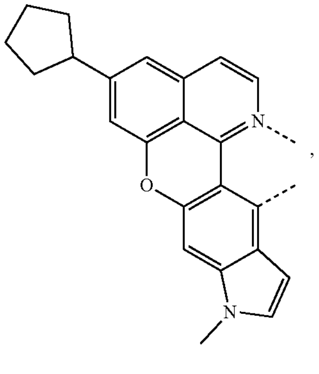
-continued
$L_{a246}$
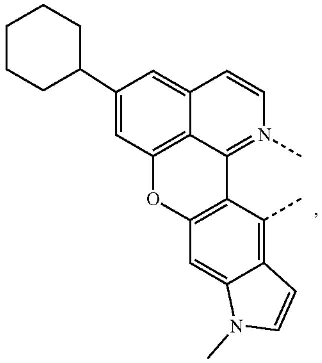
$L_{a247}$
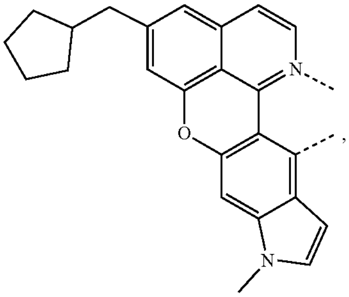
$L_{a248}$
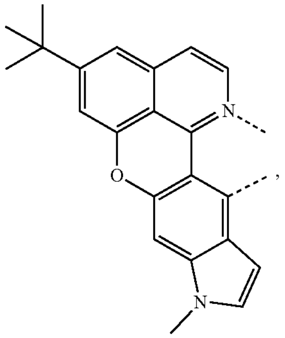
$L_{a249}$
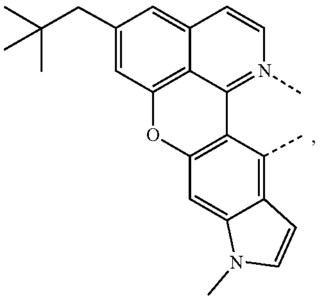

-continued
$L_{a250}$
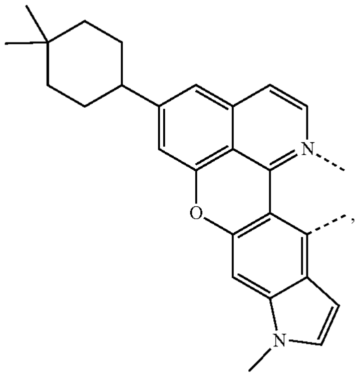
$L_{a251}$
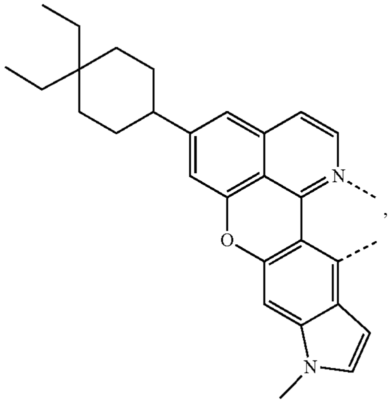
$L_{a252}$
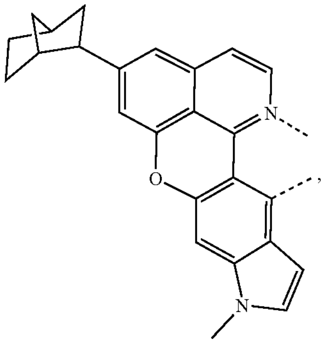
$L_{a253}$
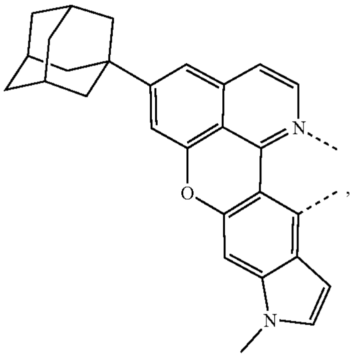
-continued
$L_{a254}$
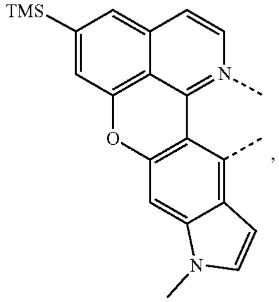
$L_{a255}$
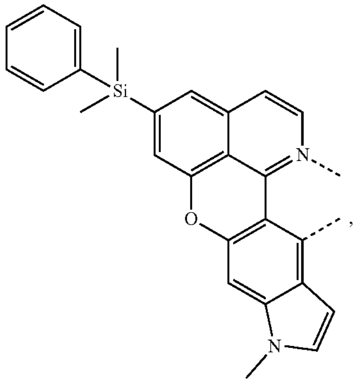
$L_{a256}$
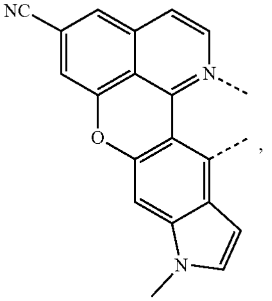
$L_{a257}$
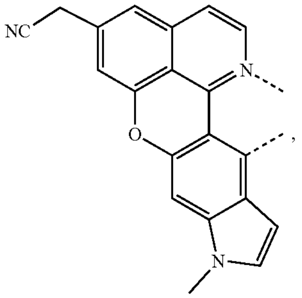
$L_{a258}$
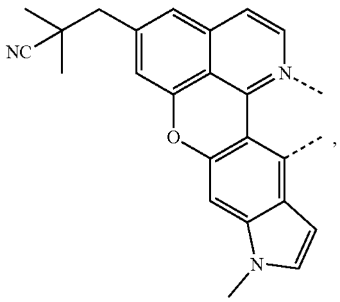

-continued
$L_{a259}$
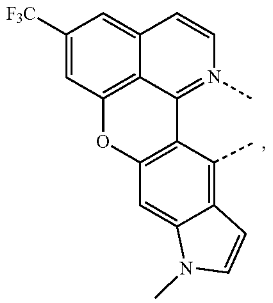
$L_{a260}$
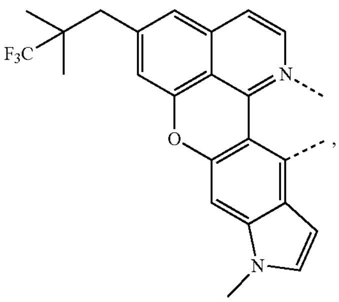
$L_{a261}$
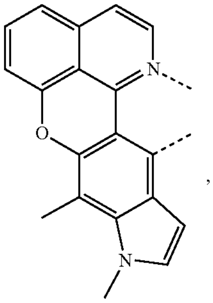
$L_{a262}$
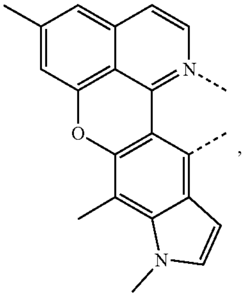
$L_{a263}$
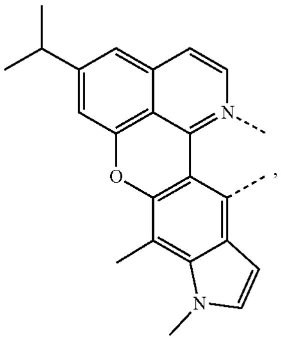
-continued
$L_{a264}$
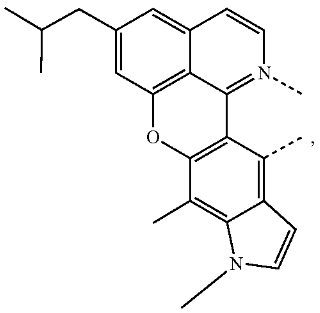
$L_{a265}$
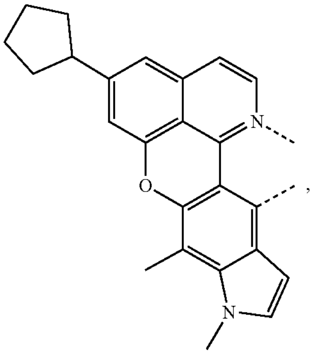
$L_{a266}$
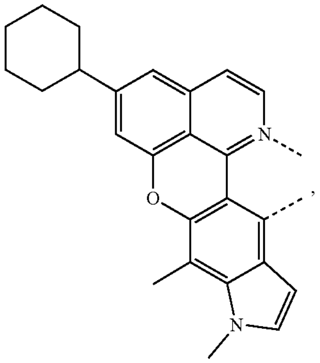
$L_{a267}$
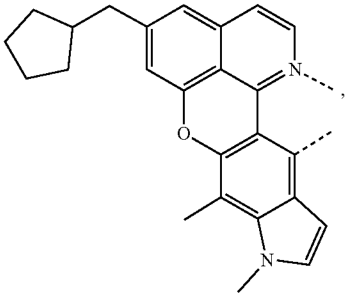

-continued
$L_{a268}$
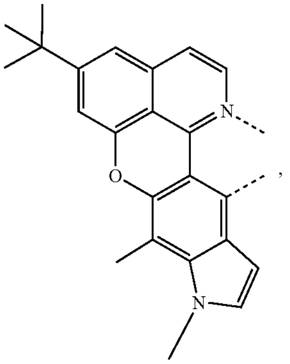
,
$L_{a269}$
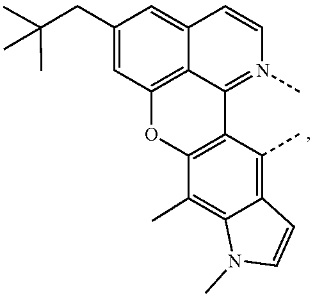
,
$L_{a270}$
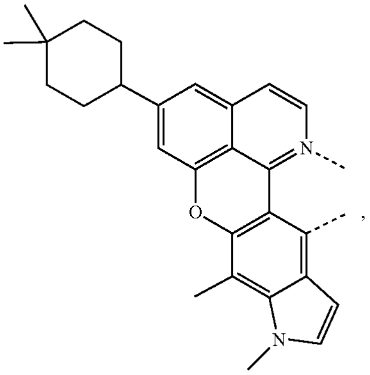
,
$L_{a271}$
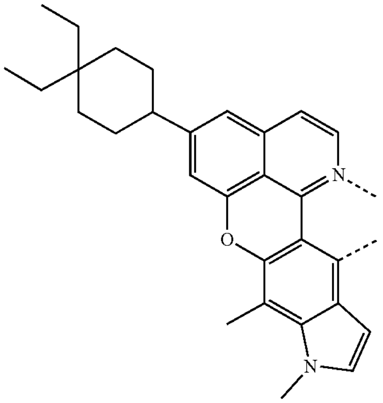
,
-continued
$L_{a272}$
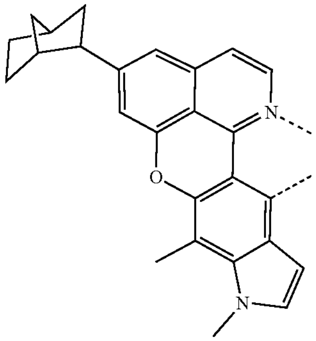
,
$L_{a273}$
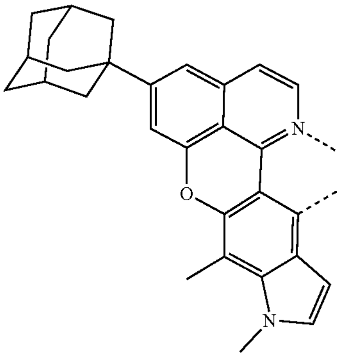
,
$L_{a274}$
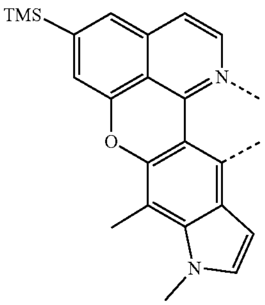
,
$L_{a275}$
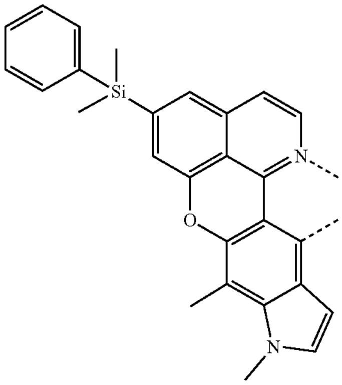
, -continued
$L_{a276}$
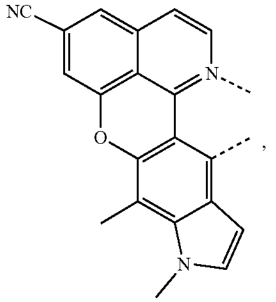
$L_{a277}$
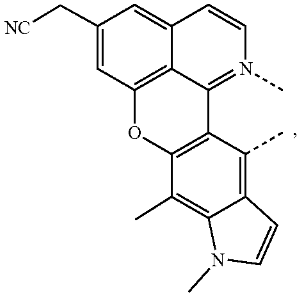
$L_{a278}$
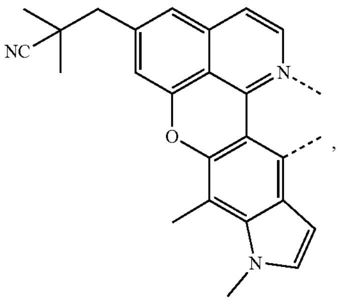
$L_{a279}$
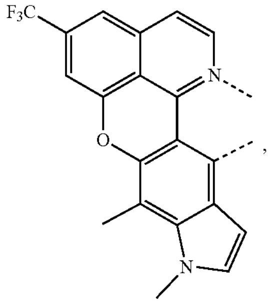
$L_{a280}$
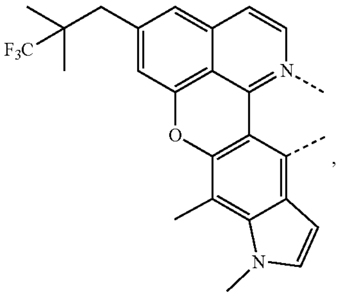
-continued
$L_{a281}$
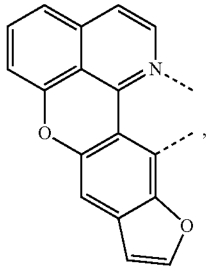
$L_{a282}$
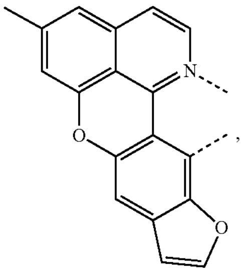
$L_{a283}$
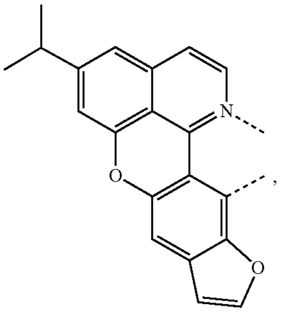
$L_{a284}$
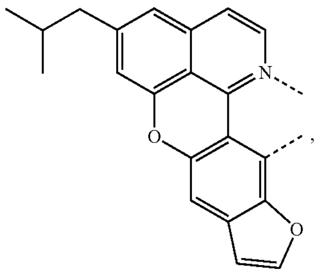
$L_{a285}$
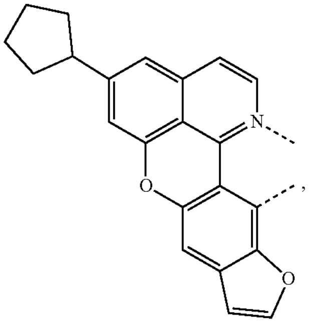

-continued
$L_{a286}$
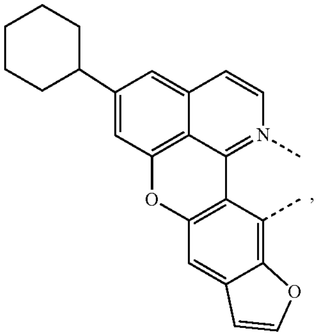
$L_{a287}$
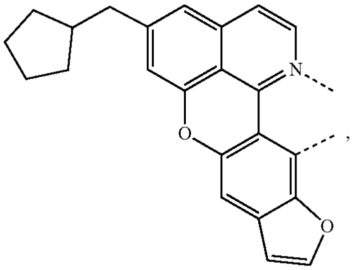
$L_{a288}$
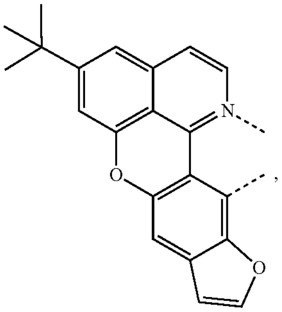
$L_{a289}$
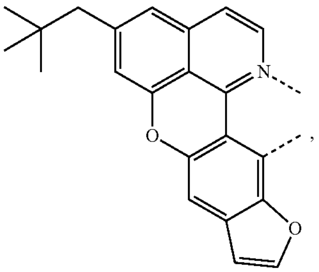
$L_{a290}$
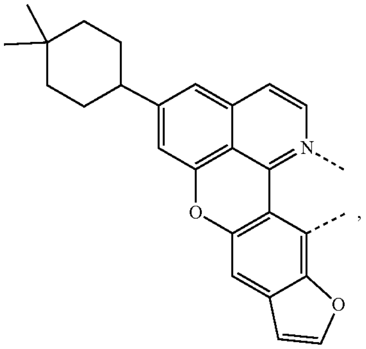
$L_{a291}$
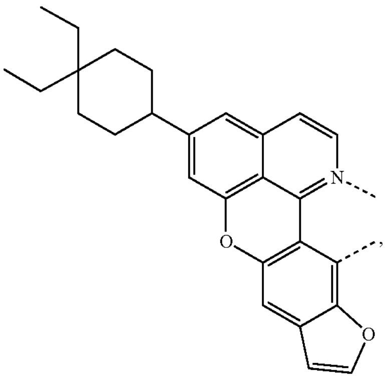
$L_{a292}$
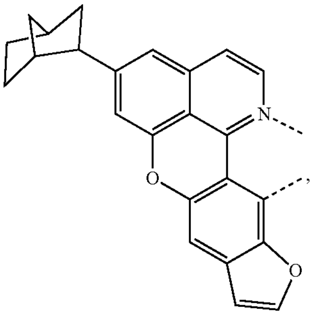
$L_{a293}$
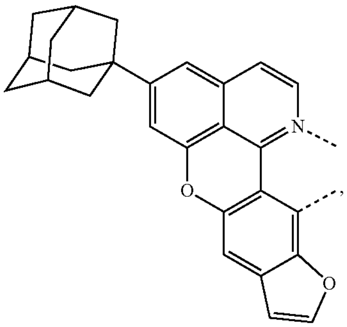
$L_{a294}$
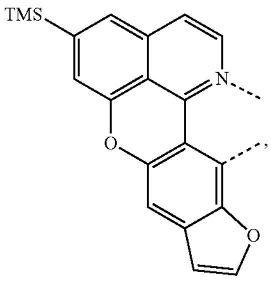

-continued
$L_{a295}$
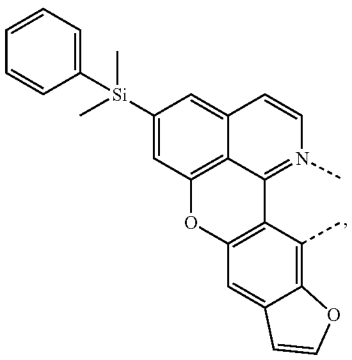
$L_{a296}$
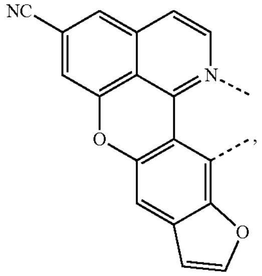
$L_{a297}$
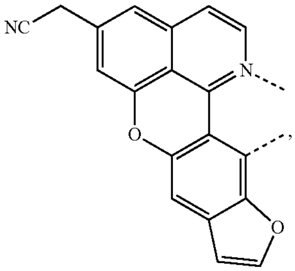
$L_{a298}$
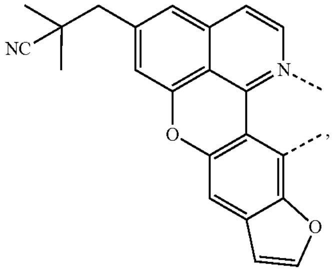
$L_{a299}$
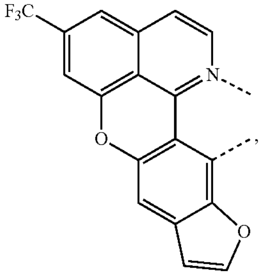
-continued
$L_{a300}$
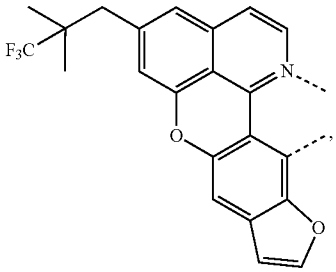
$L_{a301}$
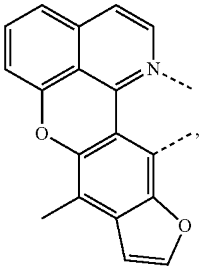
$L_{a302}$
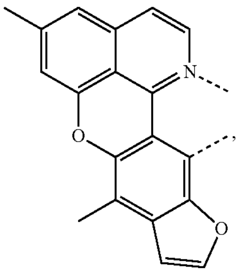
$L_{a303}$
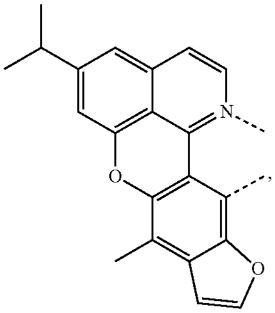
$L_{a304}$
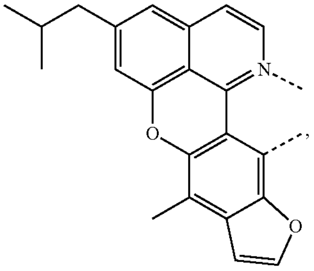

-continued
L$_{a305}$
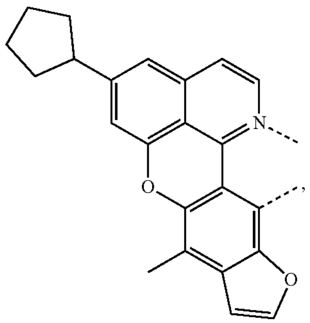
L$_{a306}$
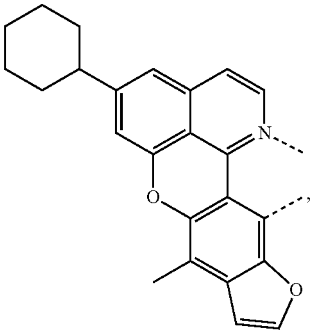
L$_{a307}$
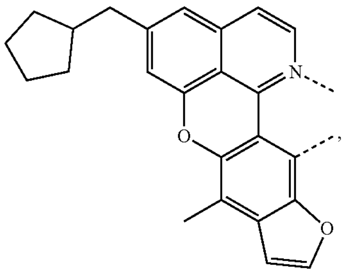
L$_{a308}$
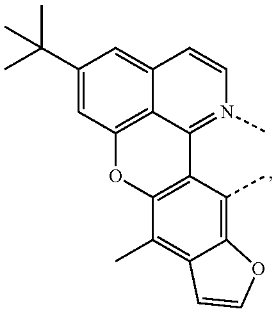
L$_{a309}$
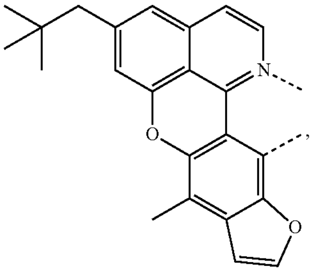
-continued
L$_{a310}$
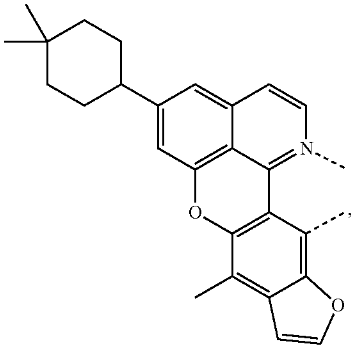
L$_{a311}$
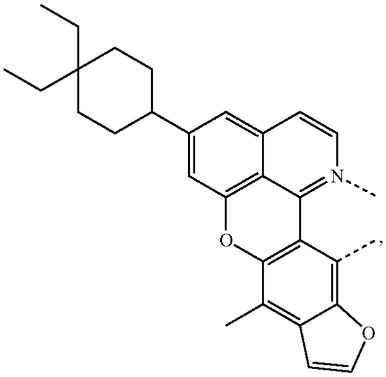
L$_{a312}$
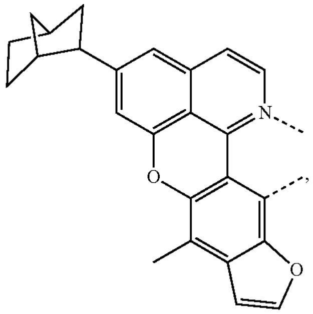
L$_{a313}$
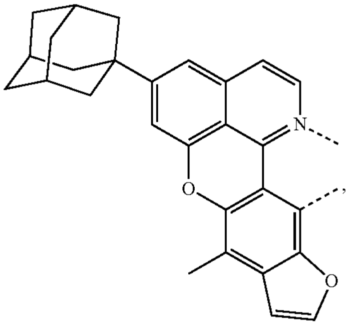

$L_{a314}$
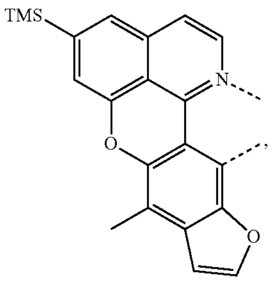
$L_{a315}$
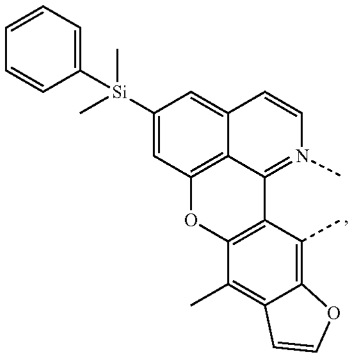
$L_{a316}$
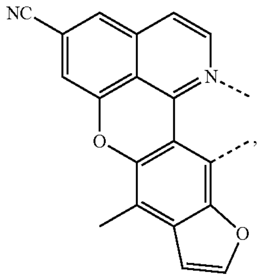
$L_{a317}$
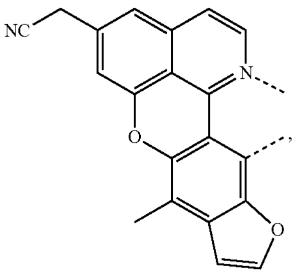
$L_{a318}$
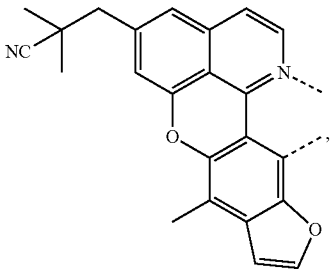
$L_{a319}$
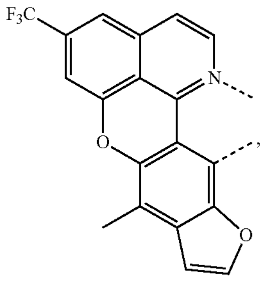
$L_{a320}$
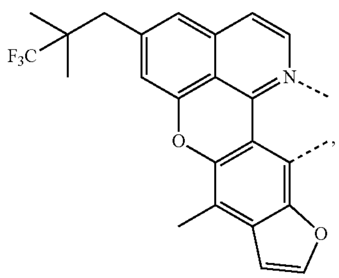
$L_{a321}$
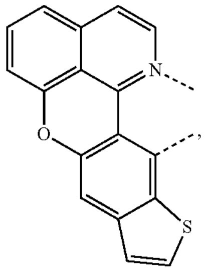
$L_{a322}$
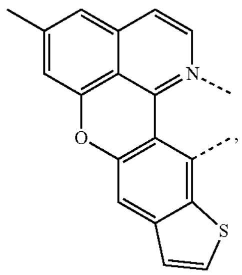
$L_{a323}$
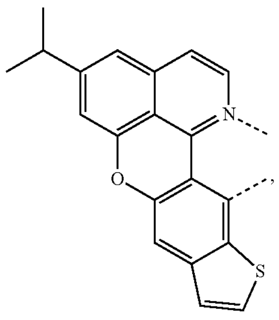

-continued
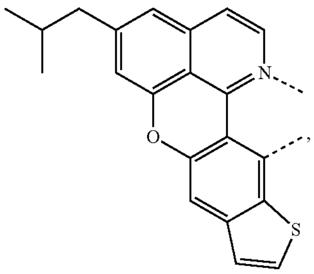
$L_{a324}$
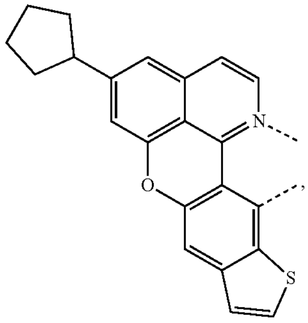
$L_{a325}$
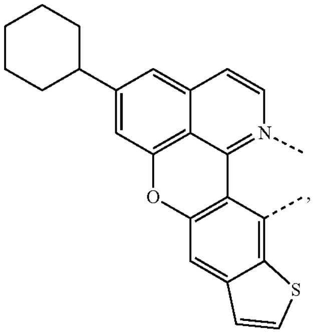
$L_{a326}$
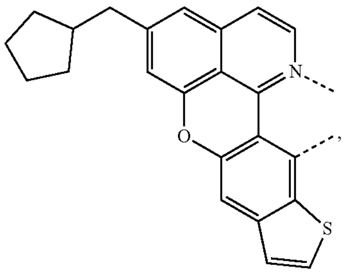
$L_{a327}$
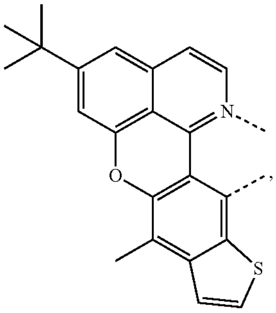
$L_{a328}$
-continued
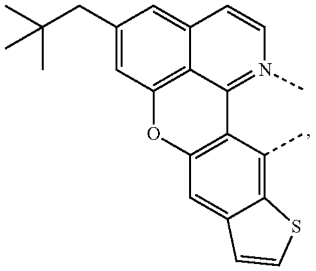
$L_{a329}$
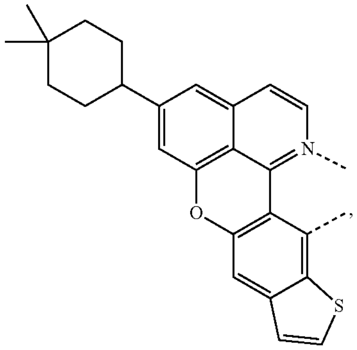
$L_{a330}$
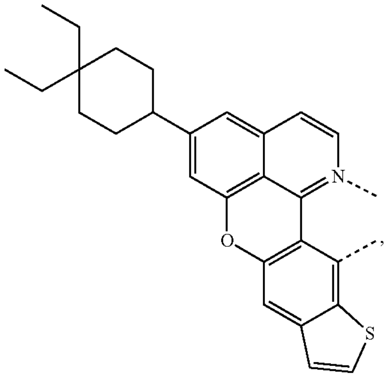
$L_{a331}$
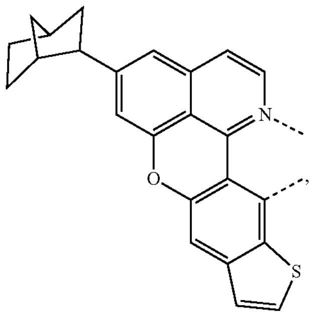
$L_{a332}$ -continued
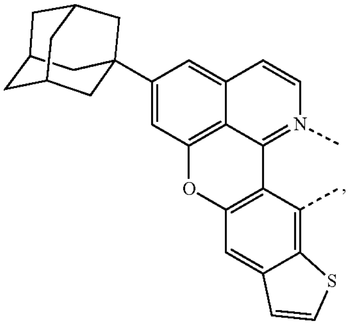
$L_{a333}$
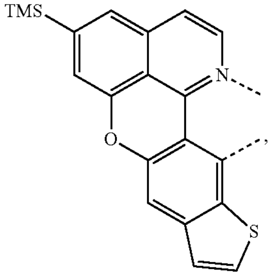
$L_{a334}$
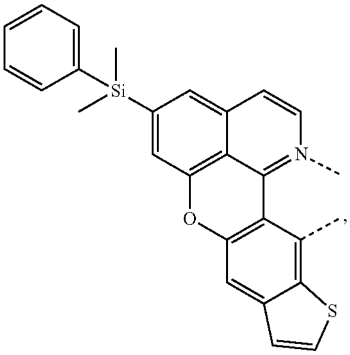
$L_{a335}$
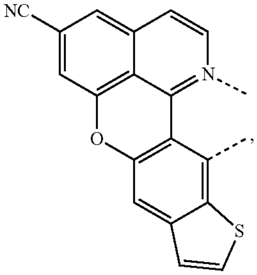
$L_{a336}$
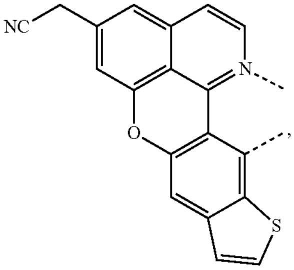
$L_{a337}$
-continued
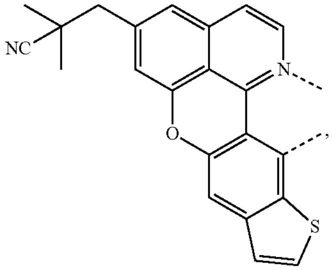
$L_{a338}$
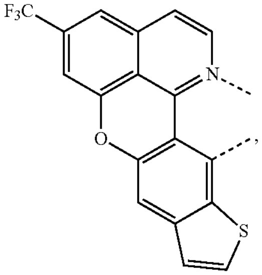
$L_{a339}$
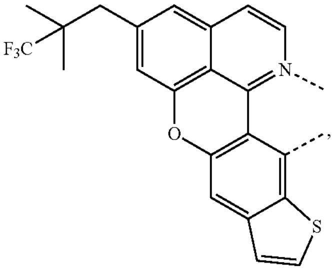
$L_{a340}$
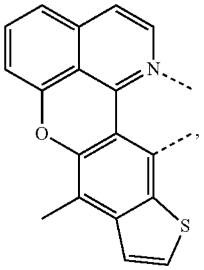
$L_{a341}$
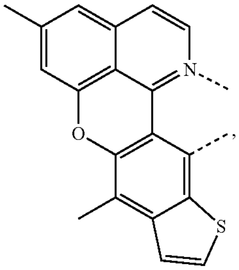
$L_{a342}$ -continued
$L_{a343}$
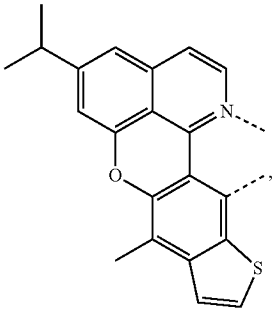
$L_{a344}$
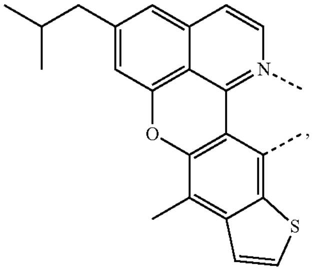
$L_{a345}$
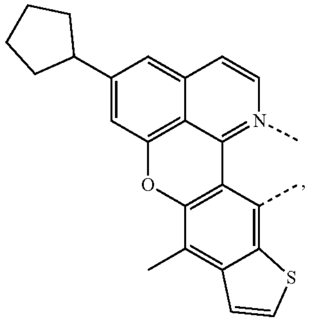
$L_{a346}$
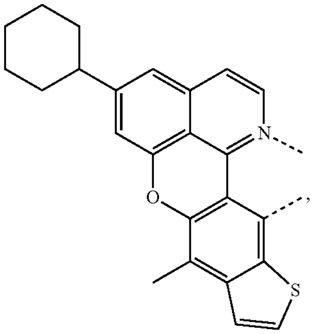
$L_{a347}$
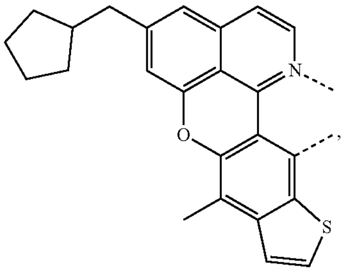
-continued
$L_{a348}$
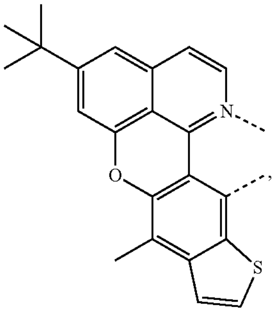
$L_{a349}$
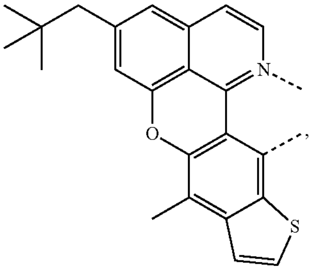
$L_{a350}$
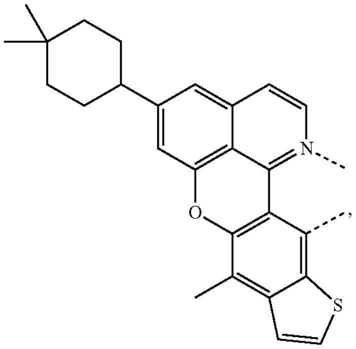
$L_{a351}$
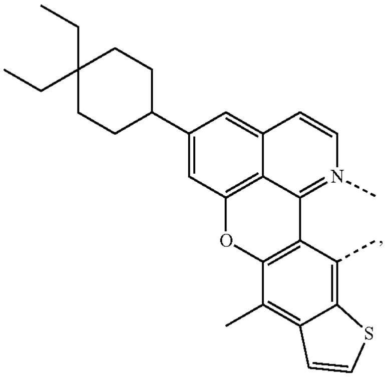

-continued
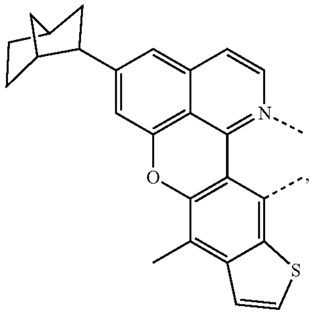
$L_{a352}$
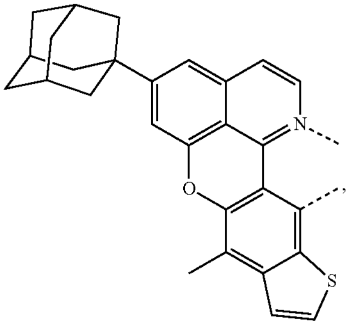
$L_{a353}$
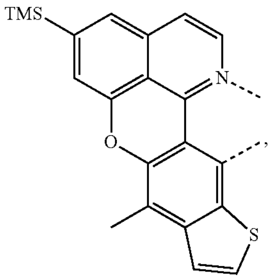
$L_{a354}$
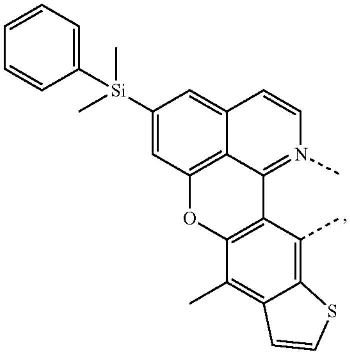
$L_{a355}$
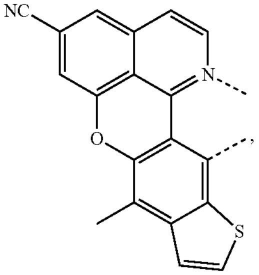
$L_{a356}$
-continued
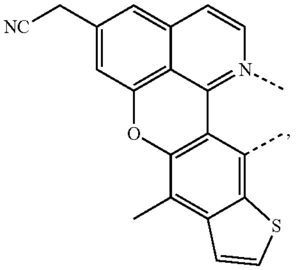
$L_{a357}$
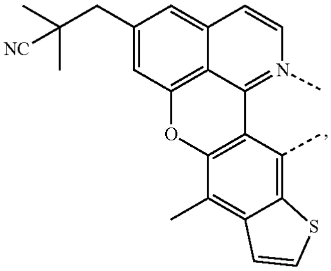
$L_{a358}$
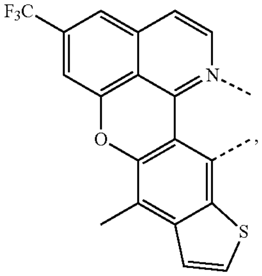
$L_{a359}$
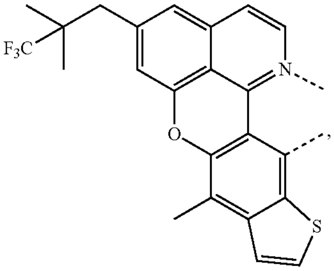
$L_{a360}$
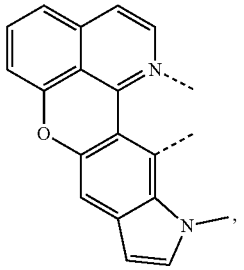
$L_{a361}$ -continued
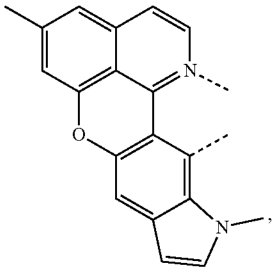
$L_{a362}$
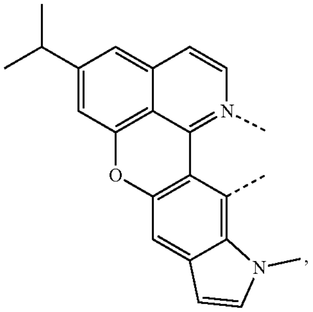
$L_{a363}$
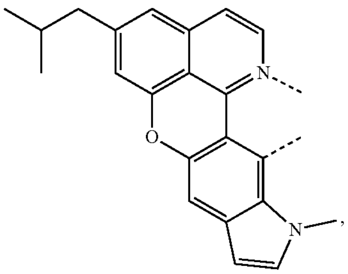
$L_{a364}$
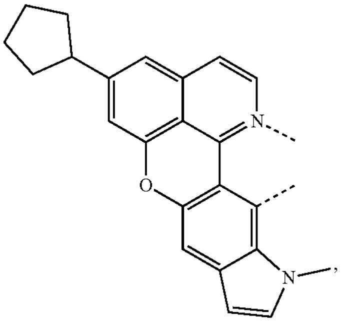
$L_{a365}$
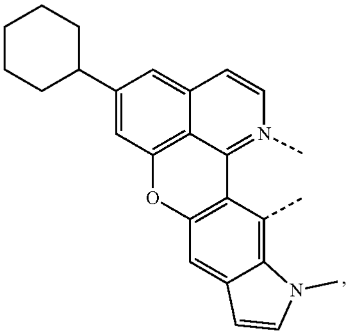
$L_{a366}$
-continued
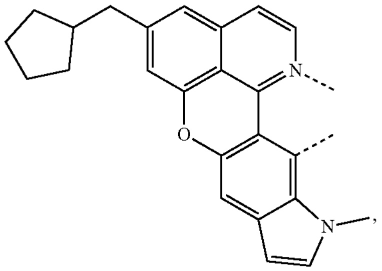
$L_{a367}$
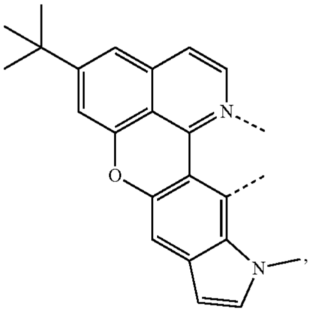
$L_{a368}$
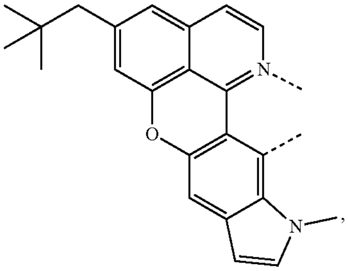
$L_{a369}$
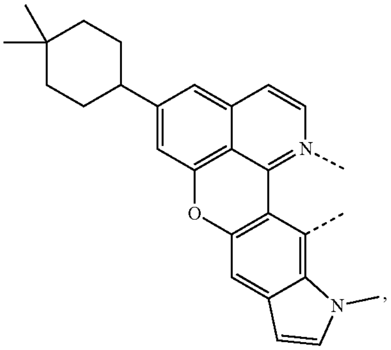
$L_{a370}$
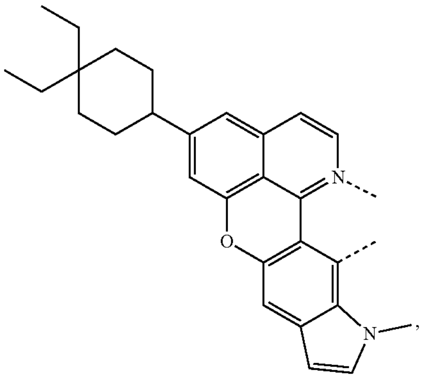
$L_{a371}$ -continued
$L_{a372}$
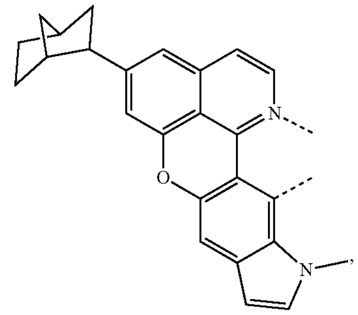
$L_{a373}$
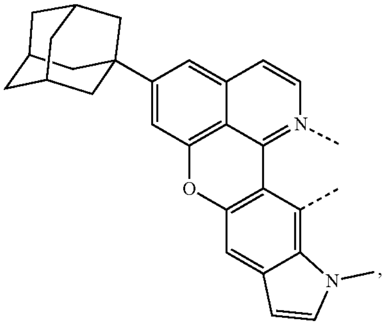
$L_{a374}$
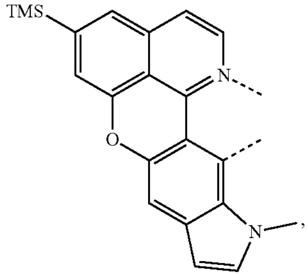
$L_{a375}$
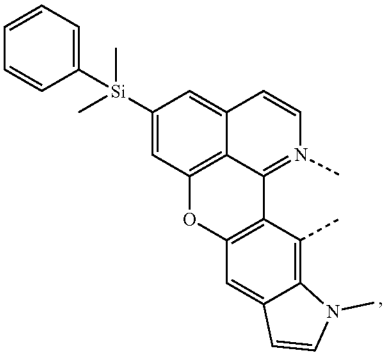
$L_{a376}$
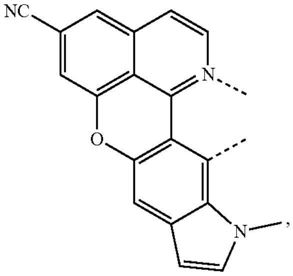
-continued
$L_{a377}$
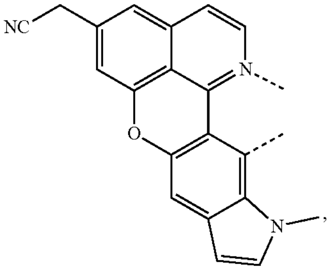
$L_{a378}$
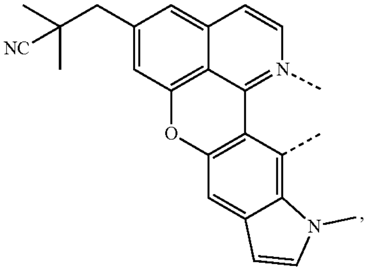
$L_{a379}$
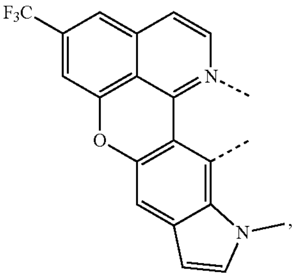
$L_{a380}$
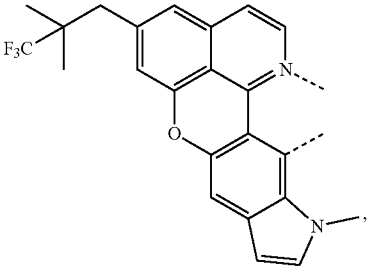
$L_{a381}$
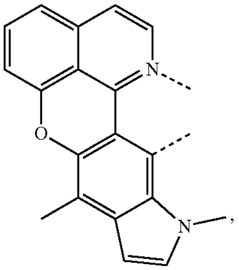

-continued
$L_{a382}$
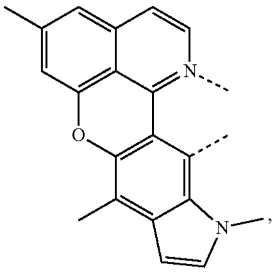
$L_{a383}$
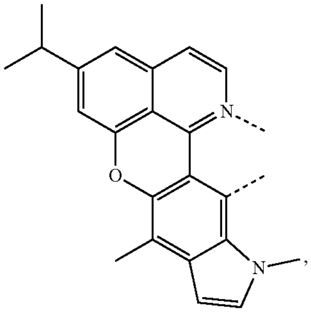
$L_{a384}$
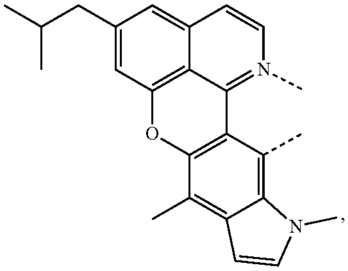
$L_{a385}$
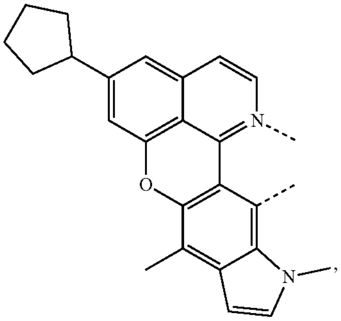
$L_{a386}$
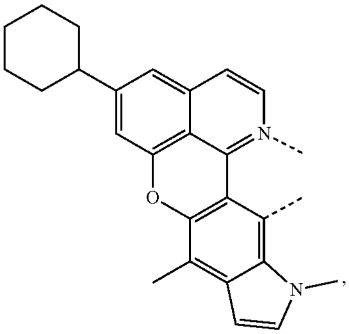
-continued
$L_{a387}$
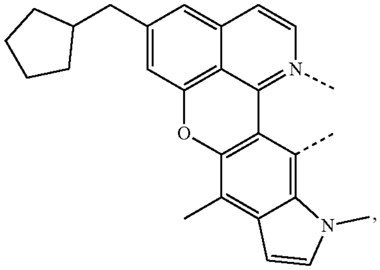
$L_{a388}$
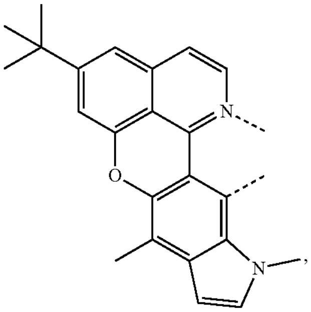
$L_{a389}$
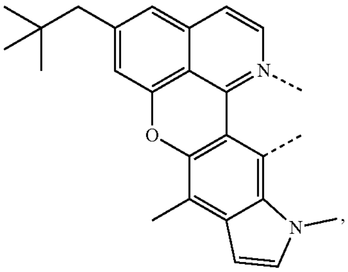
$L_{a390}$
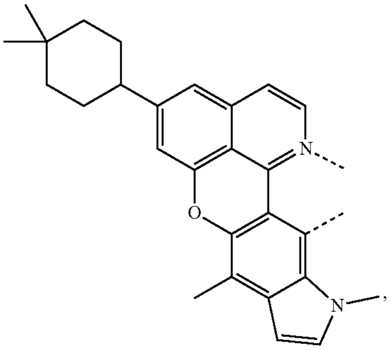
$L_{a391}$
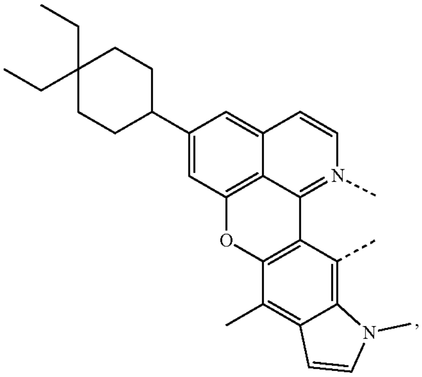

-continued
$L_{a392}$
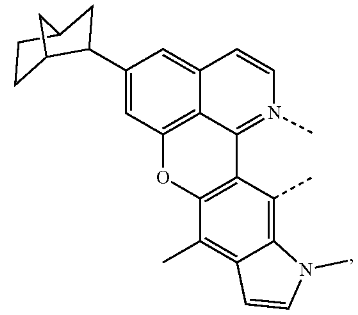
$L_{a393}$
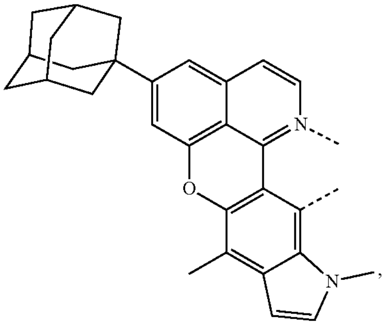
$L_{a394}$
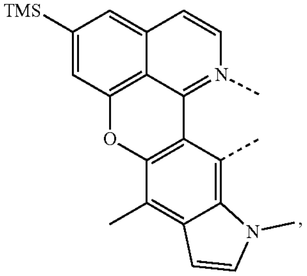
$L_{a395}$
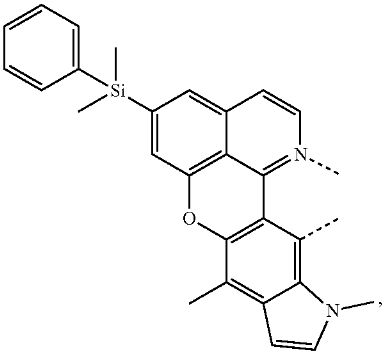
$L_{a396}$
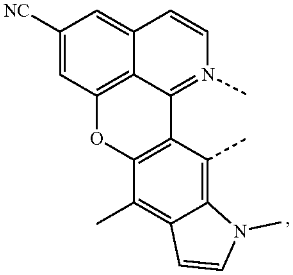
-continued
$L_{a397}$
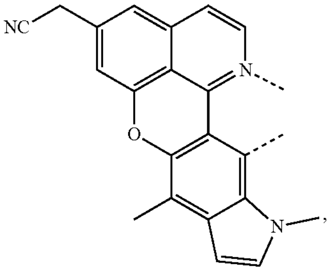
$L_{a398}$
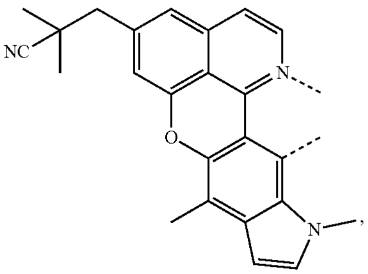
$L_{a399}$
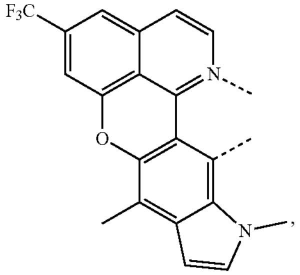
$L_{a400}$
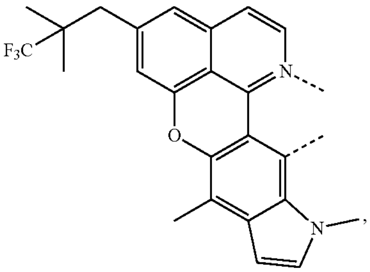
$L_{a401}$
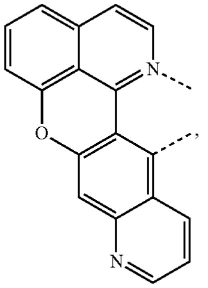

-continued
$L_{a402}$
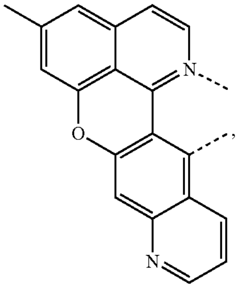
$L_{a403}$
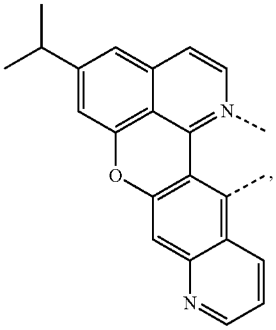
$L_{a404}$
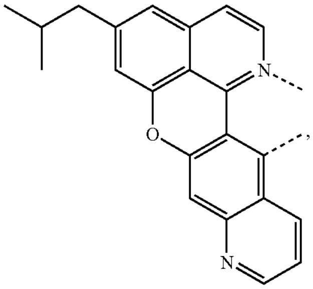
$L_{a405}$
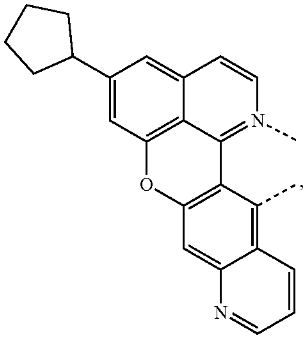
$L_{a406}$
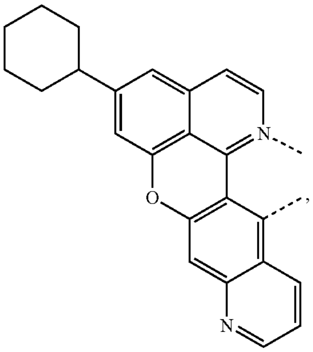
-continued
$L_{a407}$
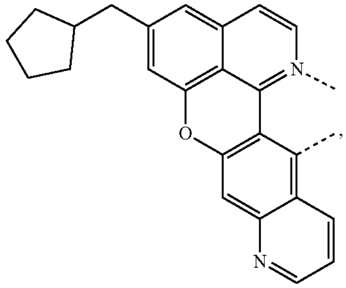
$L_{a408}$
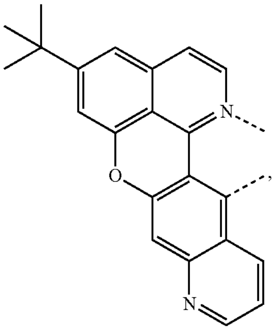
$L_{a409}$
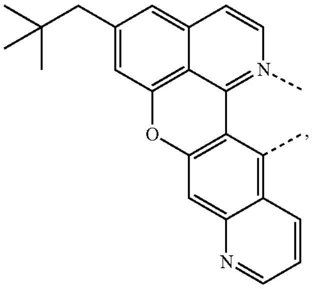
$L_{a410}$
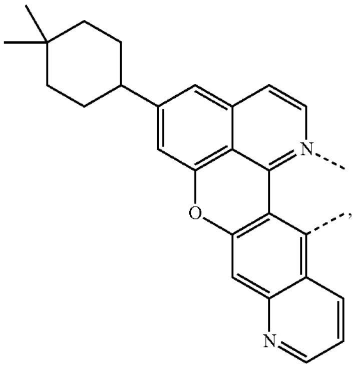

-continued
$L_{a411}$
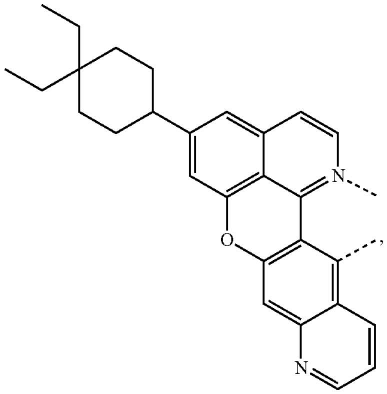
$L_{a412}$
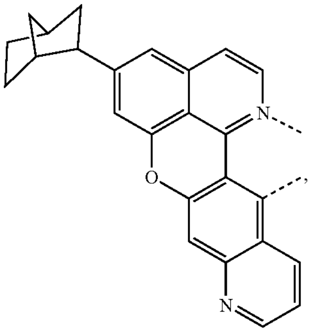
$L_{a413}$
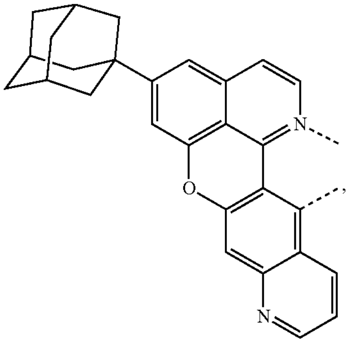
$L_{a414}$
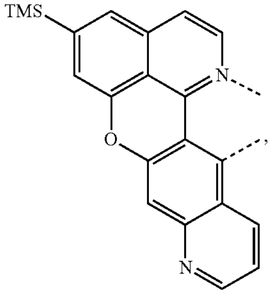
-continued
$L_{a415}$
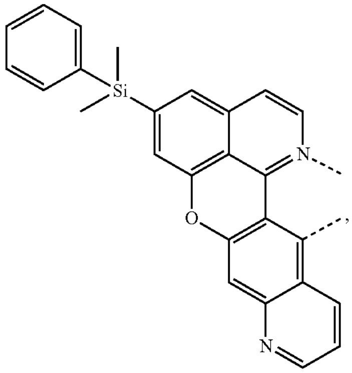
$L_{a416}$
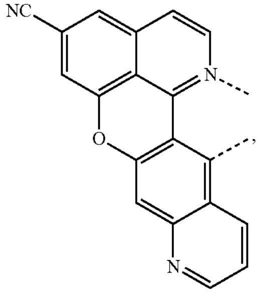
$L_{a417}$
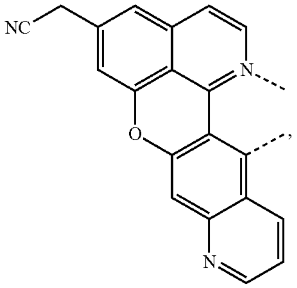
$L_{a418}$
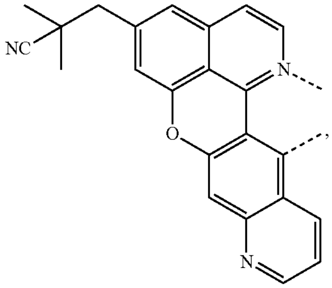
$L_{a419}$
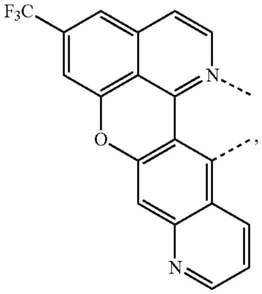

-continued
$L_{a420}$
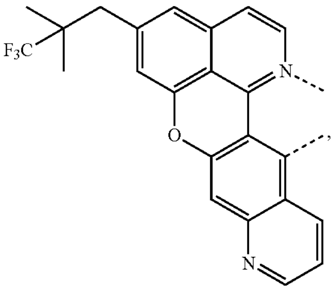
$L_{a421}$
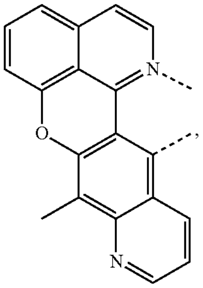
$L_{a422}$
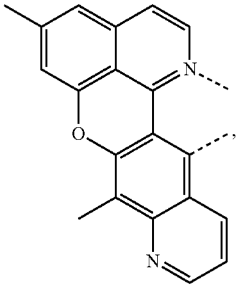
$L_{a423}$
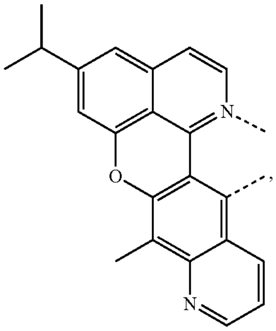
$L_{a424}$
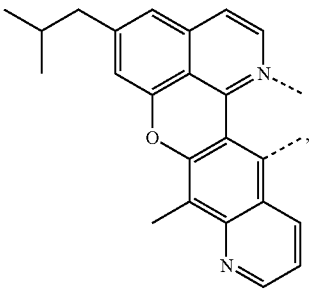
-continued
$L_{a425}$
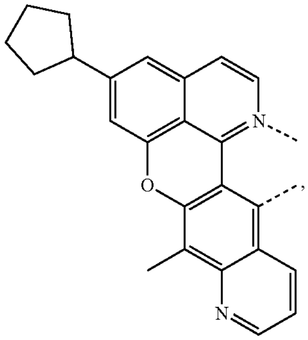
$L_{a426}$
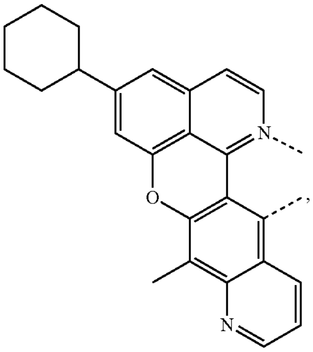
$L_{a427}$
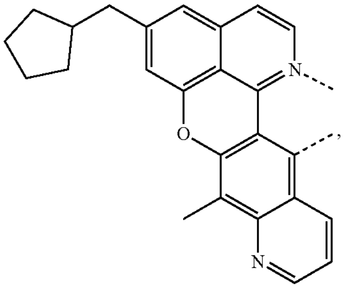
$L_{a428}$
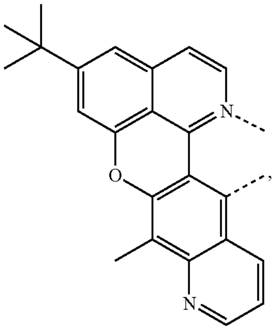
$L_{a429}$
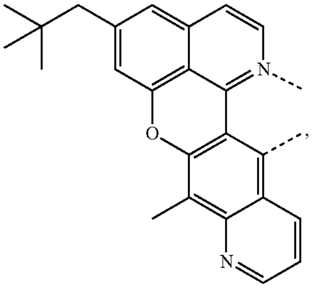

-continued
L$_{a430}$
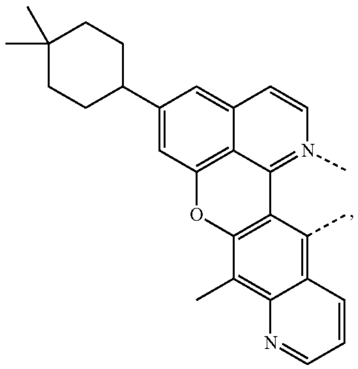
L$_{a431}$
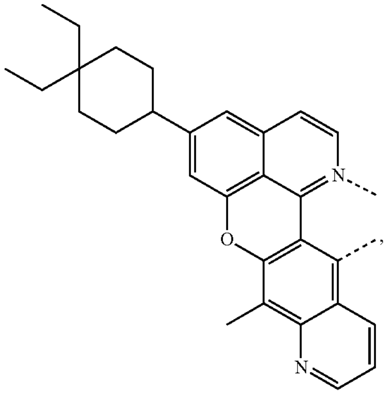
L$_{a432}$
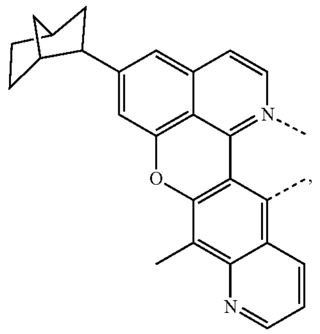
L$_{a433}$
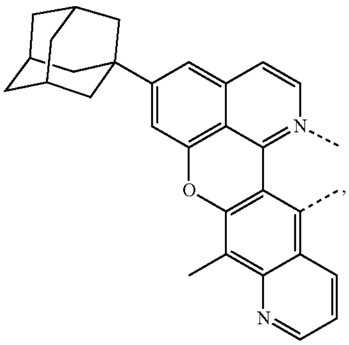
-continued
L$_{a434}$
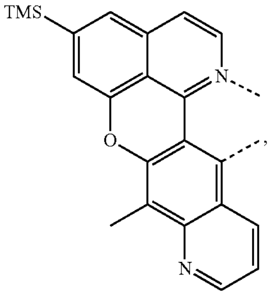
L$_{a435}$
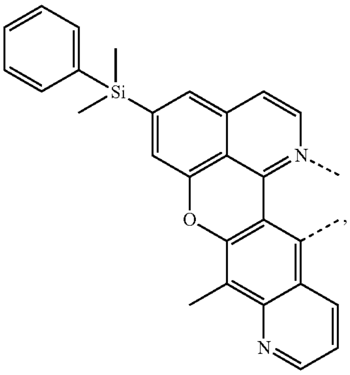
L$_{a436}$
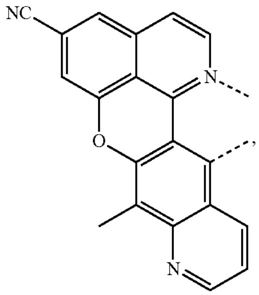
L$_{a437}$
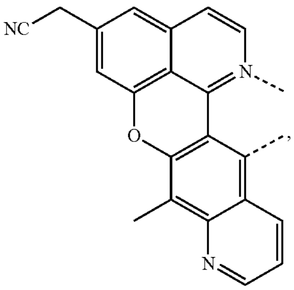
L$_{a438}$
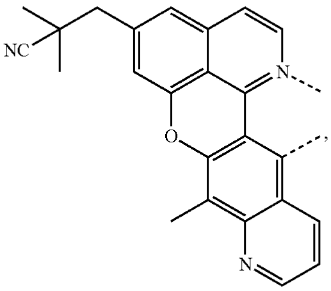

-continued
$L_{a439}$
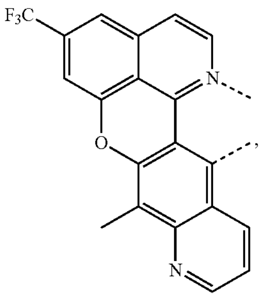
$L_{a440}$
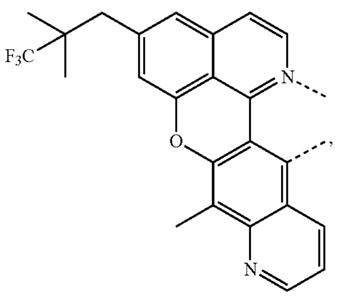
$L_{a441}$
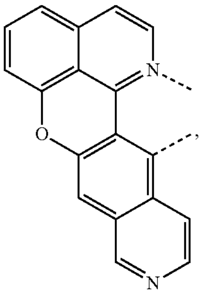
$L_{a442}$
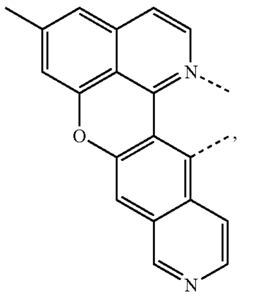
$L_{a443}$
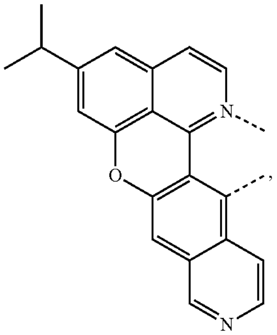
-continued
$L_{a444}$
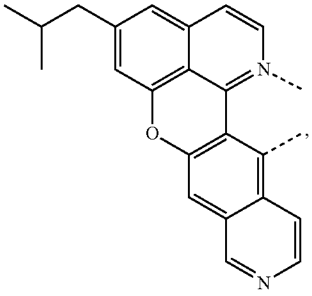
$L_{a445}$
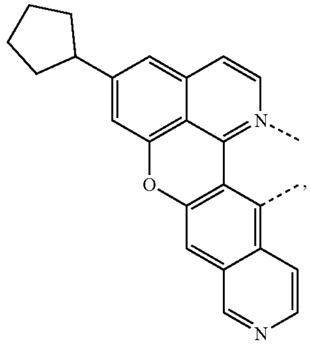
$L_{a446}$
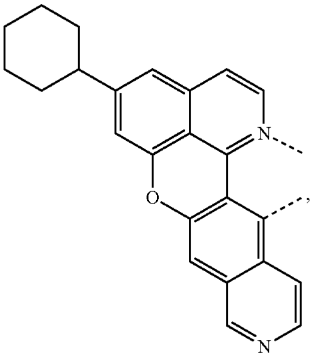
$L_{a447}$
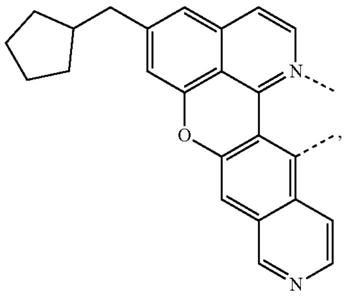

-continued
$L_{a448}$
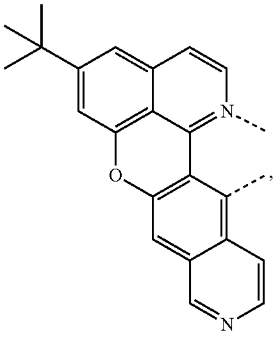
$L_{a449}$
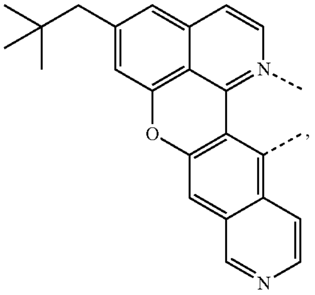
$L_{a450}$
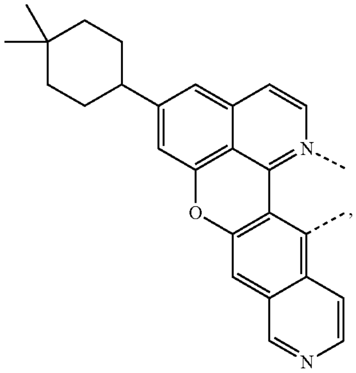
$L_{a451}$
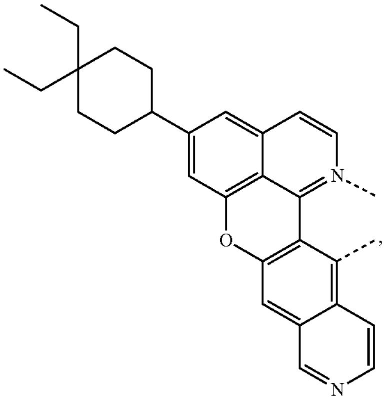
-continued
$L_{a452}$
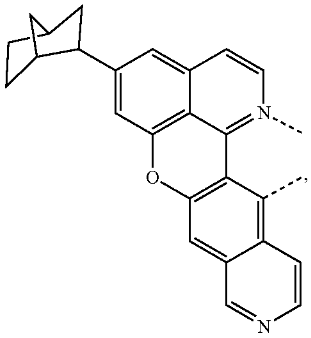
$L_{a453}$
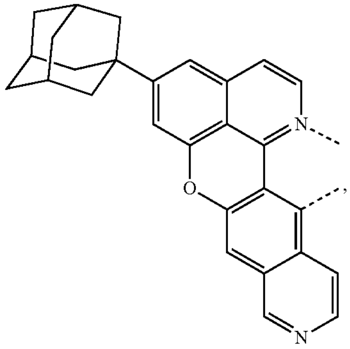
$L_{a454}$
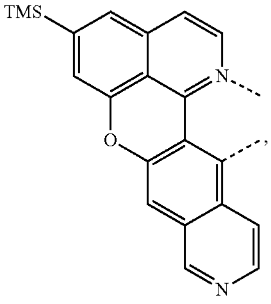
$L_{a455}$
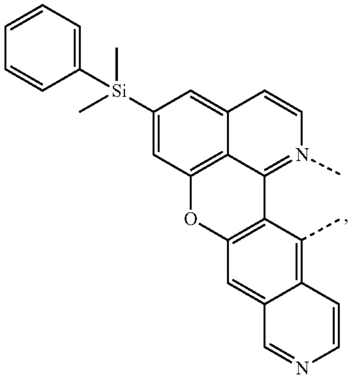

$L_{a456}$
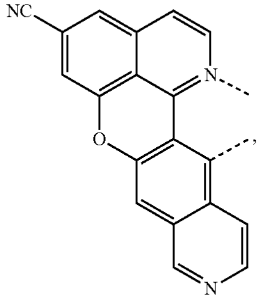
$L_{a457}$
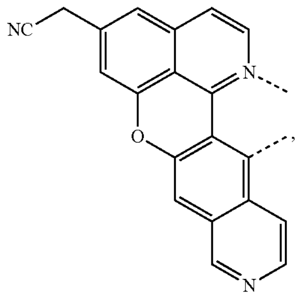
$L_{a458}$
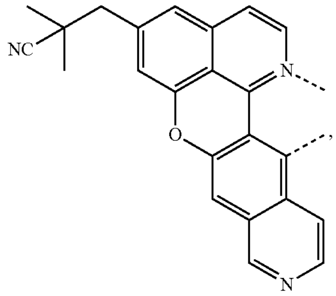
$L_{a459}$
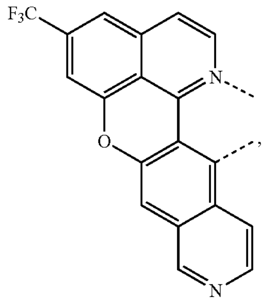
$L_{a460}$
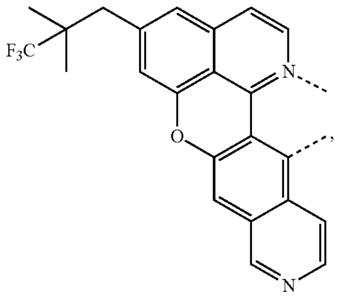
$L_{a461}$
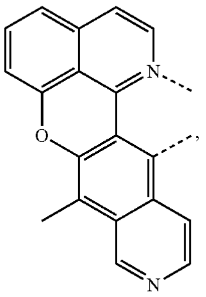
$L_{a462}$
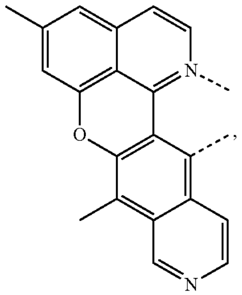
$L_{a463}$
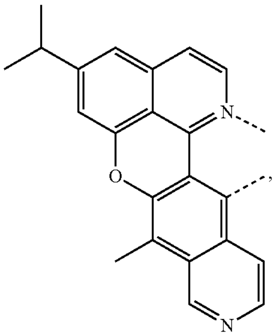
$L_{a464}$
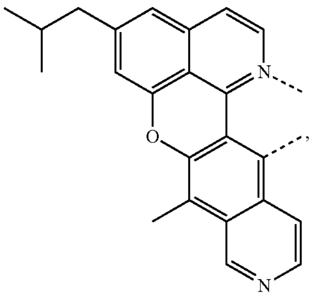
$L_{a465}$
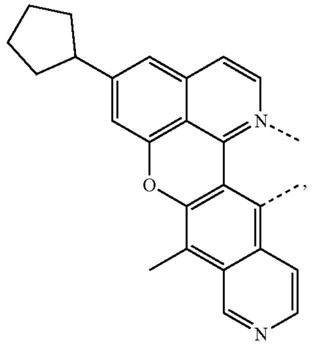

-continued
$L_{a466}$
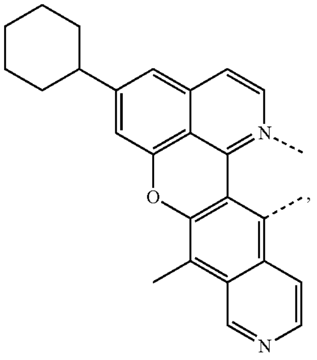
$L_{a467}$
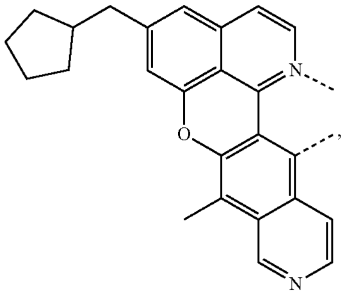
$L_{a468}$
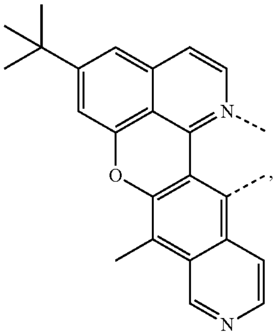
$L_{a449}$
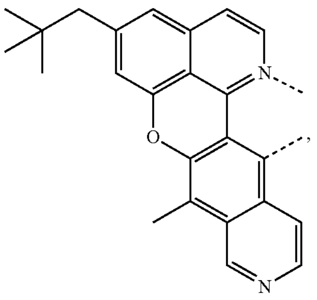
-continued
$L_{a470}$
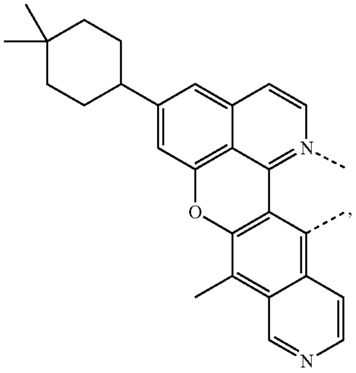
$L_{a471}$
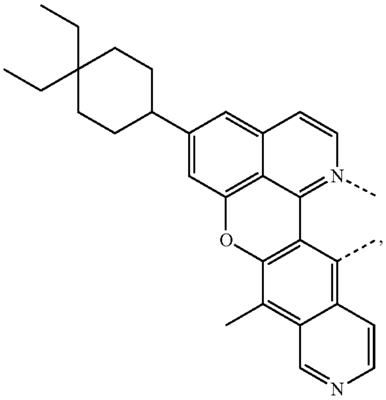
$L_{a472}$
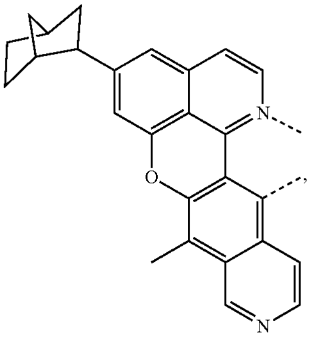
$L_{a473}$
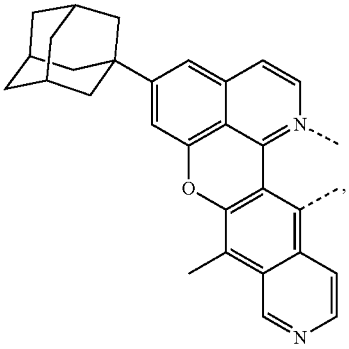

-continued
La474
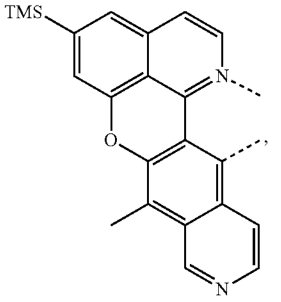
La475
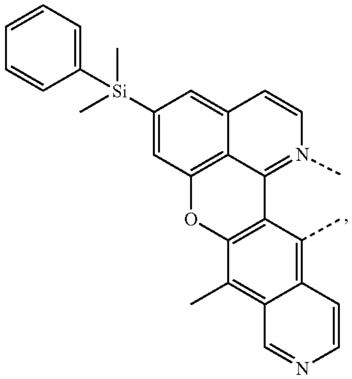
La476
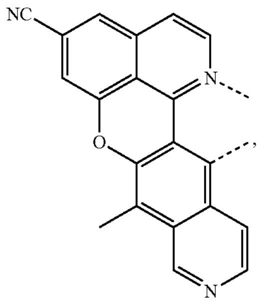
La477
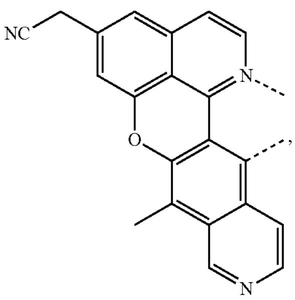
La478
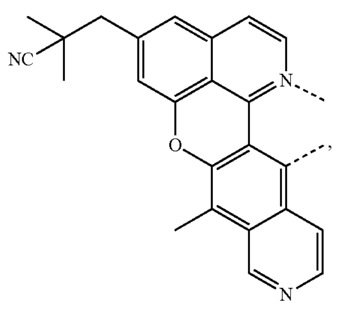
-continued
La479
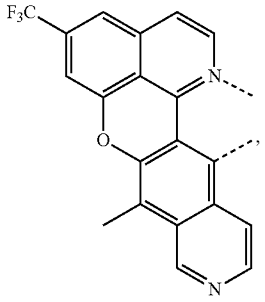
La480
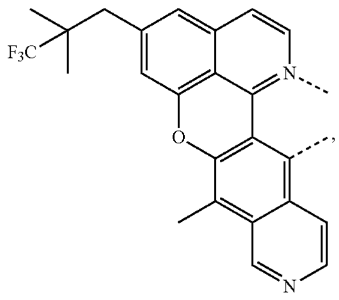
La481
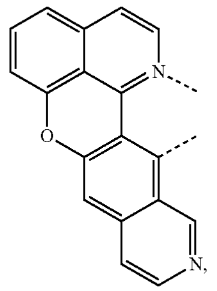
La482
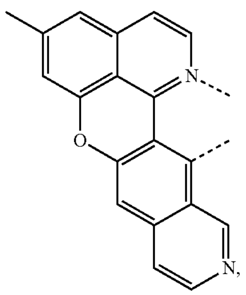
La483
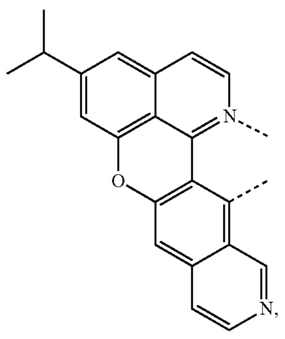

-continued
$L_{a484}$
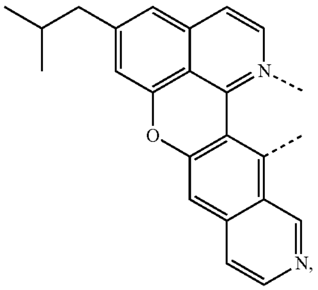
$L_{a485}$
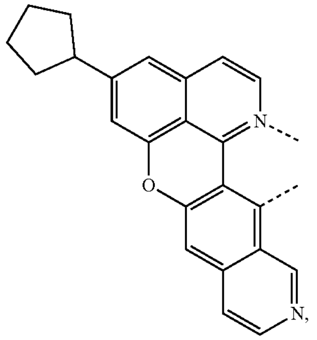
$L_{a486}$
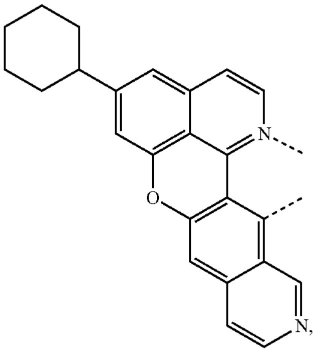
$L_{a487}$
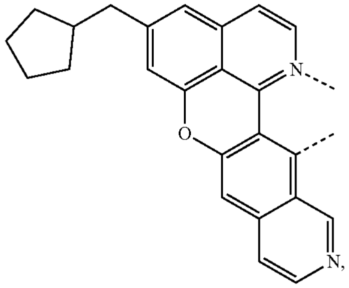
$L_{a488}$
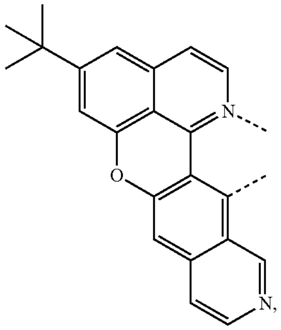
-continued
$L_{a489}$
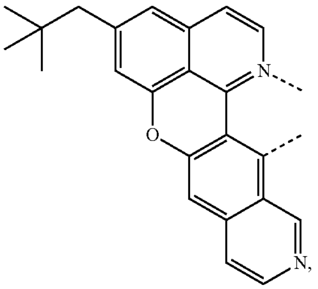
$L_{a490}$
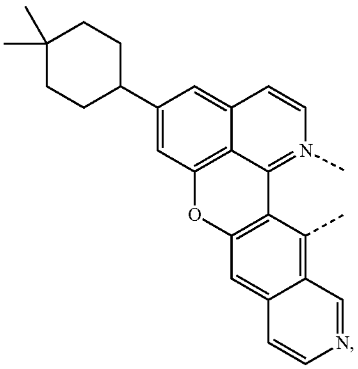
$L_{a491}$
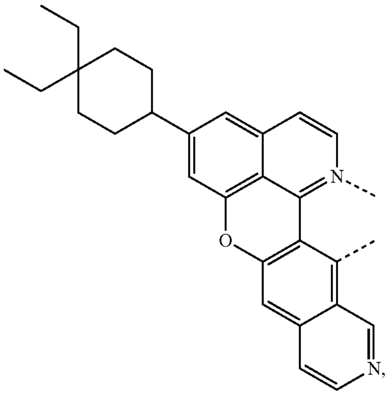
$L_{a492}$
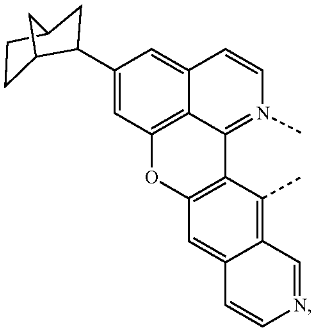

-continued
$L_{a493}$
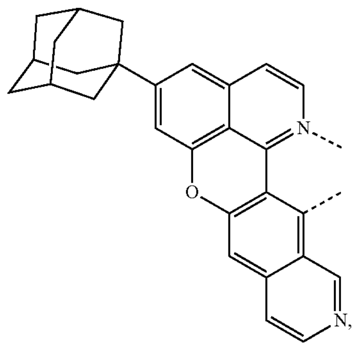
$L_{a494}$
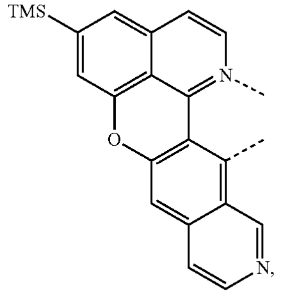
$L_{a495}$
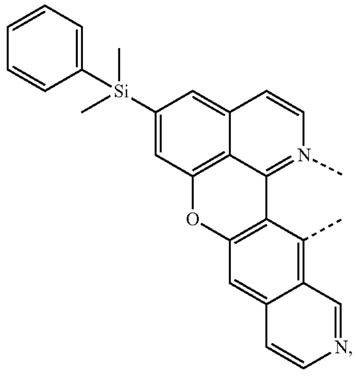
$L_{a496}$
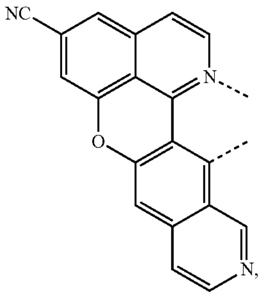
$L_{a497}$
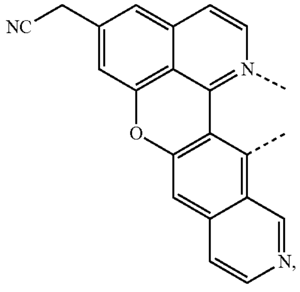
-continued
$L_{a498}$
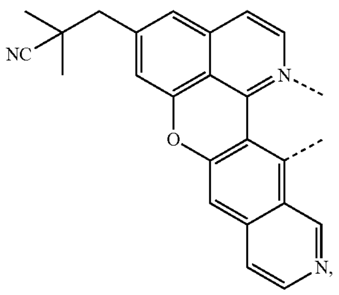
$L_{a499}$
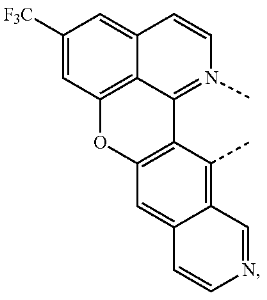
$L_{a500}$
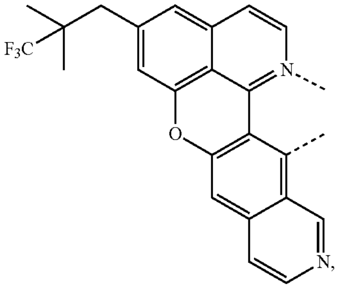
$L_{a501}$
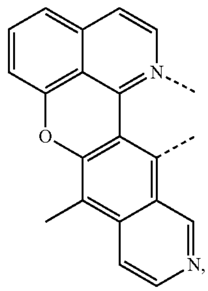
$L_{a502}$
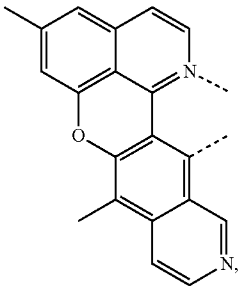

-continued
$L_{a503}$
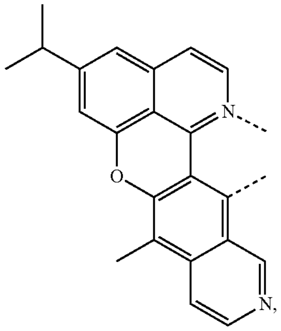
$L_{a504}$
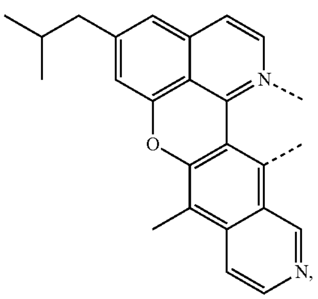
$L_{a505}$
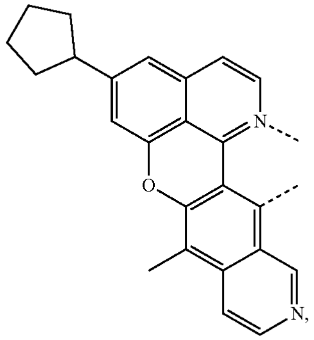
$L_{a506}$
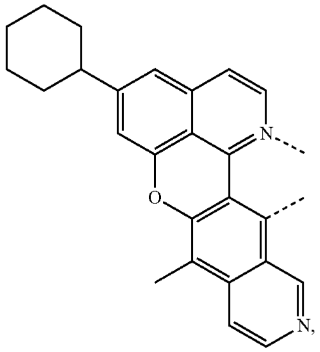
$L_{a507}$
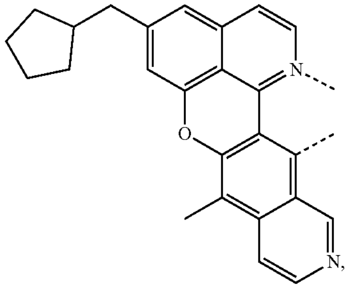
-continued
$L_{a508}$
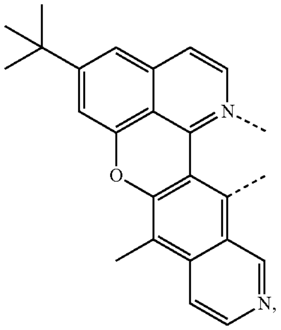
$L_{a509}$
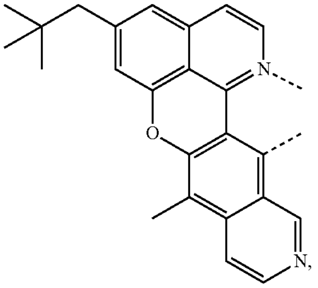
$L_{a510}$
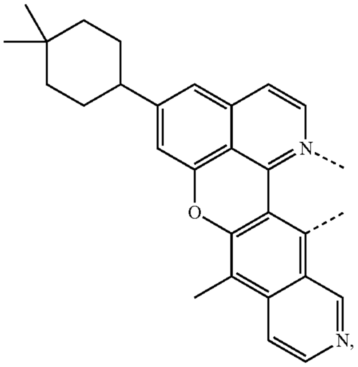
$L_{a511}$
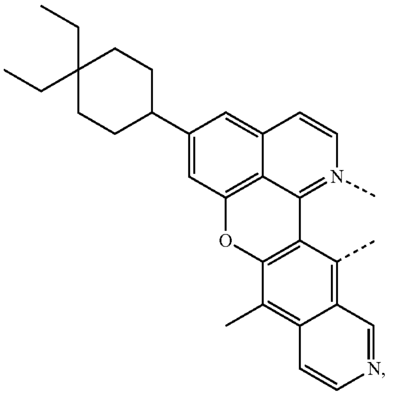

-continued
$L_{a512}$
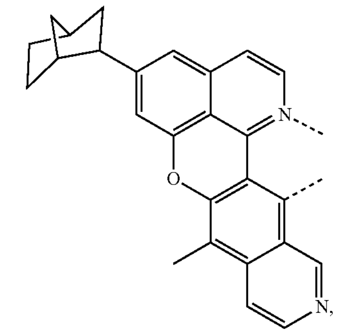
$L_{a513}$
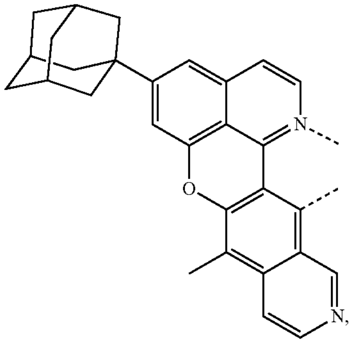
$L_{a514}$
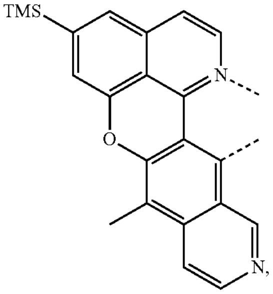
$L_{a515}$
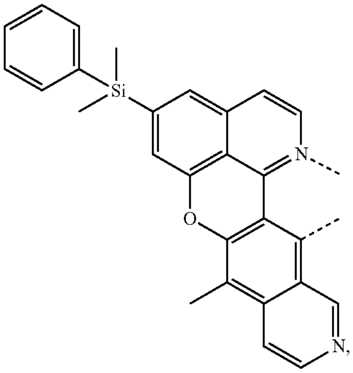
-continued
$L_{a516}$
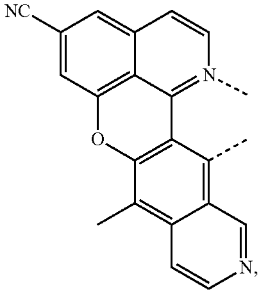
$L_{a517}$
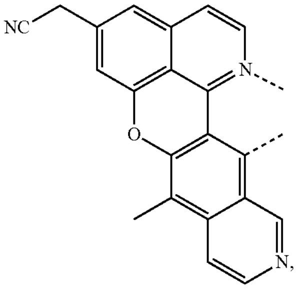
$L_{a518}$
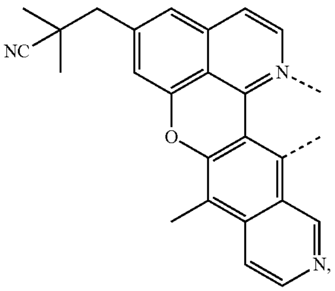
$L_{a519}$
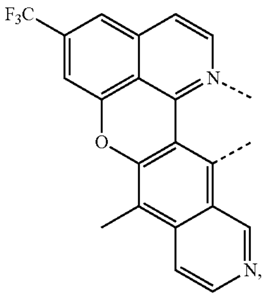
$L_{a520}$
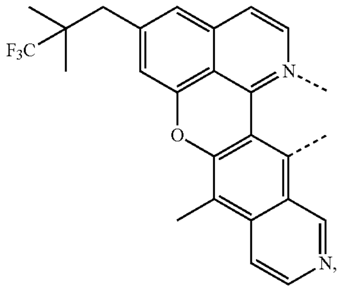

-continued
$L_{a521}$
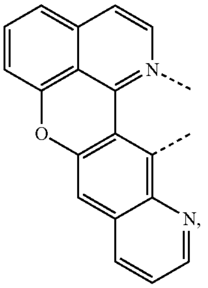
$L_{a522}$
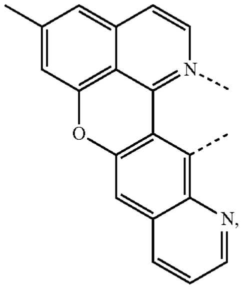
$L_{a523}$
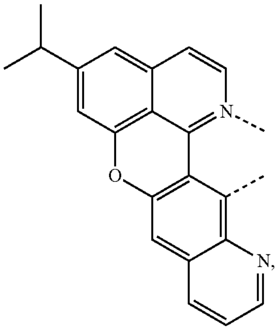
$L_{a524}$
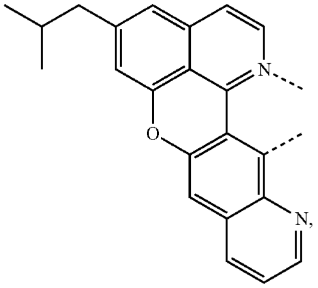
$L_{a525}$
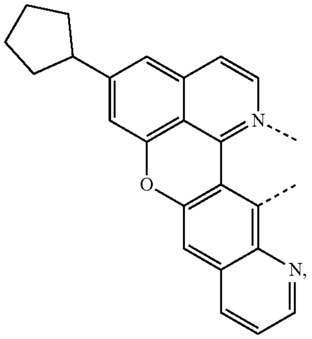
-continued
$L_{a526}$
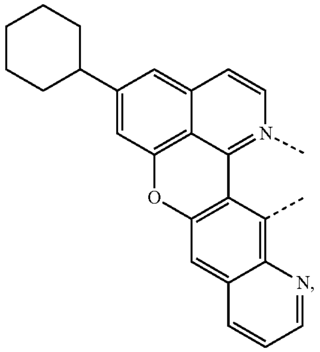
$L_{a527}$
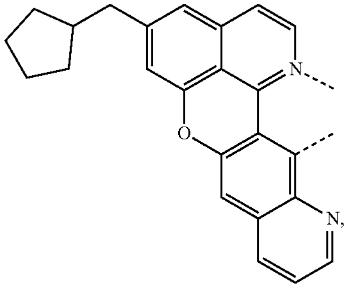
$L_{a528}$
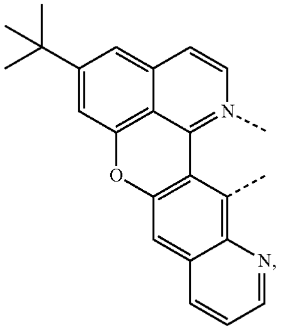
$L_{a529}$
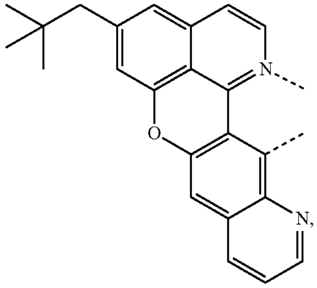

$L_{a530}$
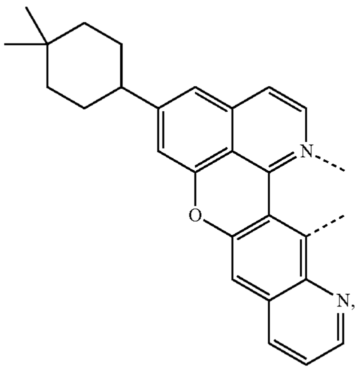
$L_{a531}$
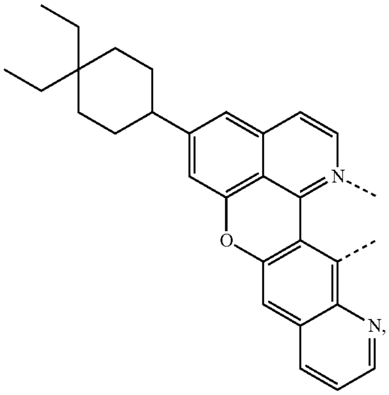
$L_{a532}$
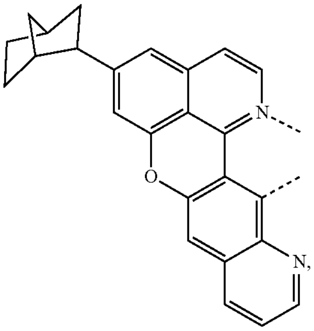
$L_{a533}$
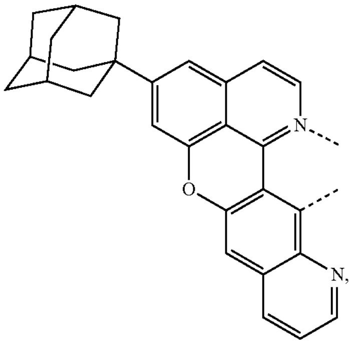
$L_{a534}$
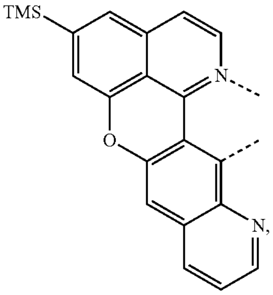
$L_{a535}$
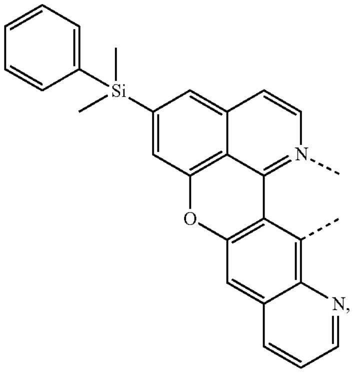
$L_{a536}$
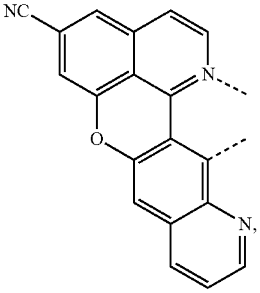
$L_{a537}$
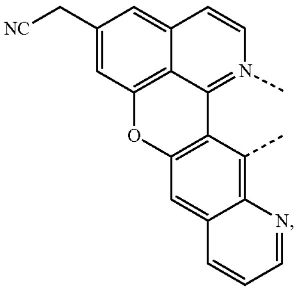
$L_{a538}$
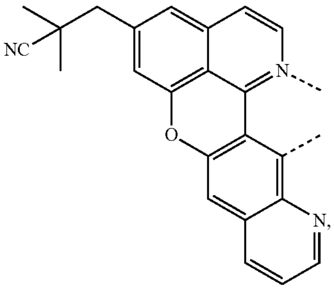

-continued
$L_{a539}$
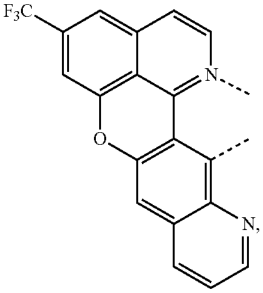
$L_{a540}$
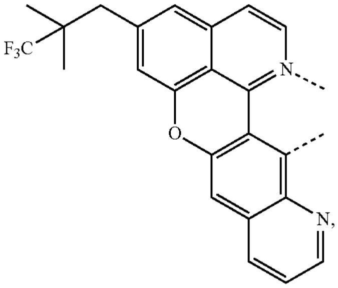
$L_{a541}$
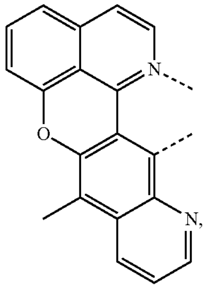
$L_{a542}$
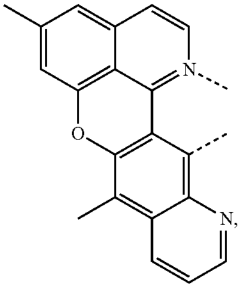
$L_{a543}$
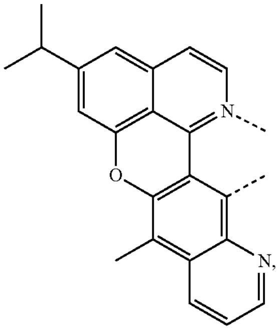
-continued
$L_{a544}$
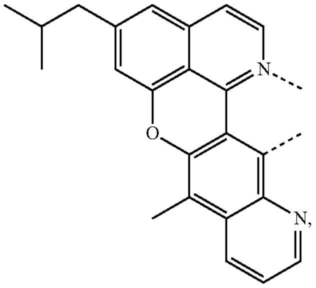
$L_{a545}$
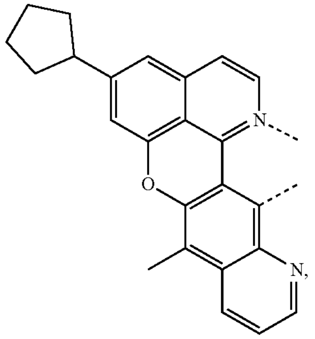
$L_{a546}$
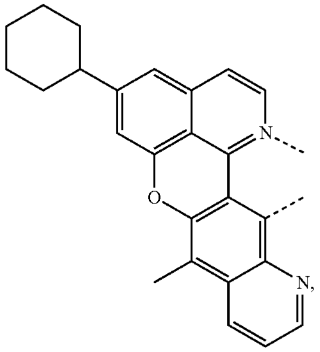
$L_{a547}$
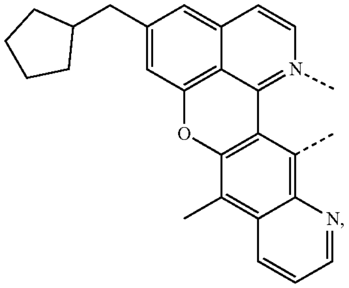
$L_{a548}$
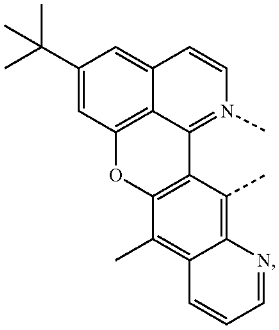

-continued
L$_{a549}$
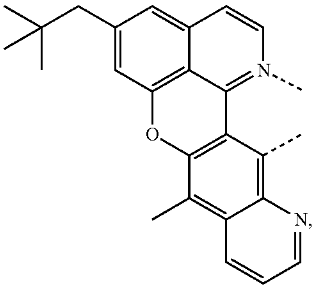
L$_{a550}$
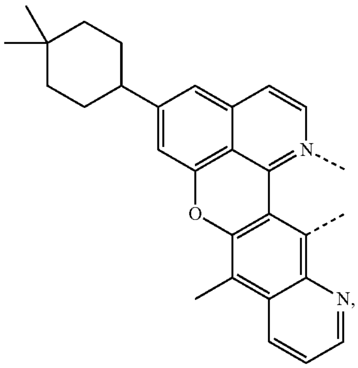
L$_{a551}$
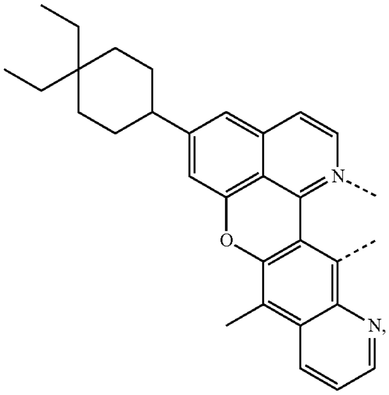
L$_{a552}$
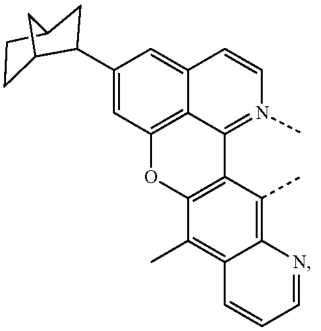
-continued
L$_{a553}$
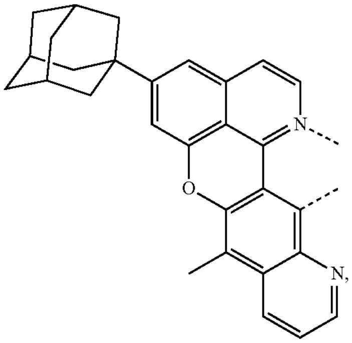
L$_{a554}$
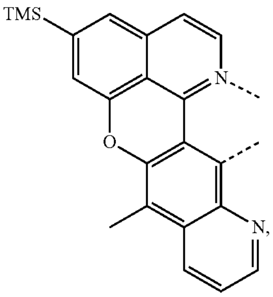
L$_{a555}$
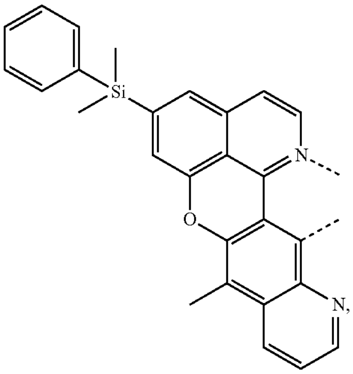
L$_{a556}$
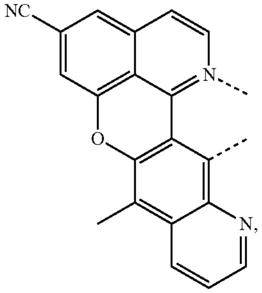
L$_{a557}$
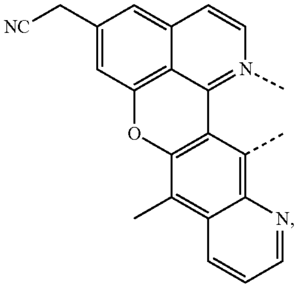

-continued
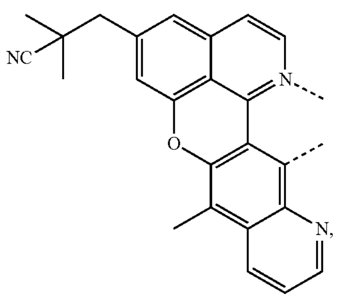
$L_{a558}$
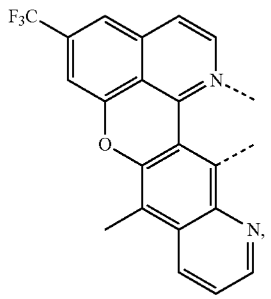
$L_{a559}$
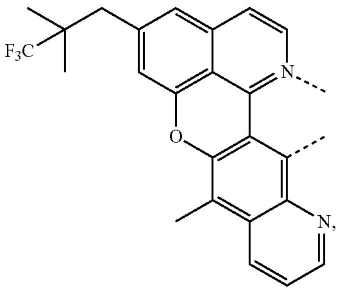
$L_{a560}$
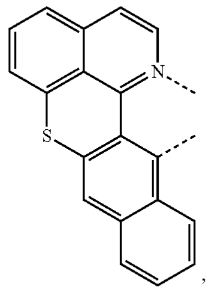
$L_{a641}$
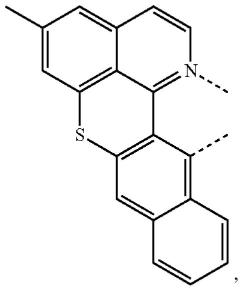
$L_{a642}$
-continued
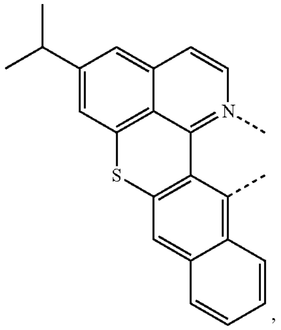
$L_{a643}$
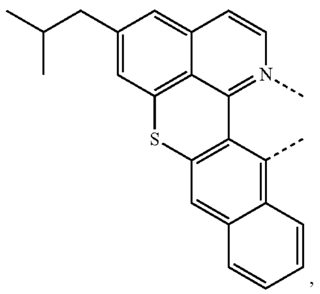
$L_{a644}$
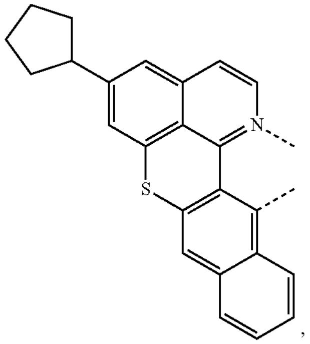
$L_{a645}$
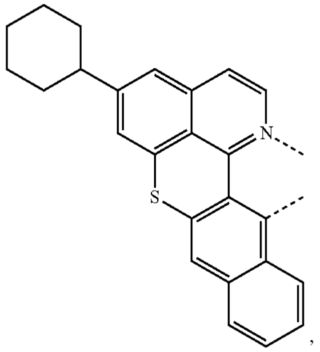
$L_{a646}$
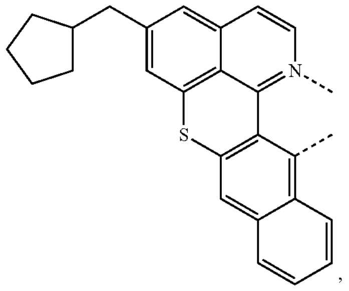
$L_{a647}$ -continued
L$_{a648}$
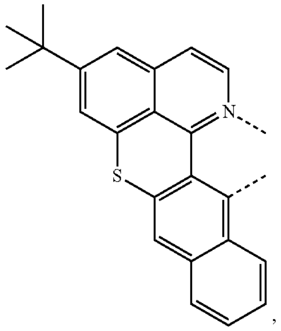
L$_{a649}$
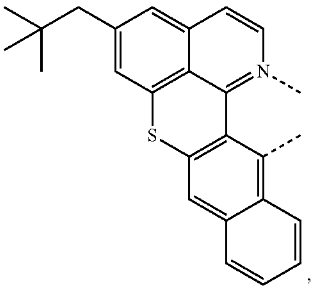
L$_{a650}$
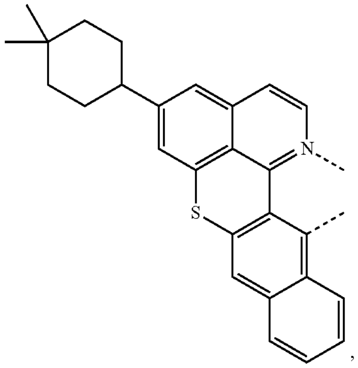
L$_{a651}$
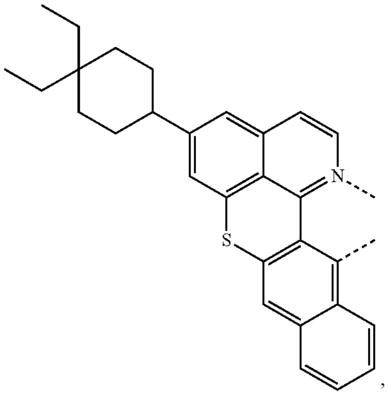
-continued
L$_{a652}$
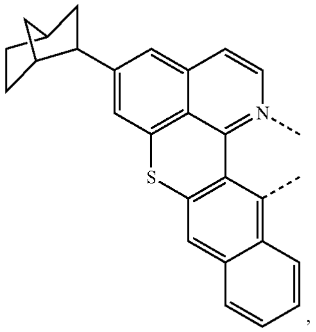
L$_{a653}$
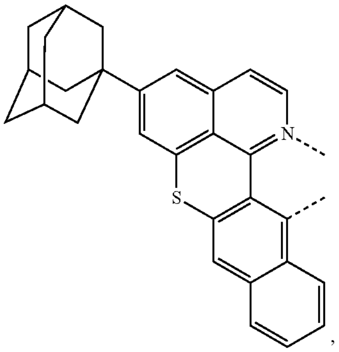
L$_{a654}$
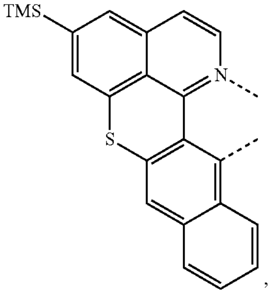
L$_{a655}$
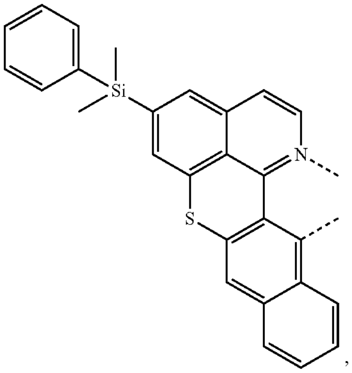

-continued
$L_{a656}$
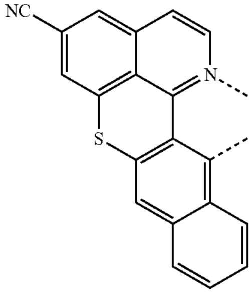
,
$L_{a657}$
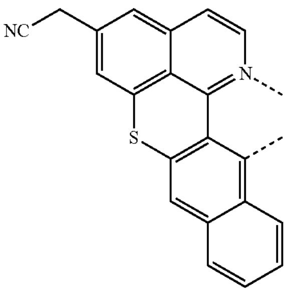
,
$L_{a658}$
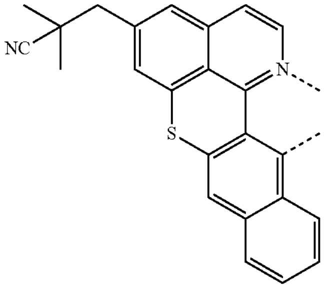
,
$L_{a659}$
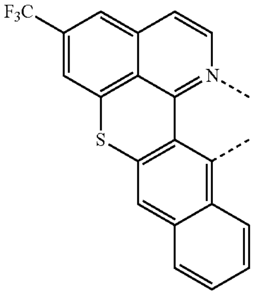
,
$L_{a660}$
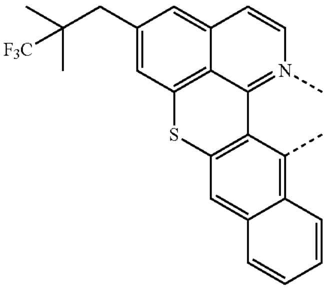
,
-continued
$L_{a661}$
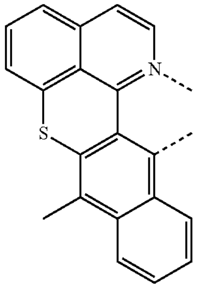
,
$L_{a662}$
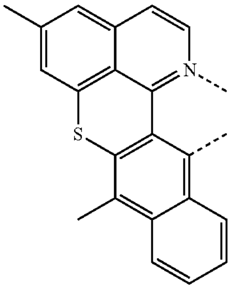
,
$L_{a663}$
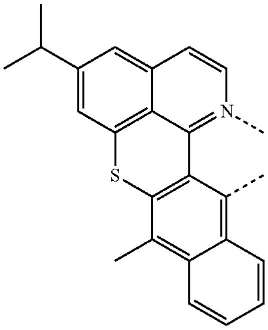
,
$L_{a664}$
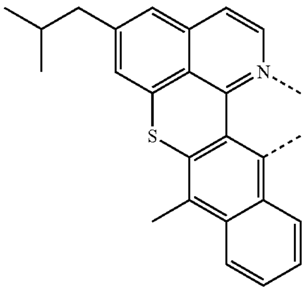
,
$L_{a665}$
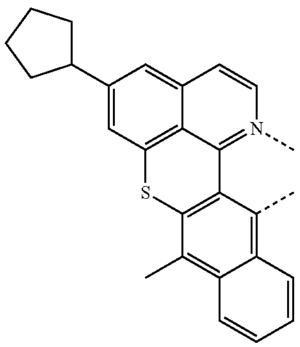
, -continued
$L_{a666}$
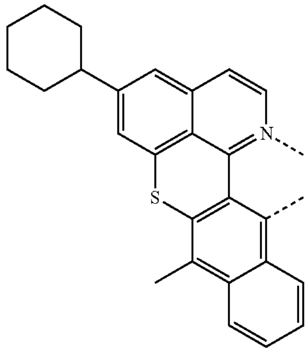
,
$L_{a667}$
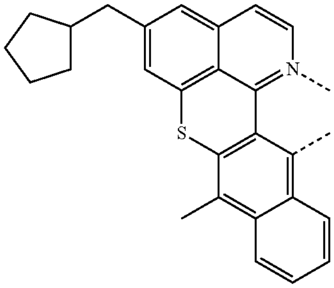
,
$L_{a668}$
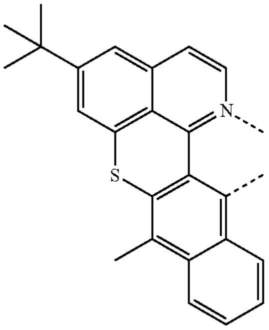
,
$L_{a669}$
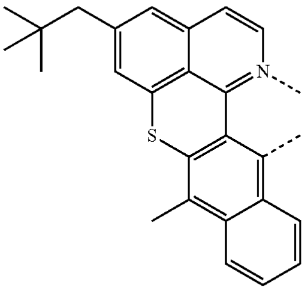
,
-continued
$L_{a670}$
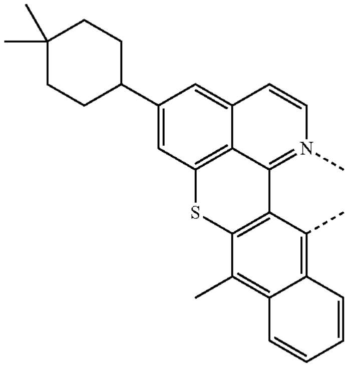
,
$L_{a671}$
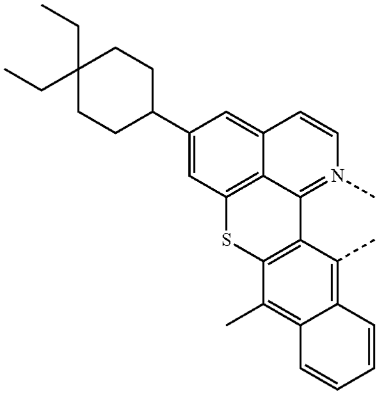
,
$L_{a672}$
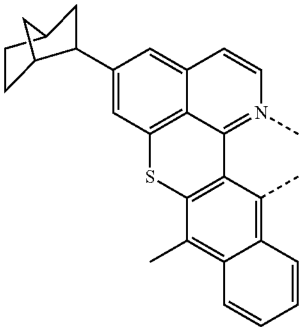
,
$L_{a673}$
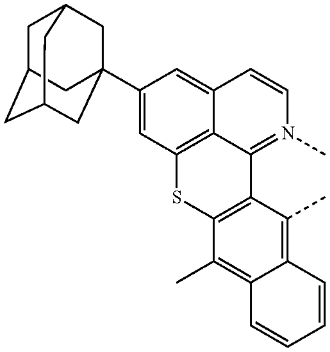
, -continued
$L_{a674}$
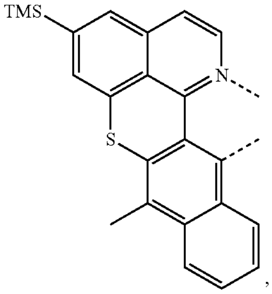
,
$L_{a675}$
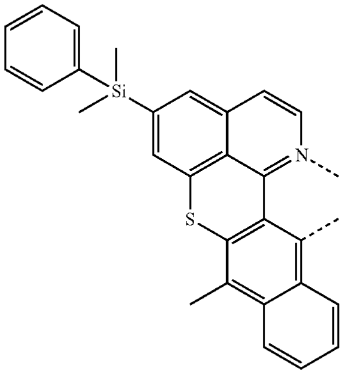
,
$L_{a676}$
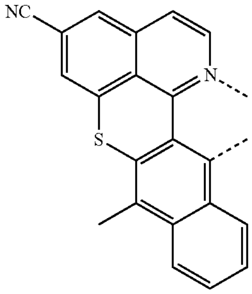
,
$L_{a677}$
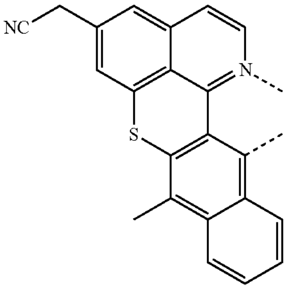
,
$L_{a678}$
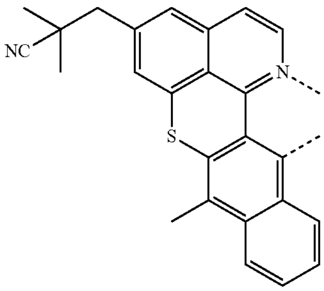
,
-continued
$L_{a679}$
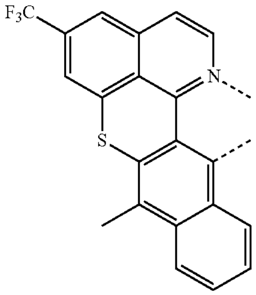
,
$L_{a680}$
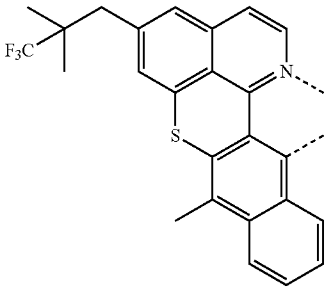
,
$L_{a681}$
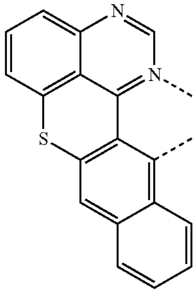
,
$L_{a682}$
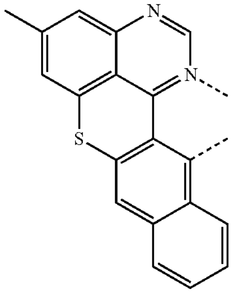
,
$L_{a683}$
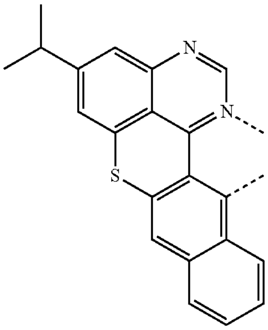
, -continued
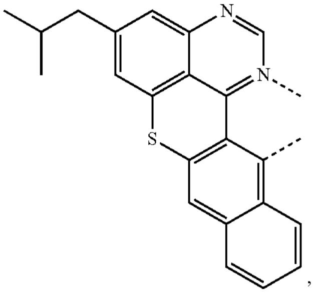
$L_{a684}$
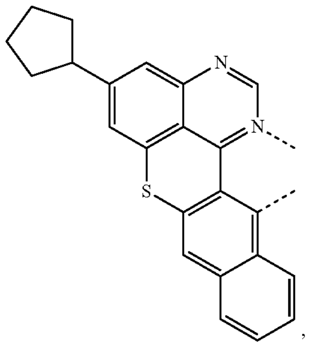
$L_{a685}$
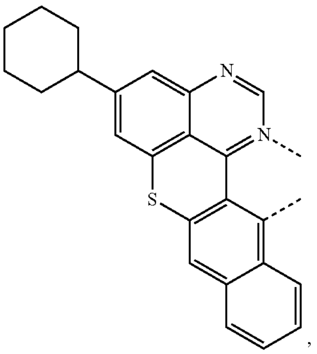
$L_{a686}$
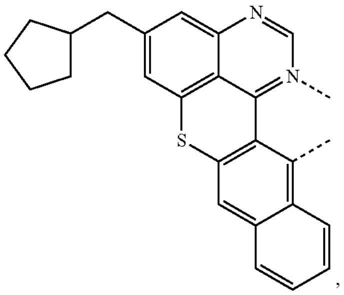
$L_{a687}$
-continued
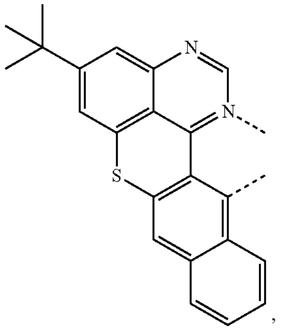
$L_{a688}$
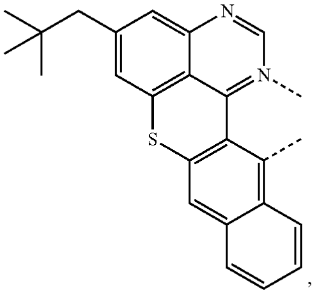
$L_{a689}$
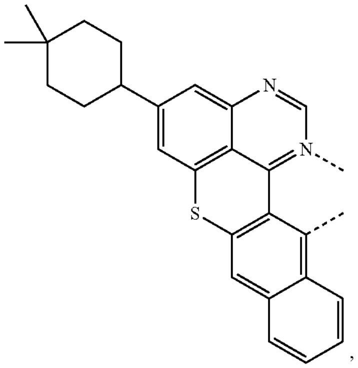
$L_{a690}$
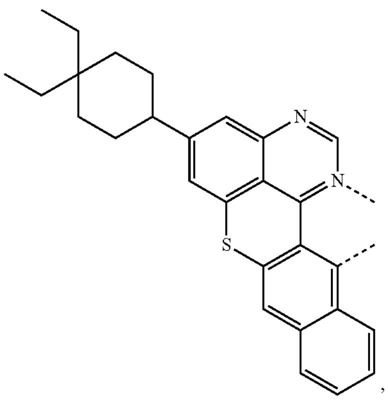
$L_{a691}$ -continued
$L_{a692}$
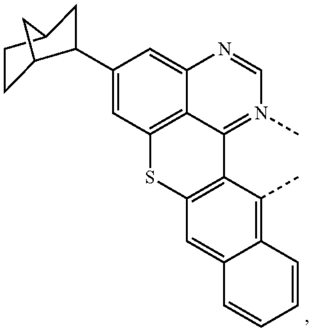
$L_{a693}$
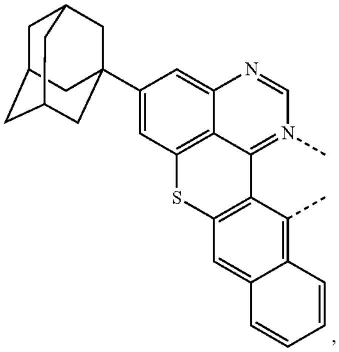
$L_{a694}$
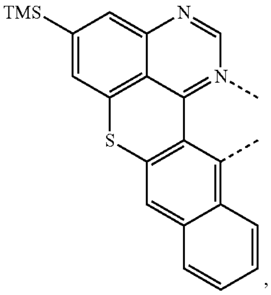
$L_{a695}$
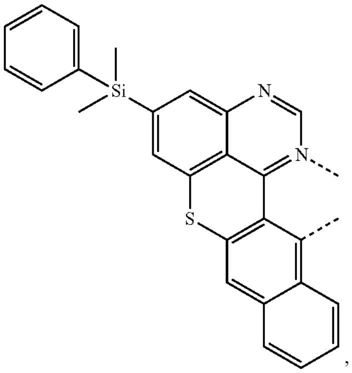
-continued
$L_{a696}$
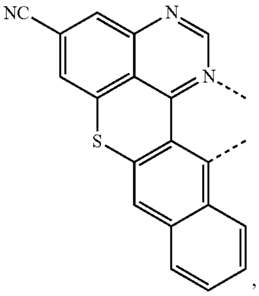
$L_{a697}$
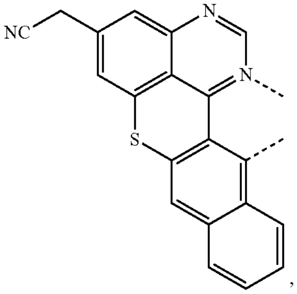
$L_{a698}$
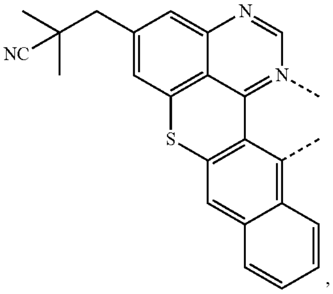
$L_{a699}$
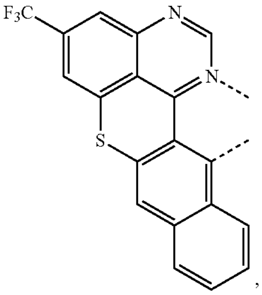
$L_{a700}$
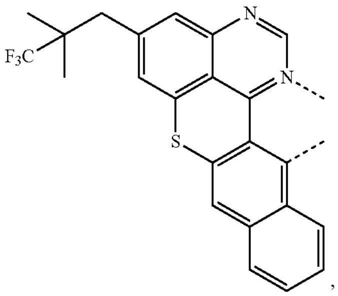

-continued
$L_{a701}$
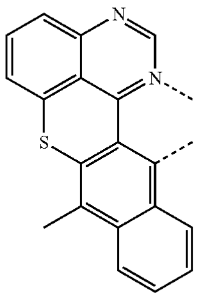
,
$L_{a702}$
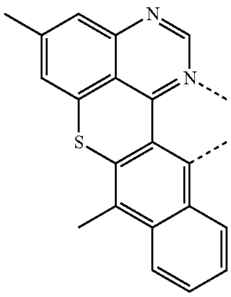
,
$L_{a703}$
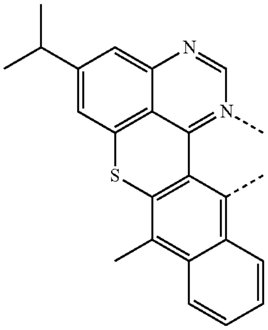
,
$L_{a704}$
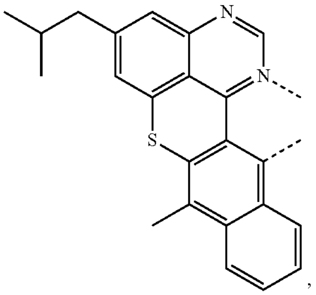
,
$L_{a705}$
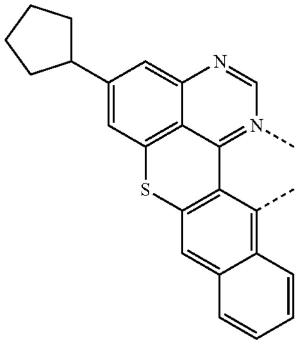
,
-continued
$L_{a706}$
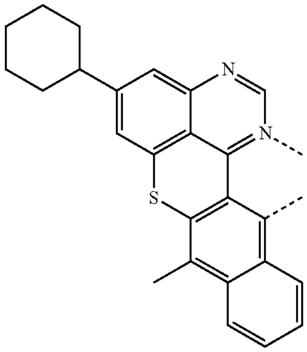
,
$L_{a707}$
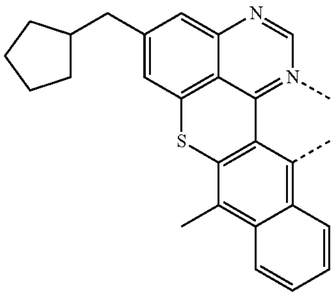
,
$L_{a708}$
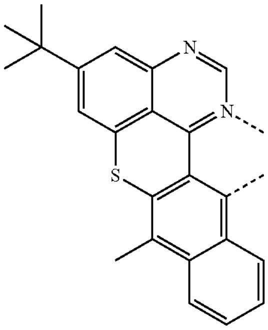
,
$L_{a709}$
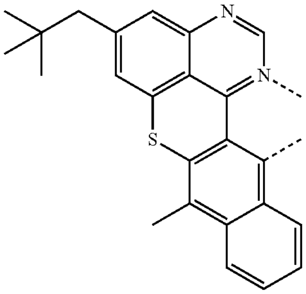
, -continued
$L_{a710}$
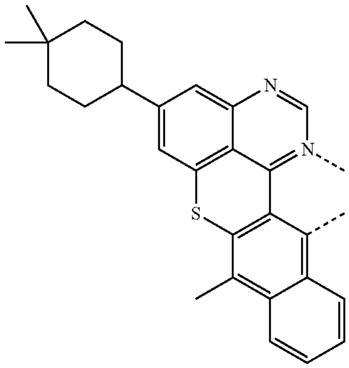
,
$L_{a711}$
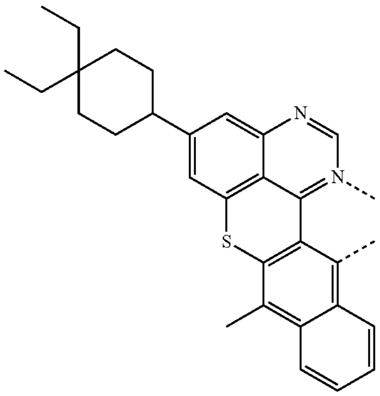
,
$L_{a712}$
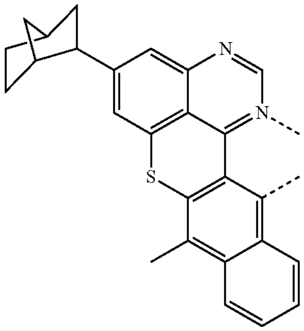
,
$L_{a713}$
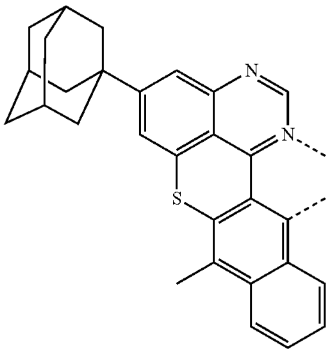
,
-continued
$L_{a714}$
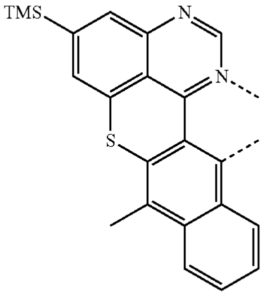
,
$L_{a715}$
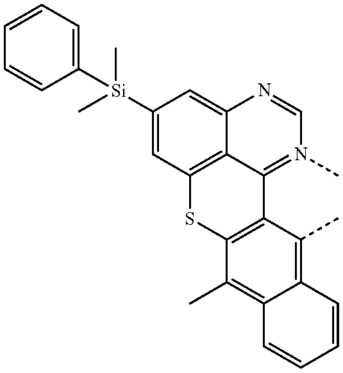
,
$L_{a716}$
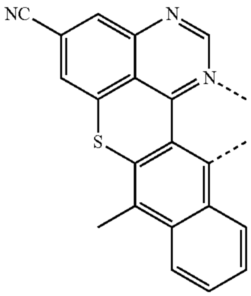
,
$L_{a717}$
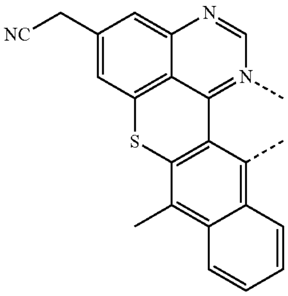
,
$L_{a718}$
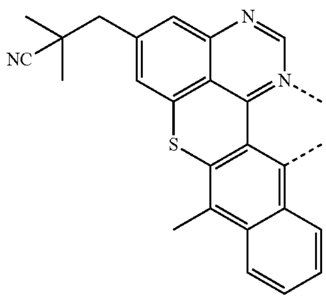
, -continued
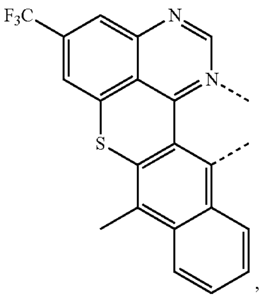
$L_{a719}$
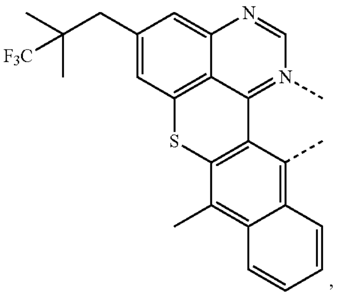
$L_{a720}$
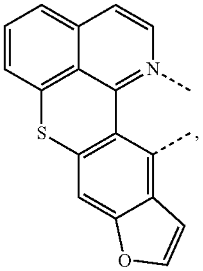
$L_{a721}$
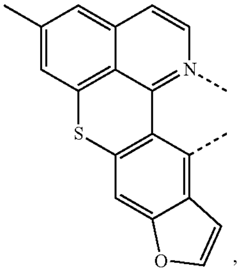
$L_{a722}$
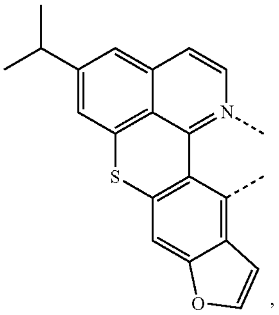
$L_{a723}$
-continued
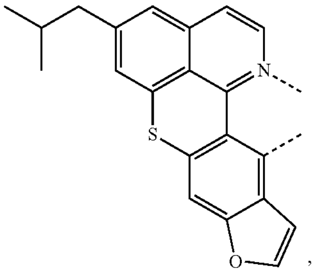
$L_{a724}$
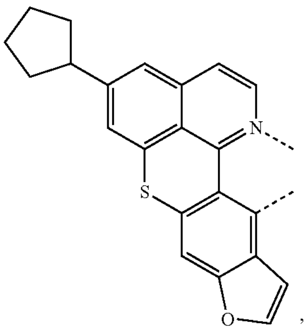
$L_{a725}$
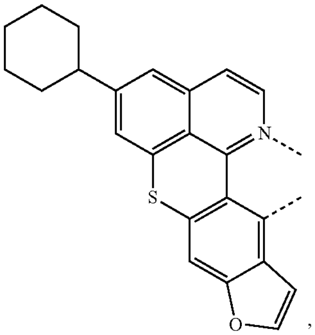
$L_{a726}$
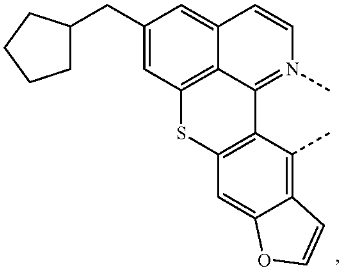
$L_{a727}$
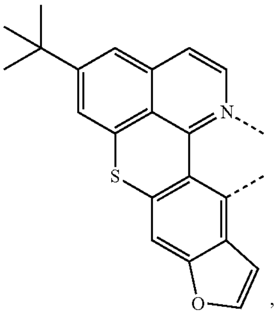
$L_{a728}$ -continued
$L_{a729}$
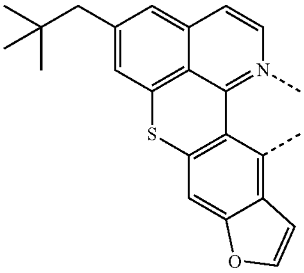
,
$L_{a730}$
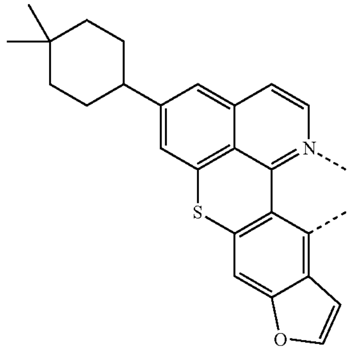
,
$L_{a731}$
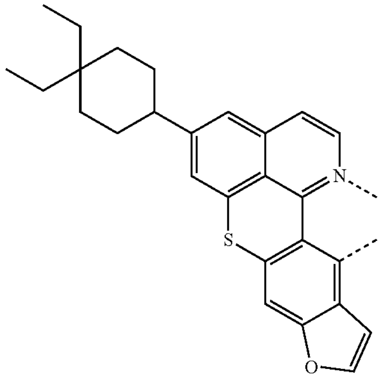
,
$L_{a732}$
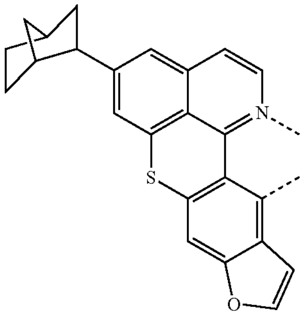
,
-continued
$L_{a733}$
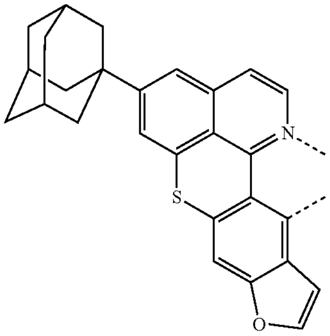
,
$L_{a734}$
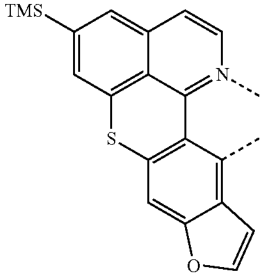
,
$L_{a735}$
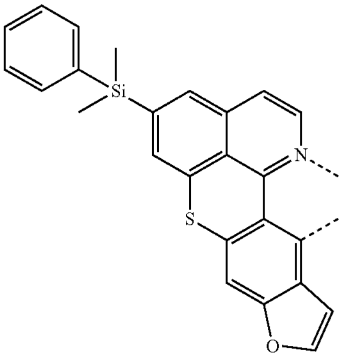
,
$L_{a736}$
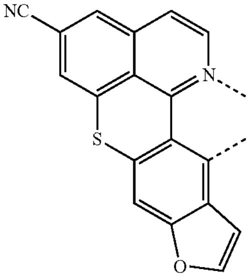
,
$L_{a737}$
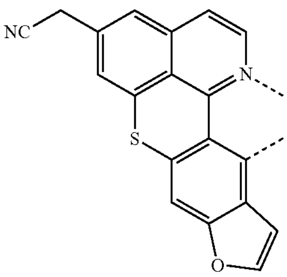
, -continued
$L_{a738}$
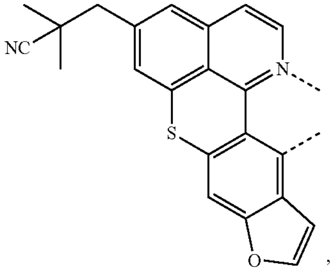
$L_{a739}$
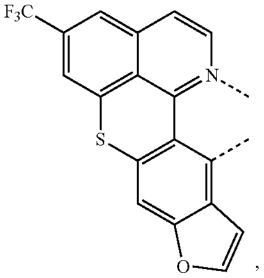
$L_{a740}$
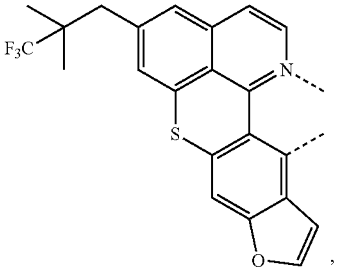
$L_{a741}$
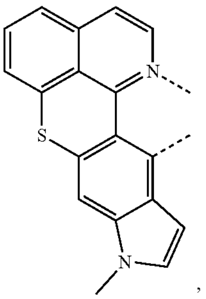
$L_{a742}$
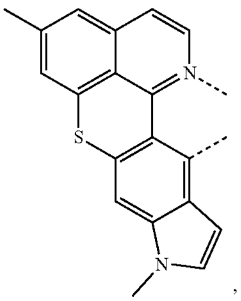
-continued
$L_{a743}$
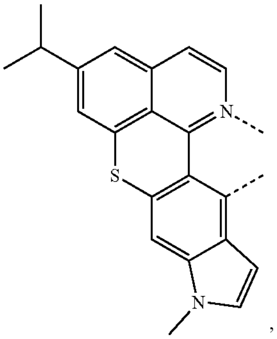
$L_{a744}$
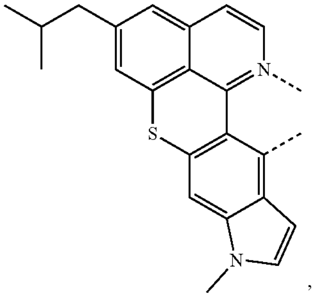
$L_{a745}$
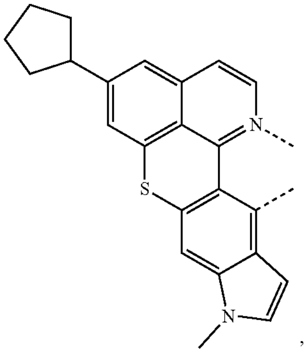
$L_{a746}$
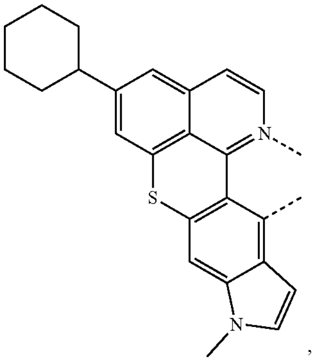

-continued
$L_{a747}$
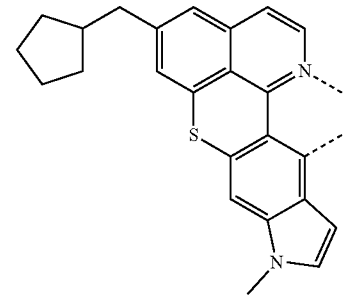
,
$L_{a748}$
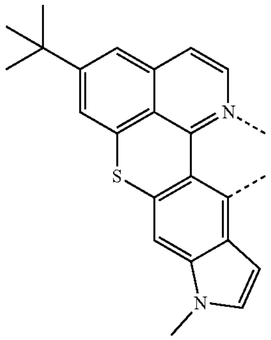
,
$L_{a749}$
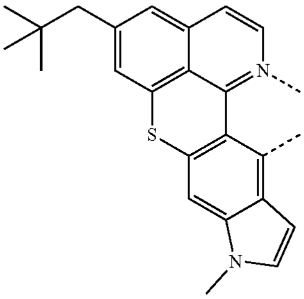
,
$L_{a750}$
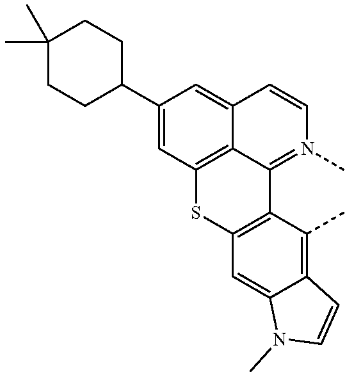
,
-continued
$L_{a751}$
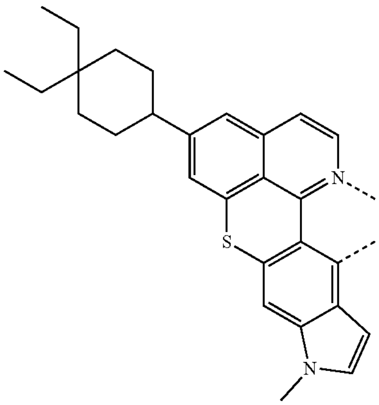
,
$L_{a752}$
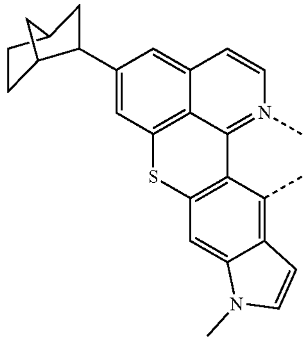
,
$L_{a753}$
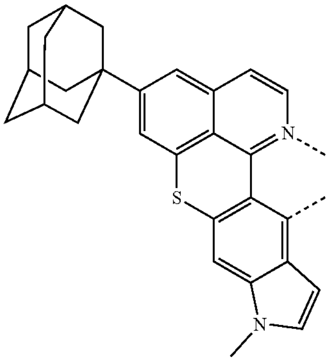
,
$L_{a754}$
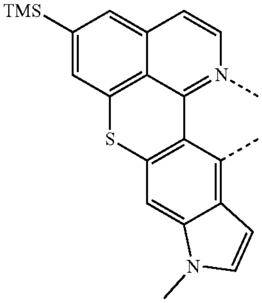
, -continued
$L_{a755}$
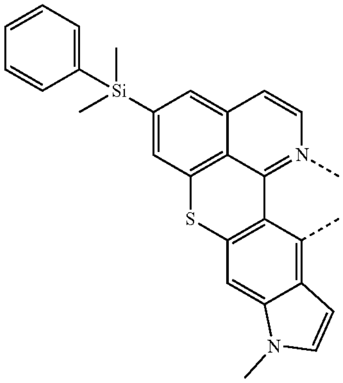
,
$L_{a756}$
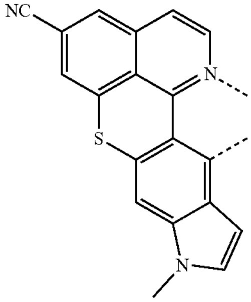
,
$L_{a757}$
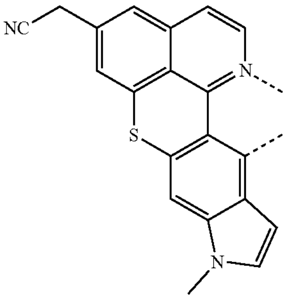
,
$L_{a758}$
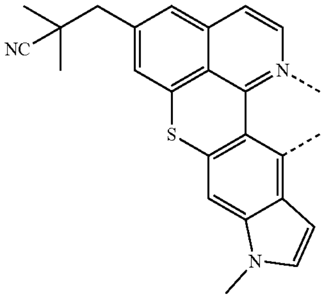
,
$L_{a759}$
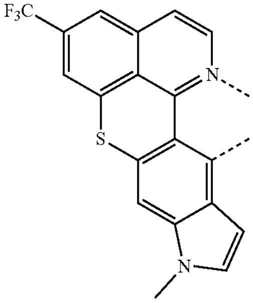
,
-continued
$L_{a760}$
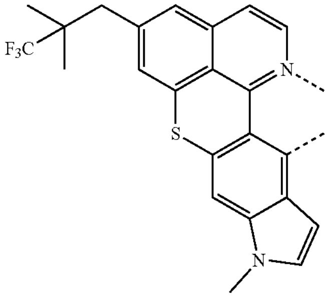
,
$L_{a761}$
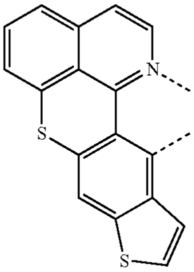
,
$L_{a762}$
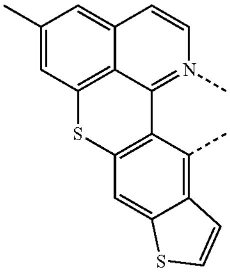
,
$L_{a763}$
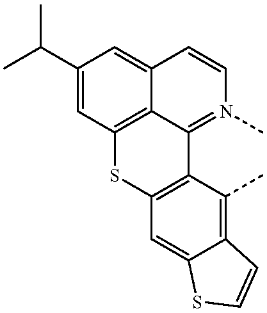
,
$L_{a764}$
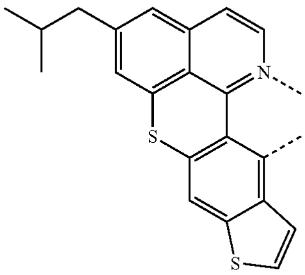
, -continued
$L_{a765}$
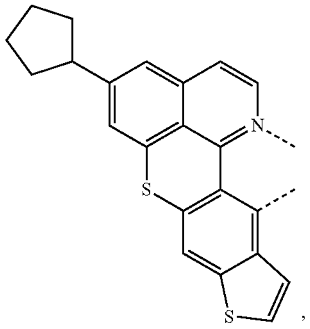
$L_{a766}$
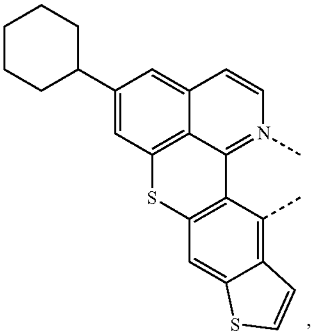
$L_{a767}$
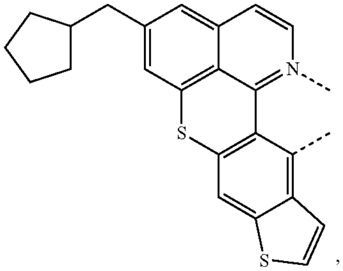
$L_{a768}$
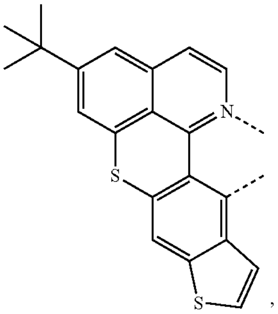
$L_{a769}$
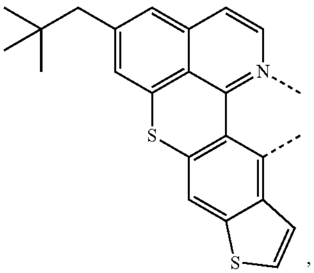
-continued
$L_{a770}$
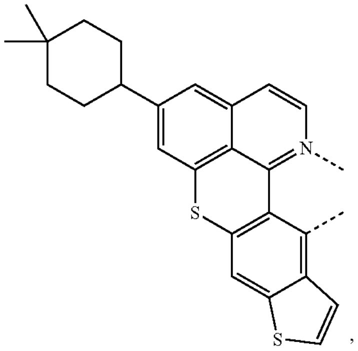
$L_{a771}$
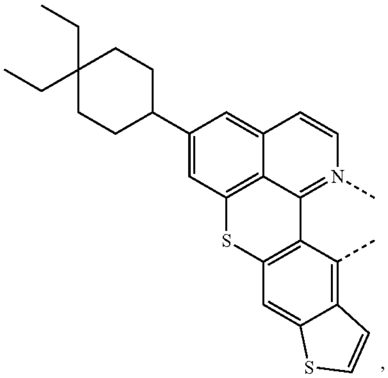
$L_{a772}$
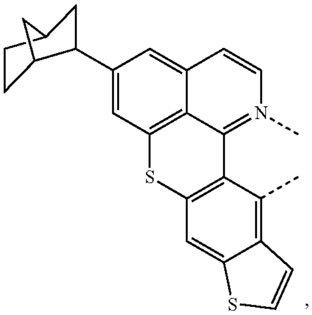
$L_{a773}$
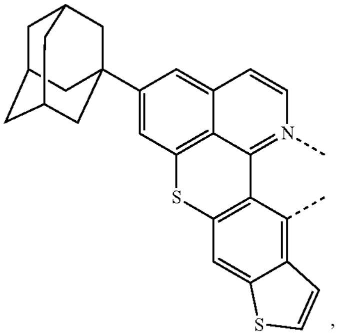

-continued
$L_{a774}$
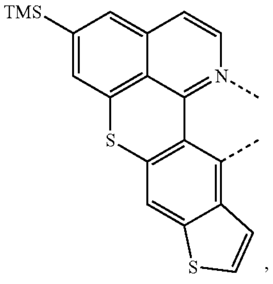
$L_{a775}$
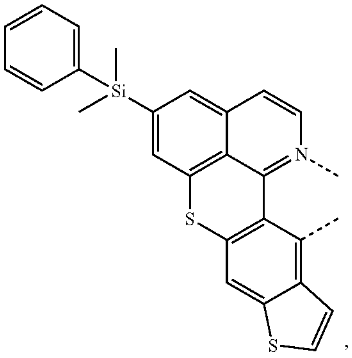
$L_{a776}$
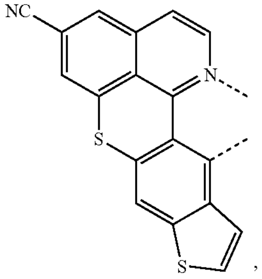
$L_{a777}$
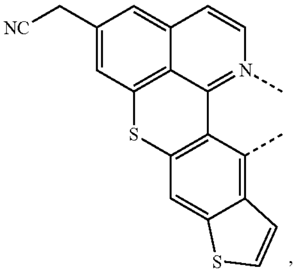
$L_{a778}$
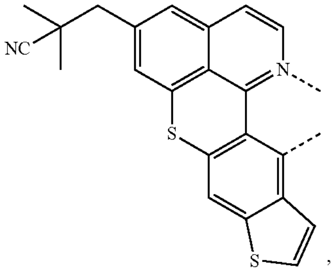
-continued
$L_{a779}$
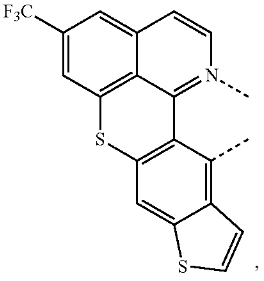
$L_{a780}$
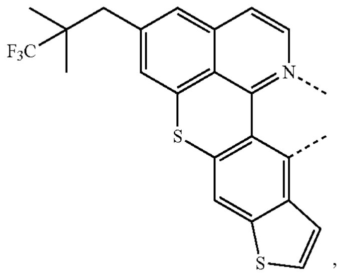
$L_{a781}$
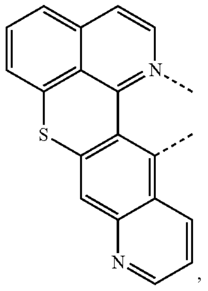
$L_{a782}$
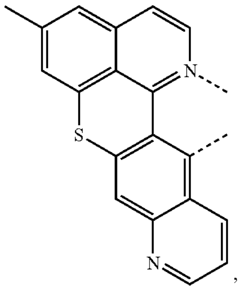
$L_{a783}$
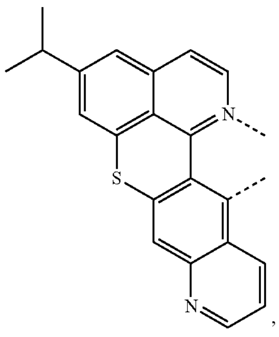

-continued
$L_{a784}$
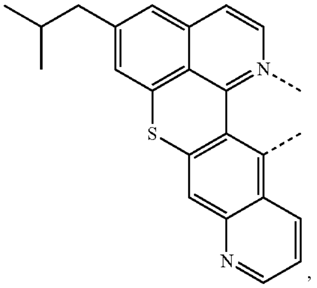
$L_{a785}$
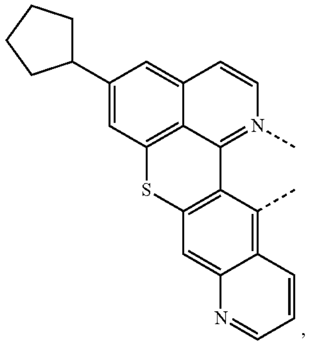
$L_{a786}$
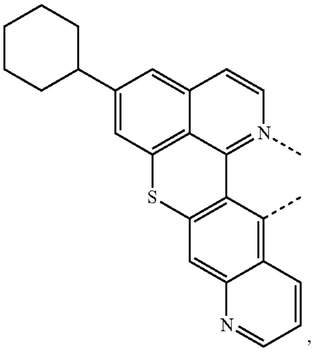
$L_{a787}$
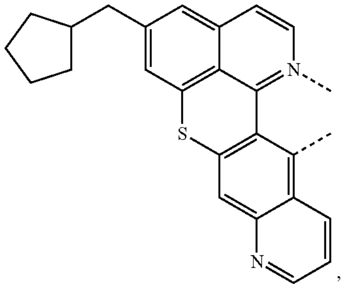
$L_{a788}$
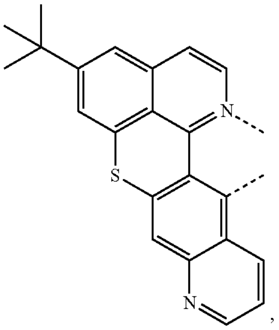
-continued
$L_{a789}$
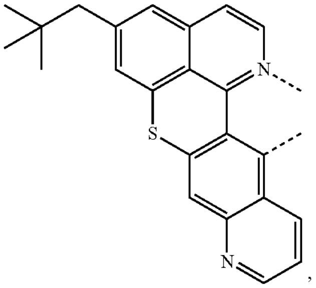
$L_{a790}$
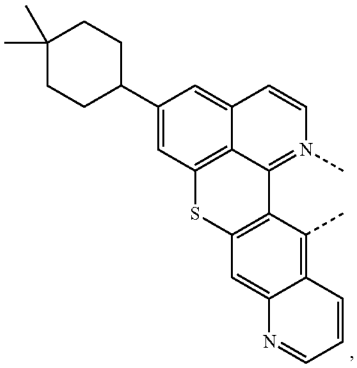
$L_{a791}$
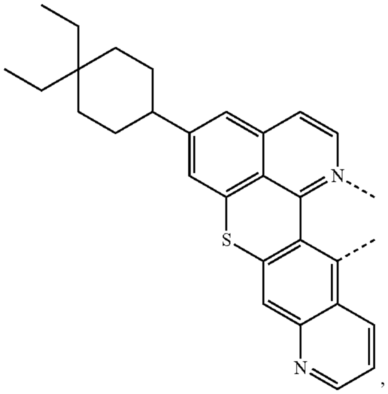
$L_{a792}$
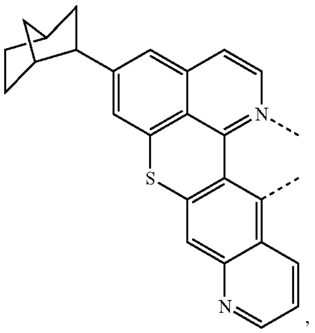

-continued
$L_{a793}$
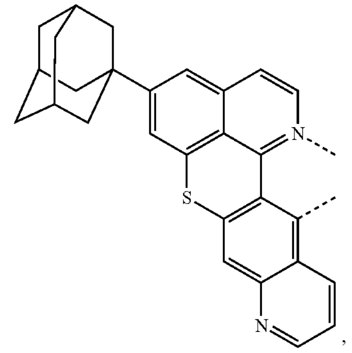
$L_{a794}$
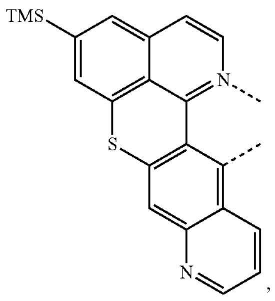
$L_{a795}$
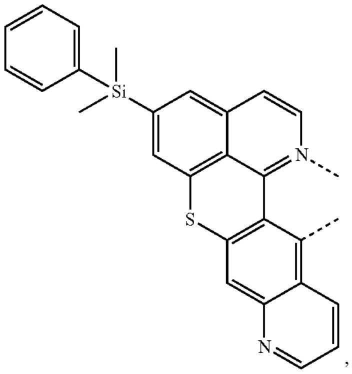
$L_{a796}$
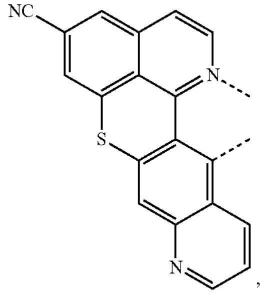
$L_{a797}$
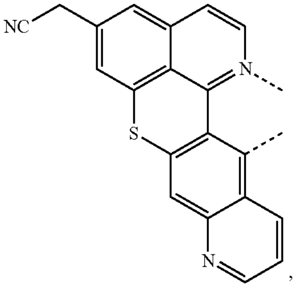
-continued
$L_{a798}$
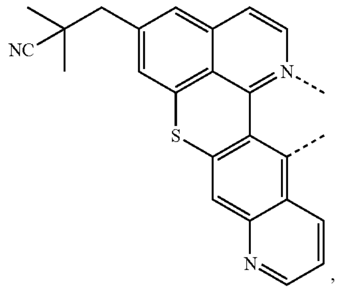
$L_{a799}$
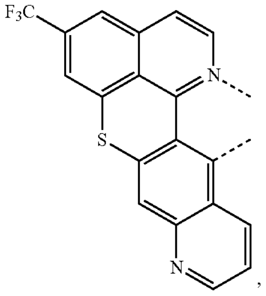
$L_{a800}$
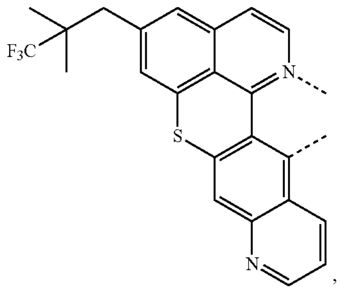
$L_{a801}$
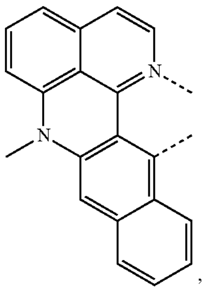
$L_{a802}$
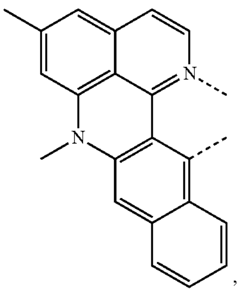

-continued
$L_{a803}$
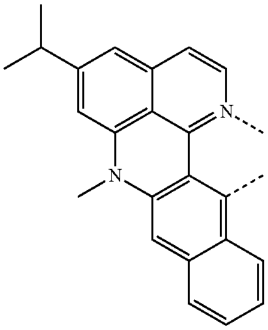
,
$L_{a804}$
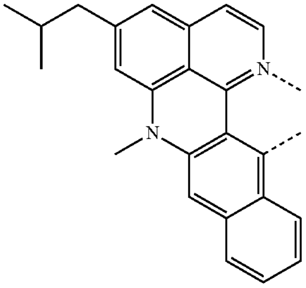
,
$L_{a805}$
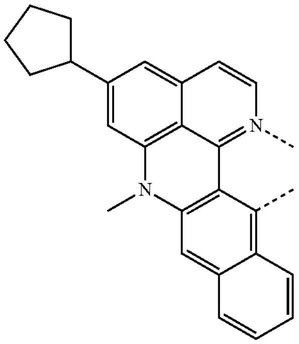
,
$L_{a806}$
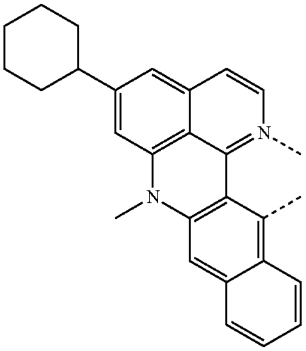
,
$L_{a807}$
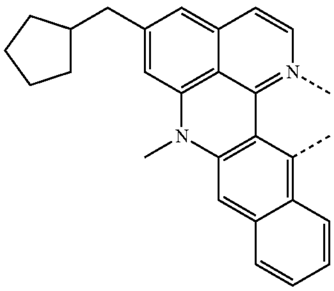
,
-continued
$L_{a808}$
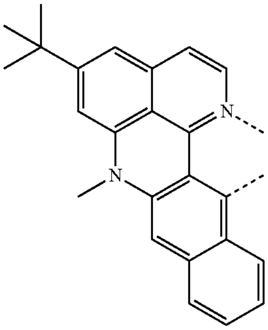
,
$L_{a809}$
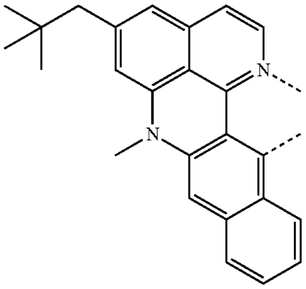
,
$L_{a810}$
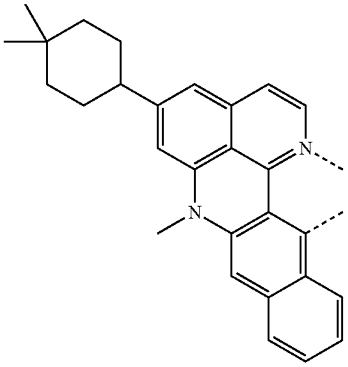
,
$L_{a811}$
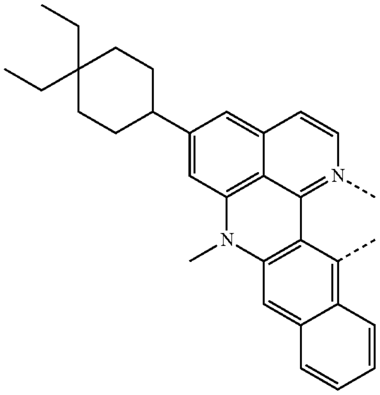
, -continued
$L_{a812}$
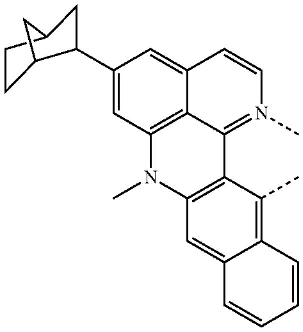
,
$L_{a813}$
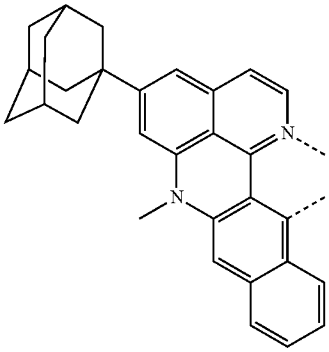
,
$L_{a814}$
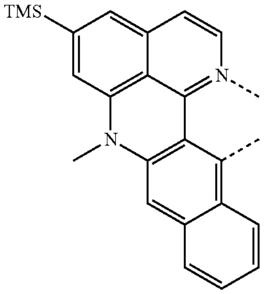
,
$L_{a815}$
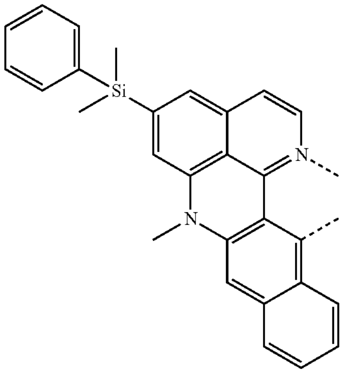
,
-continued
$L_{a816}$
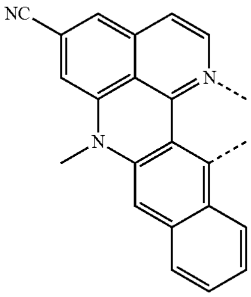
,
$L_{a817}$
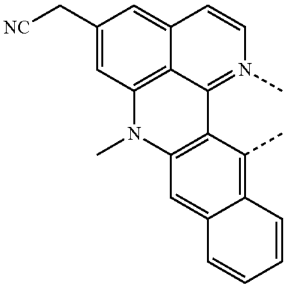
,
$L_{a818}$
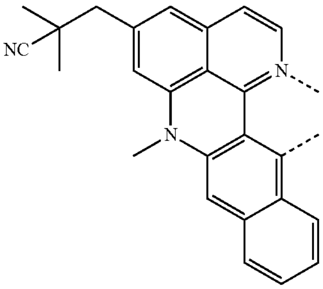
,
$L_{a819}$
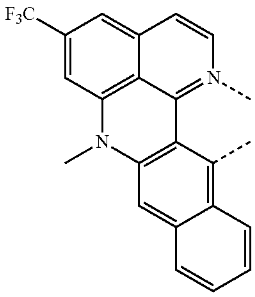
,
$L_{a820}$
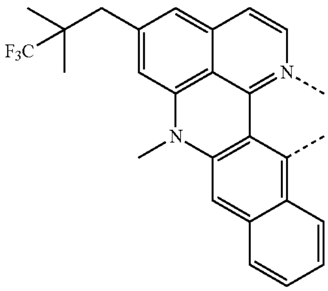
, $L_{a821}$
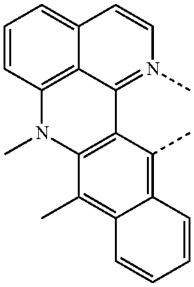
,
$L_{a822}$
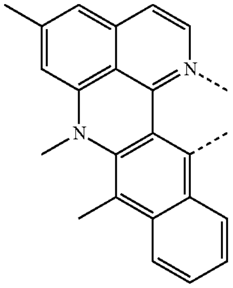
,
$L_{a823}$
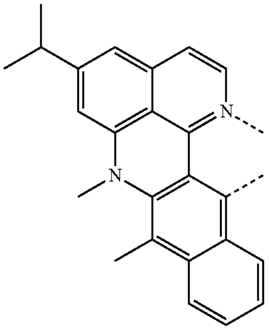
,
$L_{a824}$
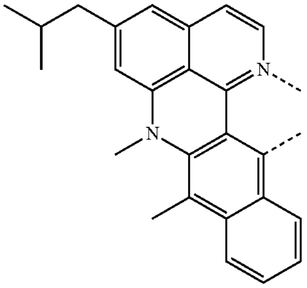
,
$L_{a825}$
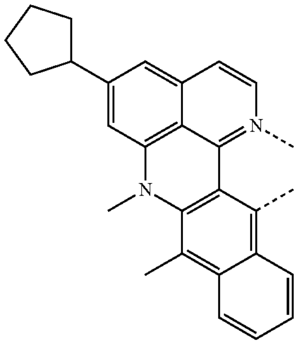
,
$L_{a826}$
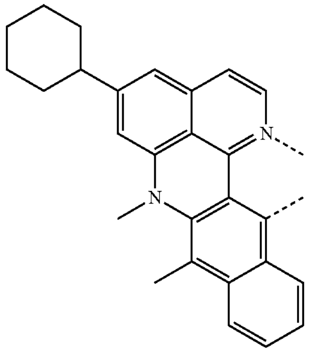
,
$L_{a827}$
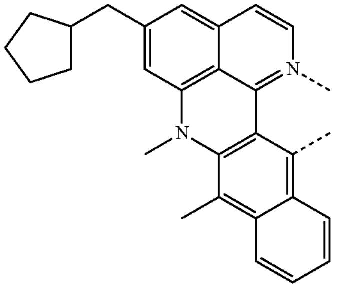
,
$L_{a828}$
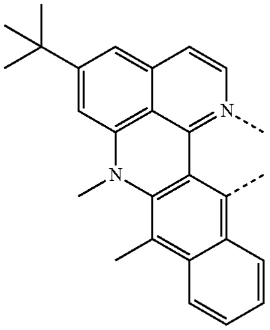
,
$L_{a829}$
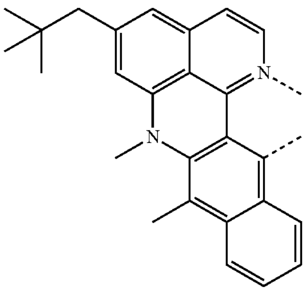
, -continued
$L_{a830}$
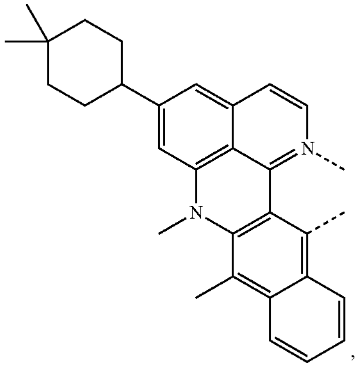
$L_{a831}$
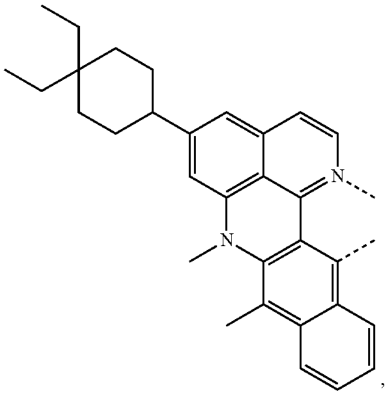
$L_{a832}$
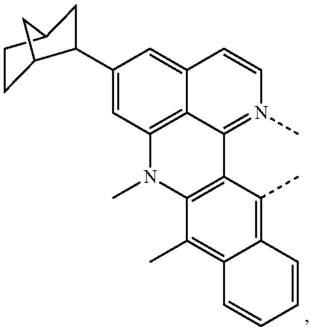
$L_{a833}$
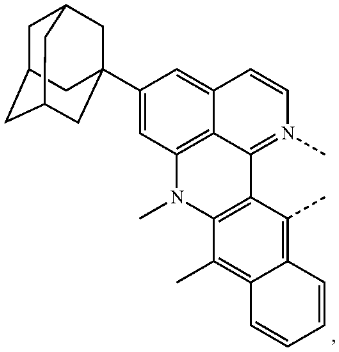
-continued
$L_{a834}$
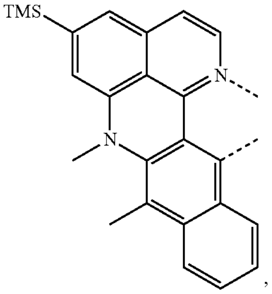
$L_{a835}$
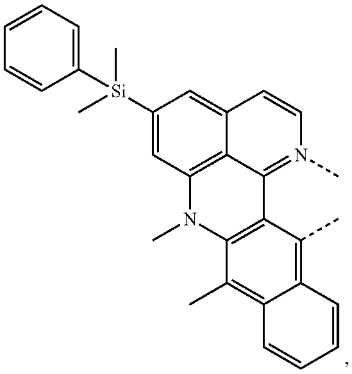
$L_{a836}$
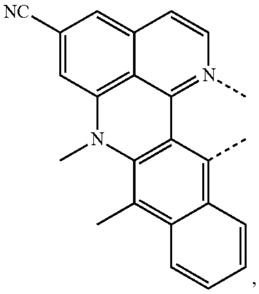
$L_{a837}$
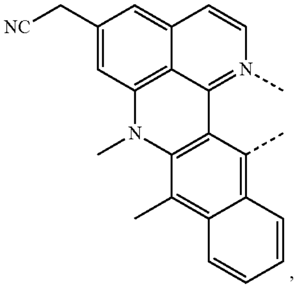
$L_{a838}$
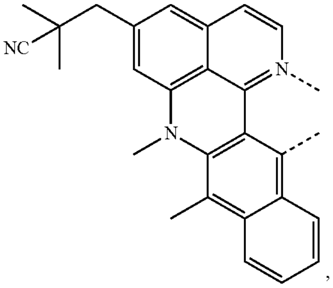

$L_{a839}$
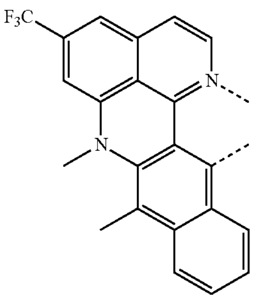,
$L_{a840}$
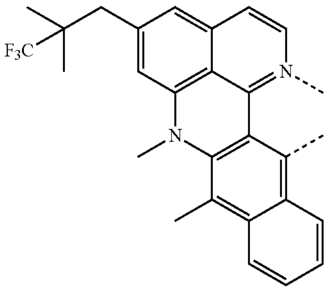,
$L_{a841}$
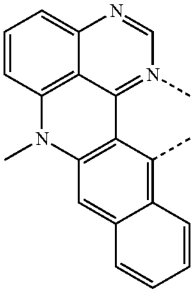,
$L_{a842}$
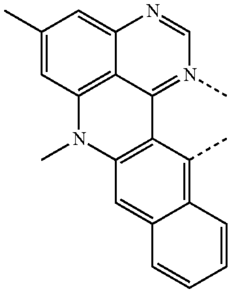,
$L_{a843}$
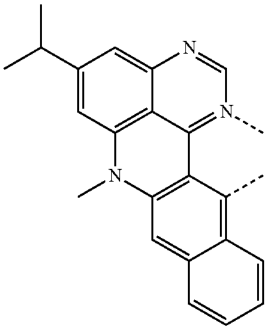,
$L_{a844}$
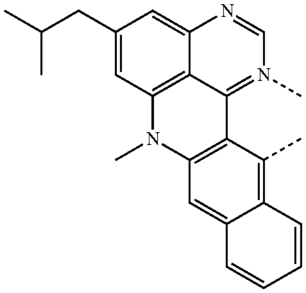,
$L_{a845}$
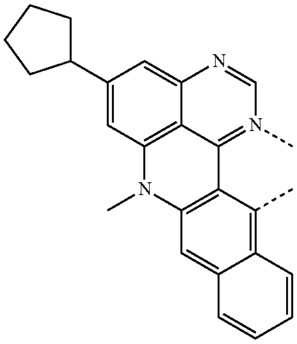,
$L_{a846}$
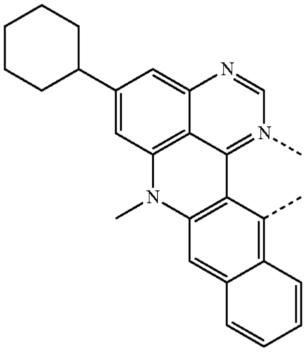,
$L_{a847}$
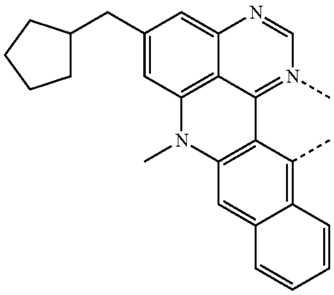, L$_{a848}$
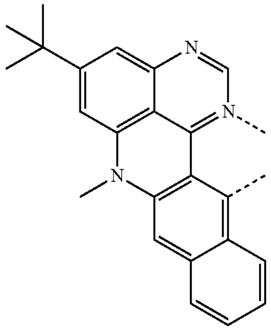
,
L$_{a849}$
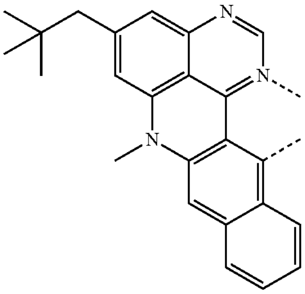
,
L$_{a850}$
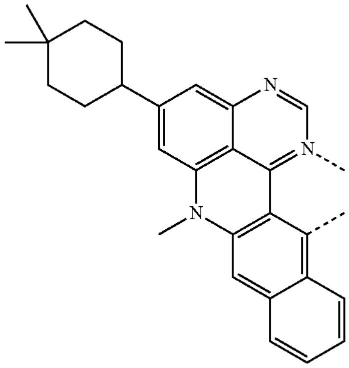
,
L$_{a851}$
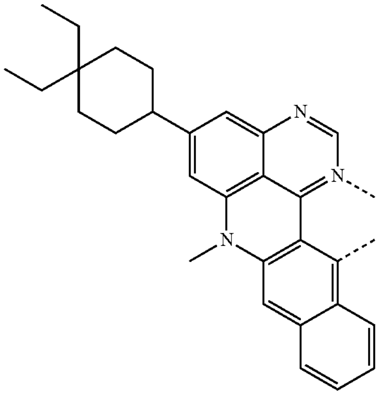
,
L$_{a852}$
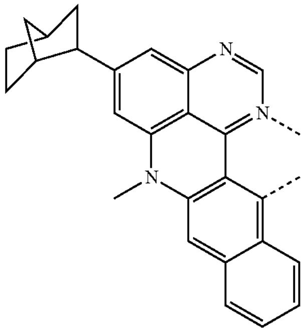
,
L$_{a853}$
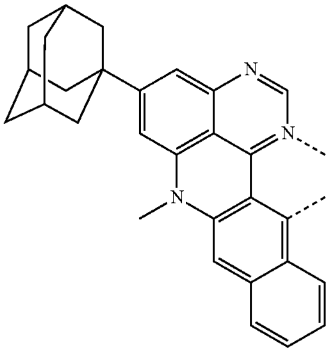
,
L$_{a854}$
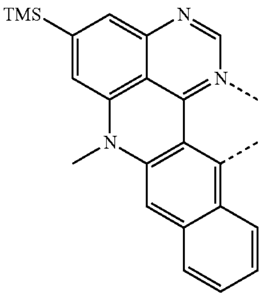
,
L$_{a855}$
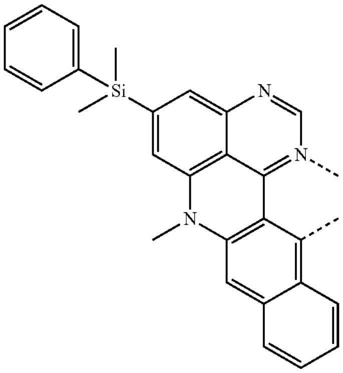
, -continued
$L_{a856}$
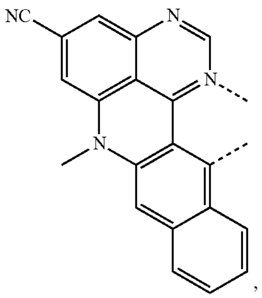
$L_{a857}$
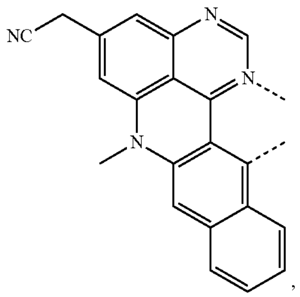
$L_{a858}$
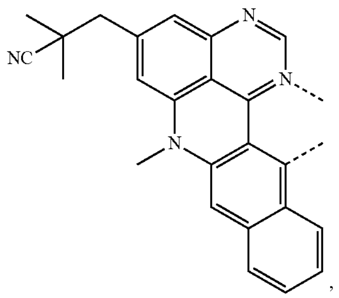
$L_{a859}$
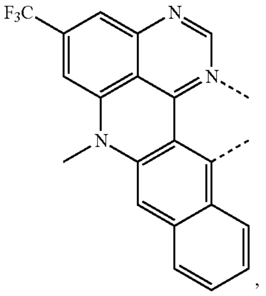
$L_{a860}$
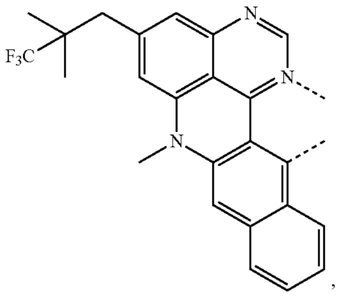
-continued
$L_{a861}$
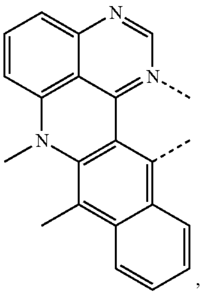
$L_{a862}$
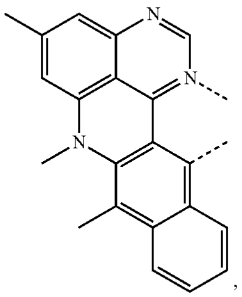
$L_{a863}$
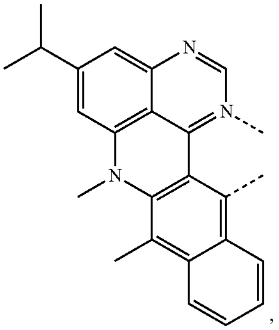
$L_{a864}$
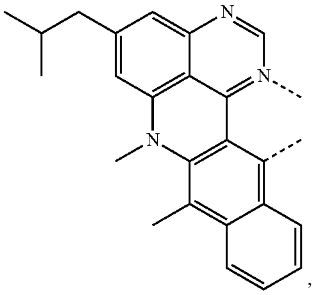
$L_{a865}$
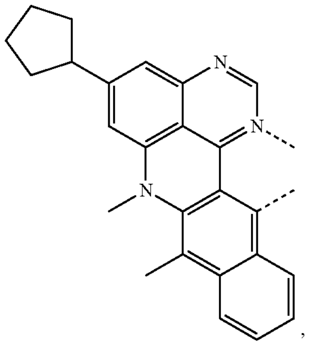

-continued
$L_{a866}$
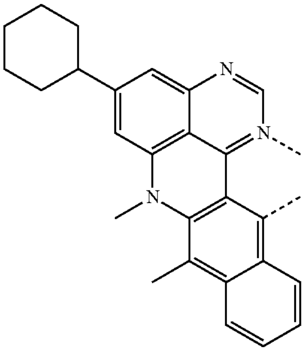
,
$L_{a867}$
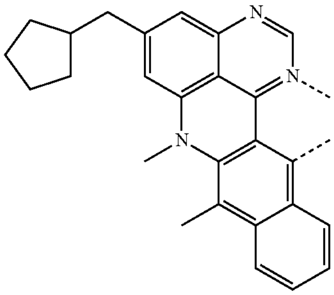
,
$L_{a868}$
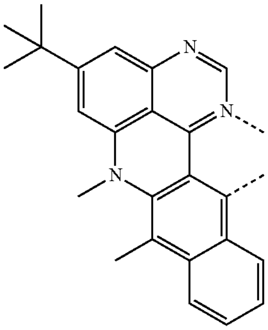
,
$L_{a869}$
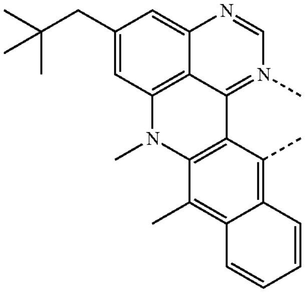
,
-continued
$L_{a870}$
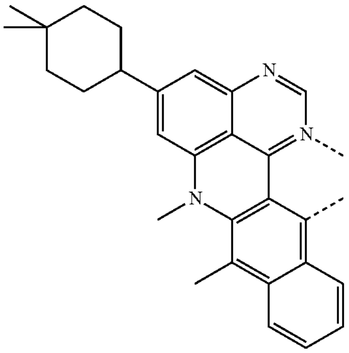
,
$L_{a871}$
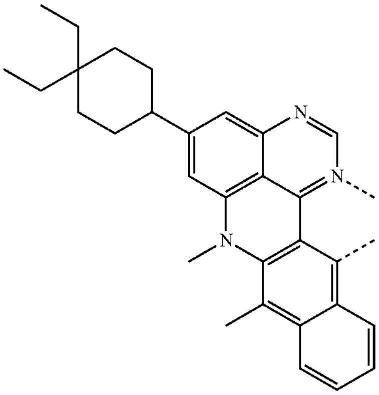
,
$L_{a872}$
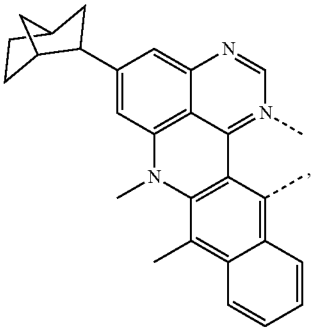
,
$L_{a873}$
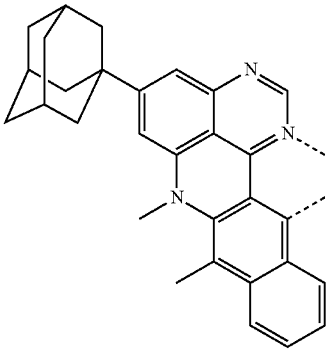
, -continued
$L_{a874}$
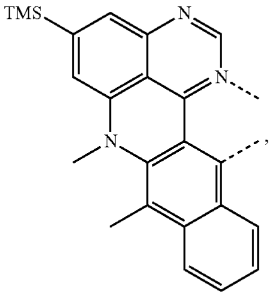
$L_{a875}$
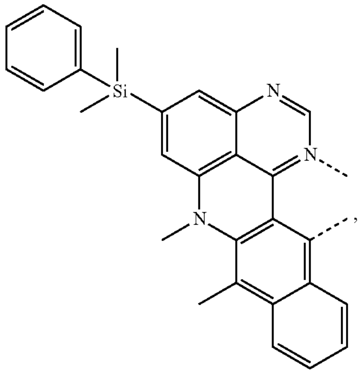
$L_{a876}$
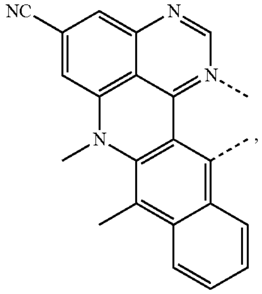
$L_{a877}$
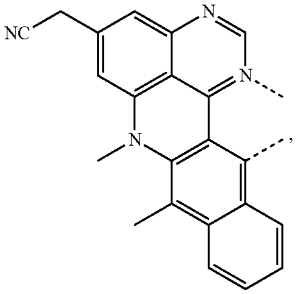
-continued
$L_{a878}$
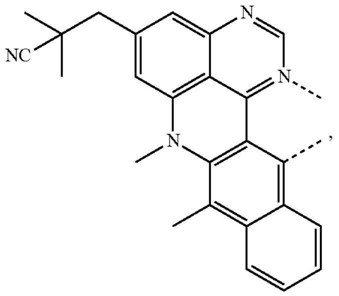
$L_{a879}$
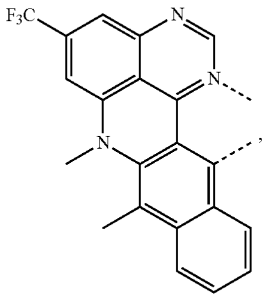
$L_{a880}$
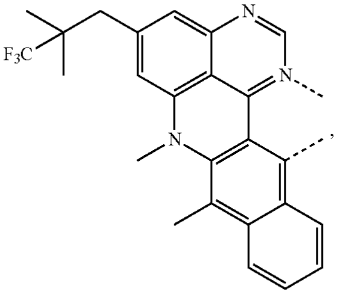
$L_{a881}$
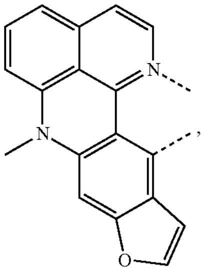
$L_{a882}$
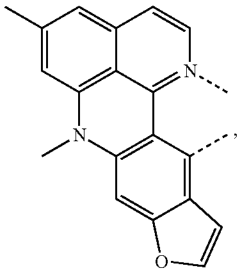

-continued
$L_{a883}$
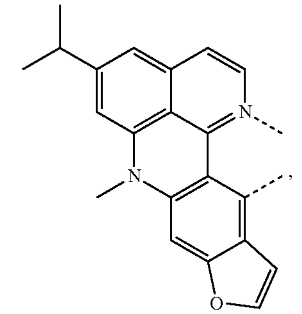
$L_{a884}$
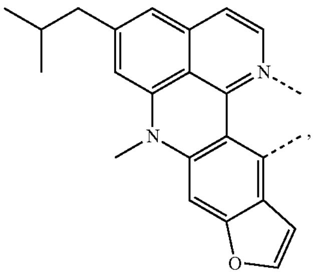
$L_{a885}$
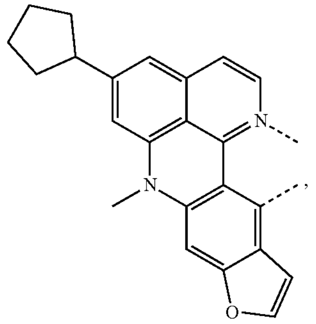
$L_{a886}$
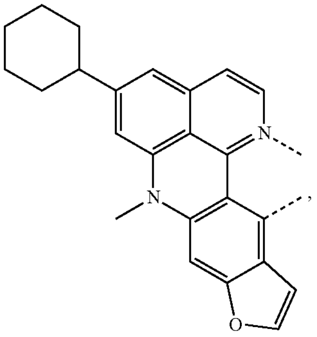
$L_{a887}$
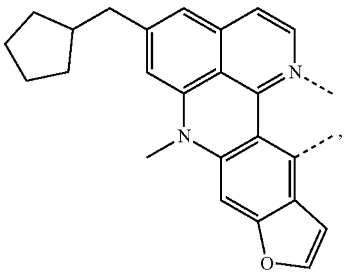
-continued
$L_{a888}$
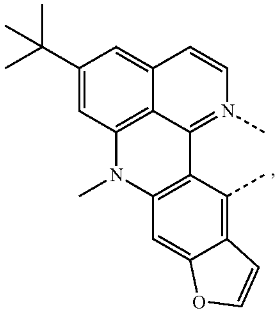
$L_{a889}$
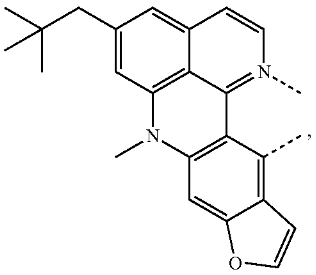
$L_{a890}$
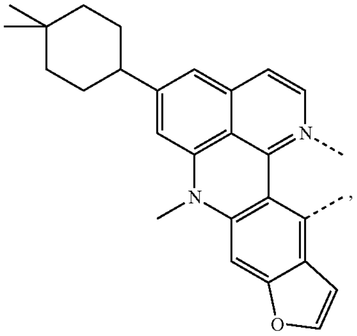
$L_{a891}$
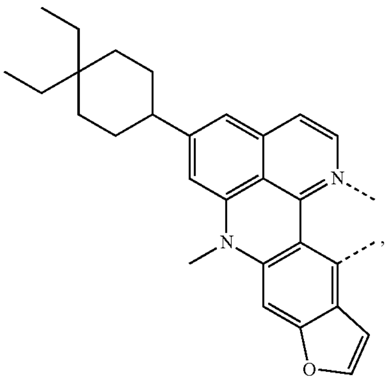

-continued
$L_{a892}$
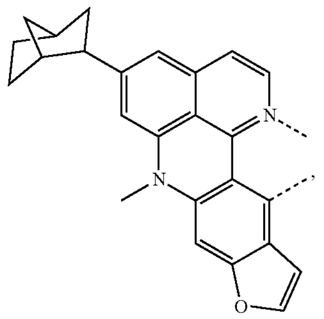
$L_{a893}$
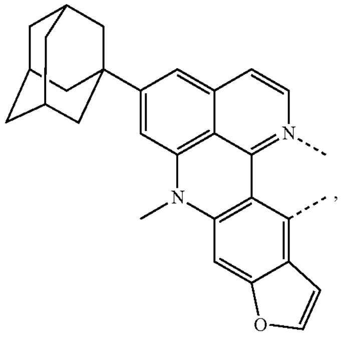
$L_{a894}$
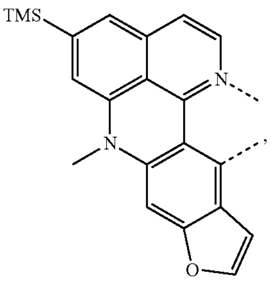
$L_{a895}$
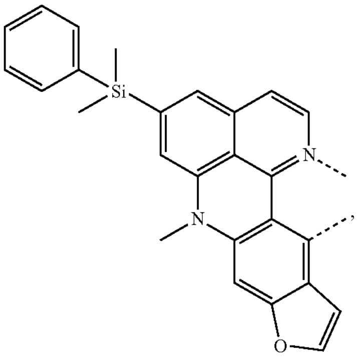
-continued
$L_{a896}$
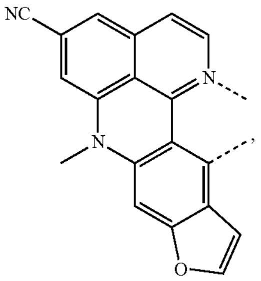
$L_{a897}$
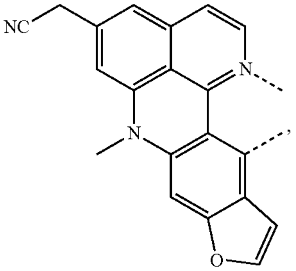
$L_{a898}$
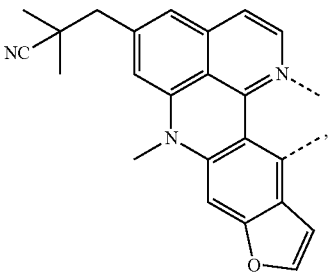
$L_{a899}$
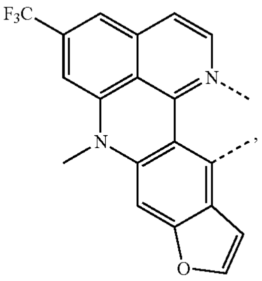
$L_{a900}$
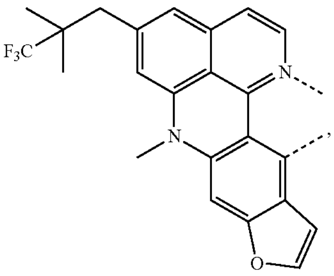

-continued
$L_{a901}$
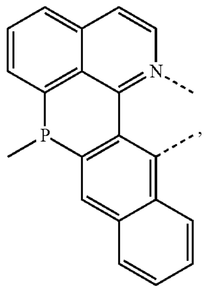
$L_{a902}$
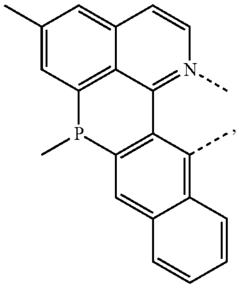
$L_{a903}$
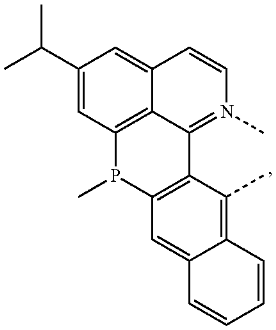
$L_{a904}$
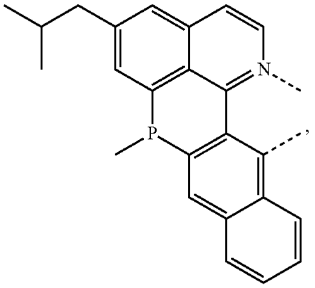
-continued
$L_{a905}$
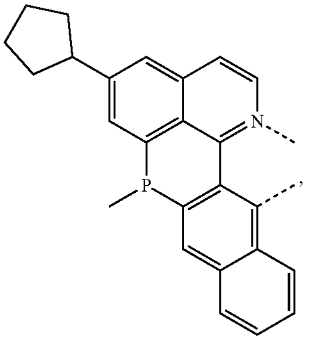
$L_{a906}$
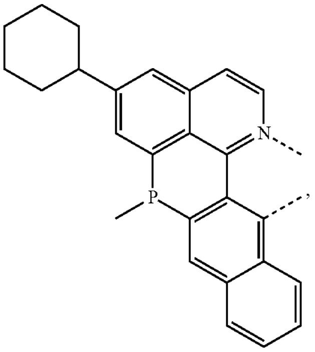
$L_{a907}$
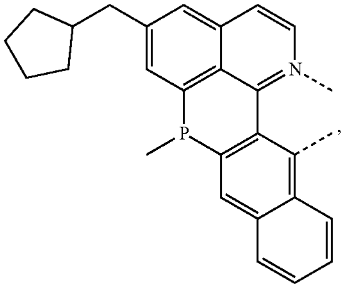
$L_{a908}$
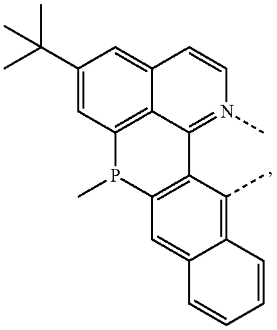

-continued
$L_{a909}$
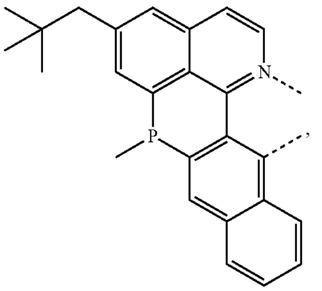
$L_{a910}$
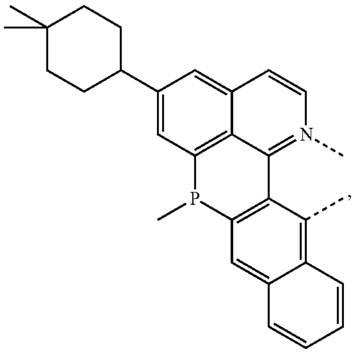
$L_{a911}$
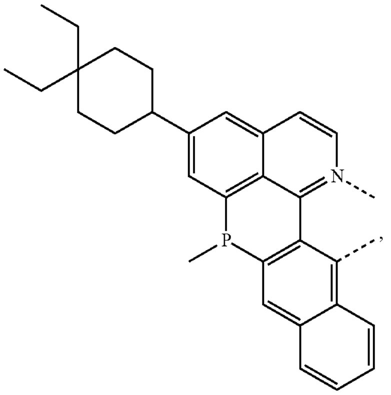
$L_{a912}$
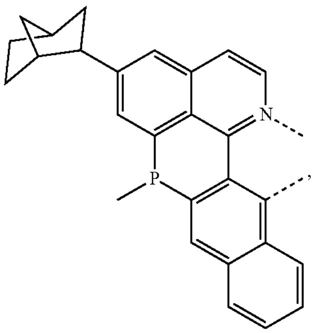
-continued
$L_{a913}$
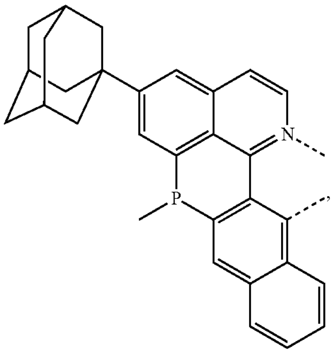
$L_{a914}$
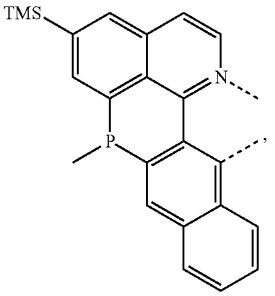
$L_{a915}$
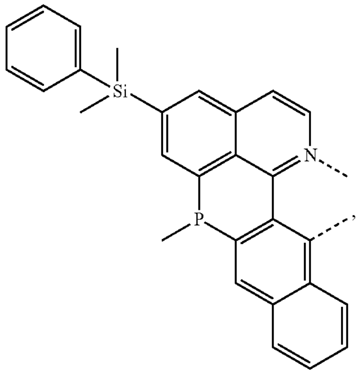
$L_{a916}$
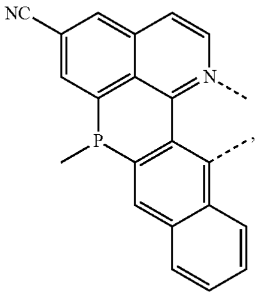

-continued
L$_{a917}$
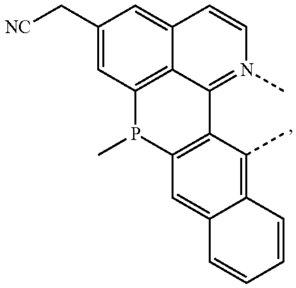
L$_{a918}$
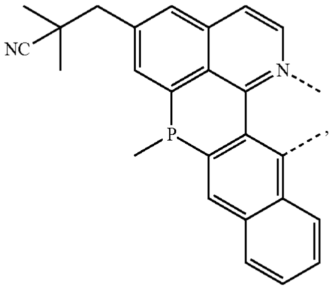
L$_{a919}$
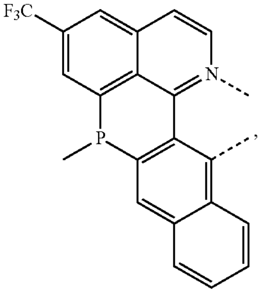
L$_{a920}$
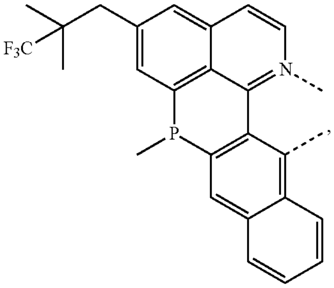
L$_{a921}$
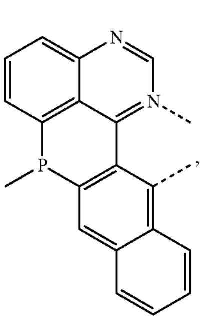
-continued
L$_{a922}$
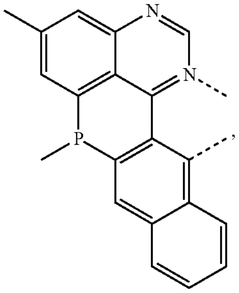
L$_{a923}$
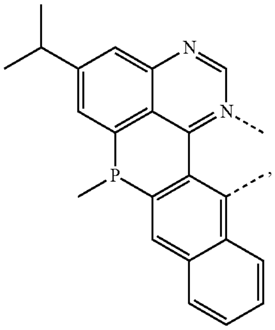
L$_{a924}$
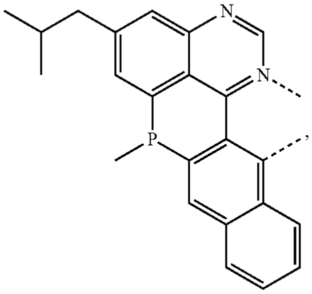
L$_{a925}$
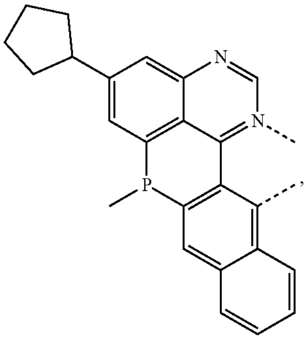

-continued
$L_{a926}$
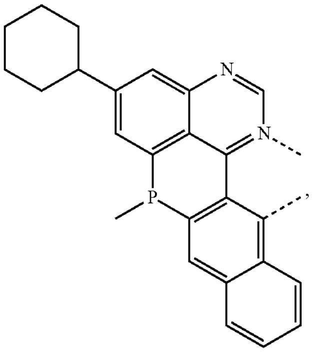
$L_{a927}$
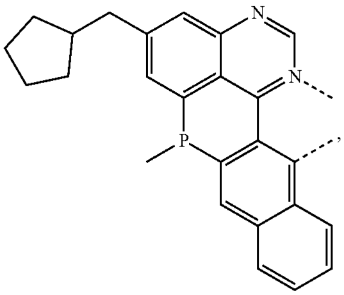
$L_{a928}$
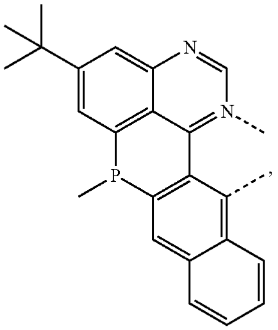
$L_{a929}$
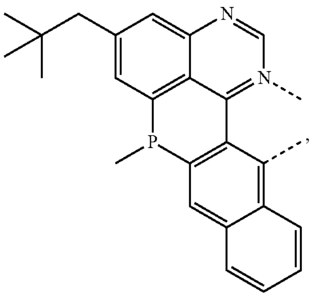
-continued
$L_{a930}$
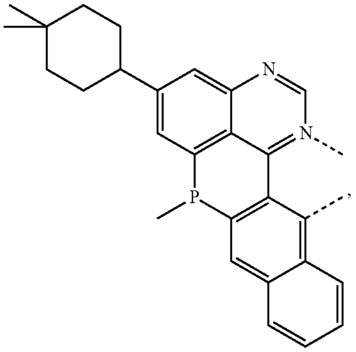
$L_{a931}$
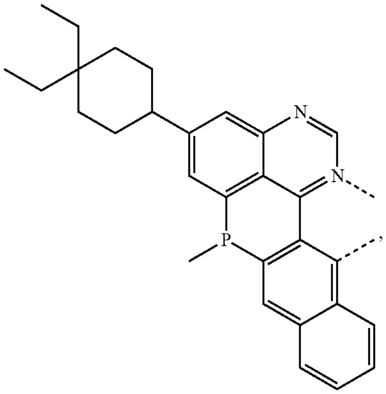
$L_{a932}$
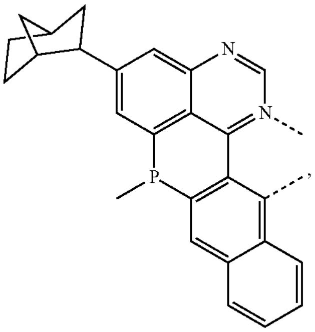
$L_{a933}$
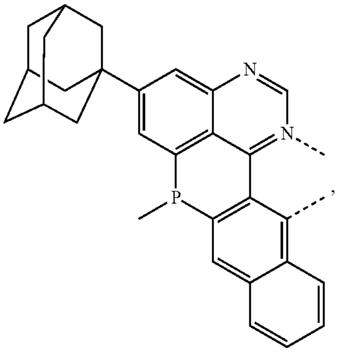

$L_{a934}$
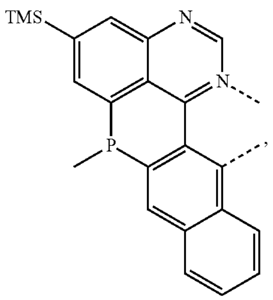
$L_{a935}$
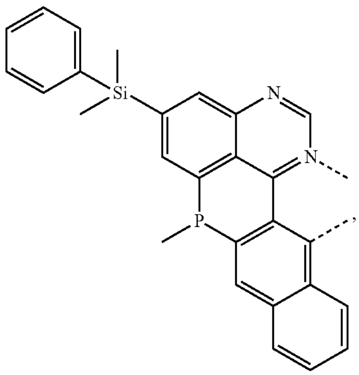
$L_{a936}$
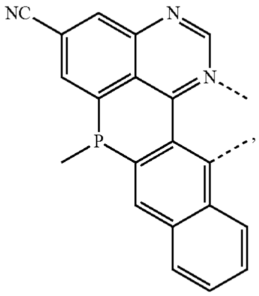
$L_{a937}$
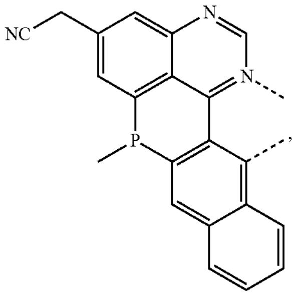
$L_{a938}$
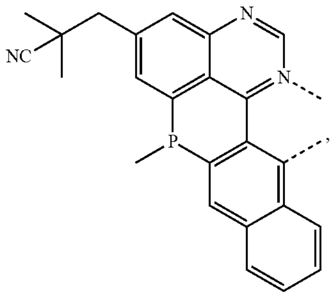
$L_{a939}$
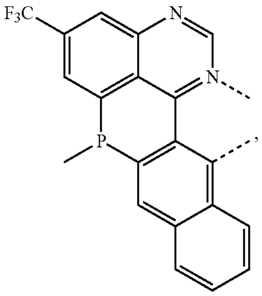
$L_{a940}$
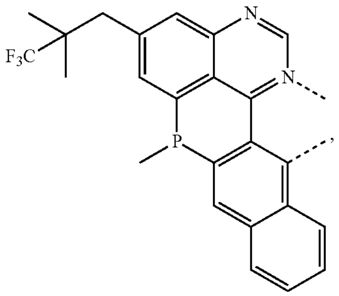
$L_{a1001}$
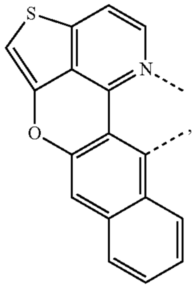
$L_{a1002}$
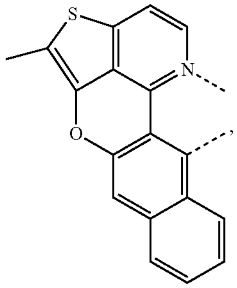
$L_{a1003}$
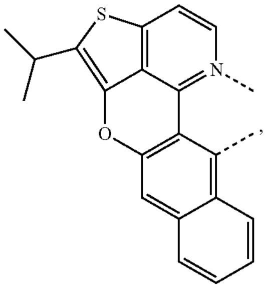

-continued
L$_{a1004}$
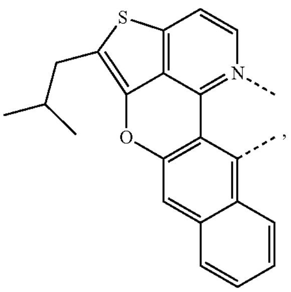
L$_{a1005}$
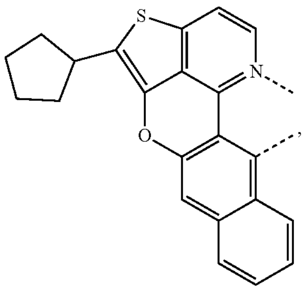
L$_{a1006}$
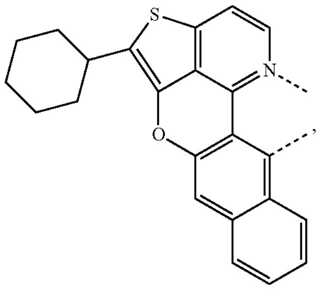
L$_{a1007}$
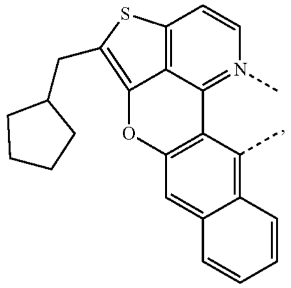
L$_{a1008}$
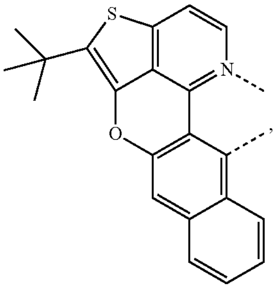
-continued
L$_{a1009}$
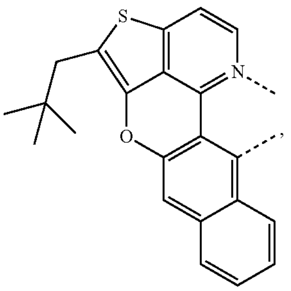
L$_{a1010}$
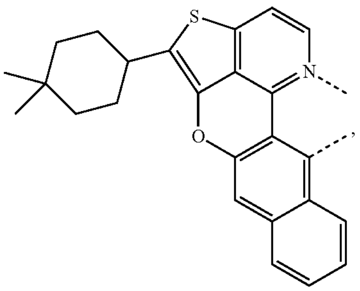
L$_{a1011}$
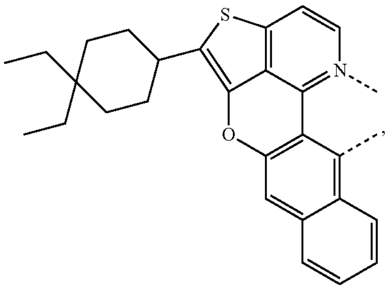
L$_{a1012}$
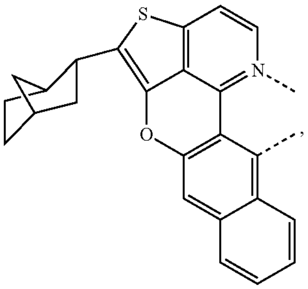
L$_{a1013}$
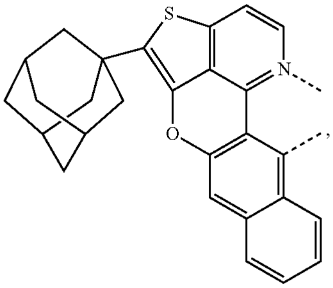

-continued
L$_{a1014}$
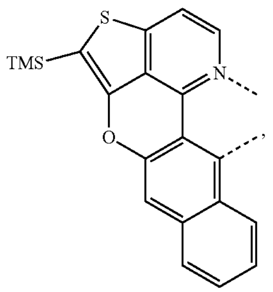
L$_{a1015}$
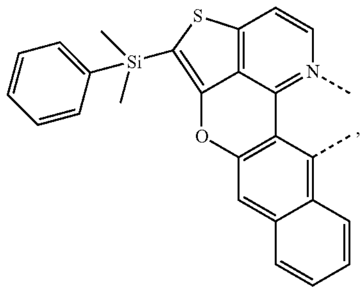
L$_{a1016}$
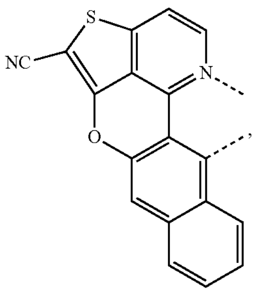
L$_{a1017}$
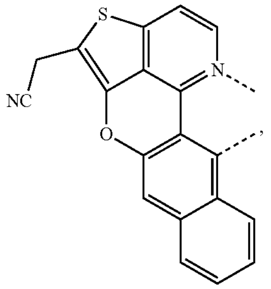
L$_{a1018}$
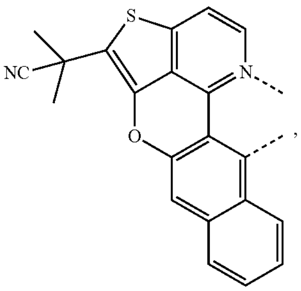
-continued
L$_{a1019}$
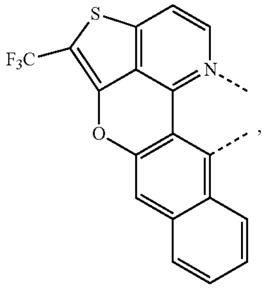
L$_{a1020}$
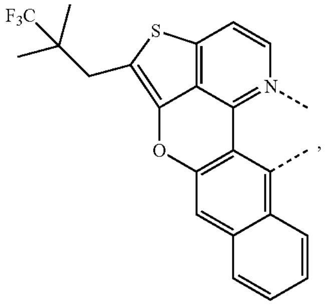
L$_{a1021}$
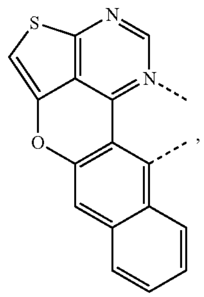
L$_{a1022}$
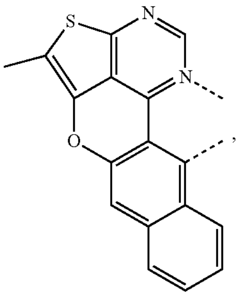
L$_{a1023}$
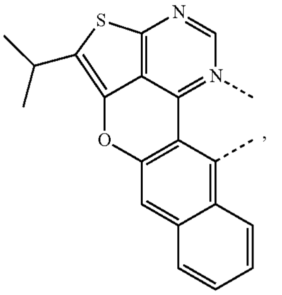

-continued
L$_{a1024}$
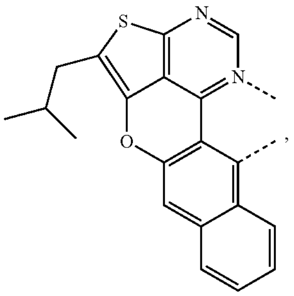
L$_{a1025}$
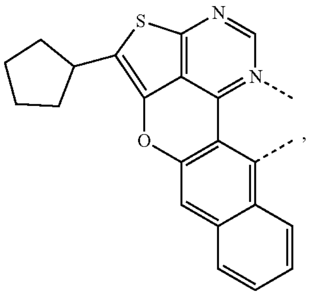
L$_{a1026}$
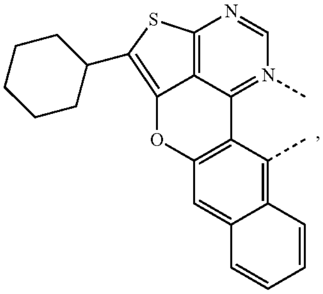
L$_{a1027}$
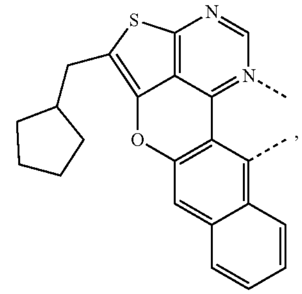
L$_{a1028}$
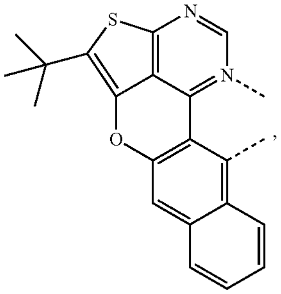
-continued
L$_{a1029}$
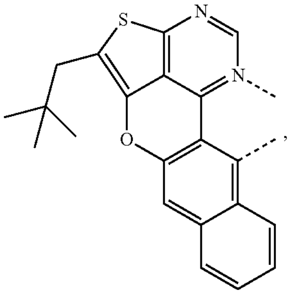
L$_{a1030}$
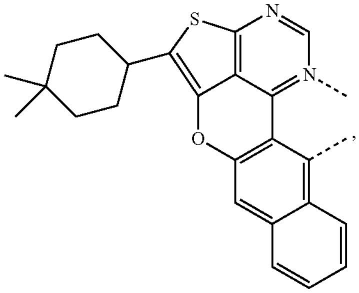
L$_{a1031}$
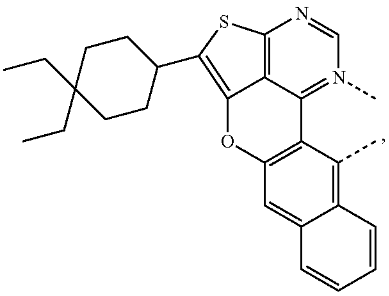
L$_{a1032}$
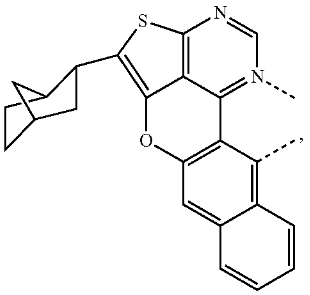
L$_{a1033}$
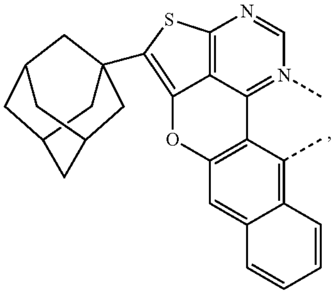

$L_{a1034}$
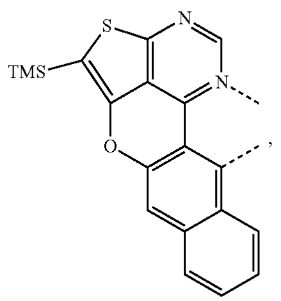
$L_{a1035}$
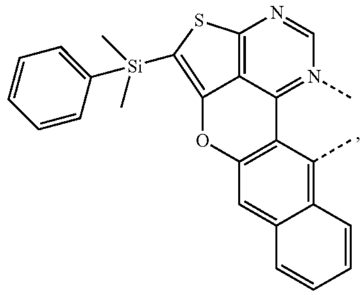
$L_{a1036}$
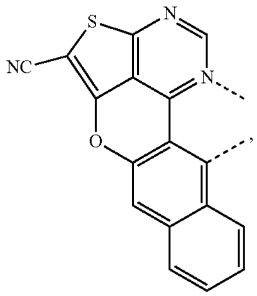
$L_{a1037}$
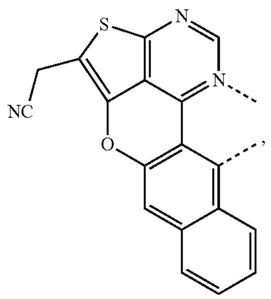
$L_{a1038}$
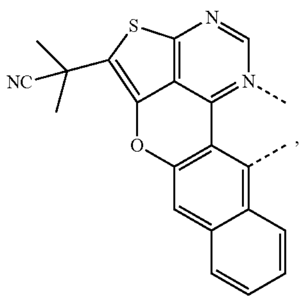
$L_{a1039}$
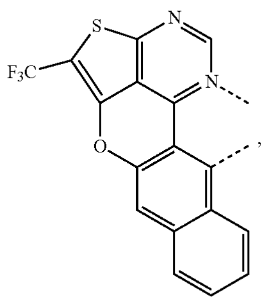
$L_{a1040}$
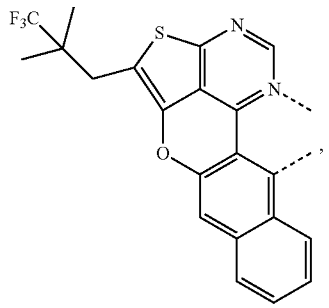
$L_{a1041}$
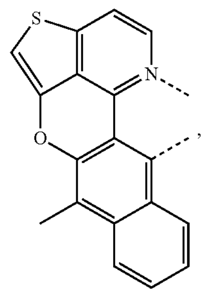
$L_{a1042}$
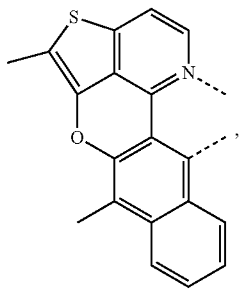
$L_{a1043}$
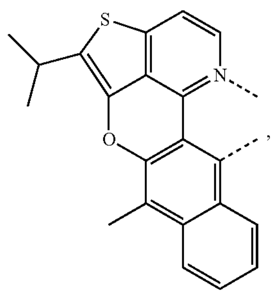

-continued
$L_{a1044}$
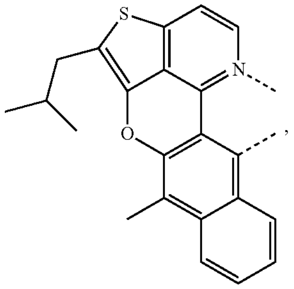
$L_{a1045}$
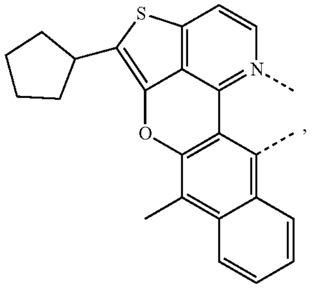
$L_{a1046}$
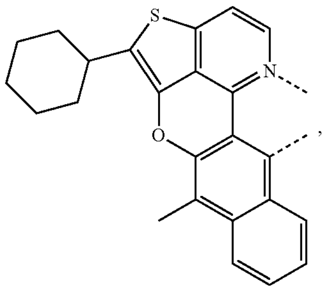
$L_{a1047}$
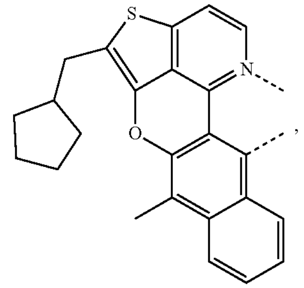
$L_{a1048}$
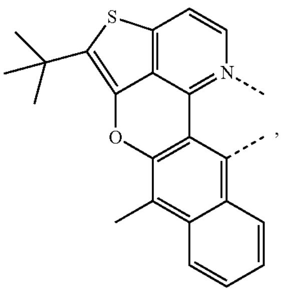
-continued
$L_{a1049}$
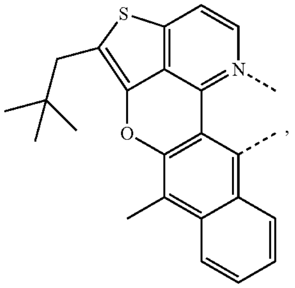
$L_{a1050}$
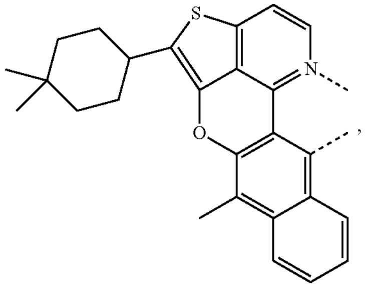
$L_{a1051}$
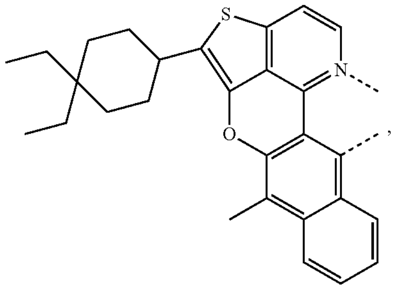
$L_{a1052}$
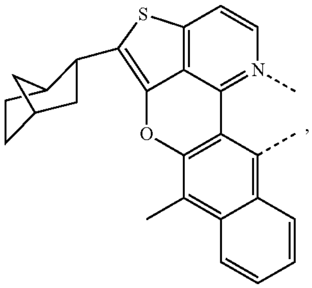
$L_{a1053}$
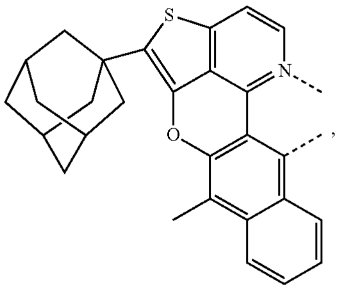

-continued
$L_{a1054}$
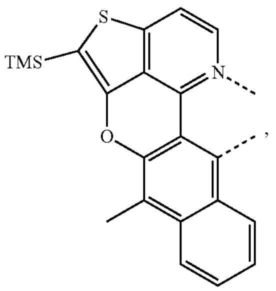
$L_{a1055}$
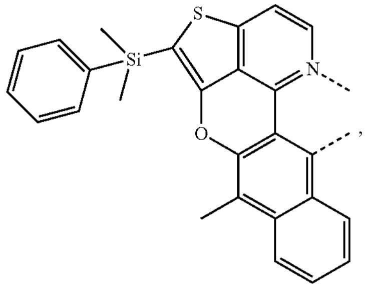
$L_{a1056}$
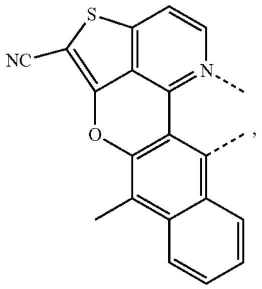
$L_{a1057}$
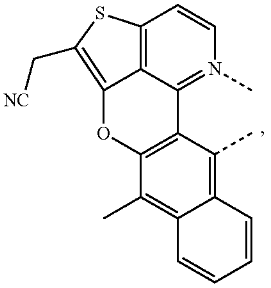
$L_{a1058}$
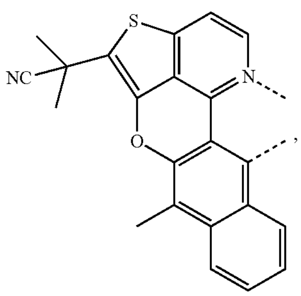
-continued
$L_{a1059}$
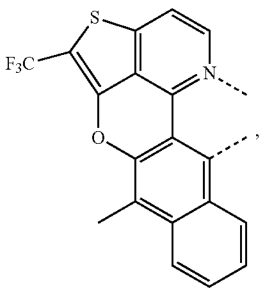
$L_{a1060}$
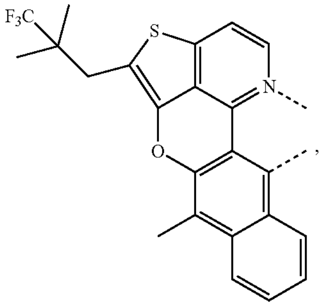
$L_{a1061}$
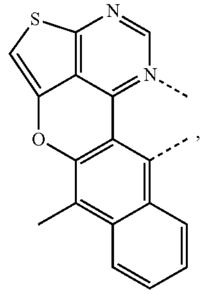
$L_{a1062}$
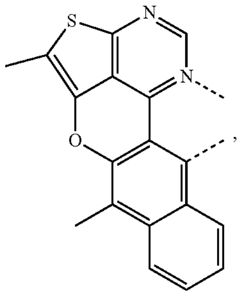
$L_{a1063}$
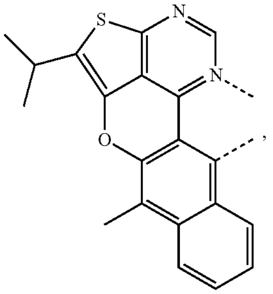

-continued
L$_{a1064}$
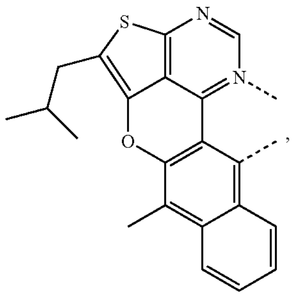
L$_{a1065}$
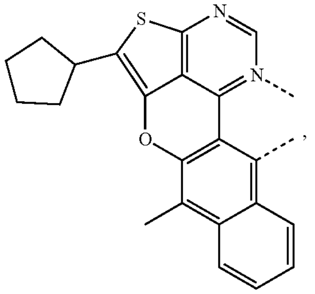
L$_{a1066}$
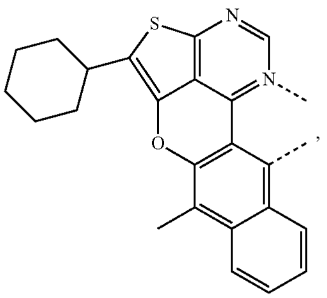
L$_{a1067}$
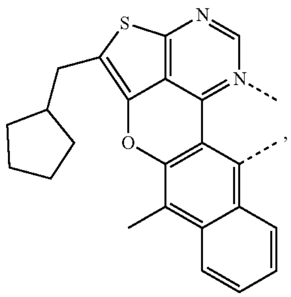
L$_{a1068}$
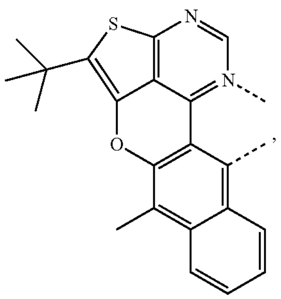
-continued
L$_{a1069}$
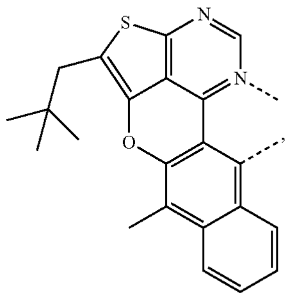
L$_{a1070}$
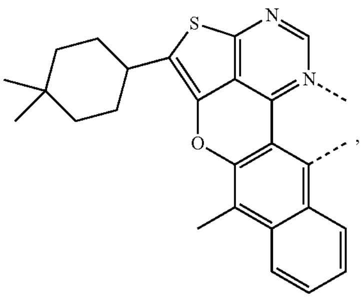
L$_{a1071}$
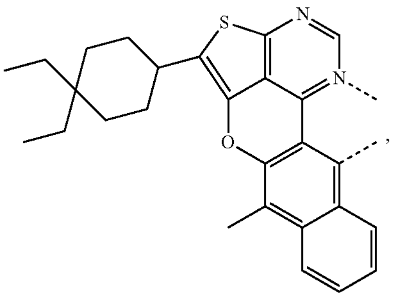
L$_{a1072}$
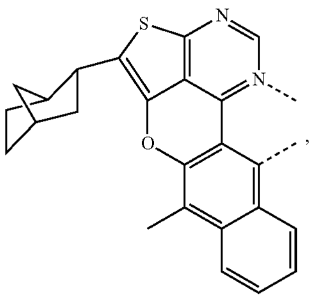
L$_{a1073}$
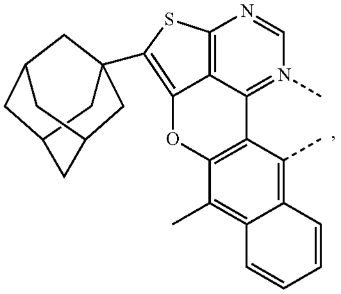

-continued
$L_{a1074}$
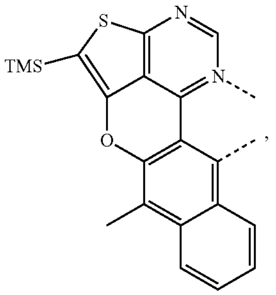
$L_{a1075}$
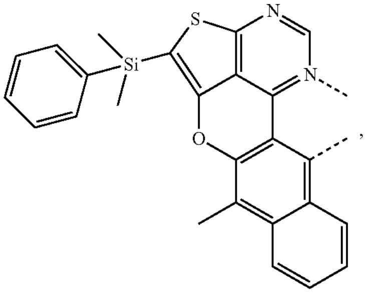
$L_{a1076}$
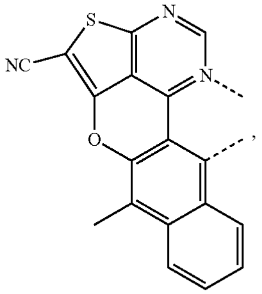
$L_{a1077}$
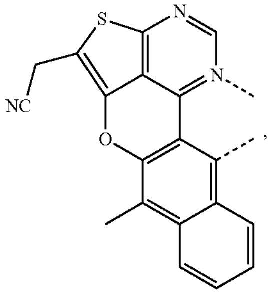
$L_{a1078}$
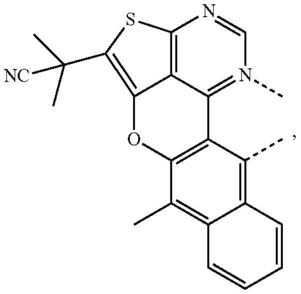
-continued
$L_{a1079}$
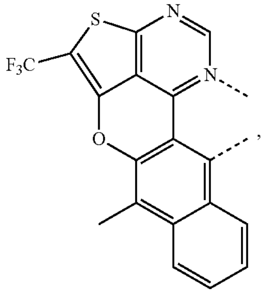
$L_{a1080}$
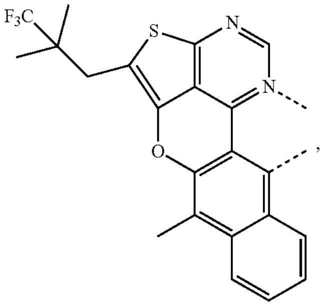
$L_{a1081}$
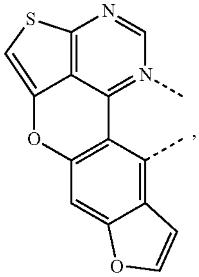
$L_{a1082}$
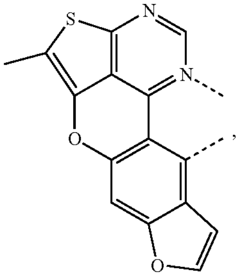
$L_{a1083}$
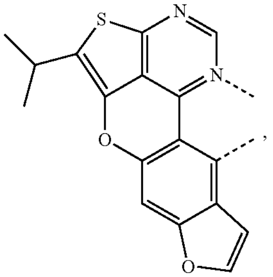

-continued
$L_{a1084}$
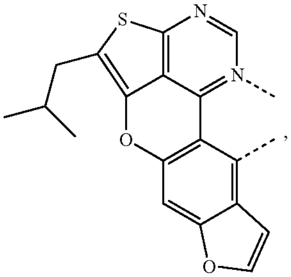
$L_{a1085}$
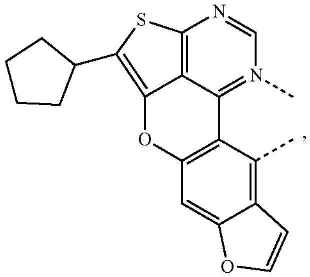
$L_{a1086}$
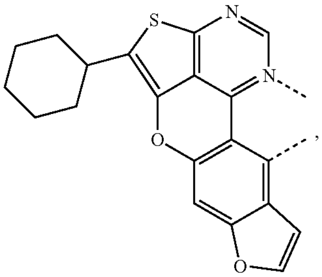
$L_{a1087}$
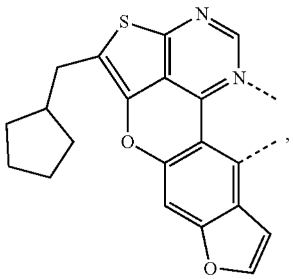
$L_{a1088}$
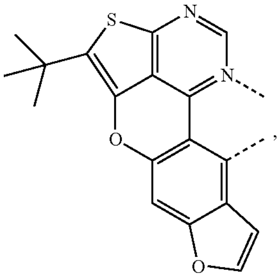
-continued
$L_{a1089}$
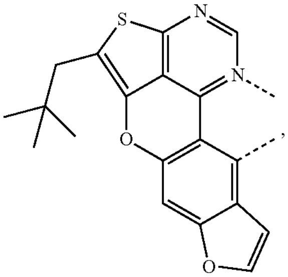
$L_{a1090}$
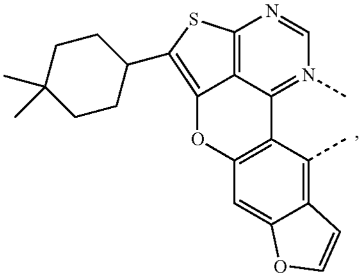
$L_{a1091}$
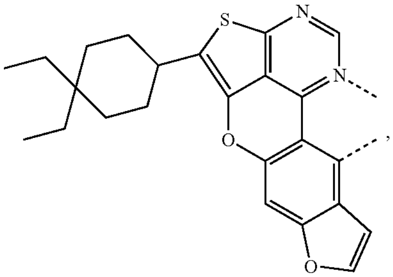
$L_{a1092}$
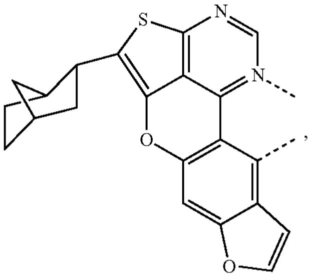
$L_{a1093}$
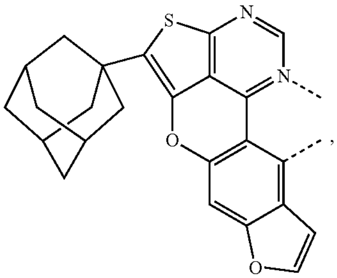

-continued
$L_{a1094}$
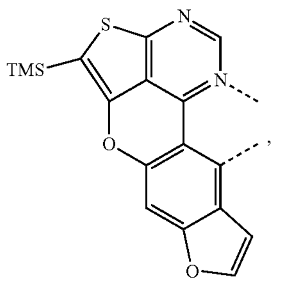
$L_{a1095}$
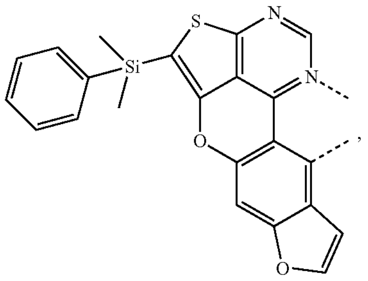
$L_{a1096}$
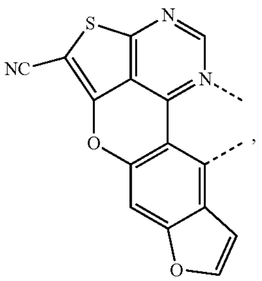
$L_{a1097}$
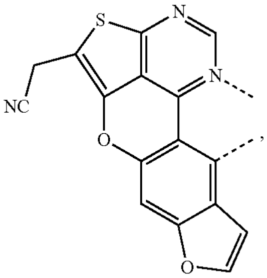
$L_{a1098}$
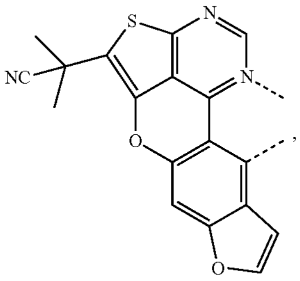
-continued
$L_{a1099}$
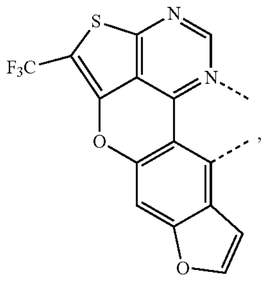
$L_{a1100}$
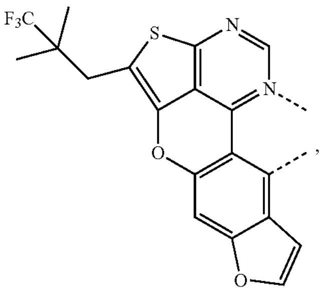
$L_{a1101}$
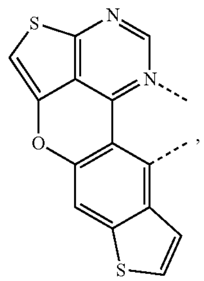
$L_{a1102}$
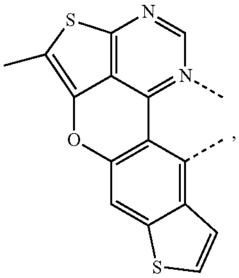
$L_{a1103}$
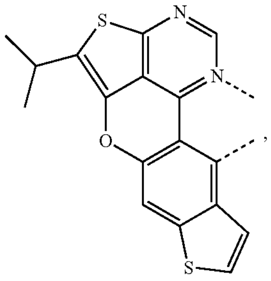

-continued
$L_{a1104}$
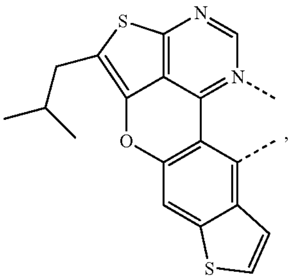
$L_{a1105}$
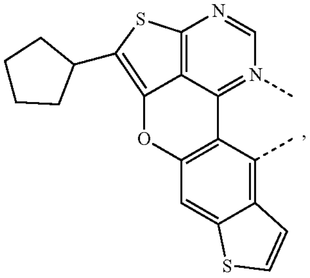
$L_{a1106}$
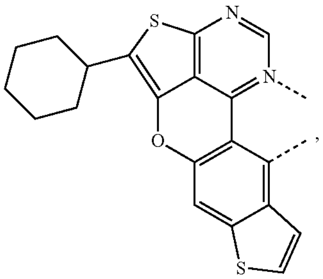
$L_{a1107}$
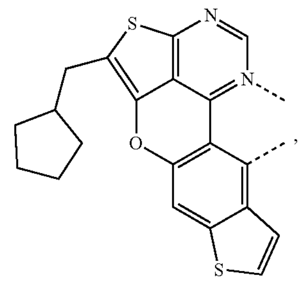
$L_{a1108}$
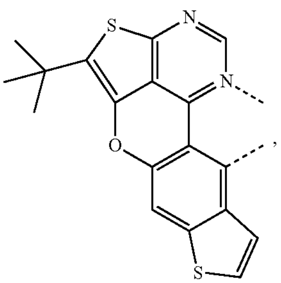
-continued
$L_{a1109}$
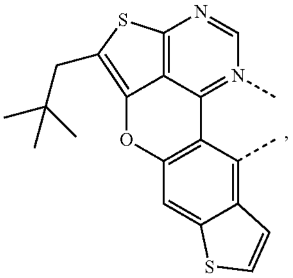
$L_{a1110}$
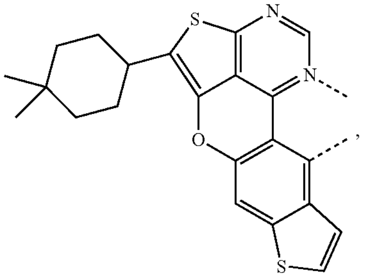
$L_{a1111}$
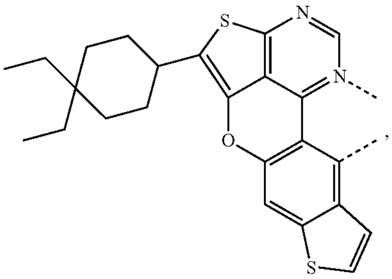
$L_{a1112}$
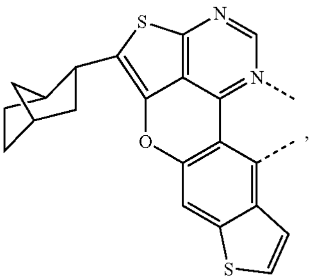
$L_{a1113}$
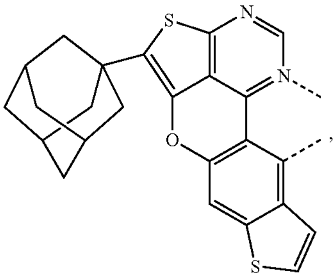

-continued
$L_{a1114}$
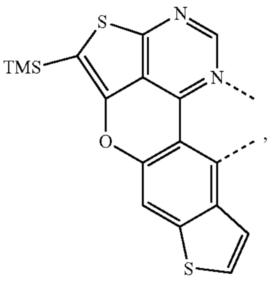
$L_{a1115}$
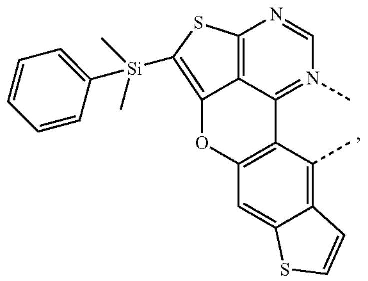
$L_{a1116}$
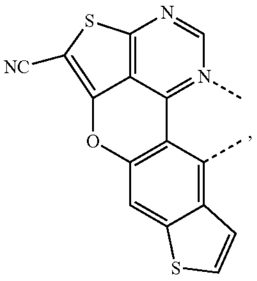
$L_{a1117}$
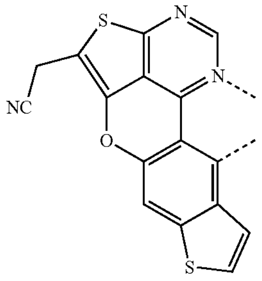
$L_{a1118}$
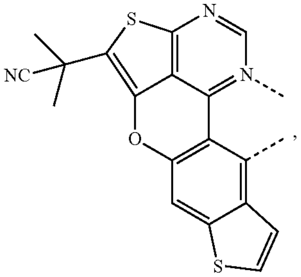
-continued
$L_{a1119}$
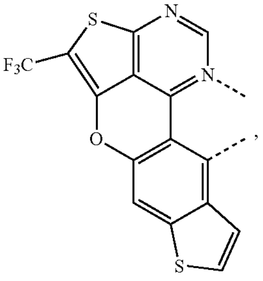
$L_{a1120}$
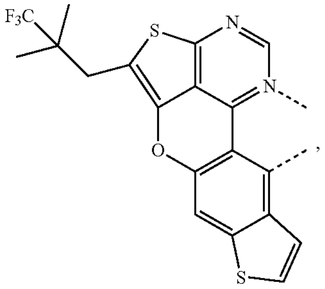
$L_{a1121}$
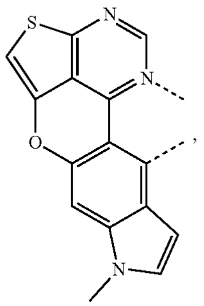
$L_{a1122}$
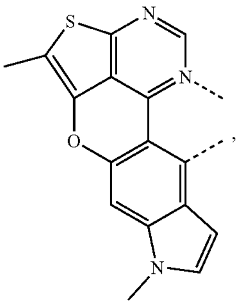
$L_{a1123}$
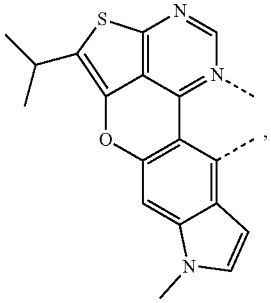

-continued
$L_{a1124}$
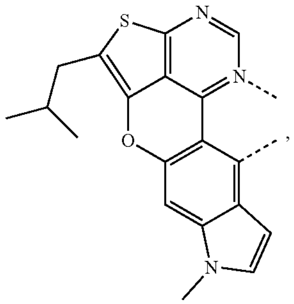
$L_{a1125}$
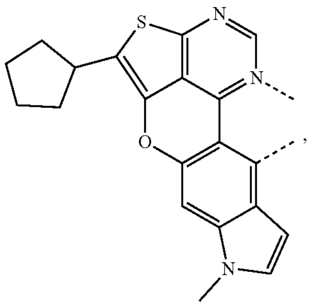
$L_{a1126}$
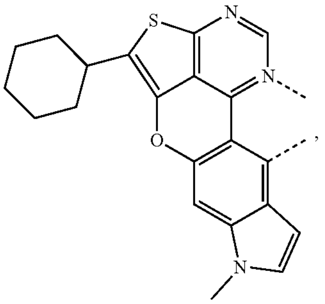
$L_{a1127}$
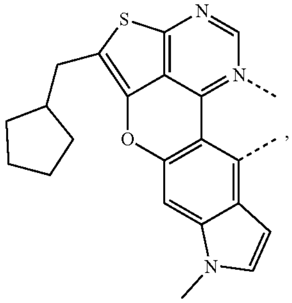
$L_{a1128}$
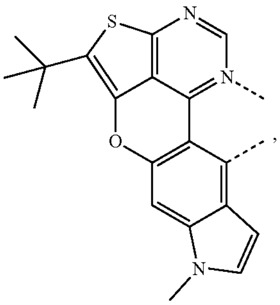
-continued
$L_{a1129}$
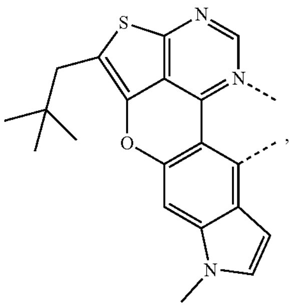
$L_{a1130}$
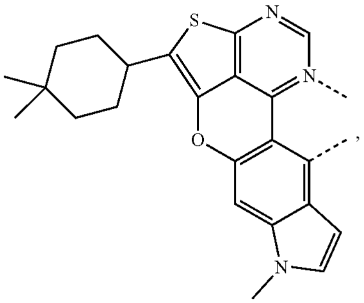
$L_{a1131}$
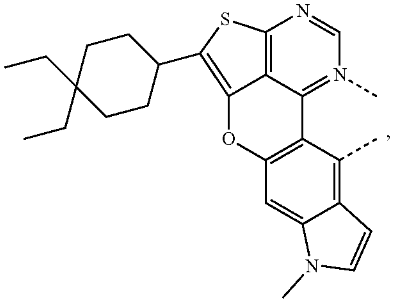
$L_{a1132}$
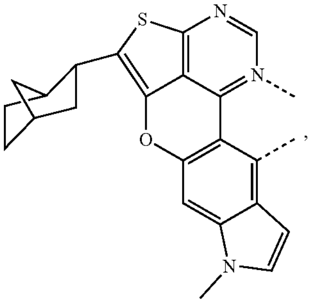
$L_{a1133}$
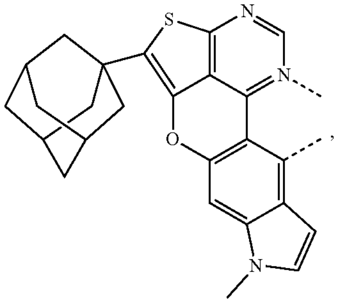

$L_{a1134}$
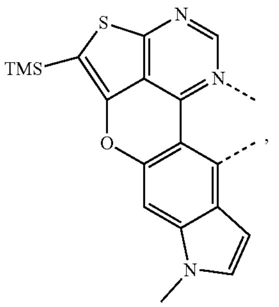
$L_{a1135}$
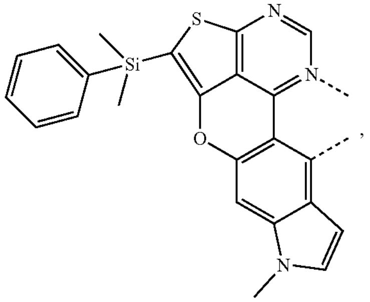
$L_{a1136}$
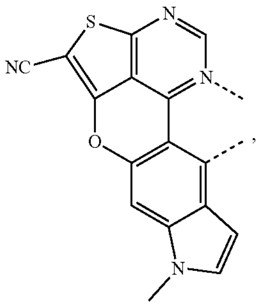
$L_{a1137}$
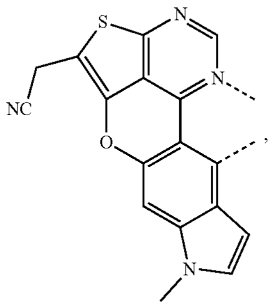
$L_{a1138}$
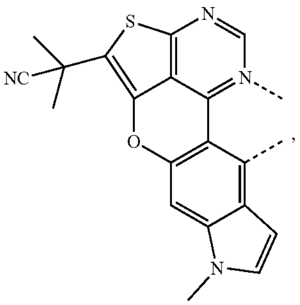
$L_{a1139}$
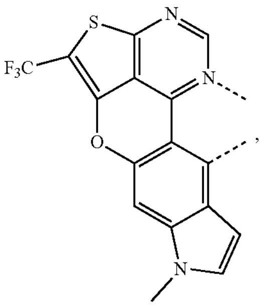
$L_{a1140}$
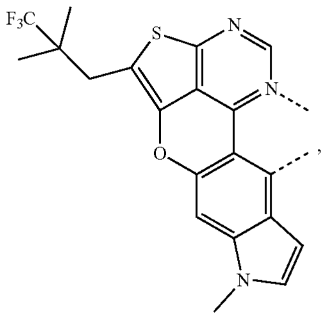
$L_{a1141}$
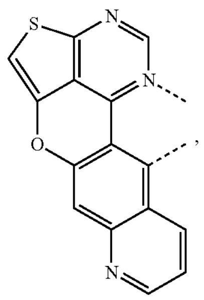
$L_{a1142}$
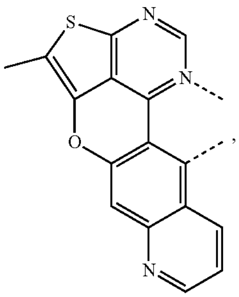
$L_{a1143}$
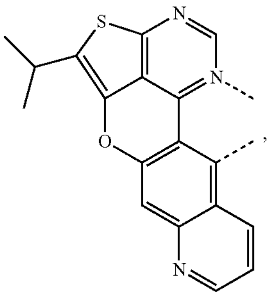

-continued
$L_{a1144}$
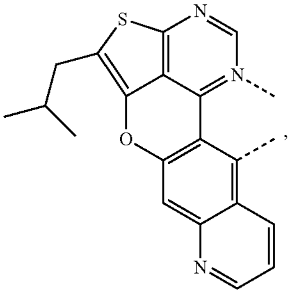
$L_{a1145}$
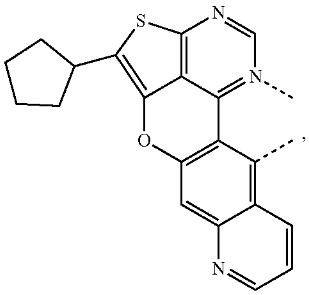
$L_{a1146}$
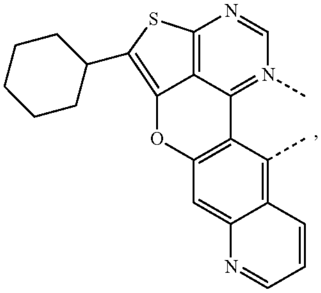
$L_{a1147}$
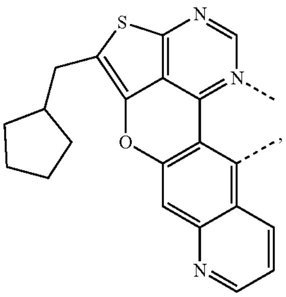
$L_{a1148}$
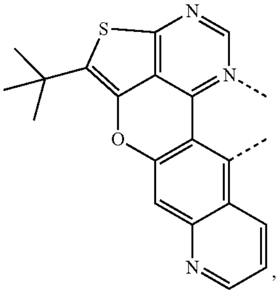
$L_{a1149}$
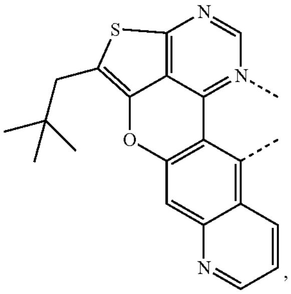
$L_{a1150}$
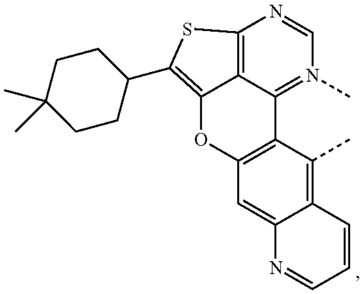
$L_{a1151}$
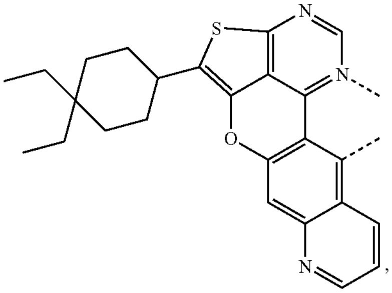
$L_{a1152}$
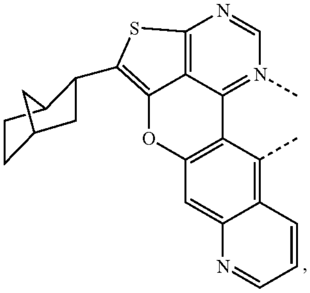

-continued
$L_{a1153}$
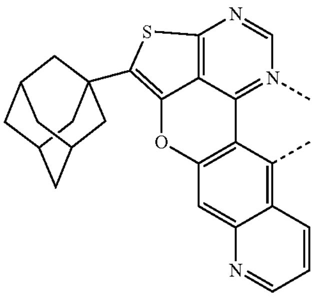,
$L_{a1154}$
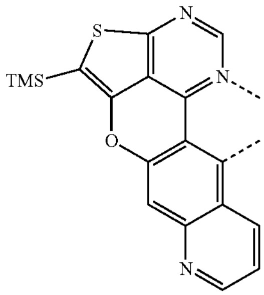,
$L_{a1155}$
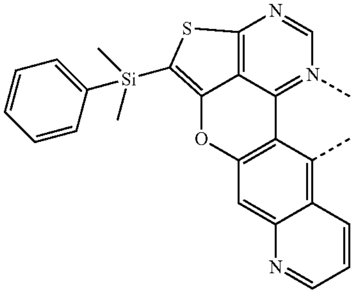,
$L_{a1156}$
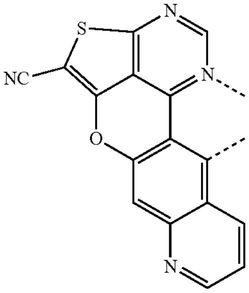,
$L_{a1157}$
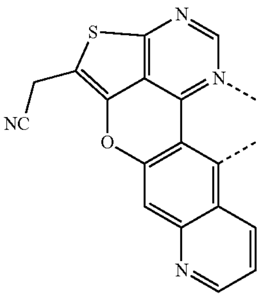,
-continued
$L_{a1158}$
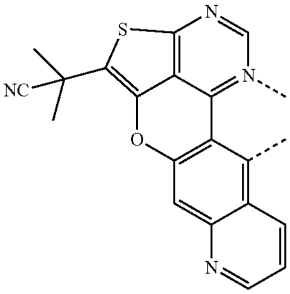,
$L_{a1159}$
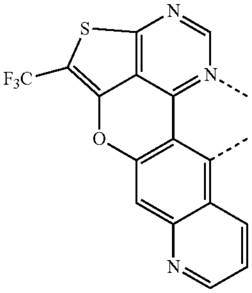,
$L_{a1160}$
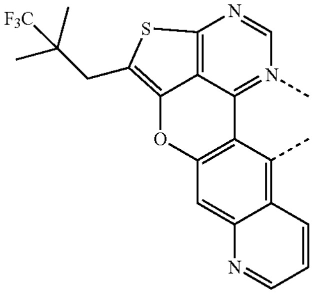,
$L_{a1161}$
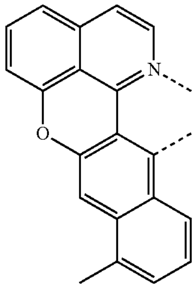,
$L_{a1162}$
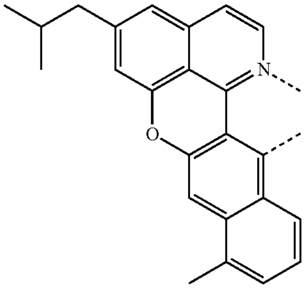, -continued
$L_{a1163}$
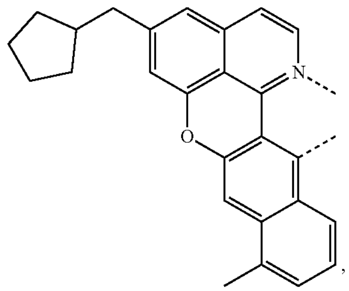
$L_{a1164}$
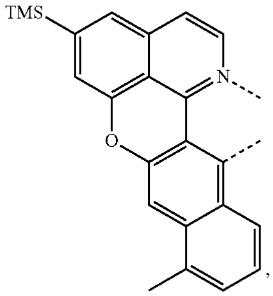
$L_{a1165}$
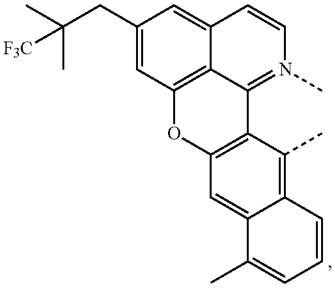
$L_{a1166}$
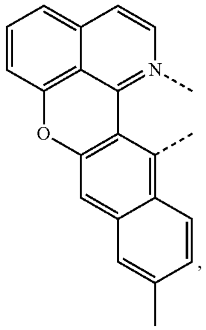
$L_{a1167}$
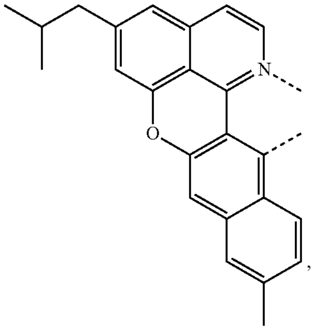
-continued
$L_{a1168}$
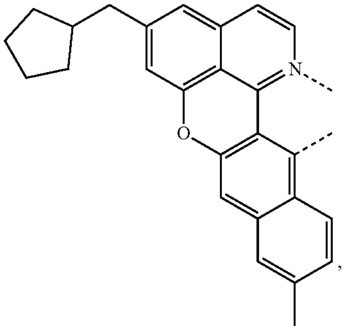
$L_{a1169}$
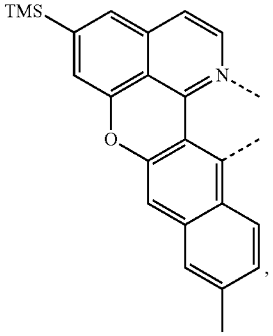
$L_{a1170}$
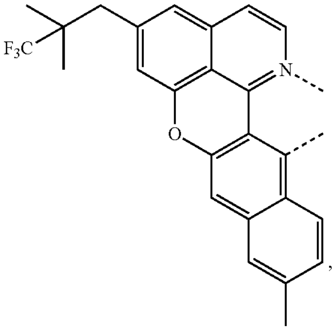
$L_{a1171}$
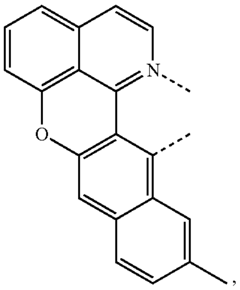
$L_{a1172}$
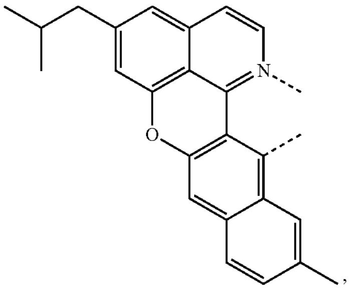

-continued
$L_{a1173}$
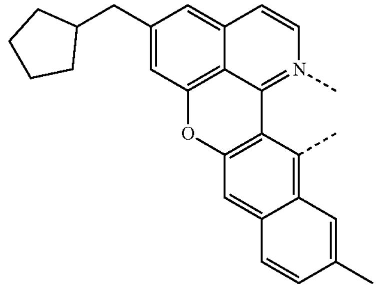
,
$L_{a1174}$
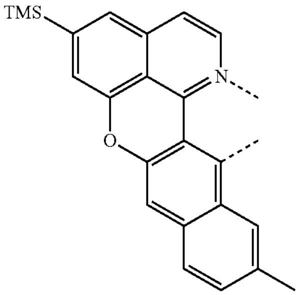
,
$L_{a1175}$
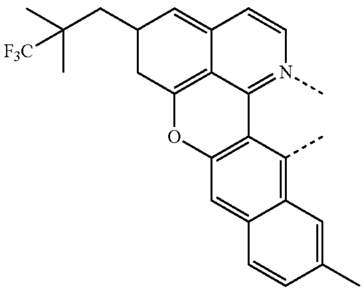
,
$L_{a1176}$
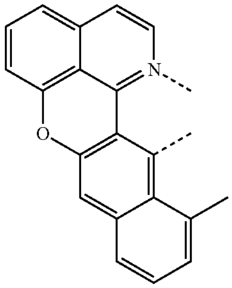
,
$L_{a1177}$
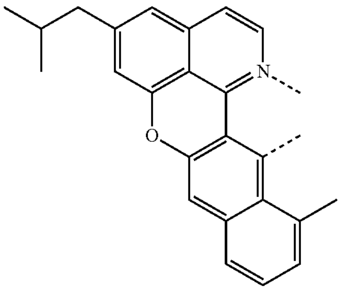
,
-continued
$L_{a1178}$
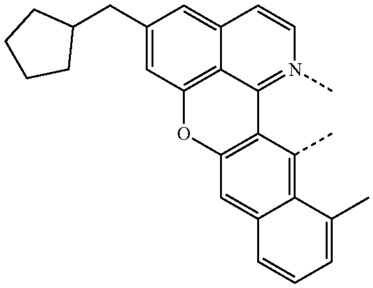
,
$L_{a1179}$
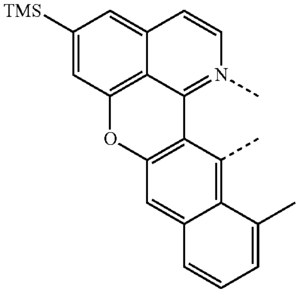
,
$L_{a1180}$
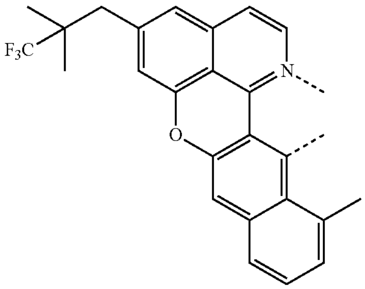
,
$L_{a1181}$
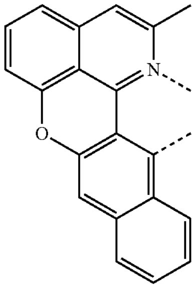
,
$L_{a1182}$
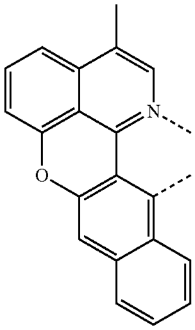
, -continued
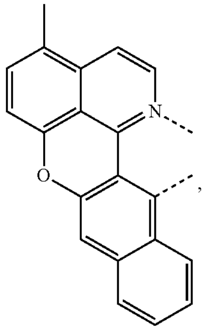
$L_{a1183}$
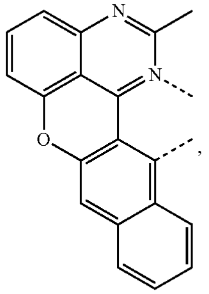
$L_{a1184}$
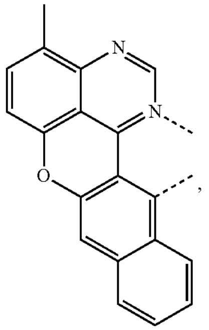
$L_{a1185}$
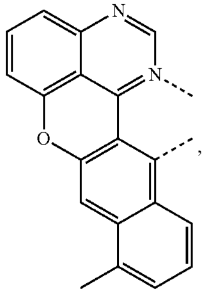
$L_{a1186}$
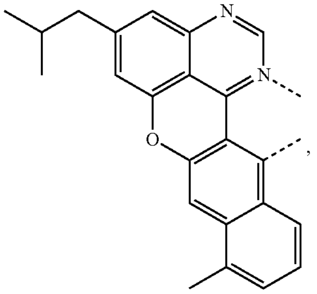
$L_{a1187}$
-continued
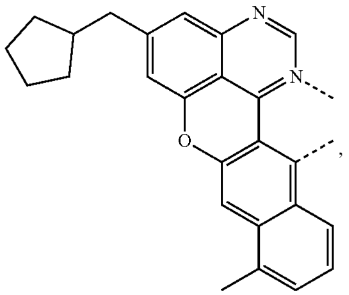
$L_{a1188}$
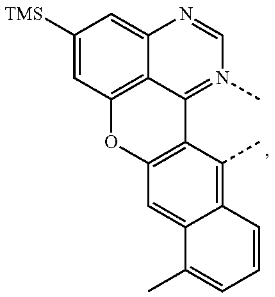
$L_{a1189}$
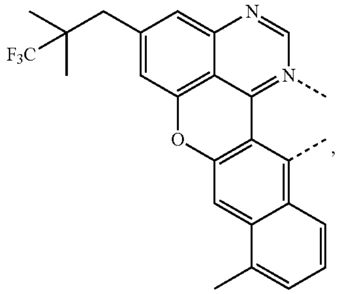
$L_{a1190}$
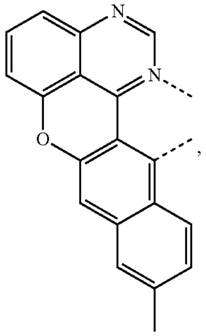
$L_{a1191}$
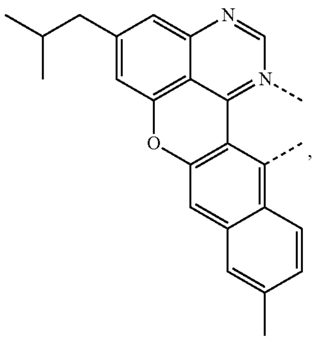
$L_{a1192}$ -continued
$L_{a1193}$
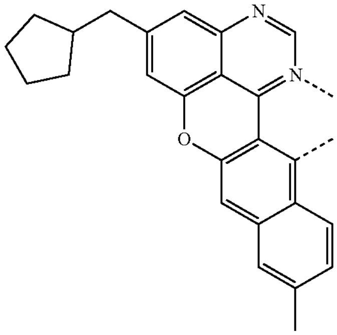
,
$L_{a1194}$
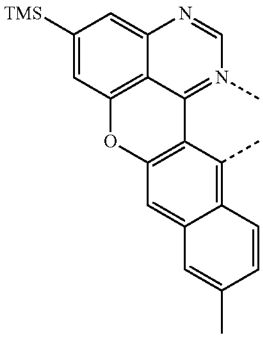
,
$L_{a1195}$
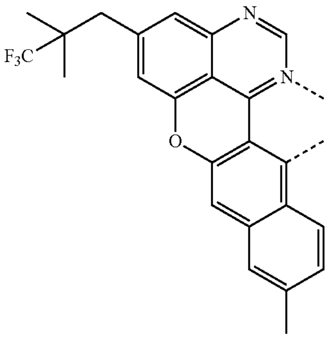
,
$L_{a1196}$
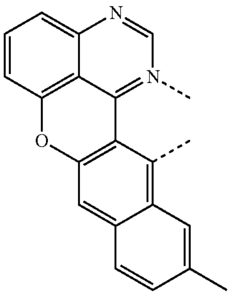
,
$L_{a1197}$
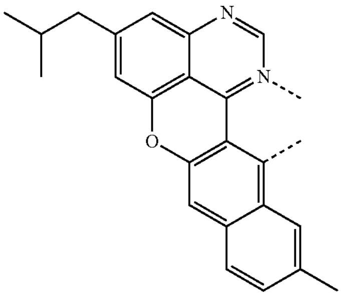
,
-continued
$L_{a1198}$
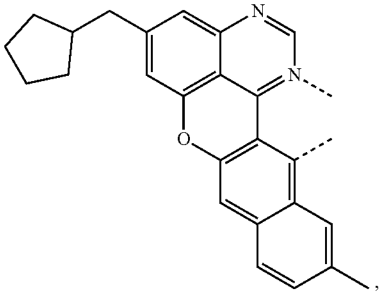
,
$L_{a1199}$
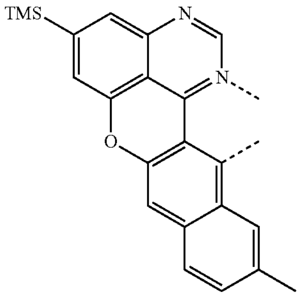
,
$L_{a1200}$
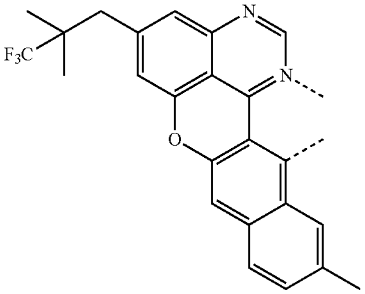
,
$L_{a1201}$
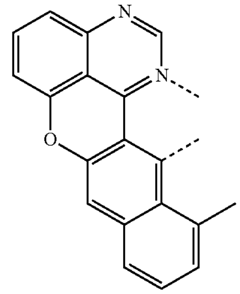
,
$L_{a1202}$
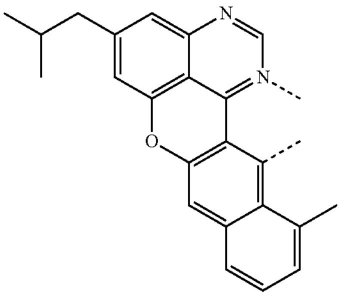
, -continued
$L_{a1203}$
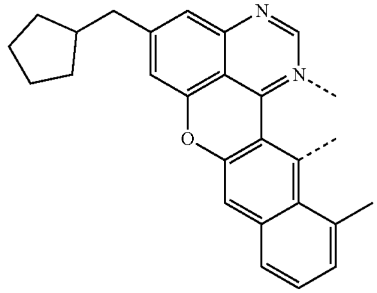
,
$L_{a1204}$
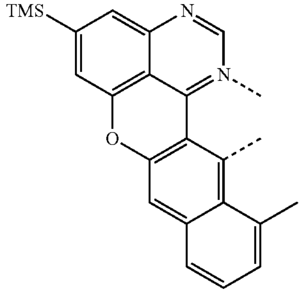
,
$L_{a1205}$
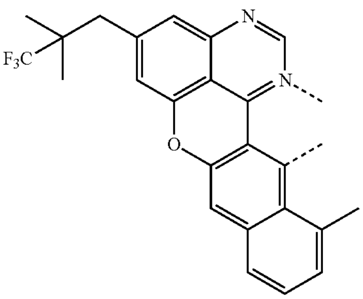
,
$L_{a1206}$
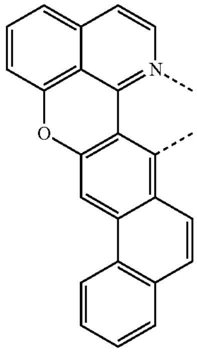
,
$L_{a1207}$
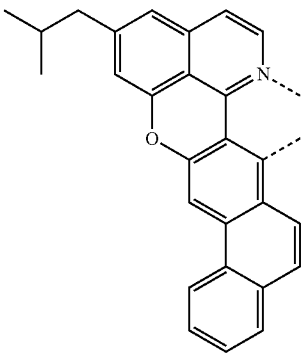
,
-continued
$L_{a1208}$
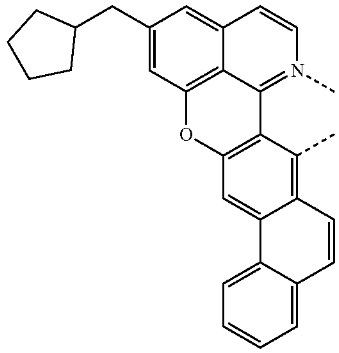
,
$L_{a1209}$
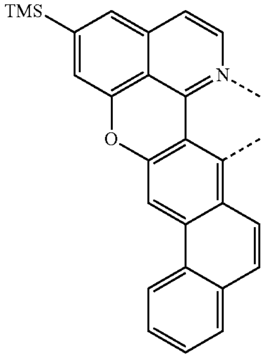
,
$L_{a1210}$
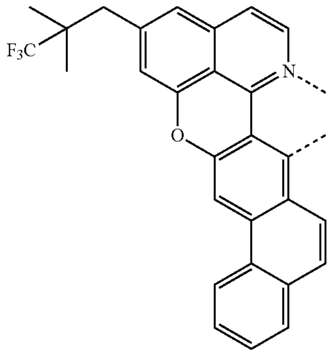
,
$L_{a1211}$
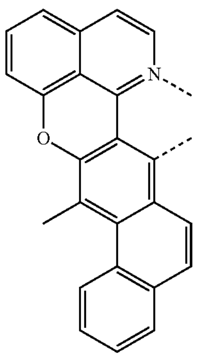
, -continued
L$_{a1212}$
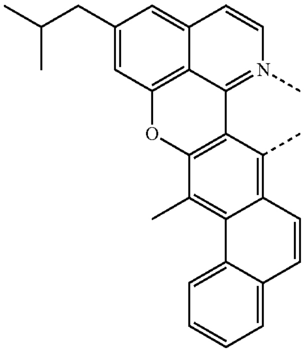
,
L$_{a1213}$
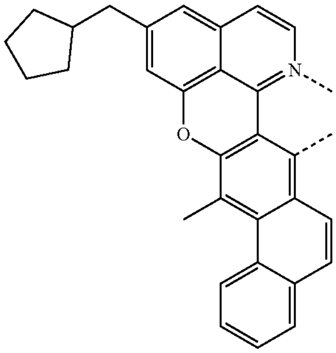
,
L$_{a1214}$
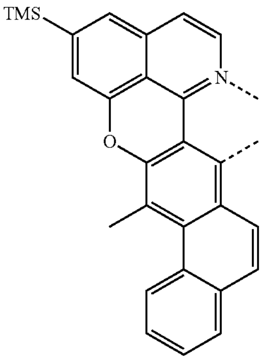
,
L$_{a1215}$
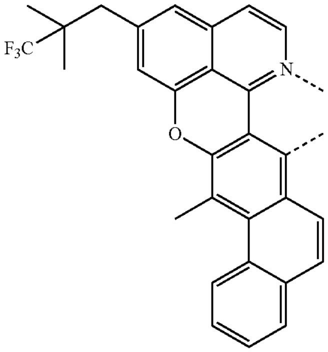
,
-continued
L$_{a1216}$
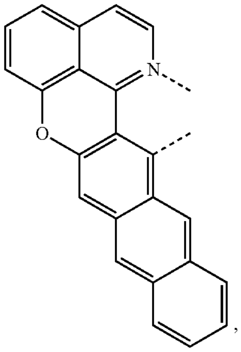
,
L$_{a1217}$
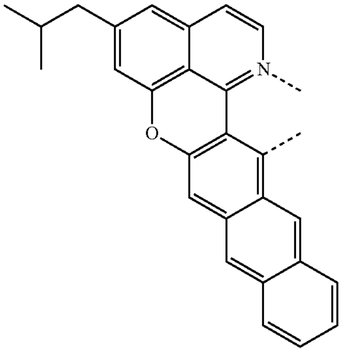
,
L$_{a1218}$
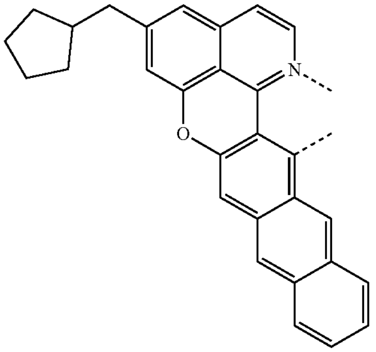
,
L$_{a1219}$
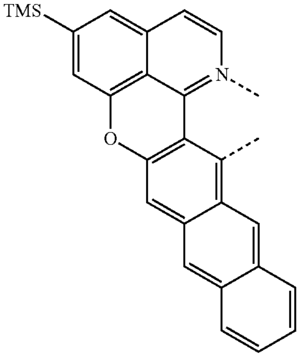
, -continued
$L_{a1220}$
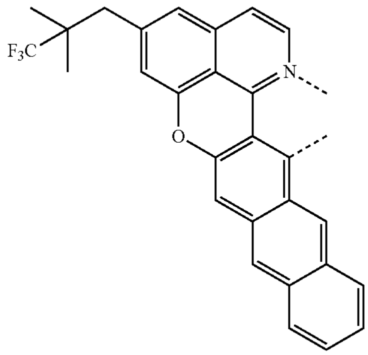
,
$L_{a1221}$
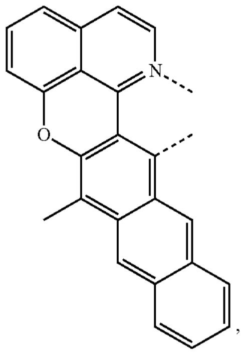
,
$L_{a1222}$
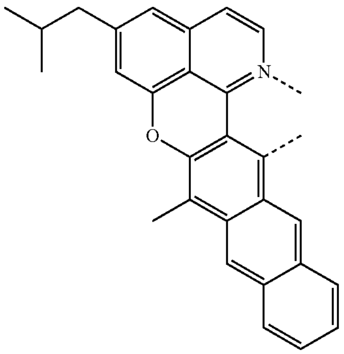
,
$L_{a1223}$
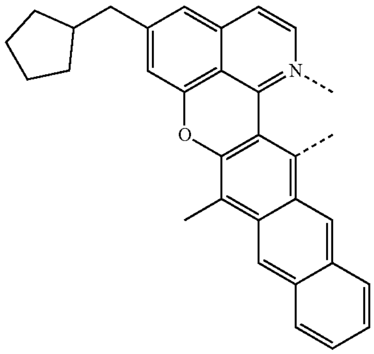
,
-continued
$L_{a1224}$
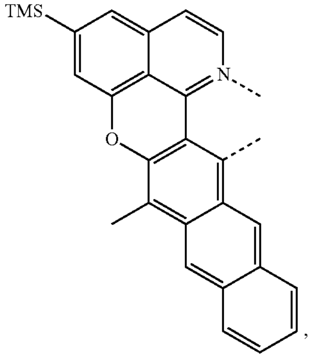
,
$L_{a1225}$
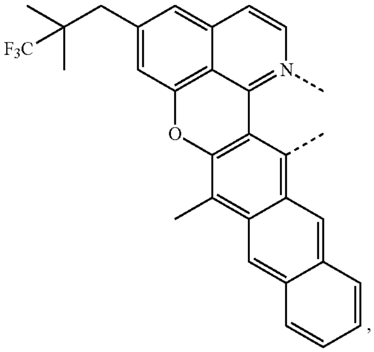
,
$L_{a1226}$
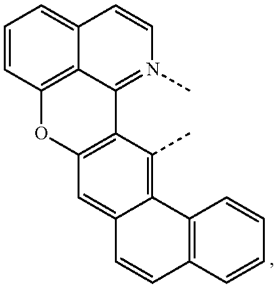
,
$L_{a1227}$
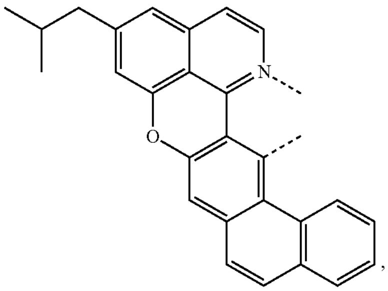
,
$L_{a1228}$
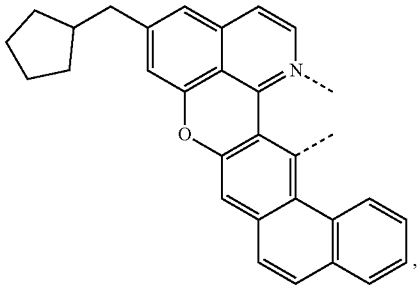
, -continued
$L_{a1229}$
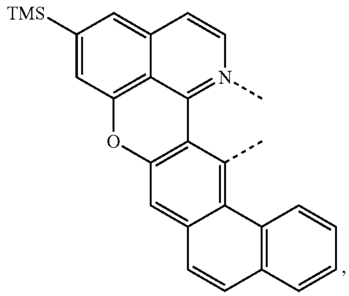
,
$L_{a1230}$
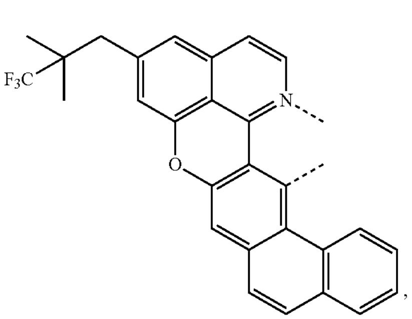
,
$L_{a1231}$
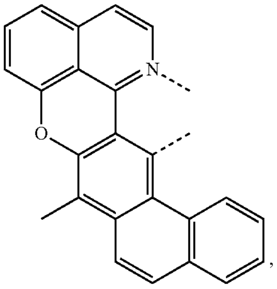
,
$L_{a1232}$
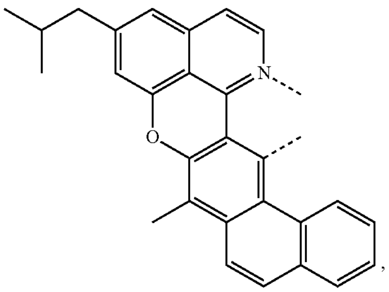
,
$L_{a1233}$
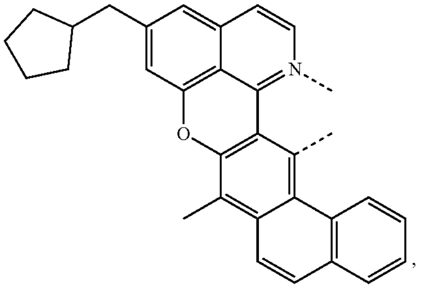
,
-continued
$L_{a1234}$
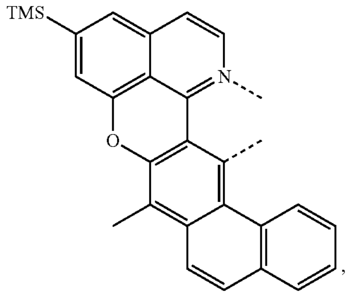
,
$L_{a1235}$
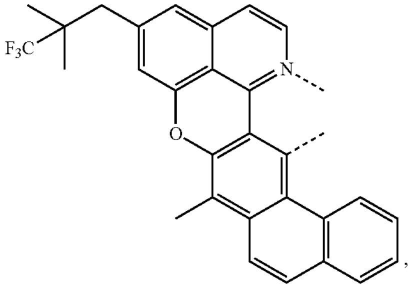
,
$L_{a1236}$
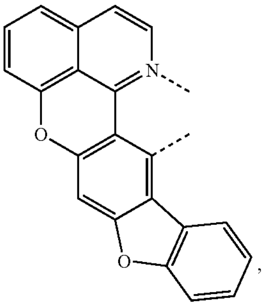
,
$L_{a1237}$
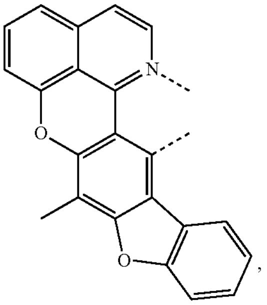
,
$L_{a1238}$
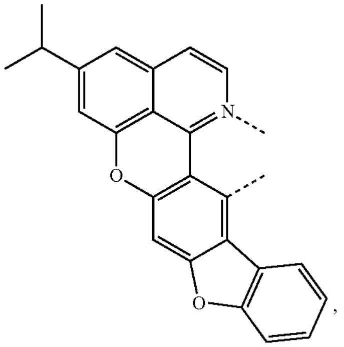
, -continued
$L_{a1239}$
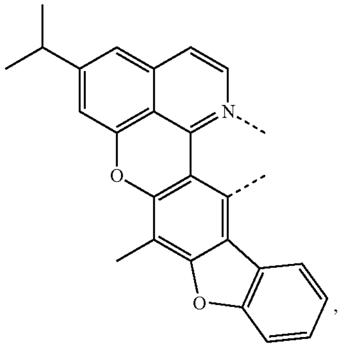
$L_{a1240}$
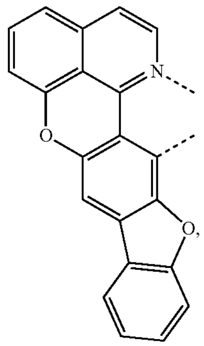
$L_{a1241}$
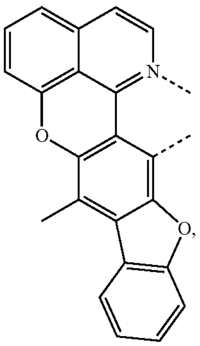
$L_{a1242}$
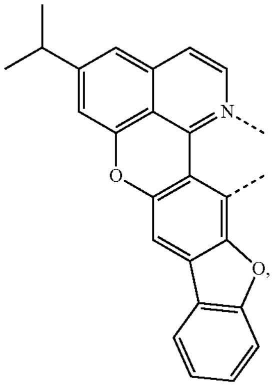
-continued
$L_{a1243}$
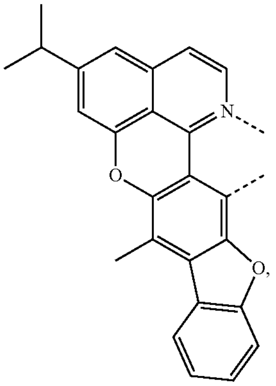
$L_{a1244}$
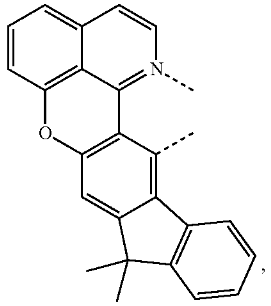
$L_{a1245}$
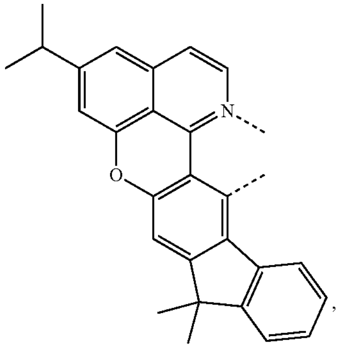
$L_{a1246}$
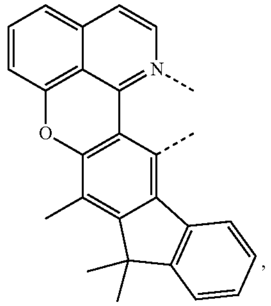

-continued
L$_{a1247}$
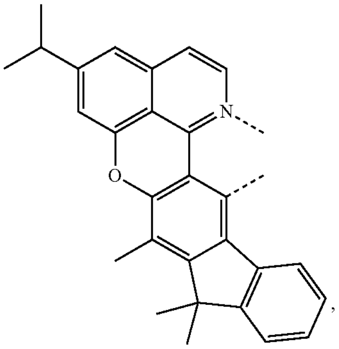
L$_{a1248}$
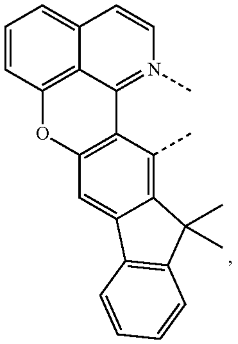
L$_{a1249}$
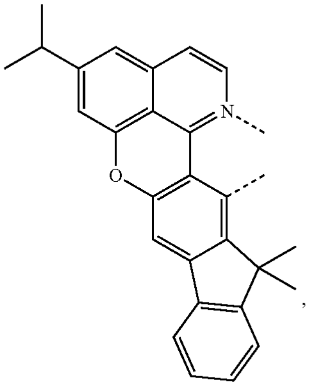
L$_{a1250}$
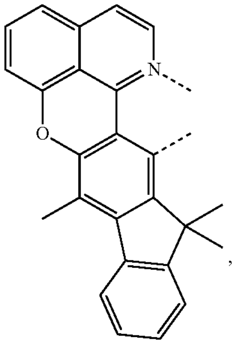
-continued
L$_{a1251}$
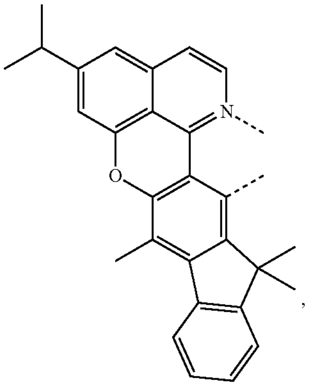
L$_{a1252}$
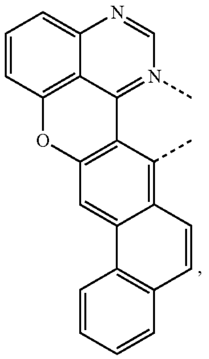
L$_{a1253}$
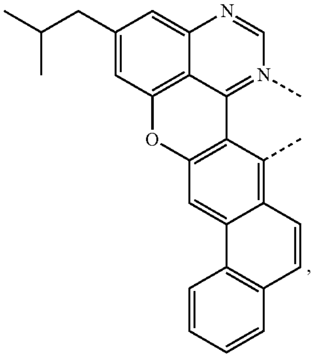
L$_{a1254}$
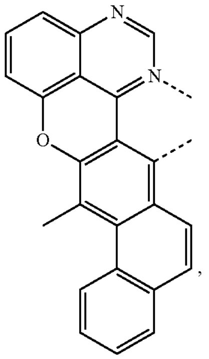

-continued
$L_{a1255}$
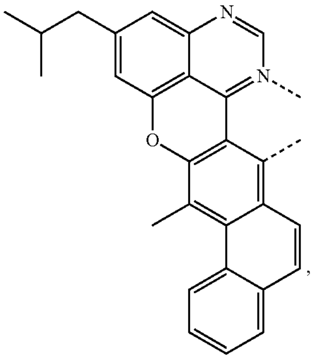
$L_{a1256}$
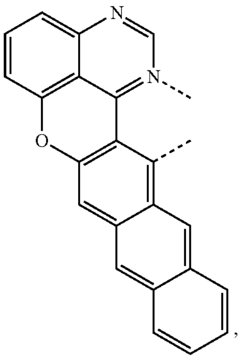
$L_{a1257}$
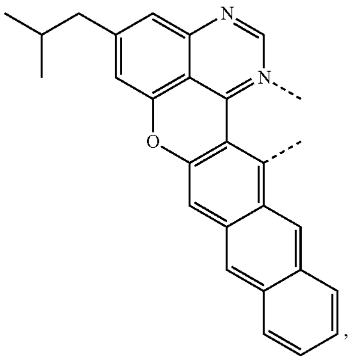
$L_{a1258}$
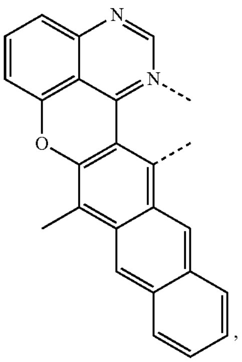
-continued
$L_{a1259}$
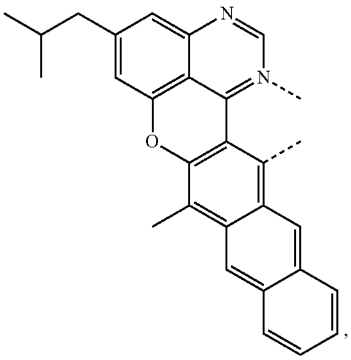
$L_{a1260}$
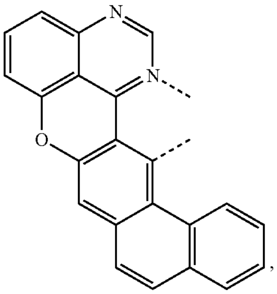
$L_{a1261}$
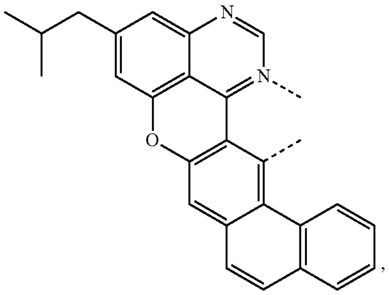
$L_{a1262}$
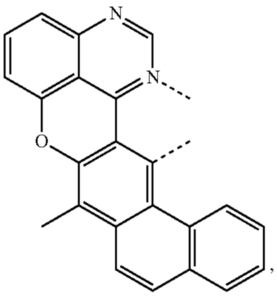
$L_{a1263}$
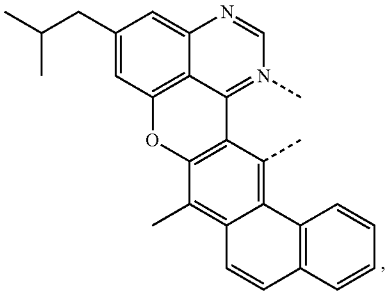

-continued
$L_{a1264}$
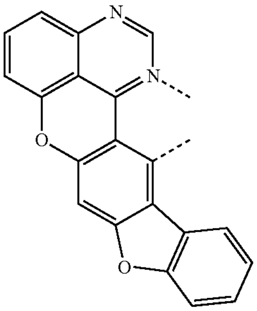
,
$L_{a1265}$
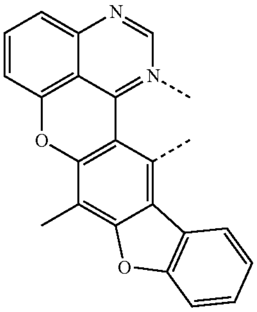
,
$L_{a1266}$
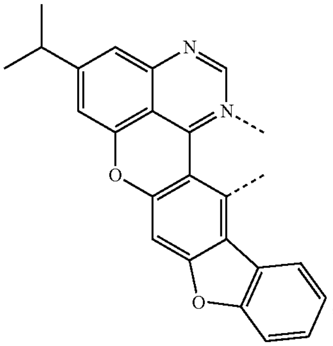
,
$L_{a1267}$
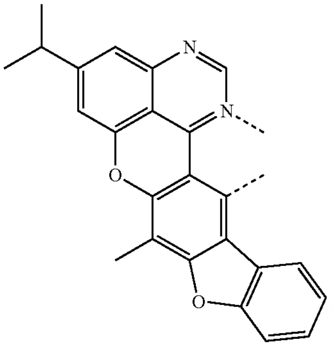
,
-continued
$L_{a1268}$
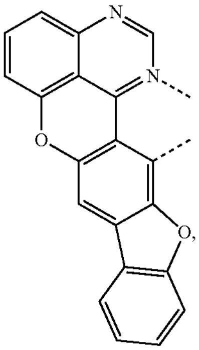
,
$L_{a1269}$
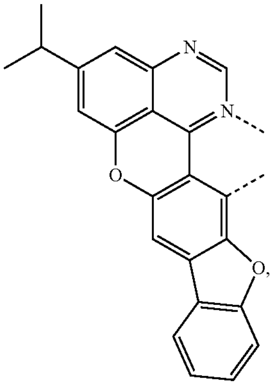
,
$L_{a1270}$
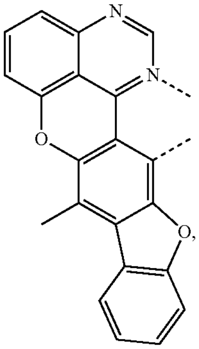
,
$L_{a1271}$
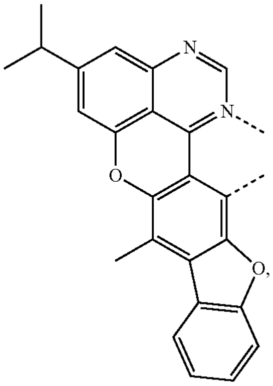
, -continued
$L_{a1272}$
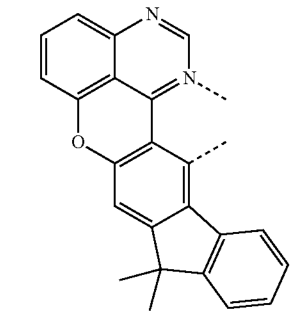
,
$L_{a1273}$
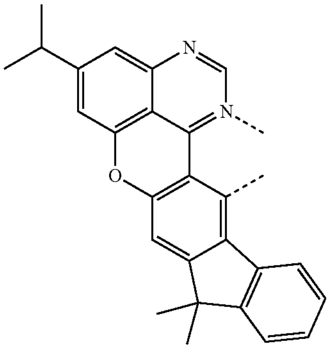
,
$L_{a1274}$
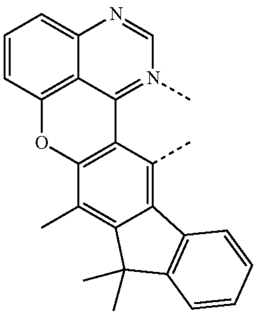
,
$L_{a1275}$
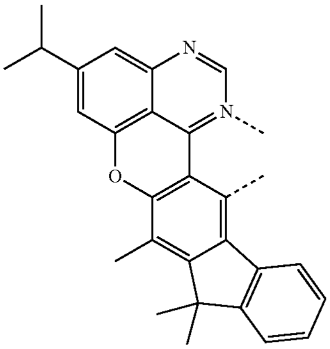
,
-continued
$L_{a1276}$
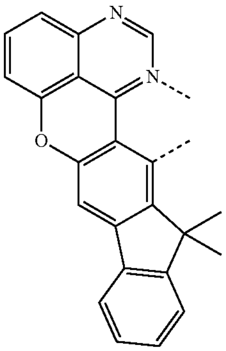
,
$L_{a1277}$
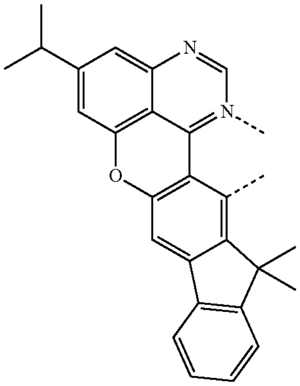
,
$L_{a1278}$
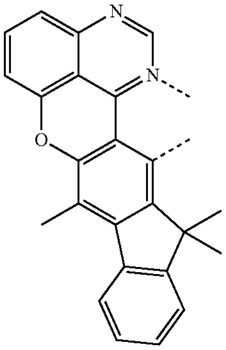
,
$L_{a1279}$
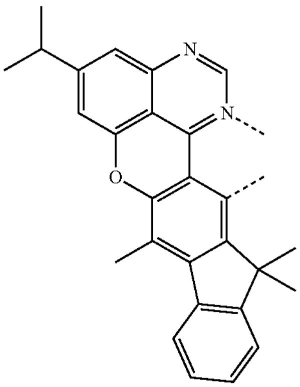
, $L_{a1280}$
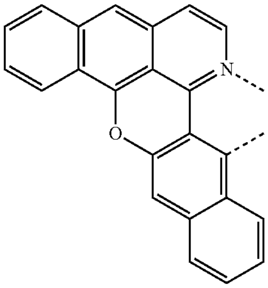,
$L_{a1281}$
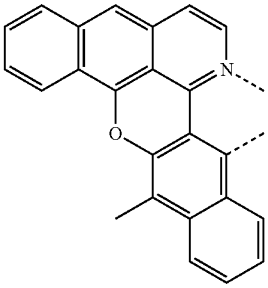,
$L_{a1282}$
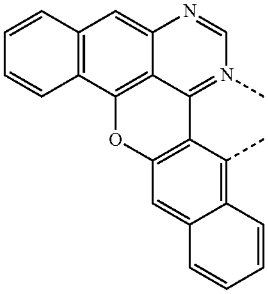,
$L_{a1283}$
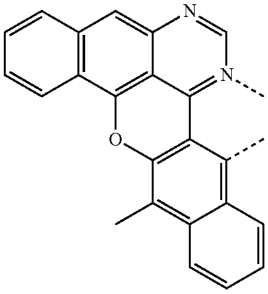,
$L_{a1284}$
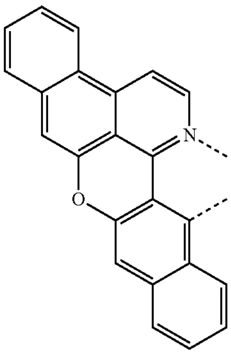,
$L_{a1285}$
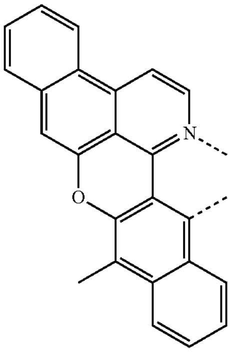,
$L_{a1286}$
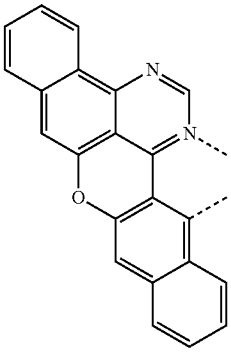,
$L_{a1287}$
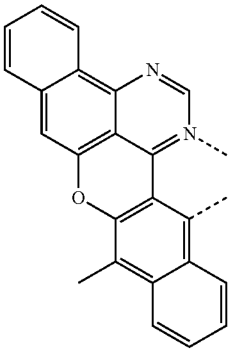,
$L_{a1292}$
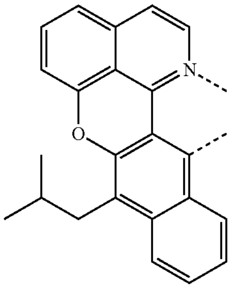, -continued
L$_{a1293}$
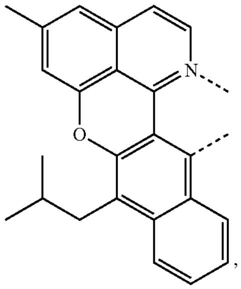
L$_{a1294}$
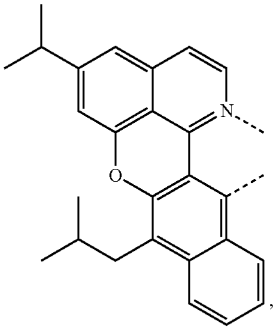
L$_{a1295}$
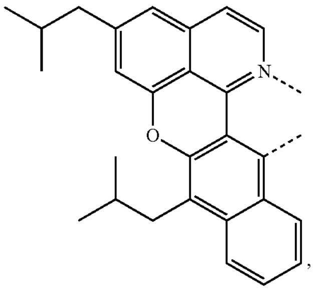
L$_{a1296}$
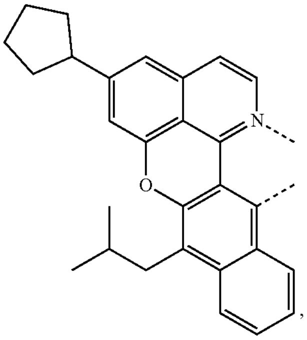
L$_{a1297}$
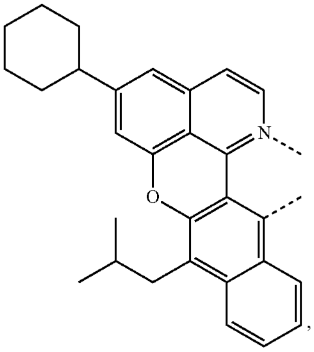
-continued
L$_{a1298}$
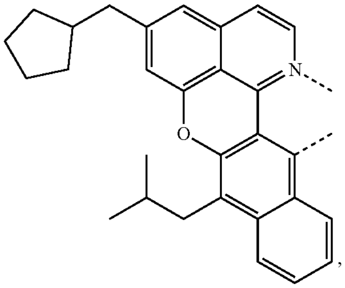
L$_{a1299}$
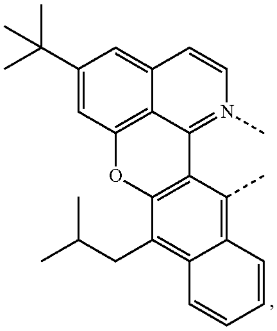
L$_{a1300}$
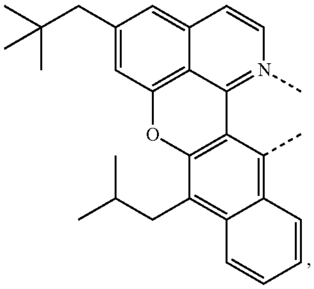
L$_{a1301}$
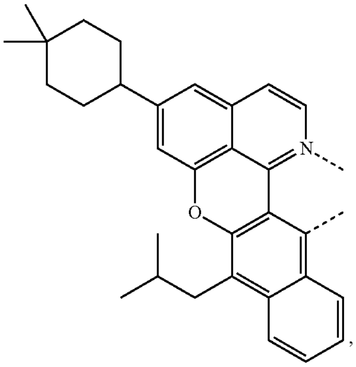

-continued
L$_{a1302}$
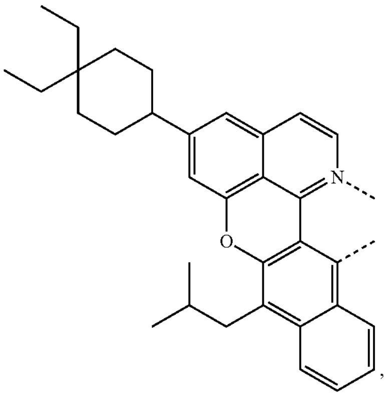
,
L$_{a1303}$
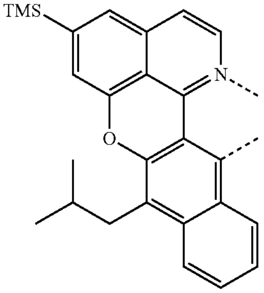
,
L$_{a1304}$
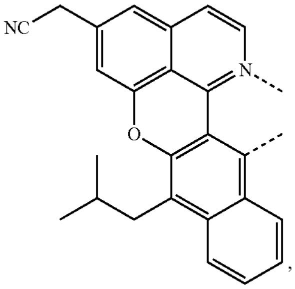
,
L$_{a1305}$
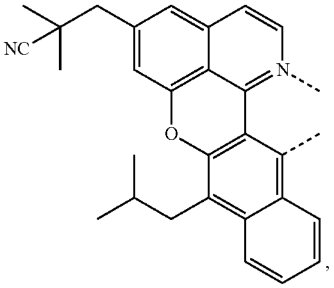
,
L$_{a1306}$
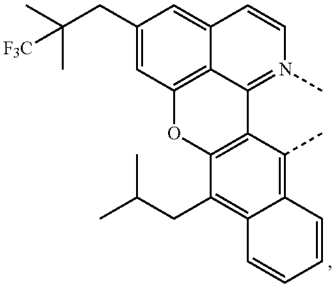
,
-continued
L$_{a1307}$
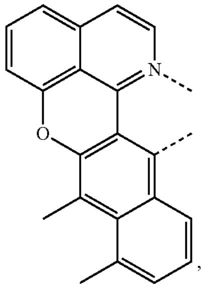
,
L$_{a1308}$
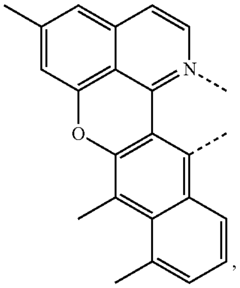
,
L$_{a1309}$
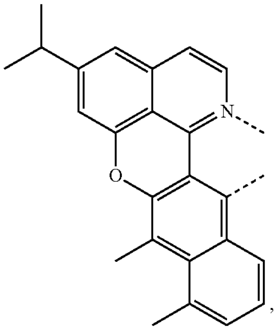
,
L$_{a1310}$
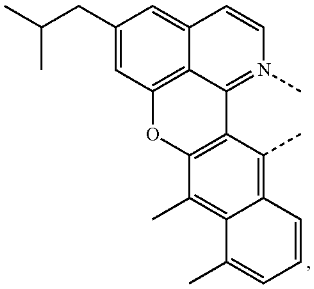
,
L$_{a1311}$
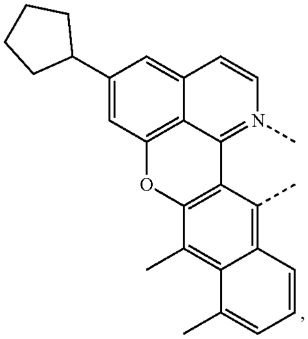
, -continued
$L_{a1312}$
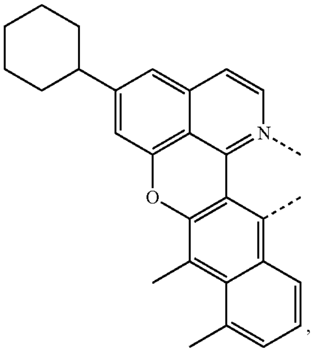
$L_{a1313}$
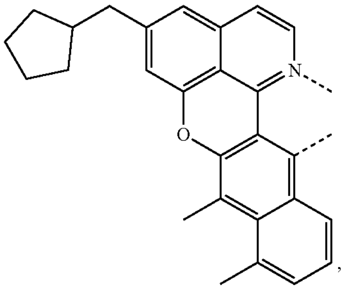
$L_{a1314}$
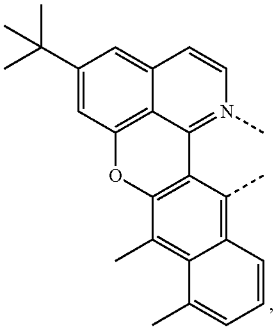
$L_{a1315}$
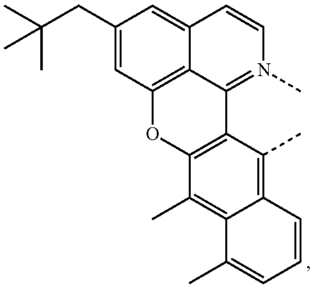
-continued
$L_{a1316}$
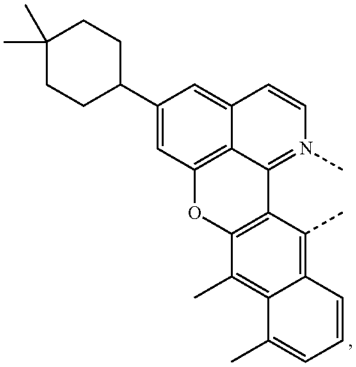
$L_{a1317}$
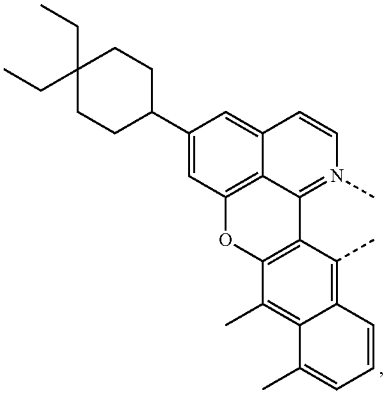
$L_{a1318}$
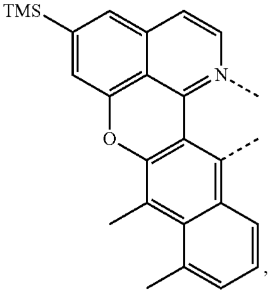
$L_{a1319}$
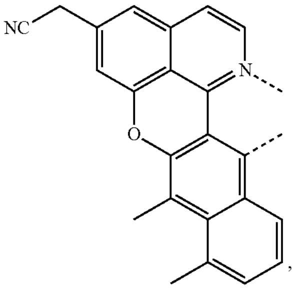

-continued
$L_{a1320}$
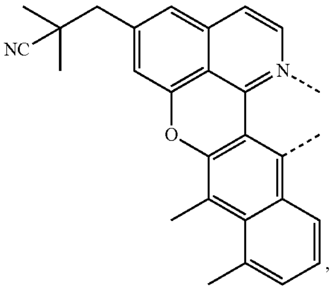
$L_{a1321}$
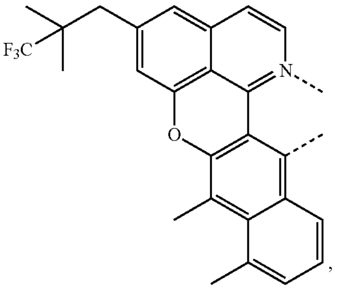
$L_{a1322}$
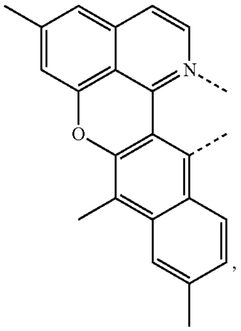
$L_{a1323}$
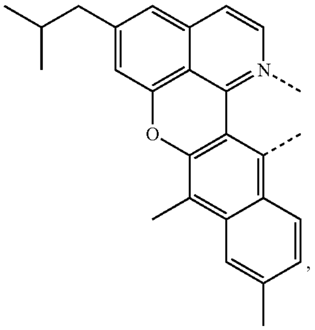
-continued
$L_{a1324}$
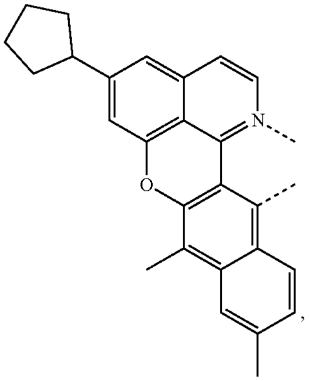
$L_{a1325}$
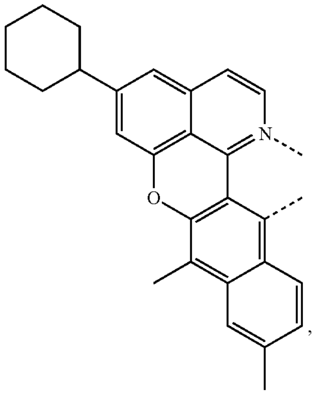
$L_{a1326}$
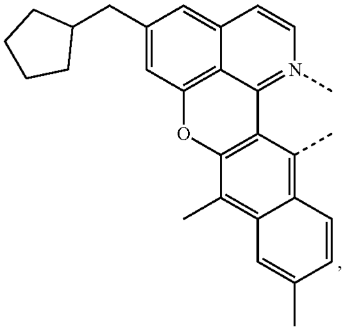
$L_{a1327}$
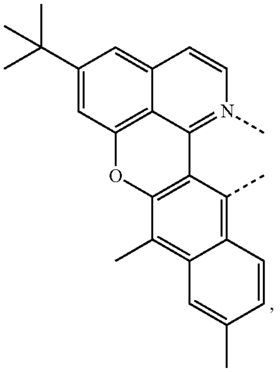

-continued
$L_{a1328}$
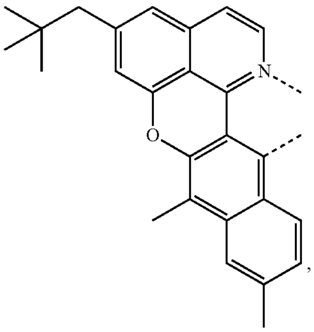
$L_{a1329}$
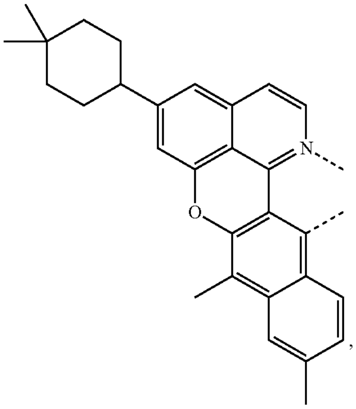
$L_{a1330}$
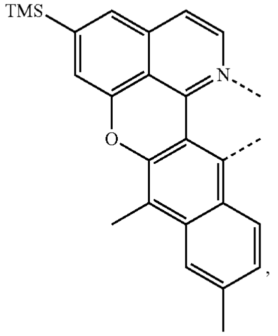
$L_{a1331}$
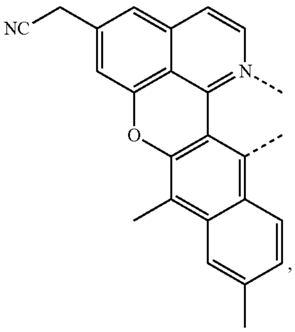
-continued
$L_{a1332}$
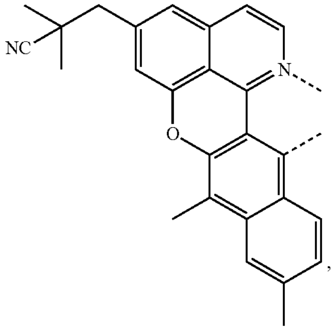
$L_{a1333}$
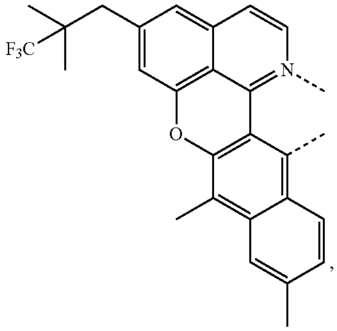
$L_{a1334}$
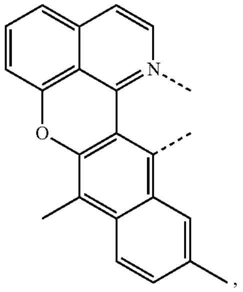
$L_{a1335}$
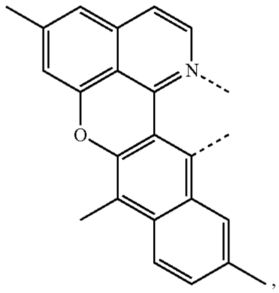
$L_{a1336}$
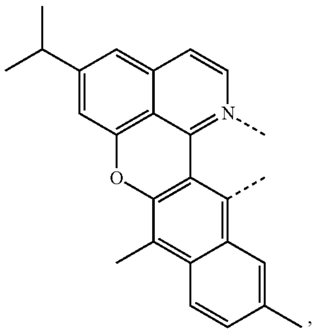

-continued
$L_{a1337}$
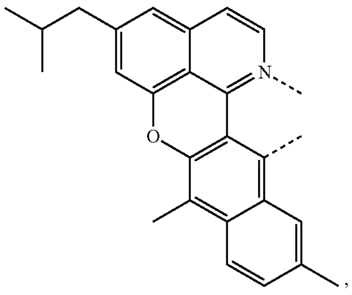
$L_{a1338}$
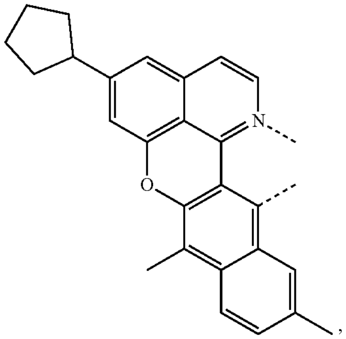
$L_{a1339}$
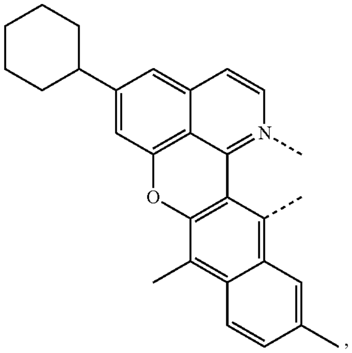
$L_{a1340}$
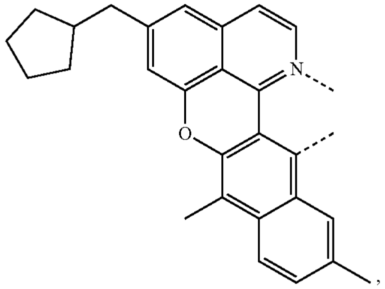
$L_{a1341}$
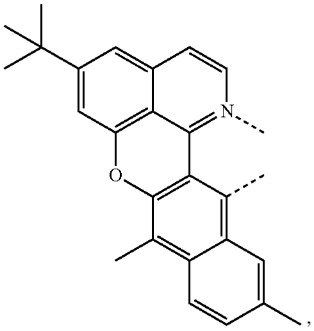
-continued
$L_{a1342}$
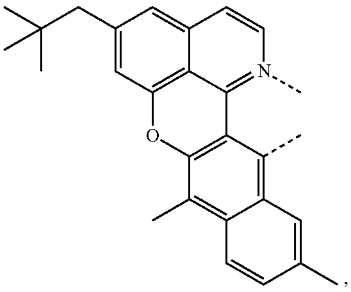
$L_{a1343}$
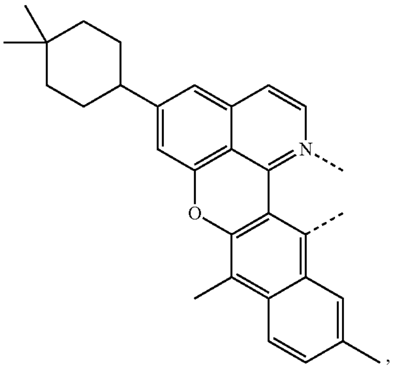
$L_{a1344}$
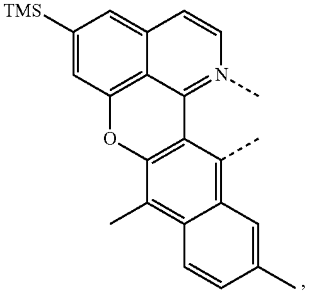
$L_{a1345}$
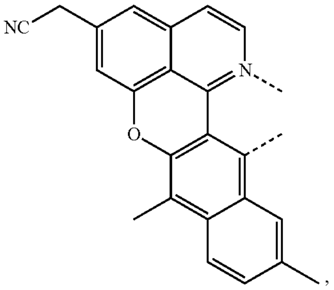
$L_{a1346}$
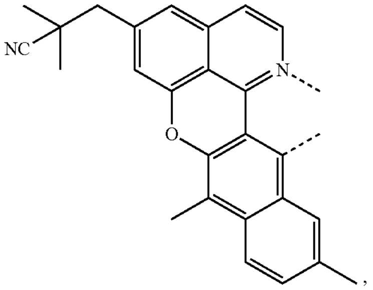

-continued
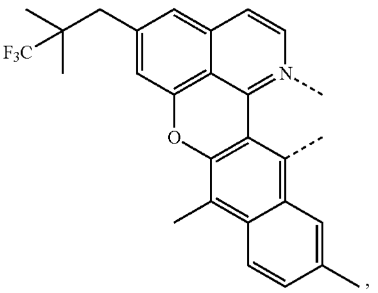
$L_{a1347}$
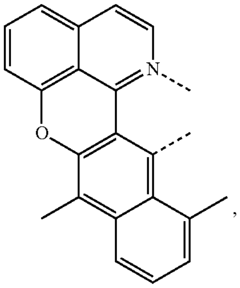
$L_{a1348}$
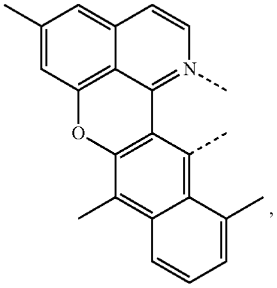
$L_{a1349}$
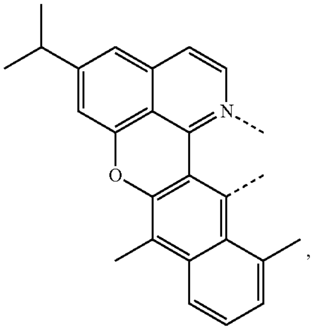
$L_{a1350}$
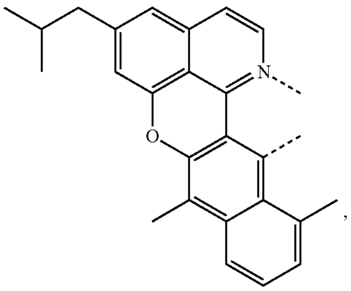
$L_{a1351}$
-continued
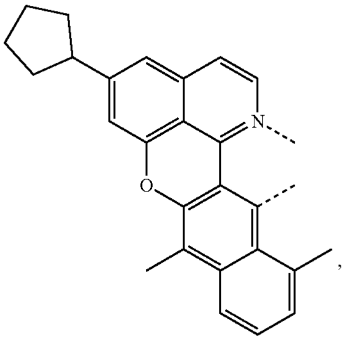
$L_{a1352}$
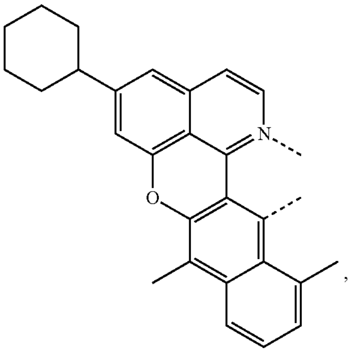
$L_{a1353}$
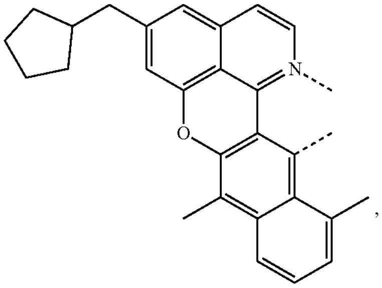
$L_{a1354}$
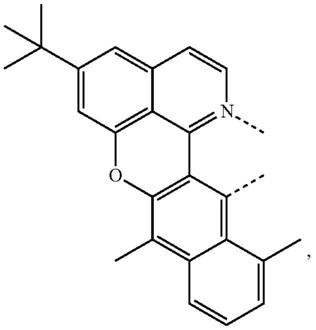
$L_{a1355}$
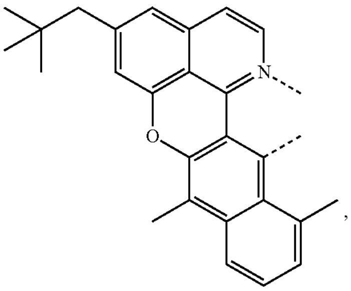
$L_{a1356}$ -continued
$L_{a1357}$
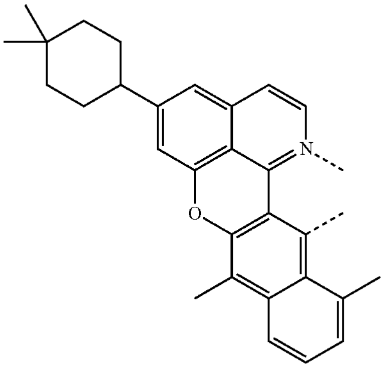
,
$L_{a1358}$
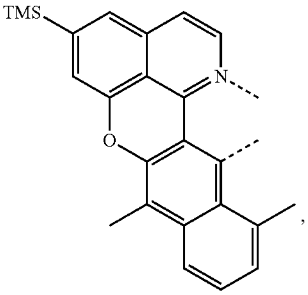
,
$L_{a1359}$
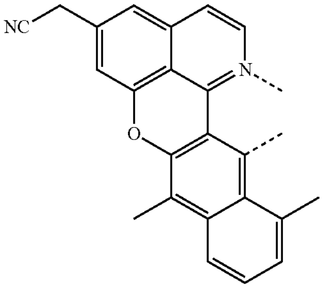
,
$L_{a1360}$
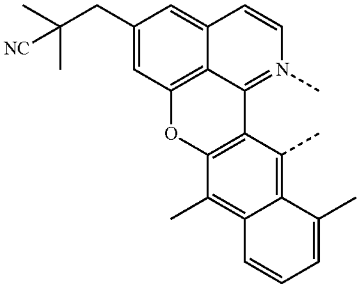
,
$L_{a1361}$
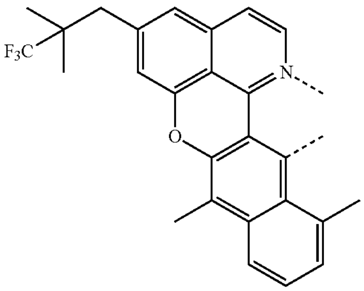
,
-continued
$L_{a1362}$
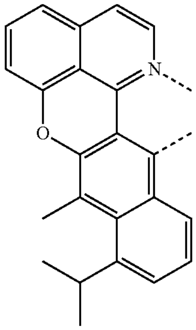
,
$L_{a1363}$
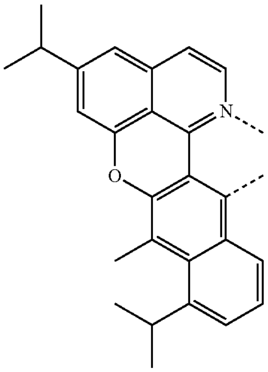
,
$L_{a1364}$
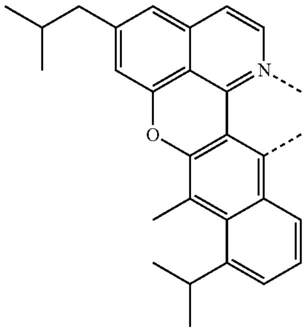
,
$L_{a1365}$
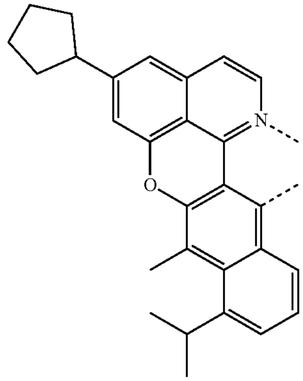
, -continued
$L_{a1366}$
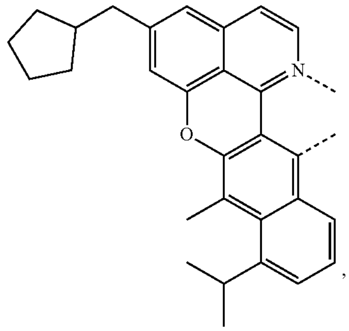
$L_{a1367}$
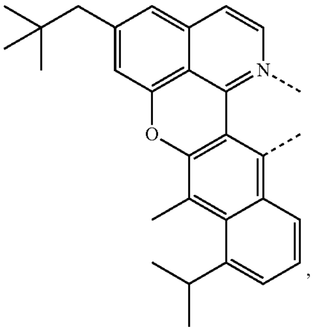
$L_{a1368}$
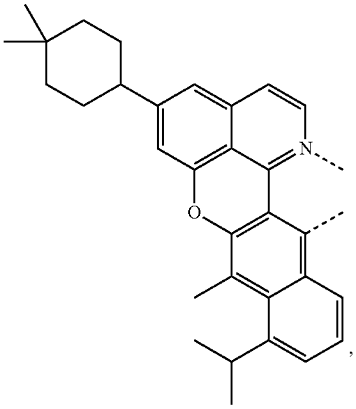
$L_{a1369}$
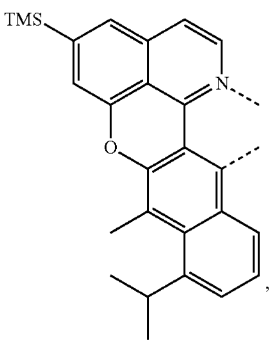
-continued
$L_{a1370}$
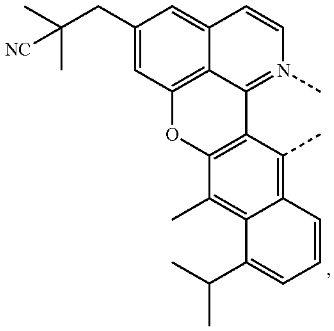
$L_{a1371}$
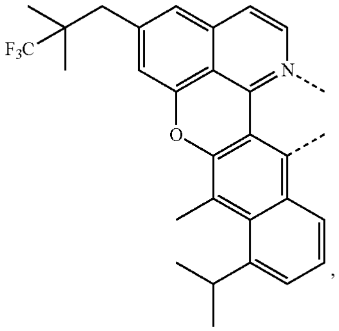
$L_{a1372}$
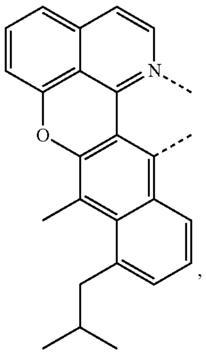
$L_{a1373}$
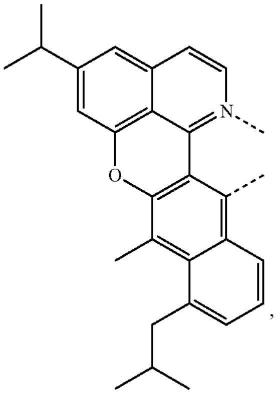

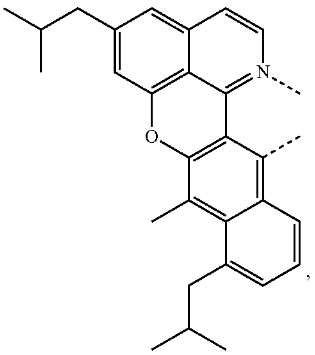
$L_{a1374}$
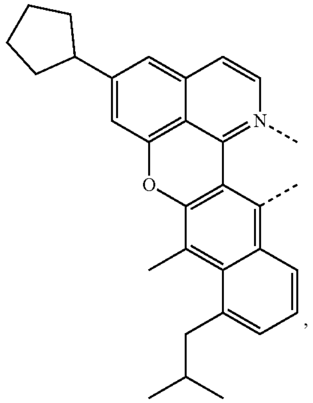
$L_{a1375}$
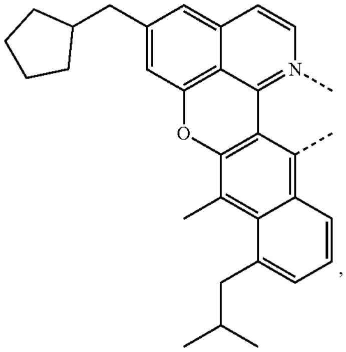
$L_{a1376}$
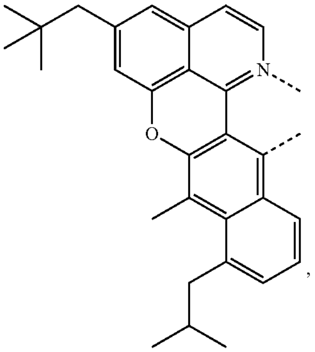
$L_{a1377}$
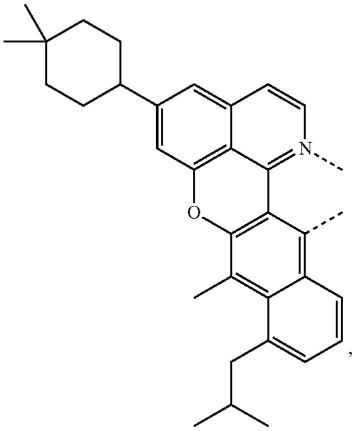
$L_{a1378}$
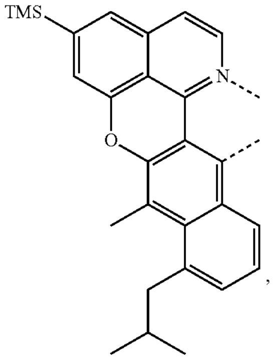
$L_{a1379}$
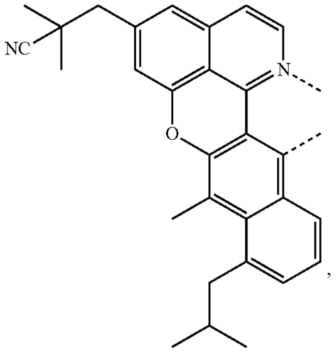
$L_{a1380}$
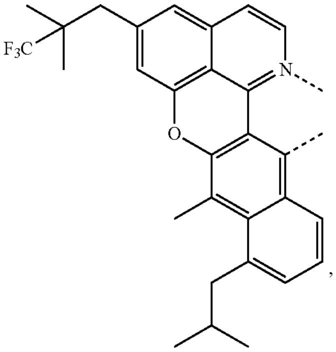
$L_{a1381}$ -continued
L$_{a1382}$
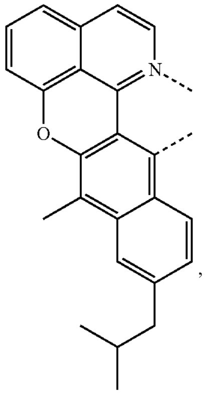
L$_{a1383}$
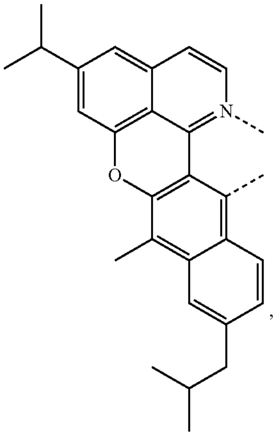
L$_{a1384}$
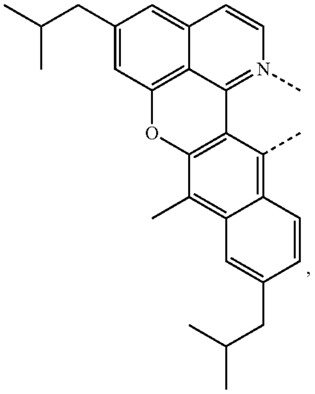
-continued
L$_{a1385}$
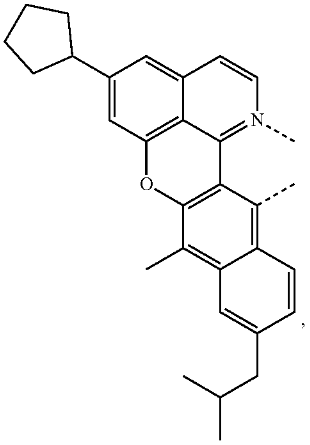
L$_{a1386}$
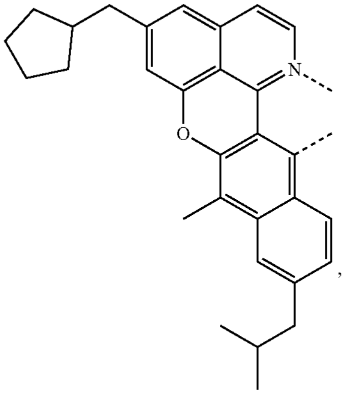
L$_{a1387}$
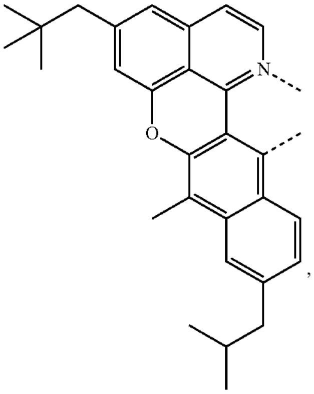

-continued
$L_{a1388}$
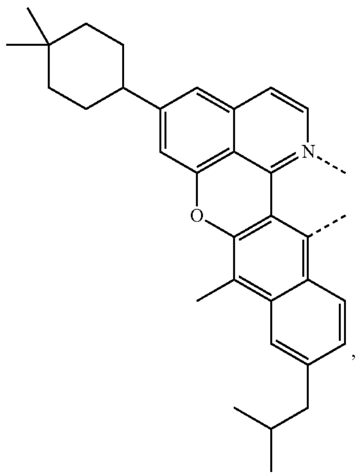
$L_{a1389}$
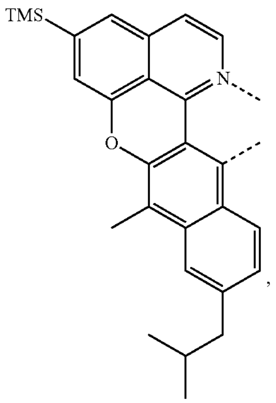
$L_{a1390}$
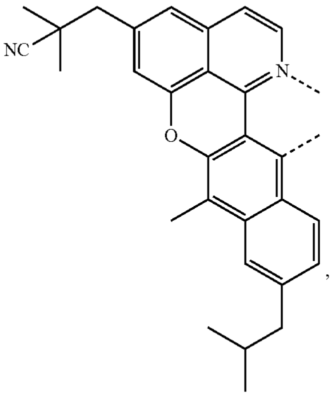
-continued
$L_{a1391}$
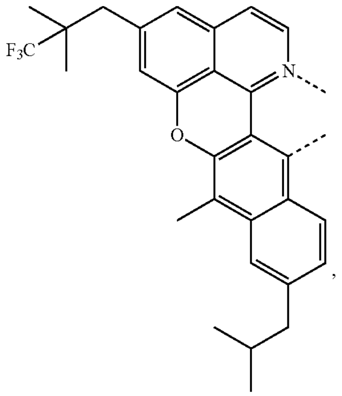
$L_{a1392}$
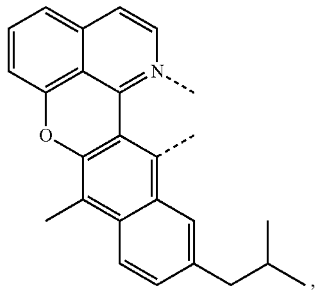
$L_{a1393}$
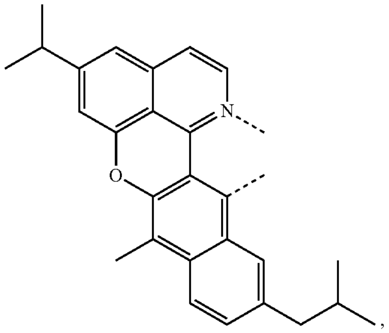
$L_{a1394}$
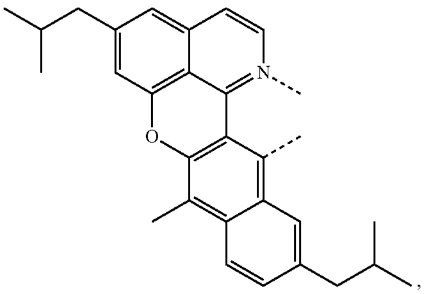

-continued
$L_{a1395}$
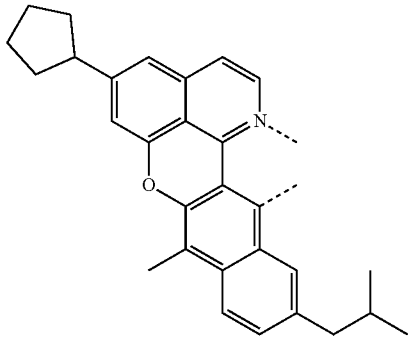
,
$L_{a1396}$
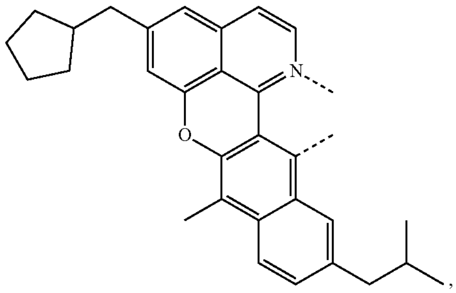
,
$L_{a1397}$
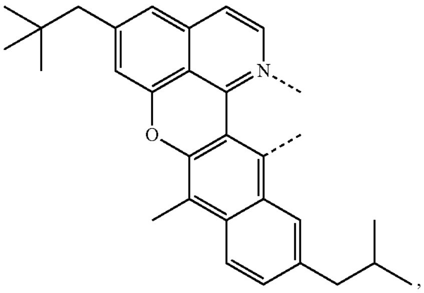
,
$L_{a1398}$
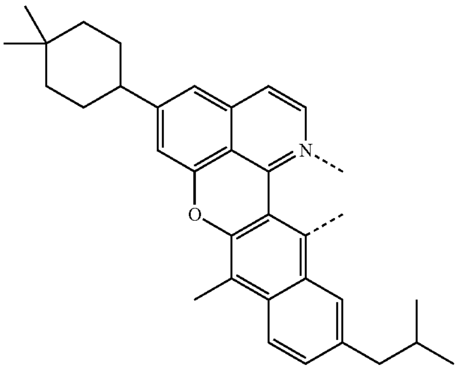
,
$L_{a1399}$
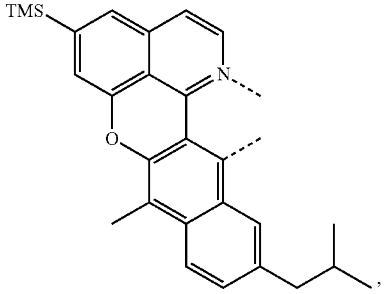
,
-continued
$L_{a1400}$
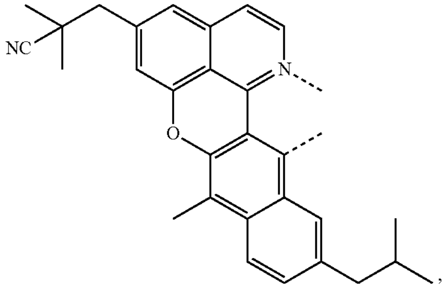
,
$L_{a1401}$
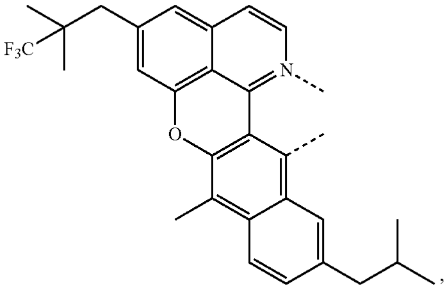
,
$L_{a1402}$
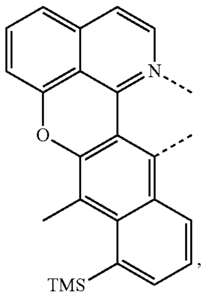
,
$L_{a1403}$
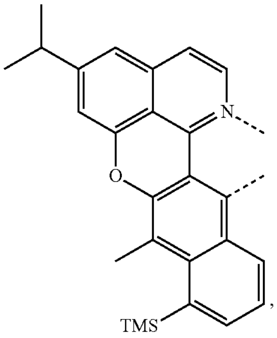
,
$L_{a1404}$
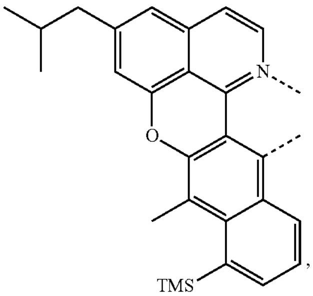
, -continued
$L_{a1405}$
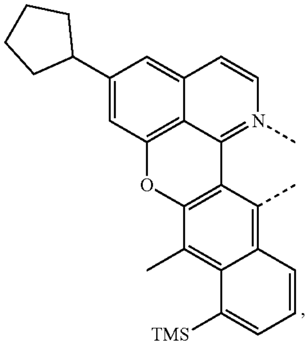
$L_{a1406}$
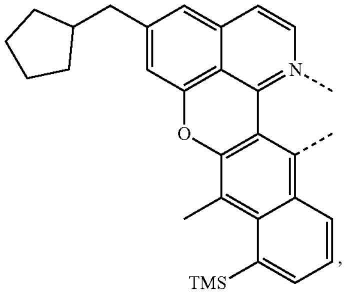
$L_{a1407}$
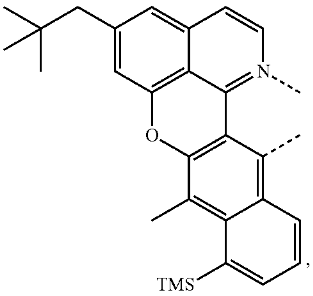
$L_{a1408}$
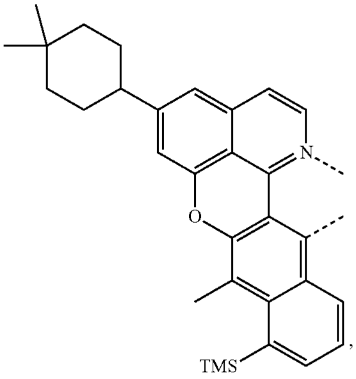
$L_{a1409}$
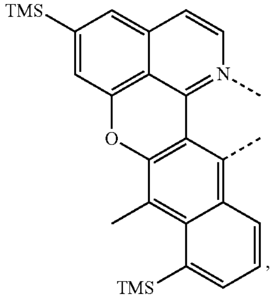
-continued
$L_{a1410}$
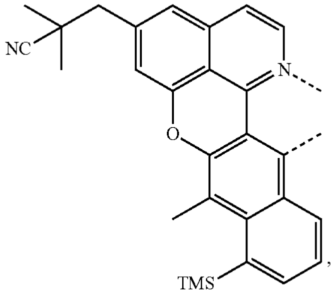
$L_{a1411}$
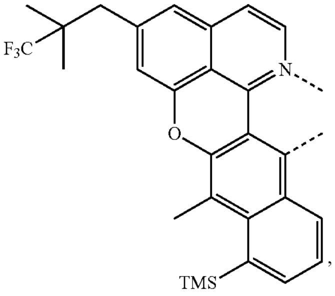
$L_{a1412}$
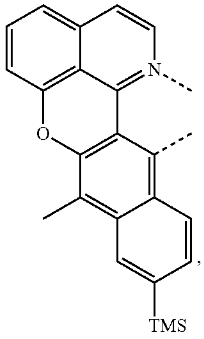
$L_{a1413}$
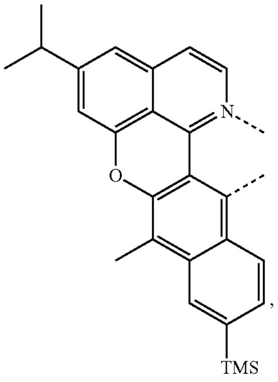

-continued
L$_{a1414}$
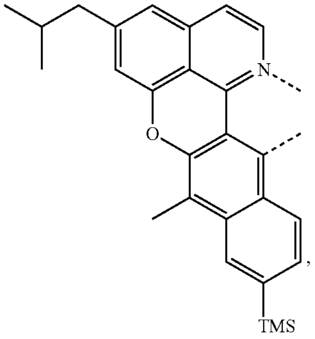
L$_{a1415}$
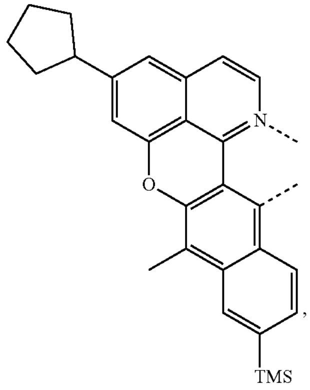
L$_{a1416}$
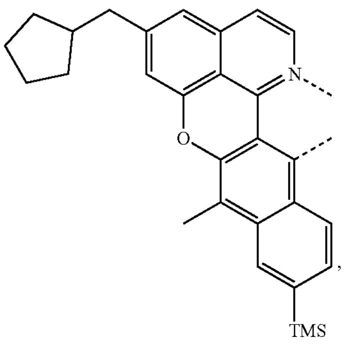
L$_{a1417}$
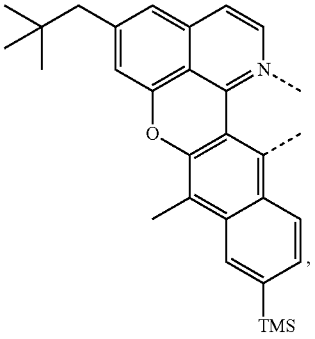
-continued
L$_{a1418}$
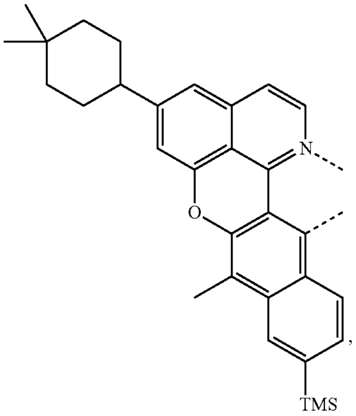
L$_{a1419}$
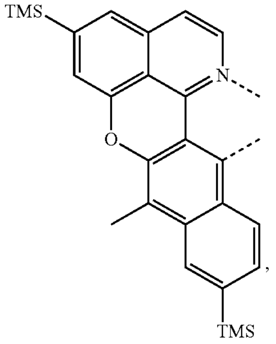
L$_{a1420}$
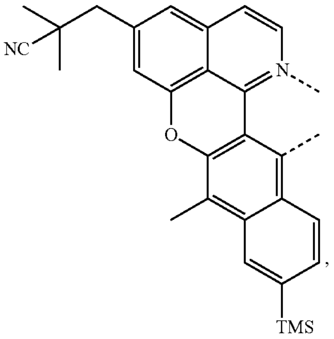
L$_{a1421}$
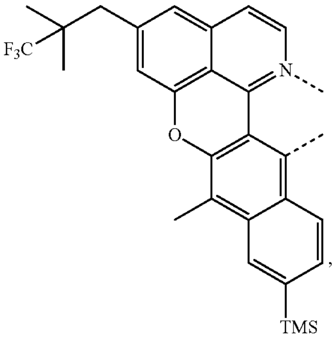

-continued
$L_{a1422}$
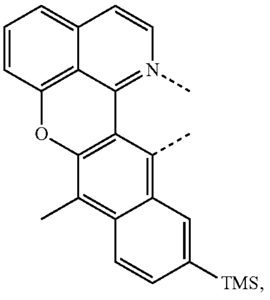
$L_{a1423}$
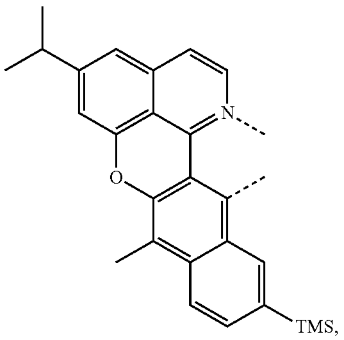
$L_{a1424}$
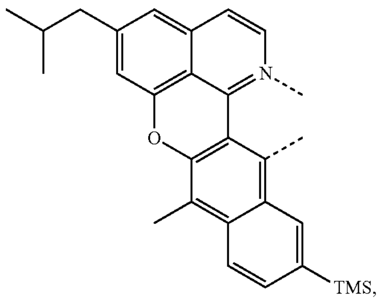
$L_{a1425}$
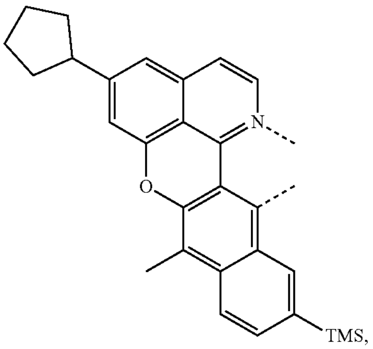
$L_{a1426}$
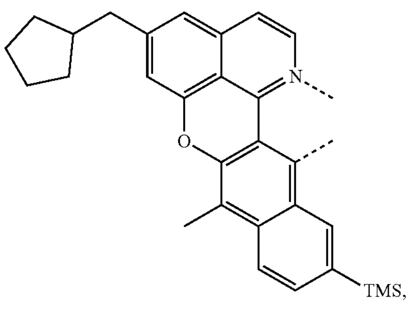
-continued
$L_{a1427}$
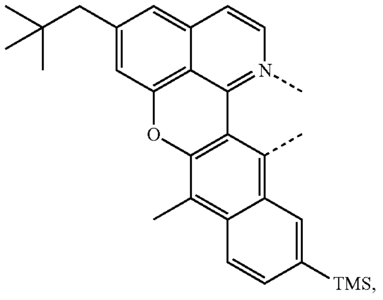
$L_{a1428}$
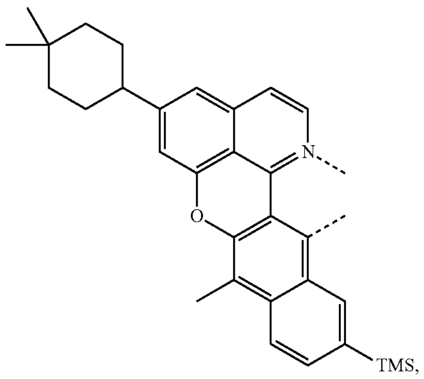
$L_{a1429}$
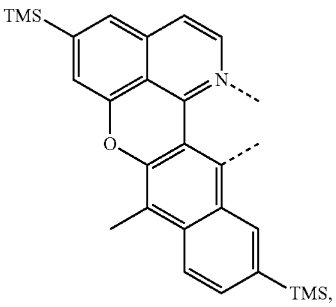
$L_{a1430}$
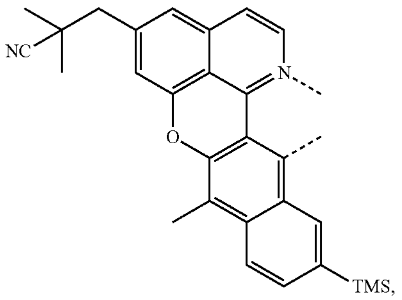
$L_{a1431}$
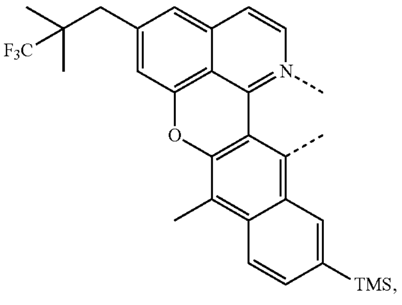

$L_{a1432}$
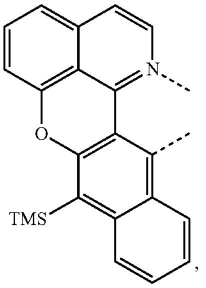
$L_{a1433}$
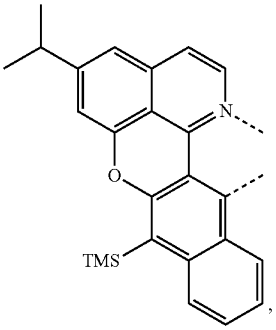
$L_{a1434}$
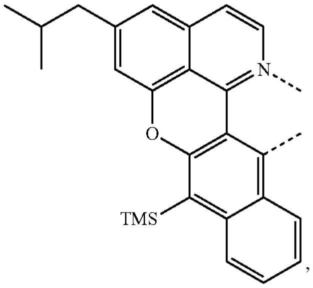
$L_{a1435}$
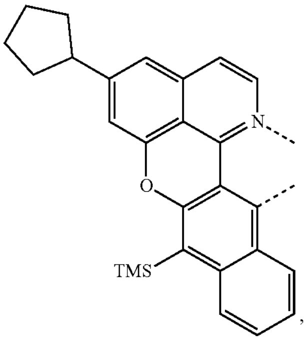
$L_{a1436}$
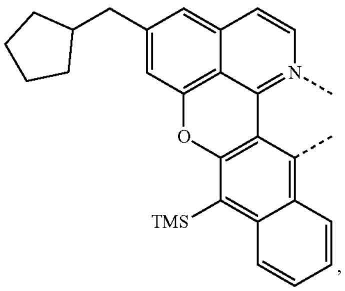
$L_{a1437}$
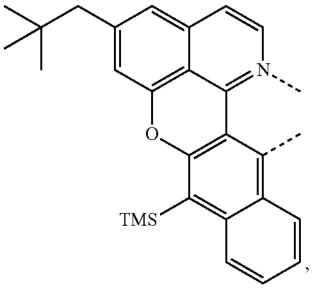
$L_{a1438}$
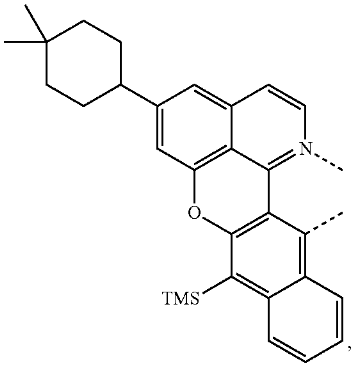
$L_{a1439}$
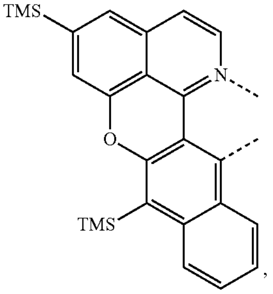
$L_{a1440}$
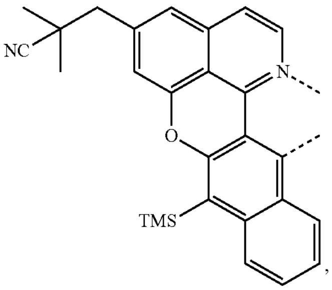
$L_{a1441}$
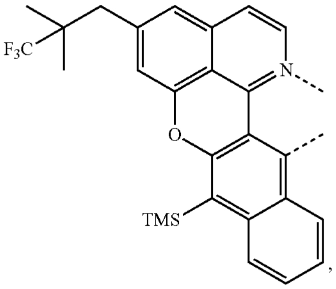

-continued
$L_{a1442}$
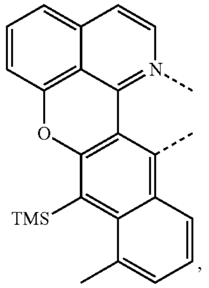
$L_{a1443}$
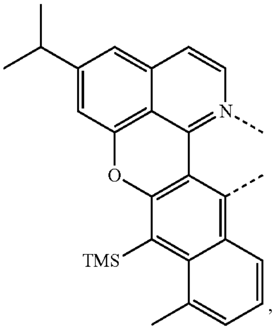
$L_{a1444}$
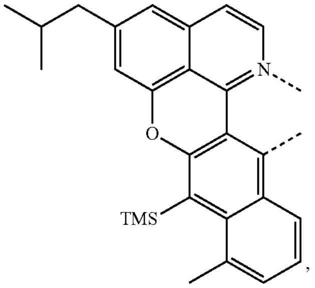
$L_{a1445}$
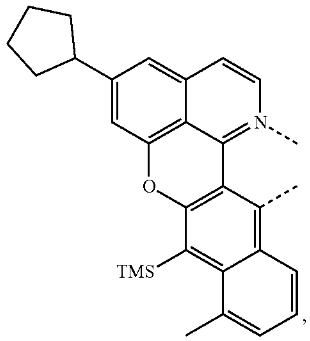
$L_{a1446}$
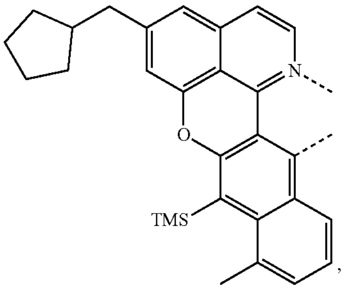
-continued
$L_{a1447}$
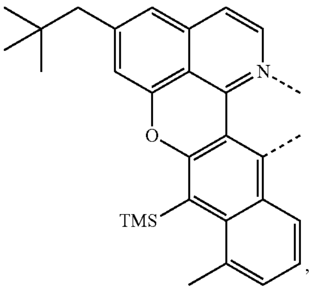
$L_{a1448}$
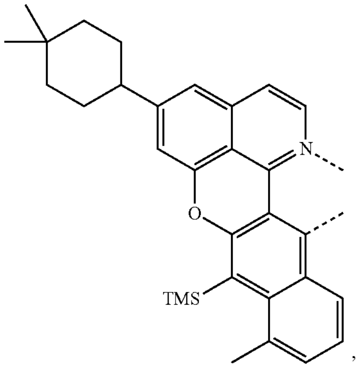
$L_{a1449}$
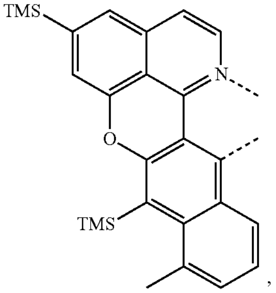
$L_{a1450}$
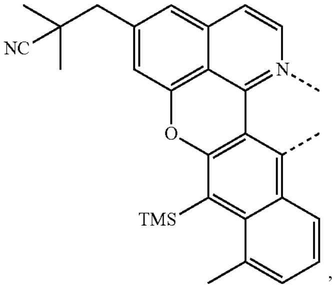

-continued
L$_{a1451}$
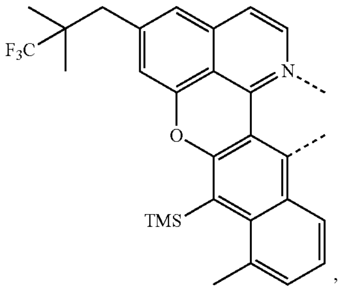
L$_{a1452}$
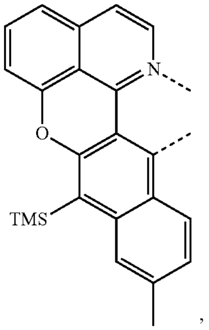
L$_{a1453}$
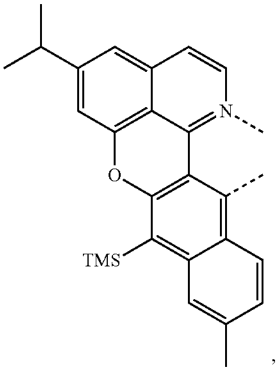
L$_{a1454}$
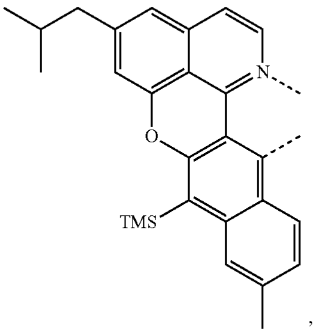
-continued
L$_{a1455}$
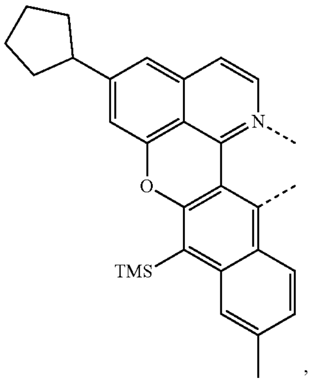
L$_{a1456}$
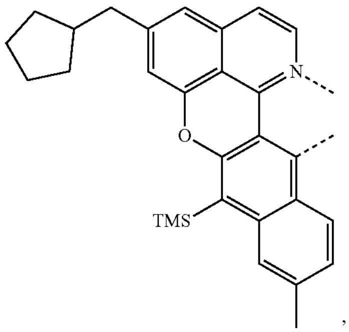
L$_{a1457}$
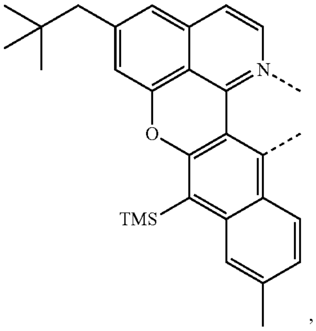
L$_{a1458}$
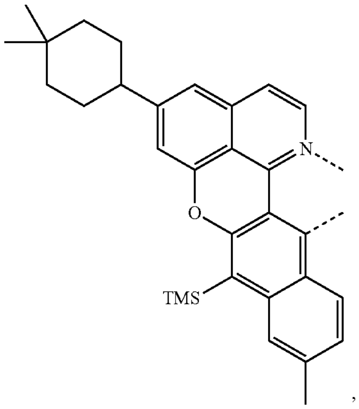

-continued
$L_{a1459}$
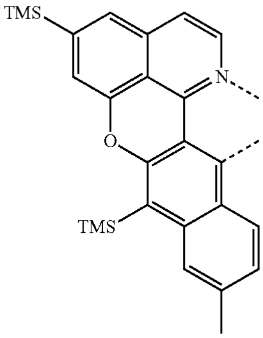
,
$L_{a1460}$
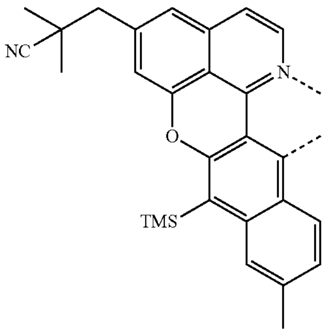
,
$L_{a1461}$
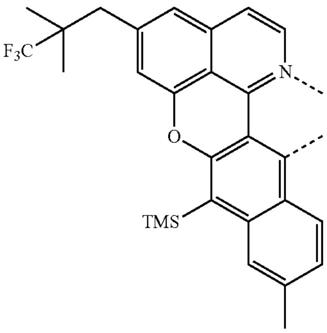
,
$L_{a1462}$
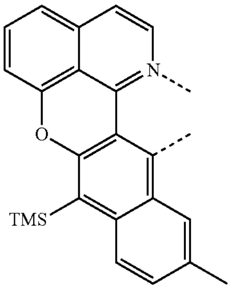
,
-continued
$L_{a1463}$
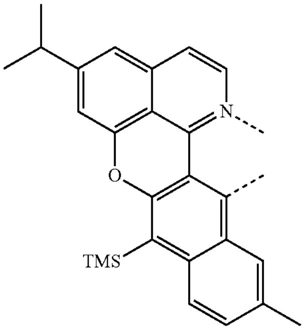
,
$L_{a1464}$
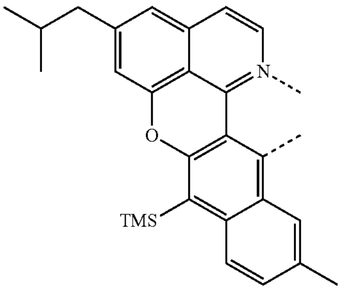
,
$L_{a1465}$
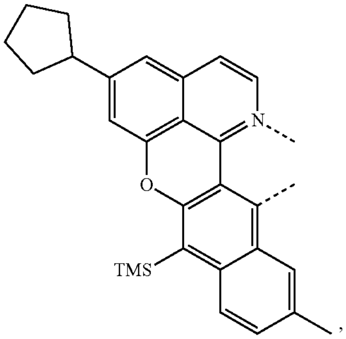
,
$L_{a1466}$
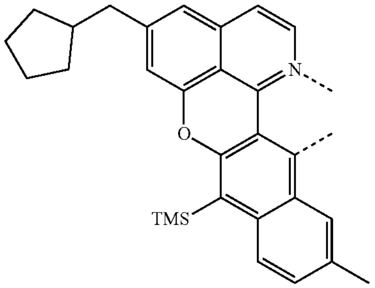
,
$L_{a1467}$
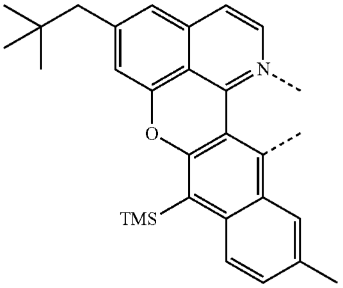
, -continued
$L_{a1468}$
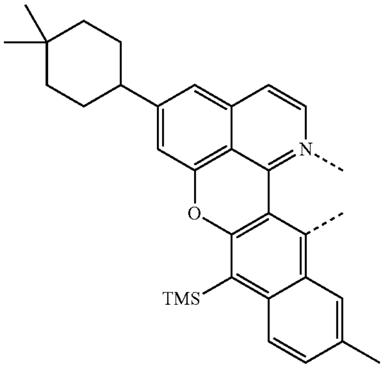
,
$L_{a1469}$
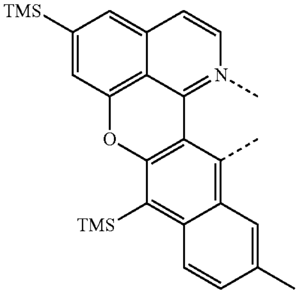
,
$L_{a1470}$
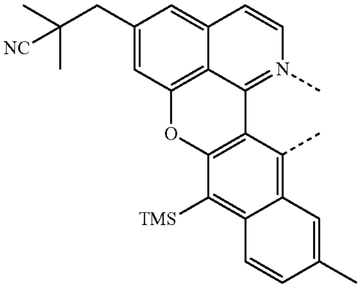
,
$L_{a1471}$
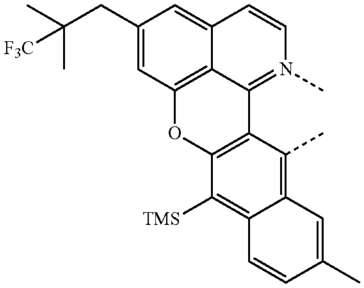
,
$L_{a1472}$
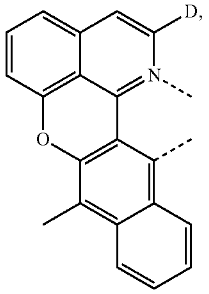
-continued
$L_{a1473}$
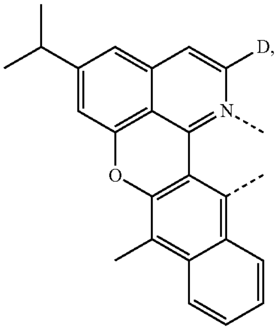
$L_{a1474}$
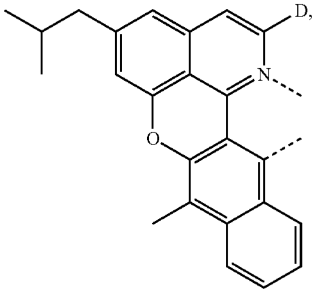
$L_{a1475}$
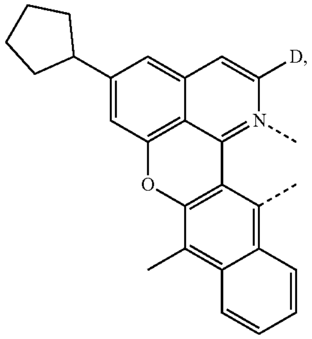
$L_{a1476}$
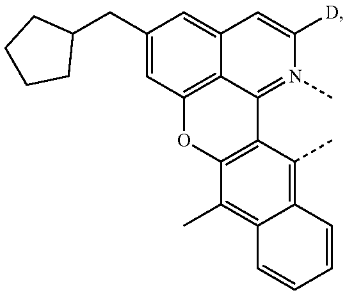
$L_{a1477}$
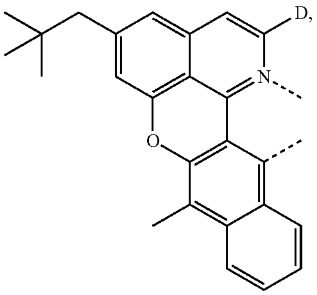

-continued
$L_{a1478}$
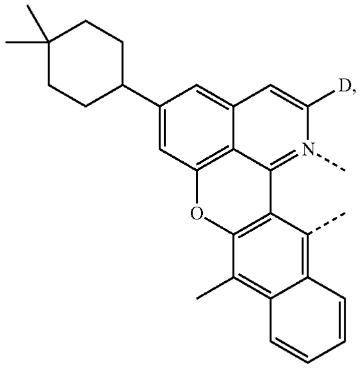
$L_{a1479}$
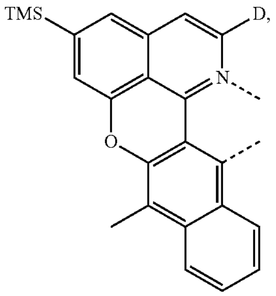
$L_{a1480}$
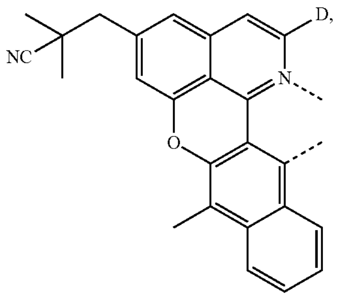
$L_{a1481}$
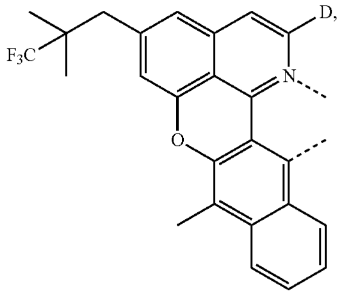
$L_{a1482}$
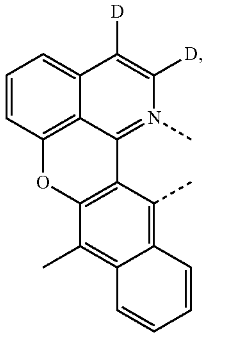
-continued
$L_{a1483}$
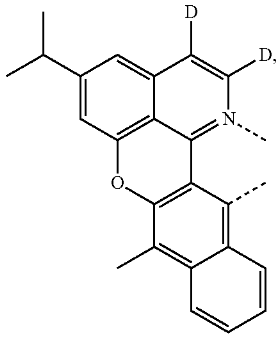
$L_{a1484}$
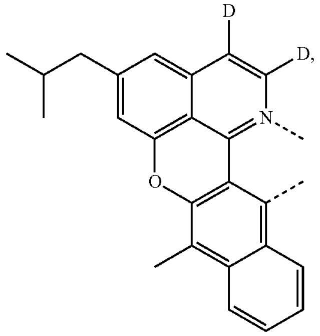
$L_{a1485}$
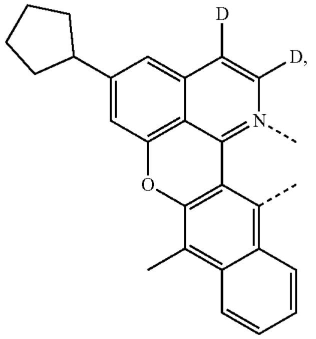
$L_{a1486}$
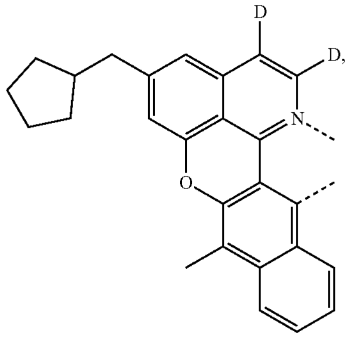

-continued
$L_{a1487}$
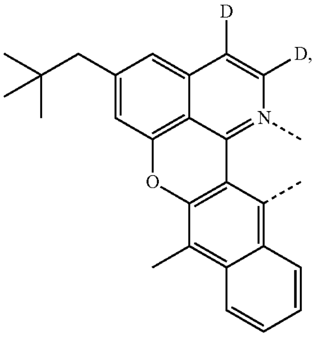
$L_{a1488}$
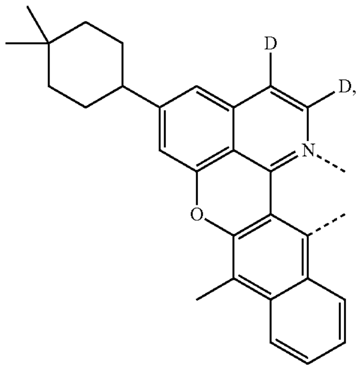
$L_{a1489}$
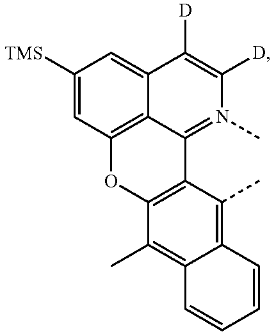
$L_{a1490}$
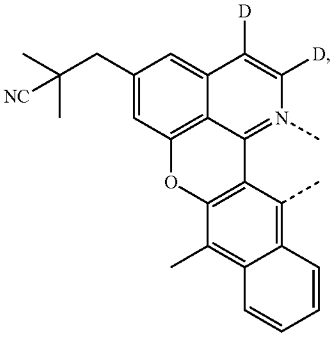
-continued
$L_{a1491}$
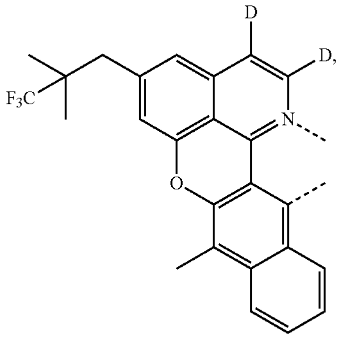
$L_{a1492}$
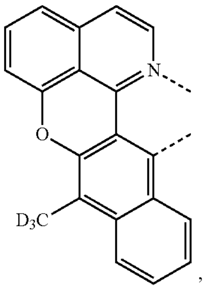
$L_{a1493}$
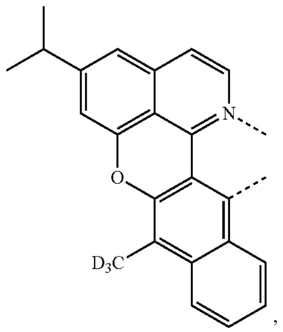
$L_{a1494}$
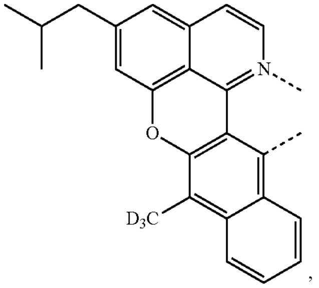
$L_{a1495}$
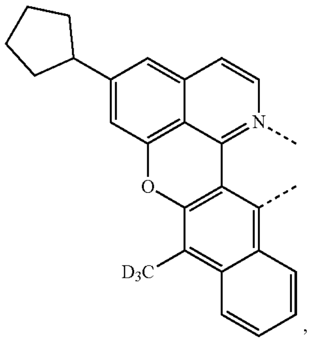

-continued
$L_{a1496}$
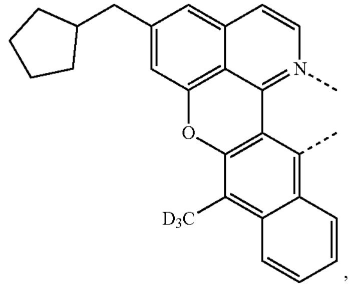
$L_{a1497}$
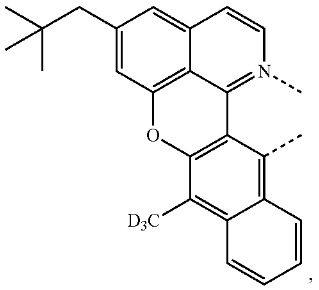
$L_{a1498}$
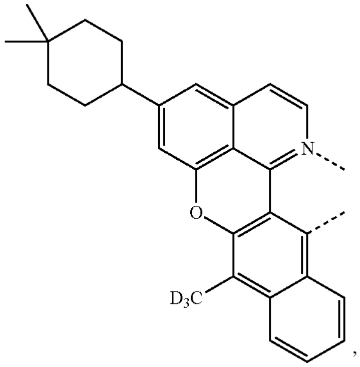
$L_{a1499}$
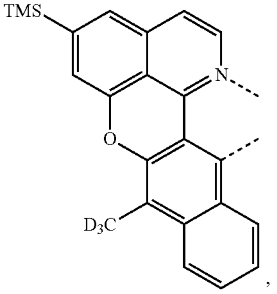
$L_{a1500}$
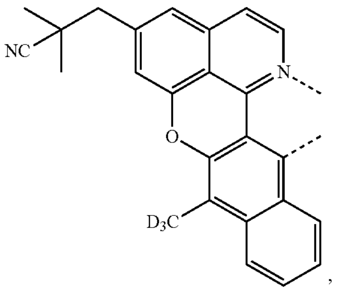
-continued
$L_{a1501}$
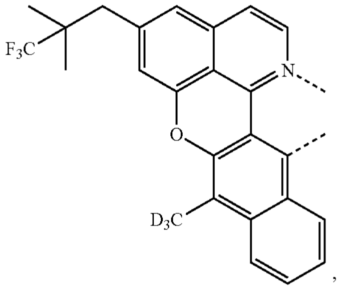
$L_{a1502}$
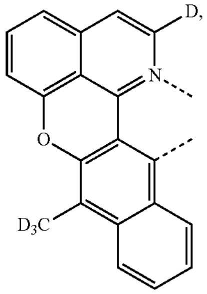
$L_{a1503}$
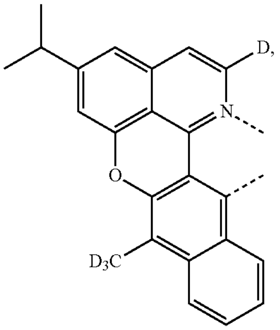
$L_{a1504}$
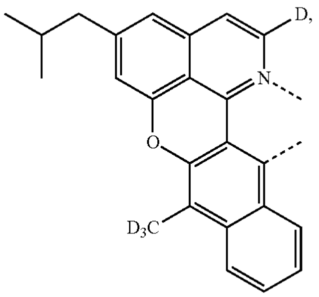
$L_{a1505}$
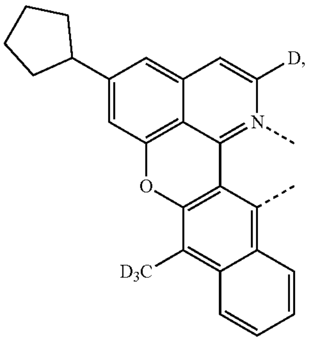

-continued
$L_{a1506}$
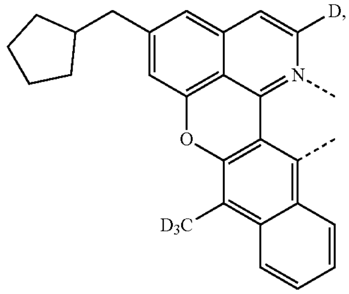
$L_{a1507}$
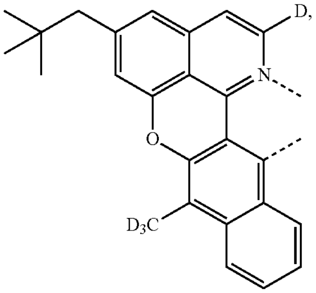
$L_{a1508}$
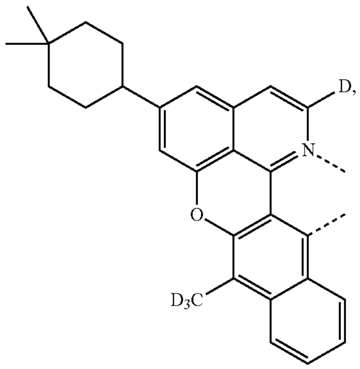
$L_{a1509}$
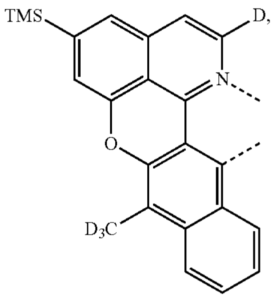
$L_{a1510}$
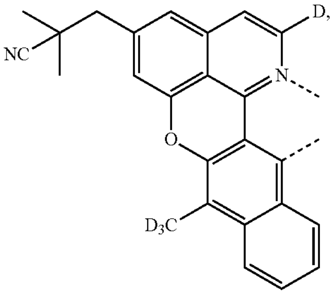
-continued
$L_{a1511}$
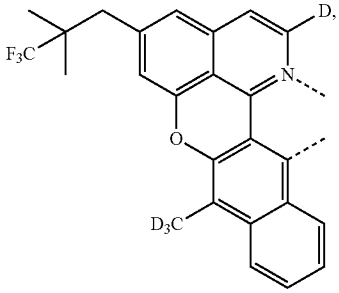
$L_{a1512}$
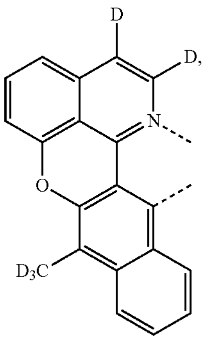
$L_{a1513}$
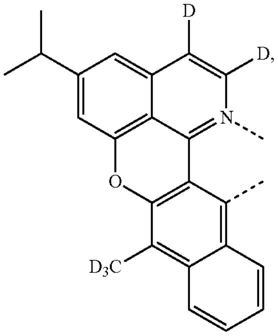
$L_{a1514}$
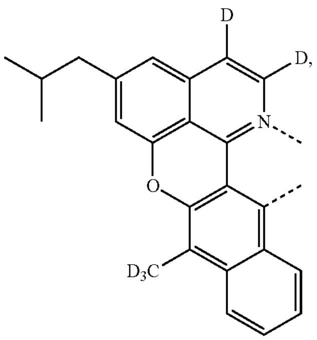

-continued
$L_{a1515}$
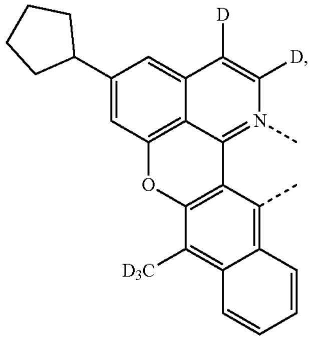
$L_{a1516}$
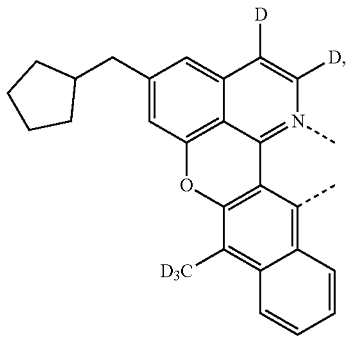
$L_{a1517}$
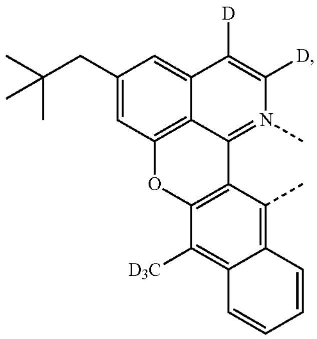
$L_{a1518}$
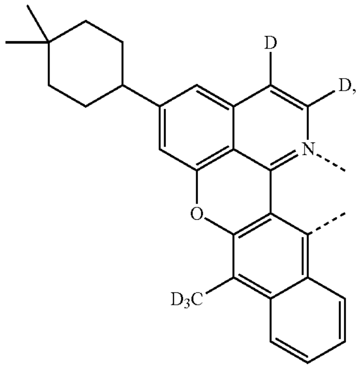
-continued
$L_{a1519}$
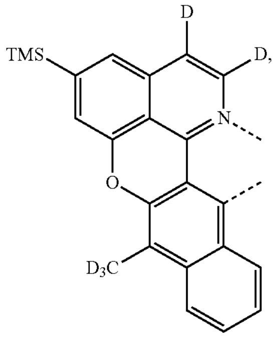
$L_{a1520}$
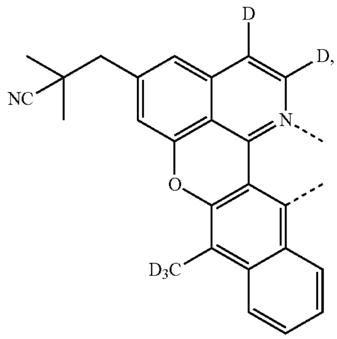
$L_{a1521}$
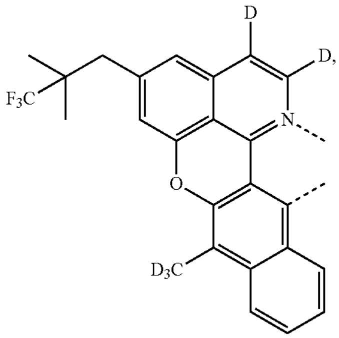
$L_{a1522}$
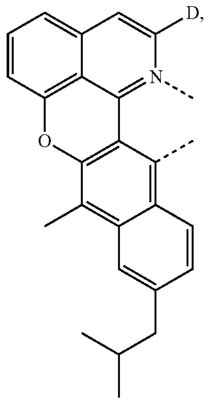

-continued
$L_{a1523}$
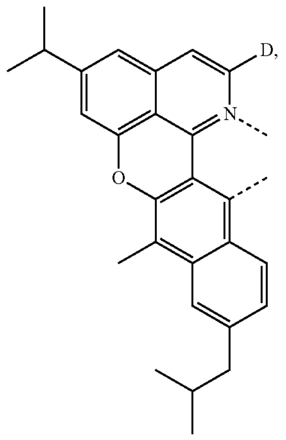
$L_{a1524}$
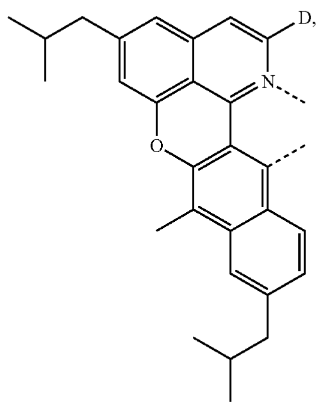
$L_{a1525}$
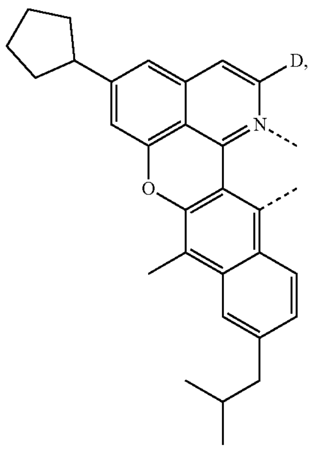
-continued
$L_{a1526}$
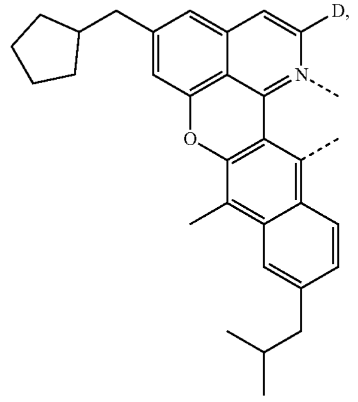
$L_{a1527}$
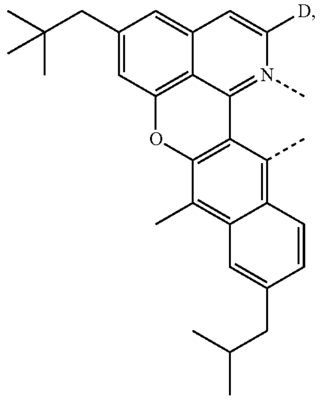
$L_{a1528}$
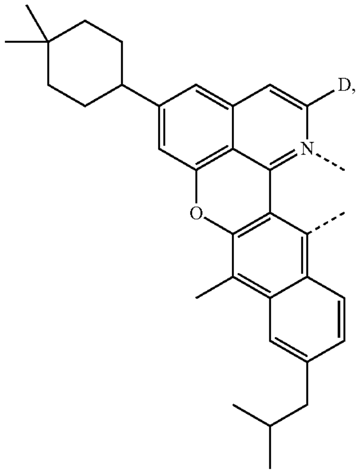

-continued
$L_{a1529}$
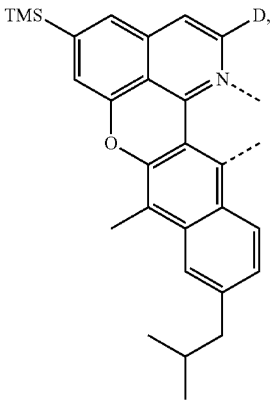
$L_{a1530}$
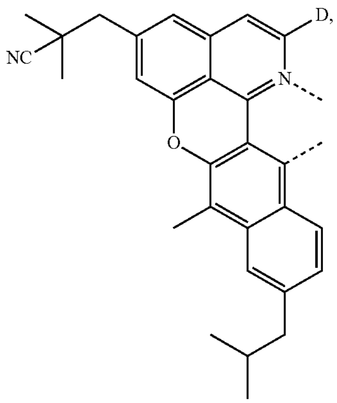
$L_{a1531}$
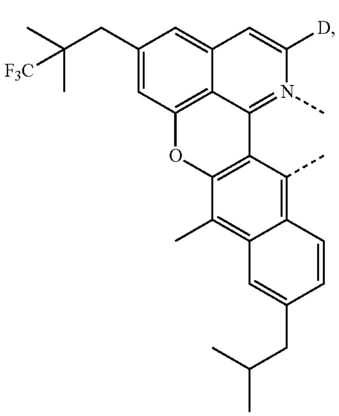
-continued
$L_{a1532}$
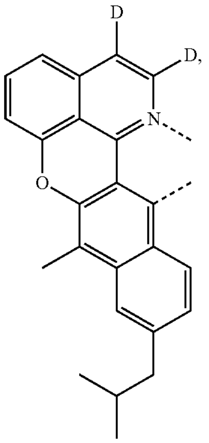
$L_{a1533}$
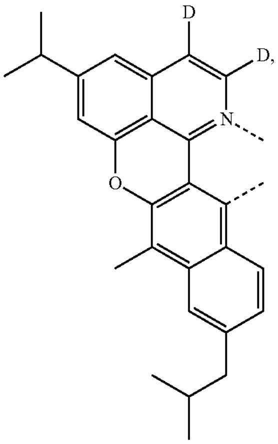
$L_{a1534}$
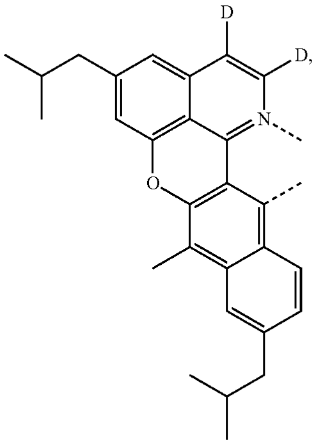

-continued
$L_{a1535}$
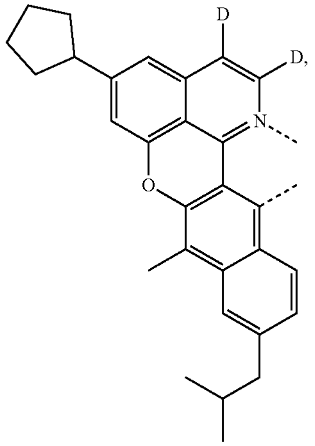
$L_{a1536}$
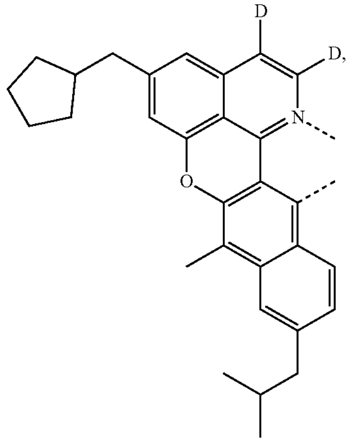
$L_{a1537}$
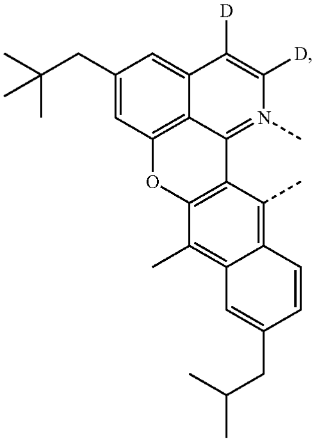
-continued
$L_{a1538}$
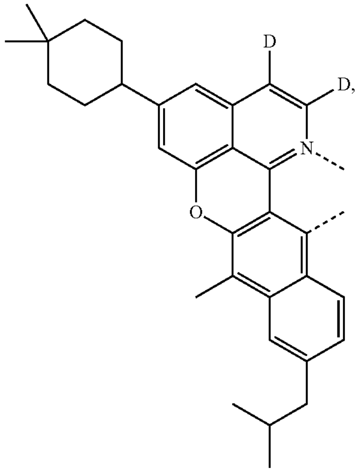
$L_{a1539}$
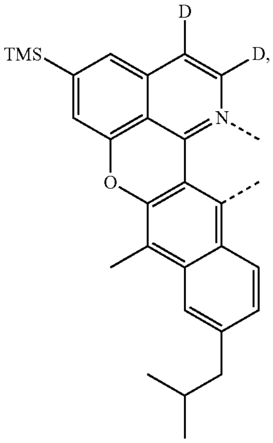
$L_{a1540}$
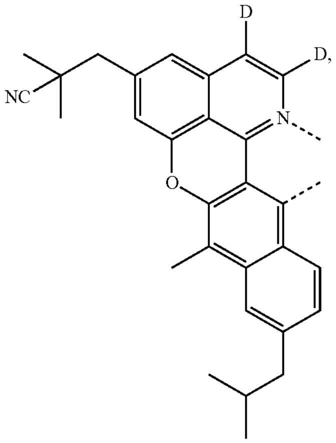

-continued
$L_{a1541}$
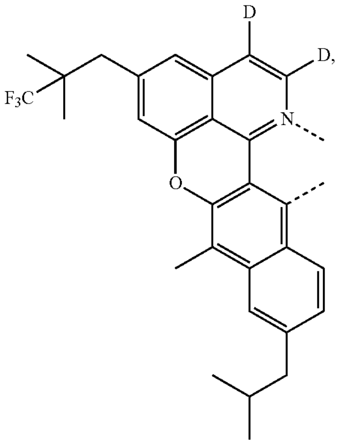
$L_{a1542}$
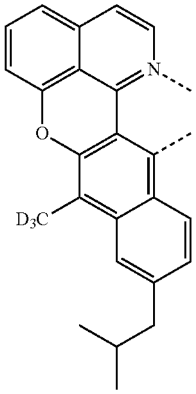
,
$L_{a1543}$
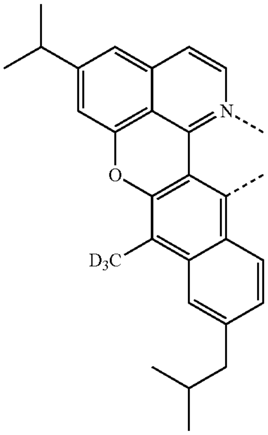
,
-continued
$L_{a1544}$
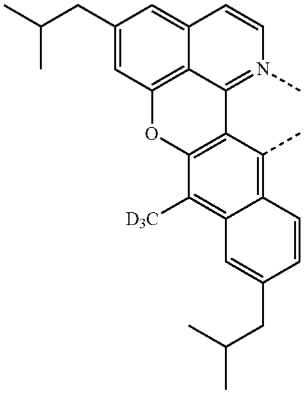
,
$L_{a1545}$
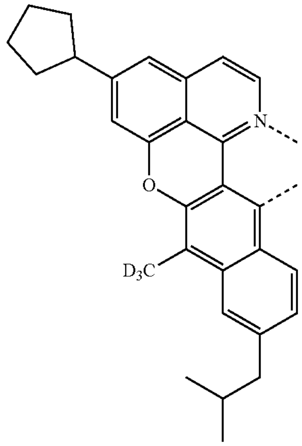
,
$L_{a1546}$
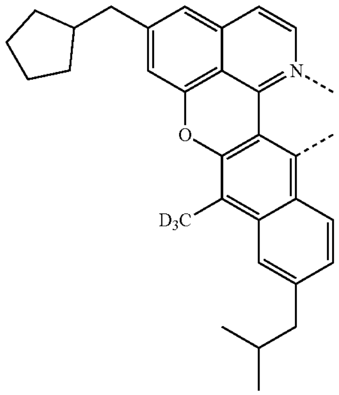
,
$L_{a1547}$
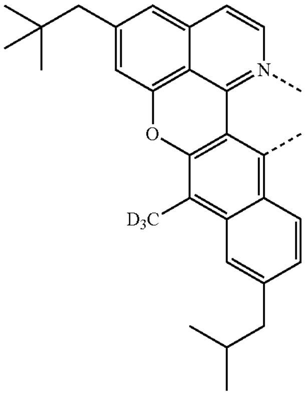
, -continued
$L_{a1548}$
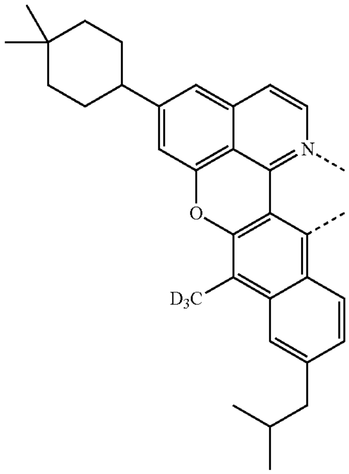
,
$L_{a1549}$
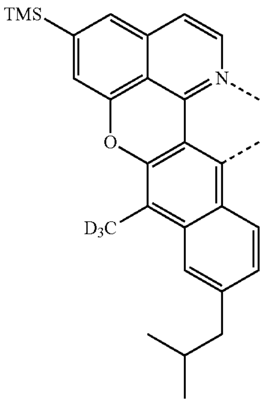
,
$L_{a1550}$
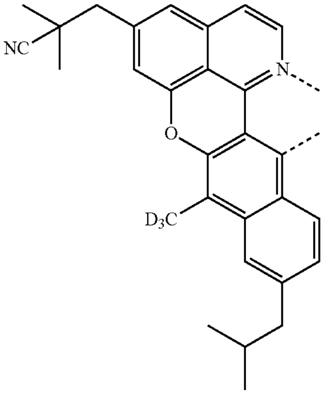
,
-continued
$L_{a1551}$
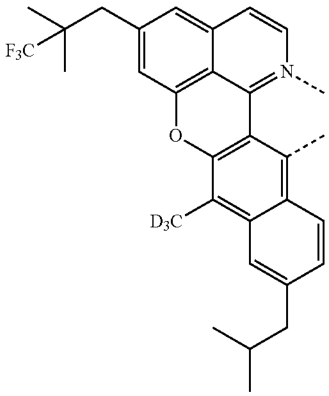
,
$L_{a1552}$
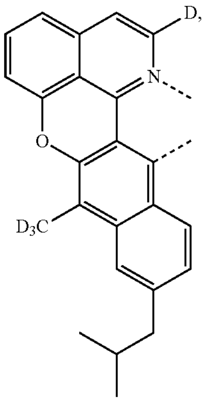
$L_{a1553}$
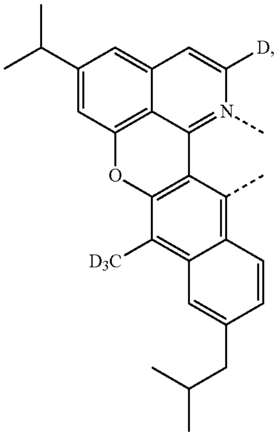
$L_{a1554}$
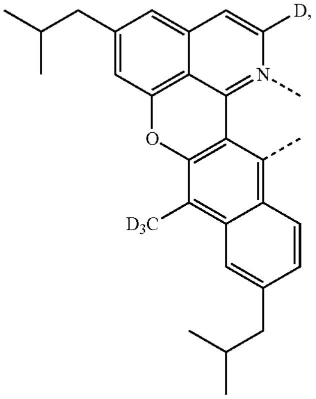

-continued
L$_{a1555}$
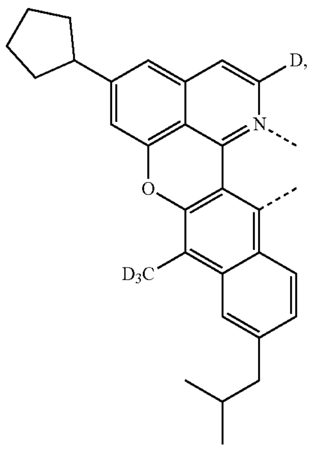
L$_{a1556}$
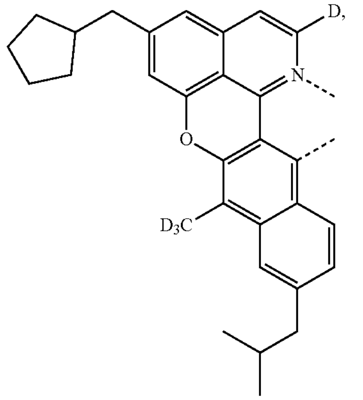
L$_{a1557}$
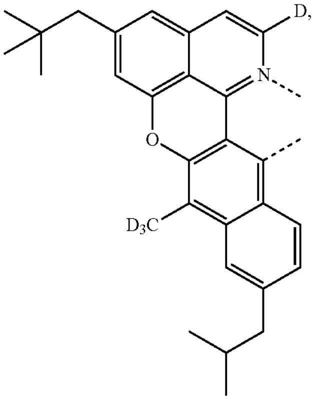
-continued
L$_{a1558}$
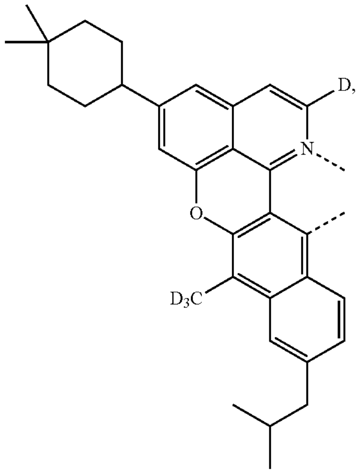
L$_{a1559}$
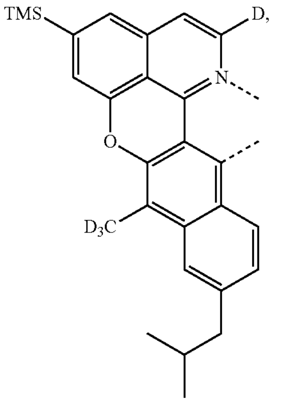
L$_{a1560}$
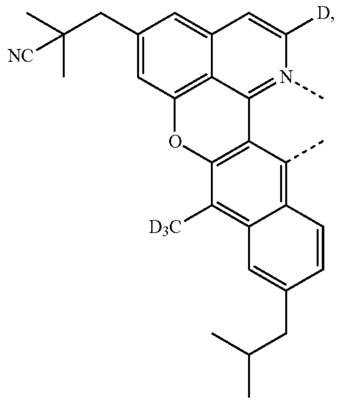

-continued
$L_{a1561}$
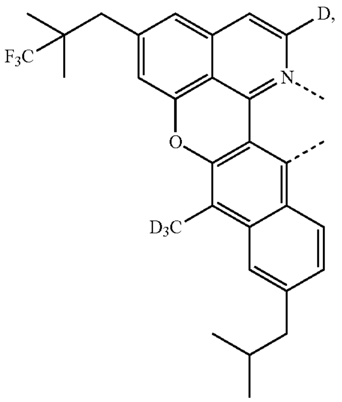
$L_{a1562}$
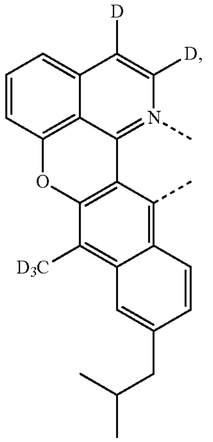
$L_{a1563}$
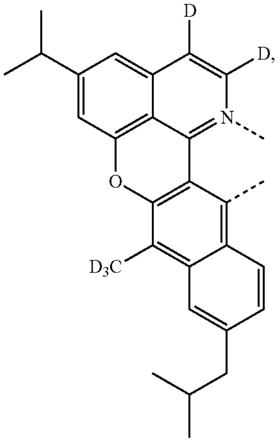
-continued
$L_{a1564}$
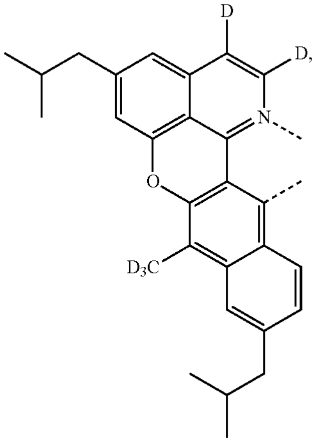
$L_{a1565}$
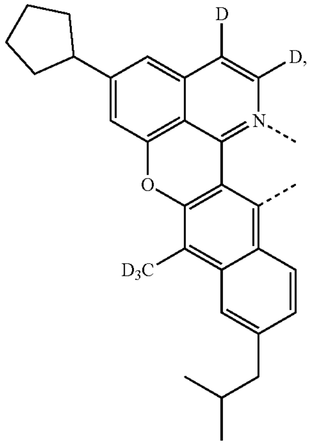
$L_{a1566}$
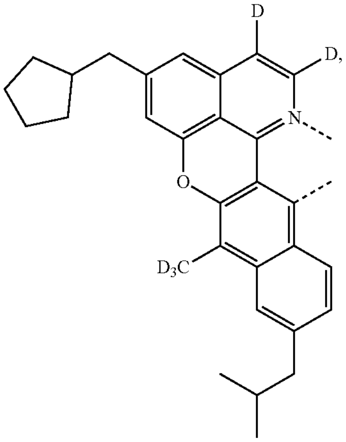

-continued
$L_{a1567}$
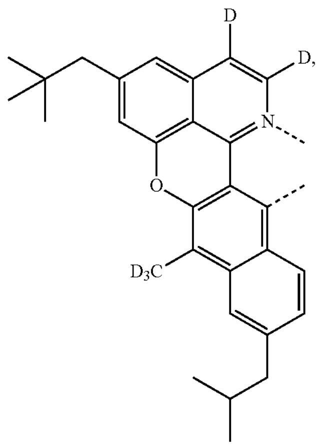
$L_{a1568}$
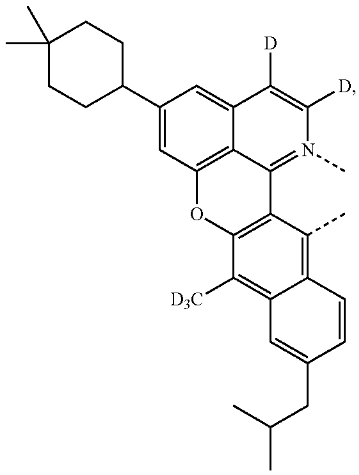
$L_{a1569}$
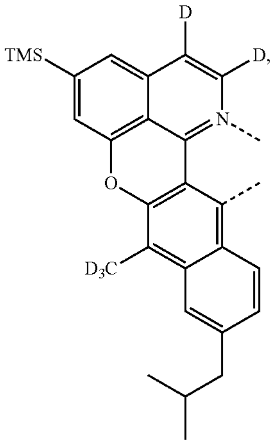
-continued
$L_{a1570}$
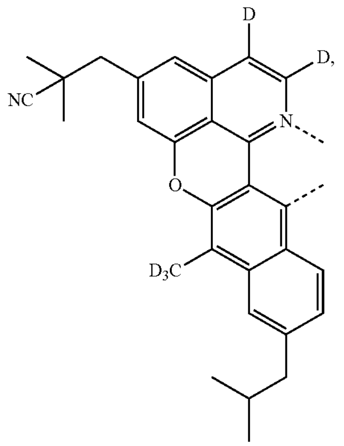
$L_{a1571}$
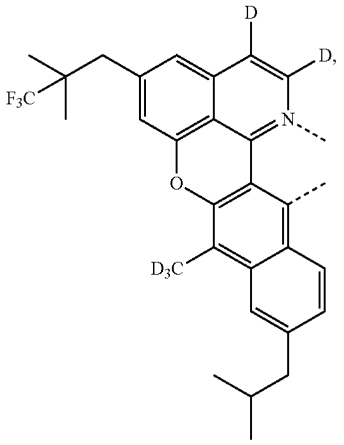
$L_{a1572}$
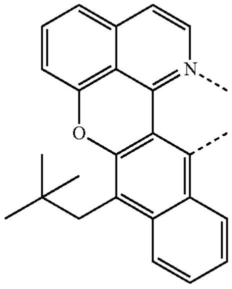
,
$L_{a1573}$
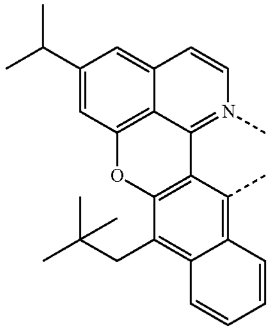
, $L_{a1574}$
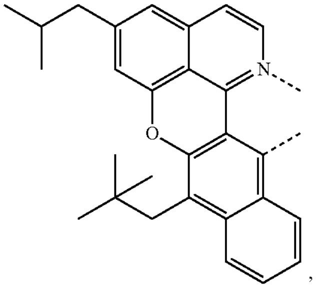
$L_{a1575}$
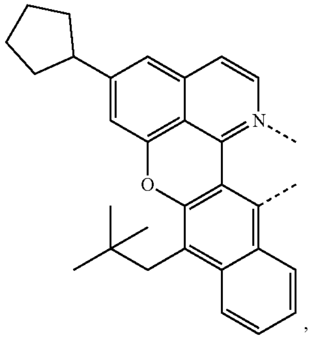
$L_{a1576}$
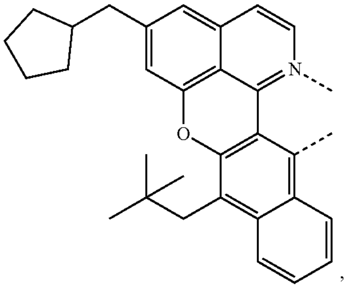
$L_{a1577}$
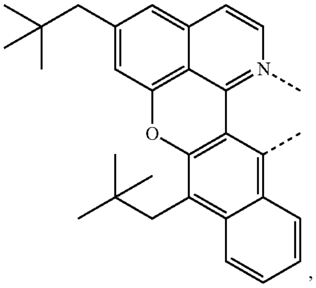
$L_{a1578}$
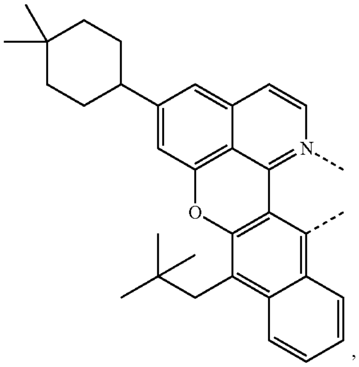
$L_{a1579}$
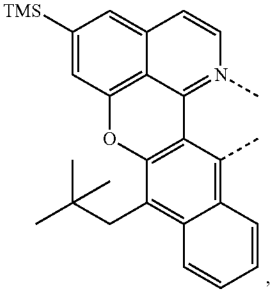
$L_{a1580}$
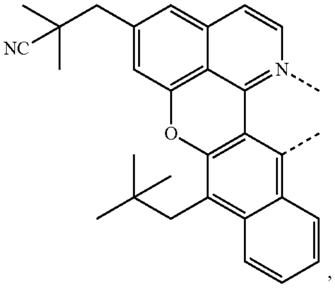
$L_{a1581}$
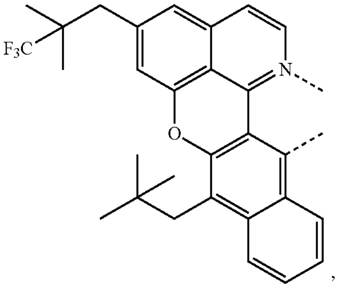
$L_{a1582}$
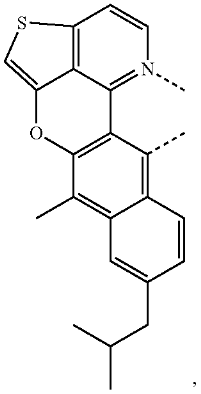

-continued
$L_{a1583}$
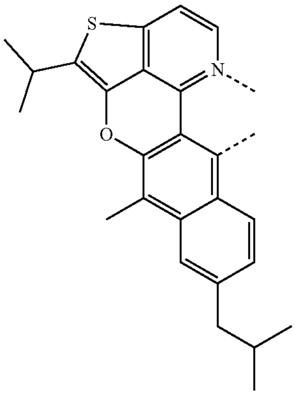
,
$L_{a1584}$
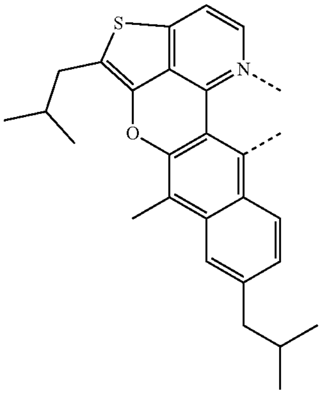
,
$L_{a1585}$
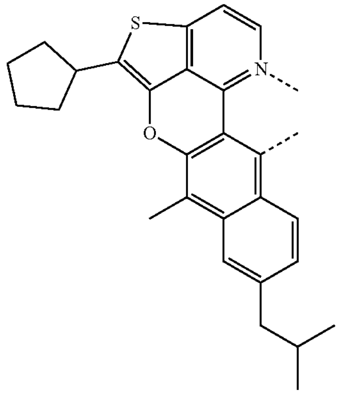
,
$L_{a1586}$
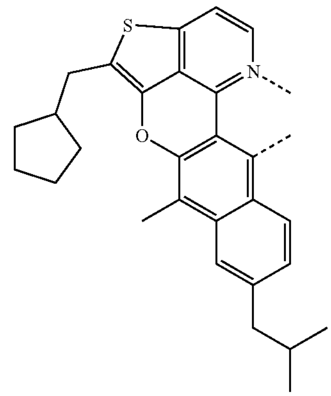
,
-continued
$L_{a1587}$
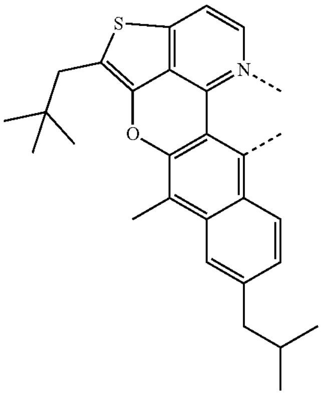
,
$L_{a1588}$
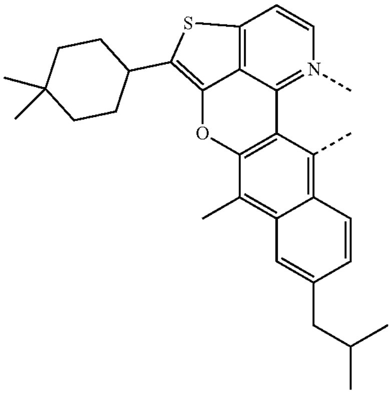
,
$L_{a1589}$
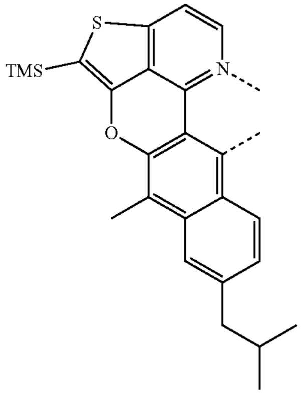
,
$L_{a1590}$
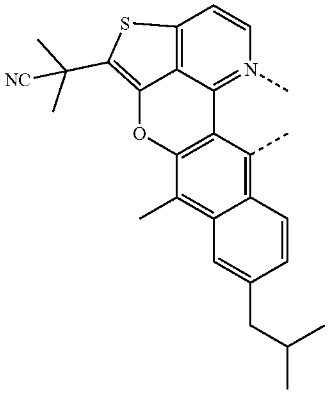
, $L_{a1591}$
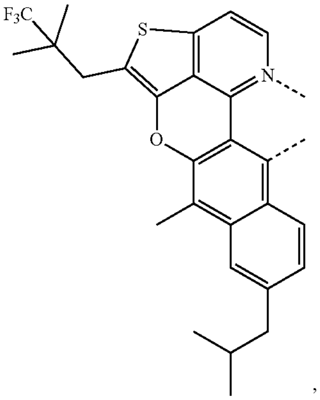
$L_{a1592}$
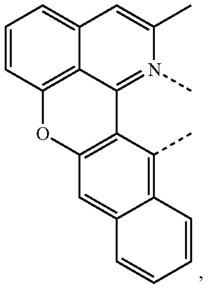
$L_{a1593}$
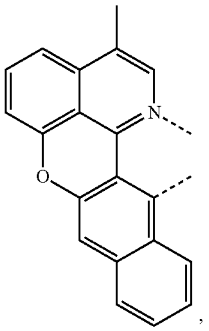
$L_{a1594}$
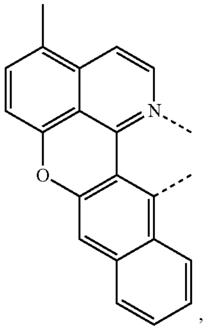
$L_{a1595}$
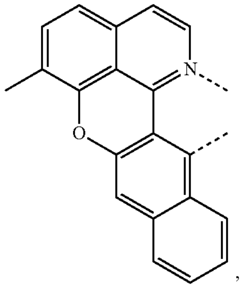
$L_{a1596}$
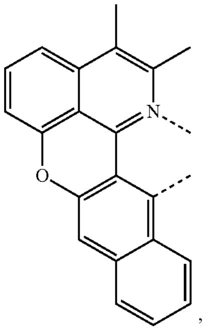
$L_{a1597}$
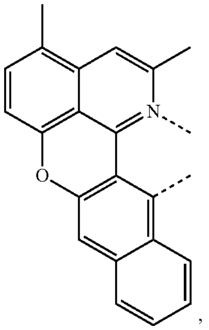
$L_{a1598}$
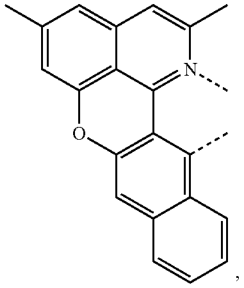
$L_{a1599}$
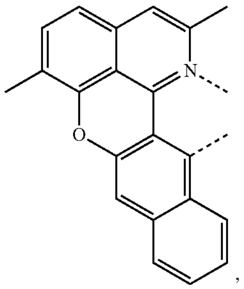

-continued
L$_{a1600}$
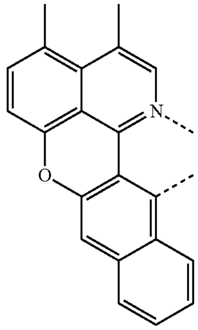
,
L$_{a1601}$
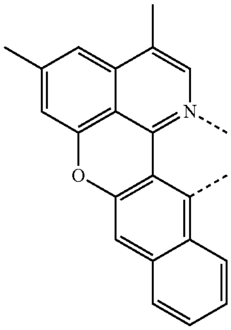
,
L$_{a1602}$
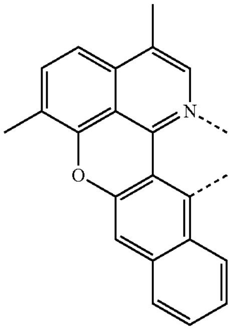
,
L$_{a1603}$
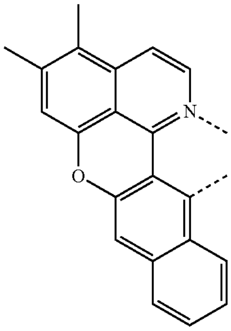
,
L$_{a1604}$
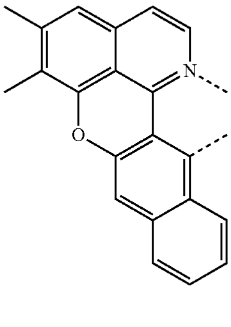
,
-continued
L$_{a1605}$
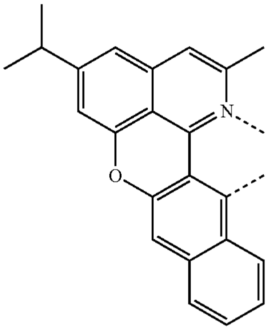
,
L$_{a1606}$
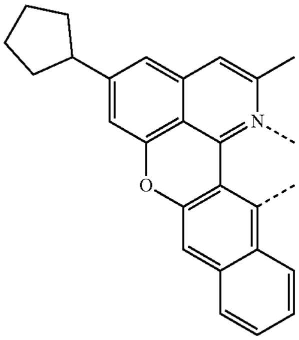
,
L$_{a1607}$
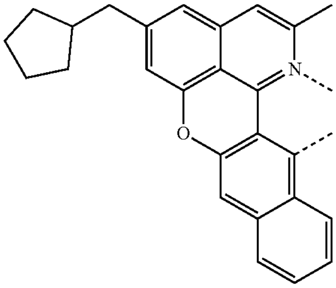
,
L$_{a1608}$
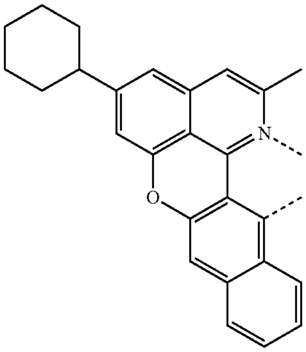
, -continued
$L_{a1609}$
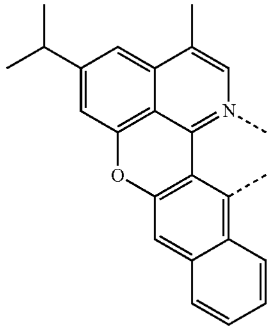
,
$L_{a1610}$
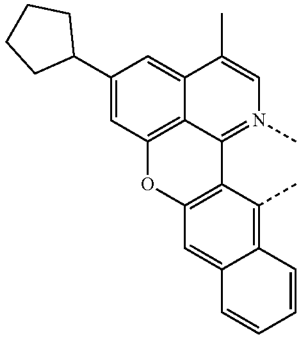
,
$L_{a1611}$
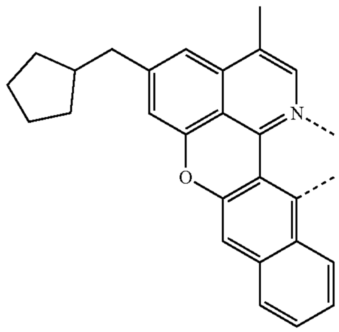
,
$L_{a1612}$
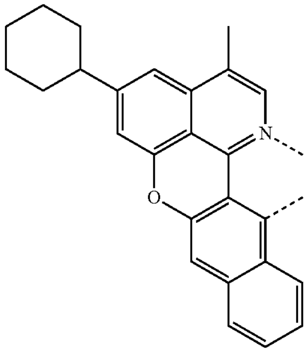
,
-continued
$L_{a1613}$
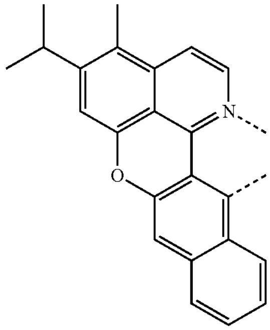
,
$L_{a1614}$
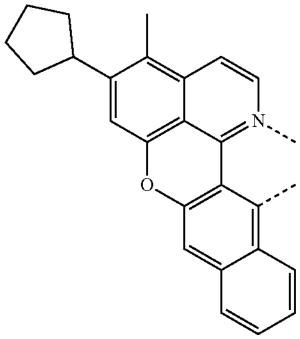
,
$L_{a1615}$
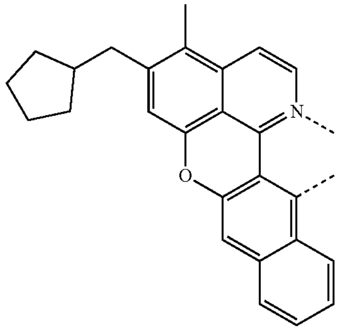
,
$L_{a1616}$
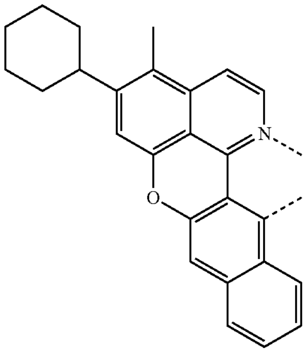
, -continued
$L_{a1617}$
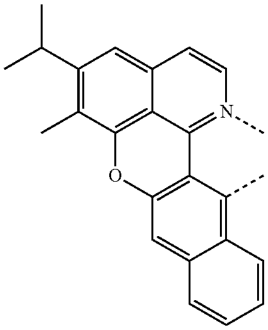
,
$L_{a1618}$
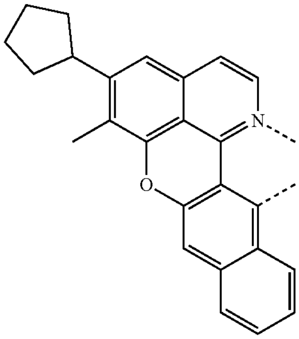
,
$L_{a1619}$
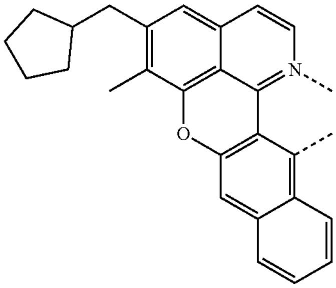
,
$L_{a1620}$
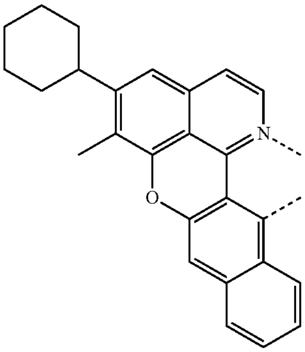
,
$L_{a1621}$
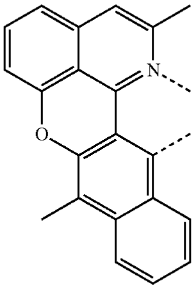
,
-continued
$L_{a1622}$
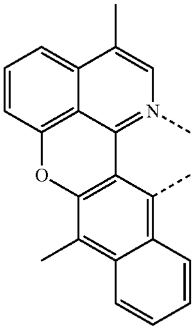
,
$L_{a1623}$
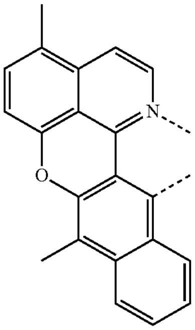
,
$L_{a1624}$
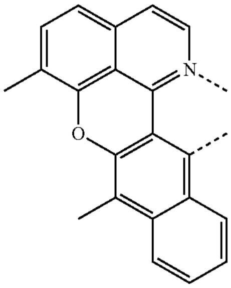
,
$L_{a1625}$
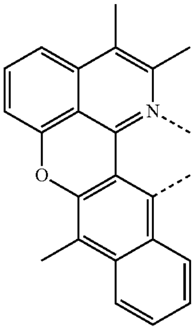
,
$L_{a1626}$
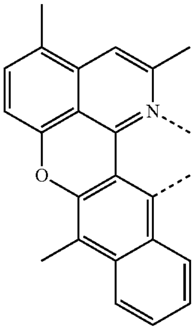
, -continued
$L_{a1627}$
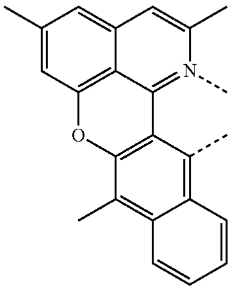
,
$L_{a1628}$
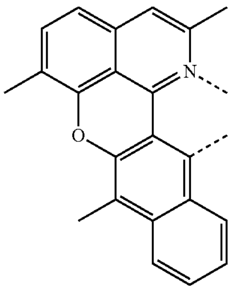
,
$L_{a1629}$
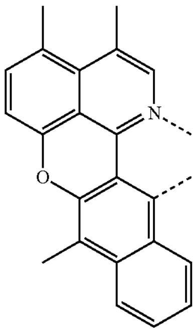
,
$L_{a1630}$
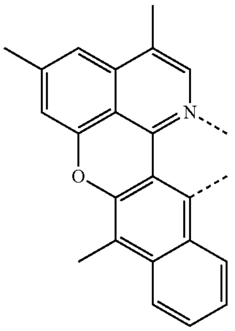
,
$L_{a1631}$
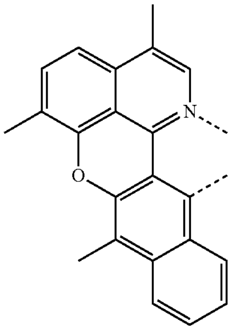
,
-continued
$L_{a1632}$
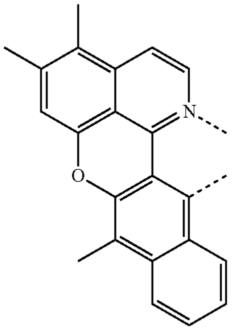
,
$L_{a1633}$
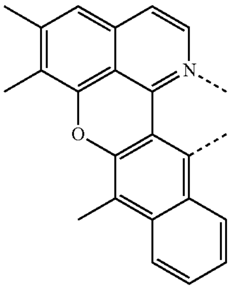
,
$L_{a1634}$
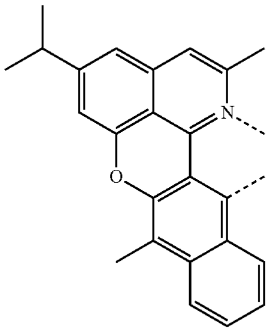
,
$L_{a1635}$
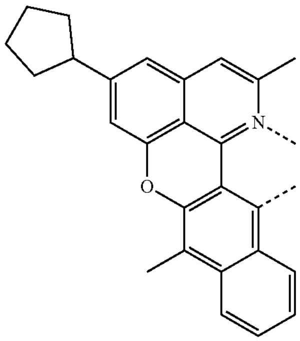
,
$L_{a1636}$
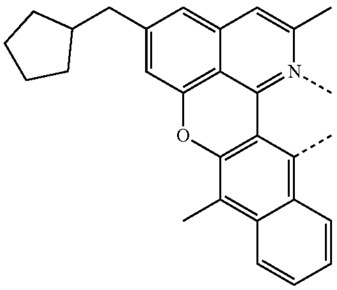
, -continued
$L_{a1637}$
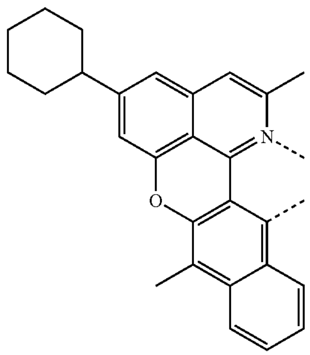
,
$L_{a1638}$
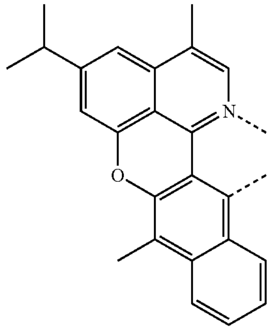
,
$L_{a1639}$
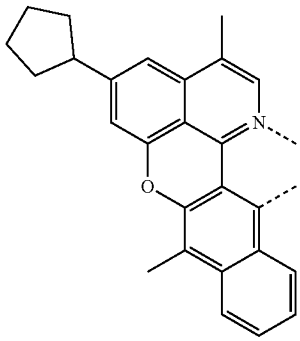
,
$L_{a1640}$
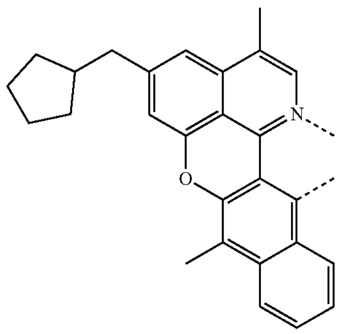
,
-continued
$L_{a1641}$
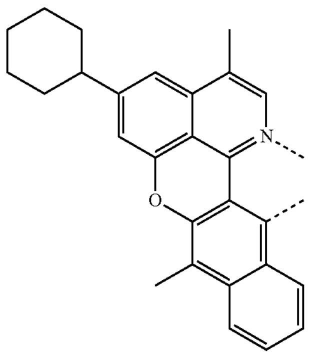
,
$L_{a1642}$
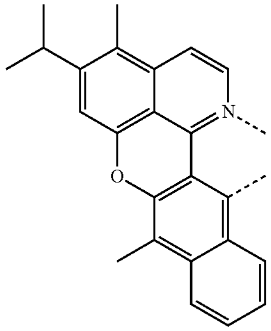
,
$L_{a1643}$
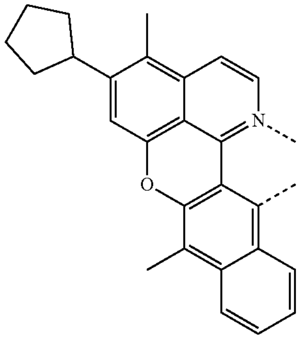
,
$L_{a1644}$
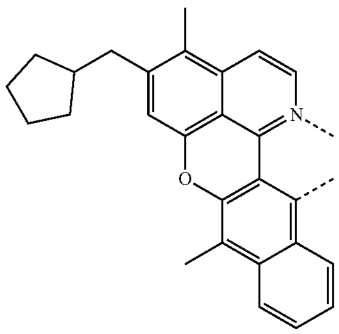
, -continued
$L_{a1645}$
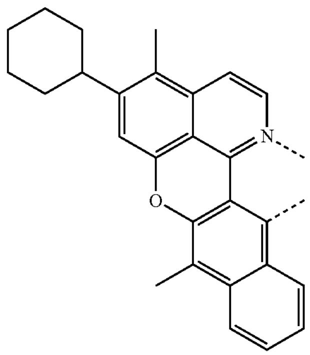
,
$L_{a1646}$
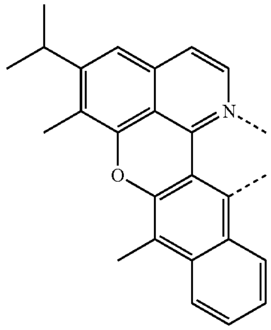
,
$L_{a1647}$
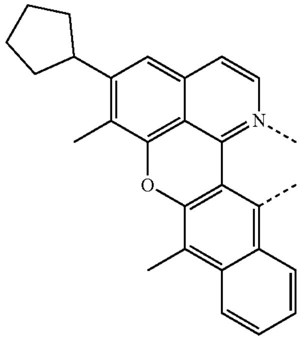
,
$L_{a1648}$
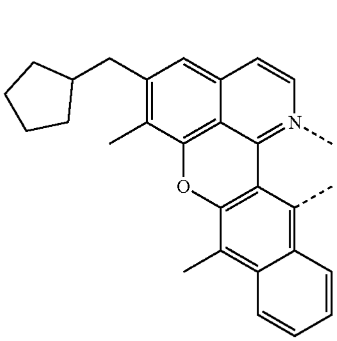
,
-continued
$L_{a1649}$
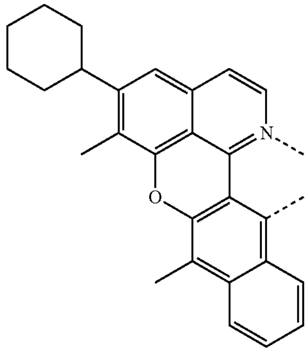
,
$L_{a1650}$
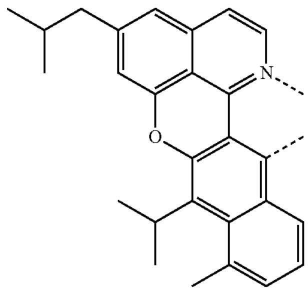
,
$L_{a1651}$
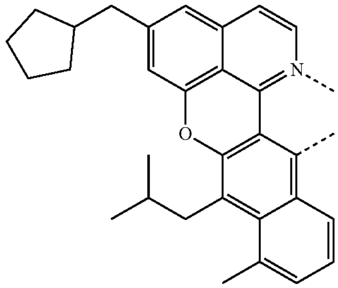
,
$L_{a1652}$
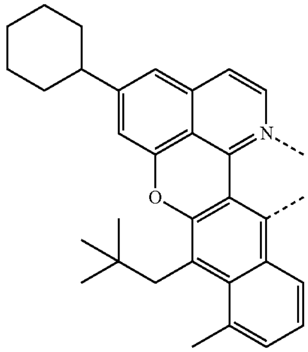
,
$L_{a1653}$
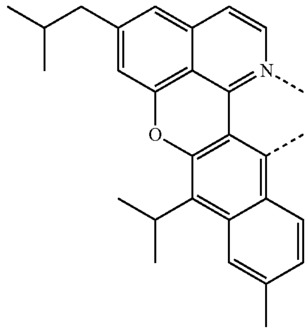
, -continued
L$_{a1654}$
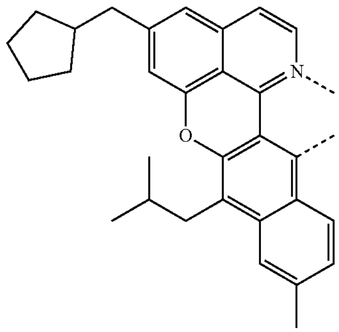
,
L$_{a1655}$
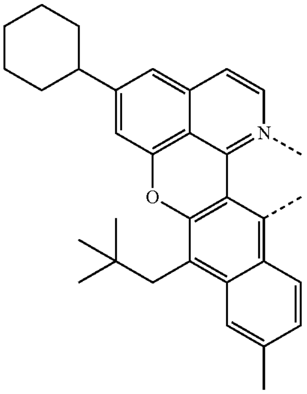
,
L$_{a1656}$
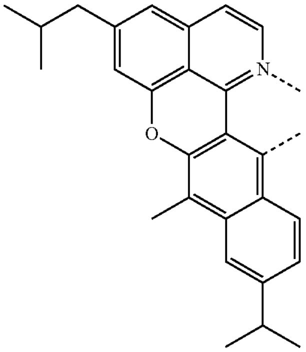
,
L$_{a1657}$
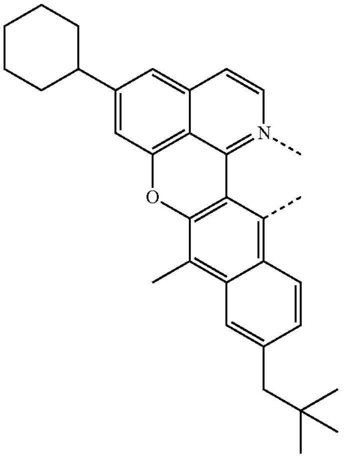
,
-continued
L$_{a1658}$
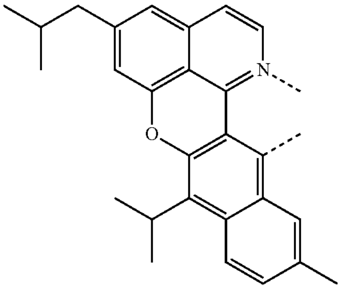
,
L$_{a1659}$
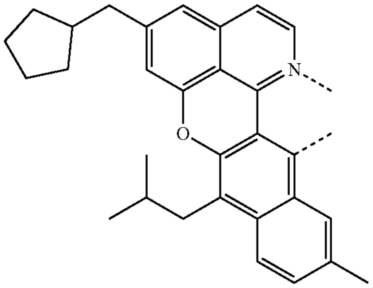
,
L$_{a1660}$
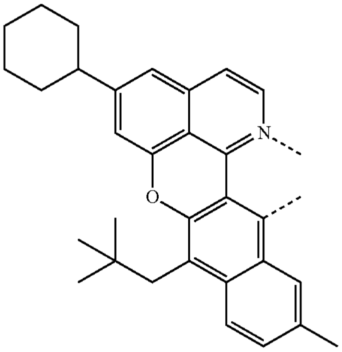
,
L$_{a1661}$
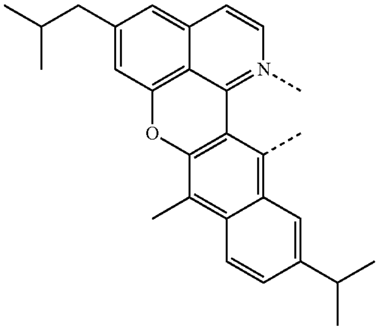
, -continued
$L_{a1662}$
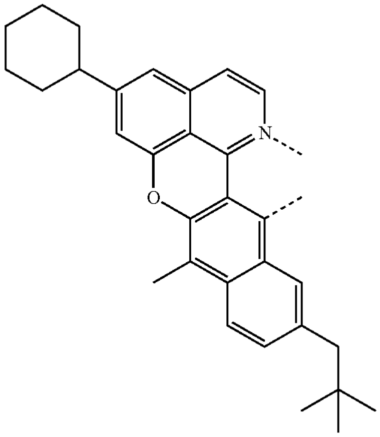
,
$L_{a1663}$
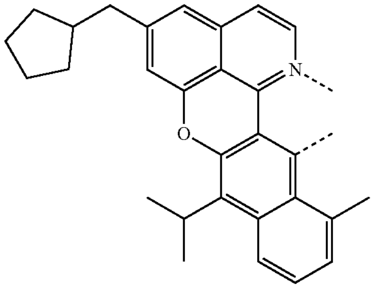
,
$L_{a1664}$
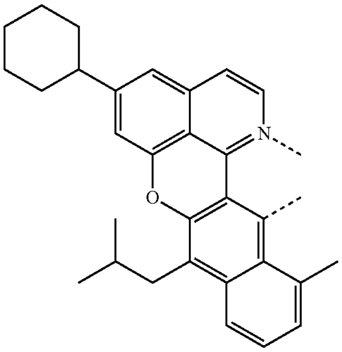
,
$L_{a1671}$
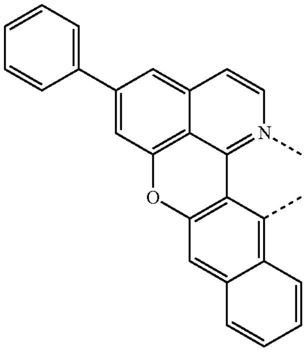
,
-continued
$L_{a1672}$
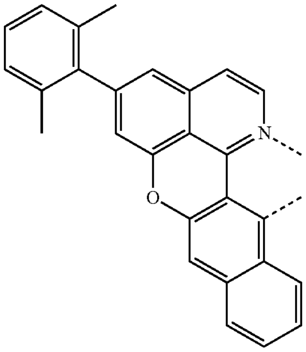
,
$L_{a1673}$
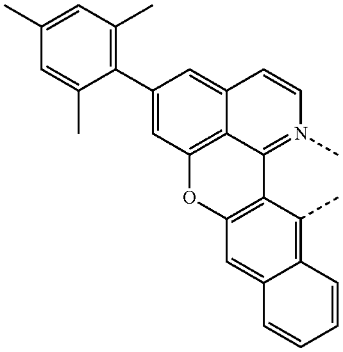
,
$L_{a1674}$
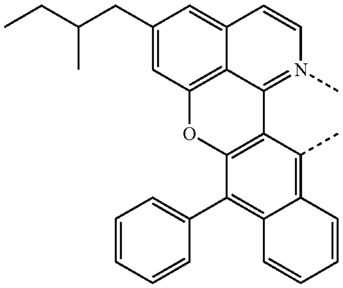
,
$L_{a1675}$
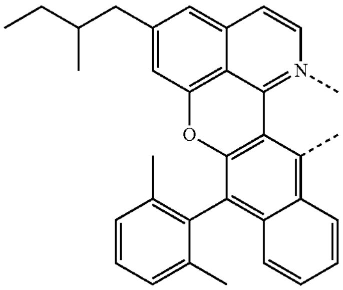
,
$L_{a1676}$
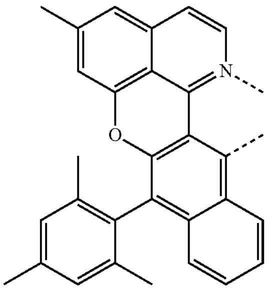
, -continued
$L_{a1677}$
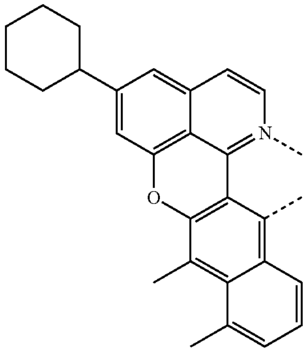
,
$L_{a1678}$
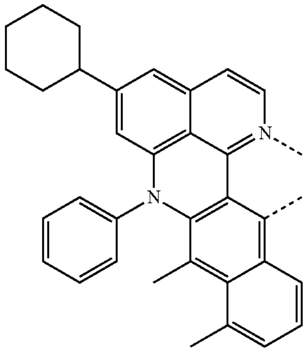
,
$L_{a1679}$
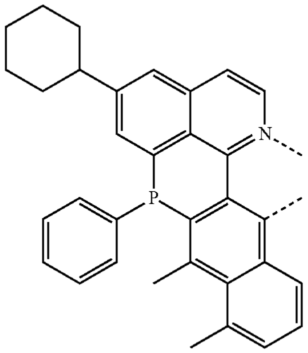
,
$L_{a1680}$
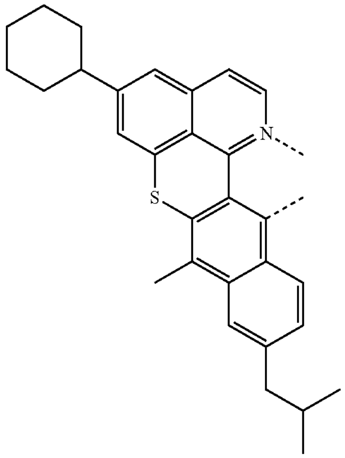
,
-continued
$L_{a1681}$
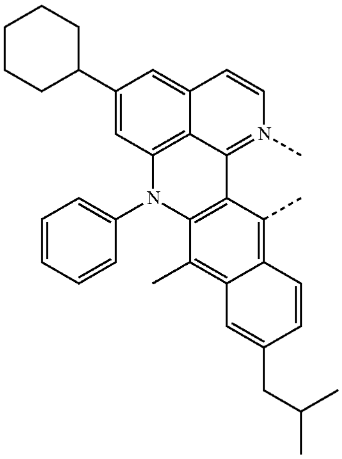
,
$L_{a1682}$
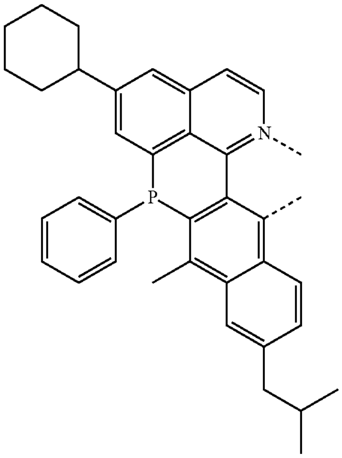
,
$L_{a1683}$
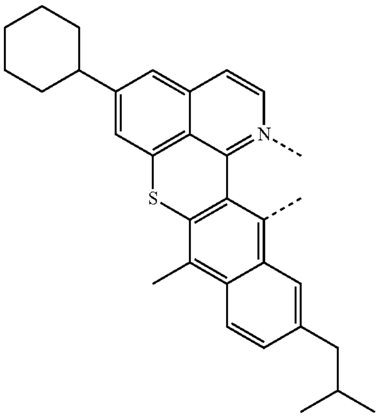
, -continued
$L_{a1684}$
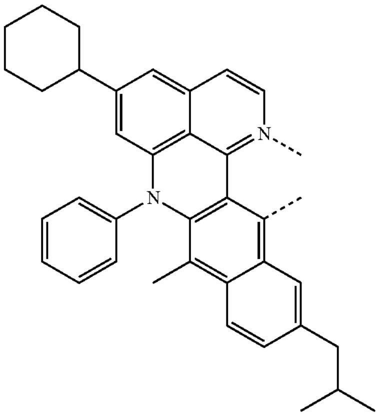
,
$L_{a1685}$
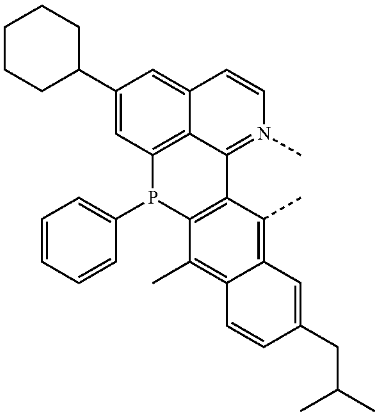
,
$L_{a1686}$
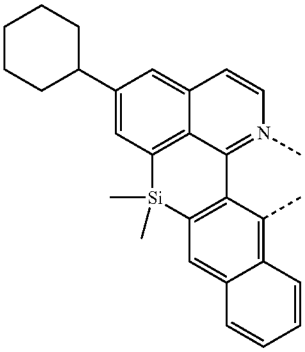
,
$L_{a1687}$
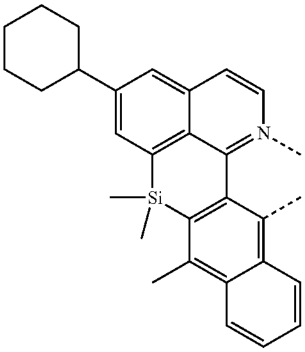
,
-continued
$L_{a1688}$
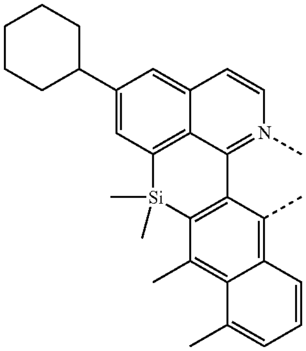
,
$L_{a1689}$
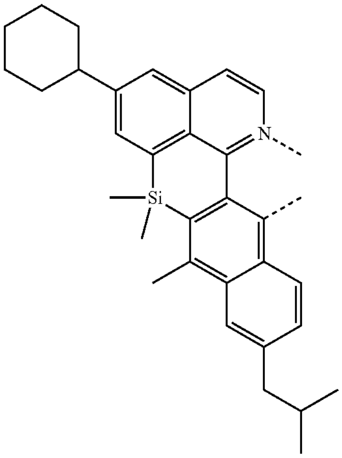
,
$L_{a1690}$
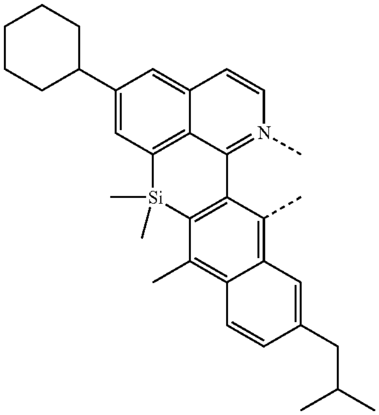
,
$L_{a1691}$
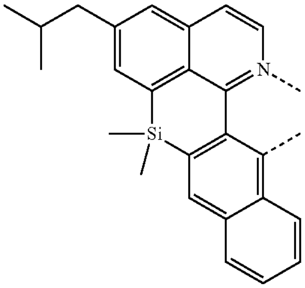
, $L_{a1692}$
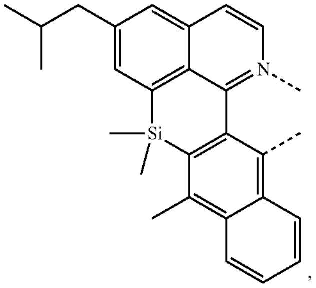
$L_{a1693}$
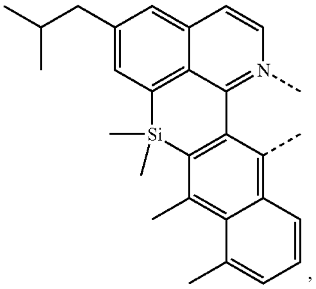
$L_{a1694}$
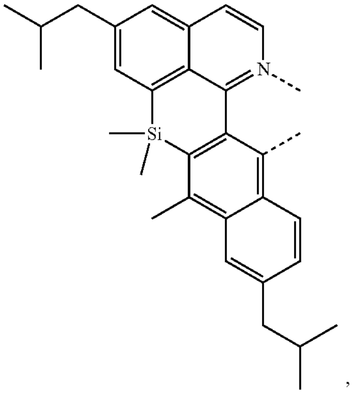
$L_{a1695}$
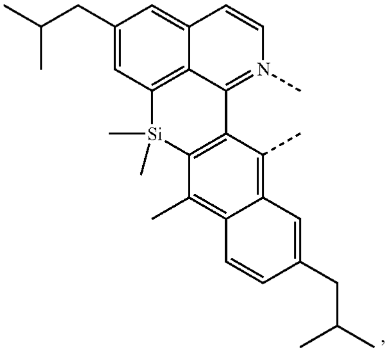
$L_{a1696}$
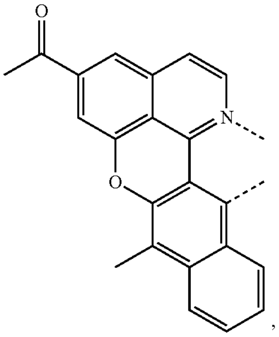
$L_{a1697}$
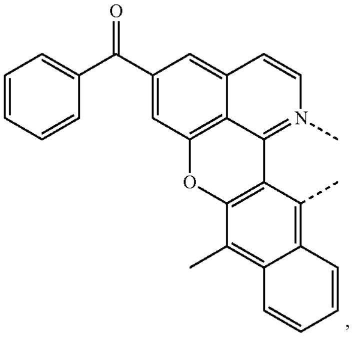
$L_{a1698}$
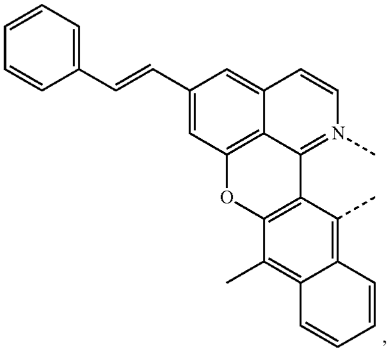
$L_{a1699}$
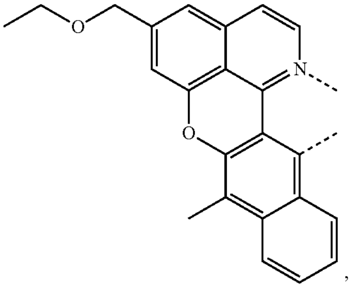
$L_{a1700}$
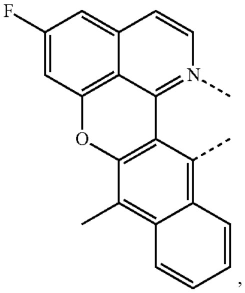

-continued
$L_{a1701}$
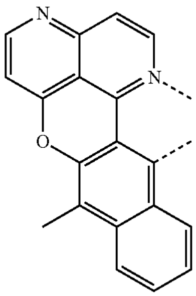
,
$L_{a1702}$
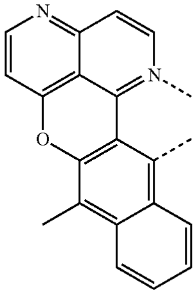
,
$L_{a1703}$
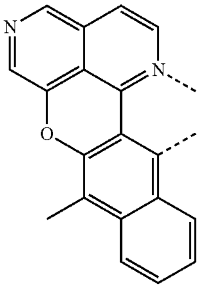
,
$L_{a1704}$
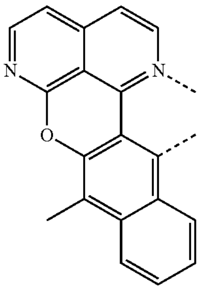
,
$L_{a1705}$
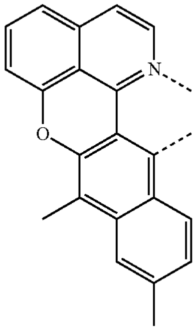
,
-continued
$L_{a1706}$
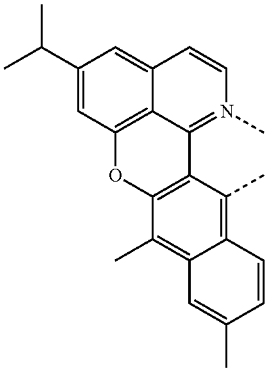
,
$L_{a1707}$
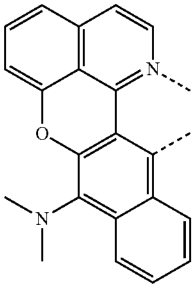
,
$L_{a1708}$
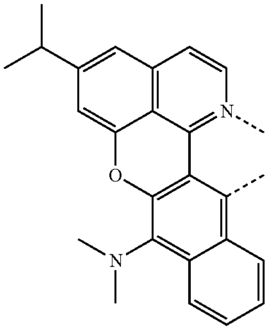
,
$L_{a1709}$
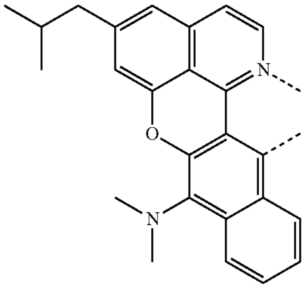
,
$L_{a1710}$
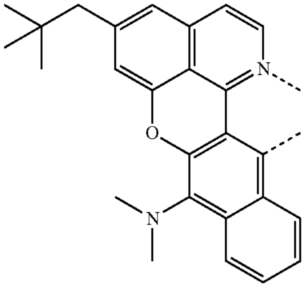
, -continued
$L_{a1711}$
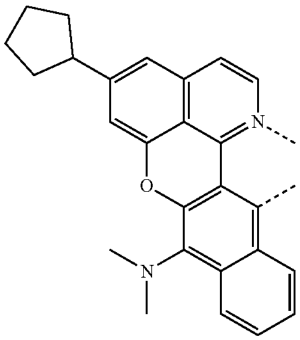
,
$L_{a1712}$
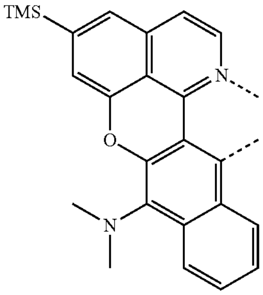
,
$L_{a1713}$
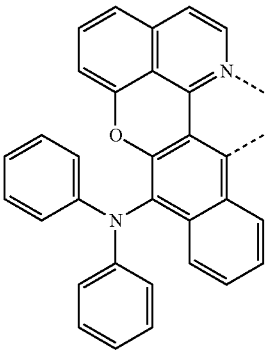
,
$L_{a1714}$
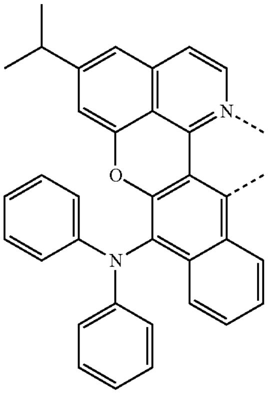
,
-continued
$L_{a1715}$
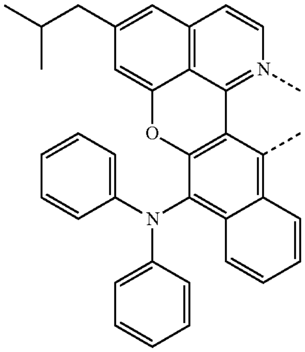
,
$L_{a1716}$
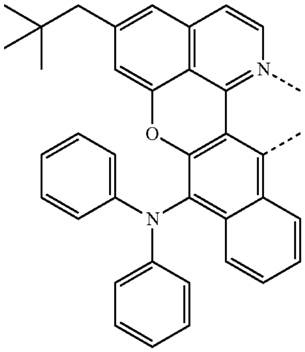
,
$L_{a1717}$
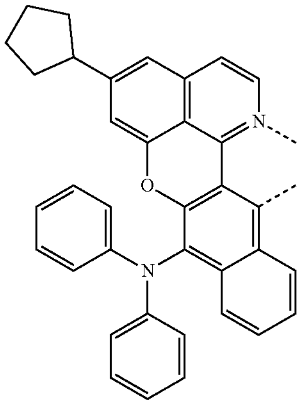
,
$L_{a1718}$
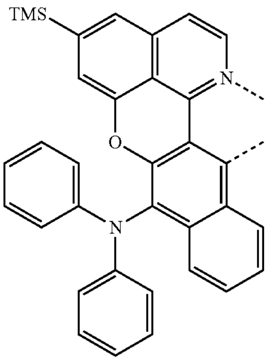
, -continued
$L_{a1719}$
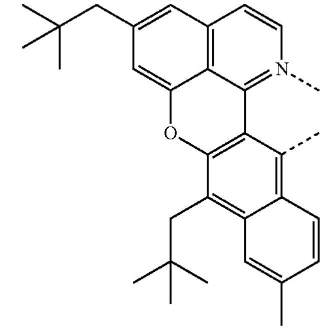
,
$L_{a1720}$
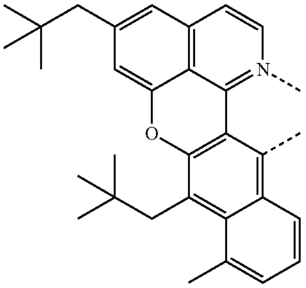
,
$L_{a1721}$
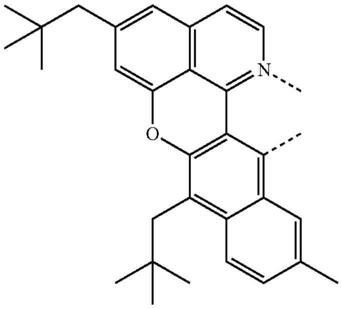
,
$L_{a1722}$
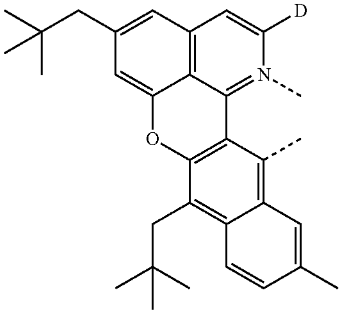
,
$L_{a1723}$
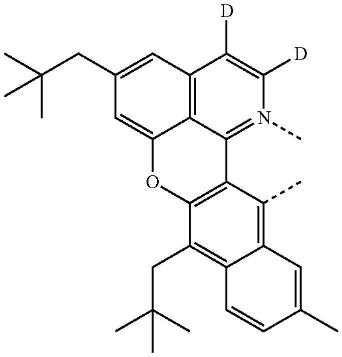
,
-continued
$L_{a1724}$
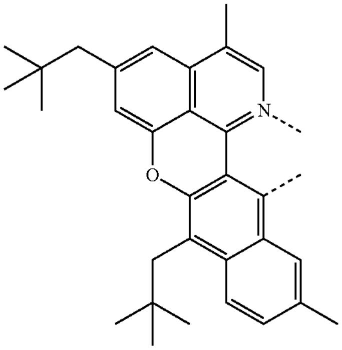
,
$L_{a1725}$
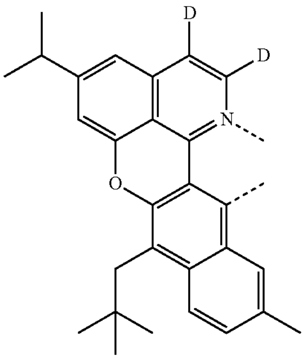
,
$L_{a1726}$
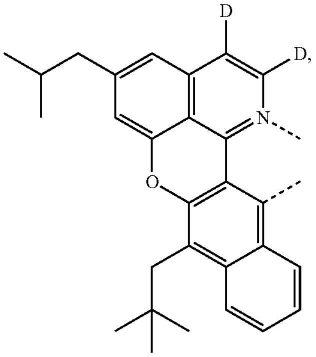
$L_{a1727}$
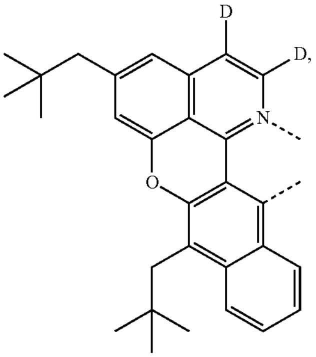

-continued
$L_{a1728}$
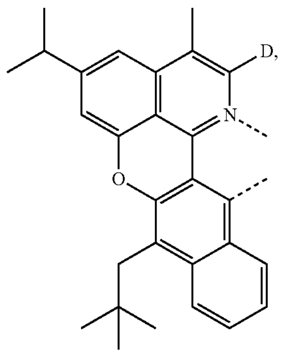
$L_{a1729}$
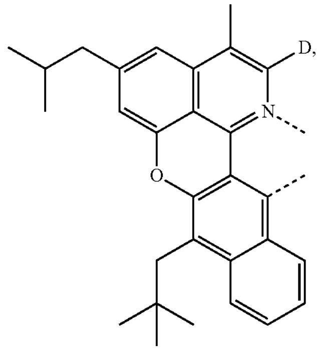
$L_{a1730}$
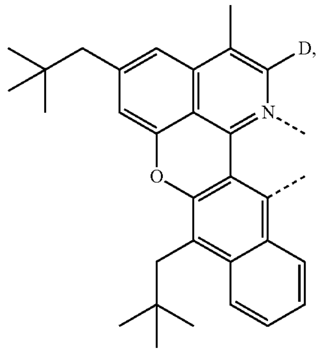
$L_{a1731}$
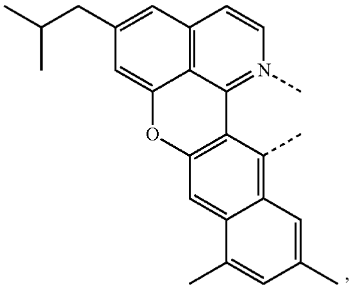
-continued
$L_{a1732}$
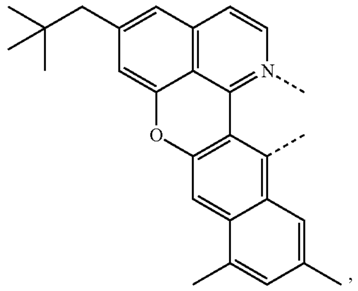
$L_{a1733}$
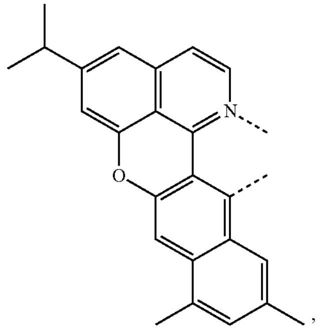
$L_{a1734}$
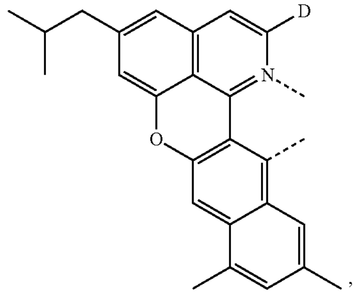
$L_{a1735}$
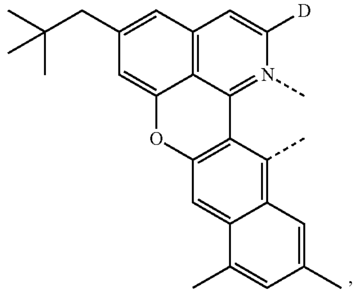
$L_{a1736}$
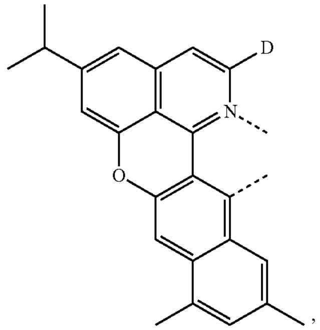

-continued
$L_{a1737}$
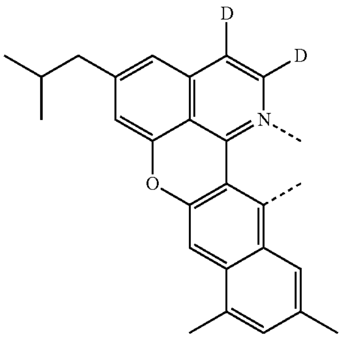
,
$L_{a1738}$
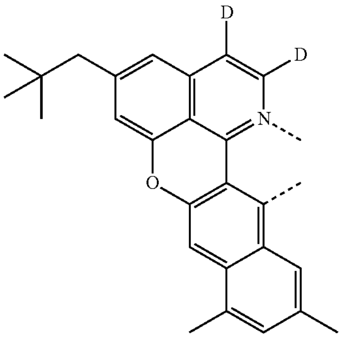
,
$L_{a1739}$
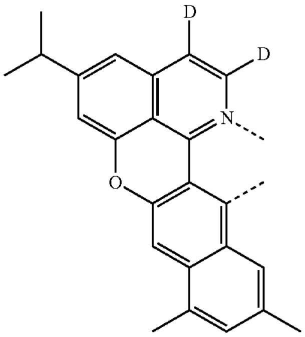
,
$L_{a1740}$
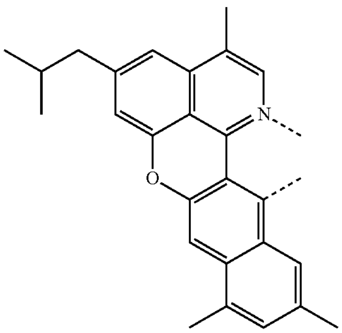
,
-continued
$L_{a1741}$
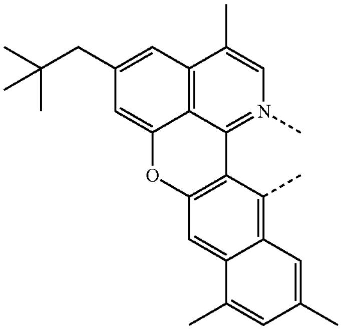
,
$L_{a1742}$
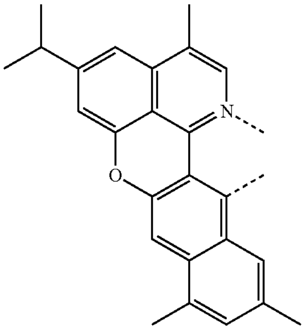
,
$L_{a1743}$
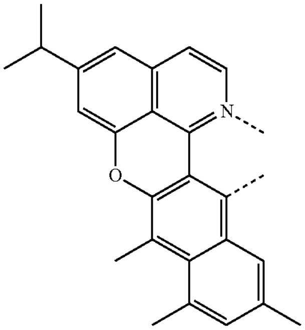
,
$L_{a1744}$
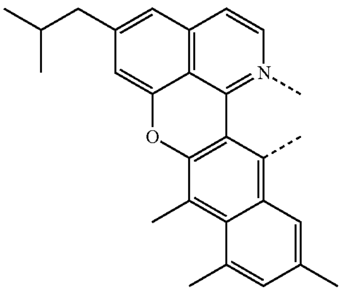
,
$L_{a1745}$
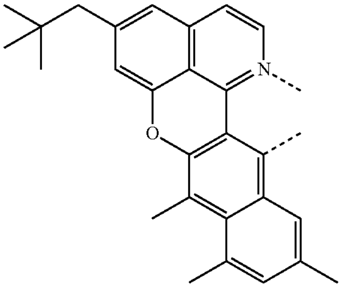
, -continued
$L_{a1746}$
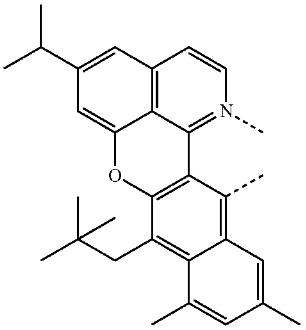
,
$L_{a1747}$
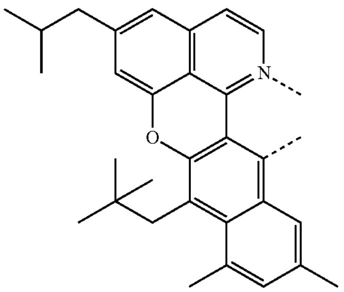
,
$L_{a1748}$
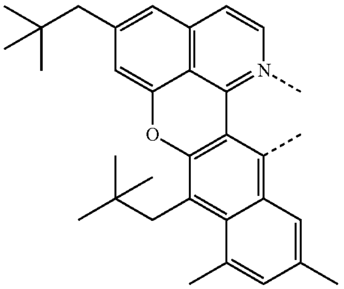
,
$L_{a1749}$
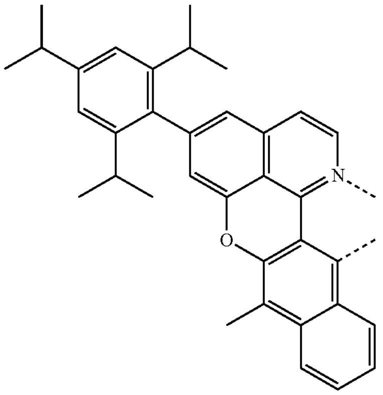
,
-continued
$L_{a1750}$
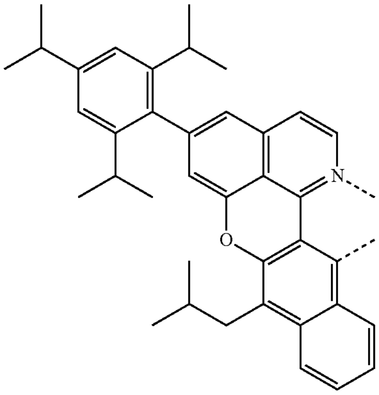
,
$L_{a1751}$
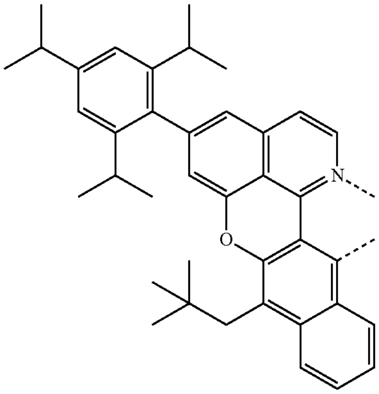
,
$L_{a1752}$
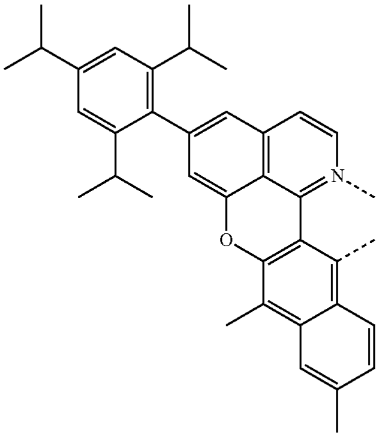
, -continued
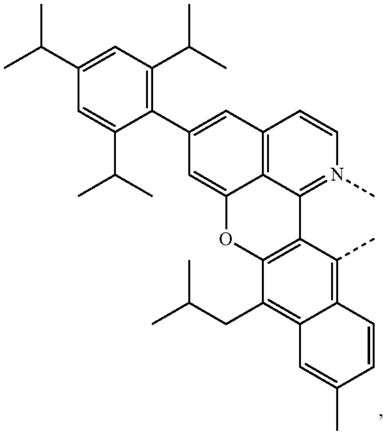
, $L_{a1753}$
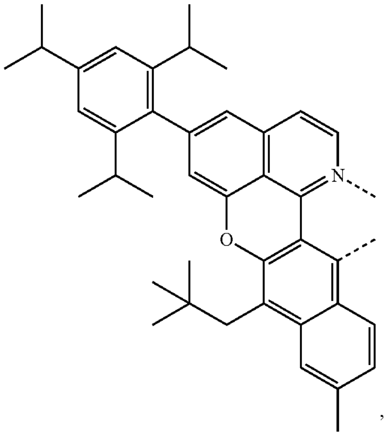
, $L_{a1754}$
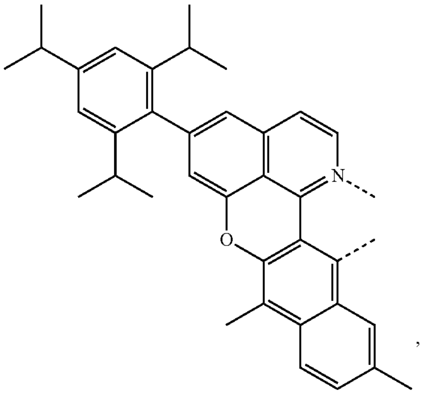
, $L_{a1755}$
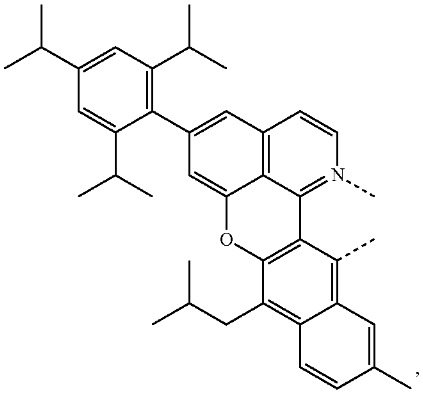
, $L_{a1756}$
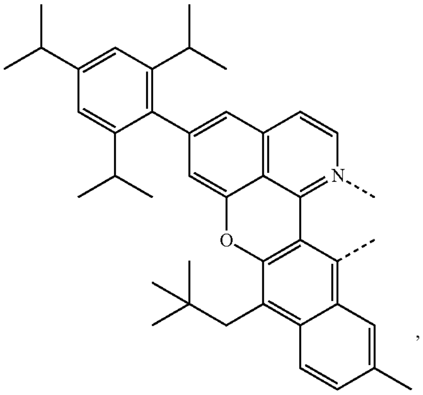
, $L_{a1757}$
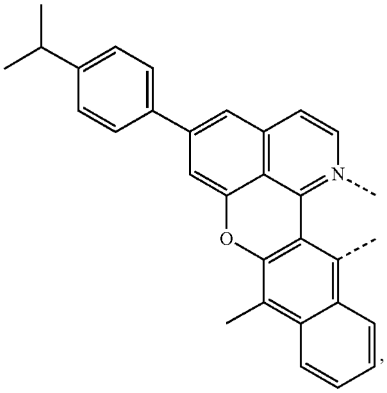
, $L_{a1758}$
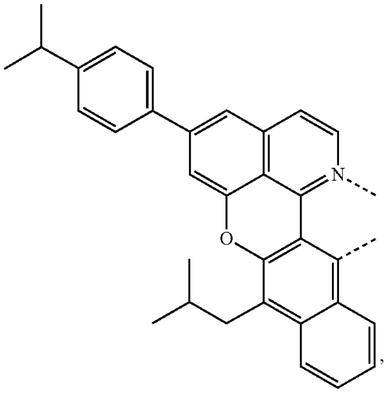
, $L_{a1759}$ -continued
$L_{a1760}$
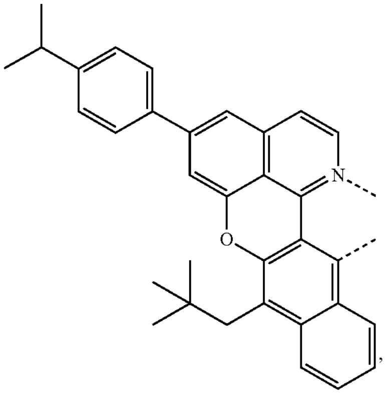
,
$L_{a1761}$
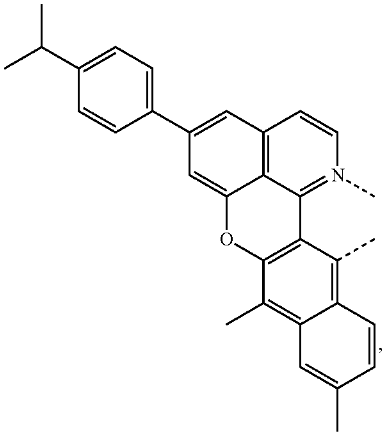
,
$L_{a1762}$
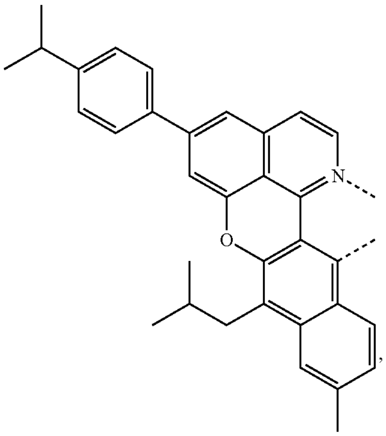
,
-continued
$L_{a1763}$
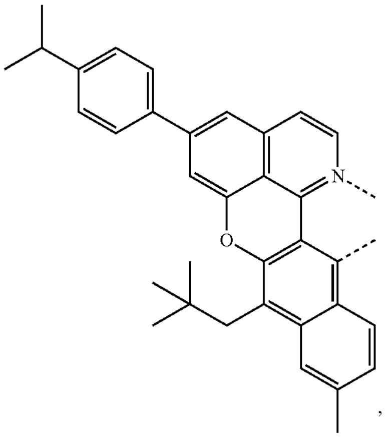
,
$L_{a1764}$
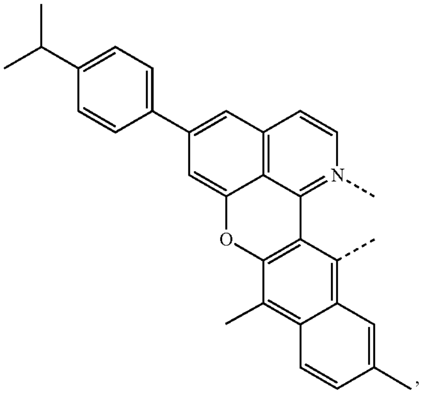
,
$L_{a1765}$
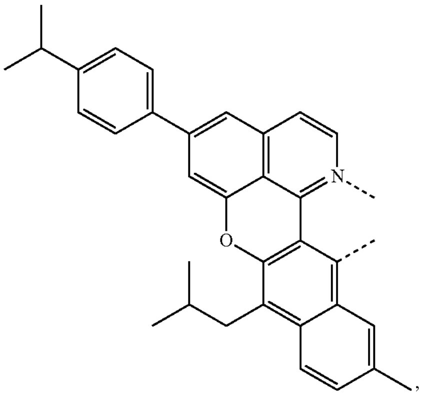
,
$L_{a1766}$
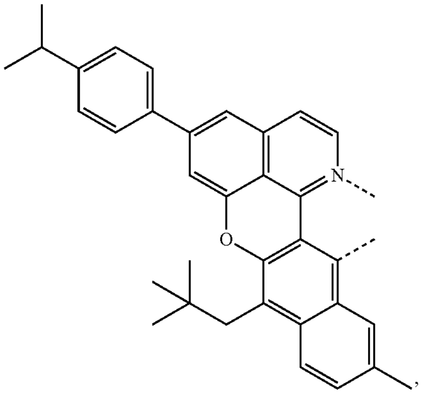
, L$_{a1767}$
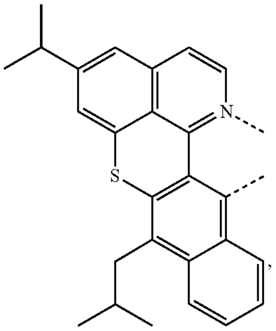
L$_{a1768}$
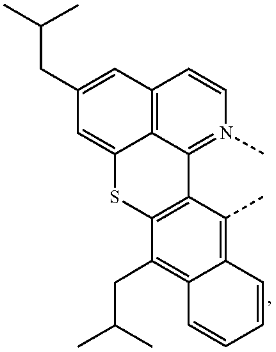
L$_{a1769}$
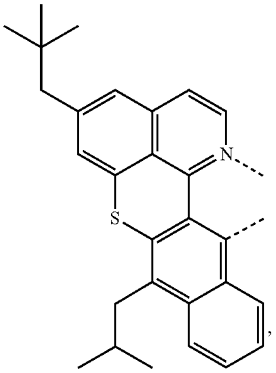
L$_{a1770}$
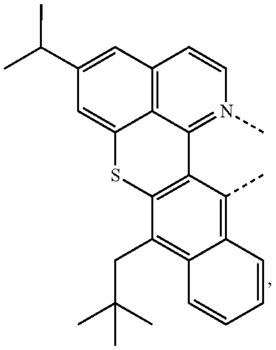
L$_{a1771}$
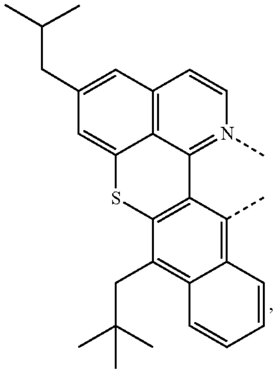
L$_{a1772}$
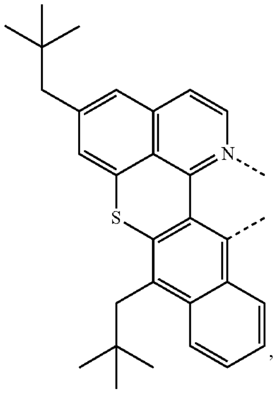
L$_{a1773}$
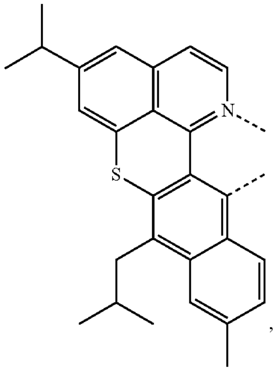
L$_{a1774}$
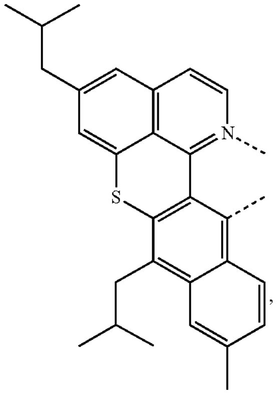

-continued
$L_{a1775}$
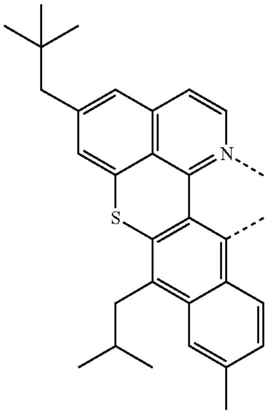
,
$L_{a1776}$
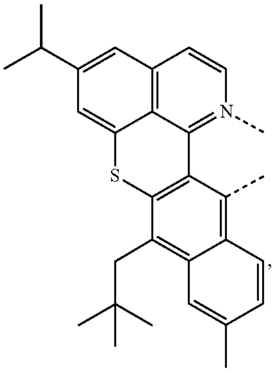
,
$L_{a1777}$
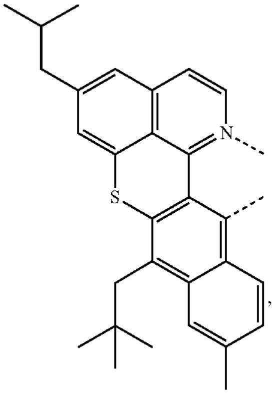
,
$L_{a1778}$
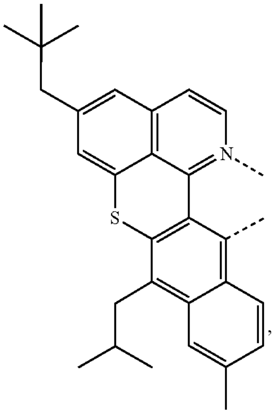
,
-continued
$L_{a1779}$
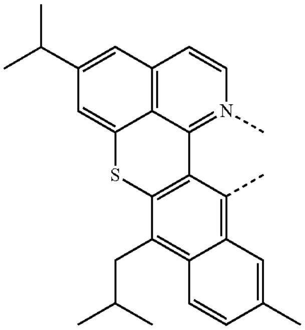
,
$L_{a1780}$
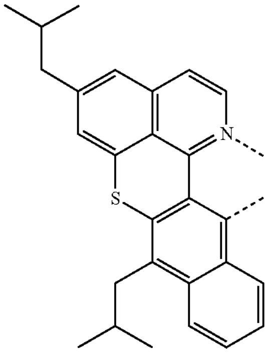
,
$L_{a1781}$
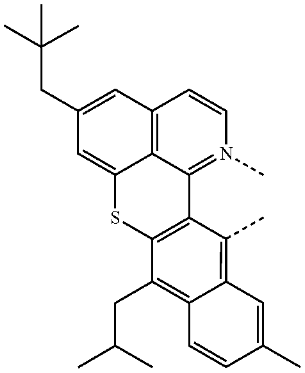
,
$L_{a1782}$
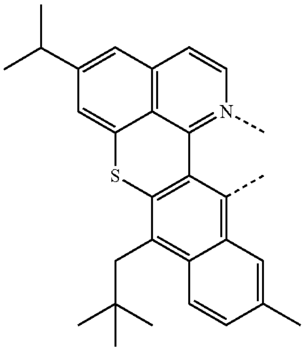
, -continued
$L_{a1783}$
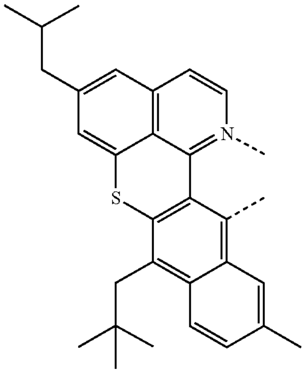
,
$L_{a1784}$
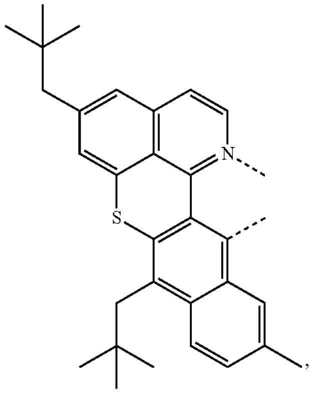
,
$L_{a1785}$
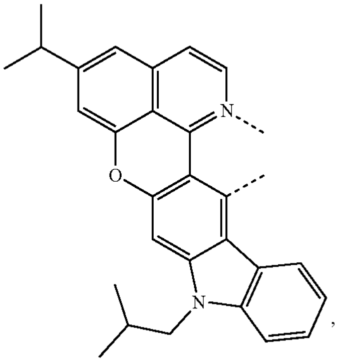
,
$L_{a1786}$
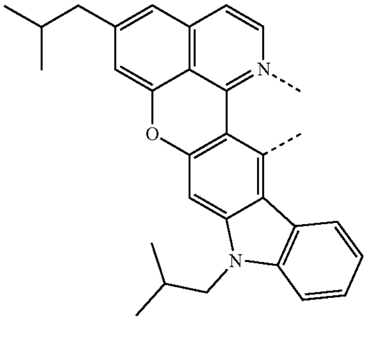
,
-continued
$L_{a1787}$
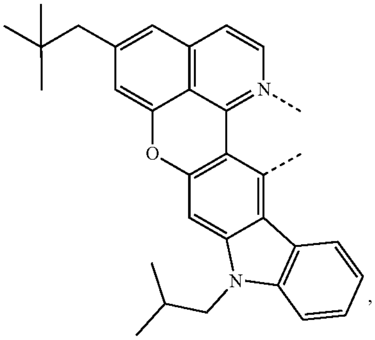
,
$L_{a1788}$
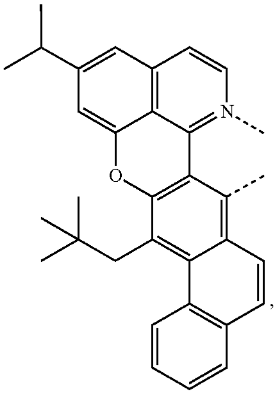
,
$L_{a1789}$
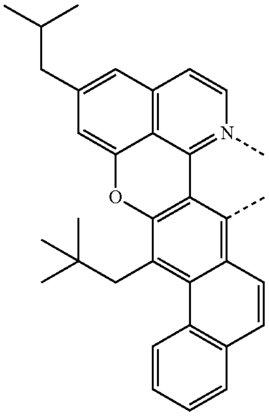
,
$L_{a1790}$
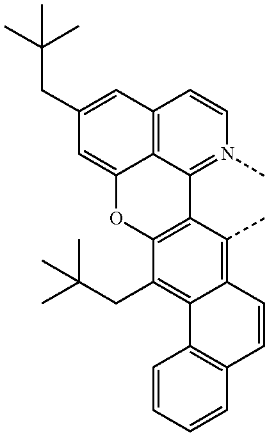
, -continued
L$_{a1791}$
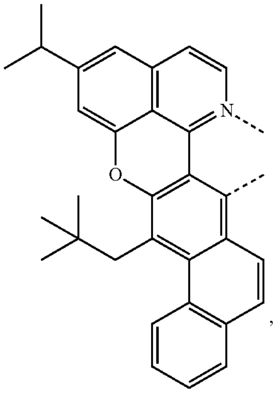
L$_{a1792}$
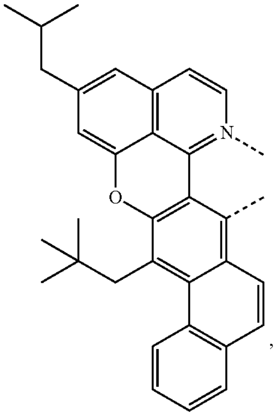
L$_{a1793}$
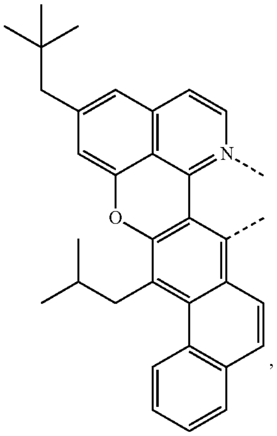
L$_{a1794}$
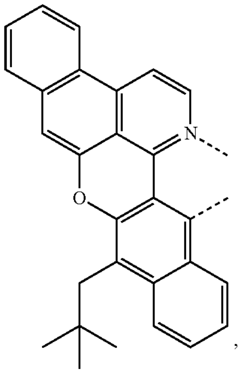
-continued
L$_{a1795}$
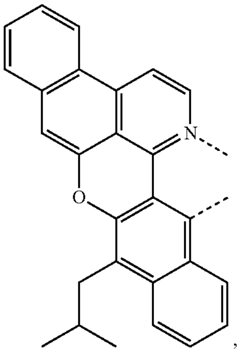
L$_{a1796}$
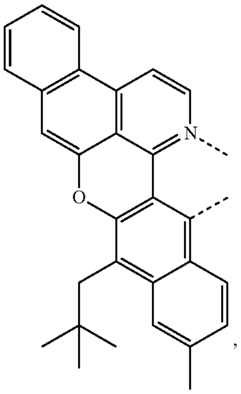
L$_{a1797}$
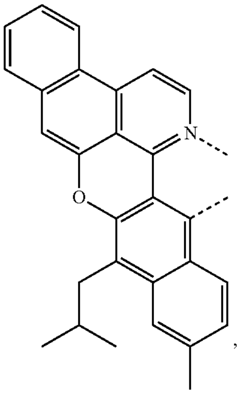
L$_{a1798}$
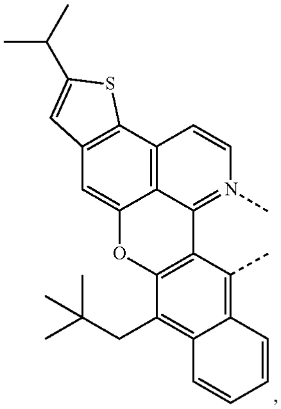

-continued
$L_{a1799}$
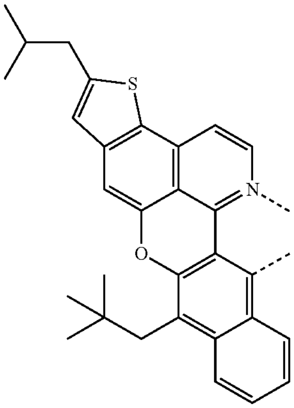
,
$L_{a1800}$
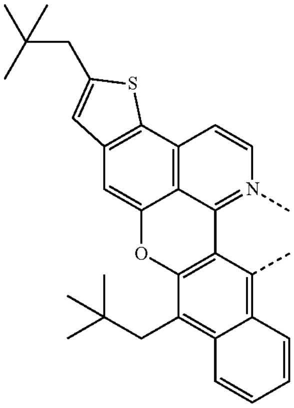
,
$L_{a1801}$
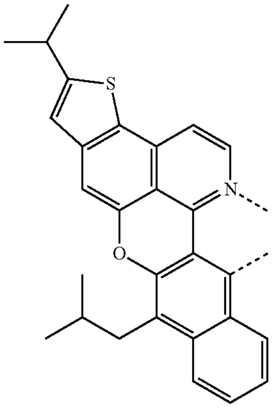
,
-continued
$L_{a1802}$
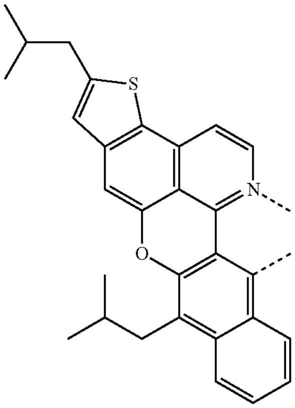
,
$L_{a1803}$
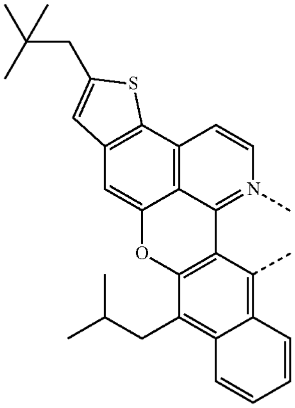
,
$L_{a1804}$
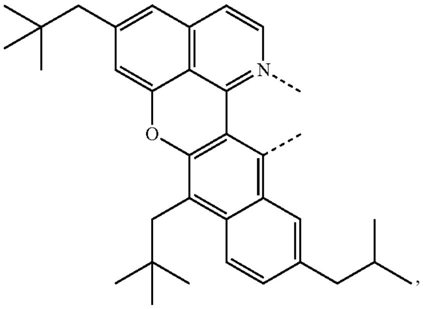
,
$L_{a1805}$
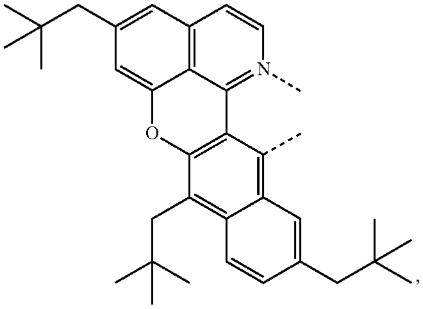
, -continued
$L_{a1806}$
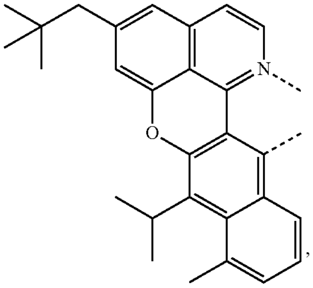
,
$L_{a1807}$
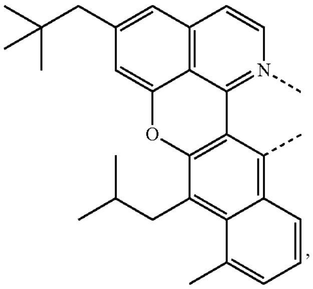
,
$L_{a1808}$
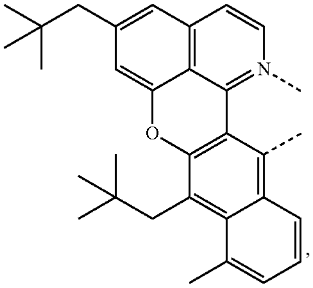
,
$L_{a1809}$
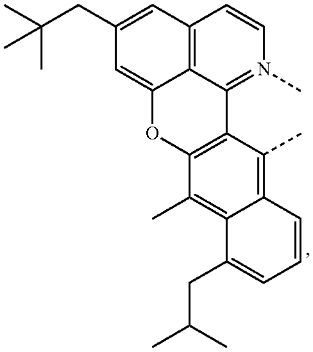
,
$L_{a1810}$
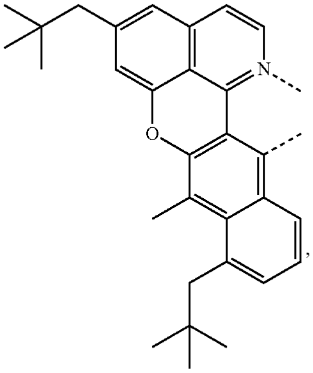
,
-continued
$L_{a1811}$
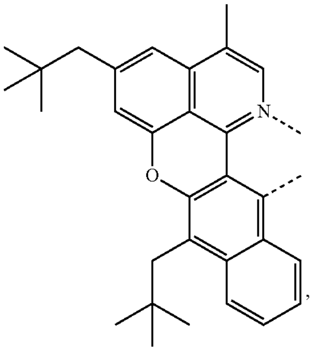
,
$L_{a1812}$
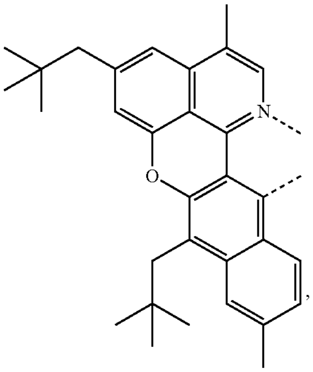
,
$L_{a1813}$
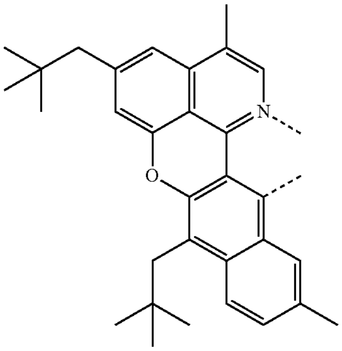
,
$L_{a1814}$
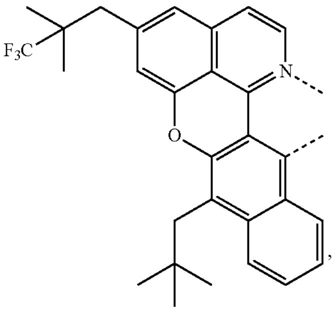
, -continued
$L_{a1815}$
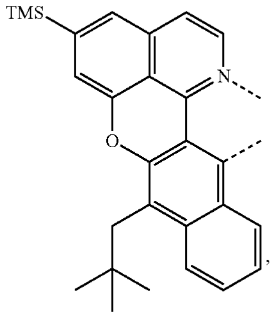
$L_{a1816}$
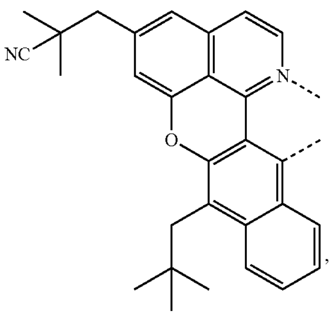
$L_{a1817}$
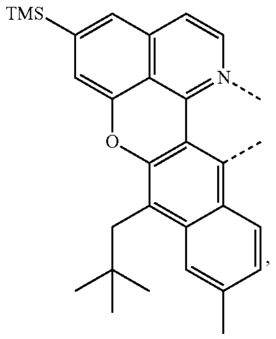
$L_{a1818}$
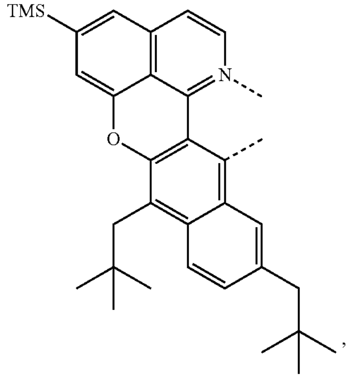
-continued
$L_{a1819}$
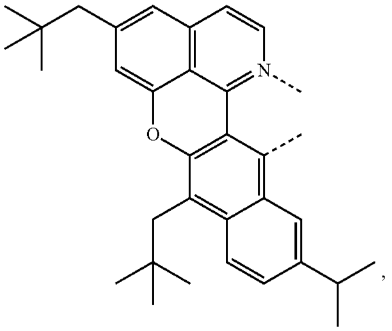
$L_{a1820}$
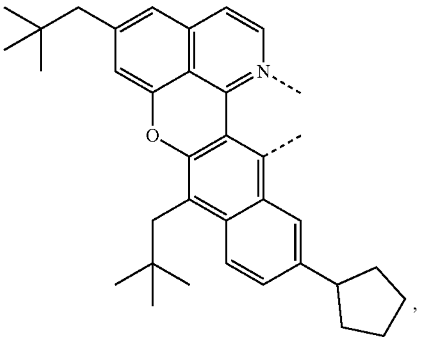
$L_{a1821}$
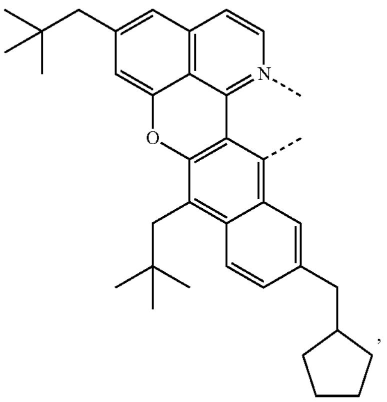
$L_{a1822}$
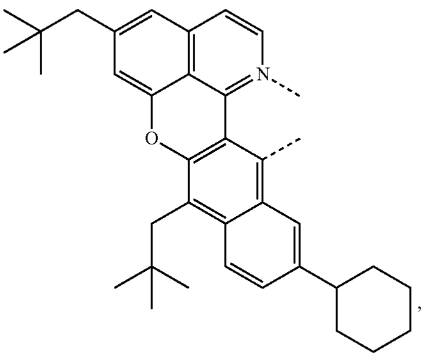

-continued
$L_{a1823}$
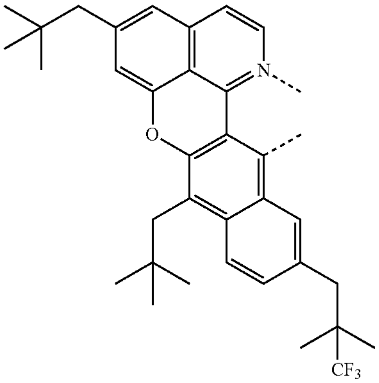
,
$L_{a1824}$
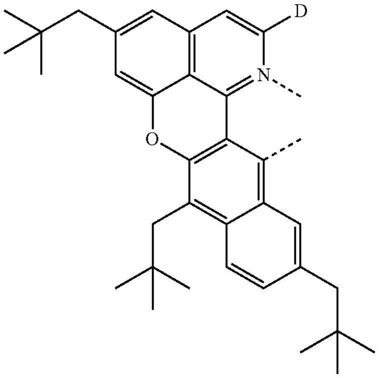
,
$L_{a1825}$
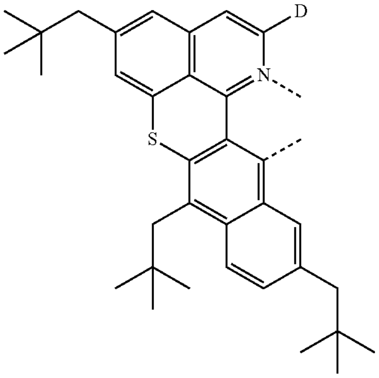
,
$L_{a1826}$
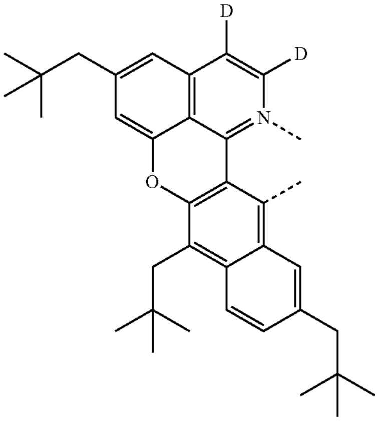
,
-continued
$L_{a1827}$
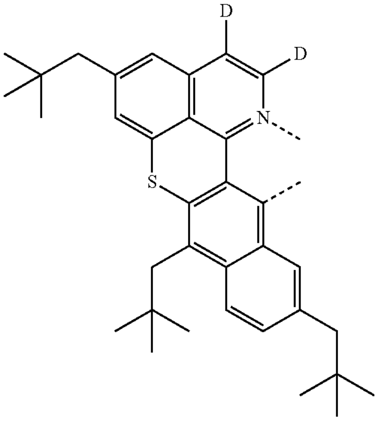
,
$L_{a1828}$
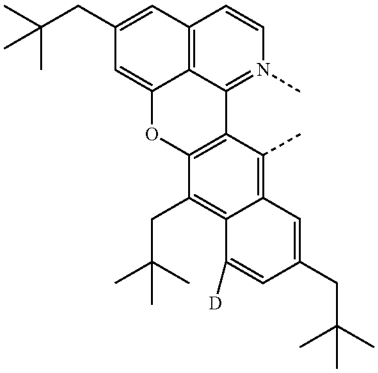
,
$L_{a1829}$
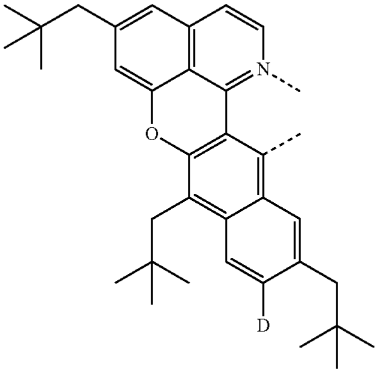
,
$L_{a1830}$
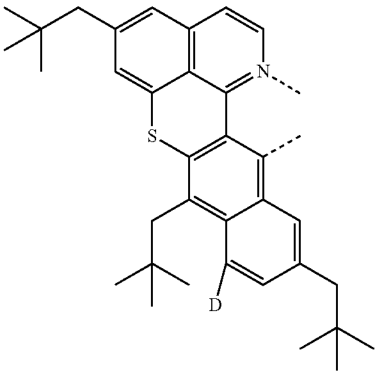
, -continued
L$_{a1831}$
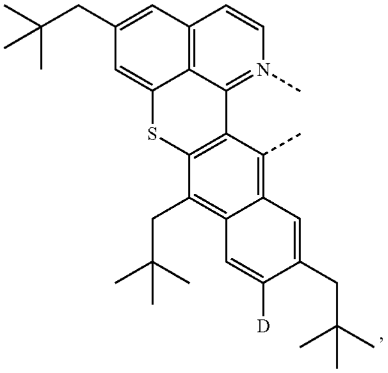
L$_{a1832}$
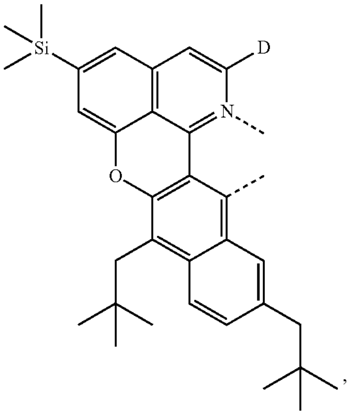
L$_{a1833}$
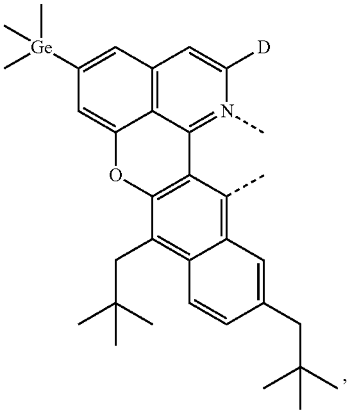
L$_{a1834}$
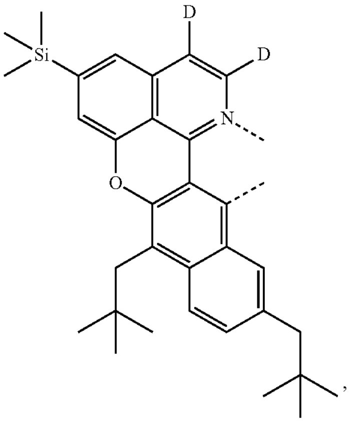
-continued
L$_{a1835}$
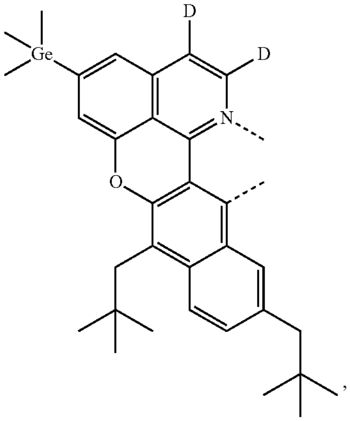
L$_{a1836}$
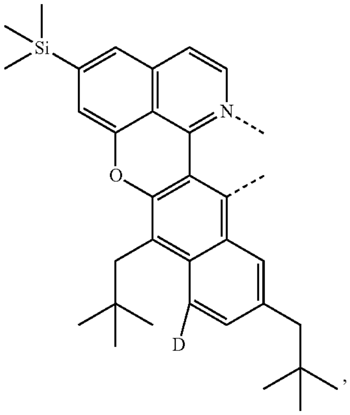
L$_{a1837}$
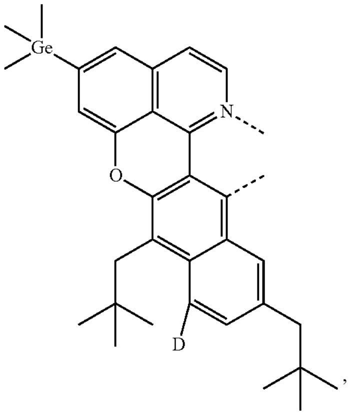

-continued
$L_{a1838}$
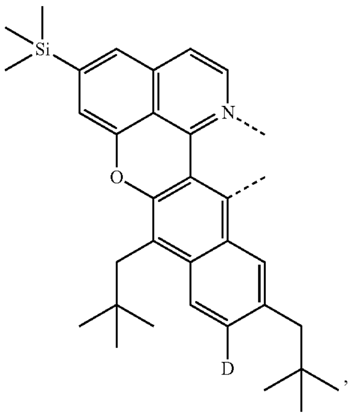
$L_{a1839}$
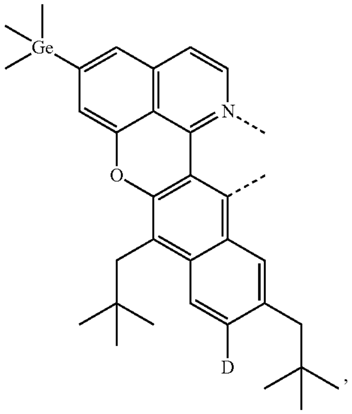
$L_{a1840}$
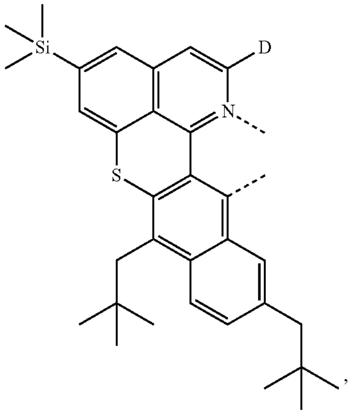
-continued
$L_{a1841}$
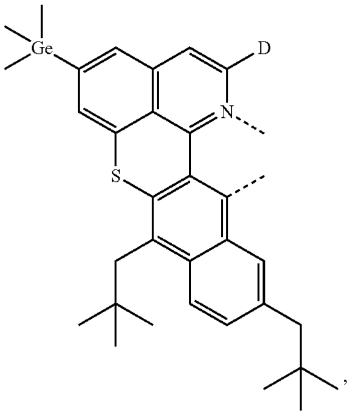
$L_{a1842}$
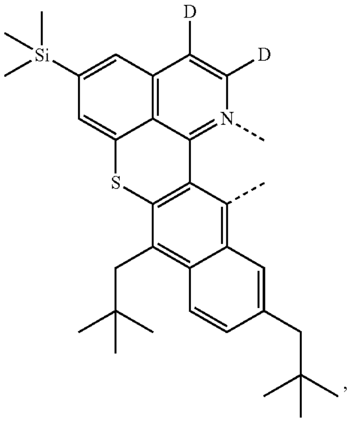
$L_{a1843}$
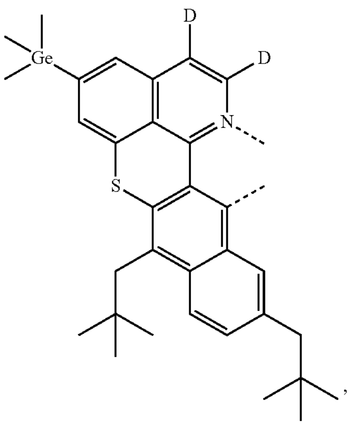

-continued
$L_{a1844}$
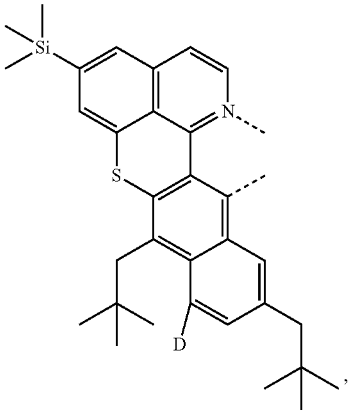
$L_{a1845}$
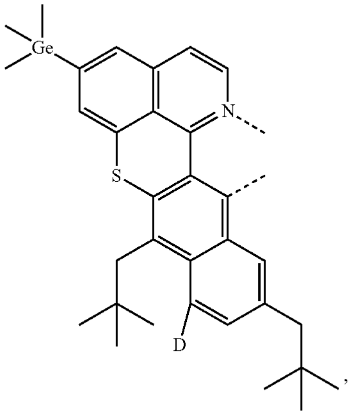
$L_{a1846}$
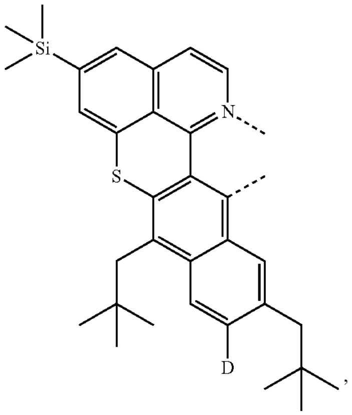
-continued
$L_{a1847}$
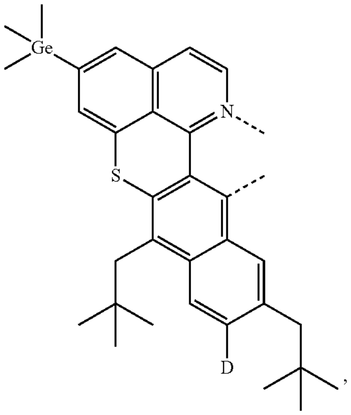
$L_{a1848}$
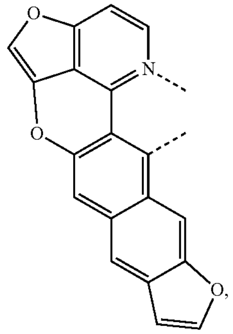
$L_{a1849}$
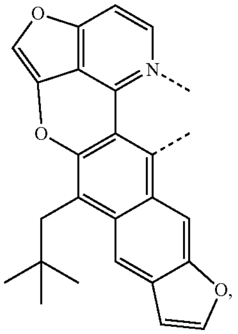
$L_{a1850}$
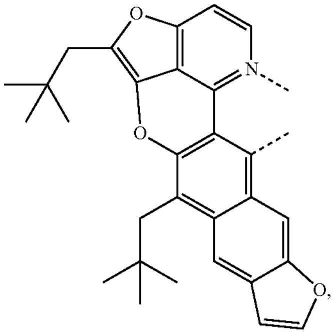

-continued
L_{a1851}
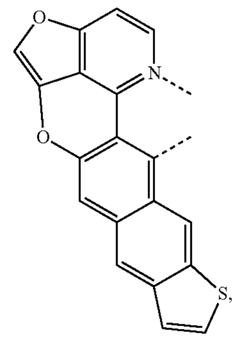
L_{a1852}
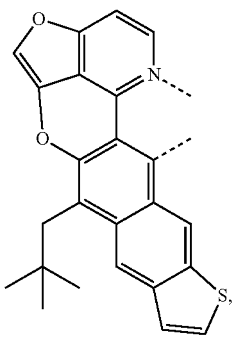
L_{a1853}
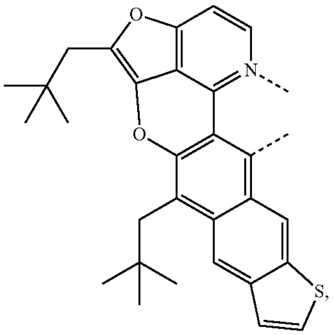
L_{a1854}
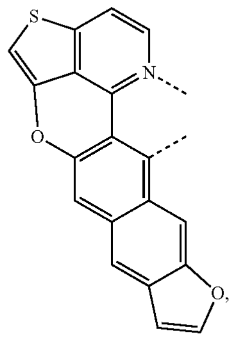
-continued
L_{a1855}
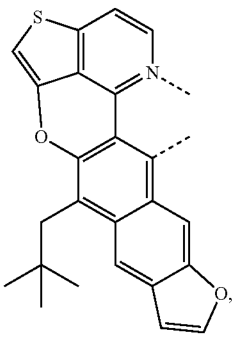
L_{a1856}
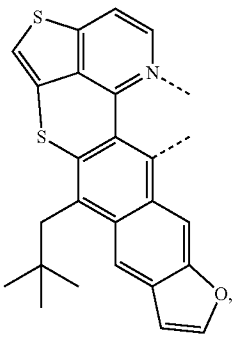
L_{a1857}
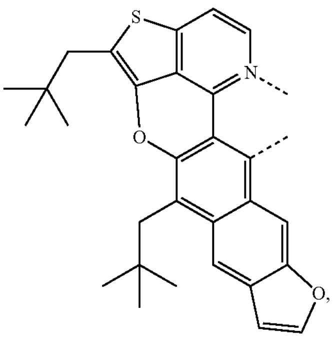
L_{a1858}
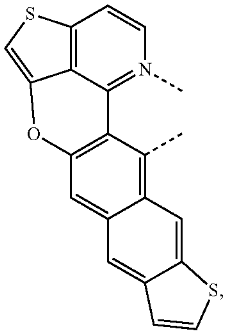

-continued
L$_{a1859}$
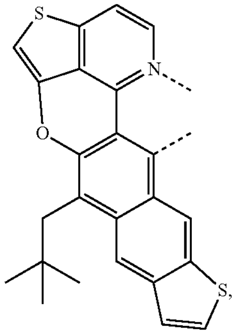
L$_{a1860}$
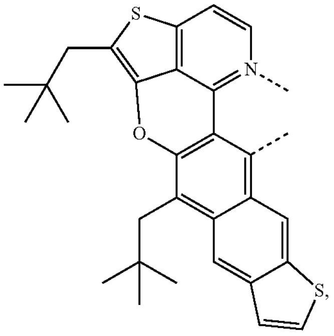
L$_{a1861}$
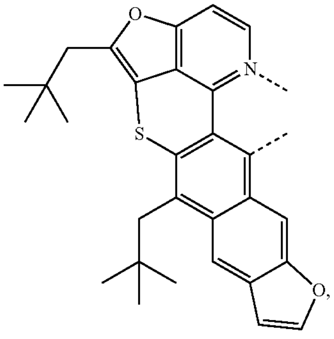
L$_{a1862}$
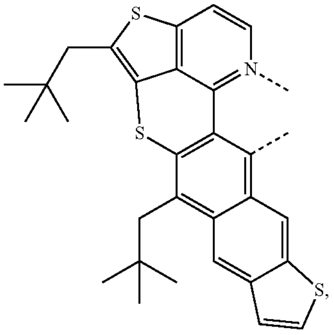
-continued
L$_{a1863}$
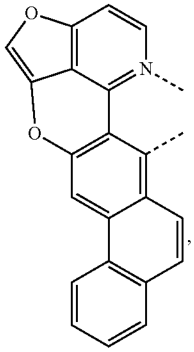
L$_{a1864}$
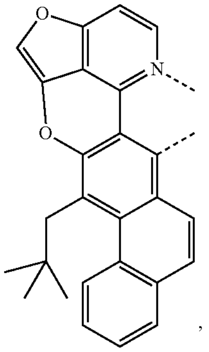
L$_{a1865}$
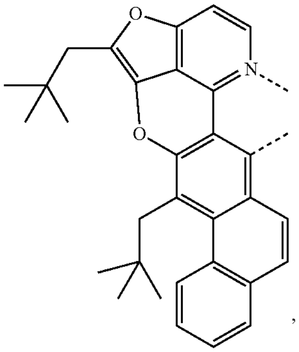
L$_{a1866}$
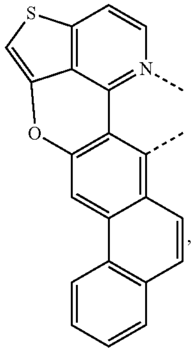

-continued
La1867
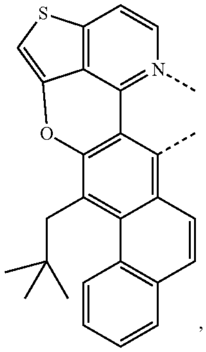
,
La1868
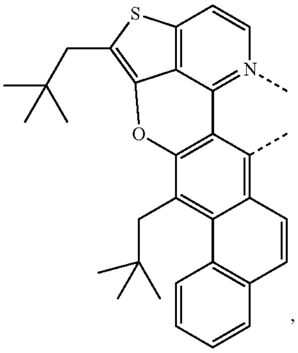
,
La1869
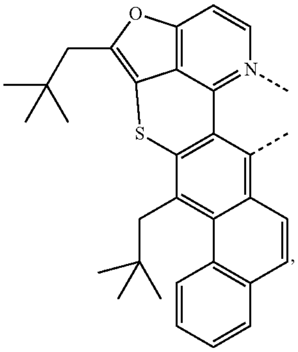
,
La1870
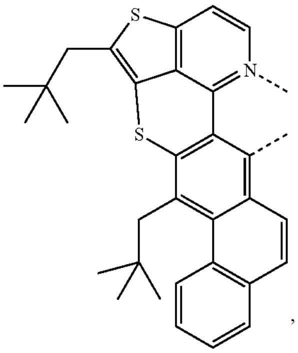
,
-continued
La1871
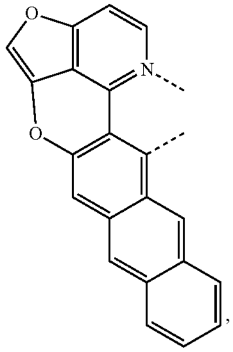
,
La1872
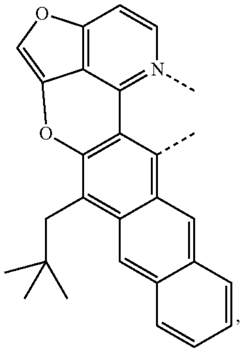
,
La1873
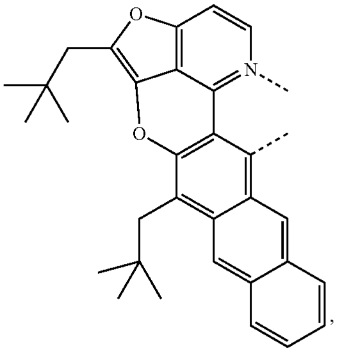
,
La1874
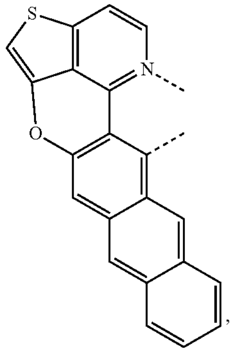
, -continued
$L_{a1875}$
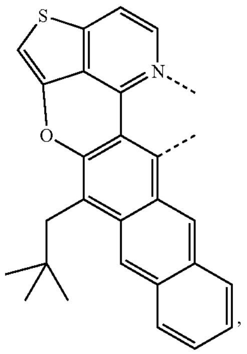
$L_{a1876}$
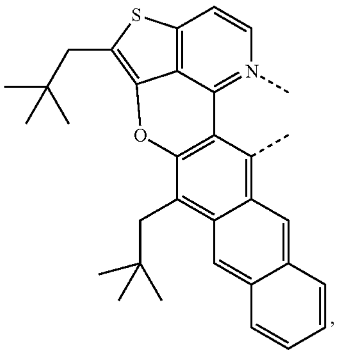
$L_{a1877}$
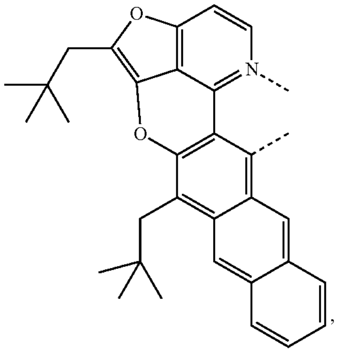
$L_{a1878}$
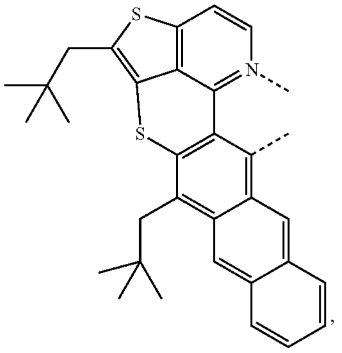
-continued
$L_{a1879}$
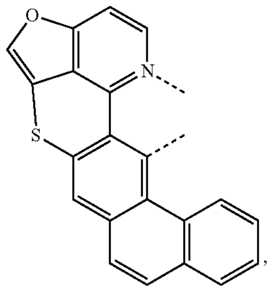
$L_{a1880}$
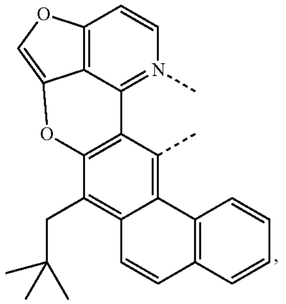
$L_{a1881}$
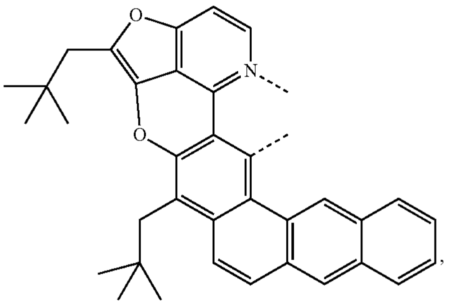
$L_{a1882}$
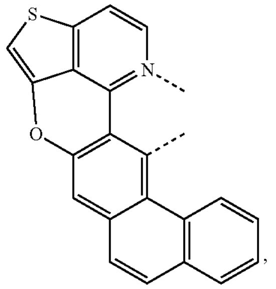
$L_{a1883}$
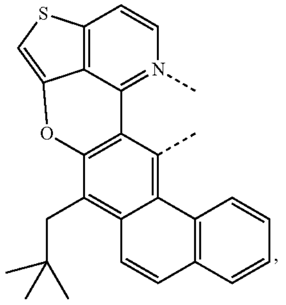

$L_{a1884}$
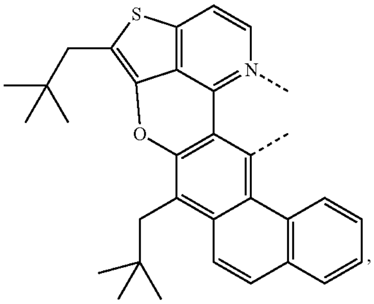
,
$L_{a1885}$
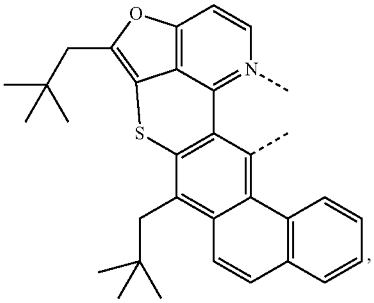
,
$L_{a1886}$
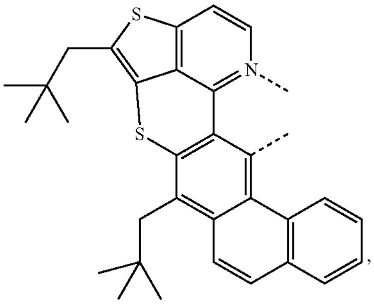
,
$L_{a1887}$
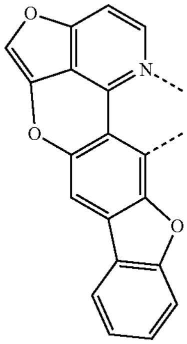
,
$L_{a1888}$
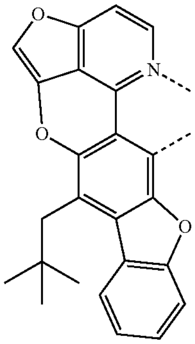
,
$L_{a1889}$
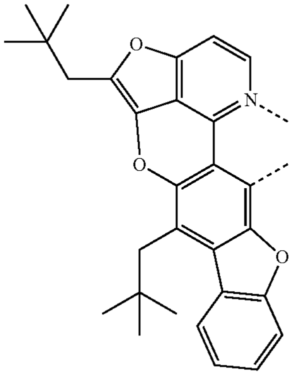
,
$L_{a1890}$
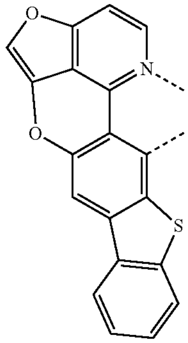
,
$L_{a1891}$
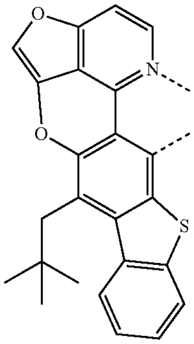
,
$L_{a1892}$
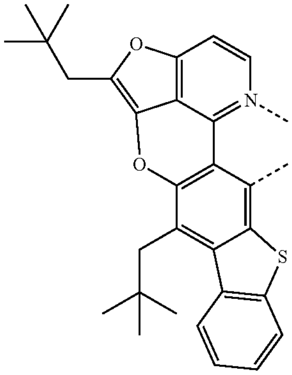
,

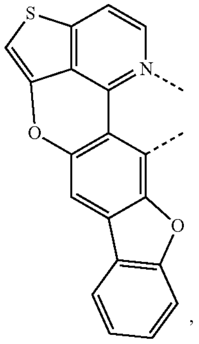
$L_{a1893}$
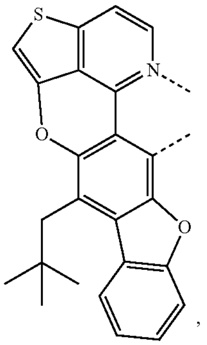
$L_{a1894}$
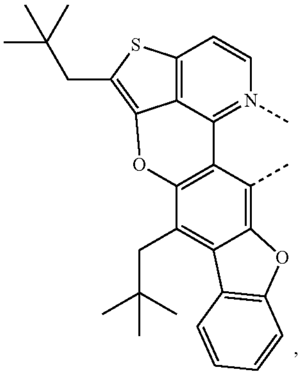
$L_{a1895}$
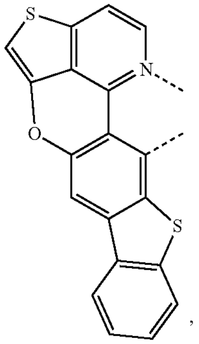
$L_{a1896}$
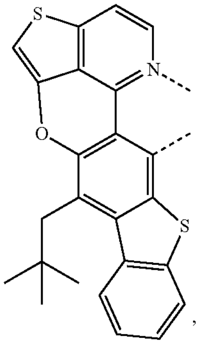
$L_{a1897}$
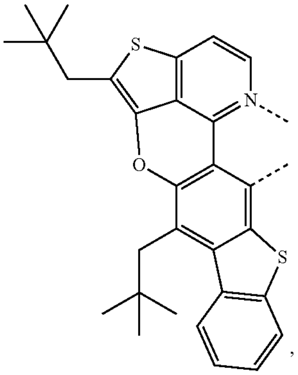
$L_{a1898}$
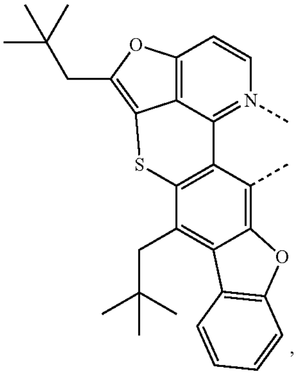
$L_{a1899}$
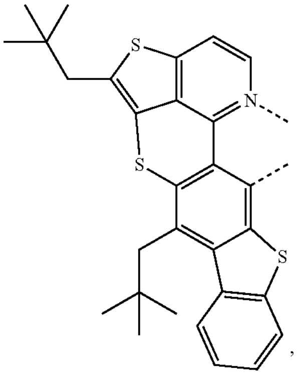
$L_{a1900}$ -continued
$L_{a1901}$
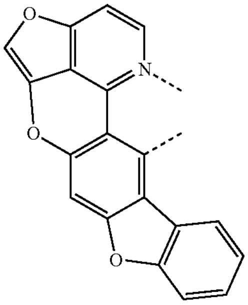
,
$L_{a1902}$
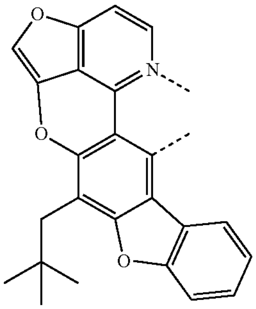
,
$L_{a1903}$
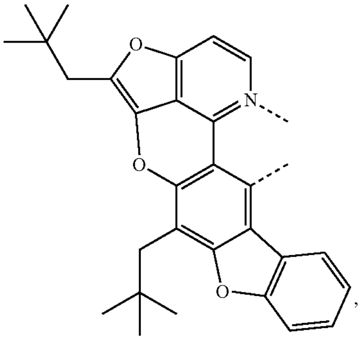
,
$L_{a1904}$
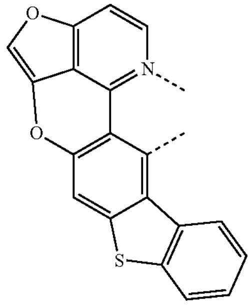
,
$L_{a1905}$
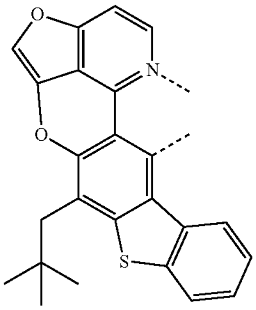
,
-continued
$L_{a1906}$
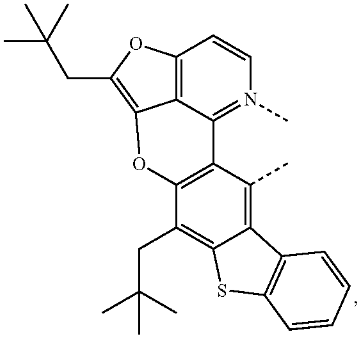
,
$L_{a1907}$
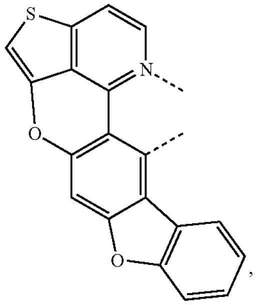
,
$L_{a1908}$
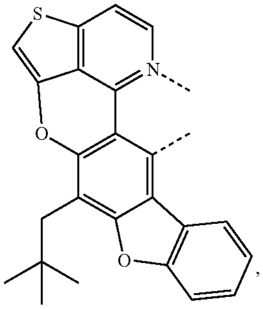
,
$L_{a1909}$
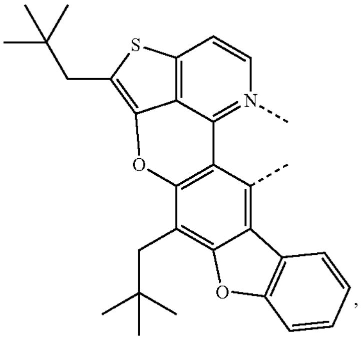
,
$L_{a1910}$
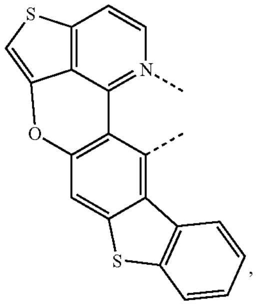
, -continued
$L_{a1911}$
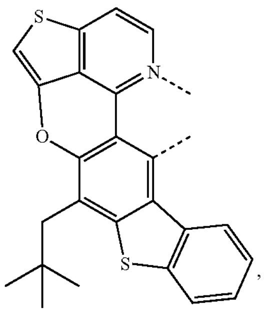
,
$L_{a1912}$
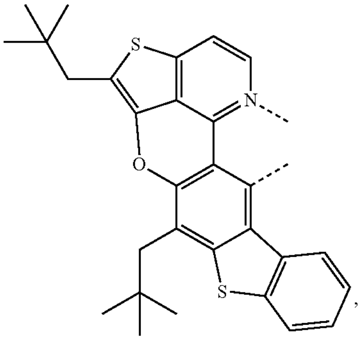
,
$L_{a1913}$
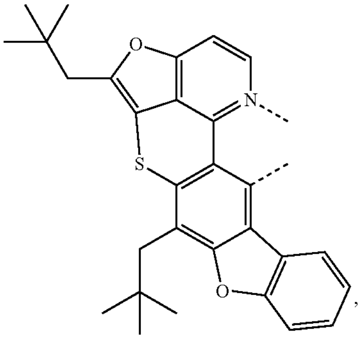
,
$L_{a1914}$
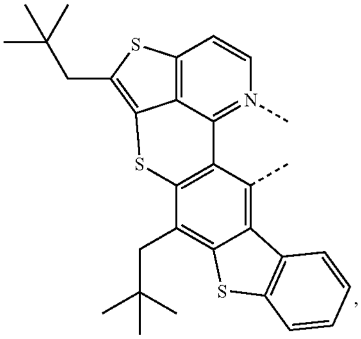
,
-continued
$L_{a1915}$
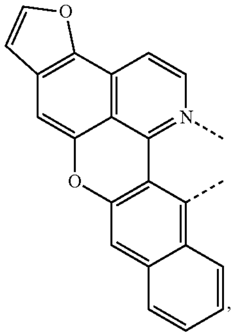
,
$L_{a1916}$
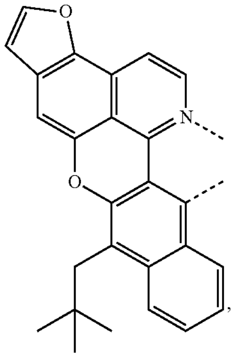
,
$L_{a1917}$
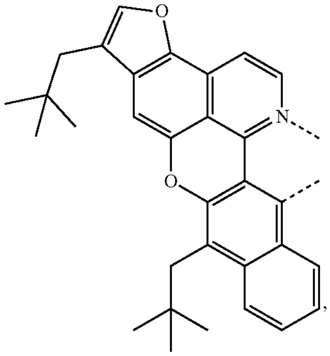
,
$L_{a1918}$
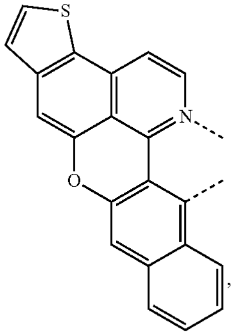
, -continued
La1919
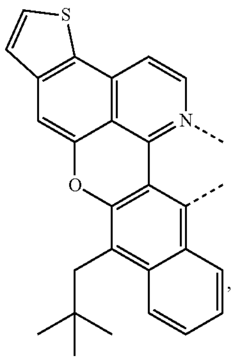
La1920
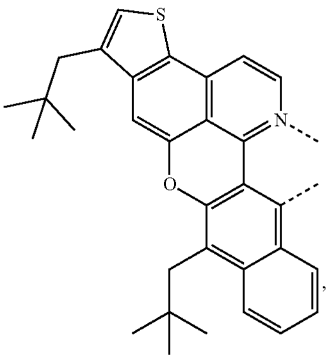
La1921
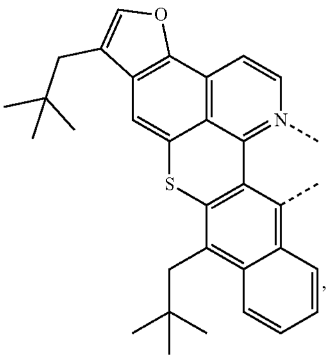
La1922
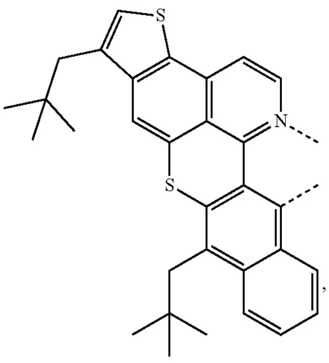
-continued
La1923
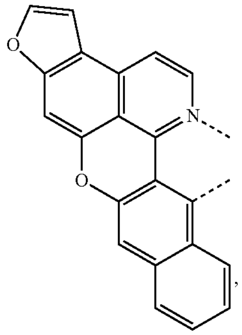
La1924
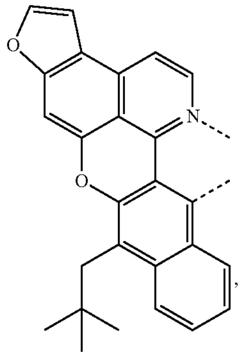
La1925
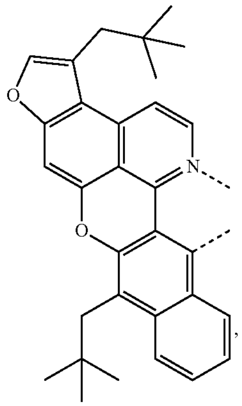
La1926
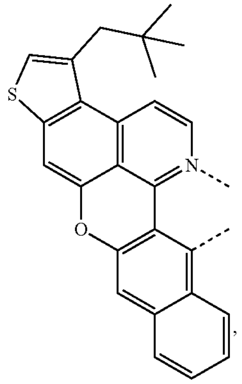

-continued $L_{a1927}$

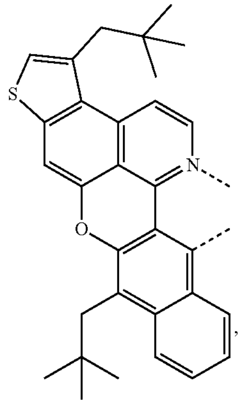

$L_{a1928}$

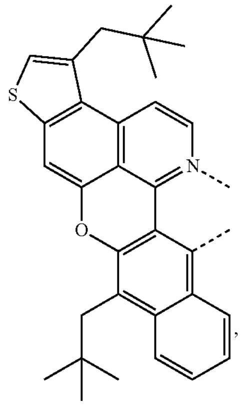

$L_{a1929}$

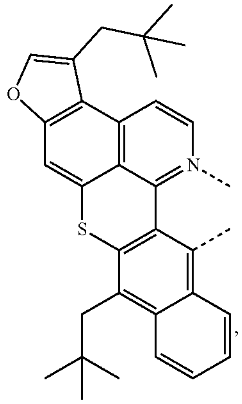

$L_{a1930}$

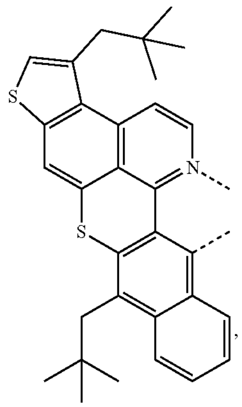

-continued $L_{a1931}$

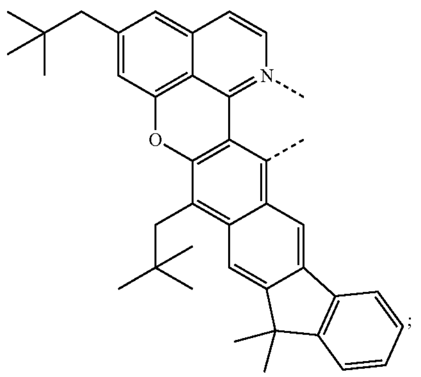

wherein in the above structures, TMS is trimethylsilyl;

wherein optionally, hydrogens in the above structures can be partially or fully substituted with deuterium.

15. The metal complex of claim 14, wherein the metal complex has a structure of $M(L_a)_m(L_b)_n(L_c)_q$;

wherein, the metal M is selected from a metal with a relative atomic mass greater than 40; $L_a$, $L_b$ and $L_c$ are the first ligand, the second ligand and the third ligand of the metal complex, respectively; m is 1, 2 or 3, n is 0, 1 or 2, q is 0, 1 or 2, and m+n+q is equal to the oxidation state of the metal M; when m is greater than 1, the multiple $L_a$ are the same or different; when n is 2, the two $L_b$ are the same or different; when q is 2, the two $L_c$ are the same or different;

$L_a$, $L_b$ and $L_c$ can be optionally joined to form a multi-dentate ligand; and $L_b$ and $L_c$ are, at each occurrence identically or differently, selected from the group consisting of the following structures:

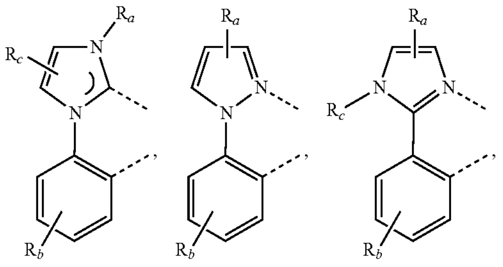

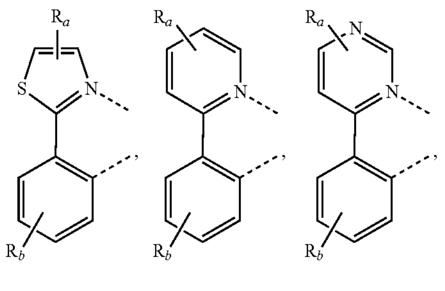

-continued

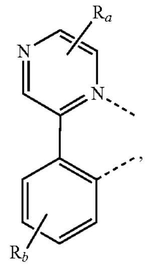
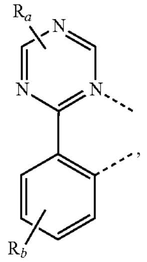
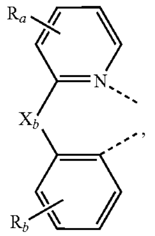
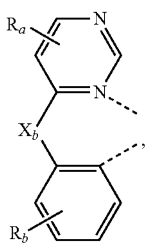
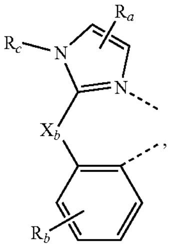
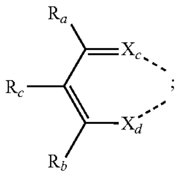

wherein $R_a$, $R_b$ and $R_c$ represent, at each occurrence identically or differently, mono-substitution, multiple substitutions or non-substitution;

$X_b$ is, at each occurrence identically or differently, selected from the group consisting of: O, S, Se, $NR_{N1}$ and $CR_{c1}R_{c2}$;

$X_c$ and $X_d$ are, at each occurrence identically or differently, selected from the group consisting of: O, S, Se and $NR_{N2}$;

$R_a$, $R_b$, $R_c$, $R_{N1}$, $R_{N2}$, $R_{c1}$ and $R_{c2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof, and adjacent substituents $R_a$, $R_b$, $R_c$, $R_{N1}$, $R_{N2}$, $R_{c1}$ and $R_{c2}$ can be optionally joined to form a ring.

16. The metal complex of claim 15, wherein the metal M is selected from Ir, Rh, Re, Os, Pt, Au or Cu.

17. The metal complex of claim 15, wherein $L_b$ is, at each occurrence identically or differently, selected from the following structure:

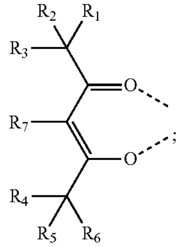

wherein $R_1$ to $R_7$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted amino having 0 to 20 carbon atoms, an acyl group, a carbonyl group, a carboxylic acid group, an ester group, a cyano group, an isocyano group, a sulfanyl group, a sulfinyl group, a sulfonyl group, a phosphino group and combinations thereof.

18. The metal complex of claim 15, wherein $L_b$ is, at each occurrence identically or differently, selected from the group consisting of the following structures:

$L_{b1}$

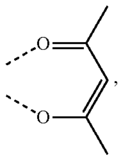

$L_{b2}$

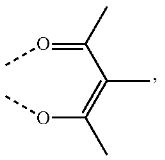

$L_{b3}$

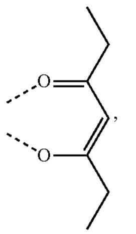

-continued
L$_{b4}$
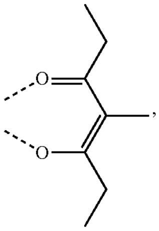,
L$_{b5}$
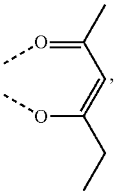,
L$_{b6}$
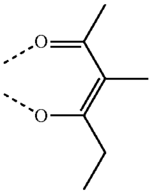,
L$_{b7}$
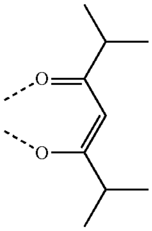,
L$_{b8}$
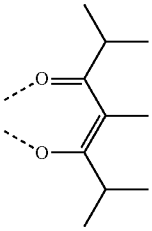,
L$_{b9}$
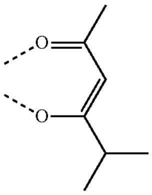,
L$_{b10}$
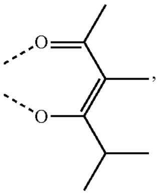,
-continued
L$_{b11}$
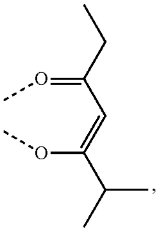,
L$_{b12}$
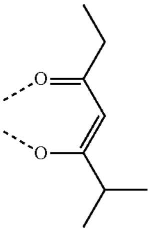,
L$_{b13}$
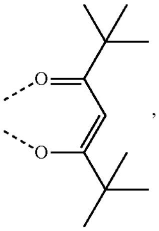,
L$_{b14}$
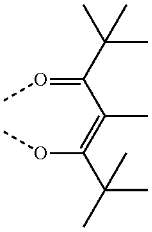,
L$_{b15}$
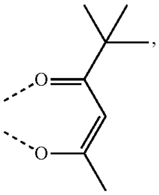,
L$_{b16}$
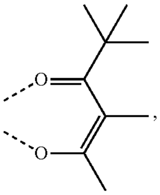,
L$_{b17}$
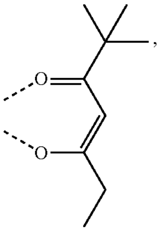, -continued
$L_{b18}$
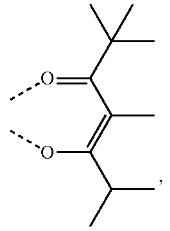
,
$L_{b19}$
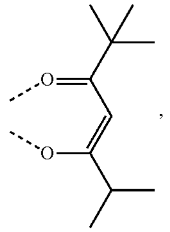
,
$L_{b20}$
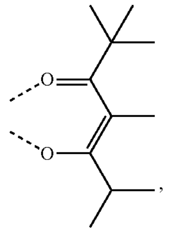
,
$L_{b21}$
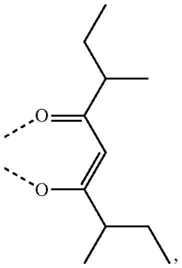
,
$L_{b22}$
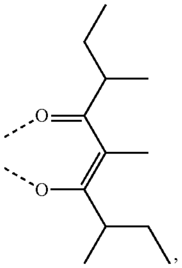
,
$L_{b23}$
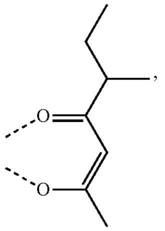
,
-continued
$L_{b24}$
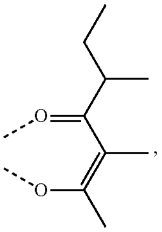
,
$L_{b25}$
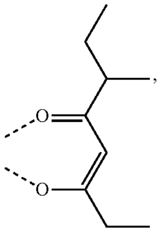
,
$L_{b26}$
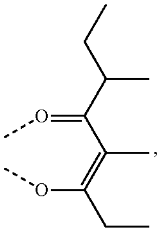
,
$L_{b27}$
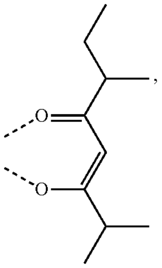
,
$L_{b28}$
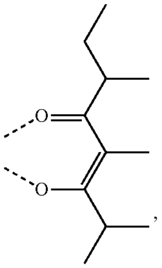
,
$L_{b29}$
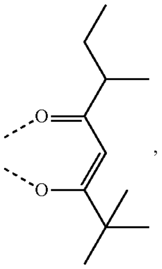
, -continued
$L_{b30}$
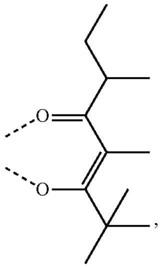
$L_{b31}$
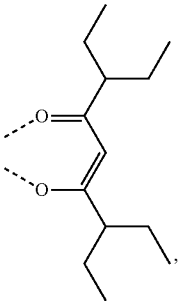
$L_{b32}$
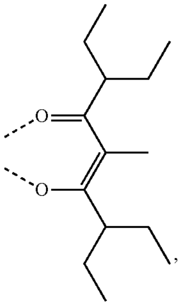
$L_{b33}$
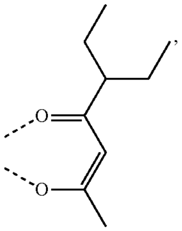
$L_{b34}$
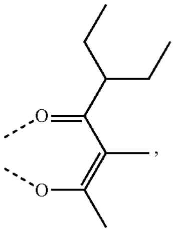
$L_{b35}$
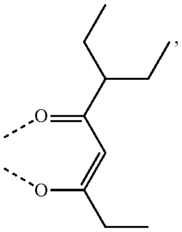
-continued
$L_{b36}$
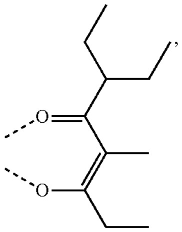
$L_{b37}$
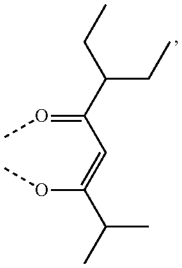
$L_{b38}$
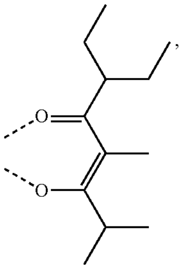
$L_{b39}$
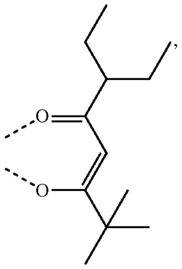
$L_{b40}$
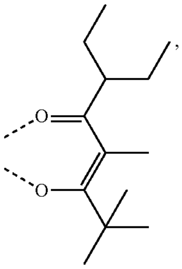
$L_{b41}$
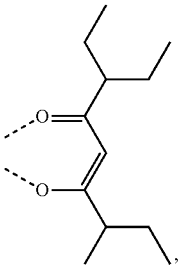

-continued
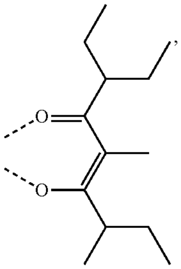
$L_{b42}$
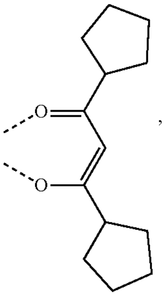
$L_{b43}$
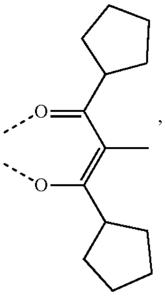
$L_{b44}$
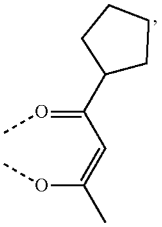
$L_{b45}$
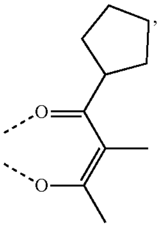
$L_{b46}$
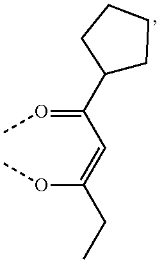
$L_{b47}$
-continued
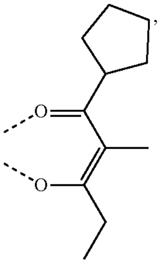
$L_{b48}$
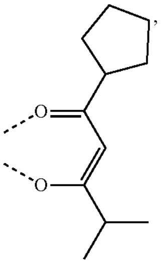
$L_{b49}$
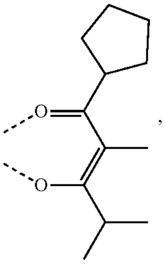
$L_{b50}$
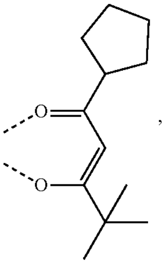
$L_{b51}$
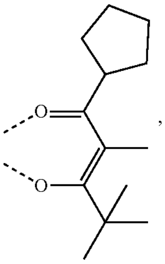
$L_{b52}$
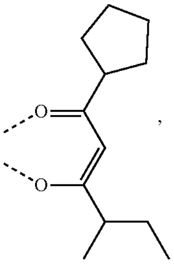
$L_{b53}$ -continued
$L_{b54}$
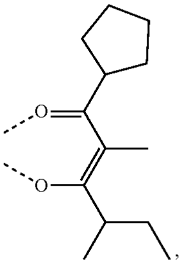
,
$L_{b55}$
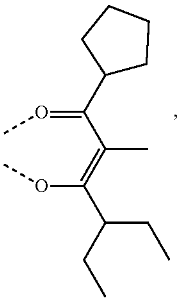
,
$L_{b56}$
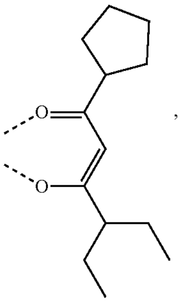
,
$L_{b57}$
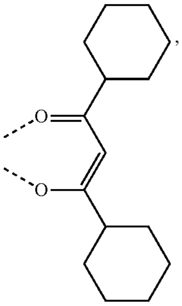
,
$L_{b58}$
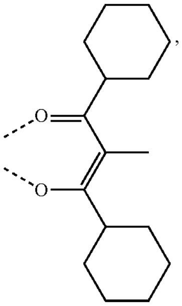
,
-continued
$L_{b59}$
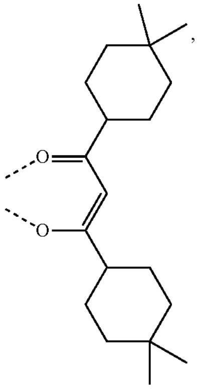
,
$L_{b60}$
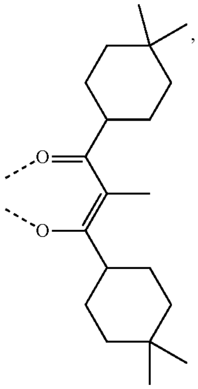
,
$L_{b61}$
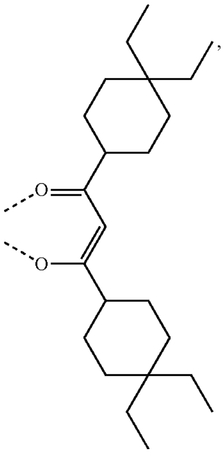
, -continued
$L_{b62}$
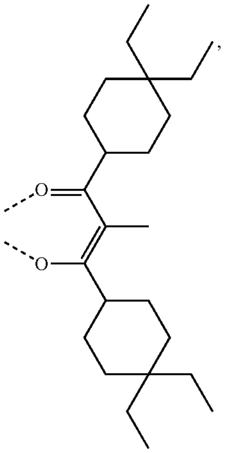
$L_{b63}$
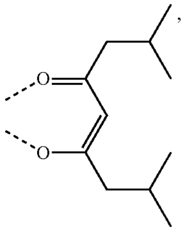
$L_{b64}$
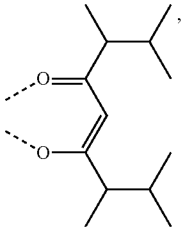
$L_{b65}$
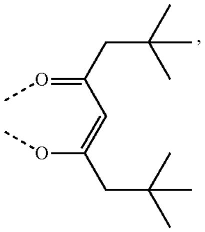
$L_{b66}$
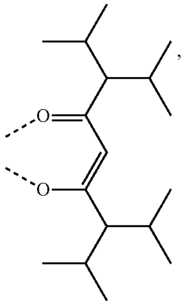
-continued
$L_{b67}$
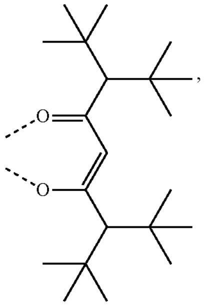
$L_{b68}$
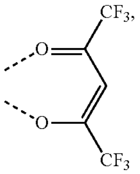
$L_{b69}$
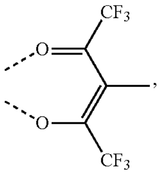
$L_{b70}$
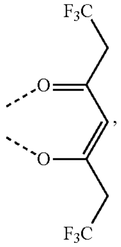
$L_{b71}$
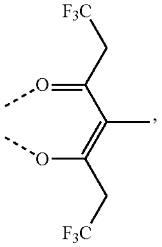
$L_{b72}$
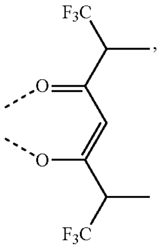

-continued
$L_{b73}$
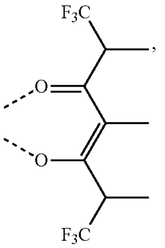
$L_{b74}$
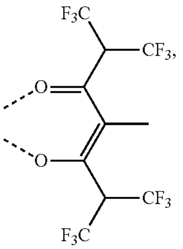
$L_{b75}$
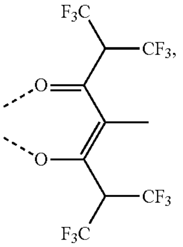
$L_{b76}$
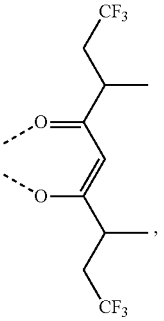
$L_{b77}$
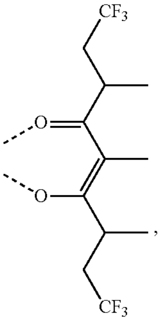
-continued
$L_{b78}$
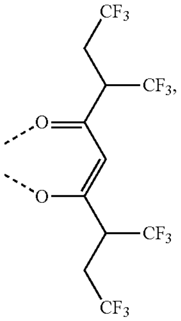
$L_{b79}$
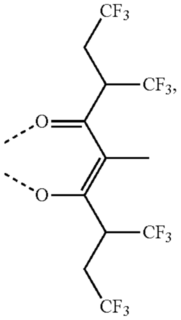
$L_{b80}$
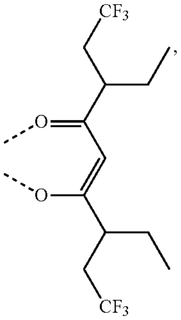
$L_{b81}$
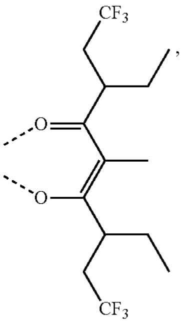
$L_{b82}$
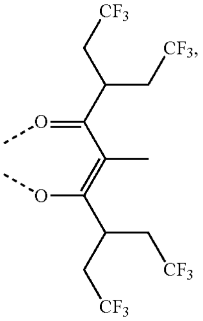

-continued
$L_{b83}$
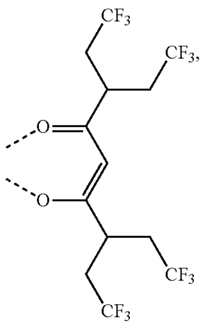
$L_{b84}$
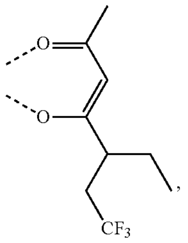
$L_{b85}$
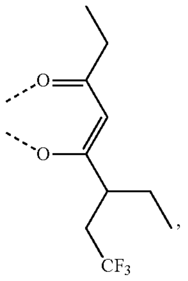
$L_{b86}$
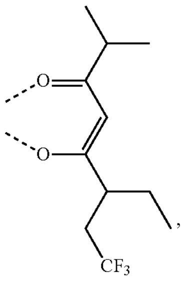
$L_{b87}$
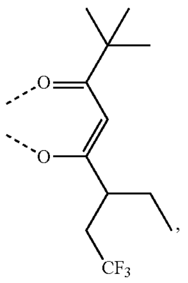
-continued
$L_{b88}$
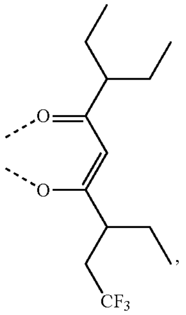
$L_{b89}$
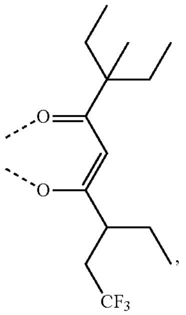
$L_{b90}$
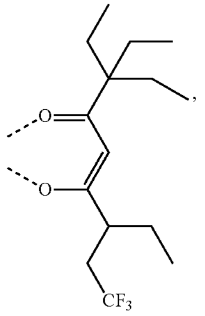
$L_{b91}$
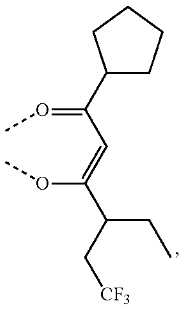
$L_{b92}$
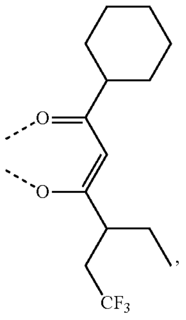

-continued
L$_{b93}$
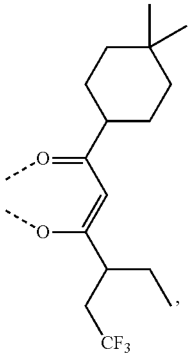
L$_{b94}$
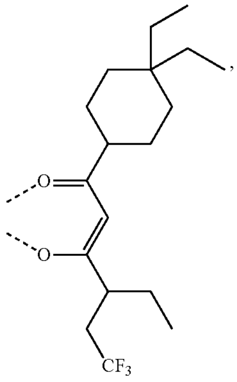
L$_{b95}$
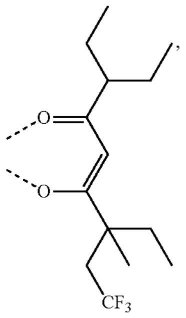
L$_{b96}$
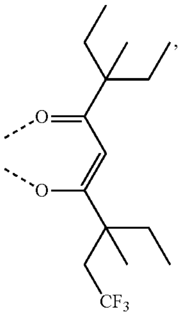
-continued
L$_{b97}$
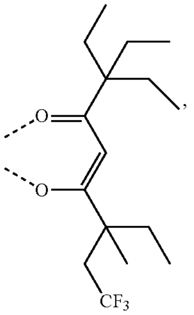
L$_{b98}$
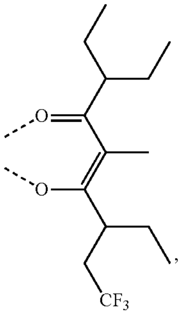
L$_{b99}$
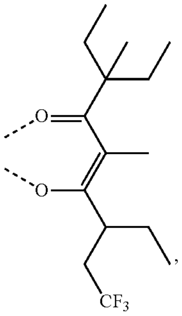
L$_{b100}$
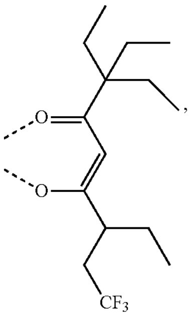
L$_{b101}$
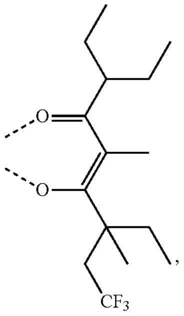

-continued
$L_{b102}$
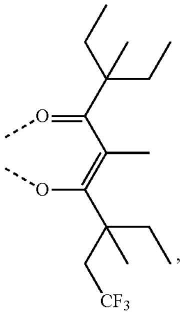
$L_{b103}$
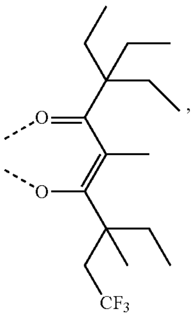
$L_{b104}$
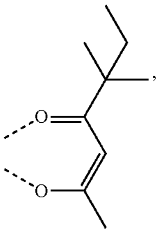
$L_{b105}$
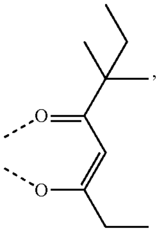
$L_{b106}$
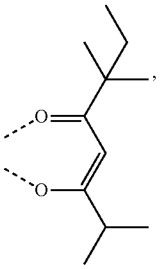
-continued
$L_{b107}$
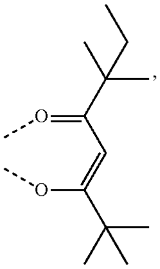
$L_{b108}$
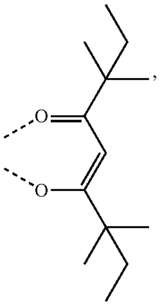
$L_{b109}$
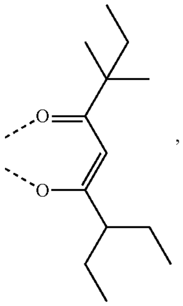
$L_{b110}$
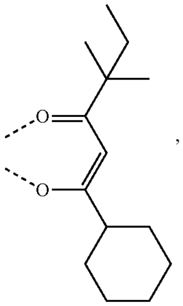
$L_{b111}$
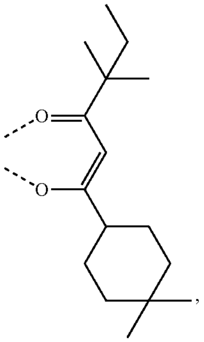

-continued
$L_{b112}$
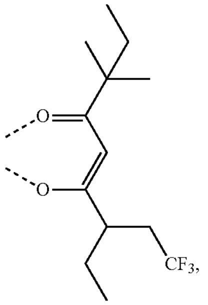
$L_{b113}$
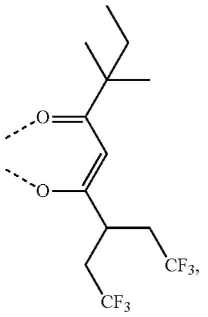
$L_{b114}$
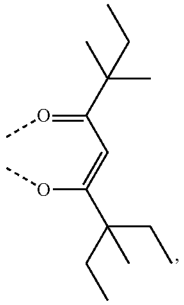
$L_{b115}$
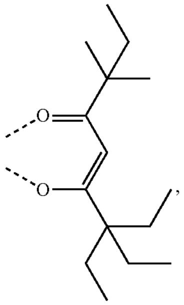
$L_{b116}$
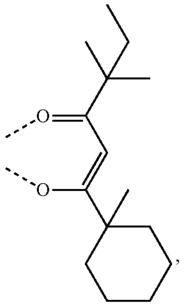
-continued
$L_{b117}$
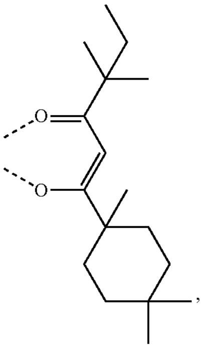
$L_{b118}$
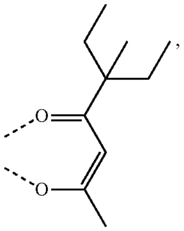
$L_{b119}$
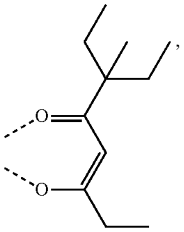
$L_{b120}$
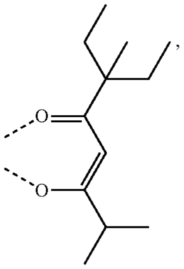
$L_{b121}$
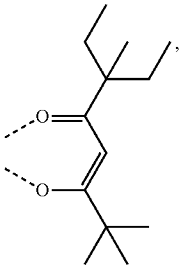

-continued
$L_{b122}$
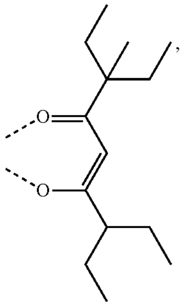
$L_{b123}$
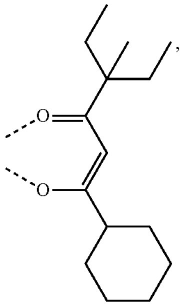
$L_{b124}$
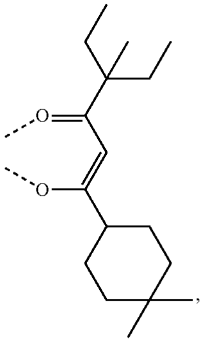
$L_{b125}$
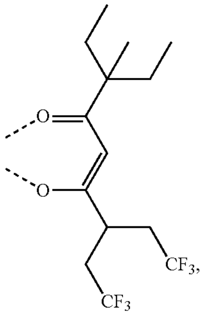
$L_{b126}$
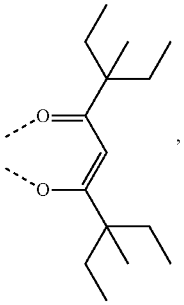
-continued
$L_{b127}$
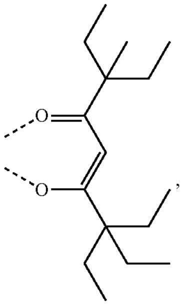
$L_{b128}$
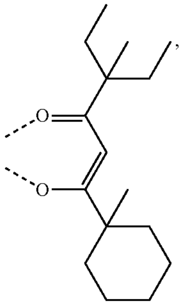
$L_{b129}$
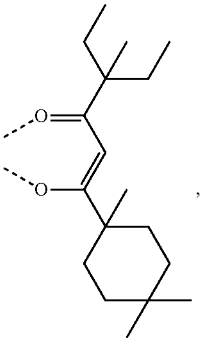
$L_{b130}$
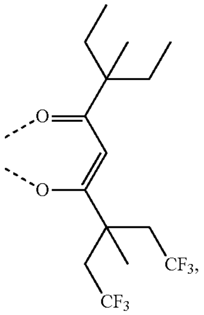
$L_{b131}$
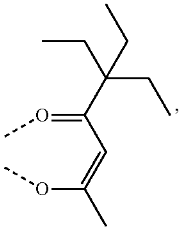

-continued
$L_{b132}$
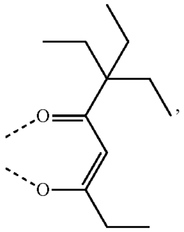
$L_{b133}$
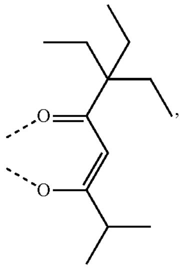
$L_{b134}$
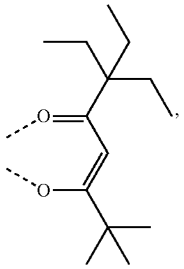
$L_{b135}$
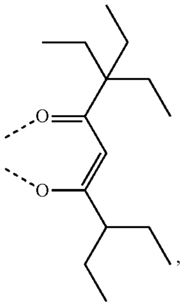
$L_{b136}$
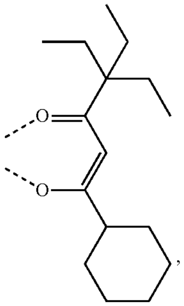
-continued
$L_{b137}$
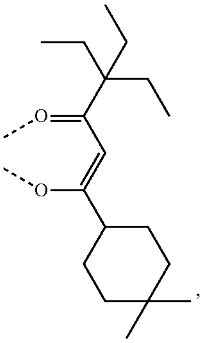
$L_{b138}$
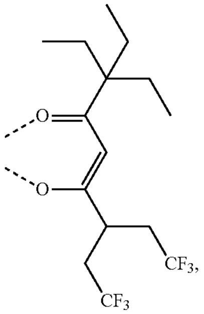
$L_{b139}$
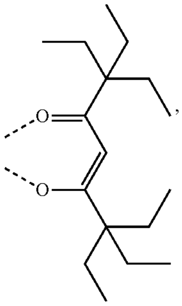
$L_{b140}$
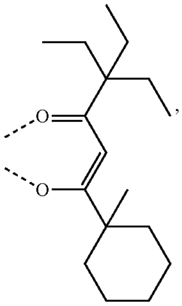

-continued
$L_{b141}$
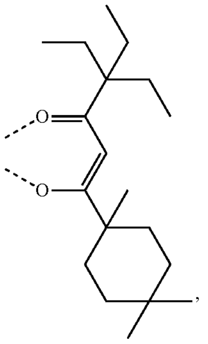
$L_{b142}$
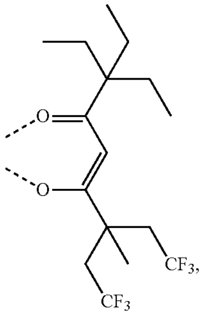
$L_{b143}$
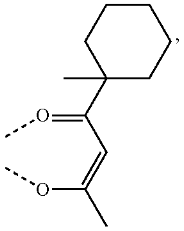
$L_{b144}$
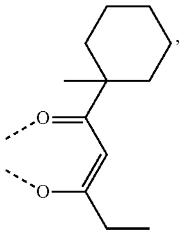
$L_{b145}$
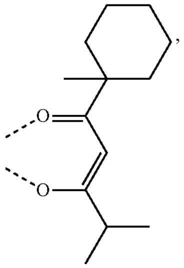
-continued
$L_{b146}$
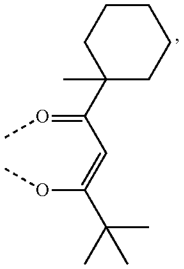
$L_{b147}$
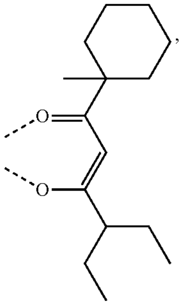
$L_{b148}$
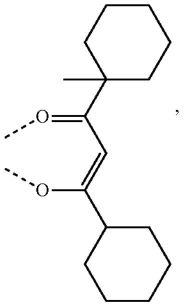
$L_{b149}$
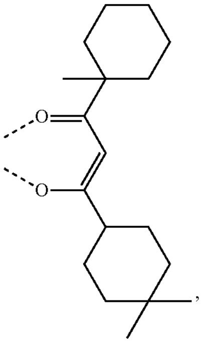
$L_{b150}$
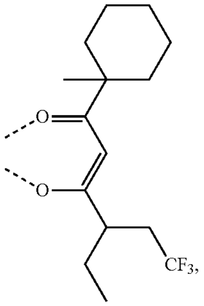

-continued
$L_{b151}$
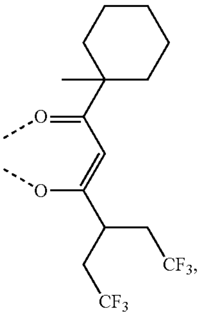
$L_{b152}$
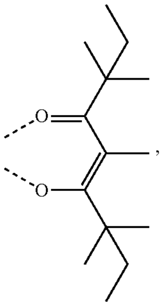
$L_{b153}$
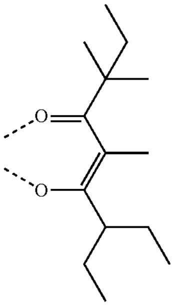
,
$L_{b154}$
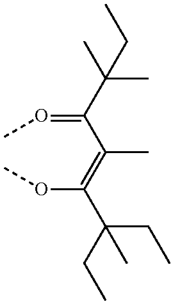
,
$L_{b155}$
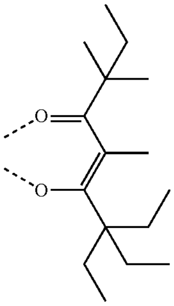
,
-continued
$L_{b156}$
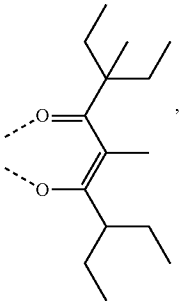
,
$L_{b157}$
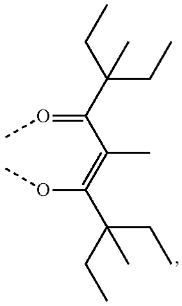
$L_{b158}$
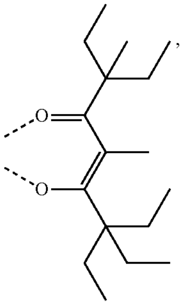
$L_{b159}$
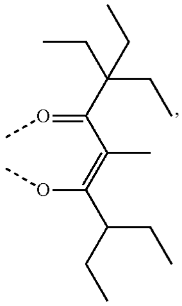
$L_{b160}$
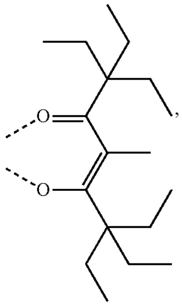

-continued
$L_{b161}$
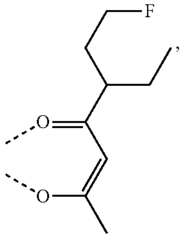
$L_{b162}$
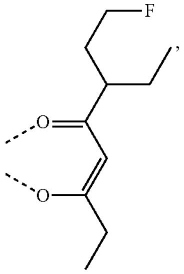
$L_{b163}$
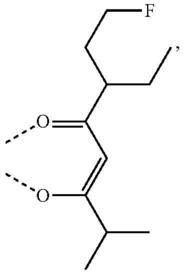
$L_{b164}$
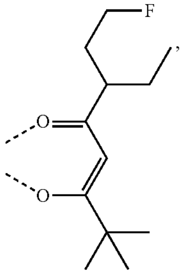
$L_{b165}$
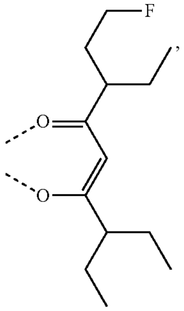
-continued
$L_{b166}$
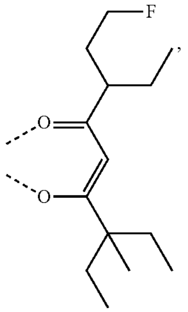
$L_{b167}$
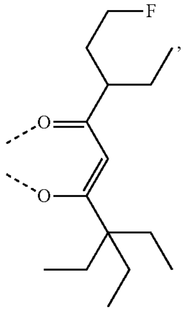
$L_{b168}$
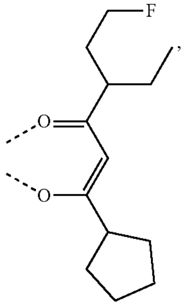
$L_{b169}$
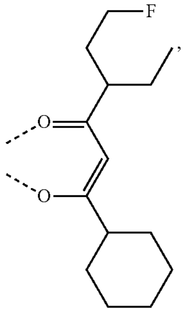
$L_{b170}$
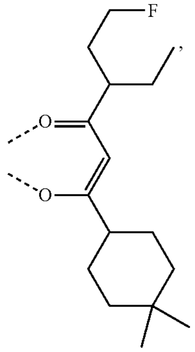

-continued
$L_{b171}$
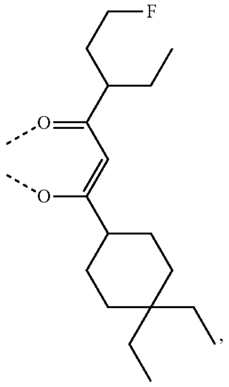
$L_{b172}$
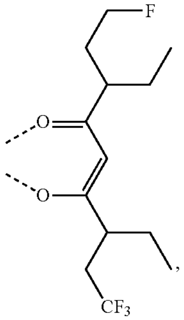
$L_{b173}$
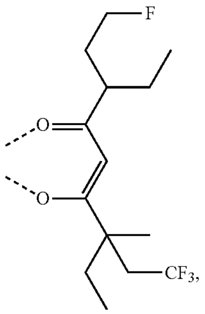
$L_{b174}$
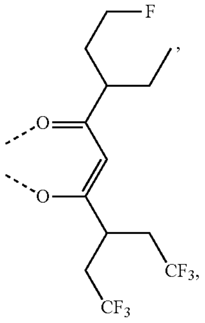
-continued
$L_{b175}$
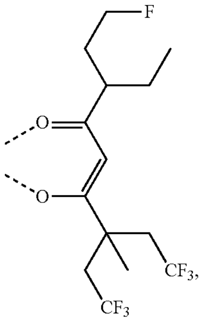
$L_{b176}$
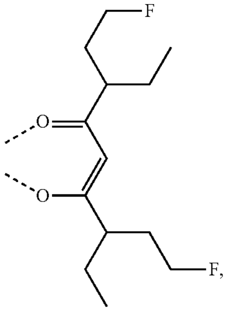
$L_{b177}$
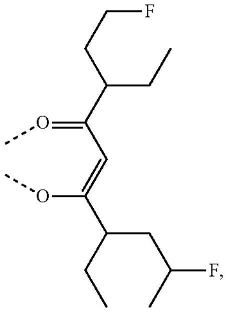
$L_{b178}$
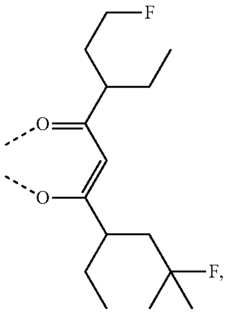
$L_{b179}$
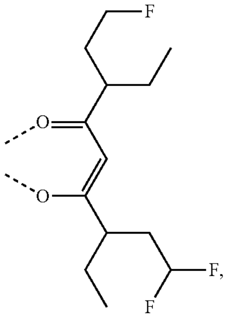

-continued
$L_{b180}$
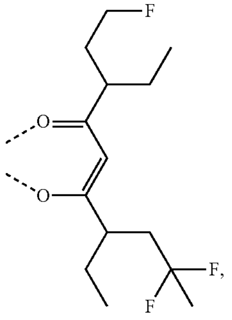
$L_{b181}$
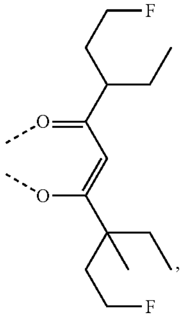
$L_{b182}$
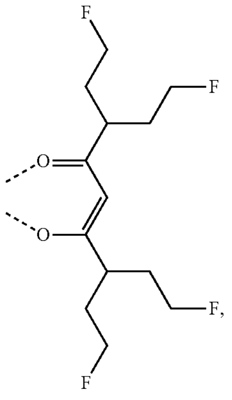
$L_{b183}$
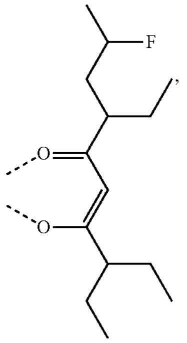
-continued
$L_{b184}$
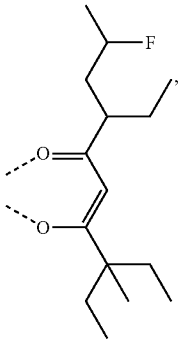
$L_{b185}$
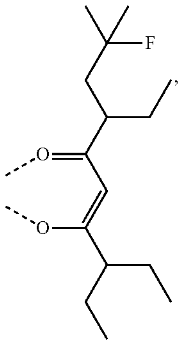
$L_{b186}$
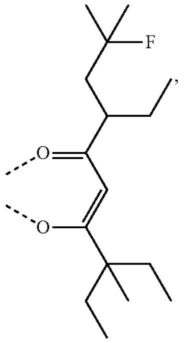
$L_{b187}$
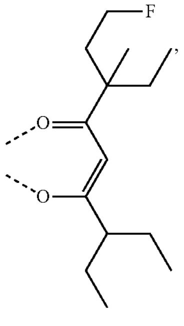
$L_{b188}$
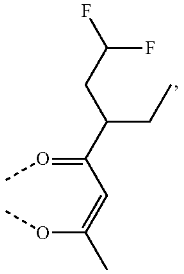

-continued
$L_{b189}$
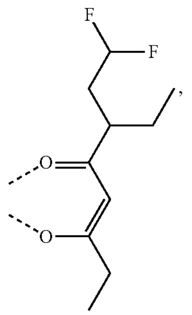
$L_{b190}$
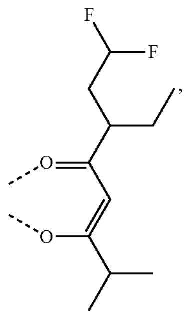
$L_{b191}$
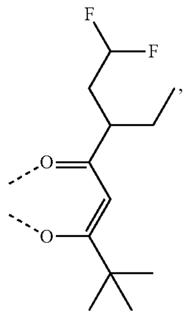
$L_{b192}$
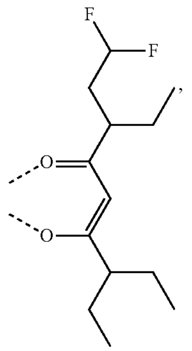
-continued
$L_{b193}$
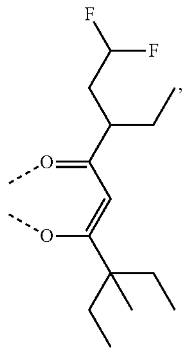
$L_{b194}$
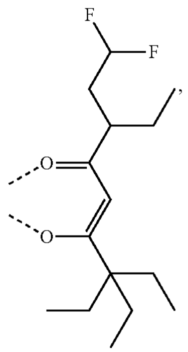
$L_{b195}$
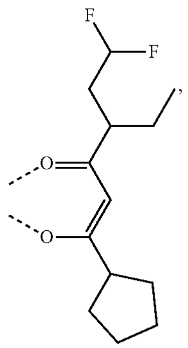
$L_{b196}$
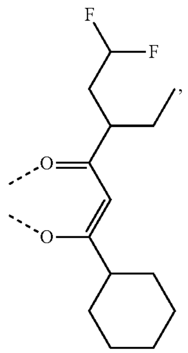

$L_{b197}$
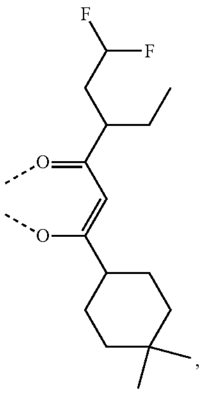
$L_{b198}$
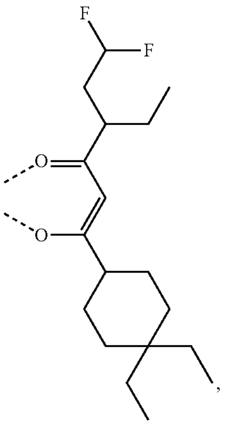
$L_{b199}$
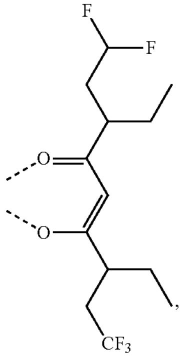
$L_{b200}$
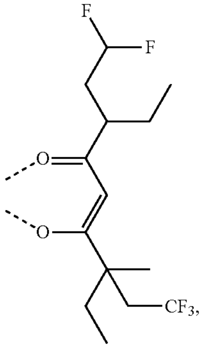
-continued
$L_{b201}$
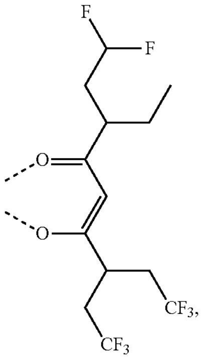
$L_{b202}$
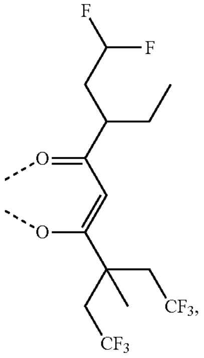
$L_{b203}$
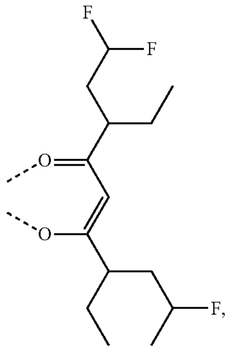
$L_{b204}$
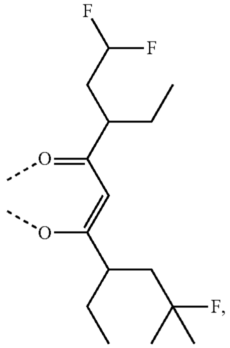

-continued
$L_{b205}$
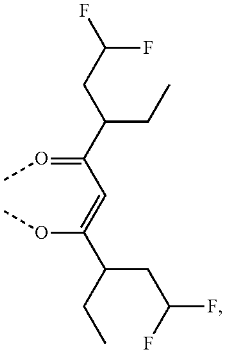
$L_{b206}$
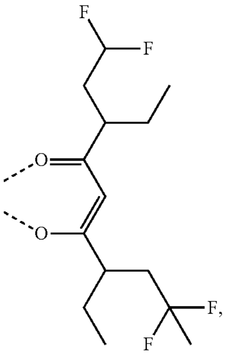
$L_{b207}$
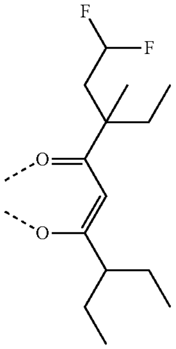
$L_{b208}$
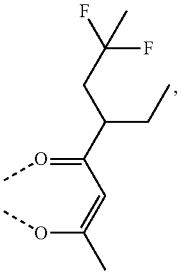
-continued
$L_{b209}$
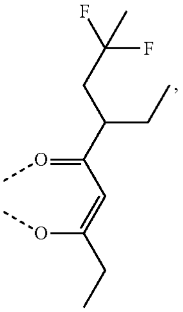
$L_{b210}$
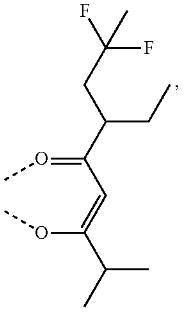
$L_{b211}$
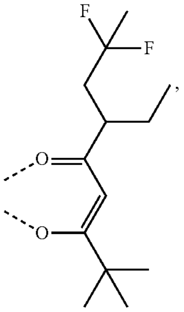
$L_{b212}$
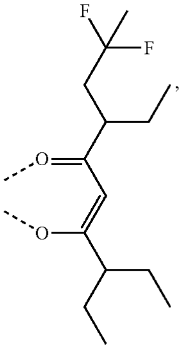

-continued
$L_{b213}$
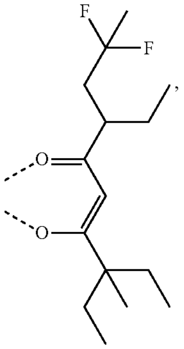
$L_{b214}$
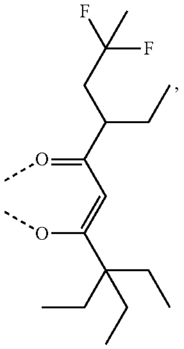
$L_{b215}$
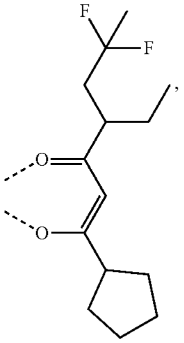
$L_{b216}$
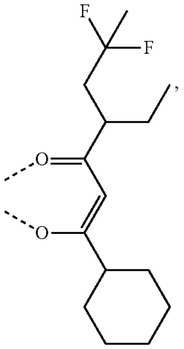
-continued
$L_{b217}$
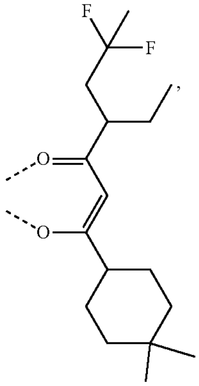
$L_{b218}$
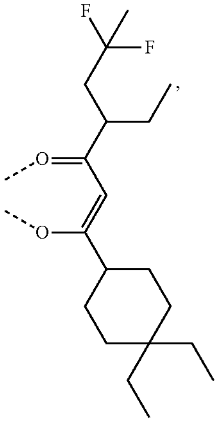
$L_{b219}$
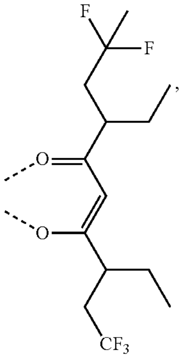
$L_{b220}$
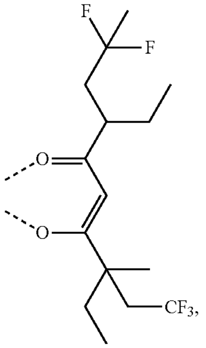

-continued
$L_{b221}$
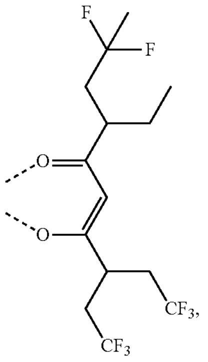
$L_{b222}$
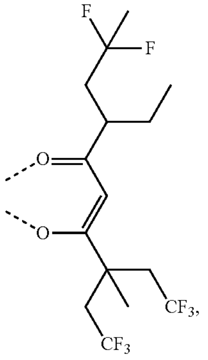
$L_{b223}$
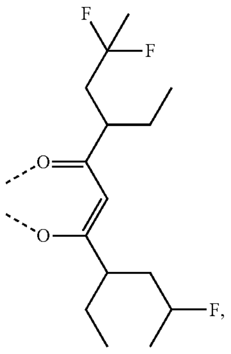
$L_{b224}$
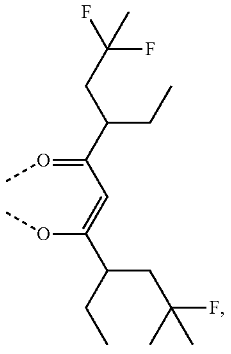
-continued
$L_{b225}$
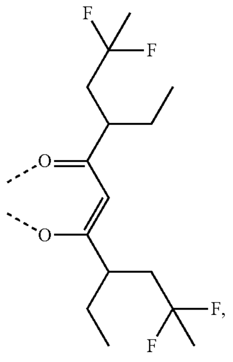
$L_{b226}$
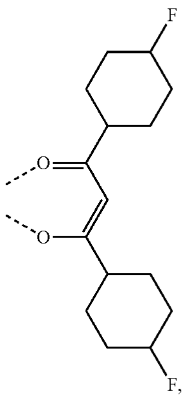
$L_{b227}$
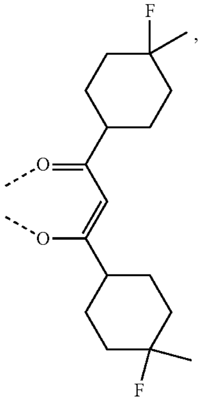
$L_{b228}$
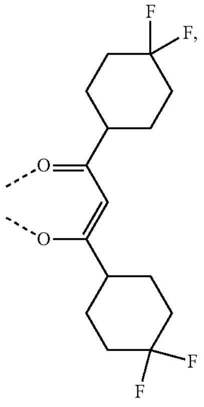

-continued
$L_{b229}$
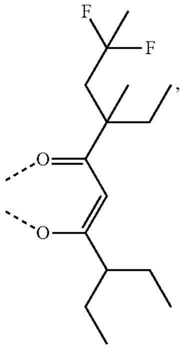
$L_{b230}$
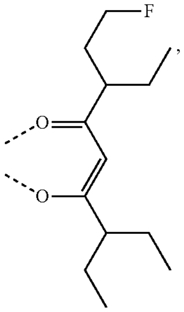
$L_{b231}$
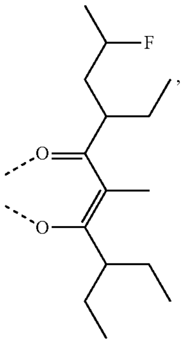
$L_{b232}$
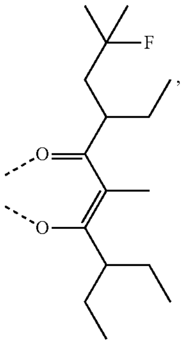
-continued
$L_{b233}$
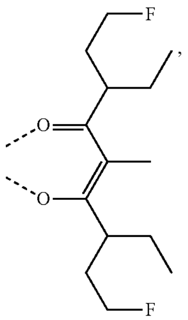
$L_{b234}$
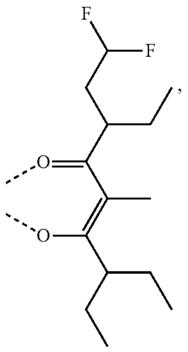
$L_{b235}$
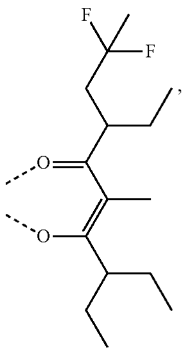
$L_{b236}$
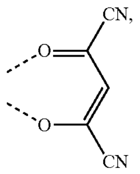
$L_{b237}$
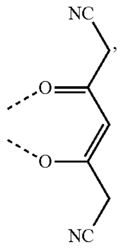

-continued
$L_{b238}$
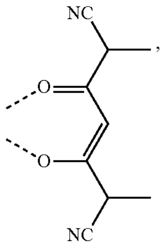
$L_{b239}$
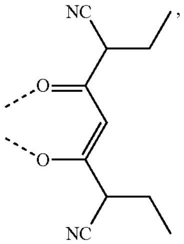
$L_{b240}$
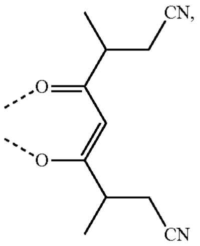
$L_{b241}$
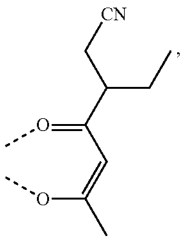
$L_{b242}$
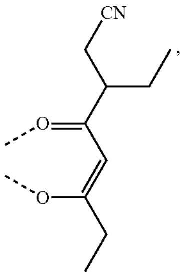
$L_{b243}$
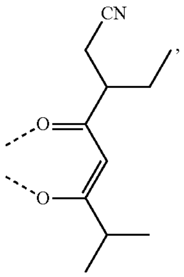
-continued
$L_{b244}$
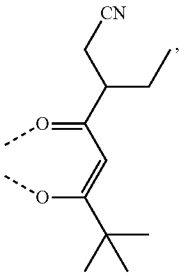
$L_{b245}$
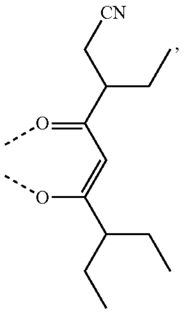
$L_{b246}$
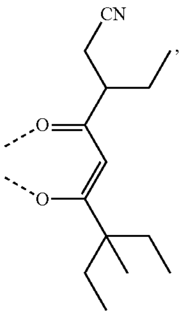
$L_{b247}$
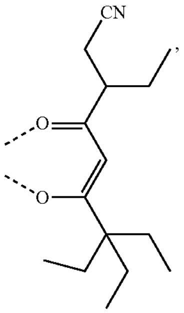
$L_{b248}$
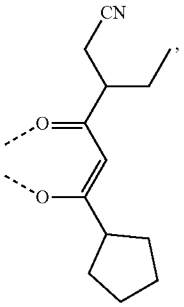

-continued
L$_{b249}$
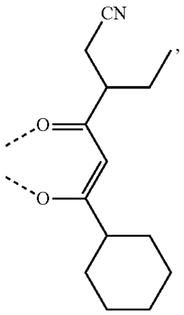
L$_{b250}$
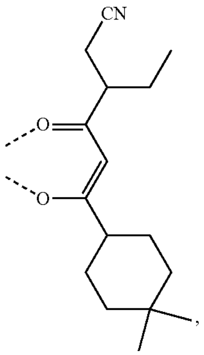
L$_{b251}$
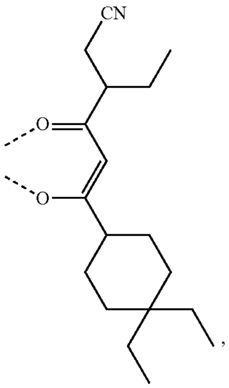
L$_{b252}$
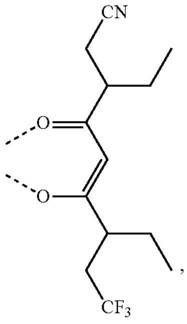
-continued
L$_{b253}$
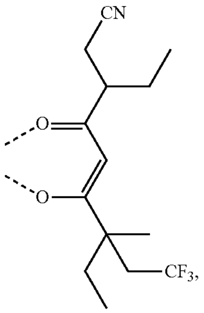
L$_{b254}$
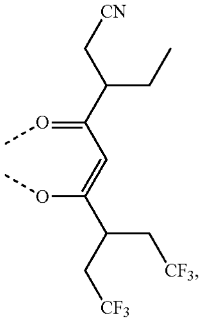
L$_{b255}$
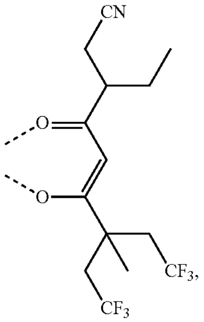
L$_{b256}$
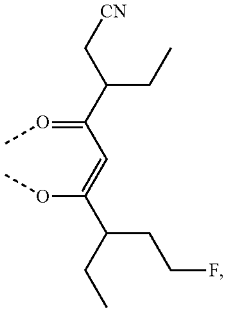
L$_{b257}$
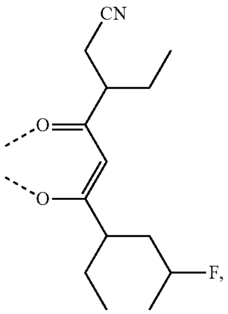

-continued
$L_{b258}$
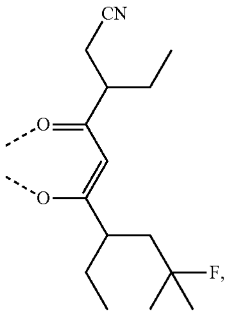
$L_{b259}$
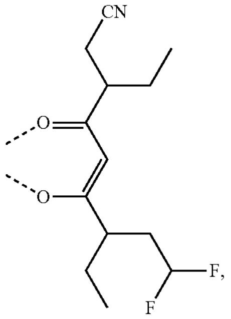
$L_{b260}$
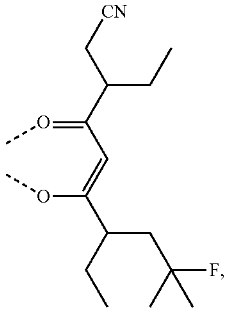
$L_{b261}$
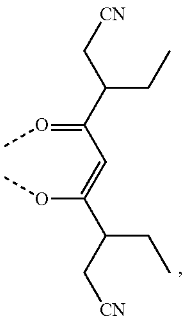
$L_{b262}$
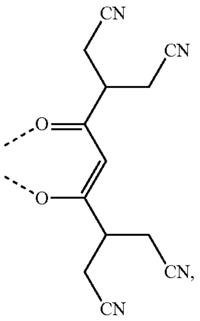
-continued
$L_{b263}$
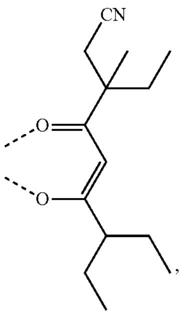
$L_{b264}$
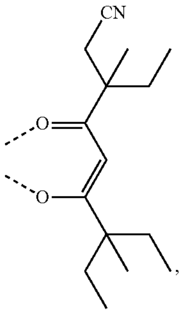
$L_{b265}$
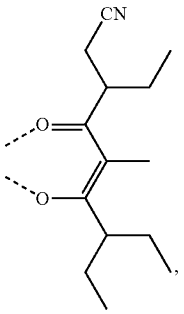
$L_{b266}$
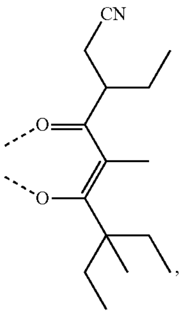
$L_{b267}$
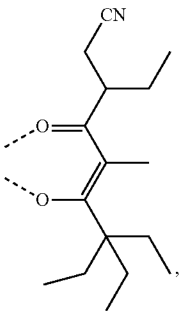

-continued
$L_{b268}$
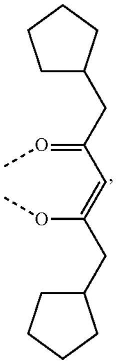
,
$L_{b269}$
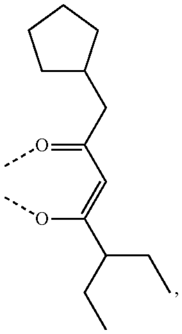
,
$L_{b270}$
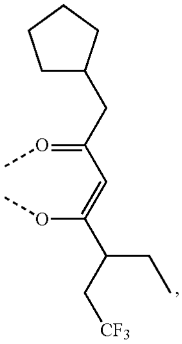
,
$L_{b271}$
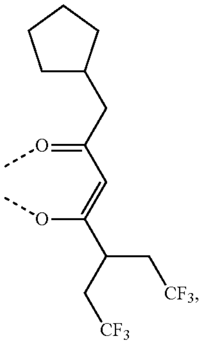
,
-continued
$L_{b272}$
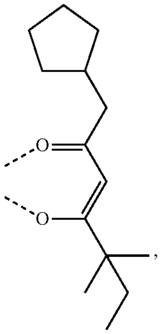
,
$L_{b273}$
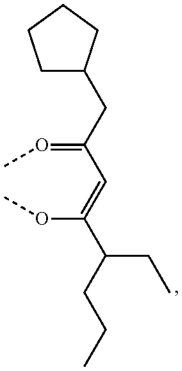
,
$L_{b274}$
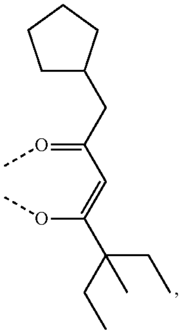
,
$L_{b275}$
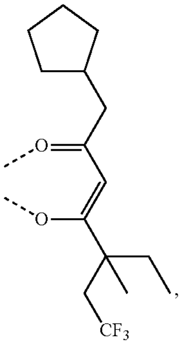
, -continued
$L_{b276}$
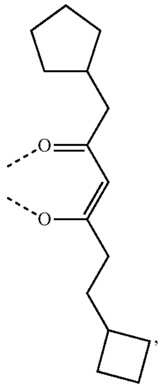
,
$L_{b277}$
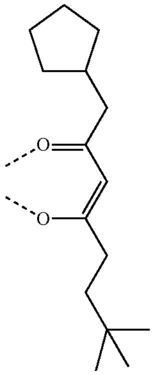
,
$L_{b278}$
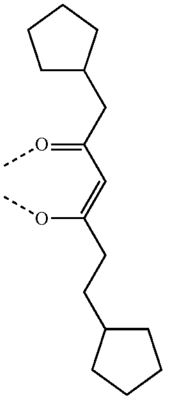
,
$L_{b279}$
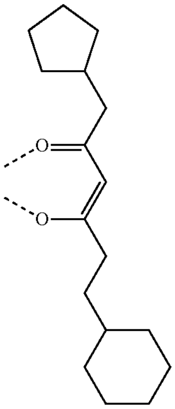
,
-continued
$L_{b280}$
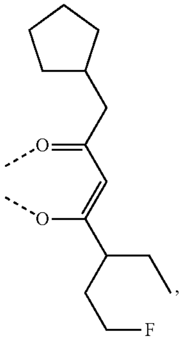
,
$L_{b281}$
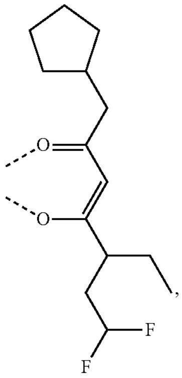
,
$L_{b282}$
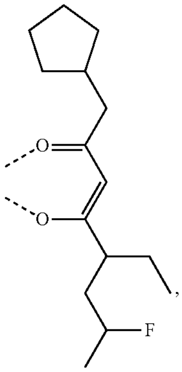
,
$L_{b283}$
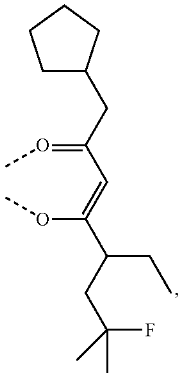
, -continued
$L_{b284}$
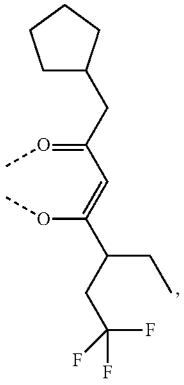
$L_{b285}$
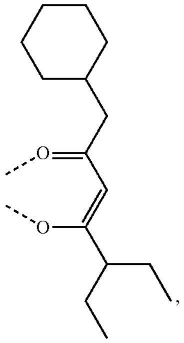
$L_{b286}$
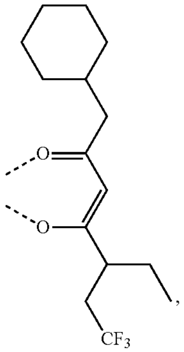
$L_{b287}$
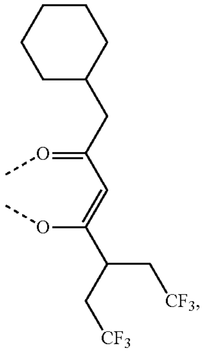
-continued
$L_{b288}$
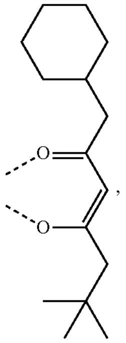
$L_{b289}$
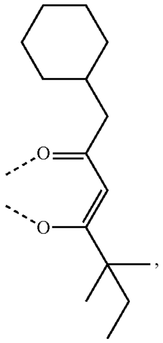
$L_{b290}$
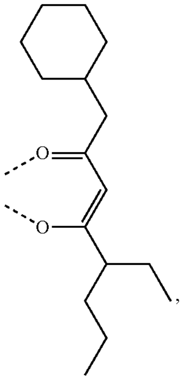
$L_{b291}$
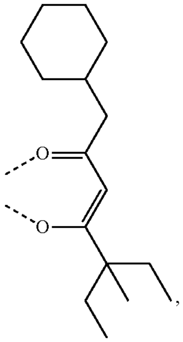

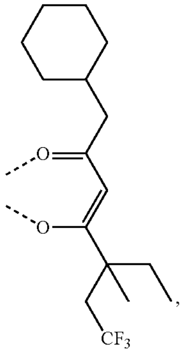
$L_{b292}$
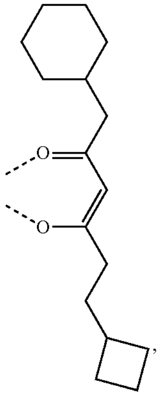
$L_{b293}$
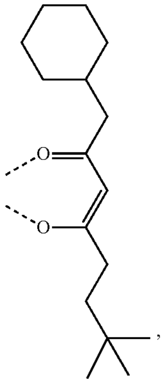
$L_{b294}$
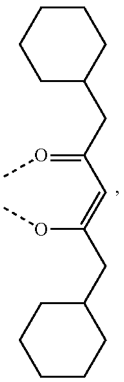
$L_{b295}$
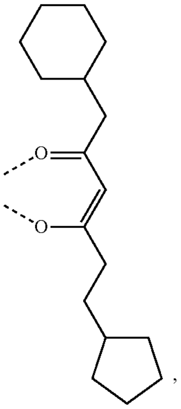
$L_{b296}$
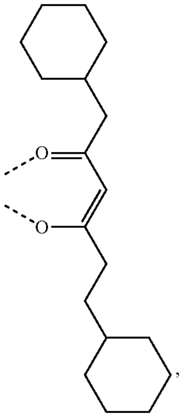
$L_{b297}$
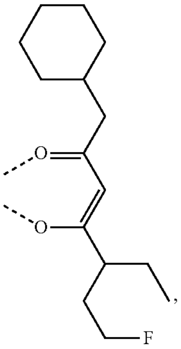
$L_{b298}$
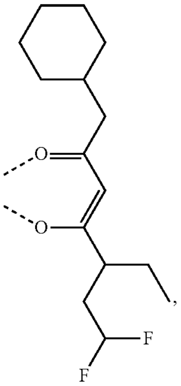
$L_{b299}$ -continued
$L_{b300}$
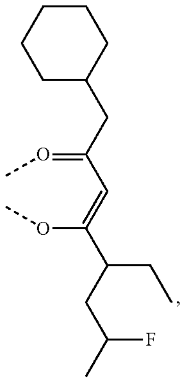,
$L_{b301}$
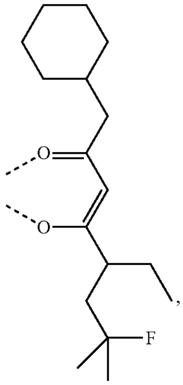,
$L_{b302}$
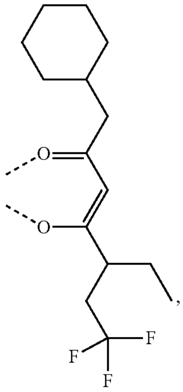,
$L_{b303}$
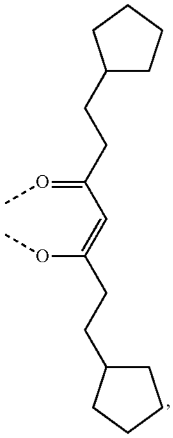,
-continued
$L_{b304}$
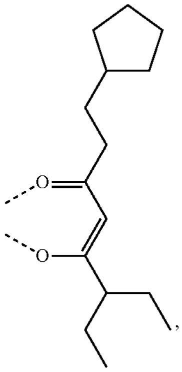,
$L_{b305}$
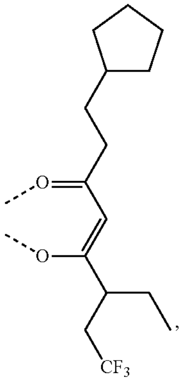,
$L_{b306}$
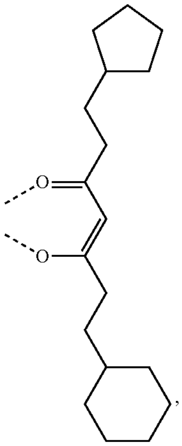,
$L_{b307}$
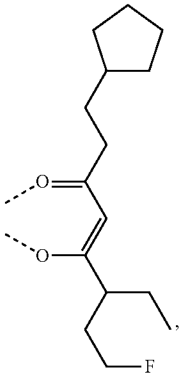, -continued
$L_{b308}$
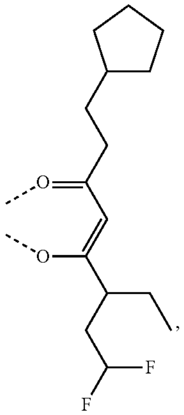
$L_{b309}$
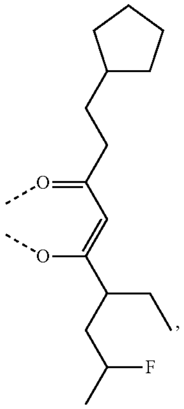
$L_{b310}$
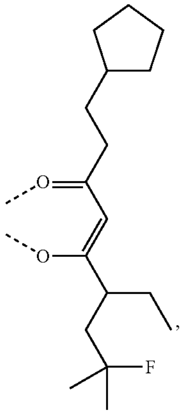
-continued
$L_{b311}$
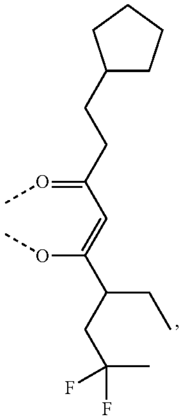
$L_{b312}$
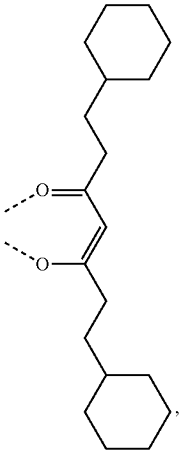
$L_{b313}$
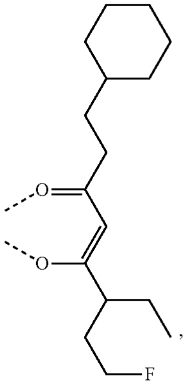

-continued
$L_{b314}$
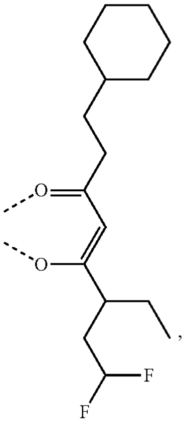
$L_{b315}$
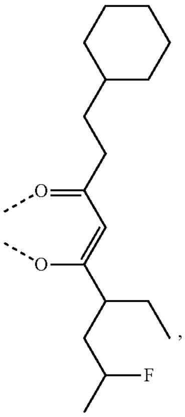
$L_{b316}$
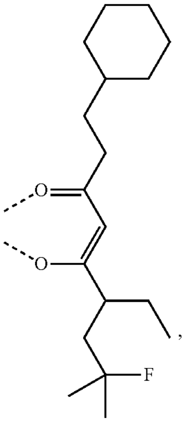
-continued
$L_{b317}$
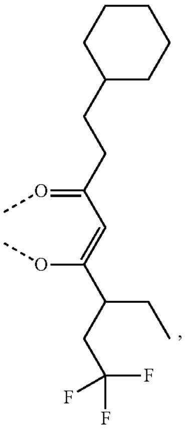
$L_{b318}$
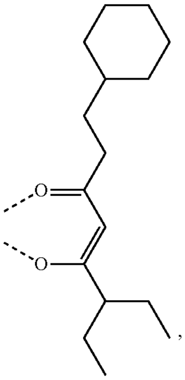
$L_{b319}$
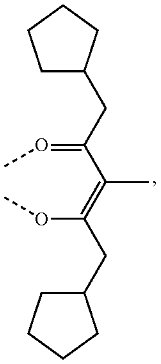
$L_{b320}$
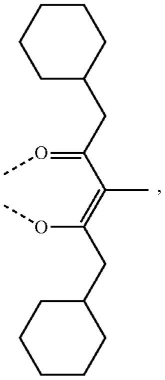

-continued
$L_{b321}$
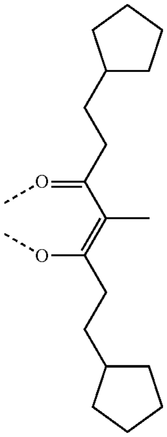
,
$L_{b322}$
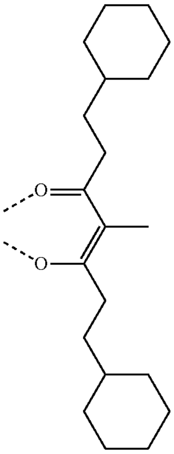
;
wherein $L_c$ is, at each occurrence identically or differently, selected from the group consisting of the following structures:
$L_{c1}$
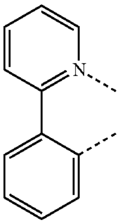
,
$L_{c2}$
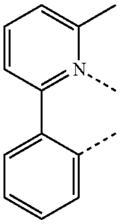
,
-continued
$L_{c3}$
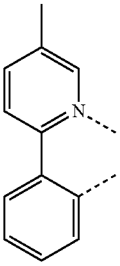
,
$L_{c4}$
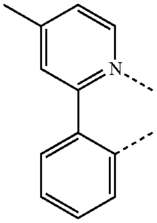
,
$L_{c5}$
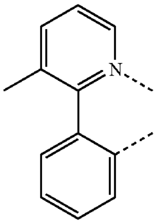
,
$L_{c6}$
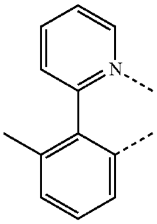
,
$L_{c7}$
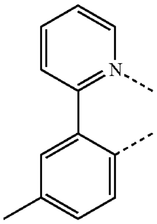
,
$L_{c8}$
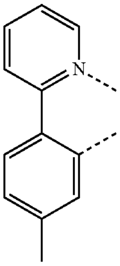
, -continued
$L_{c9}$
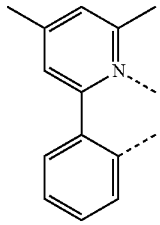
,
$L_{c10}$
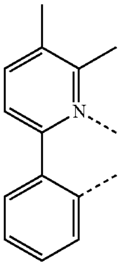
,
$L_{c11}$
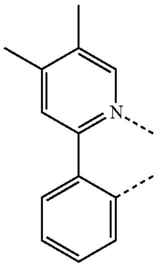
,
$L_{c12}$
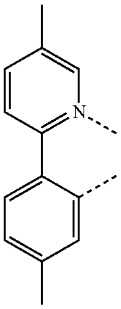
,
$L_{c13}$
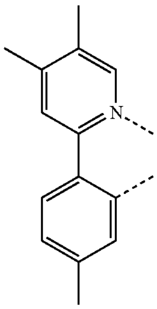
,
-continued
$L_{c14}$
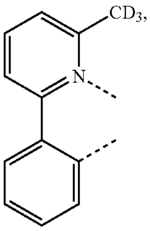
$L_{c15}$
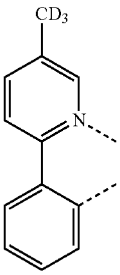
,
$L_{c16}$
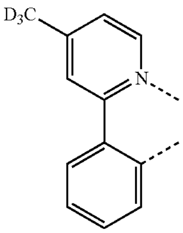
,
$L_{c17}$
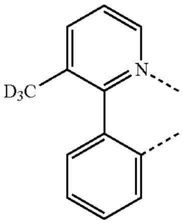
,
$L_{c18}$
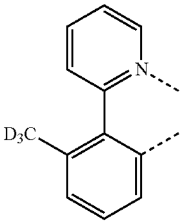
,
$L_{c19}$
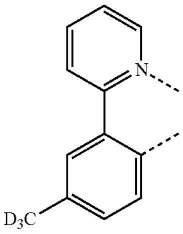
, -continued
$L_{c20}$
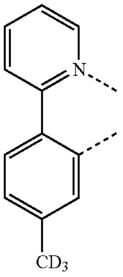
,
$L_{c21}$
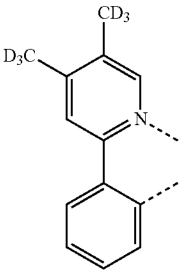
,
$L_{c22}$
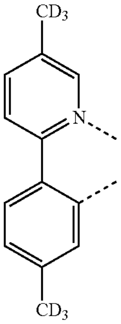
,
$L_{c23}$
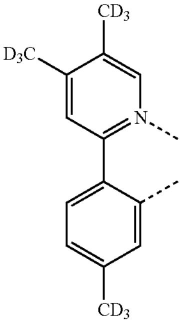
,
$L_{c24}$
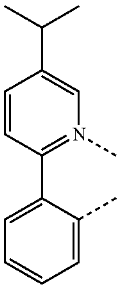
,
-continued
$L_{c25}$
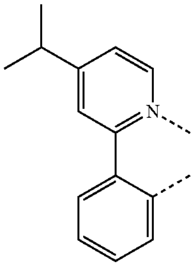
,
$L_{c26}$
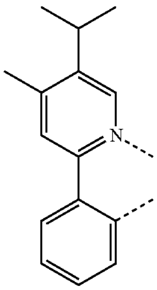
,
$L_{c27}$
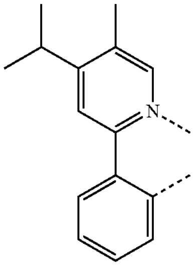
,
$L_{c28}$
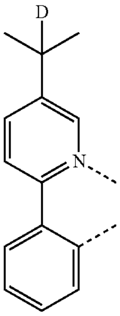
,
$L_{c29}$
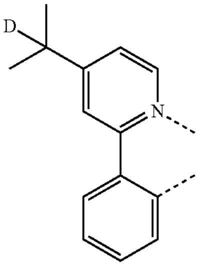
, -continued
$L_{c30}$
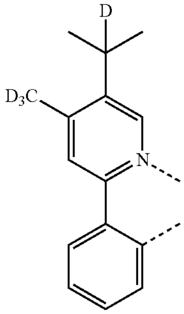
,
$L_{c31}$
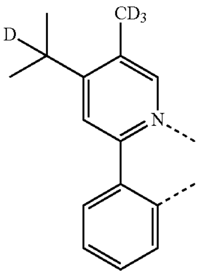
,
$L_{c32}$
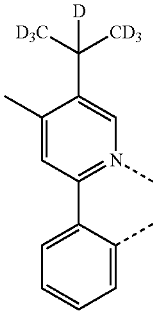
,
$L_{c33}$
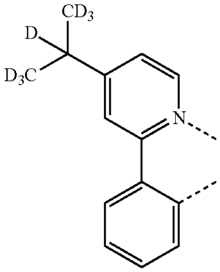
,
$L_{c34}$
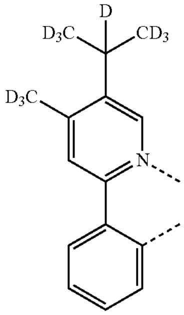
,
-continued
$L_{c35}$
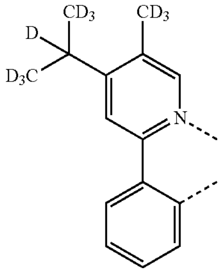
,
$L_{c36}$
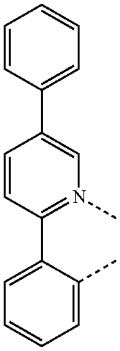
,
$L_{c37}$
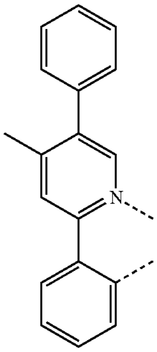
,
$L_{c38}$
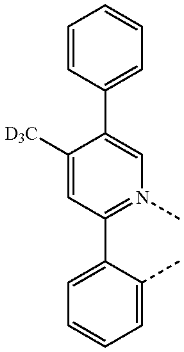
, -continued
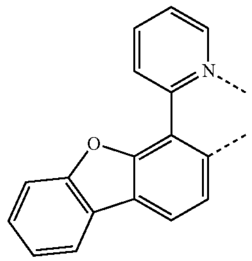
$L_{c39}$
,
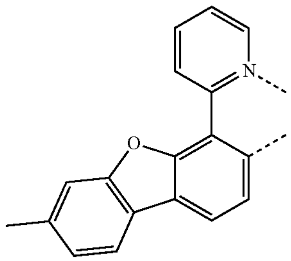
$L_{c40}$
,
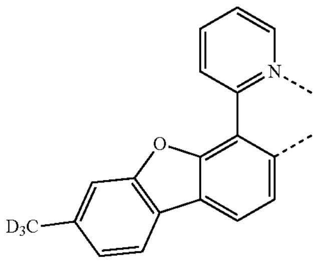
$L_{c41}$
,
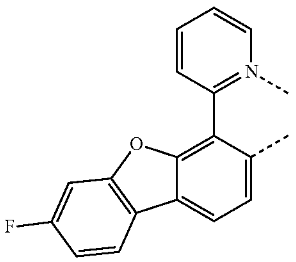
$L_{c42}$
,
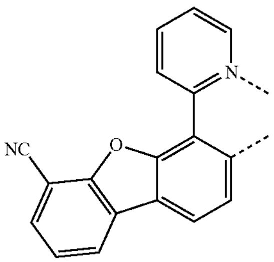
$L_{c43}$
,
-continued
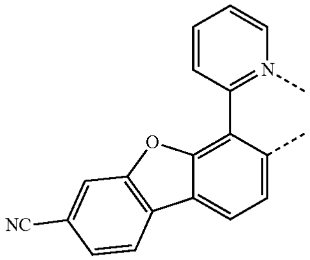
$L_{c44}$
,
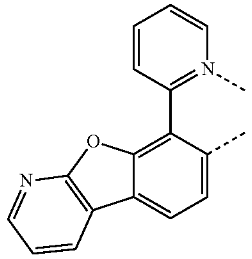
$L_{c45}$
,
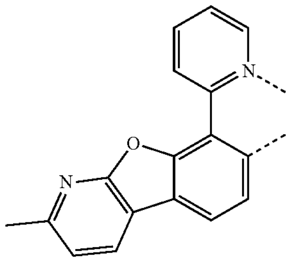
$L_{c46}$
,
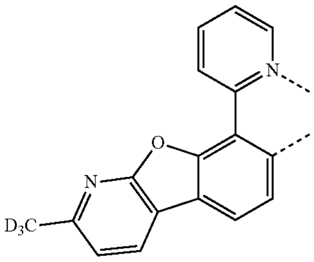
$L_{c47}$
,
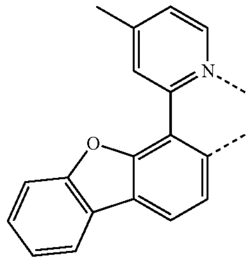
$L_{c48}$
, -continued
L$_{c49}$
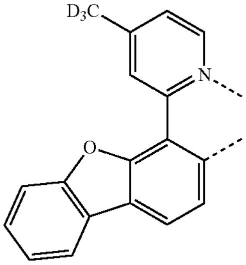
,
L$_{c50}$
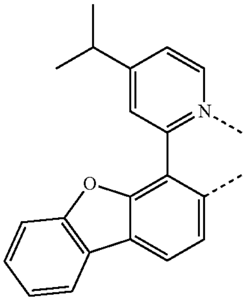
,
L$_{c51}$
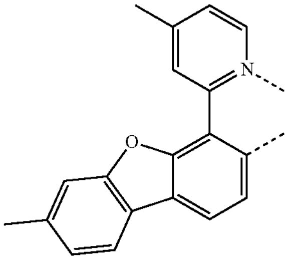
,
L$_{c52}$
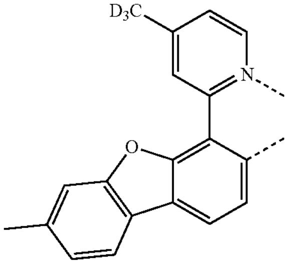
,
L$_{c53}$
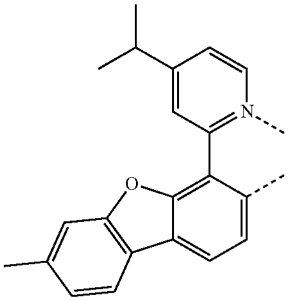
,
-continued
L$_{c54}$
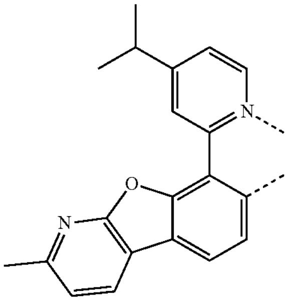
,
L$_{c55}$
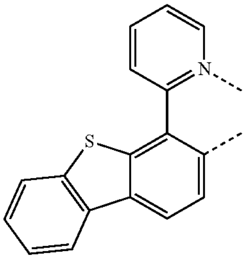
,
L$_{c56}$
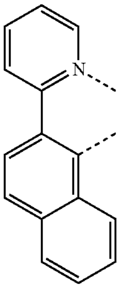
,
L$_{c57}$
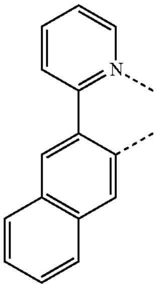
,
L$_{c58}$
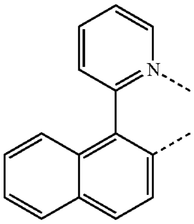
, -continued
$L_{c59}$
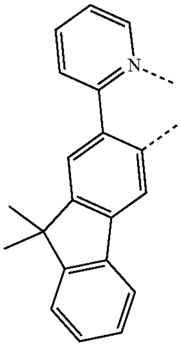
,
$L_{c60}$
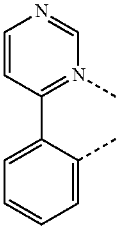
,
$L_{c61}$
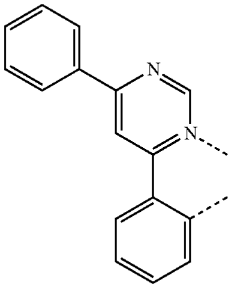
,
$L_{c62}$
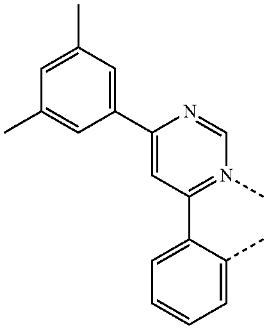
,
$L_{c63}$
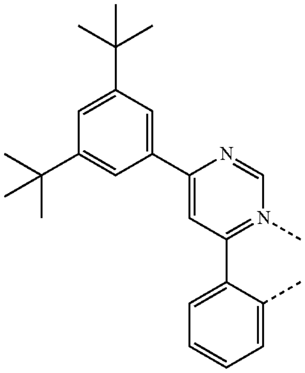
,
-continued
$L_{c64}$
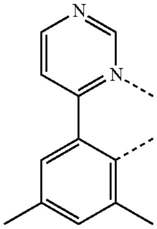
,
$L_{c65}$
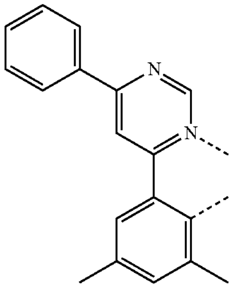
,
$L_{c66}$
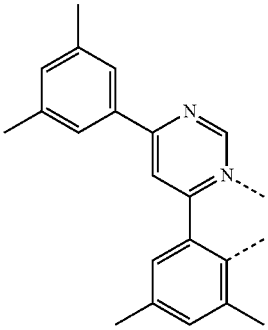
,
$L_{c67}$
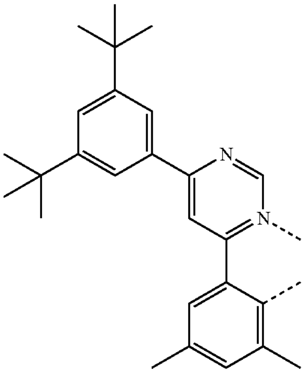
,
$L_{c68}$
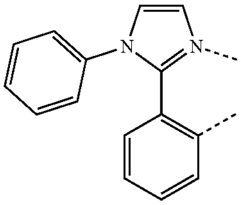
, -continued
$L_{c69}$
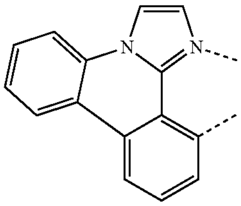
,
$L_{c70}$
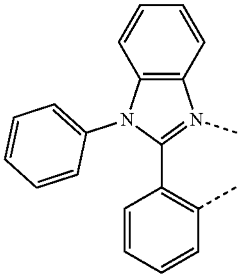
,
$L_{c71}$
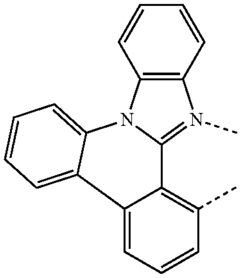
,
$L_{c72}$
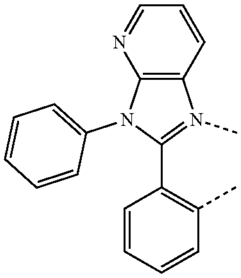
,
$L_{c73}$
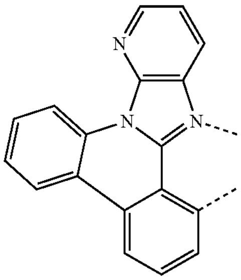
,
-continued
$L_{c74}$
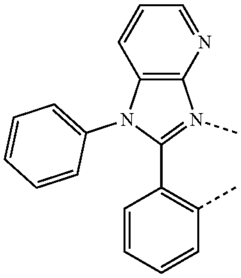
,
$L_{c75}$
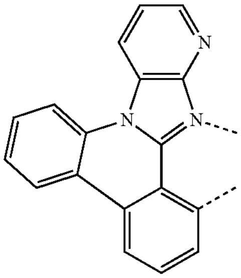
,
$L_{c76}$
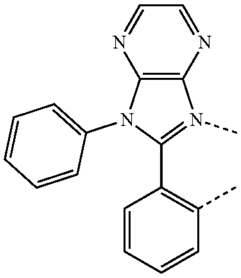
,
$L_{c77}$
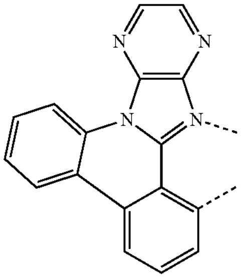
,
$L_{c78}$
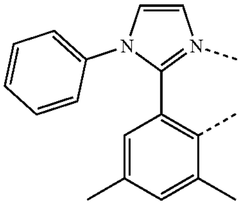
,
$L_{c79}$
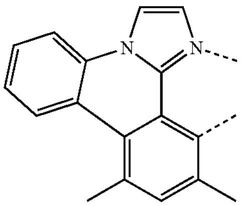
, -continued
$L_{c80}$
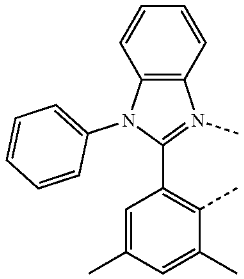
,
$L_{c81}$
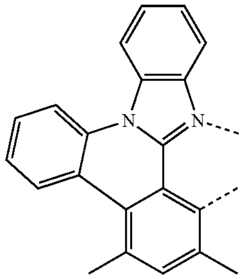
,
$L_{c82}$
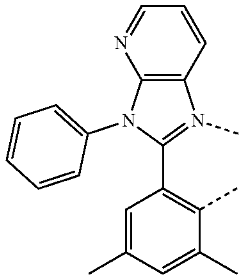
,
$L_{c83}$
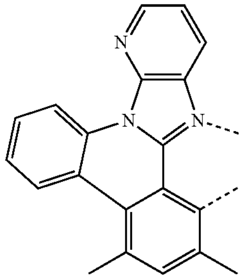
,
$L_{c84}$
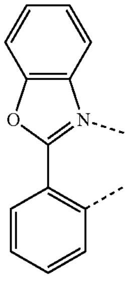
,
-continued
$L_{c85}$
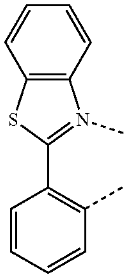
,
$L_{c86}$
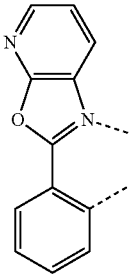
,
$L_{c87}$
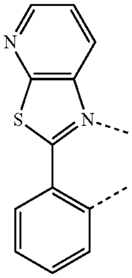
,
$L_{c88}$
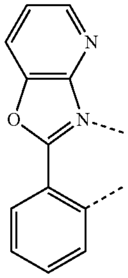
,
$L_{c89}$
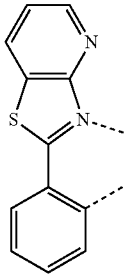
, L<sub>c90</sub>
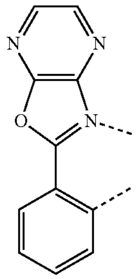
,
L<sub>c91</sub>
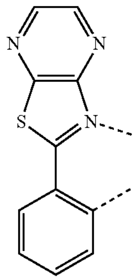
,
L<sub>c92</sub>
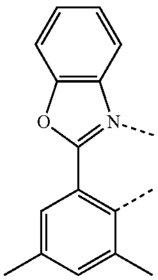
,
L<sub>c93</sub>
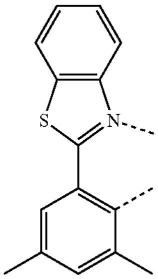
,
L<sub>c94</sub>
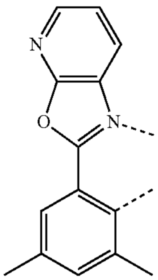
,
L<sub>c95</sub>
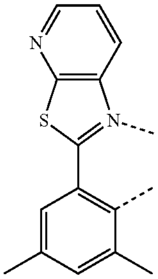
,
L<sub>c96</sub>
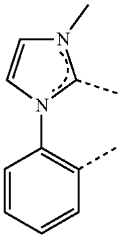
,
L<sub>c97</sub>
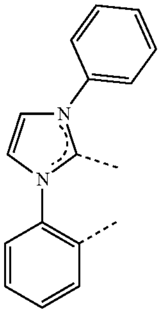
,
L<sub>c98</sub>
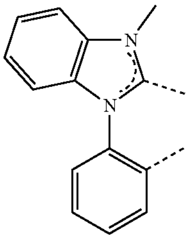
,
L<sub>c99</sub>
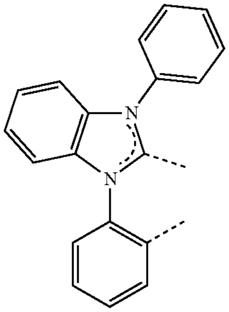
, -continued
$L_{c100}$
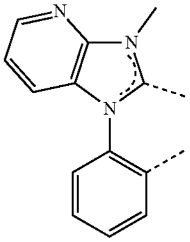
,
$L_{c101}$
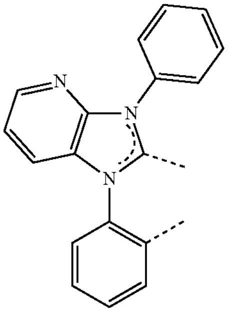
,
$L_{c102}$
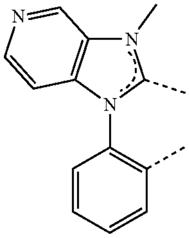
,
$L_{c103}$
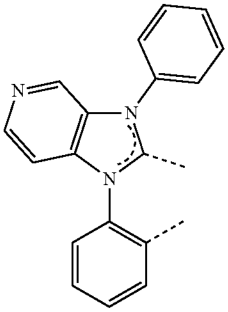
,
$L_{c104}$
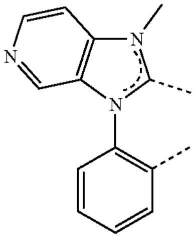
,
-continued
$L_{c105}$
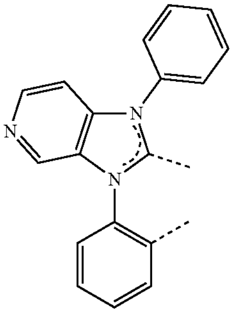
,
$L_{c106}$
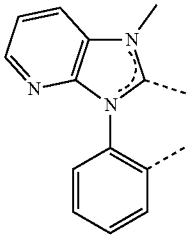
,
$L_{c107}$
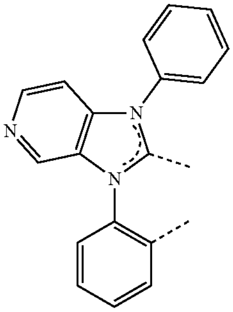
,
$L_{c108}$
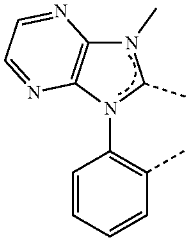
,
$L_{c109}$
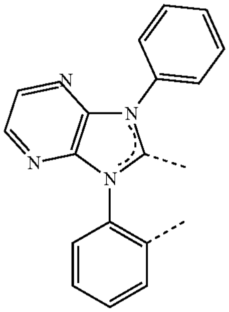
, -continued
$L_{c110}$
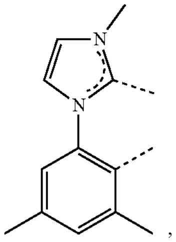
,
$L_{c111}$
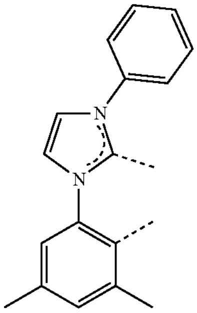
,
$L_{c112}$
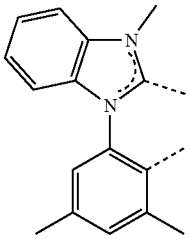
,
$L_{c113}$
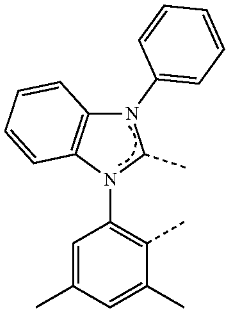
,
$L_{c114}$
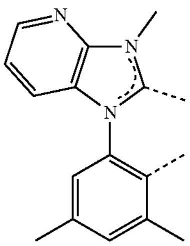
,
-continued
$L_{c115}$
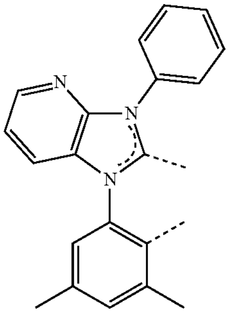
,
$L_{c116}$
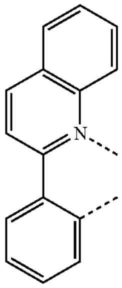
,
$L_{c117}$
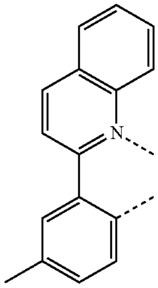
,
$L_{c118}$
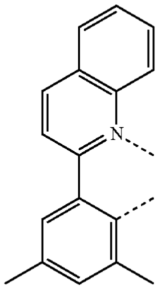
,
$L_{c119}$
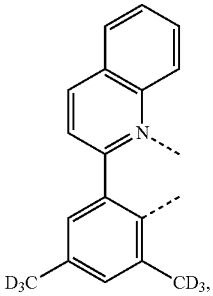
, -continued
$L_{c120}$
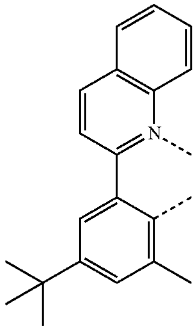
,
$L_{c121}$
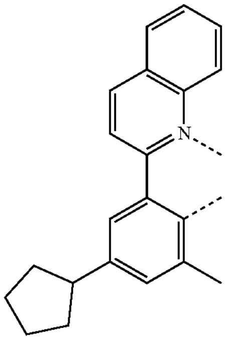
,
$L_{c122}$
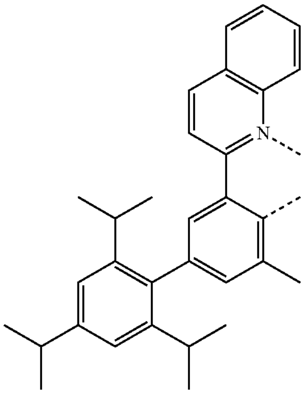
,
$L_{c123}$
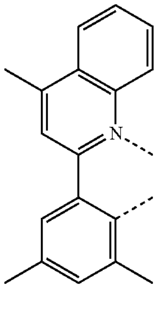
,
-continued
$L_{c124}$
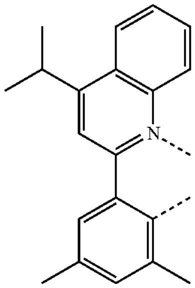
,
$L_{c125}$
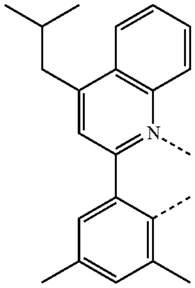
,
$L_{c126}$
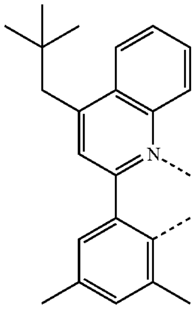
,
$L_{c127}$
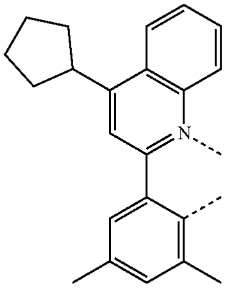
,
$L_{c128}$
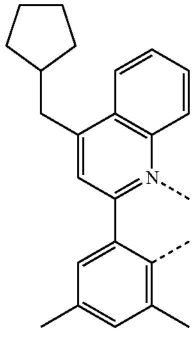
, -continued
Lc129
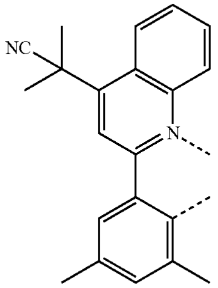
,
Lc130
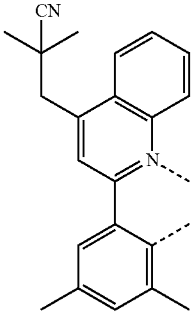
,
Lc131
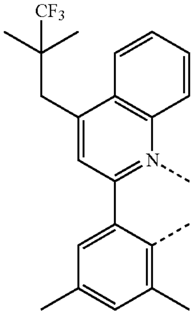
,
Lc132
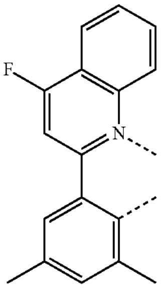
,
Lc133
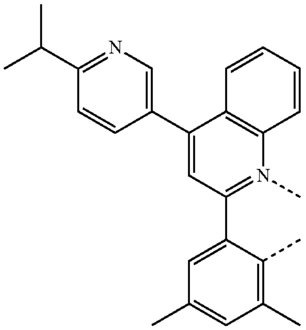
,
-continued
Lc134
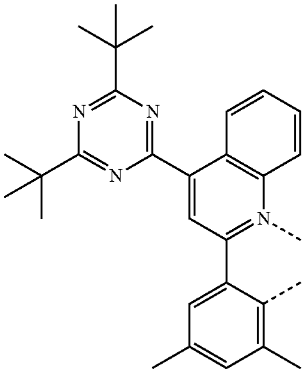
,
Lc135
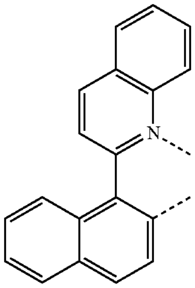
,
Lc136
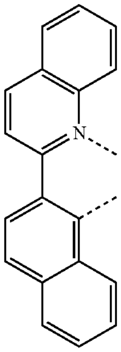
,
Lc137
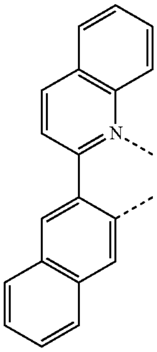
, -continued
$L_{c138}$
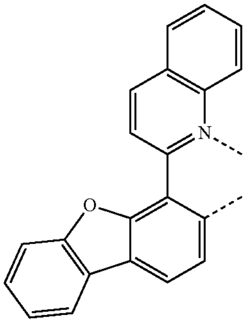
,
$L_{c139}$
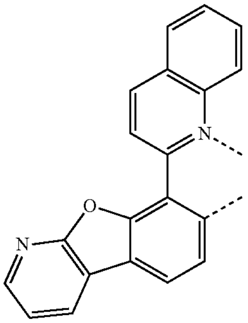
,
$L_{c140}$
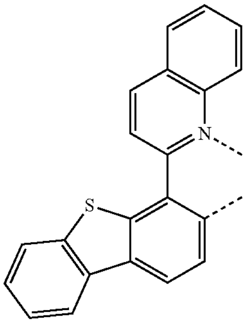
,
$L_{c141}$
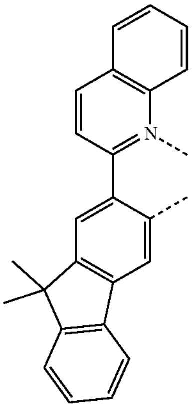
,
-continued
$L_{c142}$
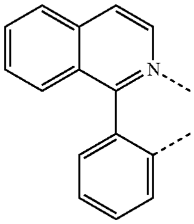
,
$L_{c143}$
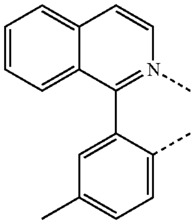
,
$L_{c144}$
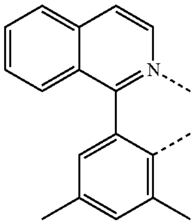
,
$L_{c145}$
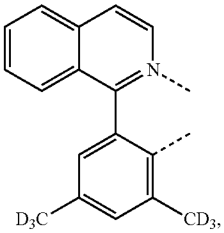
,
$L_{c146}$
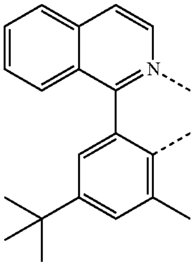
,
$L_{c147}$
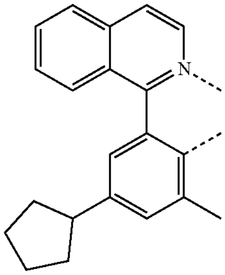
, -continued
$L_{c148}$
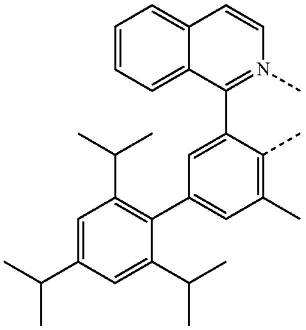
,
$L_{c149}$
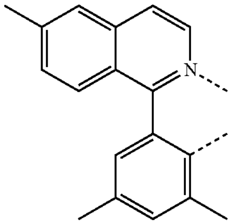
,
$L_{c150}$
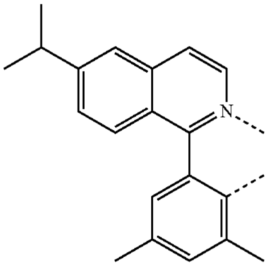
,
$L_{c151}$
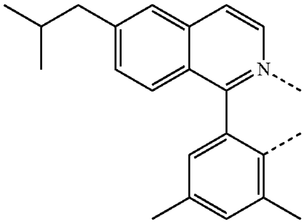
,
$L_{c152}$
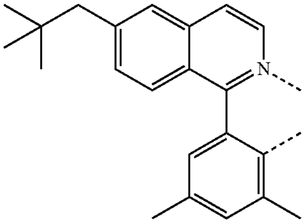
,
$L_{c153}$
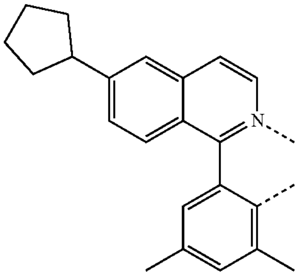
,
-continued
$L_{c154}$
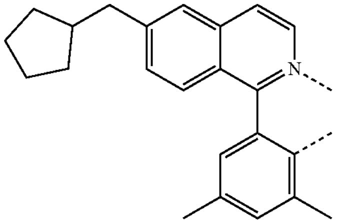
,
$L_{c155}$
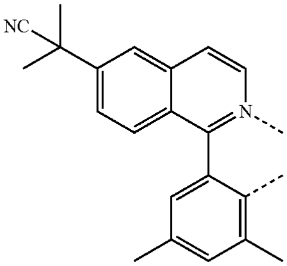
,
$L_{c156}$
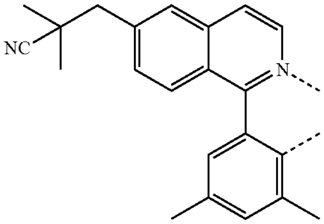
,
$L_{c157}$
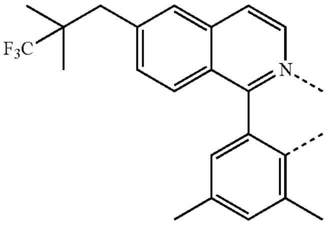
,
$L_{c158}$
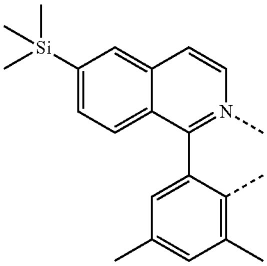
,
$L_{c159}$
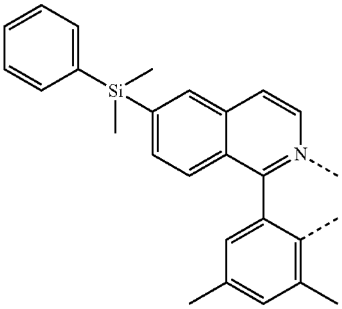
, -continued
$L_{c160}$
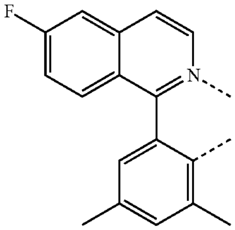
,
$L_{c161}$
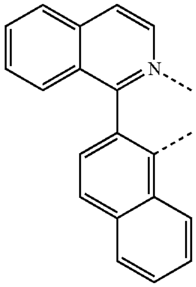
,
$L_{c162}$
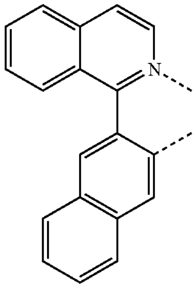
,
$L_{c163}$
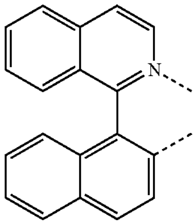
,
$L_{c164}$
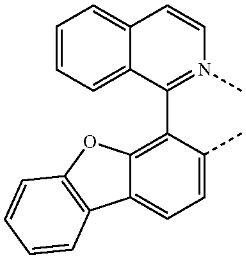
,
$L_{c165}$
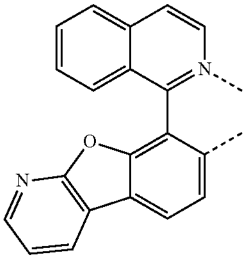
,
-continued
$L_{c166}$
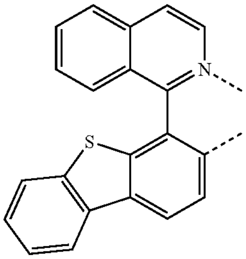
,
$L_{c167}$
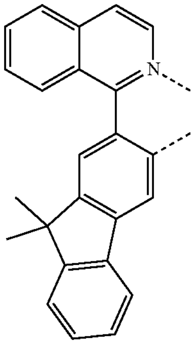
,
$L_{c168}$
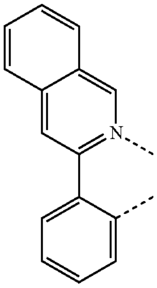
,
$L_{c169}$
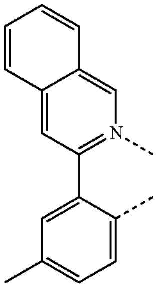
,
$L_{c170}$
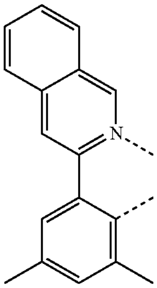
, -continued
$L_{c171}$
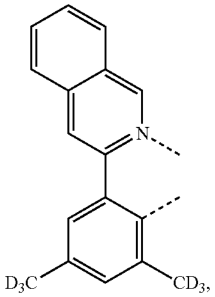
$L_{c172}$
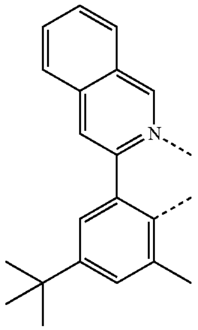
,
$L_{c173}$
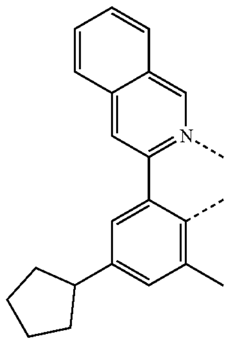
,
$L_{c174}$
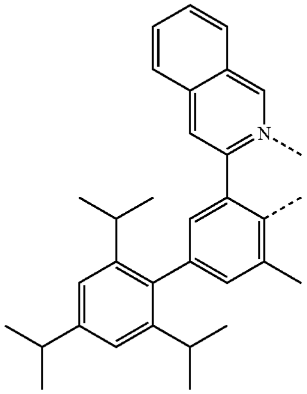
,
-continued
$L_{c175}$
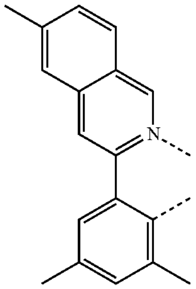
,
$L_{c176}$
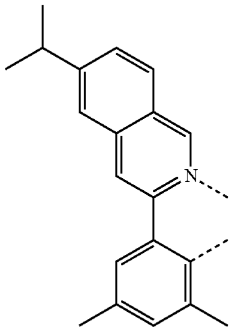
,
$L_{c177}$
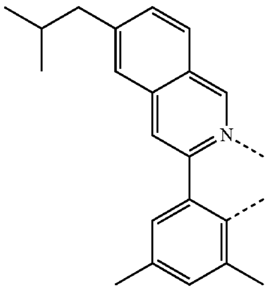
,
$L_{c178}$
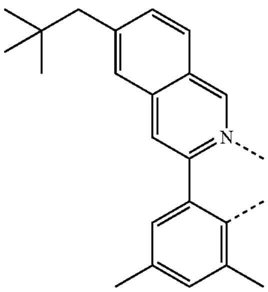
,
$L_{c179}$
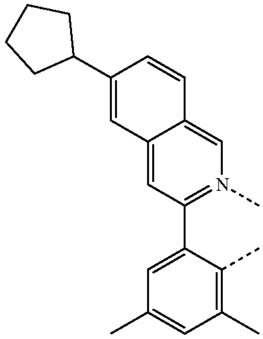
, -continued
$L_{c180}$
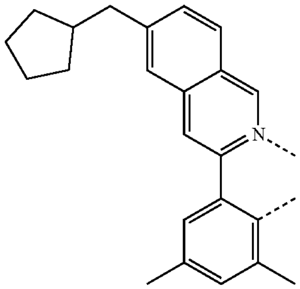
,
$L_{c181}$
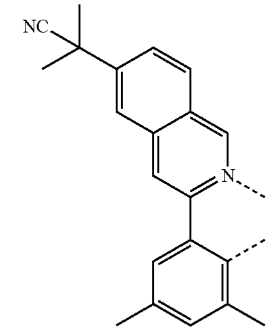
,
$L_{c182}$
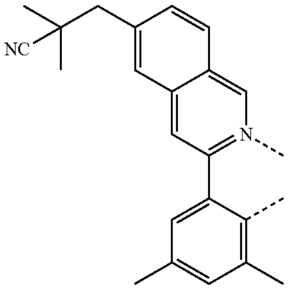
,
$L_{c183}$
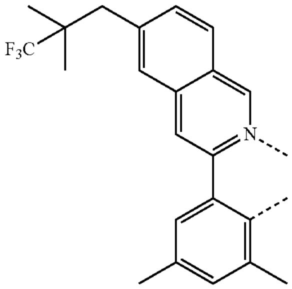
,
$L_{c184}$
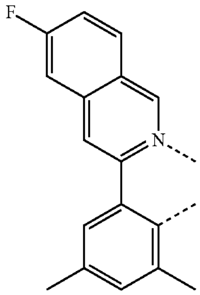
,
-continued
$L_{c185}$
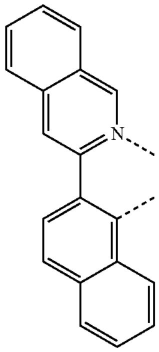
,
$L_{c186}$
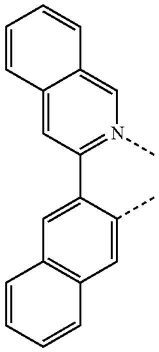
,
$L_{c187}$
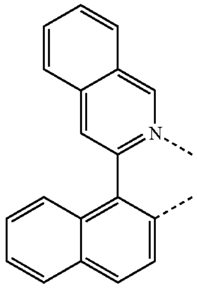
,
$L_{c188}$
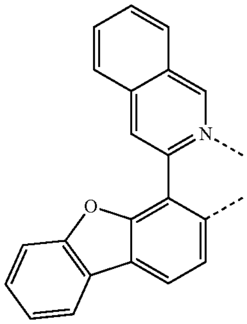
, -continued
$L_{c189}$
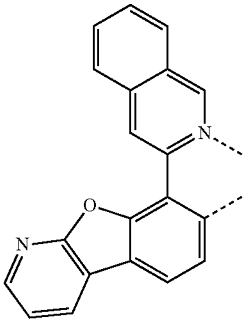
,
$L_{c190}$
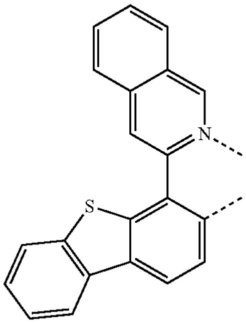
,
$L_{c191}$
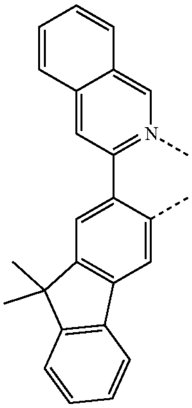
,
$L_{c192}$
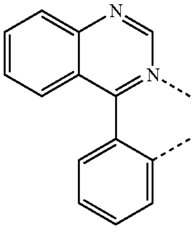
,
$L_{c193}$
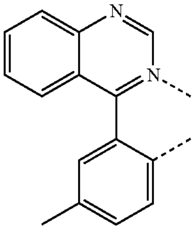
,
-continued
$L_{c194}$
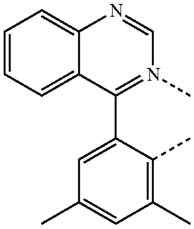
,
$L_{c195}$
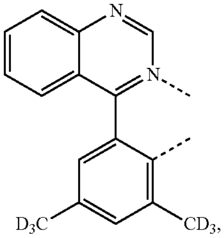
$L_{c196}$
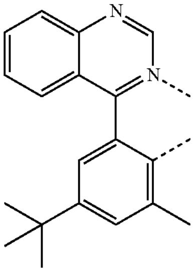
,
$L_{c197}$
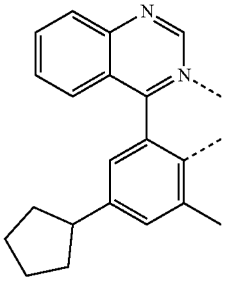
,
$L_{c198}$
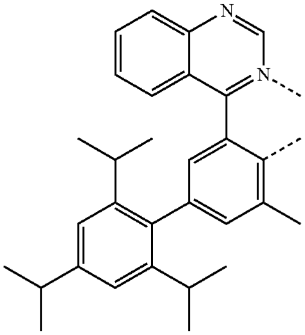
, -continued
$L_{c199}$
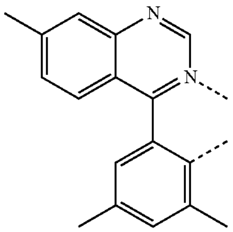
,
$L_{c200}$
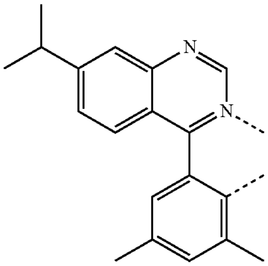
,
$L_{c201}$
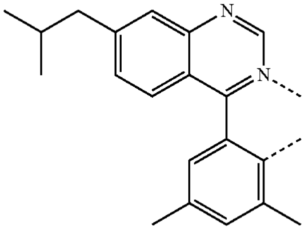
,
$L_{c202}$
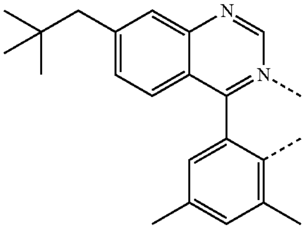
,
$L_{c203}$
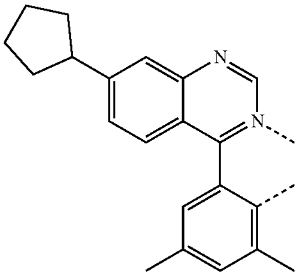
,
$L_{c204}$
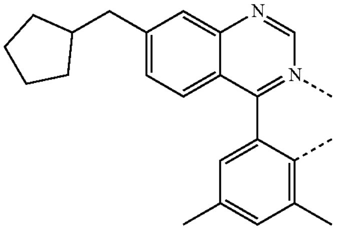
,
-continued
$L_{c205}$
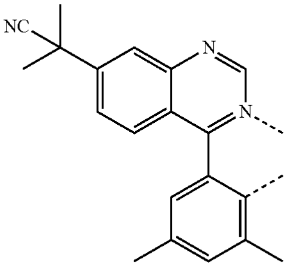
,
$L_{c206}$
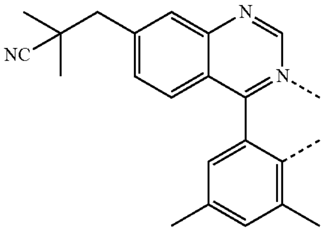
,
$L_{c207}$
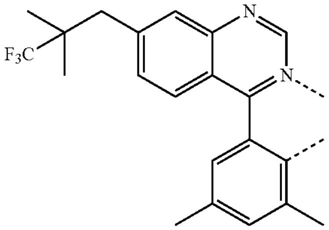
,
$L_{c208}$
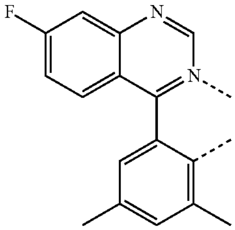
,
$L_{c209}$
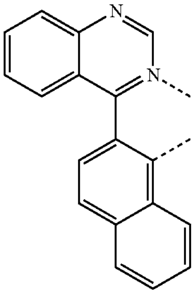
,
$L_{c210}$
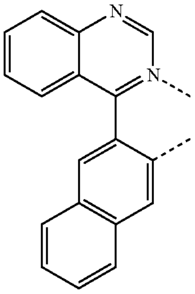
, -continued
$L_{c211}$
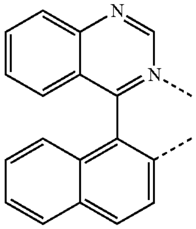
,
$L_{c212}$
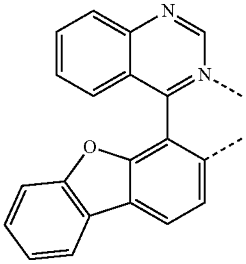
,
$L_{c213}$
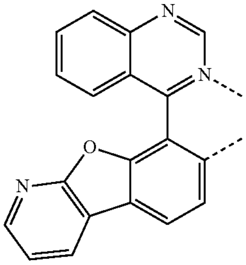
,
$L_{c214}$
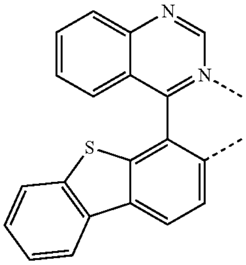
,
$L_{c215}$
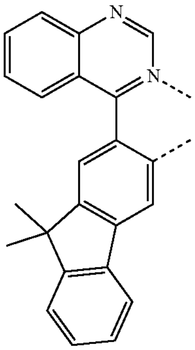
,
-continued
$L_{c216}$
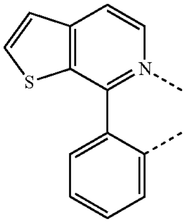
,
$L_{c217}$
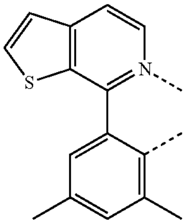
,
$L_{c218}$
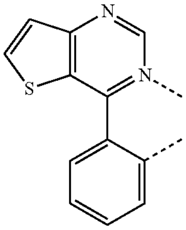
,
$L_{c219}$
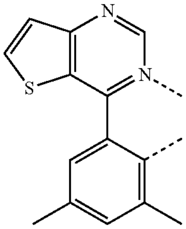
,
$L_{c220}$
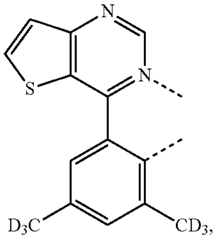
$L_{c221}$
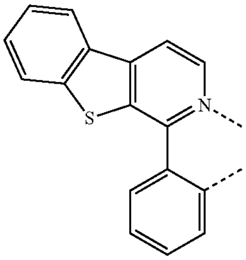
, -continued $L_{c222}$

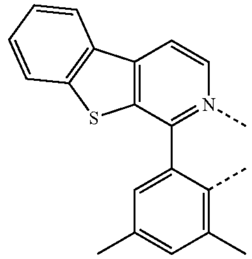

, $L_{c223}$

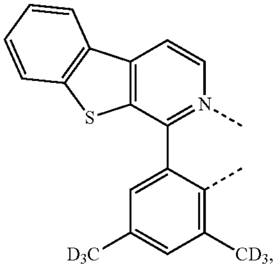

$L_{c224}$

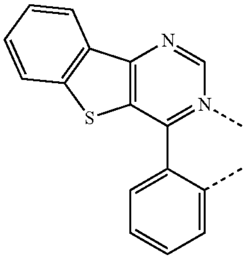

, $L_{c225}$

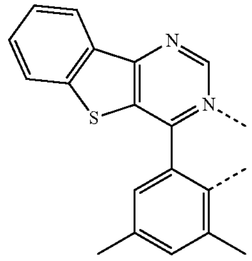

, $L_{c226}$

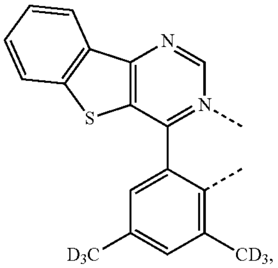

-continued $L_{c227}$

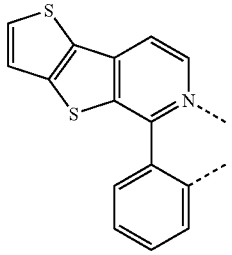

, $L_{c228}$

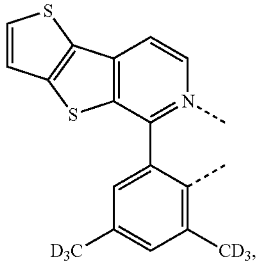

$L_{c229}$

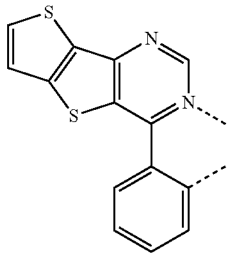

, $L_{c230}$

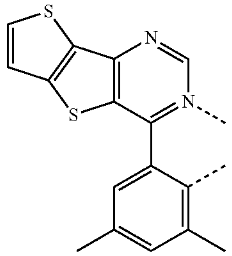

, $L_{c231}$

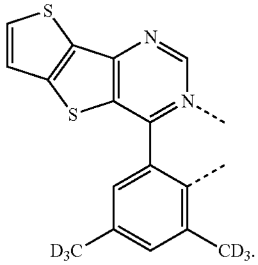

19. The metal complex of claim 18, wherein the metal complex has a structure of $Ir(L_a)_2(L_b)$ or $Ir(L_a)_2(L_c)$ or $Ir(L_a)(L_c)_2$;

wherein, when the metal complex has a structure of $Ir(L_a)_2(L_b)$, $L_a$ is, at each occurrence identically or differently, selected from any one or any two of the group consisting of $L_{a1}$ to $L_{a560}$, $L_{a641}$ to $L_{a940}$, $L_{a1001}$ to $L_{a1287}$, $L_{a1292}$ to $L_{a1664}$, $L_{a1671}$ to $L_{a1931}$ and $L_b$ is selected from any one of the group consisting of $L_{b1}$ to $L_{b322}$; when the metal complex has a structure of $Ir(L_a)_2(L_c)$, $L_a$ is, at each occurrence identically or differently, selected from any one or any two of the group consisting of $L_{a1}$ to $L_{a560}$, $L_{a641}$ to $L_{a940}$, $L_{a1001}$ to $L_{a1287}$, $L_{a1292}$ to $L_{a1664}$, $L_{a1671}$ to $L_{a1931}$ and $L_c$ is selected from any one of the group consisting of $L_{c1}$ to $L_{c231}$; and when the metal complex has a structure of $Ir(L_a)(L_c)_2$, $L_a$ is selected from any one of the group consisting of Lai to $L_{a560}$, $L_{a641}$ to $L_{a940}$, $L_{a1001}$ to $L_{a1287}$, $L_{a1292}$ to $L_{a1664}$, $L_{a1671}$ to $L_{a1931}$ and $L_c$ is, at each occurrence identically or differently, selected from any one or any two of the group consisting of $L_{c1}$ to $L_{c231}$.

20. An electroluminescent device, comprising:

an anode, a cathode, and an organic layer disposed between the anode and the cathode, wherein the organic layer comprises the metal complex of claim 1.

21. The electroluminescent device of claim 20, wherein the organic layer is a light-emitting layer and the metal complex is a light-emitting material.

22. The electroluminescent device of claim 20, wherein the electroluminescent device emits red light or white light.

23. The electroluminescent device of claim 21, wherein the light-emitting layer further comprises at least one host material.

24. A compound composition, comprising the metal complex of claim 1.

25. The metal complex of claim 2, wherein the ring A and/or the ring B are each independently selected from an aromatic ring having 6 to 10 carbon atoms, or a heteroaromatic ring having 3 to 10 carbon atoms.

26. The metal complex of claim 4, wherein in Formula 2 to Formula 19 and Formula 22 to Formula 23, at least one of $X_1$ to $X_n$ is selected from N, wherein the $X_n$ corresponds to one with the largest number of $X_1$ to $X_7$ in any one of Formula 2 to Formula 19 and Formula 22 to Formula 23.

27. The metal complex of claim 4, wherein in Formula 2 to Formula 19 and Formula 22 to Formula 23, $X_2$ is N.

28. The metal complex of claim 11, wherein in Formula 20 and Formula 21, at least one or two of $R_{x1}$, $R_{x2}$, $R_{i1}$, $R_{i2}$ and $R_{i3}$ and/or of $R_{ii1}$, $R_{ii2}$, $R_{ii3}$ and $R_{ii4}$ are, at each occurrence identically or differently, selected from deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof; R is selected from halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

29. The metal complex of claim 11, wherein $R_{i2}$ is selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof, R is selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof, and at least one or two of $R_{ii1}$, $R_{ii2}$, $R_{ii3}$ and $R_{ii4}$ are, at each occurrence identically or differently, selected from substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms or a combination thereof.

30. The metal complex of claim 13, wherein in Formula 20 and Formula 21, at least one of $R_{x1}$, $R_{x2}$, $R_{i1}$, $R_{i2}$, $R_{i3}$, $R_{ii1}$, $R_{ii2}$, $R_{ii3}$, $R_{ii4}$ and R is, at each occurrence identically or differently, selected from the group consisting of: substituted or unsubstituted alkyl having 3 to 10 carbon atoms, substituted or unsubstituted cycloalkyl having 3 to 10 ring carbon atoms and combinations thereof.

31. The metal complex of claim 15, wherein the metal M is Ir.

32. The metal complex of claim 17, wherein at least one or two of $R_1$ to $R_3$ are selected from substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof; and/or at least one of $R_4$ to $R_6$ is substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms or a combination thereof.

33. The metal complex of claim 17, wherein at least two of $R_1$ to $R_3$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof, and/or at least two of $R_4$ to $R_6$ are selected from substituted or unsubstituted alkyl having 2 to 20 carbon atoms, substituted or unsubstituted cycloalkyl having 3 to 20 ring carbon atoms, substituted or unsubstituted heteroalkyl having 2 to 20 carbon atoms or a combination thereof.

34. The metal complex of claim 18, wherein the metal complex is selected from the group consisting of Compound 1 to Compound 312;

wherein Compound 1 to Compound 200 and Compound 261 to Compound 312 each has a structure of $Ir(L_a)_2(L_b)$, wherein the two $L_a$ are the same, and $L_a$ and $L_b$ are respectively selected from structures listed in the following table:

| Compound No. | $L_a$ | $L_b$ | Compound No. | $L_a$ | $L_b$ |
|---|---|---|---|---|---|
| 1 | $L_{a1}$ | $L_{b1}$ | 2 | $L_{a4}$ | $L_{b1}$ |
| 3 | $L_{a24}$ | $L_{b1}$ | 4 | $L_{a104}$ | $L_{b1}$ |
| 5 | $L_{a134}$ | $L_{b1}$ | 6 | $L_{a164}$ | $L_{b1}$ |
| 7 | $L_{a424}$ | $L_{b1}$ | 8 | $L_{a894}$ | $L_{b1}$ |

-continued

| Compound No. | $L_a$ | $L_b$ | Compound No. | $L_a$ | $L_b$ |
|---|---|---|---|---|---|
| 9 | $L_{a1024}$ | $L_{b1}$ | 10 | $L_{a1064}$ | $L_{b1}$ |
| 11 | $L_{a1218}$ | $L_{b1}$ | 12 | $L_{a1323}$ | $L_{b1}$ |
| 13 | $L_{a1384}$ | $L_{b1}$ | 14 | $L_{a1414}$ | $L_{b1}$ |
| 15 | $L_{a1494}$ | $L_{b1}$ | 16 | $L_{a1514}$ | $L_{b1}$ |
| 17 | $L_{a1524}$ | $L_{b1}$ | 18 | $L_{a1544}$ | $L_{b1}$ |
| 19 | $L_{a1564}$ | $L_{b1}$ | 20 | $L_{a1240}$ | $L_{b1}$ |
| 21 | $L_{a1}$ | $L_{b31}$ | 22 | $L_{a4}$ | $L_{b31}$ |
| 23 | $L_{a24}$ | $L_{b31}$ | 24 | $L_{a104}$ | $L_{b31}$ |
| 25 | $L_{a134}$ | $L_{b31}$ | 26 | $L_{a164}$ | $L_{b31}$ |
| 27 | $L_{a424}$ | $L_{b31}$ | 28 | $L_{a894}$ | $L_{b31}$ |
| 29 | $L_{a1024}$ | $L_{b31}$ | 30 | $L_{a1064}$ | $L_{b31}$ |
| 31 | $L_{a1218}$ | $L_{b31}$ | 32 | $L_{a1323}$ | $L_{b31}$ |
| 33 | $L_{a1384}$ | $L_{b31}$ | 34 | $L_{a1414}$ | $L_{b31}$ |
| 35 | $L_{a1494}$ | $L_{b31}$ | 36 | $L_{a1514}$ | $L_{b31}$ |
| 37 | $L_{a1524}$ | $L_{b31}$ | 38 | $L_{a1544}$ | $L_{b31}$ |
| 39 | $L_{a1564}$ | $L_{b31}$ | 40 | $L_{a1240}$ | $L_{b31}$ |
| 41 | $L_{a1}$ | $L_{b57}$ | 42 | $L_{a4}$ | $L_{b57}$ |
| 43 | $L_{a24}$ | $L_{b57}$ | 44 | $L_{a104}$ | $L_{b57}$ |
| 45 | $L_{a134}$ | $L_{b57}$ | 46 | $L_{a164}$ | $L_{b57}$ |
| 47 | $L_{a424}$ | $L_{b57}$ | 47 | $L_{a894}$ | $L_{b57}$ |
| 49 | $L_{a1024}$ | $L_{b57}$ | 50 | $L_{a1064}$ | $L_{b57}$ |
| 51 | $L_{a1218}$ | $L_{b57}$ | 52 | $L_{a1323}$ | $L_{b57}$ |
| 53 | $L_{a1384}$ | $L_{b57}$ | 54 | $L_{a1414}$ | $L_{b57}$ |
| 55 | $L_{a1494}$ | $L_{b57}$ | 56 | $L_{a1514}$ | $L_{b57}$ |
| 57 | $L_{a1524}$ | $L_{b57}$ | 58 | $L_{a1544}$ | $L_{b57}$ |
| 59 | $L_{a1564}$ | $L_{b57}$ | 60 | $L_{a1240}$ | $L_{b57}$ |
| 61 | $L_{a1}$ | $L_{b88}$ | 62 | $L_{a4}$ | $L_{b88}$ |
| 63 | $L_{a24}$ | $L_{b88}$ | 64 | $L_{a124}$ | $L_{b88}$ |
| 65 | $L_{a134}$ | $L_{b88}$ | 66 | $L_{a164}$ | $L_{b88}$ |
| 67 | $L_{a424}$ | $L_{b88}$ | 68 | $L_{a894}$ | $L_{b88}$ |
| 69 | $L_{a1024}$ | $L_{b88}$ | 70 | $L_{a1064}$ | $L_{b88}$ |
| 71 | $L_{a1218}$ | $L_{b88}$ | 72 | $L_{a1323}$ | $L_{b88}$ |
| 73 | $L_{a1384}$ | $L_{b88}$ | 74 | $L_{a1414}$ | $L_{b88}$ |
| 75 | $L_{a1494}$ | $L_{b88}$ | 76 | $L_{a1514}$ | $L_{b88}$ |
| 77 | $L_{a1524}$ | $L_{b88}$ | 78 | $L_{a1544}$ | $L_{b88}$ |
| 79 | $L_{a1564}$ | $L_{b88}$ | 80 | $L_{a1240}$ | $L_{b88}$ |
| 81 | $L_{a1}$ | $L_{b122}$ | 82 | $L_{a4}$ | $L_{b122}$ |
| 83 | $L_{a24}$ | $L_{b122}$ | 84 | $L_{a104}$ | $L_{b122}$ |
| 85 | $L_{a1044}$ | $L_{b122}$ | 86 | $L_{a134}$ | $L_{b122}$ |
| 87 | $L_{a1384}$ | $L_{b122}$ | 88 | $L_{a1394}$ | $L_{b122}$ |
| 89 | $L_{a1584}$ | $L_{b122}$ | 90 | $L_{a1064}$ | $L_{b122}$ |
| 91 | $L_{a1218}$ | $L_{b122}$ | 92 | $L_{a1484}$ | $L_{b122}$ |
| 93 | $L_{a1384}$ | $L_{b122}$ | 94 | $L_{a1414}$ | $L_{b122}$ |
| 95 | $L_{a1494}$ | $L_{b122}$ | 96 | $L_{a1514}$ | $L_{b122}$ |
| 97 | $L_{a1524}$ | $L_{b122}$ | 98 | $L_{a1544}$ | $L_{b122}$ |
| 99 | $L_{a1564}$ | $L_{b122}$ | 100 | $L_{a1240}$ | $L_{b122}$ |
| 101 | $L_{a1}$ | $L_{b165}$ | 102 | $L_{a4}$ | $L_{b165}$ |
| 103 | $L_{a24}$ | $L_{b165}$ | 104 | $L_{a104}$ | $L_{b165}$ |
| 105 | $L_{a134}$ | $L_{b165}$ | 106 | $L_{a164}$ | $L_{b165}$ |
| 107 | $L_{a424}$ | $L_{b165}$ | 108 | $L_{a894}$ | $L_{b165}$ |
| 109 | $L_{a1024}$ | $L_{b165}$ | 110 | $L_{a1064}$ | $L_{b165}$ |
| 111 | $L_{a1218}$ | $L_{b165}$ | 112 | $L_{a1323}$ | $L_{b165}$ |
| 113 | $L_{a1389}$ | $L_{b126}$ | 114 | $L_{a84}$ | $L_{b126}$ |
| 115 | $L_{a1574}$ | $L_{b126}$ | 116 | $L_{a64}$ | $L_{b126}$ |
| 117 | $L_{a1295}$ | $L_{b126}$ | 118 | $L_{a1544}$ | $L_{b165}$ |
| 119 | $L_{a1564}$ | $L_{b165}$ | 120 | $L_{a1240}$ | $L_{b165}$ |
| 121 | $L_{a1}$ | $L_{b212}$ | 122 | $L_{a4}$ | $L_{b212}$ |
| 123 | $L_{a24}$ | $L_{b212}$ | 124 | $L_{a104}$ | $L_{b212}$ |
| 125 | $L_{a134}$ | $L_{b212}$ | 126 | $L_{a164}$ | $L_{b212}$ |
| 127 | $L_{a424}$ | $L_{b212}$ | 128 | $L_{a894}$ | $L_{b212}$ |
| 129 | $L_{a1024}$ | $L_{b212}$ | 130 | $L_{a1064}$ | $L_{b212}$ |
| 131 | $L_{a1218}$ | $L_{b212}$ | 132 | $L_{a1323}$ | $L_{b212}$ |
| 133 | $L_{a1384}$ | $L_{b212}$ | 134 | $L_{a1414}$ | $L_{b212}$ |
| 135 | $L_{a1494}$ | $L_{b212}$ | 136 | $L_{a21}$ | $L_{b192}$ |
| 137 | $L_{a114}$ | $L_{b192}$ | 138 | $L_{a104}$ | $L_{b192}$ |
| 139 | $L_{a94}$ | $L_{b192}$ | 140 | $L_{a34}$ | $L_{b192}$ |
| 141 | $L_{a1}$ | $L_{b245}$ | 142 | $L_{a4}$ | $L_{b245}$ |
| 143 | $L_{a24}$ | $L_{b245}$ | 144 | $L_{a104}$ | $L_{b245}$ |
| 145 | $L_{a134}$ | $L_{b245}$ | 146 | $L_{a164}$ | $L_{b245}$ |
| 147 | $L_{a424}$ | $L_{b245}$ | 148 | $L_{a894}$ | $L_{b245}$ |
| 149 | $L_{a1024}$ | $L_{b245}$ | 150 | $L_{a1064}$ | $L_{b245}$ |
| 151 | $L_{a1218}$ | $L_{b245}$ | 152 | $L_{a1323}$ | $L_{b245}$ |
| 153 | $L_{a1384}$ | $L_{b245}$ | 154 | $L_{a1414}$ | $L_{b245}$ |
| 155 | $L_{a1494}$ | $L_{b245}$ | 156 | $L_{a1514}$ | $L_{b245}$ |
| 157 | $L_{a1524}$ | $L_{b245}$ | 158 | $L_{a1544}$ | $L_{b245}$ |
| 159 | $L_{a1564}$ | $L_{b245}$ | 160 | $L_{a1240}$ | $L_{b245}$ |

-continued

| Compound No. | $L_a$ | $L_b$ | Compound No. | $L_a$ | $L_b$ |
|---|---|---|---|---|---|
| 161 | $L_{a1}$ | $L_{b268}$ | 162 | $L_{a4}$ | $L_{b268}$ |
| 163 | $L_{a24}$ | $L_{b268}$ | 164 | $L_{a104}$ | $L_{b268}$ |
| 165 | $L_{a134}$ | $L_{b268}$ | 166 | $L_{a164}$ | $L_{b268}$ |
| 167 | $L_{a424}$ | $L_{b268}$ | 168 | $L_{a894}$ | $L_{b268}$ |
| 169 | $L_{a1024}$ | $L_{b268}$ | 170 | $L_{a1064}$ | $L_{b268}$ |
| 171 | $L_{a1218}$ | $L_{b268}$ | 172 | $L_{a1323}$ | $L_{b268}$ |
| 173 | $L_{a1384}$ | $L_{b268}$ | 174 | $L_{a1414}$ | $L_{b268}$ |
| 175 | $L_{a1494}$ | $L_{b268}$ | 176 | $L_{a1514}$ | $L_{b268}$ |
| 177 | $L_{a1524}$ | $L_{b268}$ | 178 | $L_{a1544}$ | $L_{b268}$ |
| 179 | $L_{a1564}$ | $L_{b268}$ | 180 | $L_{a1240}$ | $L_{b268}$ |
| 181 | $L_{a1}$ | $L_{b295}$ | 182 | $L_{a4}$ | $L_{b295}$ |
| 183 | $L_{a24}$ | $L_{b295}$ | 184 | $L_{a104}$ | $L_{b295}$ |
| 185 | $L_{a134}$ | $L_{b295}$ | 186 | $L_{a164}$ | $L_{b295}$ |
| 187 | $L_{a424}$ | $L_{b295}$ | 188 | $L_{a894}$ | $L_{b295}$ |
| 189 | $L_{a1024}$ | $L_{b295}$ | 190 | $L_{a1064}$ | $L_{b295}$ |
| 191 | $L_{a1218}$ | $L_{b295}$ | 192 | $L_{a1323}$ | $L_{b295}$ |
| 193 | $L_{a1384}$ | $L_{b295}$ | 194 | $L_{a1414}$ | $L_{b295}$ |
| 195 | $L_{a1494}$ | $L_{b295}$ | 196 | $L_{a1514}$ | $L_{b295}$ |
| 197 | $L_{a1524}$ | $L_{b295}$ | 198 | $L_{a1544}$ | $L_{b295}$ |
| 199 | $L_{a1564}$ | $L_{b295}$ | 200 | $L_{a1240}$ | $L_{b295}$ |
| 261 | $L_{a1384}$ | $L_{b126}$ | 262 | $L_{a1394}$ | $L_{b88}$ |
| 263 | $L_{a1294}$ | $L_{b126}$ | 264 | $L_{a1573}$ | $L_{b126}$ |
| 265 | $L_{a1721}$ | $L_{b88}$ | 266 | $L_{a1721}$ | $L_{b122}$ |
| 267 | $L_{a1310}$ | $L_{b126}$ | 268 | $L_{a1309}$ | $L_{b126}$ |
| 269 | $L_{a1709}$ | $L_{b126}$ | 270 | $L_{a1419}$ | $L_{b122}$ |
| 271 | $L_{a1725}$ | $L_{b126}$ | 272 | $L_{a1728}$ | $L_{b126}$ |
| 273 | $L_{a1731}$ | $L_{b126}$ | 274 | $L_{a1743}$ | $L_{b126}$ |
| 275 | $L_{a1751}$ | $L_{b126}$ | 276 | $L_{a1579}$ | $L_{b88}$ |
| 277 | $L_{a1722}$ | $L_{b126}$ | 278 | $L_{a1577}$ | $L_{b98}$ |
| 279 | $L_{a1794}$ | $L_{b126}$ | 280 | $L_{a641}$ | $L_{b122}$ |
| 281 | $L_{a1772}$ | $L_{b126}$ | 282 | $L_{a1760}$ | $L_{b126}$ |
| 283 | $L_{a1790}$ | $L_{b126}$ | 284 | $L_{a1799}$ | $L_{b122}$ |
| 285 | $L_{a1785}$ | $L_{b126}$ | 286 | $L_{a1785}$ | $L_{b88}$ |
| 287 | $L_{a1577}$ | $L_{b126}$ | 288 | $L_{a1577}$ | $L_{b156}$ |
| 289 | $L_{a1295}$ | $L_{b156}$ | 290 | $L_{a1721}$ | $L_{b98}$ |
| 291 | $L_{a1804}$ | $L_{b88}$ | 292 | $L_{a1805}$ | $L_{b88}$ |
| 293 | $L_{a1805}$ | $L_{b135}$ | 294 | $L_{a1811}$ | $L_{b126}$ |
| 295 | $L_{a1815}$ | $L_{b88}$ | 296 | $L_{a1816}$ | $L_{b135}$ |
| 297 | $L_{a124}$ | $L_{b135}$ | 298 | $L_{a1}$ | $L_{b135}$ |
| 299 | $L_{a1384}$ | $L_{b135}$ | 300 | $L_{a24}$ | $L_{b135}$ |
| 301 | $L_{a1760}$ | $L_{b135}$ | 302 | $L_{a1295}$ | $L_{b135}$ |
| 303 | $L_{a1394}$ | $L_{b135}$ | 304 | $L_{a1294}$ | $L_{b135}$ |
| 305 | $L_{a1573}$ | $L_{b135}$ | 306 | $L_{a1731}$ | $L_{b135}$ |
| 307 | $L_{a1721}$ | $L_{b135}$ | 308 | $L_{a1310}$ | $L_{b135}$ |
| 309 | $L_{a1811}$ | $L_{b135}$ | 310 | $L_{a1577}$ | $L_{b135}$ |
| 311 | $L_{a1804}$ | $L_{b135}$ | 312 | $L_{a1579}$ | $L_{b135}$ |

wherein Compound 201 to Compound 260 each has a structure of $Ir(L_a)_2(L_b)$, wherein the two $L_a$ are different, and $L_a$ and $L_b$ are respectively selected from structures listed in the following table:

| Compound No. | $L_a$ | $L_a$ | $L_b$ | Compound No. | $L_a$ | $L_a$ | $L_b$ |
|---|---|---|---|---|---|---|---|
| 201 | $L_{a4}$ | $L_{a24}$ | $L_{b1}$ | 202 | $L_{a4}$ | $L_{a134}$ | $L_{b1}$ |
| 203 | $L_{a4}$ | $L_{a1024}$ | $L_{b1}$ | 204 | $L_{a4}$ | $L_{a1064}$ | $L_{b1}$ |
| 205 | $L_{a4}$ | $L_{a1218}$ | $L_{b1}$ | 206 | $L_{a4}$ | $L_{a1384}$ | $L_{b1}$ |
| 207 | $L_{a4}$ | $L_{a1534}$ | $L_{b1}$ | 208 | $L_{a4}$ | $L_{a1564}$ | $L_{b1}$ |
| 219 | $L_{a1024}$ | $L_{a1064}$ | $L_{b1}$ | 210 | $L_{a1384}$ | $L_{a1534}$ | $L_{b1}$ |
| 211 | $L_{a1564}$ | $L_{a1384}$ | $L_{b1}$ | 212 | $L_{a1534}$ | $L_{a1564}$ | $L_{b1}$ |
| 213 | $L_{a4}$ | $L_{a24}$ | $L_{b31}$ | 214 | $L_{a4}$ | $L_{a134}$ | $L_{b31}$ |
| 215 | $L_{a4}$ | $L_{a1024}$ | $L_{b31}$ | 216 | $L_{a4}$ | $L_{a1064}$ | $L_{b31}$ |
| 217 | $L_{a4}$ | $L_{a1218}$ | $L_{b31}$ | 218 | $L_{a4}$ | $L_{a1384}$ | $L_{b31}$ |
| 219 | $L_{a4}$ | $L_{a1534}$ | $L_{b31}$ | 220 | $L_{a4}$ | $L_{a1564}$ | $L_{b31}$ |
| 221 | $L_{a1024}$ | $L_{a1064}$ | $L_{b31}$ | 222 | $L_{a1384}$ | $L_{a1534}$ | $L_{b31}$ |
| 223 | $L_{a1564}$ | $L_{a1384}$ | $L_{b31}$ | 224 | $L_{a1534}$ | $L_{a1564}$ | $L_{b31}$ |
| 225 | $L_{a4}$ | $L_{a24}$ | $L_{b88}$ | 226 | $L_{a4}$ | $L_{a134}$ | $L_{b88}$ |
| 227 | $L_{a4}$ | $L_{a1024}$ | $L_{b88}$ | 228 | $L_{a4}$ | $L_{a1064}$ | $L_{b88}$ |
| 229 | $L_{a4}$ | $L_{a1218}$ | $L_{b88}$ | 230 | $L_{a4}$ | $L_{a1384}$ | $L_{b88}$ |
| 231 | $L_{a4}$ | $L_{a1534}$ | $L_{b88}$ | 232 | $L_{a4}$ | $L_{a1564}$ | $L_{b88}$ |
| 233 | $L_{a1024}$ | $L_{a1064}$ | $L_{b88}$ | 234 | $L_{a1384}$ | $L_{a1534}$ | $L_{b88}$ |
| 235 | $L_{a1564}$ | $L_{a1384}$ | $L_{b88}$ | 236 | $L_{a1534}$ | $L_{a1564}$ | $L_{b88}$ |
| 237 | $L_{a4}$ | $L_{a24}$ | $L_{b122}$ | 238 | $L_{a4}$ | $L_{a134}$ | $L_{b122}$ |
| 239 | $L_{a4}$ | $L_{a1024}$ | $L_{b122}$ | 240 | $L_{a4}$ | $L_{a1064}$ | $L_{b122}$ |
| 241 | $L_{a4}$ | $L_{a1218}$ | $L_{b122}$ | 242 | $L_{a4}$ | $L_{a1384}$ | $L_{b122}$ |
| 243 | $L_{a4}$ | $L_{a1534}$ | $L_{b122}$ | 244 | $L_{a4}$ | $L_{a1564}$ | $L_{b122}$ |
| 245 | $L_{a1024}$ | $L_{a1064}$ | $L_{b122}$ | 246 | $L_{a1384}$ | $L_{a1534}$ | $L_{b122}$ |
| 247 | $L_{a1564}$ | $L_{a1384}$ | $L_{b122}$ | 248 | $L_{a1534}$ | $L_{a1564}$ | $L_{b122}$ |
| 249 | $L_{a4}$ | $L_{a24}$ | $L_{b212}$ | 250 | $L_{a4}$ | $L_{a134}$ | $L_{b212}$ |
| 251 | $L_{a4}$ | $L_{a1024}$ | $L_{b212}$ | 252 | $L_{a4}$ | $L_{a1064}$ | $L_{b212}$ |
| 253 | $L_{a4}$ | $L_{a1218}$ | $L_{b212}$ | 254 | $L_{a4}$ | $L_{a1384}$ | $L_{b212}$ |
| 255 | $L_{a4}$ | $L_{a1534}$ | $L_{b212}$ | 256 | $L_{a4}$ | $L_{a1564}$ | $L_{b212}$ |
| 257 | $L_{a1024}$ | $L_{a1064}$ | $L_{b212}$ | 258 | $L_{a1384}$ | $L_{a1534}$ | $L_{b212}$ |
| 259 | $L_{a1564}$ | $L_{a1384}$ | $L_{b212}$ | 260 | $L_{a1534}$ | $L_{a1564}$ | $L_{b212}$. |

35. The metal complex of claim 3, wherein the $L_a$ is selected from a structure represented by any one of Formula 2, Formula 5 to Formula 8, Formula 10, and Formula 22 to Formula 23.

* * * * *